US010823894B2

(12) United States Patent
Peroz et al.

(10) Patent No.: US 10,823,894 B2
(45) Date of Patent: Nov. 3, 2020

(54) NANOGRATING METHOD AND APPARATUS

(71) Applicant: Magic Leap, Inc., Plantation, FL (US)

(72) Inventors: Christophe Peroz, San Francisco, CA (US); Mauro Melli, San Leandro, CA (US); Vikramjit Singh, Pflugerville, TX (US); David Jurbergs, Austin, TX (US); Jeffrey Dean Schmulen, Austin, TX (US); Zongxing Wang, Austin, TX (US); Shuqiang Yang, Austin, TX (US); Frank Y. Xu, Austin, TX (US); Kang Luo, Austin, TX (US); Marlon Edward Menezes, Austin, TX (US); Michael Nevin Miller, Austin, TX (US)

(73) Assignee: Magic Leaps, Inc., Plantation, FL (US)

( * ) Notice: Subject to any disclaimer, the term of this patent is extended or adjusted under 35 U.S.C. 154(b) by 0 days.

(21) Appl. No.: 16/596,630

(22) Filed: Oct. 8, 2019

(65) Prior Publication Data

US 2020/0041712 A1 Feb. 6, 2020

Related U.S. Application Data

(62) Division of application No. 15/683,706, filed on Aug. 22, 2017, now Pat. No. 10,481,317.

(Continued)

(51) Int. Cl.
*G02B 5/18* (2006.01)
*G02B 6/00* (2006.01)

(Continued)

(52) U.S. Cl.
CPC ......... *G02B 6/0016* (2013.01); *G02B 5/1823* (2013.01); *G02B 5/1857* (2013.01); *G02B 5/1866* (2013.01); *G02B 5/1871* (2013.01); *G02B 5/3025* (2013.01); *G02B 6/005* (2013.01); *G02B 6/0023* (2013.01);

(Continued)

(58) Field of Classification Search
None
See application file for complete search history.

(56) References Cited

U.S. PATENT DOCUMENTS 5,301,062 A 4/1994 Takahashi et al.
6,760,492 B1 7/2004 Lit et al.

(Continued)

FOREIGN PATENT DOCUMENTS

EP 2767852 A1 8/2014
GB 2539166 A 12/2016

(Continued)

*Primary Examiner* — Shamim Ahmed
(74) *Attorney, Agent, or Firm* — Kilpatrick Townsend & Stockton LLP

(57) ABSTRACT

A method of manufacturing a waveguide having a combination of a binary grating structure and a blazed grating structure includes cutting a substrate off-axis, depositing a first layer on the substrate, and depositing a resist layer on the first layer. The resist layer includes a pattern. The method also includes etching the first layer in the pattern using the resist layer as a mask. The pattern includes a first region and a second region. The method further includes creating the binary grating structure in the substrate in the second region and creating the blazed grating structure in the substrate in the first region.

6 Claims, 194 Drawing Sheets

Related U.S. Application Data

(60) Provisional application No. 62/377,831, filed on Aug. 22, 2016, provisional application No. 62/447,608, filed on Jan. 18, 2017, provisional application No. 62/449,524, filed on Jan. 23, 2017, provisional application No. 62/509,969, filed on May 23, 2017, provisional application No. 62/519,536, filed on Jun. 14, 2017, provisional application No. 62/521,889, filed on Jun. 19, 2017.

(51) Int. Cl.

| | |
|---|---|
| ***F21V 8/00*** | (2006.01) |
| ***G06F 3/01*** | (2006.01) |
| ***G06F 3/147*** | (2006.01) |
| ***G09G 3/00*** | (2006.01) |
| ***G09G 3/20*** | (2006.01) |
| ***G02B 27/01*** | (2006.01) |
| ***G02B 7/00*** | (2006.01) |
| ***G02B 5/30*** | (2006.01) |
| ***G02B 27/00*** | (2006.01) |
| ***G02B 27/28*** | (2006.01) |
| ***G02B 27/10*** | (2006.01) |
| ***H04N 9/31*** | (2006.01) |
| ***G02C 5/16*** | (2006.01) |
| ***G02C 11/00*** | (2006.01) |
| ***G06F 1/16*** | (2006.01) |
| ***G06F 1/20*** | (2006.01) |
| ***H05K 7/20*** | (2006.01) |
| *G02B 6/34* | (2006.01) |
| *G02B 6/293* | (2006.01) |
| *G02B 27/30* | (2006.01) |

(52) U.S. Cl.

CPC ......... *G02B 6/0035* (2013.01); *G02B 6/0036* (2013.01); *G02B 6/0038* (2013.01); *G02B 6/0076* (2013.01); *G02B 7/008* (2013.01); *G02B 27/0018* (2013.01); *G02B 27/0081* (2013.01); *G02B 27/017* (2013.01); *G02B 27/0172* (2013.01); *G02B 27/0176* (2013.01); *G02B 27/1086* (2013.01); *G02B 27/283* (2013.01); *G02C 5/16* (2013.01); *G02C 11/10* (2013.01); *G06F 1/163* (2013.01); *G06F 1/203* (2013.01); *G06F 1/206* (2013.01); *G06F 3/011* (2013.01); *G06F 3/013* (2013.01); *G06F 3/147* (2013.01); *G09G 3/001* (2013.01); *G09G 3/002* (2013.01); *G09G 3/2003* (2013.01); *G09G 3/2044* (2013.01); *H04N 9/3102* (2013.01); *H04N 9/3164* (2013.01); *H05K 7/20963* (2013.01); *G02B 6/29325* (2013.01); *G02B 6/34* (2013.01); *G02B 27/30* (2013.01); *G02B 2027/012* (2013.01); *G02B 2027/014* (2013.01); *G02B 2027/0114* (2013.01); *G02B 2027/0118* (2013.01); *G02B 2027/0125* (2013.01); *G02B 2027/0174* (2013.01); *G02B 2027/0178* (2013.01); *G09G 2320/0233* (2013.01); *G09G 2330/045* (2013.01); *G09G 2340/0464* (2013.01); *H04N 9/3144* (2013.01)

(56) References Cited

U.S. PATENT DOCUMENTS

| | | | |
|---|---|---|---|
| 6,850,221 | B1 | 2/2005 | Tickle |
| 7,206,107 | B2 | 4/2007 | Levola |
| 8,160,411 | B2 | 4/2012 | Levola et al. |
| 8,494,229 | B2 | 7/2013 | Jarvenpaa et al. |
| 8,950,867 | B2 | 2/2015 | Macnamara |
| 9,081,426 | B2 | 7/2015 | Armstrong |
| 9,215,293 | B2 | 12/2015 | Miller |
| 9,310,559 | B2 | 4/2016 | Macnamara |
| 9,348,143 | B2 | 5/2016 | Gao et al. |
| D758,367 | S | 6/2016 | Natsume |
| 9,417,452 | B2 | 8/2016 | Schowengerdt et al. |
| 9,470,906 | B2 | 10/2016 | Kaji et al. |
| 9,547,174 | B2 | 1/2017 | Gao et al. |
| 9,671,566 | B2 | 6/2017 | Abovitz et al. |
| 9,740,006 | B2 | 8/2017 | Gao |
| 9,791,700 | B2 | 10/2017 | Schowengerdt |
| 9,791,703 | B1 | 10/2017 | Vallius et al. |
| 9,851,563 | B2 | 12/2017 | Gao et al. |
| 9,857,591 | B2 | 1/2018 | Welch et al. |
| 9,874,749 | B2 | 1/2018 | Bradski et al. |
| 10,067,347 | B2 | 9/2018 | Vallius et al. |
| 10,267,970 | B2 | 4/2019 | Jones, Jr. et al. |
| 10,444,419 | B2 | 10/2019 | Bhargava et al. |
| 10,481,317 | B2 | 11/2019 | Peroz et al. |
| 2002/0135876 | A1 | 9/2002 | Holm et al. |
| 2003/0039444 | A1 | 2/2003 | Mossberg et al. |
| 2004/0184732 | A1 | 9/2004 | Zhou |
| 2005/0237615 | A1 | 10/2005 | Urey et al. |
| 2006/0126179 | A1 | 6/2006 | Levola |
| 2007/0188837 | A1 | 8/2007 | Shimizu et al. |
| 2010/0177388 | A1 | 7/2010 | Cohen et al. |
| 2010/0321781 | A1 | 12/2010 | Levola et al. |
| 2012/0127062 | A1 | 5/2012 | Bar-Zeev et al. |
| 2013/0032734 | A1 | 2/2013 | Santori et al. |
| 2013/0051729 | A1 | 2/2013 | Chen et al. |
| 2013/0082922 | A1 | 4/2013 | Miller |
| 2013/0125027 | A1 | 5/2013 | Abovitz |
| 2014/0023319 | A1 | 1/2014 | Mizuyama |
| 2014/0071539 | A1 | 3/2014 | Gao |
| 2014/0104665 | A1 | 4/2014 | Popovich et al. |
| 2014/0118829 | A1 | 5/2014 | Ma et al. |
| 2014/0177023 | A1 | 6/2014 | Gao et al. |
| 2014/0218468 | A1 | 8/2014 | Gao et al. |
| 2014/0306866 | A1 | 10/2014 | Miller et al. |
| 2015/0086163 | A1 | 3/2015 | Valera et al. |
| 2015/0103306 | A1 | 4/2015 | Kaji et al. |
| 2015/0222883 | A1 | 8/2015 | Welch |
| 2015/0222884 | A1 | 8/2015 | Cheng |
| 2015/0235440 | A1 | 8/2015 | Schowengerdt |
| 2015/0268415 | A1 | 9/2015 | Schowengerdt et al. |
| 2015/0302652 | A1 | 10/2015 | Miller et al. |
| 2015/0326570 | A1 | 11/2015 | Publicover et al. |
| 2015/0346490 | A1 | 12/2015 | Tekolste et al. |
| 2015/0346495 | A1 | 12/2015 | Welch et al. |
| 2016/0011417 | A1 | 1/2016 | Border et al. |
| 2016/0011419 | A1 | 1/2016 | Gao |
| 2016/0026253 | A1 | 1/2016 | Bradski et al. |
| 2016/0116739 | A1 | 4/2016 | Tekolste et al. |
| 2016/0119057 | A1 | 4/2016 | Mekis et al. |
| 2016/0231567 | A1 | 8/2016 | Saarikko et al. |
| 2016/0231568 | A1 | 8/2016 | Saarikko et al. |
| 2016/0363728 | A1 | 12/2016 | Wang et al. |
| 2017/0068094 | A1 | 3/2017 | Webster et al. |
| 2017/0131545 | A1 | 5/2017 | Wall et al. |
| 2017/0153460 | A1 | 6/2017 | Vallius et al. |
| 2017/0299865 | A1 | 10/2017 | Vallius et al. |
| 2018/0052276 | A1 | 2/2018 | Klienman et al. |
| 2018/0052277 | A1 | 2/2018 | Schowengerdt et al. |
| 2018/0052320 | A1 | 2/2018 | Curtis et al. |
| 2018/0052501 | A1 | 2/2018 | Jones, Jr. et al. |
| 2018/0059297 | A1 | 3/2018 | Peroz et al. |
| 2018/0059304 | A1 | 3/2018 | Bhargava et al. |
| 2018/0299678 | A1 | 10/2018 | Singer et al. |
| 2019/0011708 | A1 | 1/2019 | Schultz et al. |

FOREIGN PATENT DOCUMENTS

| | | | |
|---|---|---|---|
| JP | 5151518 | B2 | 3/2013 |
| WO | 2014207452 | A1 | 12/2014 |
| WO | 2015184413 | A1 | 12/2015 |
| WO | 2016048729 | A1 | 3/2016 |
| WO | 2016054092 | A1 | 4/2016 |

(56) References Cited

FOREIGN PATENT DOCUMENTS

| | | | |
|---|---|---|---|
| WO | 2017180403 | A1 | 10/2017 |
| WO | 2017213907 | A1 | 12/2017 |
| WO | 2018136892 | A1 | 7/2018 |

Sinusoidal dither

EPE Output

As perceived when viewer's pupil is within eyebox

Pupil luminance distribution caused by OPE dithering

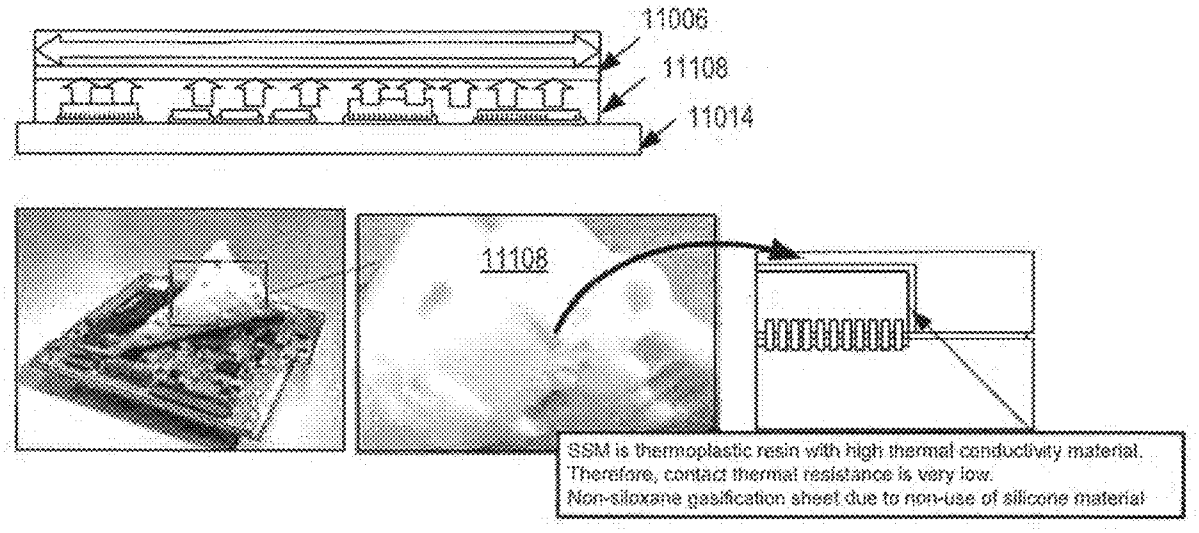

FIG. 112A

| | | Test Method | Condition | DATA | | |
|---|---|---|---|---|---|---|
| | | | | 1.0mm | 2.0mm | 3.0mm |
| Thickness | (mm) | micrometer | | 1.054 | 2.101 | 2.934 |
| Thermal Resistance | (C cm^2W | TIM Tester | 100 (kPa) | 7.53 | 14.82 | 19.48 |
| | | | 200 (kPa) | 6.71 | 13.71 | 16.01 |
| | | | 300 (kPa) | 5.90 | 10.73 | 11.38 |
| Compressibility | (%) | TIM Tester | 100 (kPa) | 4.93 | 4.05 | 4.43 |
| | | | 200 (kPa) | 9.58 | 8.66 | 14.04 |
| | | | 300 (kPa) | 18.41 | 22.13 | 40.49 |
| Thermal Conductivity | (W/m K) | (ASTM D5470) | 100 (kPa) | 1.6 | | |
| Specific Heat | (J/g C) | DSC | | 1.4 | | |
| Density | (g/cm^2) | (JIS K 7112 ) | | 1.68 | | |
| Volume Resistivity | (Ω cm) | (JIS K 6911) | | >10^14 | | |
| Dielectric Strength | (KVac/mm) | (JIS K 6249) | | 17 | | |
| Hardness (Type E) | | (JIS K 6253) | | 39 | | |
| Adhesive | (mN/cm) | | SUS | 39 | | |
| | | | Al | 31 | | |
| | | | glass | 38 | | |
| Flammability Rating | | | UL94 | V.0 | | |

FIG. 112B

| Sample | Pitch (nm) | CD Top (nm) | Efficiency % at 0 Deg |
|---|---|---|---|
| G-A | 380 | 61 | 46.6 |
| G-B | 380 | 38 | 32 |
| G-C | 380 | 68 | 45.9 |
| G-D | 380 | 33 | 38 |
| G-E | 380 | 80 | 51 |
| R-A | 430 | 115 | 52.4 |
| R-B | 430 | 85 | 51.3 |
| R-C | 430 | 150 | 50.8 |
| R-D | 430 | 170 | 47 |

*FIG. 119C*

NANOGRATING METHOD AND APPARATUS

CROSS-REFERENCES TO RELATED APPLICATIONS

This application is a divisional of U.S. patent application Ser. No. 15/683,706 filed Aug. 22, 2017, which is a non-provisional of and claims the benefit of and priority to U.S. Provisional Patent Application No. 62/377,831, filed on Aug. 22, 2016; U.S. Provisional Patent Application No. 62/447,608, filed on Jan. 18, 2017; U.S. Provisional Patent Application No. 62/449,524, filed Jan. 23, 2017; U.S. Provisional Patent Application No. 62/509,969, filed on May 23, 2017; U.S. Provisional Patent Application No. 62/519,536, filed on Jun. 14, 2017; and U.S. Provisional Patent Application No. 62/521,889, filed on Jun. 19, 2017, the disclosures of which are hereby incorporated by reference in their entirety for all purposes.

BACKGROUND OF THE INVENTION

Modern computing and display technologies have facilitated the development of systems for so called "virtual reality" or "augmented reality" experiences, wherein digitally reproduced images or portions thereof are presented to a user in a manner wherein they seem to be, or may be perceived as, real. A virtual reality, or "VR," scenario typically involves presentation of digital or virtual image information without transparency to other actual real-world visual input; an augmented reality, or "AR," scenario typically involves presentation of digital or virtual image information as an augmentation to visualization of the actual world around the user.

Despite the progress made in these display technologies, there is a need in the art for improved methods and systems related to augmented reality systems, particularly, display systems.

SUMMARY OF THE INVENTION

The present disclosure relates to virtual reality and augmented reality imaging and visualization systems. The present disclosure relates generally to methods and systems related to projection display systems including wearable displays. More particularly, embodiments of the present disclosure provide methods and systems for reducing optical artifacts in projection display systems. The disclosure is applicable to a variety of applications in computer vision and image display systems.

According to some embodiments, an optical device includes the following: a frame defining a pair of eye openings and including a pair of arms configured to extend over the ears of a user of the optical device; a temperature monitoring system configured to monitor a distribution of heat within the frame; a display assembly configured to display content to a user of the optical device; and a processor configured to receive temperature data from the temperature monitoring system and to adjust an output of the display assembly based on variation in the distribution of heat within the frame.

According to some embodiments, an optical device includes the following: a frame assembly including a pair of arms configured to extend over the ears of a user of the optical device and defining and defining a first eye opening and a second eye opening; first and second projectors coupled to the frame assembly; diffractive optics configured to receive light emitted by the first and second projectors and orient the light toward the eyes of the user; and a processor configured to shift content projected by the first and second projectors in accordance with a thermal profile of the optical device.

According to some embodiments, an optical device includes the following: a frame assembly, which includes a pair of arms joined together by a front band, the pair of arms being configured to contact the ears of a user of the optical device, and a heat distribution system for directing heat generated by the optical device to heat dissipation regions of the optical device; electronic devices in thermal contact with the frame assembly by way of the heat distribution system, the heat distribution system being configured to distribute heat emitted by the plurality of electronic devices to the pair of arms and to the front band; a display assembly; and a processor configured to adjust operation of the display assembly in accordance with temperature changes of the plurality of electronic devices.

According to an embodiment of the present invention, an artifact mitigation system is provided. The artifact mitigation system includes a projector assembly, a set of imaging optics optically coupled to the projector assembly, and an eyepiece optically coupled to the set of imaging optics. The eyepiece includes an incoupling interface. The artifact mitigation system also includes an artifact prevention element disposed between the set of imaging optics and the eyepiece. The artifact prevention element includes a linear polarizer, a first quarter waveplate disposed adjacent the linear polarizer, and a color select component disposed adjacent the first quarter waveplate.

According to another embodiment of the present invention, an artifact mitigation system is provided. The artifact mitigation system includes a projector assembly, a set of imaging optics optically coupled to the projector assembly, and an eyepiece optically coupled to the set of imaging optics. The eyepiece includes an incoupling region having a first set of incoupling diffractive elements and a second set of incoupling diffractive elements. The artifact mitigation system further includes a set of color filters disposed between the set of imaging optics and the eyepiece. The set of color filters includes a first filter disposed adjacent the first set of incoupling diffractive elements and a second filter disposed adjacent the second set of incoupling diffractive elements.

According to a specific embodiment of the present invention, a projector assembly is provided. The projector assembly includes a polarization beam splitter (PBS), a set of spatially displaced light sources disposed adjacent the PBS, and a collimator disposed adjacent the PBS. The set of spatially displaced light sources can include a set of three LEDs having different colors. In some embodiments, the set of spatially displaced light sources are adjacent a first side of the PBS. The collimator can be adjacent a second side of the PBS adjacent the first side.

The projector assembly also includes a display panel (e.g., an LCOS panel) disposed adjacent the PBS, a circular polarizer disposed adjacent the PBS, and a set of imaging optics disposed adjacent the PBS. The circular polarizer can be disposed between the PBS and the set of imaging optics. The display panel can be disposed adjacent a third side of the PBS, wherein the third side is adjacent the first side and opposite to the second side. Furthermore, the set of imaging optics can be disposed adjacent a fourth side of the PBS, wherein the fourth side is opposite to the first side.

In an embodiment, the set of imaging optics form an image of the display panel at an incoupling interface. In this embodiment, the projector assembly includes an eyepiece positioned at the incoupling interface. Each of the light sources of the set of spatially displaced light sources can be imaged at a separate portion of the incoupling interface. The eyepiece can include a plurality of waveguide layers.

Some embodiments of the present invention provide methods and systems for projecting images to a user's eye using one or more waveguides layered together in an eyepiece. The waveguides may include one or gratings and/or diffractive elements disposed within or on one or more surfaces of the waveguides.

In some embodiments, a waveguide for viewing a projected image is provided. The waveguide may include a substrate for guiding light. The waveguide may also include an incoupling diffractive element disposed within or on the substrate and configured to diffract an incoupled light related to the projected image into the substrate. The waveguide may further include a first grating disposed within or on the substrate and configured to manipulate the diffracted incoupled light from the incoupling diffractive element so as to multiply the projected image and to direct the multiplied projected image to a second grating. In some embodiments, the waveguide includes the second grating disposed within or on the substrate and configured to outcouple the manipulated diffracted incoupled light from the waveguide. In some embodiments, the first grating and the second grating occupy a same region of the waveguide.

In some embodiments, the first grating and the second grating are disposed on or within a same side of the substrate such that the first grating and the second grating are superimposed onto each other. In some embodiments, the first grating and the second grating are disposed on or within different sides of the substrate. In some embodiments, the waveguide may include a third grating disposed within or on the substrate and configured to manipulate the diffracted incoupled light from the incoupling diffractive element so as to multiply the projected image and to direct the multiplied projected image to the second grating. In some embodiments, the first grating is configured to direct the multiplied projected image to the second grating in a first direction. In some embodiments, the third grating is configured to direct the multiplied projected image to the second grating in a second direction, the second direction being opposite the first direction. In some embodiments, the first grating, the second grating, and the third grating are disposed on or within a same side of the substrate such that the first grating, the second grating, and the third grating are superimposed onto each other. In some embodiments, the first grating and the third grating are disposed on or within a same side of the substrate such that the first grating and the third grating are superimposed onto each other. In some embodiments, the second grating is disposed on or within an opposite side of the substrate.

In some embodiments, an eyepiece for viewing a projected image is provided. The eyepiece may include a plurality of waveguides coupled together in a layered arrangement. In some embodiments, each waveguide of the plurality of waveguides includes a substrate, an incoupling diffractive element, a first grating, and a second grating.

In some embodiments, a waveguide for viewing a projected image is provided. The waveguide may include a substrate for guiding light. The waveguide may also include an incoupling diffractive element disposed within or on the substrate and configured to diffract an incoupled light related to the projected image into the substrate in at least a first direction and a second direction. The waveguide may further include a first grating disposed within or on the substrate and configured to manipulate the diffracted incoupled light in the first direction so as to multiply the projected image and to direct a first multiplied projected image to a third grating. In some embodiments, the waveguide includes a second grating disposed within or on the substrate and configured to manipulate the diffracted incoupled light in the second direction so as to multiply the projected image and to direct a second multiplied projected image to the third grating. In some embodiments, the third grating is disposed within or on the substrate and is configured to outcouple at least a portion of the first multiplied projected image from the waveguide and to outcouple at least a portion of the second multiplied projected image from the waveguide.

In some embodiments, the incoupling diffractive element is configured to diffract the incoupled light related to the projected image into the substrate in a third direction. In some embodiments, the third grating is configured to outcouple at least a portion of the diffracted incoupled light in the third direction from the waveguide. In some embodiments, the first direction is substantially opposite the second direction. In some embodiments, the third direction is substantially orthogonal to the first direction and the second direction. In some embodiments, the incoupling diffractive element comprises two superimposed diffraction gratings that are orthogonal to each other. In some embodiments, the first direction forms a 120 degree angle with the second direction. In some embodiments, the third direction forms a 60 degree angle with each of the first direction and the second direction. In some embodiments, the incoupling diffractive element comprises a plurality of islands laid out in a hexagonal grid. In some embodiments, a plurality of the waveguides may be coupled together in a layered arrangement.

Some embodiments include a plurality of waveguides coupled together in a layered arrangement, wherein each waveguide of the plurality of waveguides includes a substrate for guiding light, an incoupling diffractive element disposed within or on the substrate and configured to diffract an incoupled light related to the projected image into the substrate, a first grating disposed within or on the substrate and configured to manipulate the diffracted incoupled light from the incoupling diffractive element so as to multiply the projected image and to direct the multiplied projected image to a second grating, and the second grating disposed within or on the substrate configured to outcouple the manipulated diffracted incoupled light from the waveguide.

According to an embodiment of the present invention, an eyepiece for projecting an image to an eye of a viewer is provided. The eyepiece includes a planar waveguide having a front surface and a back surface, the planar waveguide is configured to propagate light in a first wavelength range. The eyepiece also includes a grating coupled to the back surface of the waveguide and configured to diffract a first portion of the light propagating in the waveguide out of a plane of the waveguide toward a first direction and to diffract a second portion of the light propagating in the waveguide out of the plane of the waveguide toward a second direction opposite to the first direction. The eyepiece further includes a wavelength-selective reflector coupled to the front surface of the waveguide and configured to reflect light in the first wavelength range and transmit light outside the first wavelength range, such that the wavelength-selective reflector reflects at least part of the second portion of the light back toward the first direction.

According to another embodiment of the present invention, an eyepiece for projecting an image to an eye of a viewer is provided. The eyepiece includes a first planar waveguide having a first front surface and a first back surface and a second planar waveguide disposed substantially parallel to and in front of the first planar waveguide. The first planar waveguide is configured to propagate first light in a first wavelength range. The second planar waveguide has a second front surface and a second back surface and is configured to propagate second light in a second wavelength range. The eyepiece also includes a third planar waveguide disposed substantially parallel to and in front of the second planar waveguide. The third planar waveguide has a third front surface and a third back surface and is configured to propagate third light in a third wavelength range. The eyepiece further includes a first grating coupled to the first back surface of the first planar waveguide and configured to diffract a first portion of the first light propagating in the first planar waveguide out of a plane of the first planar waveguide toward a first direction and to diffract a second portion of the first light out of the plane of the first planar waveguide toward a second direction opposite to the first direction. The eyepiece additionally includes a second grating coupled to the second back surface of the second planar waveguide and configured to diffract a first portion of the second light propagating in the second planar waveguide out of a plane of the second planar waveguide toward the first direction and to diffract a second portion of the second light out of the plane of the second planar waveguide toward the second direction. The eyepiece also includes a third grating coupled to the third back surface of the third planar waveguide and configured to diffract a first portion of the third light propagating in the third planar waveguide out of a plane of the third planar waveguide toward the first direction and to diffract a second portion of the third light out of the plane of the third planar waveguide toward the second direction.

The eyepiece includes a first wavelength-selective reflector coupled to the first front surface of the first planar waveguide and configured to reflect light in the first wavelength range and transmit light outside the first wavelength range, such that the first wavelength-selective reflector reflects at least part of the second portion of the first light back toward the first direction. The eyepiece also includes a second wavelength-selective reflector coupled to the second front surface of the second planar waveguide and configured to reflect light in the second wavelength range and transmit light outside the second wavelength range, such that the second wavelength-selective reflector reflects at least part of the second portion of the second light back toward the first direction. The eyepiece further includes a third wavelength-selective reflector coupled to the third front surface of the third planar waveguide and configured to reflect light in the third wavelength range and transmit light outside the third wavelength range, such that the third wavelength-selective reflector reflects at least part of the second portion of the third light back toward the first direction.

According to a specific embodiment of the present invention, an eyepiece for projecting an image to an eye of a viewer is provided. The eyepiece includes a first planar waveguide having a first front surface and a first back surface and configured to propagate first light in a first wavelength range. The eyepiece also includes a second planar waveguide disposed substantially parallel to and in front of the first planar waveguide. The second planar waveguide has a second front surface and a second back surface and is configured to propagate second light in a second wavelength range. The eyepiece further includes a third planar waveguide disposed substantially parallel to and in front of the second planar waveguide. The third planar waveguide has a third front surface and a third back surface and is configured to propagate third light in a third wavelength range.

Additionally, the eyepiece includes a first grating coupled to the first front surface of the first planar waveguide and configured to diffract a first portion of the first light propagating in the first planar waveguide out of a plane of the first planar waveguide toward a first direction and to diffract a second portion of the first light out of the plane of the first planar waveguide toward a second direction opposite to the first direction. The eyepiece also includes a second grating coupled to the second front surface of the second planar waveguide and configured to diffract a first portion of the second light propagating in the second planar waveguide out of a plane of the second planar waveguide toward the first direction and to diffract a second portion of the second light out of the plane of the second planar waveguide toward the second direction. The eyepiece further includes a third grating coupled to the third front surface of the third waveguide and configured to diffract a first portion of the third light propagating in the third planar waveguide out of a plane of the third planar waveguide toward the first direction and to diffract a second portion of the third light out of the plane of the third planar waveguide toward the second direction.

Moreover, the eyepiece includes a first wavelength-selective reflector coupled to the second back surface of the second planar waveguide and configured to reflect light in the first wavelength range and transmit light outside the first wavelength range, such that the first wavelength-selective reflector reflects at least part of the second portion of the first light back toward the first direction. The eyepiece also includes a second wavelength-selective reflector coupled to the third back surface of the third planar waveguide and configured to reflect light in the second wavelength range and transmit light outside the second wavelength range, such that the second wavelength-selective reflector reflects at least part of the second portion of the second light back toward the first direction. The eyepiece further includes a front cover plate disposed substantially parallel to and in front of the third planar waveguide and a third wavelength-selective reflector coupled to a surface of the front cover plate. The third planar waveguide is configured to reflect light in the third wavelength range and transmit light outside the third wavelength range, such that the third wavelength-selective reflector reflects at least part of the second portion of the third light back toward the first direction.

Some embodiments of the present disclosure provide methods and systems for improving quality and uniformity in projection display systems.

According to some embodiments, a method of manufacturing a waveguide having a combination of a binary grating structure and a blazed grating structure is provided. The method comprises cutting a substrate off-axis. The method further comprises depositing a first layer on the substrate. The method further comprises depositing a resist layer on the first layer, wherein the resist layer includes a pattern. The method further comprises etching the first layer in the pattern using the resist layer as a mask, wherein the pattern includes a first region and a second region. The method further comprises removing the resist layer. The method further comprises coating a first polymer layer in the first region of the pattern. The method further comprises etching the substrate in the second region of the pattern, creating the binary grating structure in the substrate in the second region. The method further comprises removing the first polymer layer. The method further comprises coating a second polymer layer in the second region of the pattern. The method further comprises etching the substrate in the first region of the pattern, creating the blazed grating structure in the substrate in the first region. The method further comprises removing the second polymer layer. The method further comprises removing the first layer from the substrate.

According to some embodiments, a method of manufacturing a waveguide having a multi-level binary grating structure is provided. The method comprises coating a first etch stop layer on a first substrate. The method further comprises adding a second substrate on the first etch stop layer. The method further comprises depositing a first resist layer on the second substrate, wherein the first resist layer includes at least one first opening. The method further comprises depositing a second etch stop layer on the second substrate in the at least one first opening. The method further comprises removing the first resist layer from the second substrate. The method further comprises adding a third substrate on the second substrate and the second etch stop layer. The method further comprises depositing a second resist layer on the third substrate, wherein the second resist layer includes at least one second opening. The method further comprises depositing a third etch stop layer on the third substrate in the at least one second opening. The method further comprises removing the second resist layer from the third substrate. The method further comprises etching the second substrate and the third substrate, leaving the first substrate, the first etch stop layer, the second etch stop layer and the second substrate in the at least one first opening, and the third etch stop layer and the third substrate in the at least one second opening. The method further comprises etching an exposed portion of the first etch stop layer, an exposed portion of the second etch stop layer, and the third etch stop layer, forming the multi-level binary grating.

According to some embodiments, a method of manufacturing a waveguide having a blazed grating structure is provided. The method comprises cutting a substrate off-axis. The method further comprises depositing a resist layer on the substrate, wherein the resist layer includes a pattern. The method further comprises etching the substrate in the pattern using the resist layer as a mask, creating the blazed grating structure in the substrate. The method further comprises removing the resist layer from the substrate.

According to some embodiments, a method of manipulating light by an eyepiece layer is provided. The method comprises receiving light from a light source at an input coupling grating having a first grating structure characterized by a first set of grating parameters. The method further comprises receiving light from the input coupling grating at an expansion grating having a second grating structure characterized by a second set of grating parameters. The method further comprises receiving light from the expansion grating at an output coupling grating having a third grating structure characterized by a third set of grating parameters. At least one of the first grating structure, the second grating structure, or the third grating structure has a duty cycle that is graded.

Some embodiments of the present invention provide methods and systems for dithering eyepiece layers of a wearable display device.

According to some embodiments, a device is provided. The device comprises an input coupling grating having a first grating structure characterized by a first set of grating parameters. The input coupling grating is configured to receive light from a light source. The device further comprises an expansion grating having a second grating structure characterized by a second set of grating parameters varying in at least two dimensions. The second grating structure is configured to receive light from the input coupling grating. The device further comprises an output coupling grating having a third grating structure characterized by a third set of grating parameters. The output coupling grating is configured to receive light from the expansion grating and to output light to a viewer.

According to some embodiments, an optical structure is provided. The optical structure comprises a waveguide layer lying at least partially in a plane defined by a first dimension and a second dimension. The optical structure further comprises a diffractive element coupled to the waveguide layer and operable to diffract light in the plane. The diffractive element is characterized by a set of diffraction parameters that vary in at least the first dimension and the second dimension.

Numerous benefits are achieved by way of the present disclosure over conventional techniques. For example, embodiments of the present invention provide methods and systems that improve the reliability and performance of augmented reality display systems. High efficiency heat spreading and heat dissipation devices are described that distribute and dissipate heat generated due to operation of the wearable device. Methods and systems are described for adapting the output of display systems of the wearable device to account for changes in relative positioning of optical sensors, projectors and wearable display optics resulting from uneven thermal distribution or rapid increases in thermal loading.

Other embodiments of the present disclosure provide methods and systems that reduce or eliminate artifacts including ghost images in projection display systems. Additionally, embodiments of the present disclosure reduce eye strain, reduce artifacts due to stray light, and improve resolution, ANSI contrast, and general signal to noise of the displayed images or videos.

For example, embodiments of the present invention provide methods and systems that improve the scalability of eyepieces for use in augmented reality applications by decreasing the dimensions of the eyepiece and/or increasing the field of view for the user, or improving light properties of light that is delivered to a user such as brightness. Smaller dimensions of the eyepiece are often critical to user comfort when a user is wearing a particular system. Embodiments of the present invention also enable high quality images to be projected to the user's eye due to the wide range and density of light exit points within the eyepiece.

Other embodiments of the present disclosure provide methods and systems for providing gratings on eyepiece layers that improve the passage of light in projection display systems. Additionally, some embodiments of the present disclosure may provide increases in the uniformity of light intensity across an output image being projected to a viewer. In some embodiments, uniformity may be balanced, resulting in improved manufacturability and greater flexibility of design. These and other embodiments of the disclosure along with many of its advantages and features are described in more detail in conjunction with the text below and attached figures.

Some embodiments of the present invention provide methods and systems that improve uniformity of luminance, uniformity of intensity, diffraction efficiency, and/or brightness of output light, while reducing image artifacts, wave interference, and/or reflections.

It should be noted that one or more of the embodiments and implementations described herein may be combined to provide functionality enabled by the combination of the different implementations. Accordingly, the embodiments described herein can be implemented independently or in combination as appropriate to the particular application. One of ordinary skill in the art would recognize many variations, modifications, and alternatives.

These and other embodiments of the disclosure along with many of its advantages and features are described in more detail in conjunction with the text below and attached figures.

BRIEF DESCRIPTION OF THE DRAWINGS

FIGS. 77A and 77B show a top view and a side view, respectively, of a metasurface that is formed by one-dimensional nanobeams according to some embodiments.

FIGS. 77C and 77D show a plan view and a side view, respectively, of a metasurface that is formed by one-dimensional nanobeams according to some other embodiments.

FIGS. 78A and 78B show a top view and a side view, respectively, of a single-layer two-dimensional metasurface that is formed by a plurality of nano antennas formed on a surface of a substrate according to some embodiments.

FIGS. 78C and 78D show a plan view and a side view, respectively, of a multilayer two-dimensional metasurface according to some embodiments.

FIG. 79 shows plots of simulated reflectance as a function of angle of incidence for a wavelength corresponding to green color (solid line), and for a wavelength corresponding to red color (dashed line) of the metasurface illustrated in FIGS. 77C and 77D, for TE polarization, according to some embodiments.

FIG. 80 shows plots of a simulated reflectance spectrum (solid line) and a simulated transmission spectrum (dashed line) of the metasurface illustrated in FIGS. 77C and 77D, for TE polarization, according to some embodiments.

FIG. 81 shows plots of simulated reflectance as a function of angle of incidence for a wavelength corresponding to green color (solid line), and for a wavelength corresponding to red color (dashed line) of the metasurface illustrated in FIGS. 77C and 77D, for TM polarization, according to some embodiments.

FIG. 82 shows plots of a simulated reflectance spectrum (solid line) and a simulated transmission spectrum (dashed line) of the metasurface illustrated in FIGS. 77C and 77D, for TM polarization, according to some embodiments.

FIGS. 83A-83F illustrate schematically how a composite metasurface may be formed by interleaving two sub-metasurfaces according to some embodiments.

FIGS. 84A and 84B show a top view and a side view, respectively, of a metasurface according to some embodiments.

FIG. 84C illustrates schematically reflectance spectra of the metasurface illustrated in FIGS. 84A and 84B as a function of angle of incidence according to some embodiments.

FIG. 85A illustrates schematically a partial side view of an eyepiece 8500 according to some embodiments.

Figure 85A:
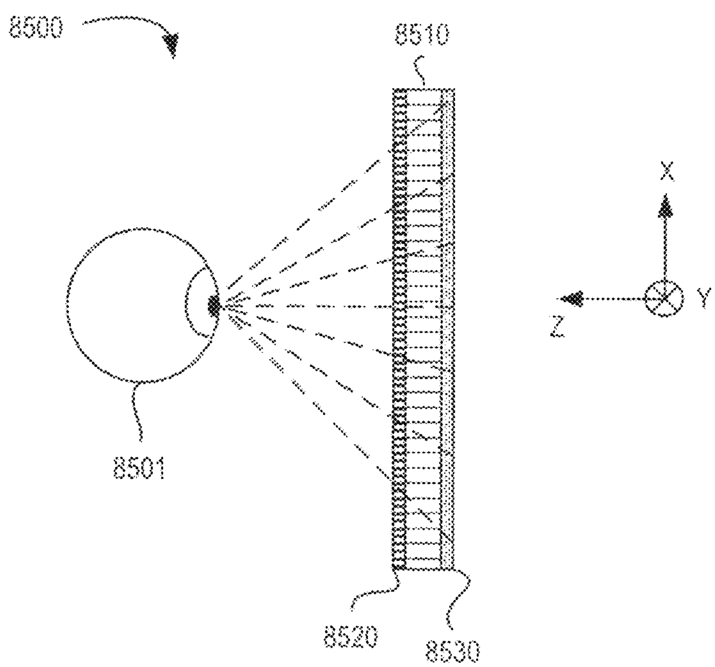
Figure 85B:
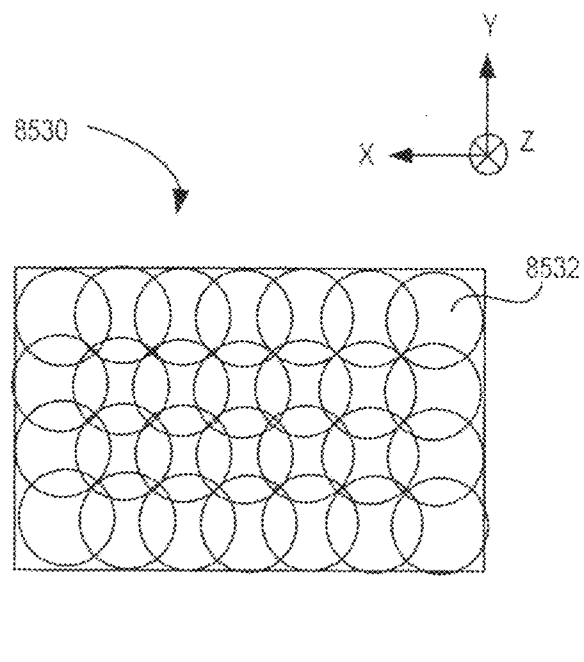

FIG. 85B illustrates schematically a top view of the wavelength-selective reflector shown in FIG. 85A according to some embodiments.

Figures 86A, 86B, 86C, 86D, 86E, 86F:
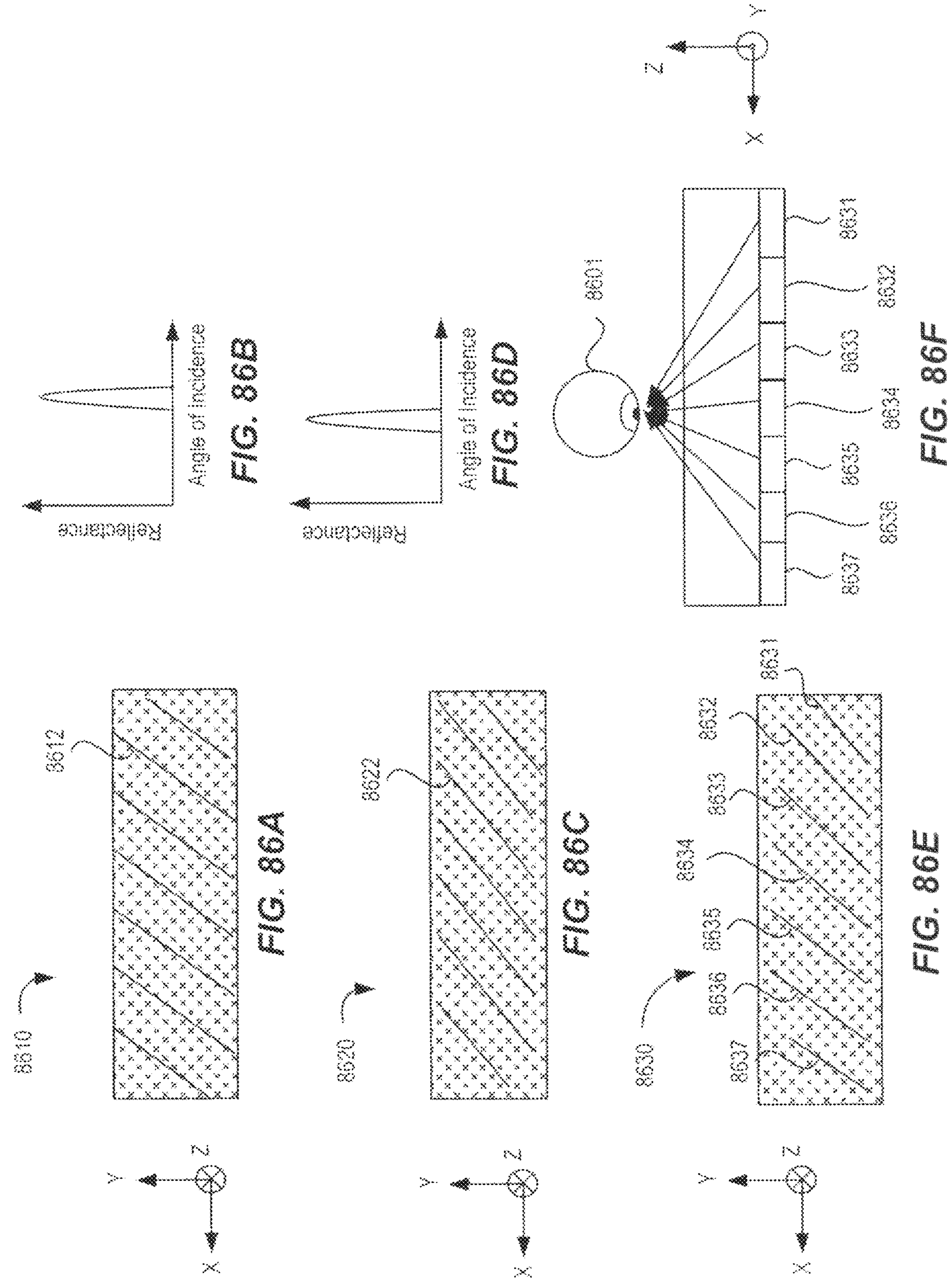

FIG. 86A illustrates schematically a partial cross-sectional view of a volume phase hologram according to some embodiments.

FIG. 86B illustrates schematically a reflectance spectrum of the volume phase hologram illustrated in FIG. 86A according to some embodiments.

FIG. 86C illustrates schematically a partial cross-sectional view of a volume phase hologram according to some embodiments.

FIG. 86D illustrates schematically a reflectance spectrum of the volume phase hologram illustrated in FIG. 86C according to some embodiments.

FIG. 86E illustrates schematically a partial cross-sectional view of a composite volume phase hologram according to some embodiments.

FIG. 86F illustrates schematically a side view of a composite volume phase hologram formed on a waveguide according to some embodiments.

Figure 87:
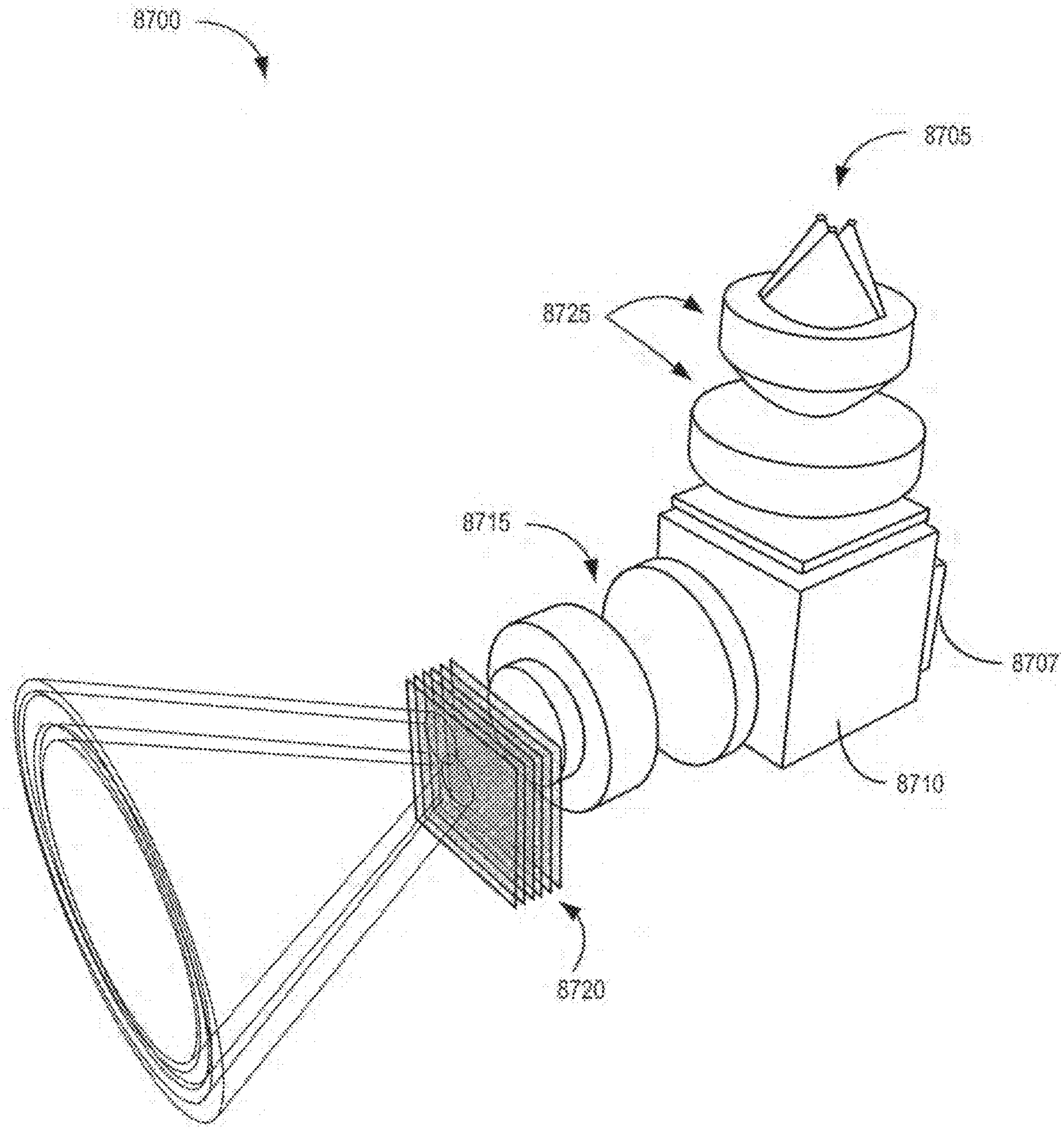

FIG. 87 is a schematic diagram illustrating an example of a projector according to one embodiments.

Figure 88:
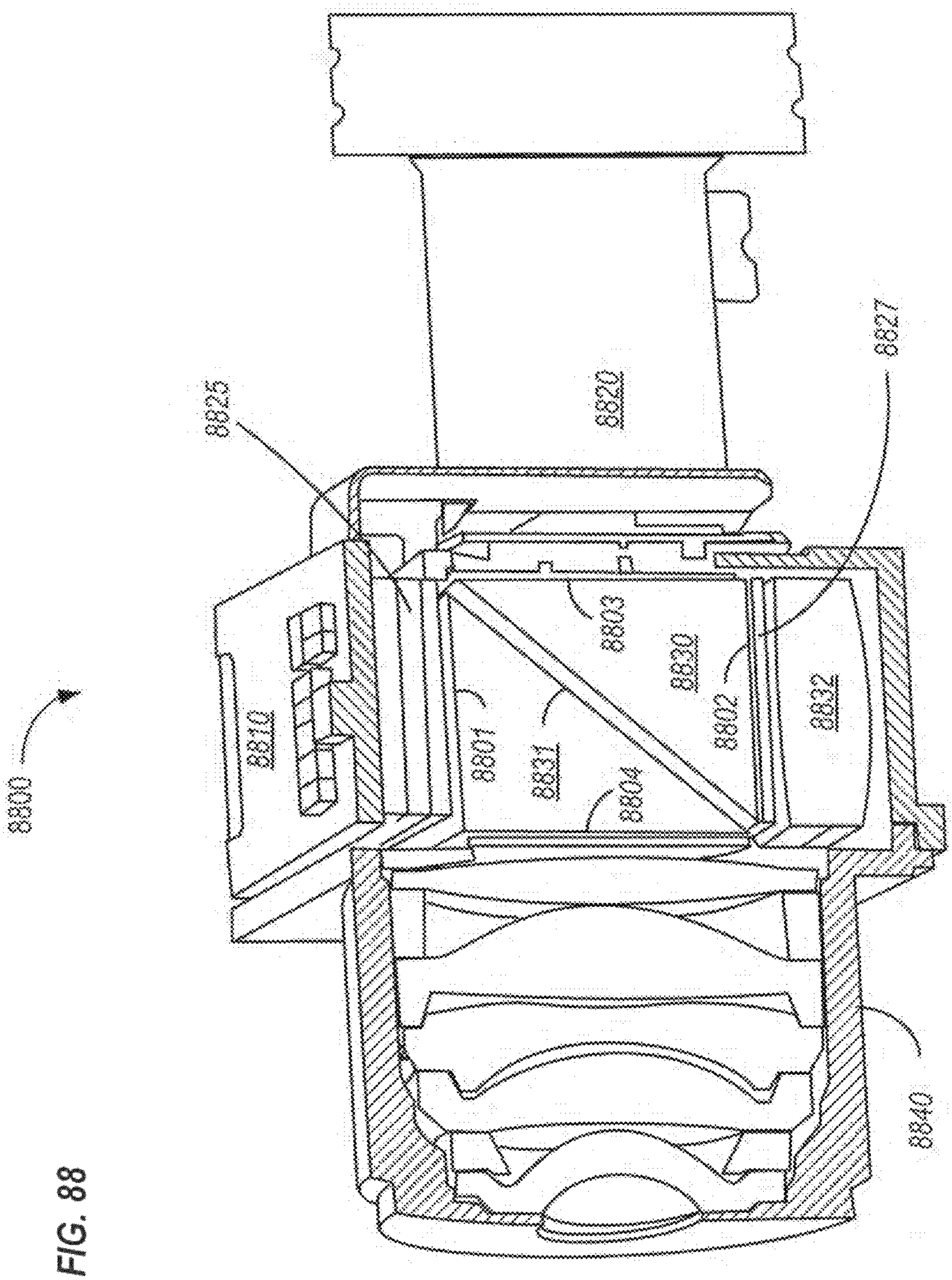

FIG. 88 is a schematic diagram illustrating an example of a projector according to one embodiment.

Figure 89:
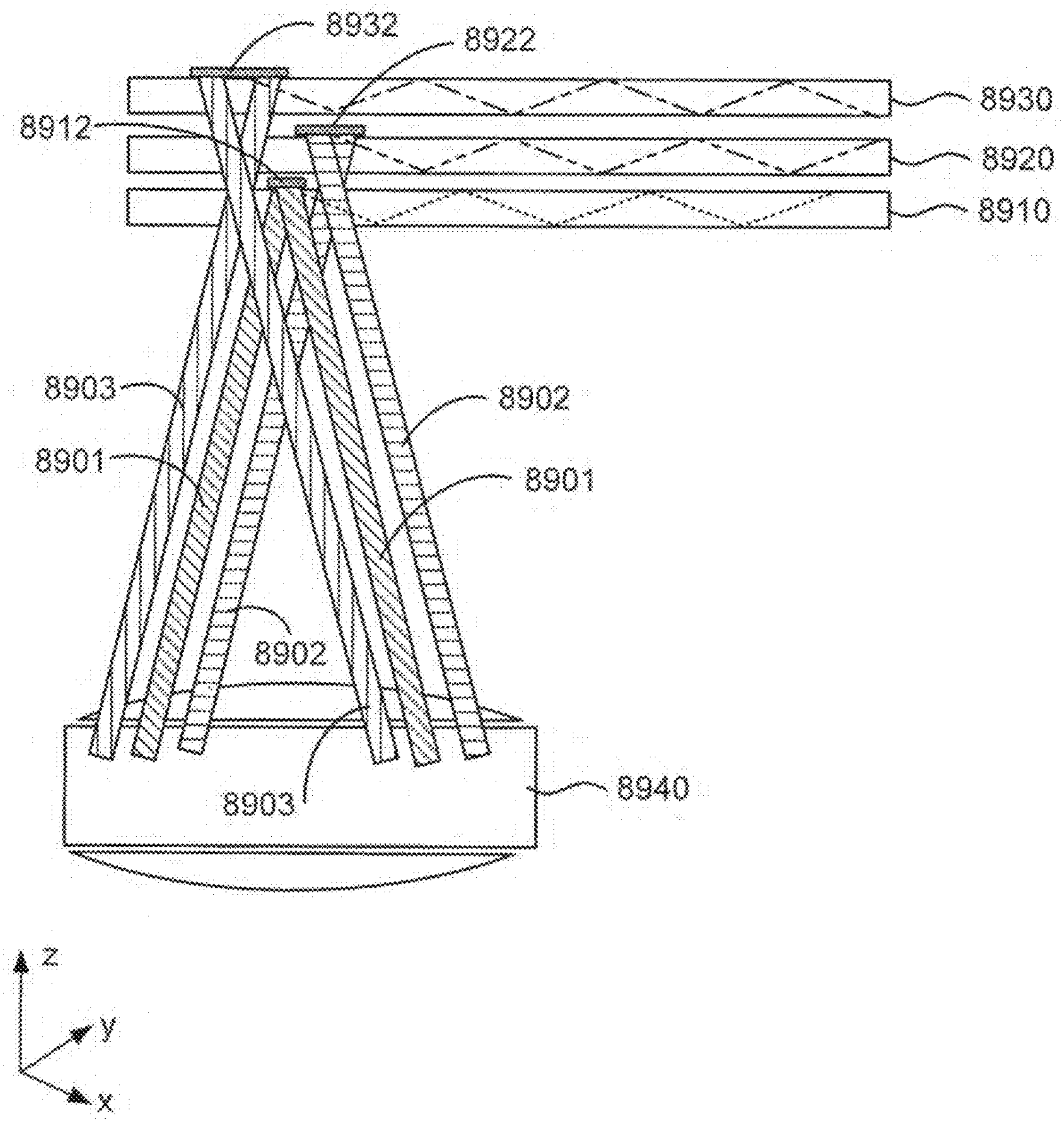

FIG. 89 is a schematic diagram illustrating multiple colors of light being coupled into corresponding waveguides using an incoupling grating disposed in each waveguide, according to one embodiment.

Figure 90A:
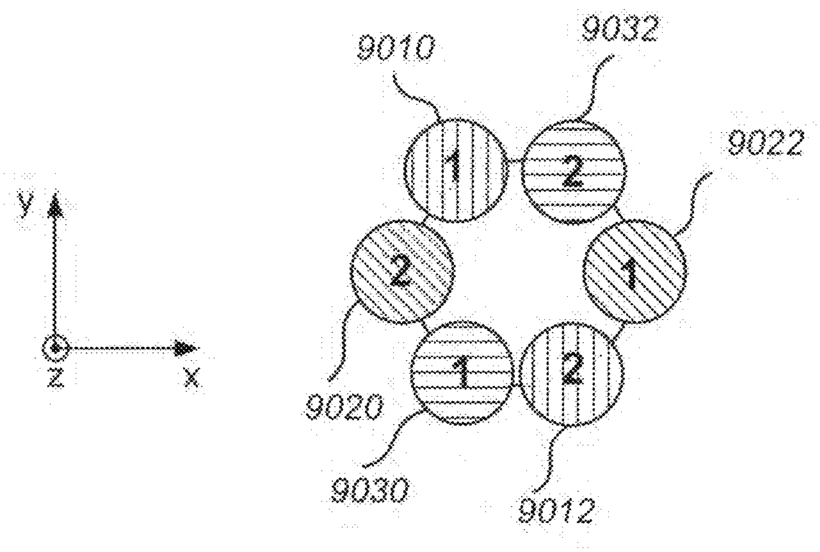
Figure 90B:
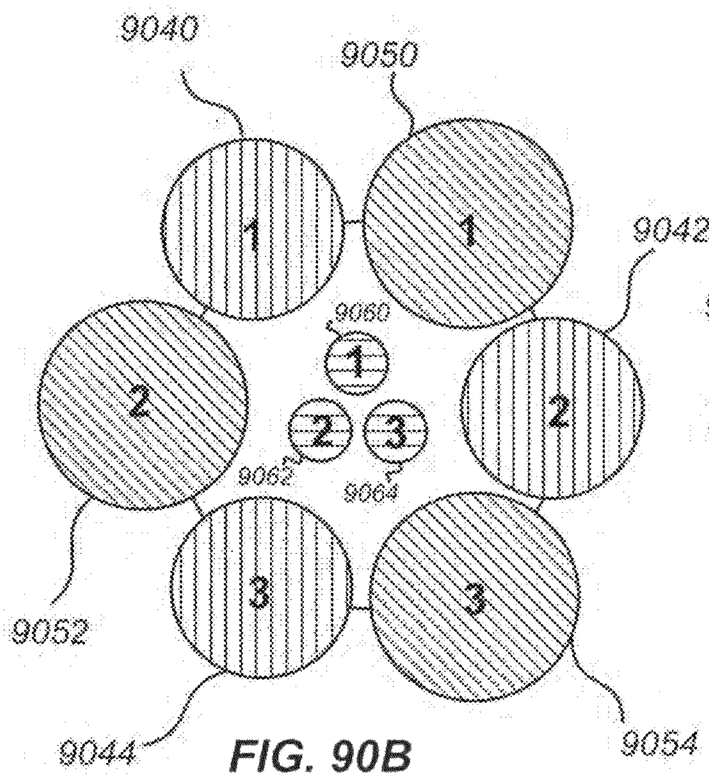
Figure 90C:
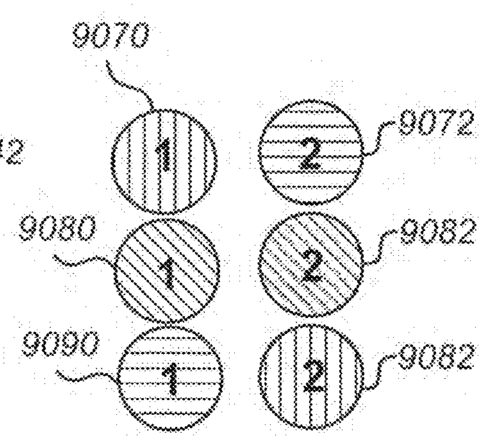

FIGS. 90A-90C are top views of distributed sub-pupil architectures according to one embodiment.

Figure 91:
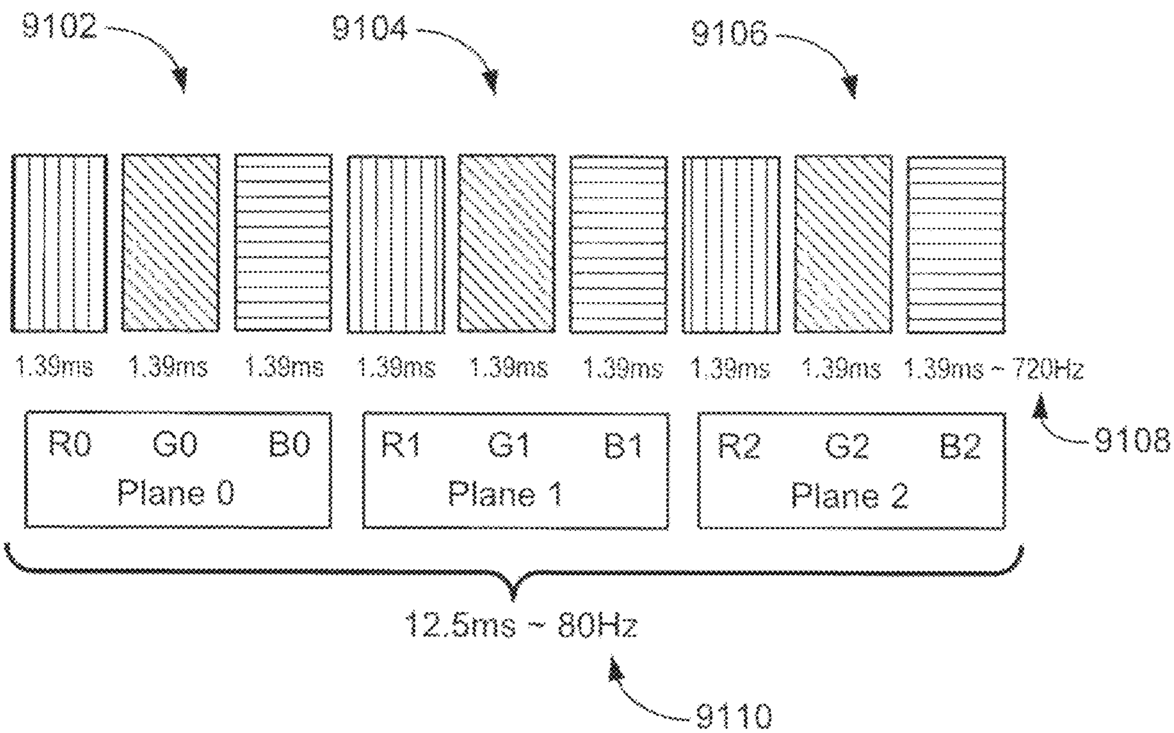

FIG. 91 is a schematic diagram illustrating time sequential encoding of colors for multiple depth planes, according to one embodiment.

Figure 92A:
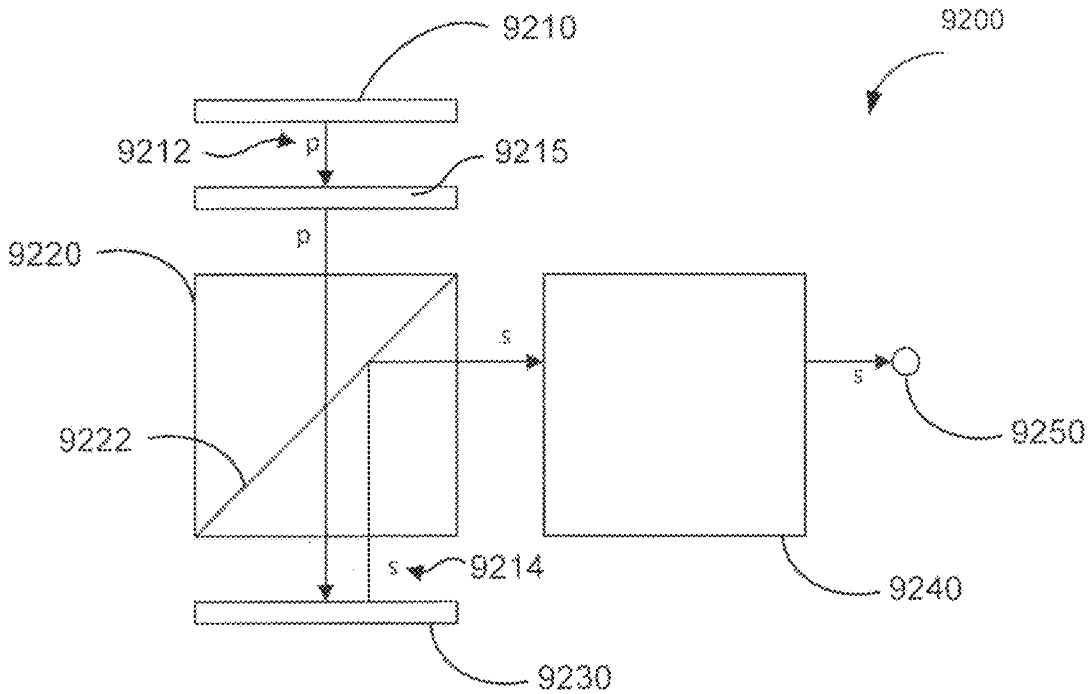

FIG. 92A is a schematic diagram illustrating a projector assembly according to one embodiment.

Figure 92B:
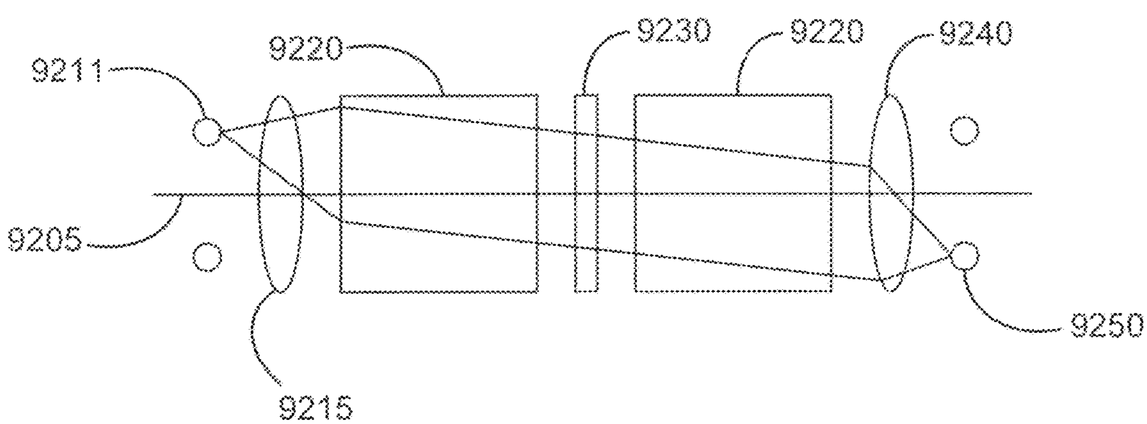

FIG. 92B is an unfolded schematic diagram illustrating the projector assembly shown in FIG. 92A.

Figure 93A:
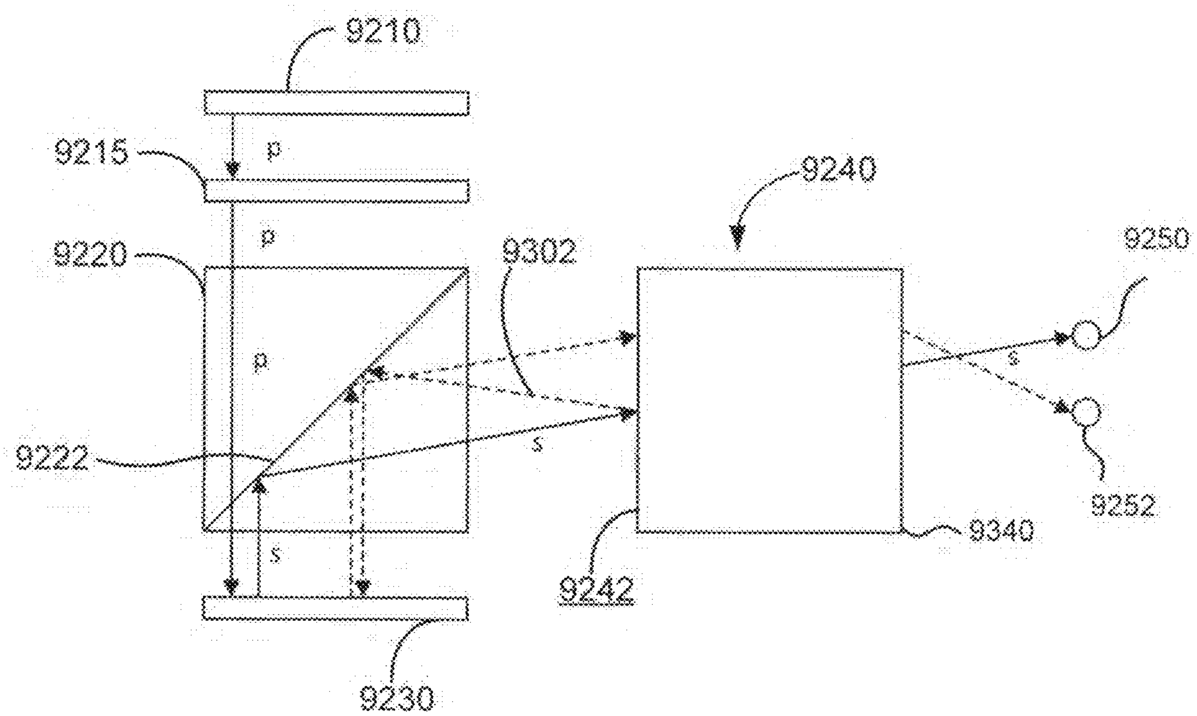

FIG. 93A is a schematic diagram illustrating an artifact formation in a projector assembly according to one embodiment.

Figure 93B:
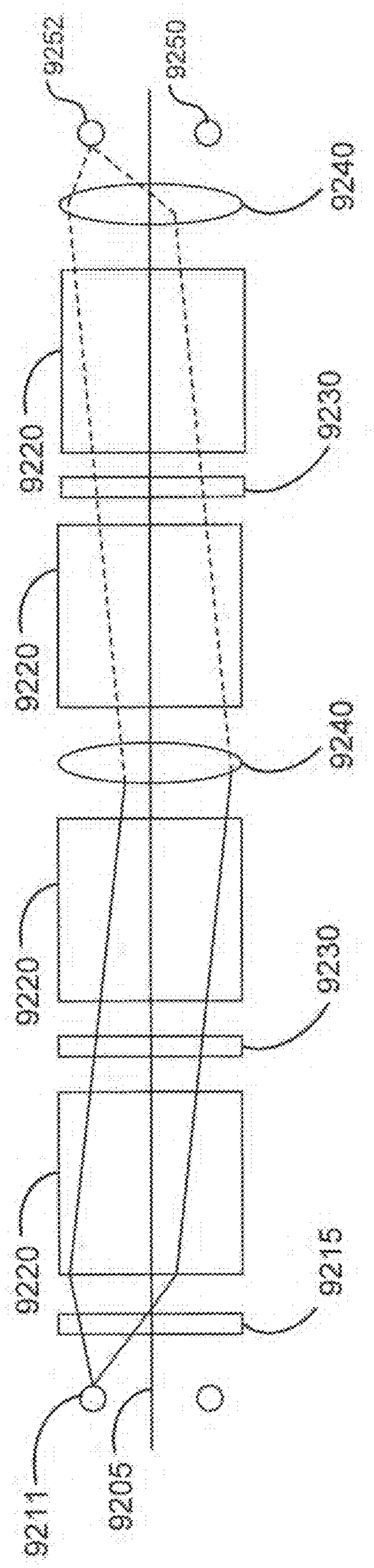

FIG. 93B is an unfolded schematic diagram illustrating artifact formation in the projector assembly shown in FIG. 93A.

Figure 94:
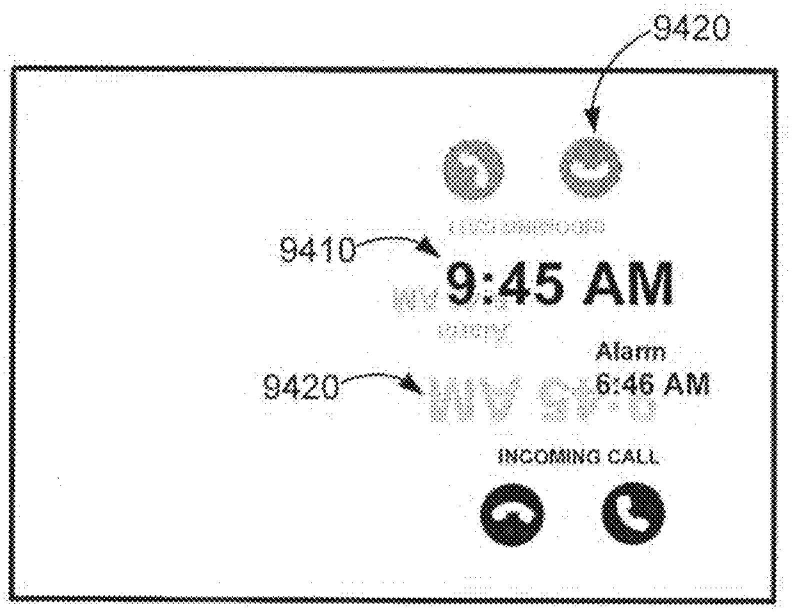

FIG. 94 illustrates presence of an artifact in a scene for the projector assembly illustrated in FIG. 92A.

Figure 95A:
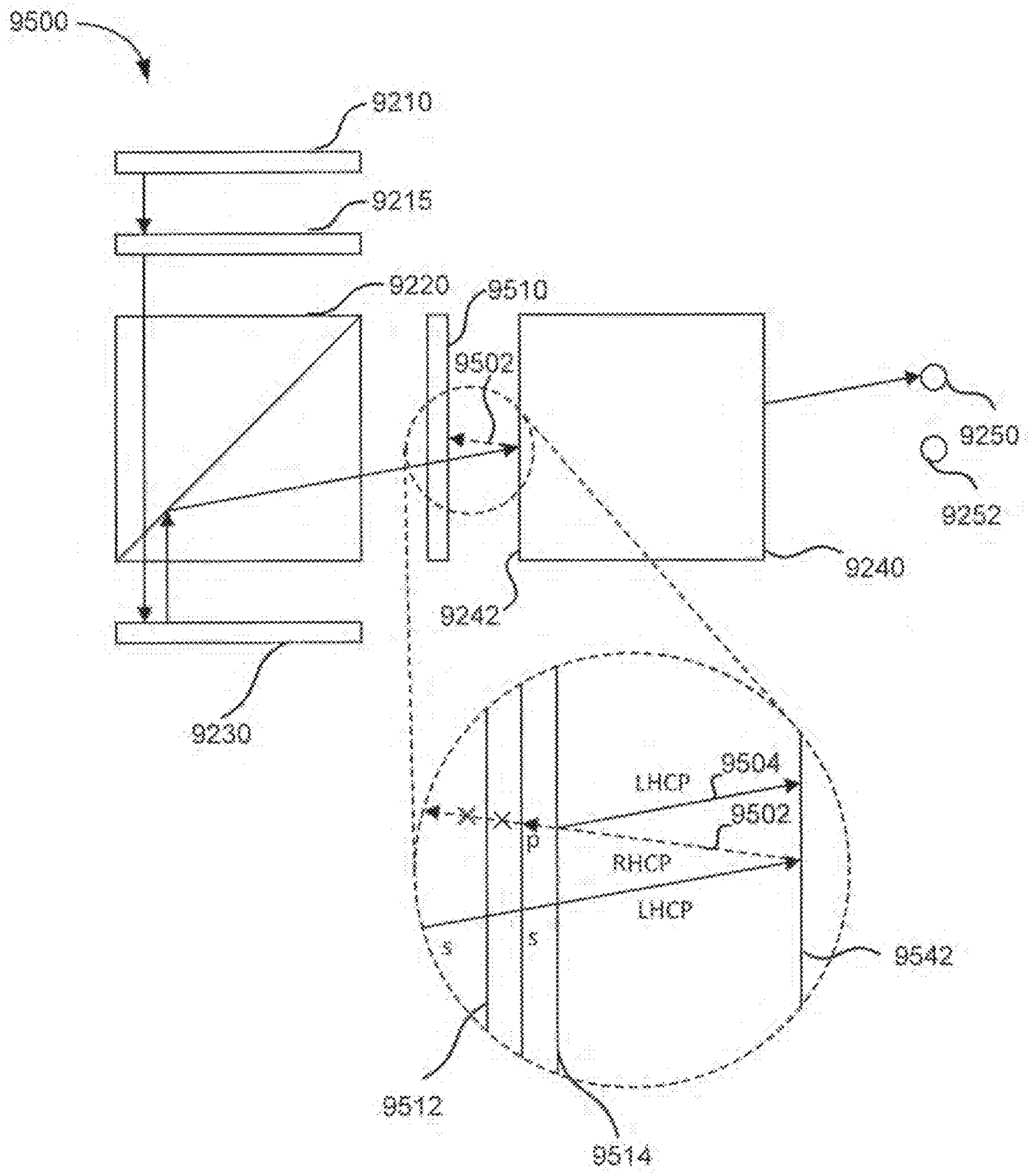

FIG. 95A is a schematic diagram illustrating a projector assembly with artifact prevention according to one embodiment.

Figure 95B:
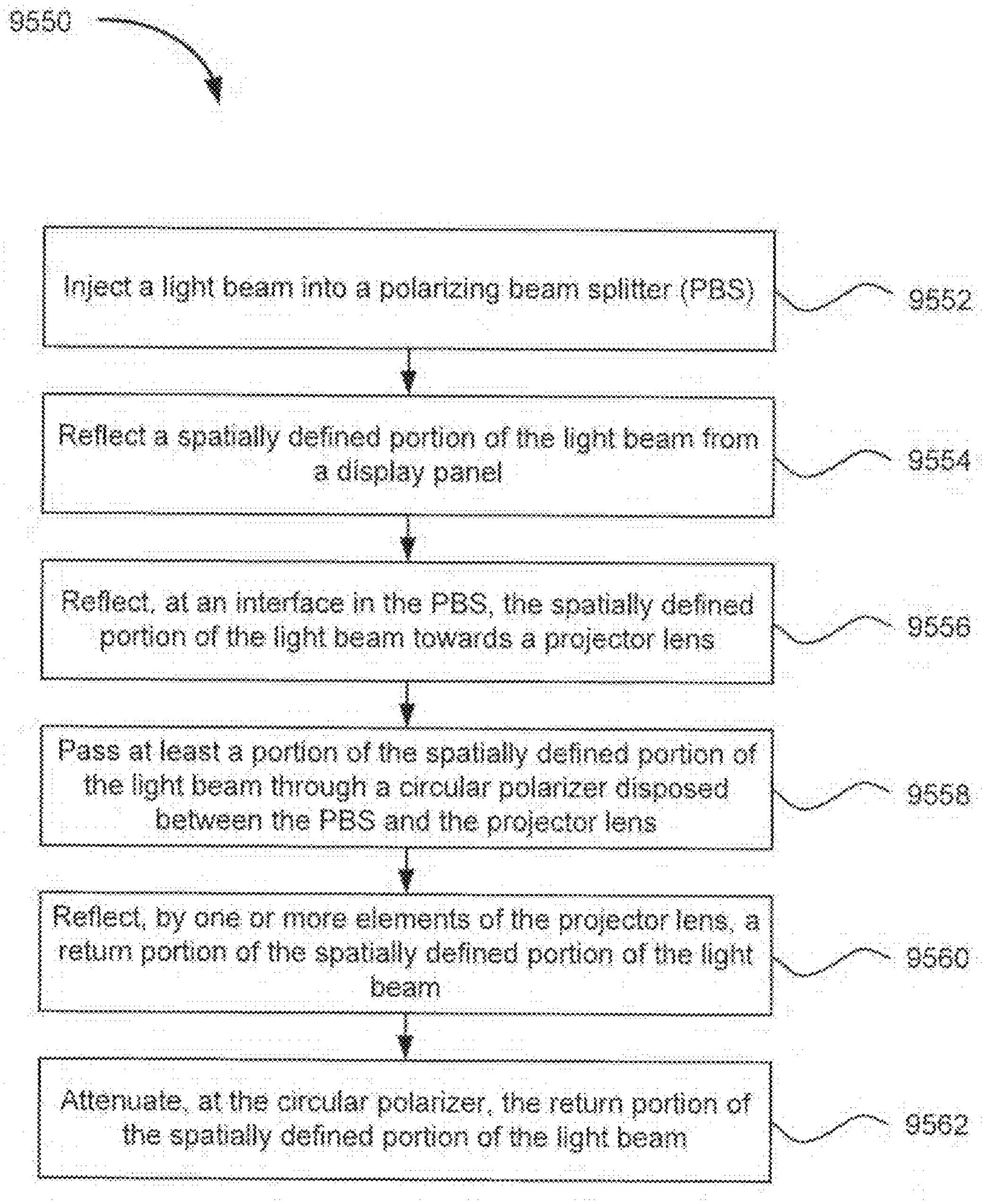

FIG. 95B is a flowchart illustrating a method of reducing optical artifacts according to one embodiment.

Figure 96:
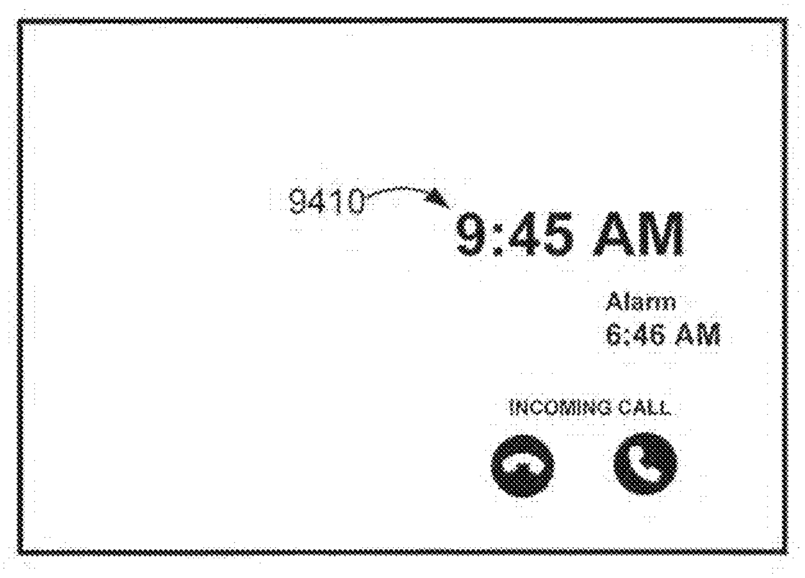

FIG. 96 illustrates reduction in intensity of the artifact using the projector assembly shown in FIG. 95A.

Figure 97A:
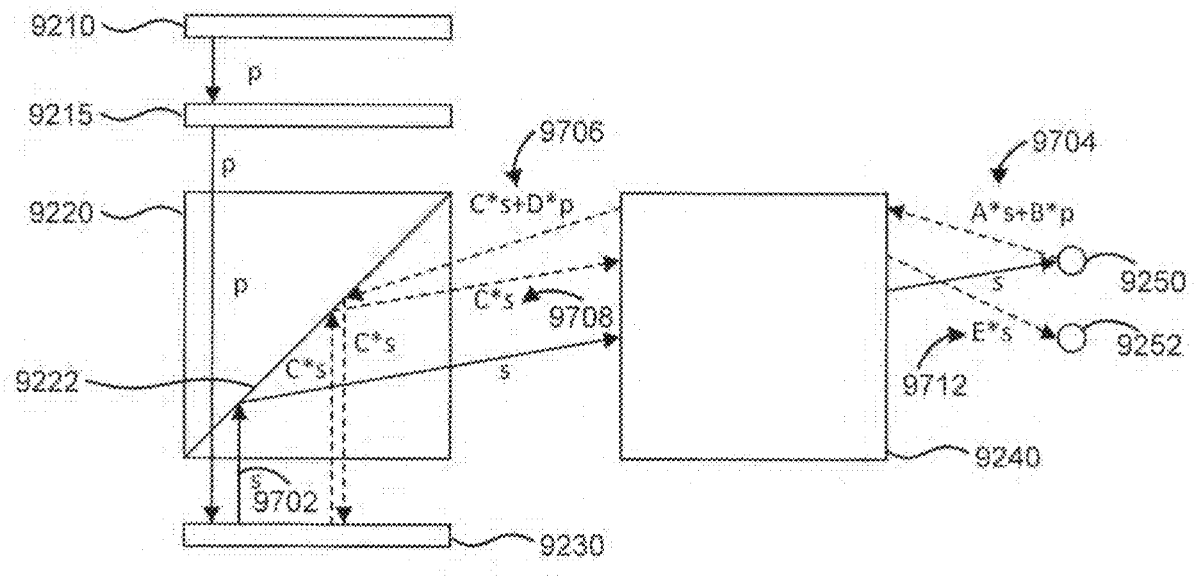

FIG. 97A is a schematic diagram illustrating artifact formation resulting from reflections from an in-coupling grating element in a projection display system, according to one embodiment.

Figure 97B:
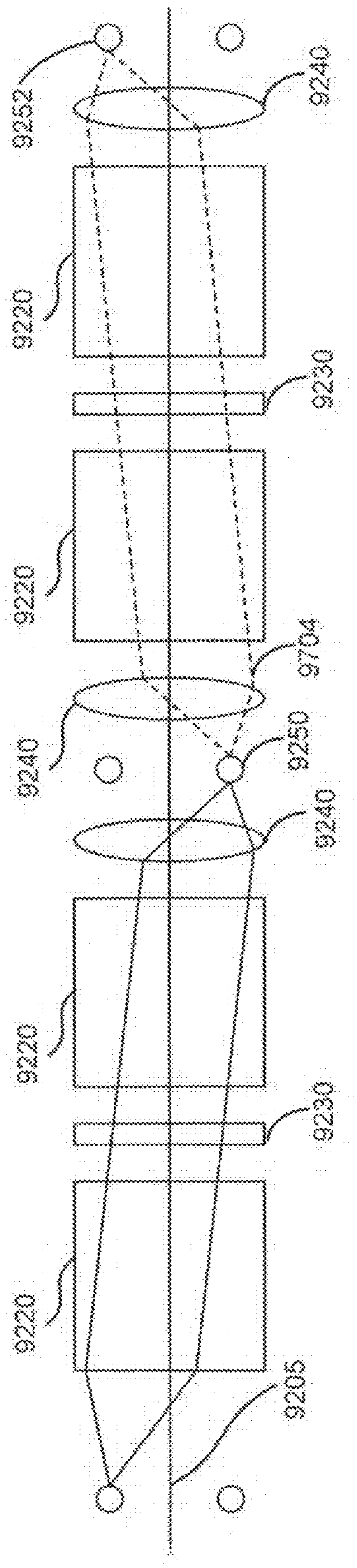

FIG. 97B is an unfolded schematic diagram illustrating artifact formation resulting from reflections from an in-coupling grating in the projection display system shown in FIG. 97A.

Figure 98:
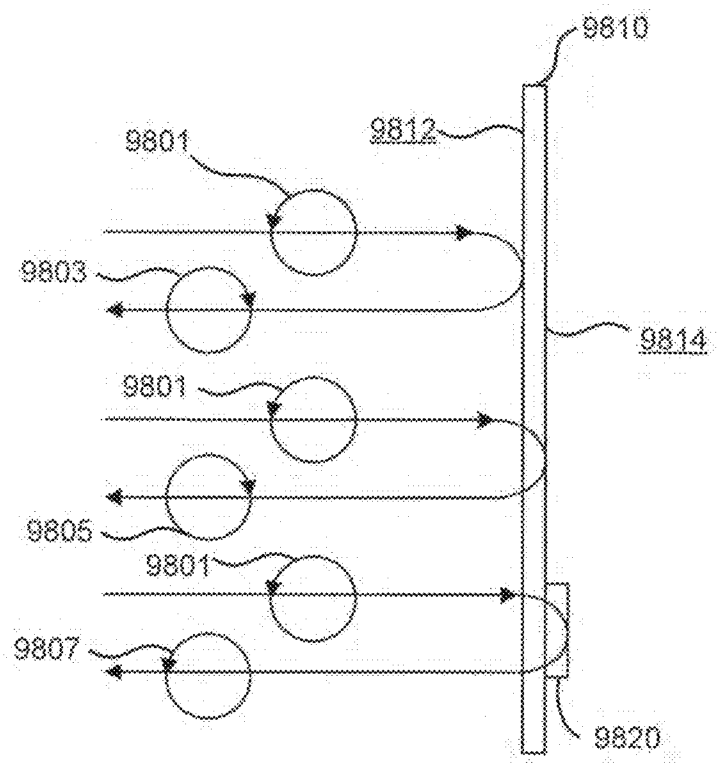

FIG. 98 is a schematic diagram illustrating reflections from an in-coupling grating element, according to one embodiment.

Figure 99A:
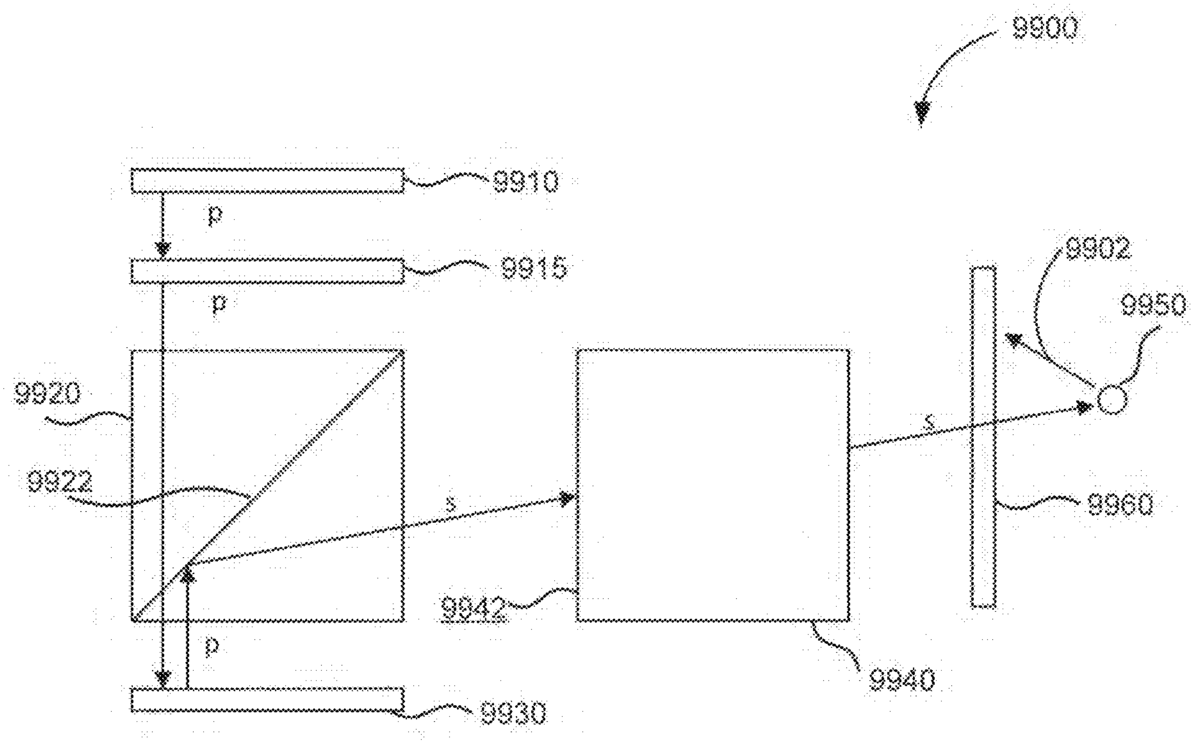

FIG. 99A is a schematic diagram illustrating a projector assembly with artifact prevention, according to another embodiment.

Figure 99B:
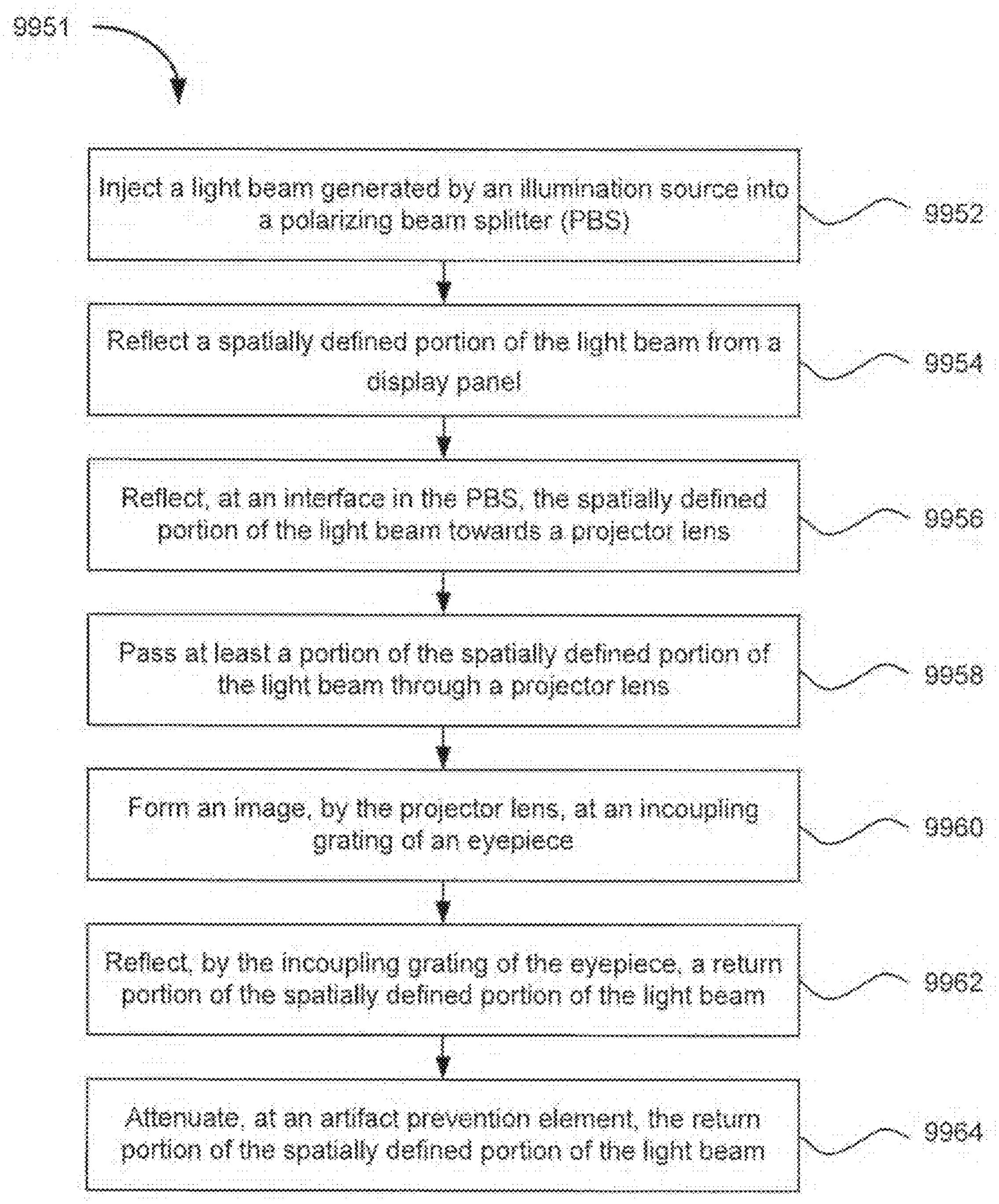

FIG. 99B is a flowchart illustrating a method of reducing artifacts in an optical system, according to an embodiment.

Figure 100:
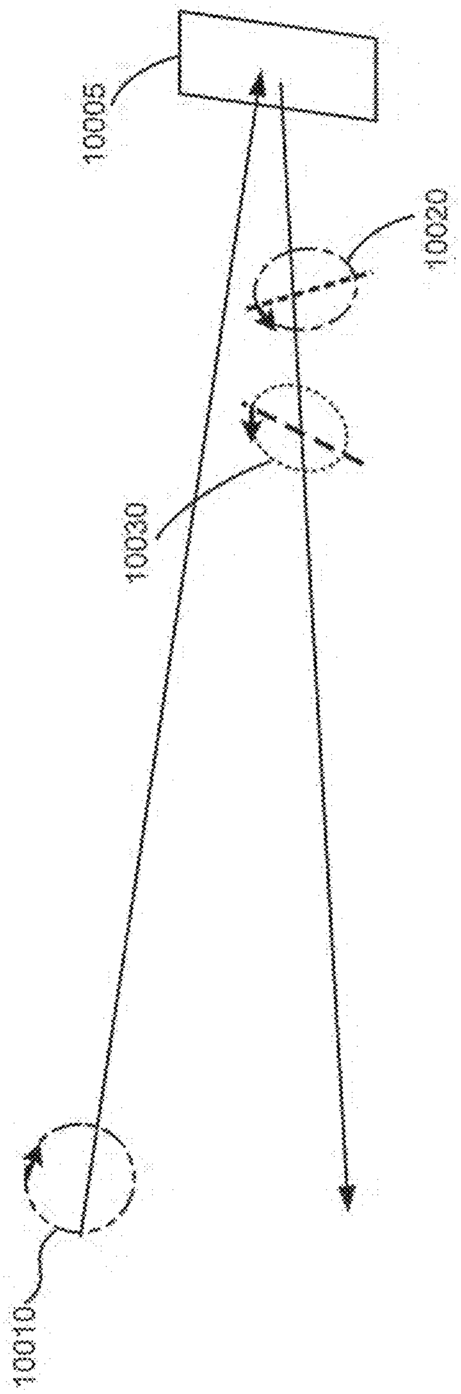

FIG. 100 illustrates reflection of light at the eyepiece in the absence of the reflection prevention element.

Figure 101A:
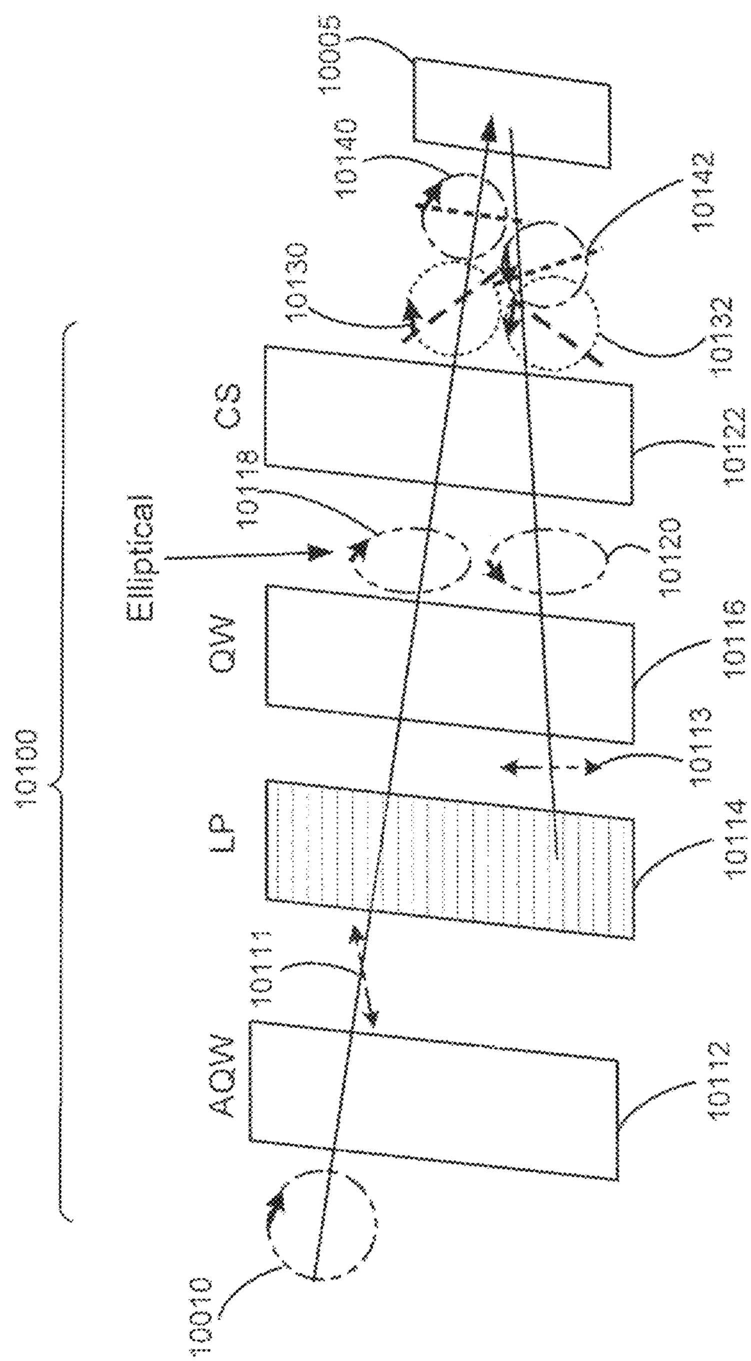

FIG. 101A illustrates blocking of reflections using an artifact prevention element, according to one embodiment.

Figure 101B:
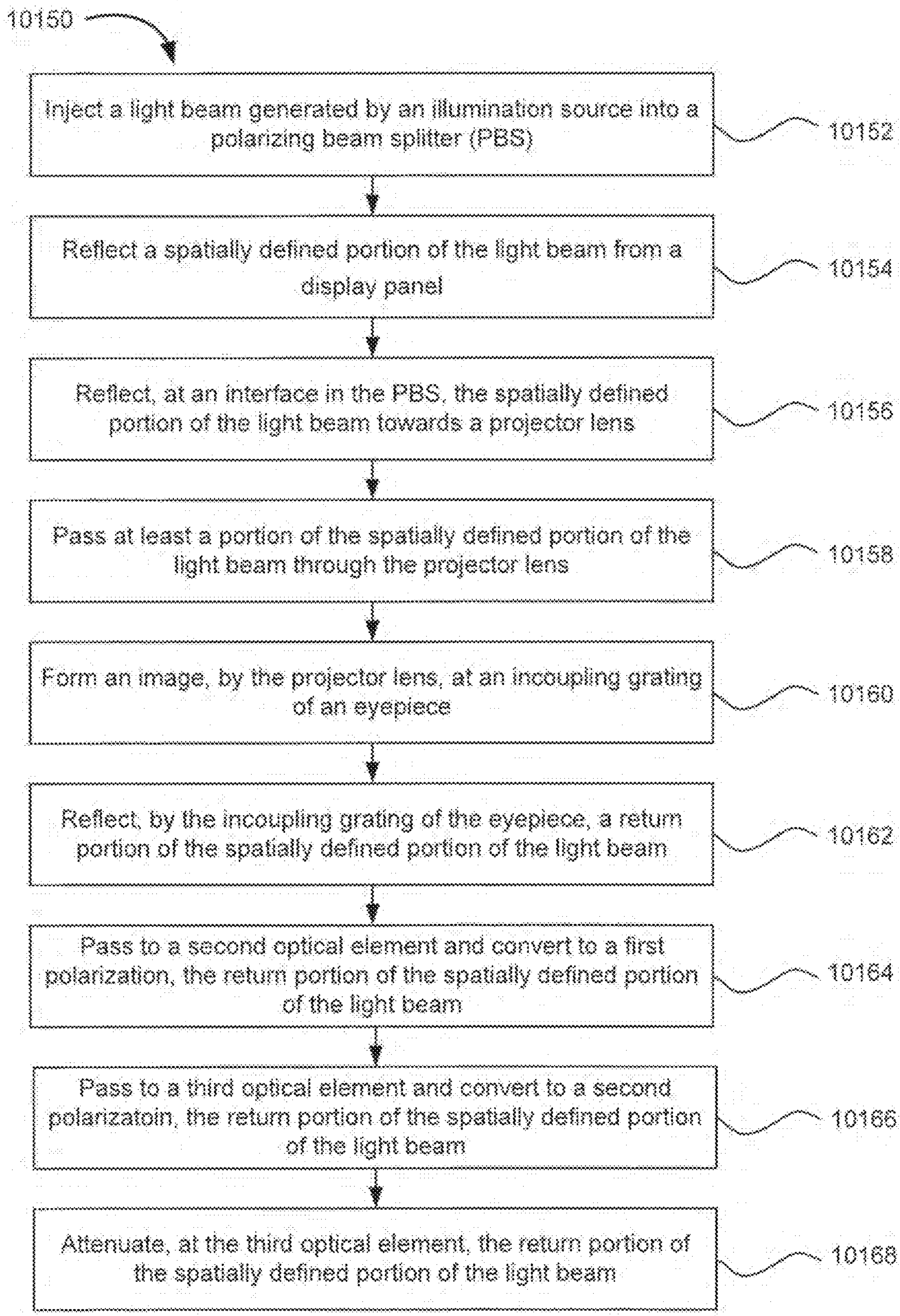

FIG. 101B is a flowchart illustrating a method of reducing artifacts in an optical system, according to one embodiment.

Figure 102:
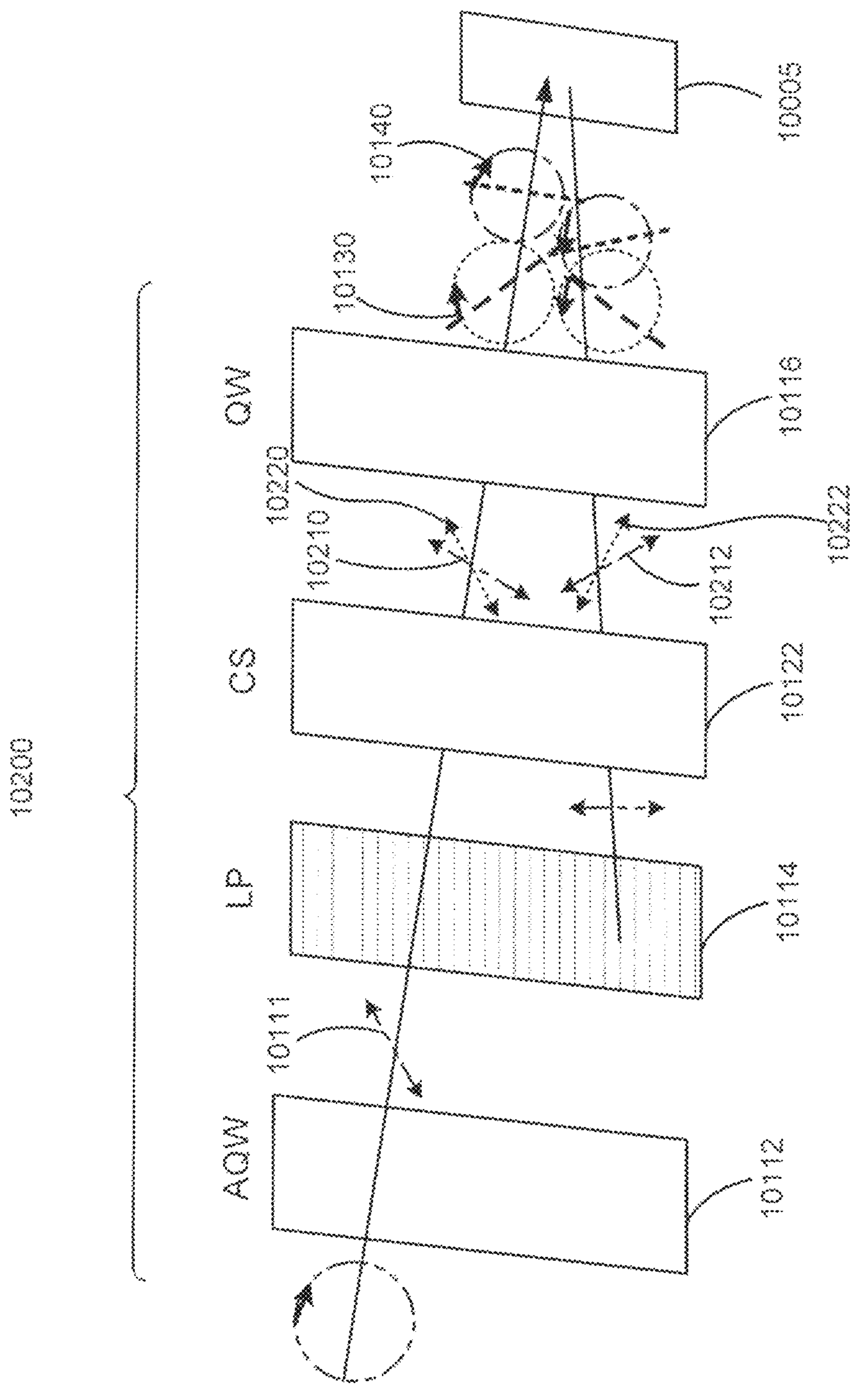

FIG. 102 illustrates blocking of reflections using an alternative geometry artifact prevention element, according to one embodiment.

Figure 103:
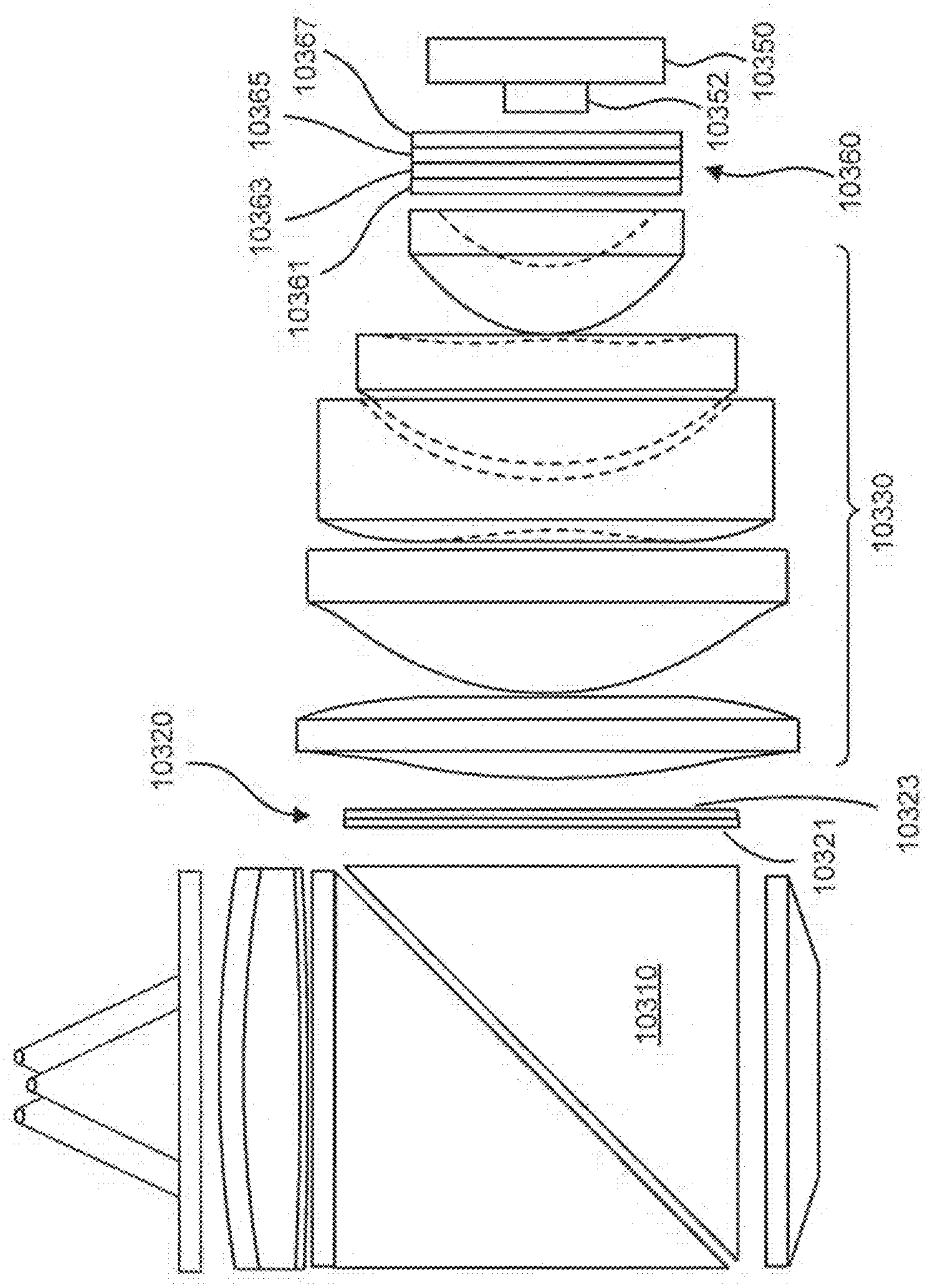

FIG. 103 is a schematic diagram of a projector assembly with multiple artifact prevention elements, according to one embodiment.

Figure 104A:
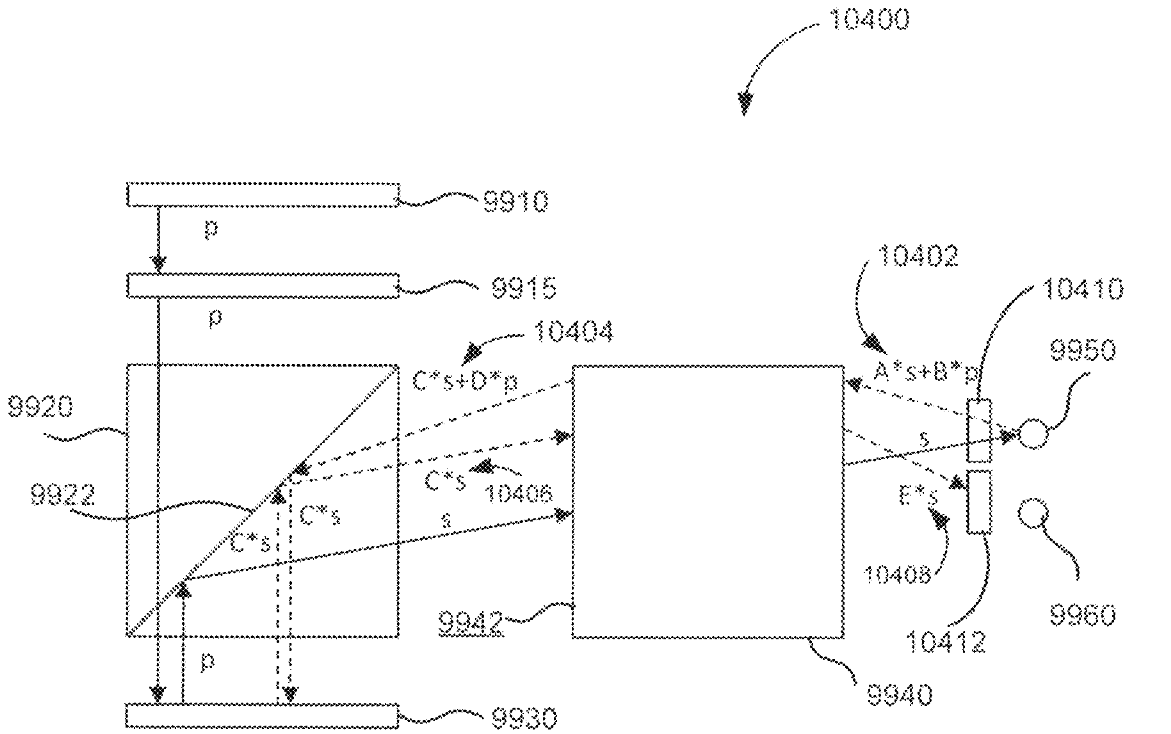

FIG. 104A is a schematic diagram illustrating a projector assembly with artifact prevention using color filters, according to one embodiment.

Figure 104B:
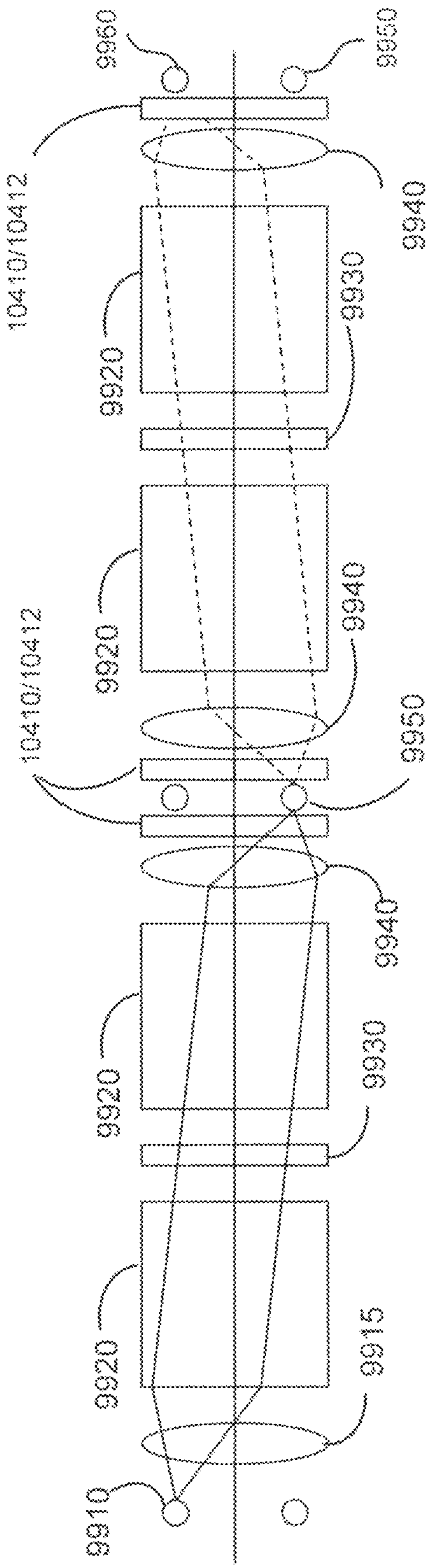

FIG. 104B is a unfolded schematic diagram illustrating the projector assembly shown in FIG. 104A.

Figure 104C:
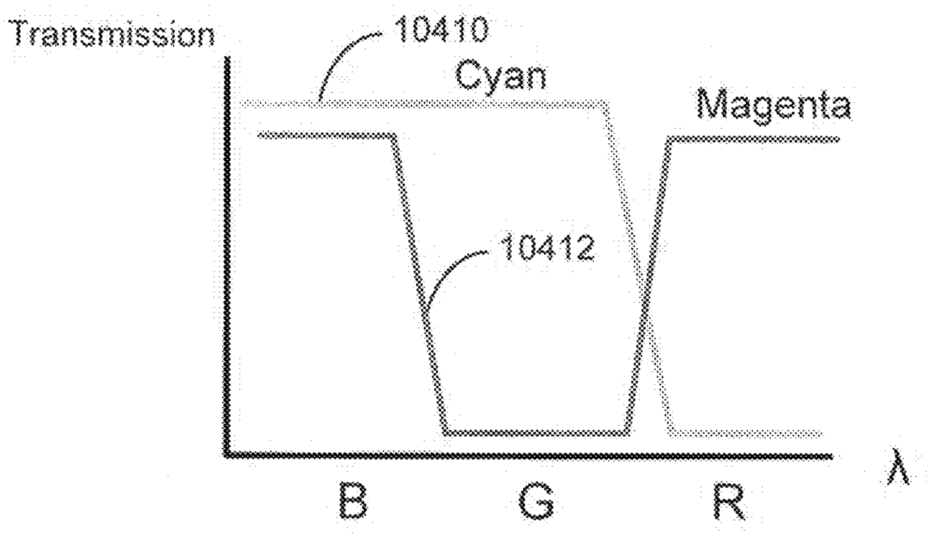

FIG. 104C is a transmission plot for cyan and magenta color filters, according to one embodiment.

Figure 104D:
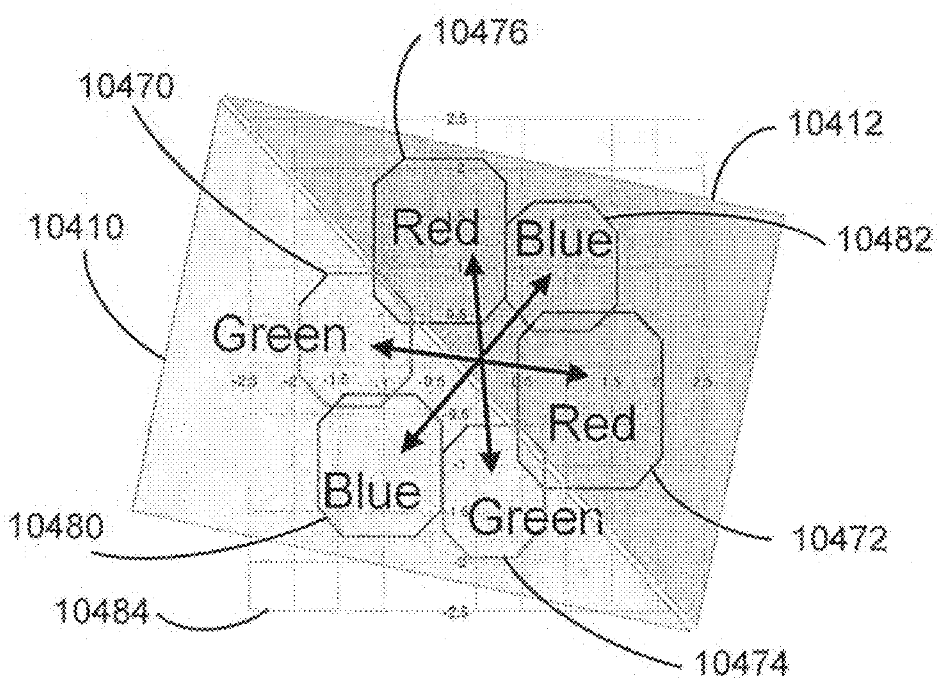

FIG. 104D is a schematic diagram illustrating spatial arrangement of color filters and sub-pupils, according to one embodiment.

Figure 104E:
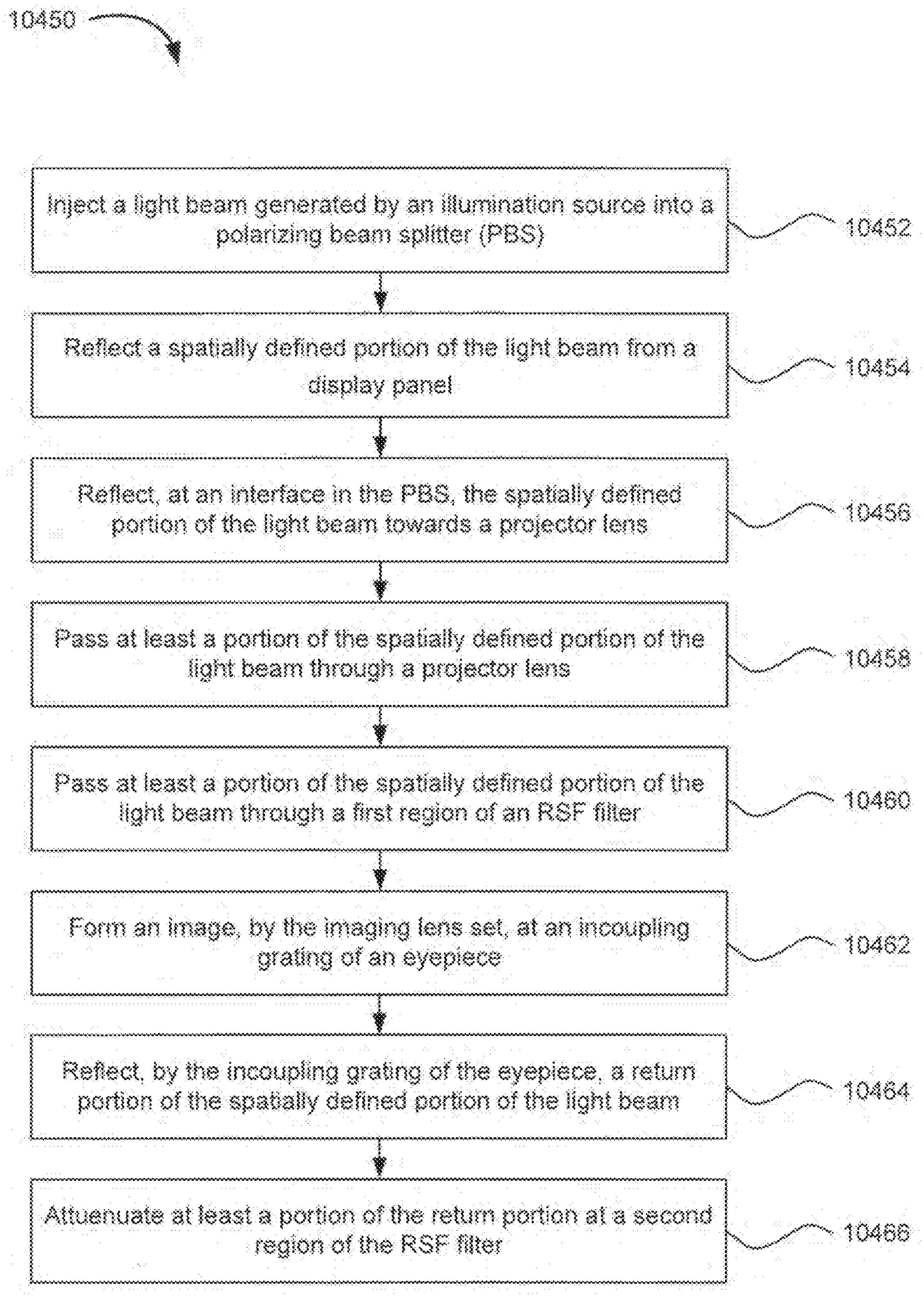

FIG. 104E is a flowchart illustrating a method of reducing artifacts in an optical system, according to one embodiment.

Figure 105:
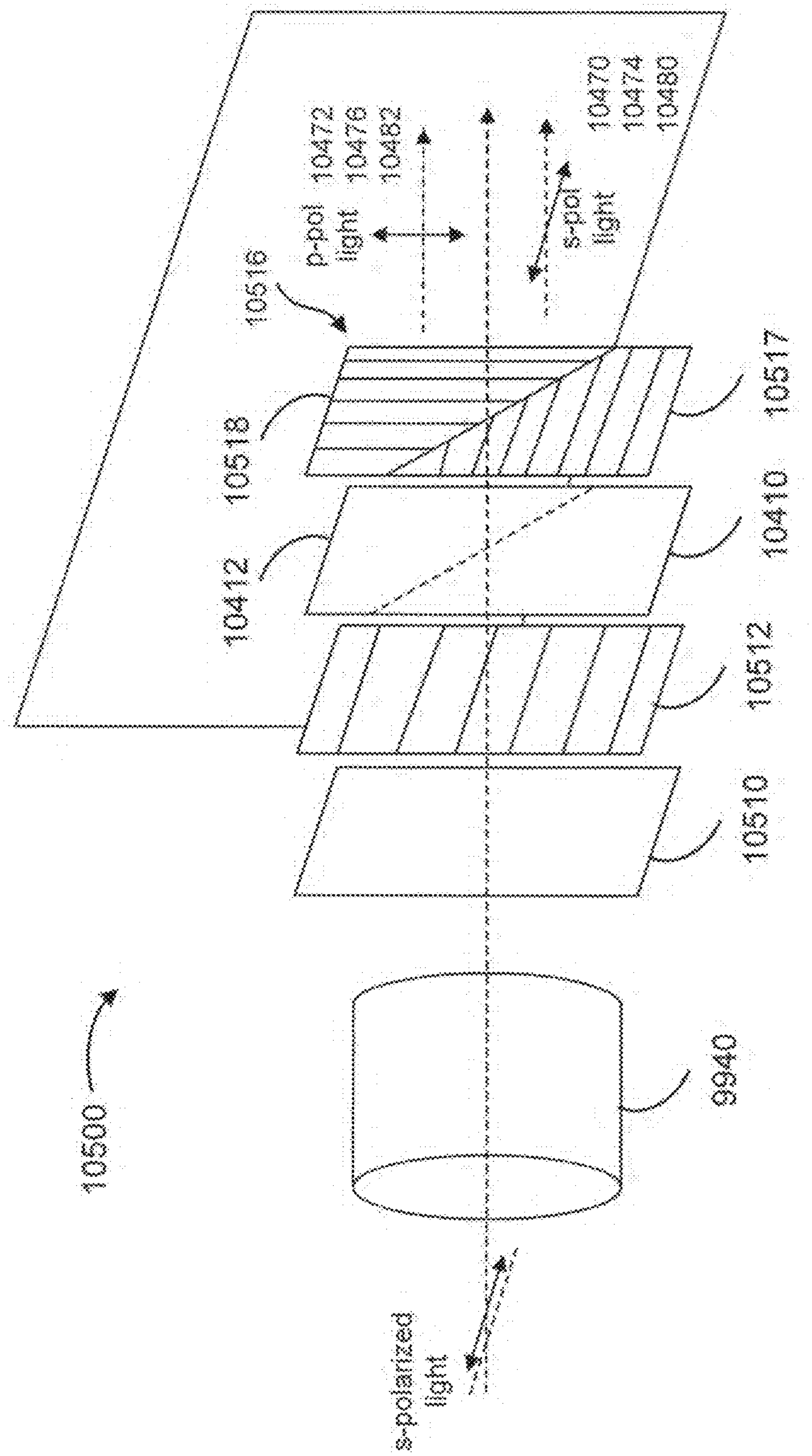

FIG. 105 is a schematic diagram illustrating a color filter system, according to one embodiment.

Figure 106:
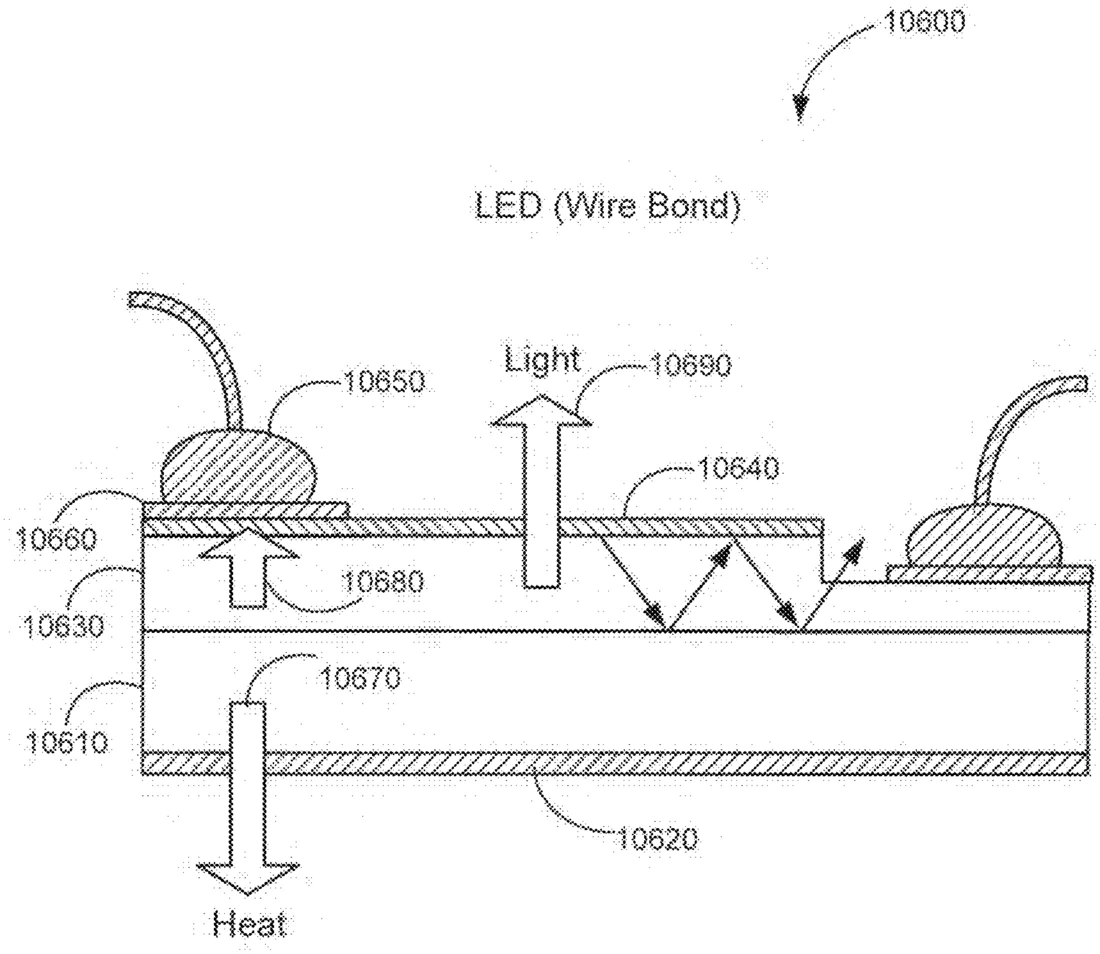

FIG. 106 is a schematic diagram illustrating a wire bonded LED, according to one embodiment.

Figure 107:
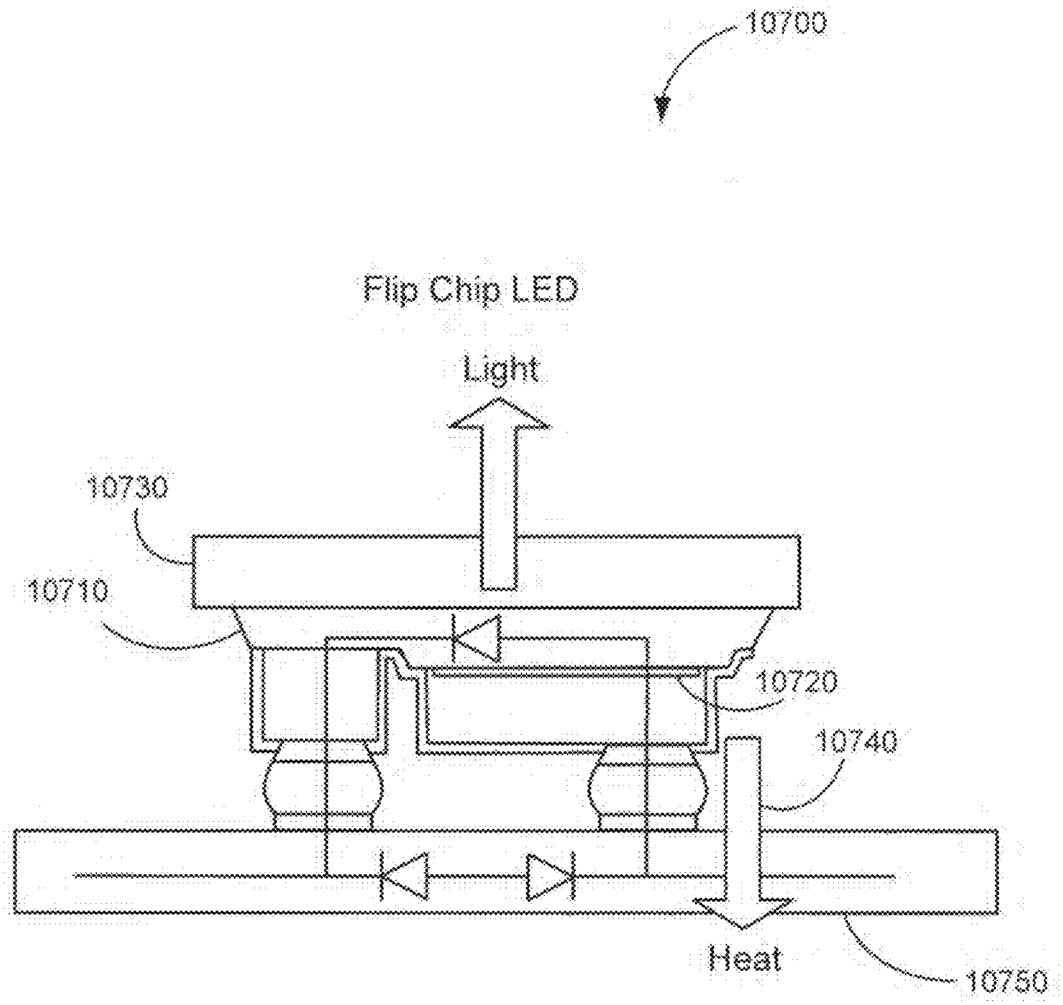

FIG. 107 is a schematic diagram illustrating a flip-chip bonded LED, according to one embodiment.

Figure 108:
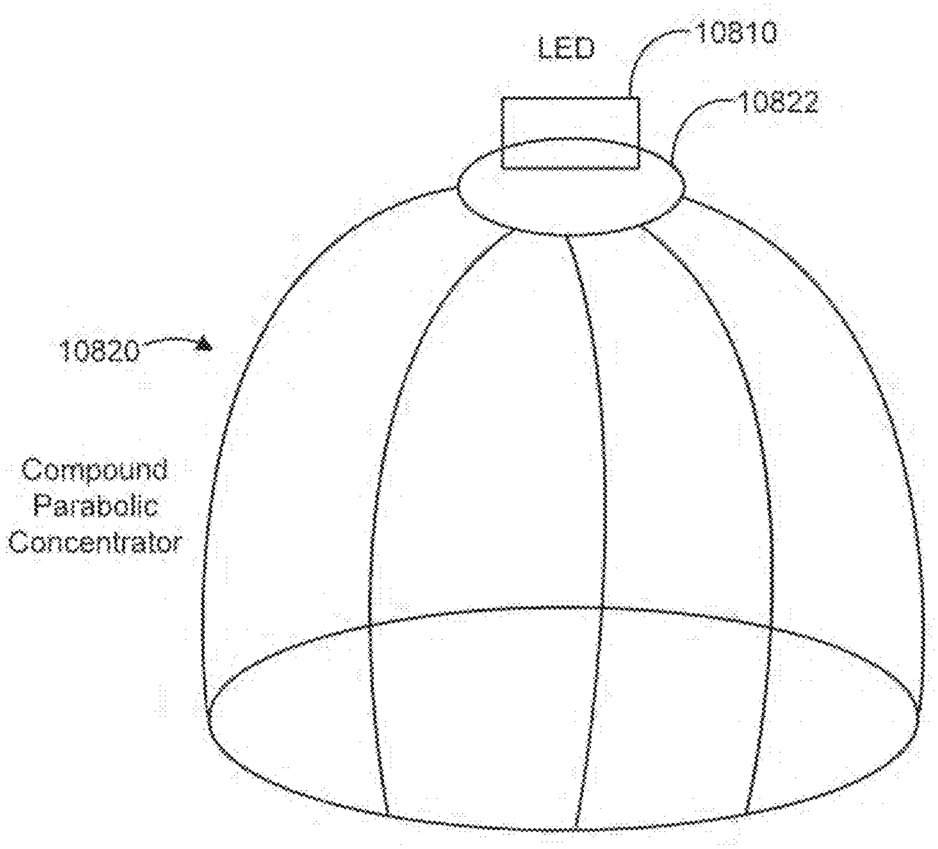

FIG. 108 is a schematic diagram illustrating an LED integrated with a parabolic beam expander, according to one embodiment.

Figure 109:
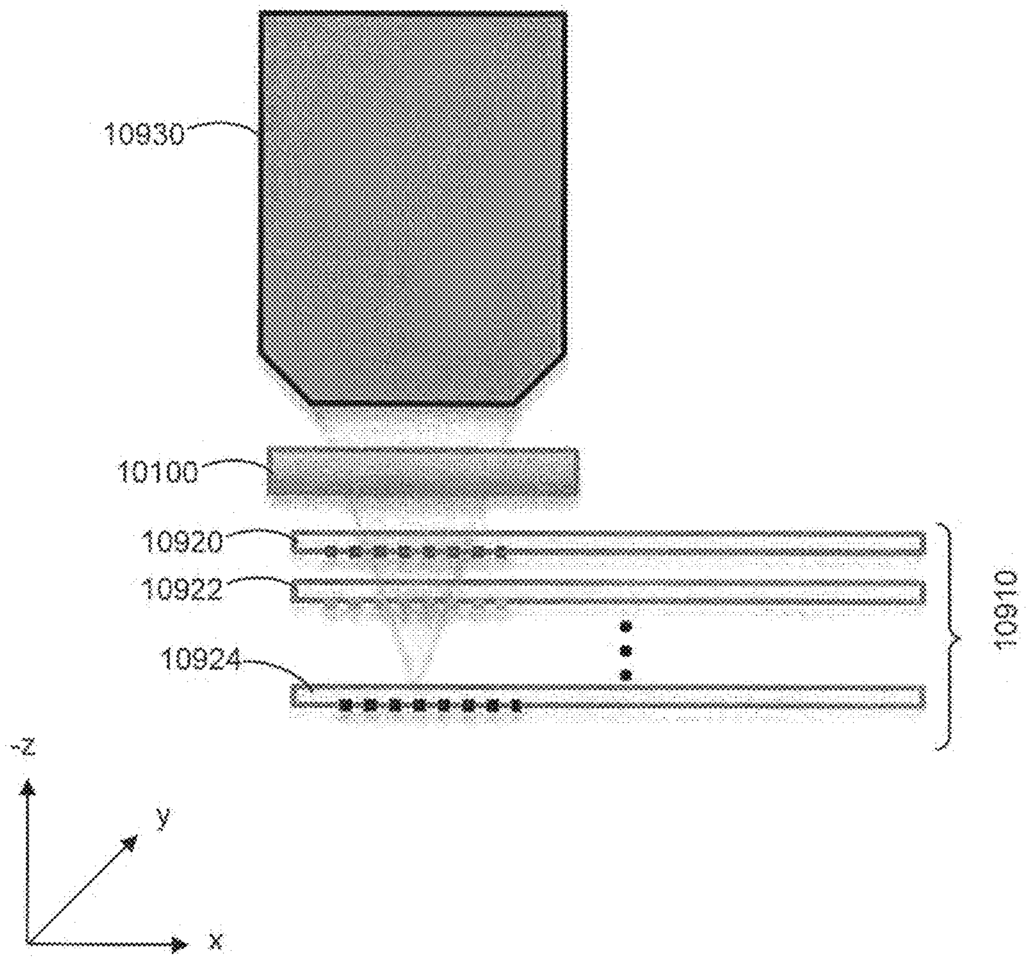

FIG. 109 is a schematic diagram illustrating a single pupil system including a projector assembly and eyepiece, according to one embodiment.

Figure 110A:
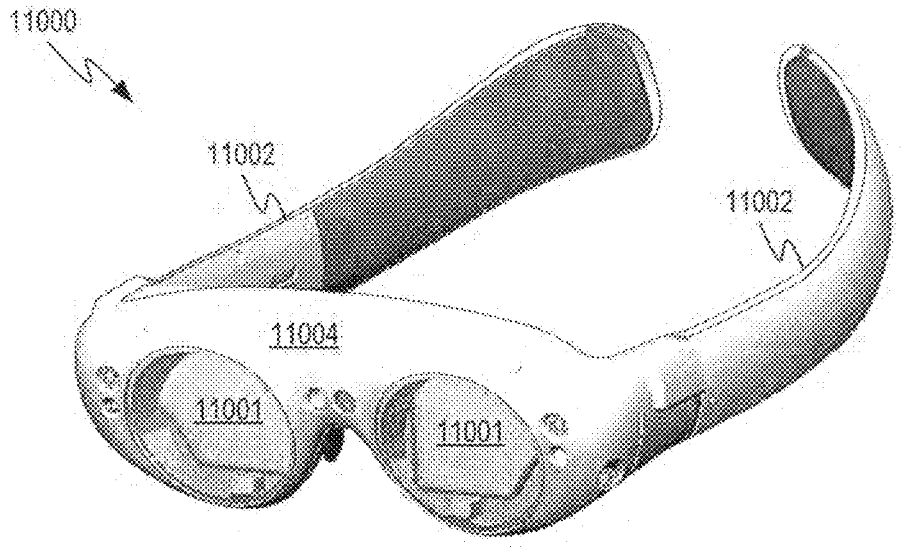
Figure 110B:
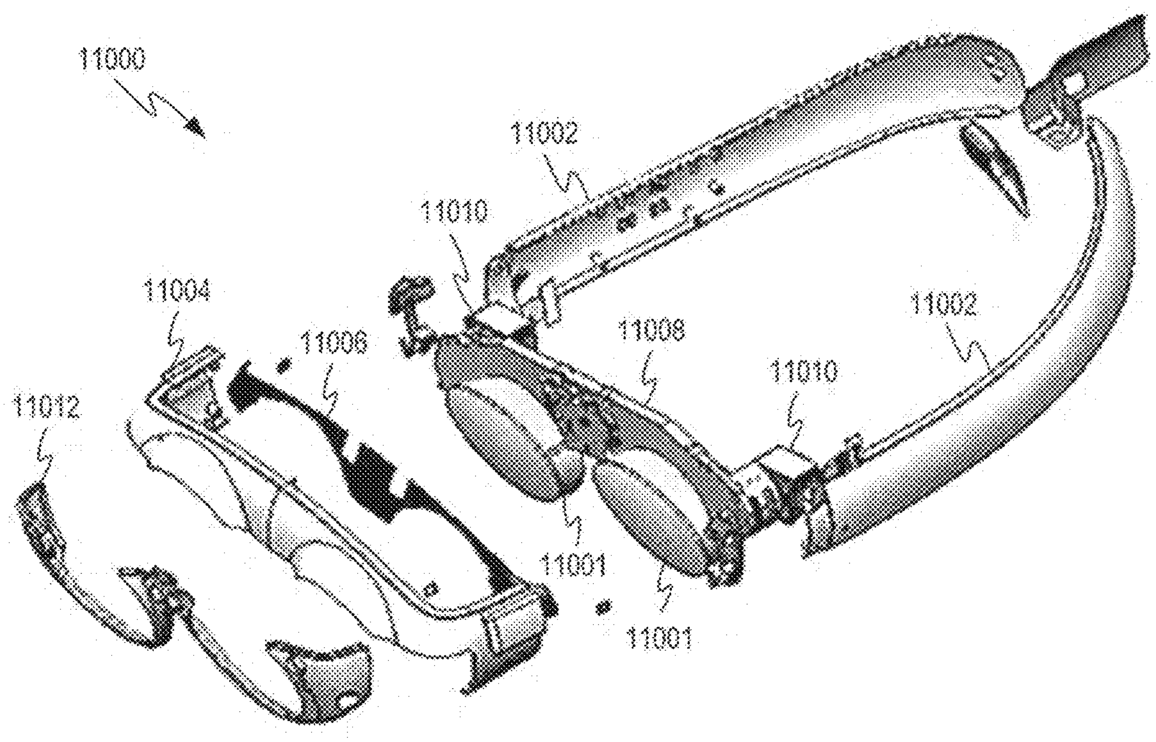
Figure 110C:
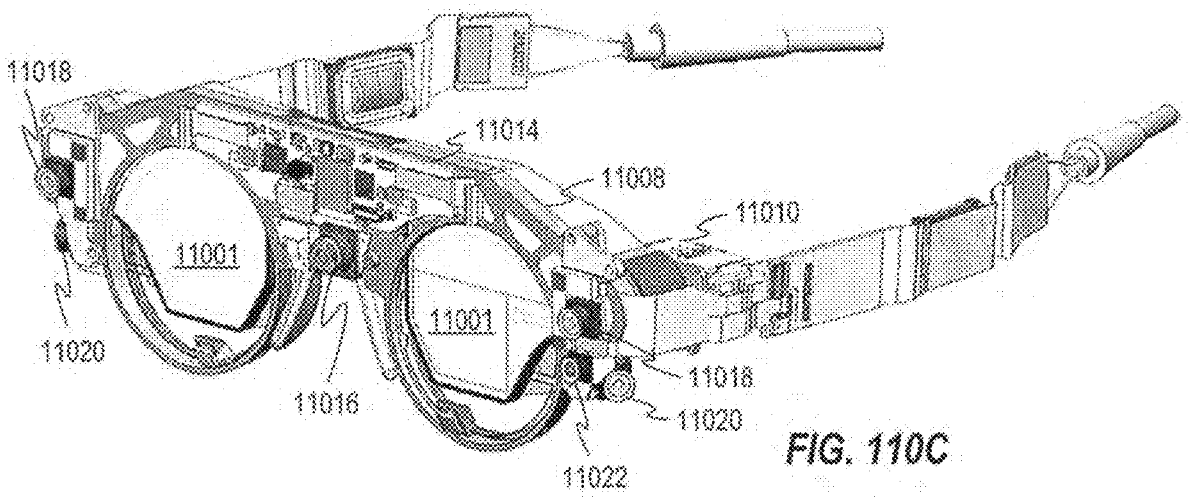
Figure 110D:
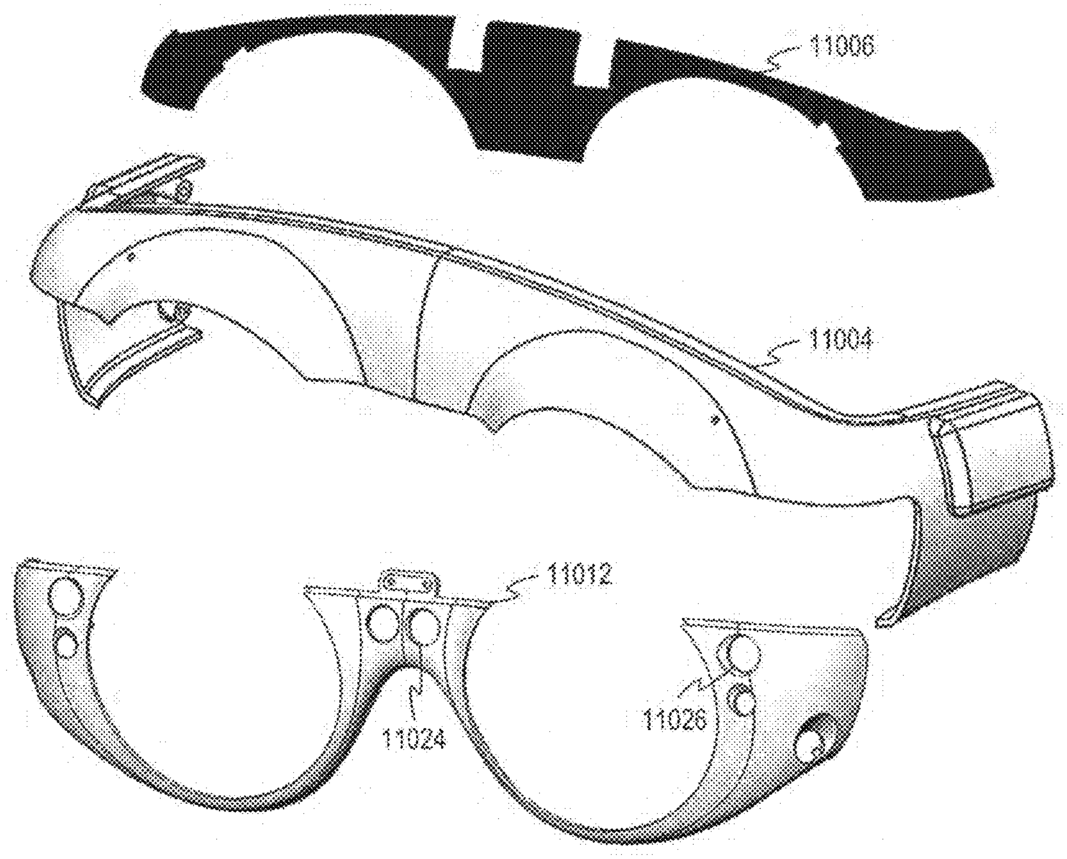
Figure 110E:
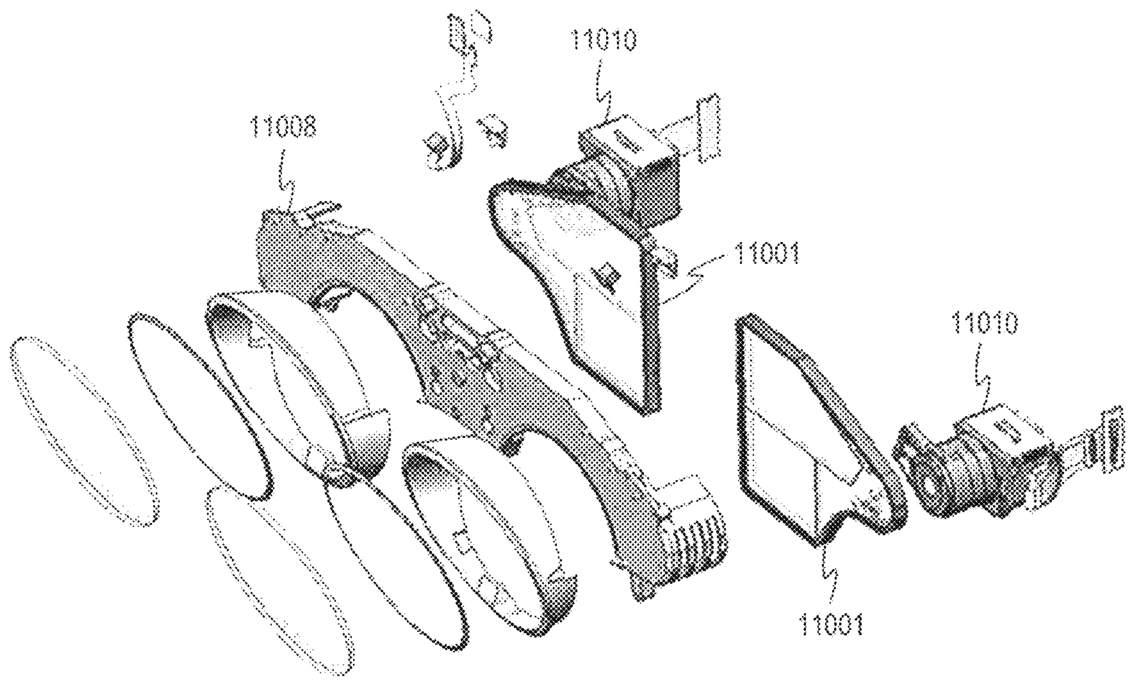
Figure 111A:
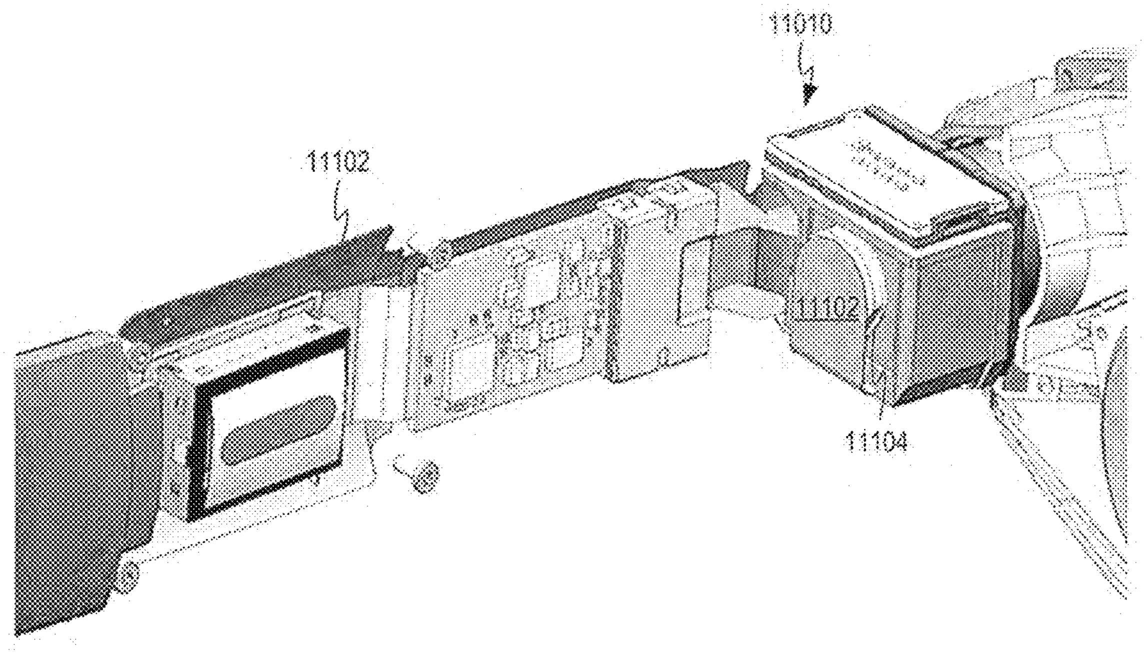
Figure 111B:
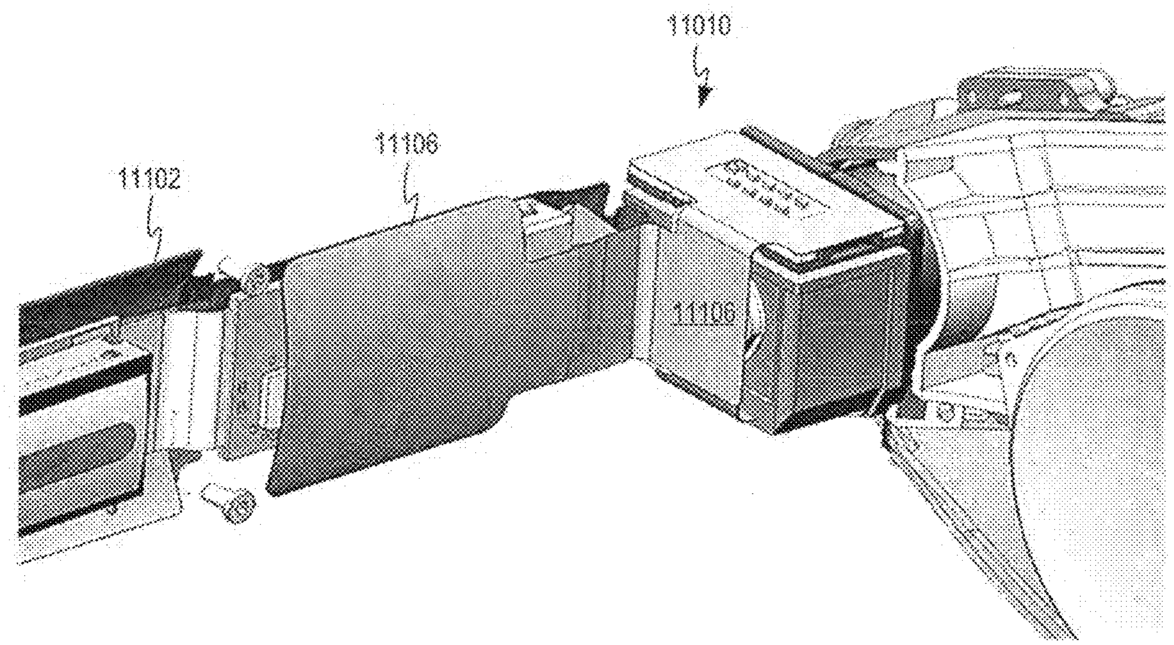
Figure 111C:
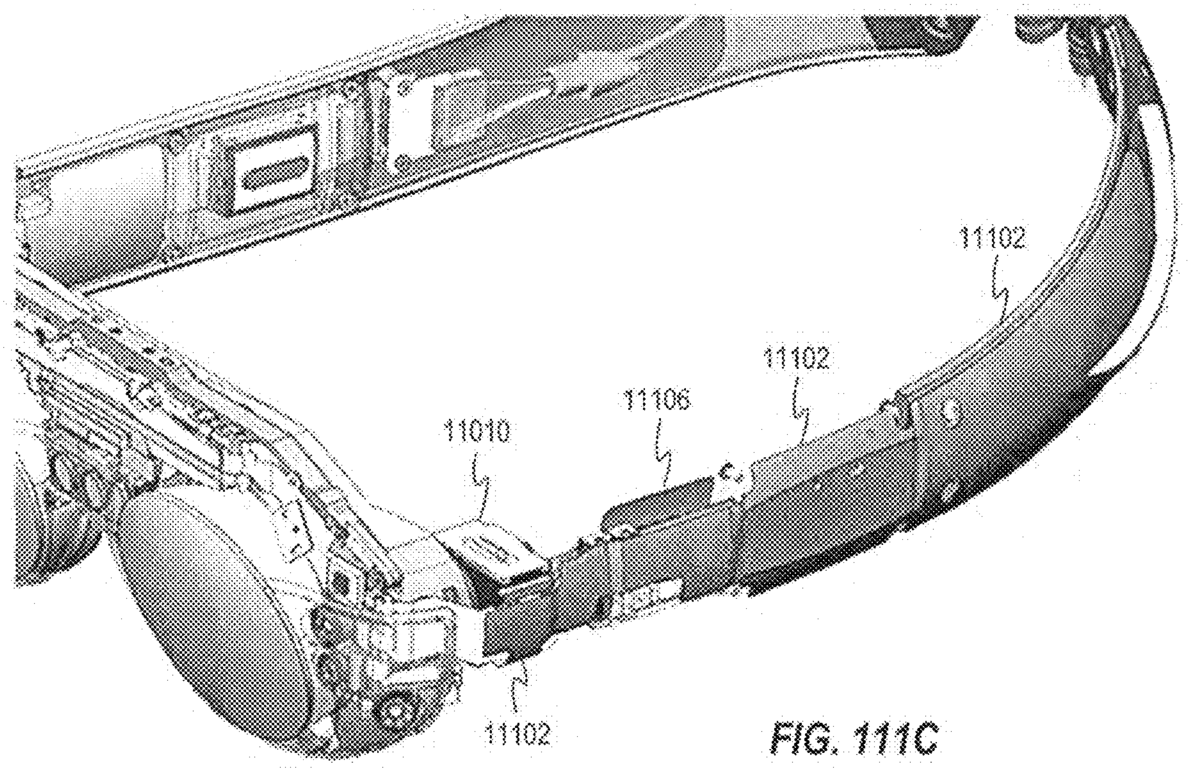
Figure 111D:
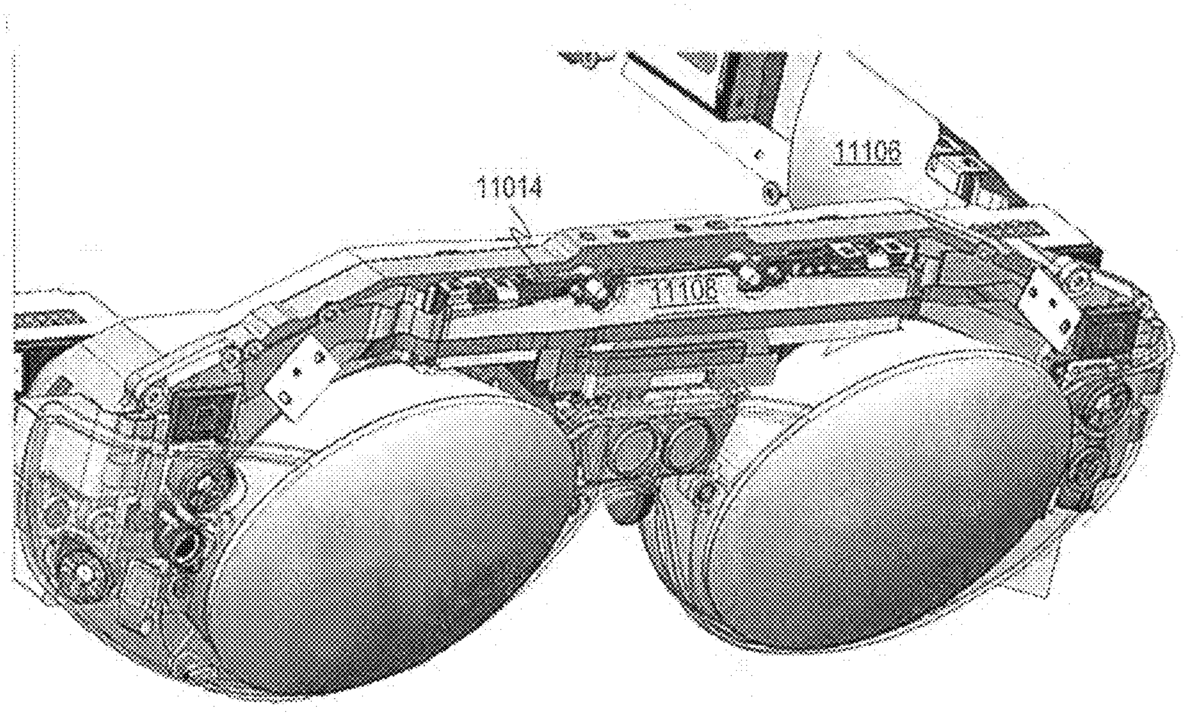
Figure 111E:
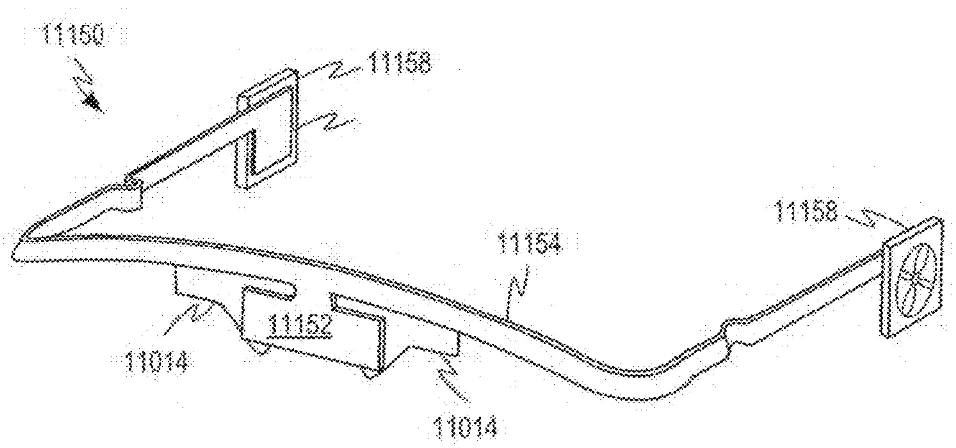
Figure 111F:
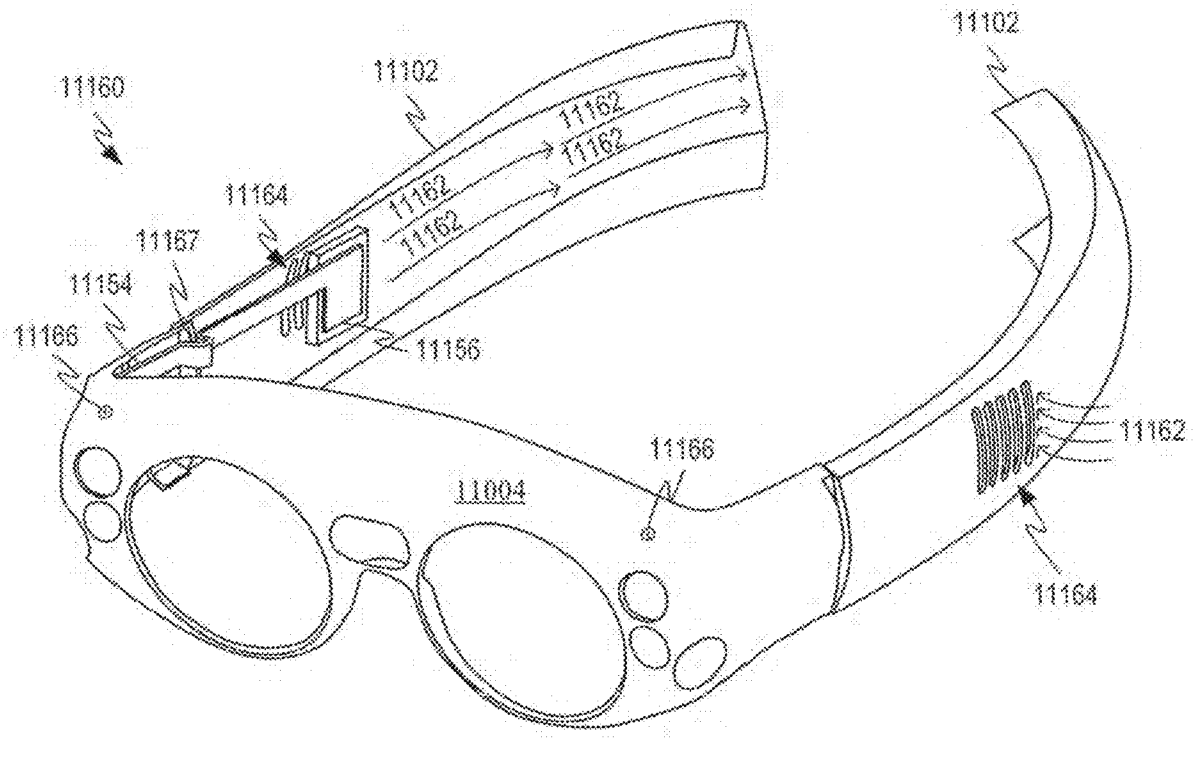
Figure 111G:
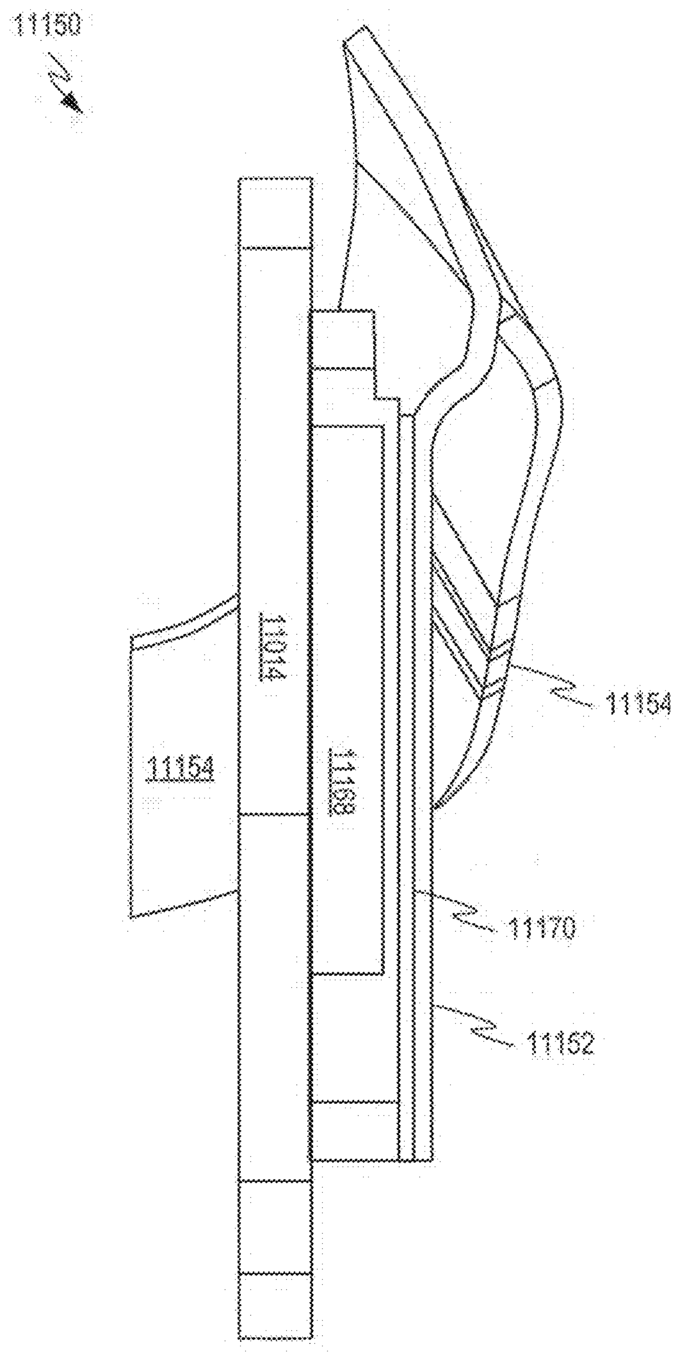
Figure 114A:
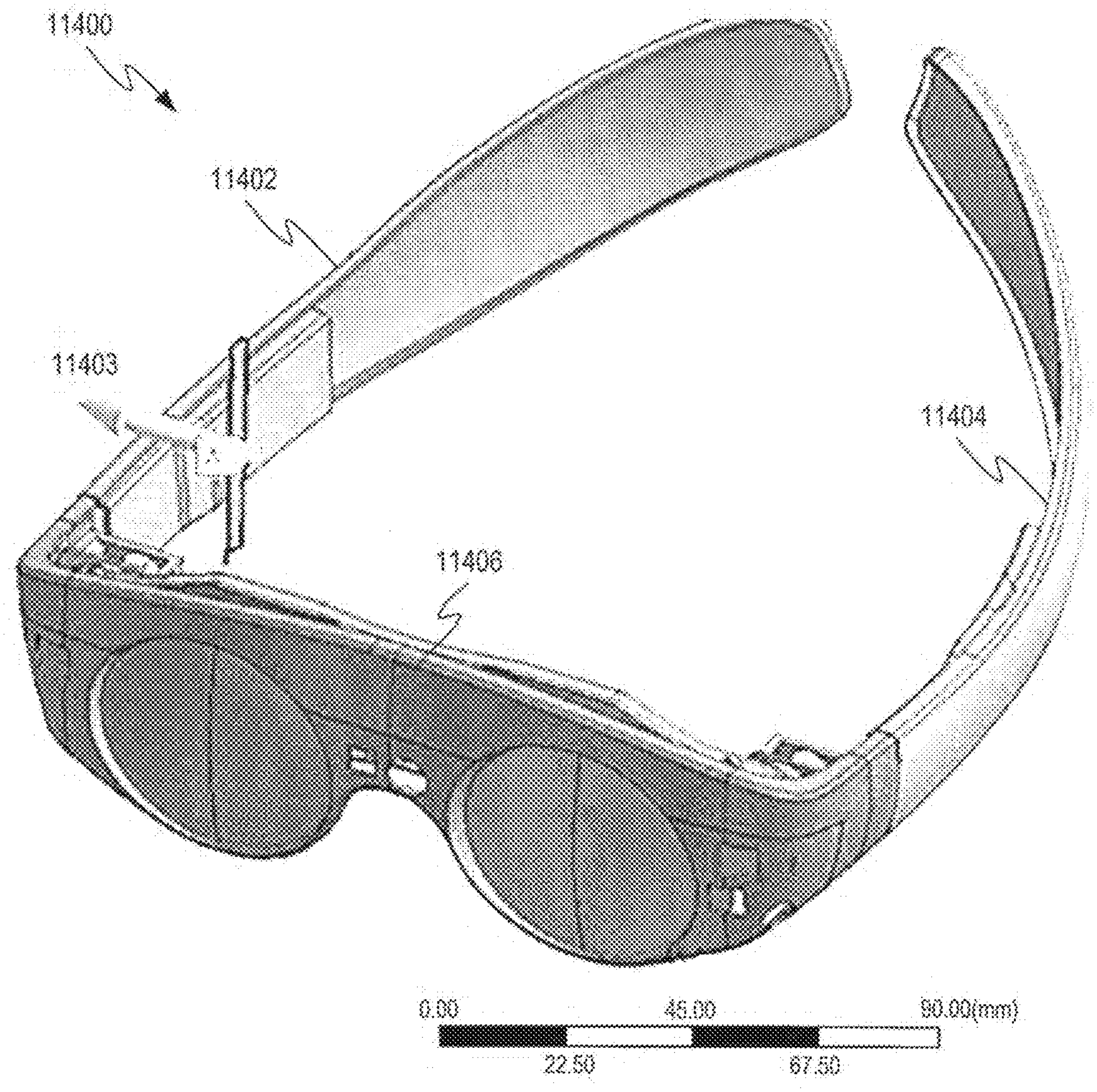
Figure 114B:
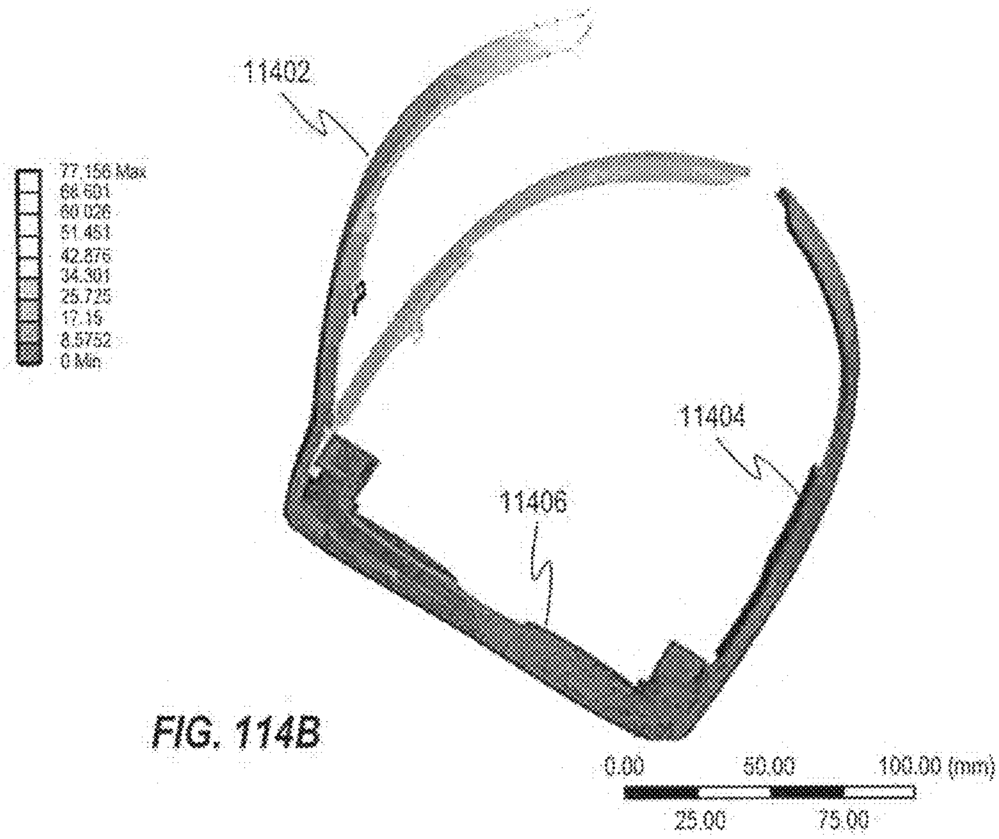
Figure 114C:
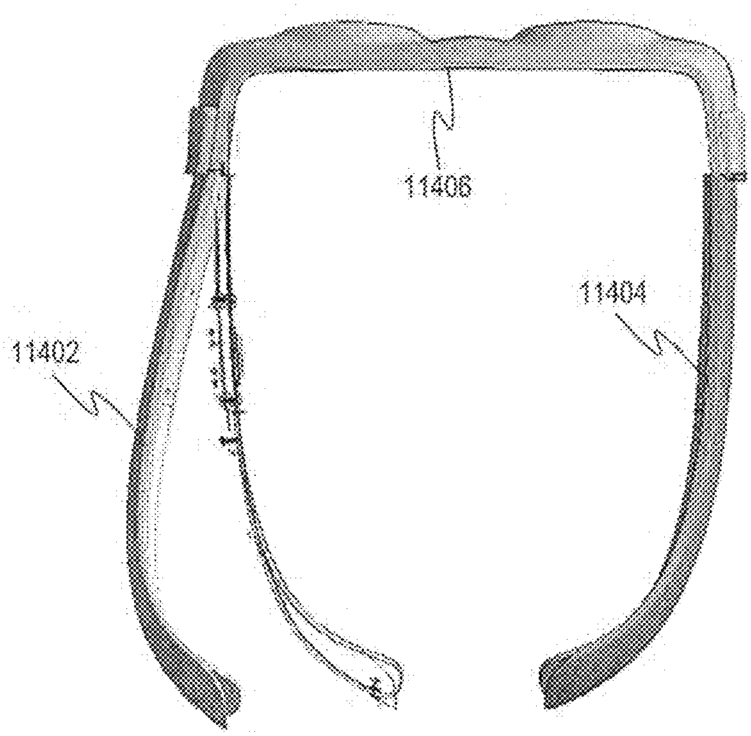
Figure 114D:
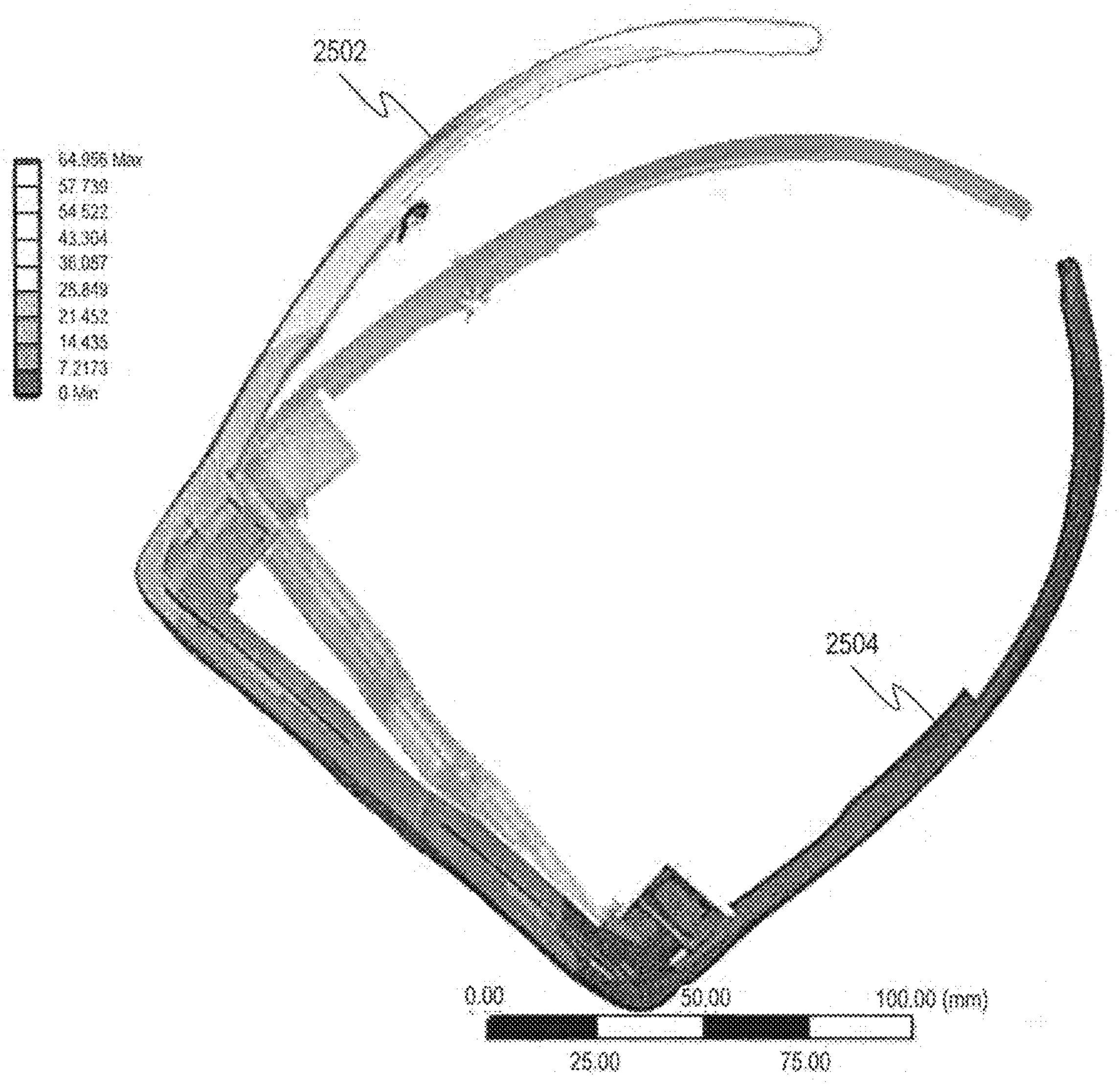

FIG. 110A-110B show perspective views of an optical device;

FIG. 110C shows a perspective view of an optics frame of the optical device with multiple electronic components attached thereto;

FIG. 110D shows a perspective view of a front band and sensor cover of the optical device;

FIG. 110E shows an exploded perspective view of the optics frame and other associated components;

FIGS. 111A-111D show how heat is distributed along various components of the optical device;

FIG. 111E-111G show perspective and side cross-sectional views of a heat dissipation system that utilizes forced convection as opposed to the passive convection illustrated in previous embodiments;

FIG. 112A shows a cross-sectional view depicting the transfer of heat from a PCB through a conduction layer to a heat-spreading layer;

FIG. 112B shows a chart listing the material properties of a conduction layer;

FIGS. 113A-113D show various heat maps overlaid on parts of the optical device;

FIG. 114A shows a perspective view of an optical device in which only one arm is capable of moving with respect to the frame;

FIG. 114B shows an overlay illustrating which portions of the optical device deform the most with respect to one another;

FIG. 114C shows a top view of the optical device showing a range of motion of the flexible arm; and FIG. 114D shows an overlay illustrating how portions of an optical device in which both arms flex move with respect to one another.

Figure 115:
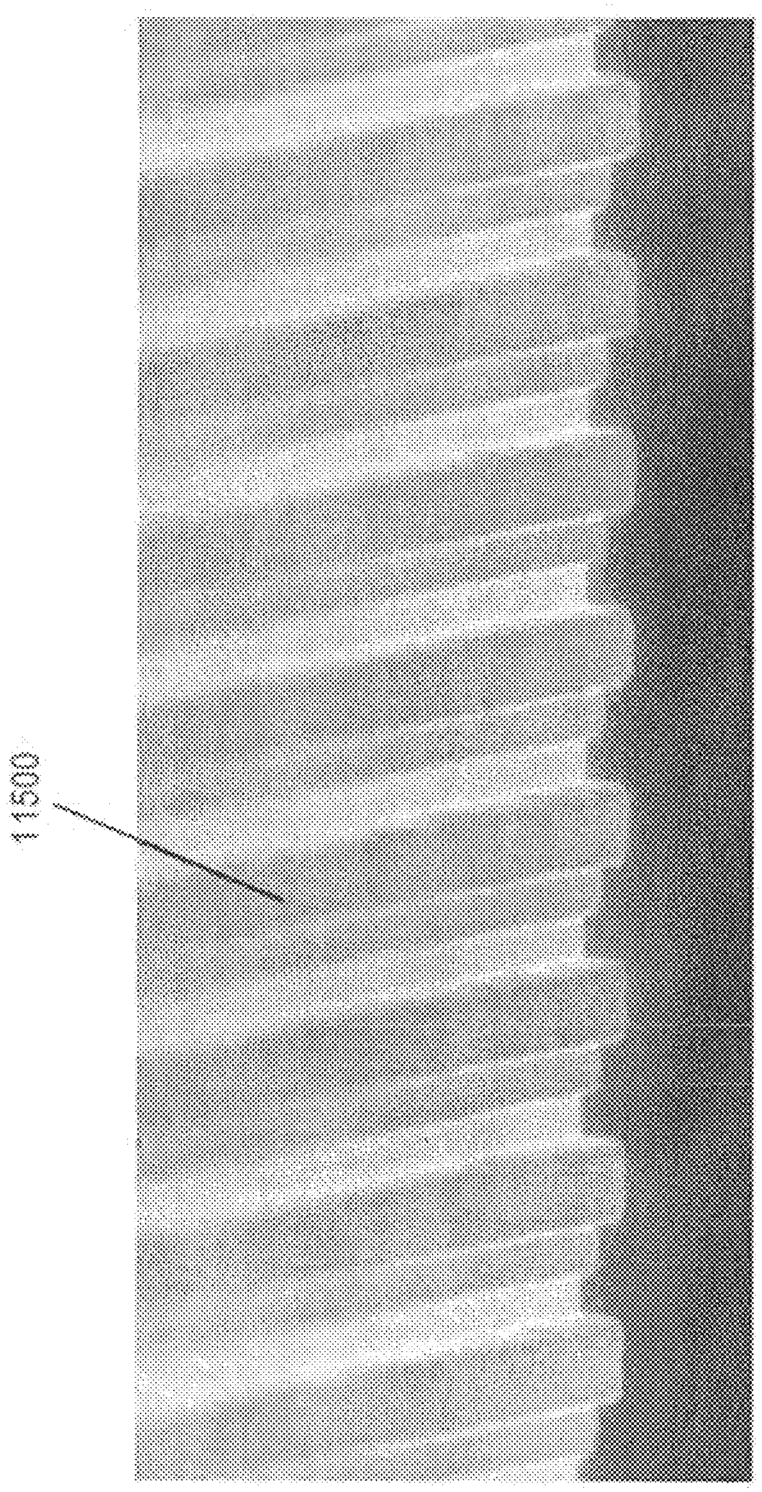

FIG. 115 is a simplified diagram illustrating optimizations for an eyepiece of a viewing optics assembly according to some embodiments of the present invention.

Figure 116A:
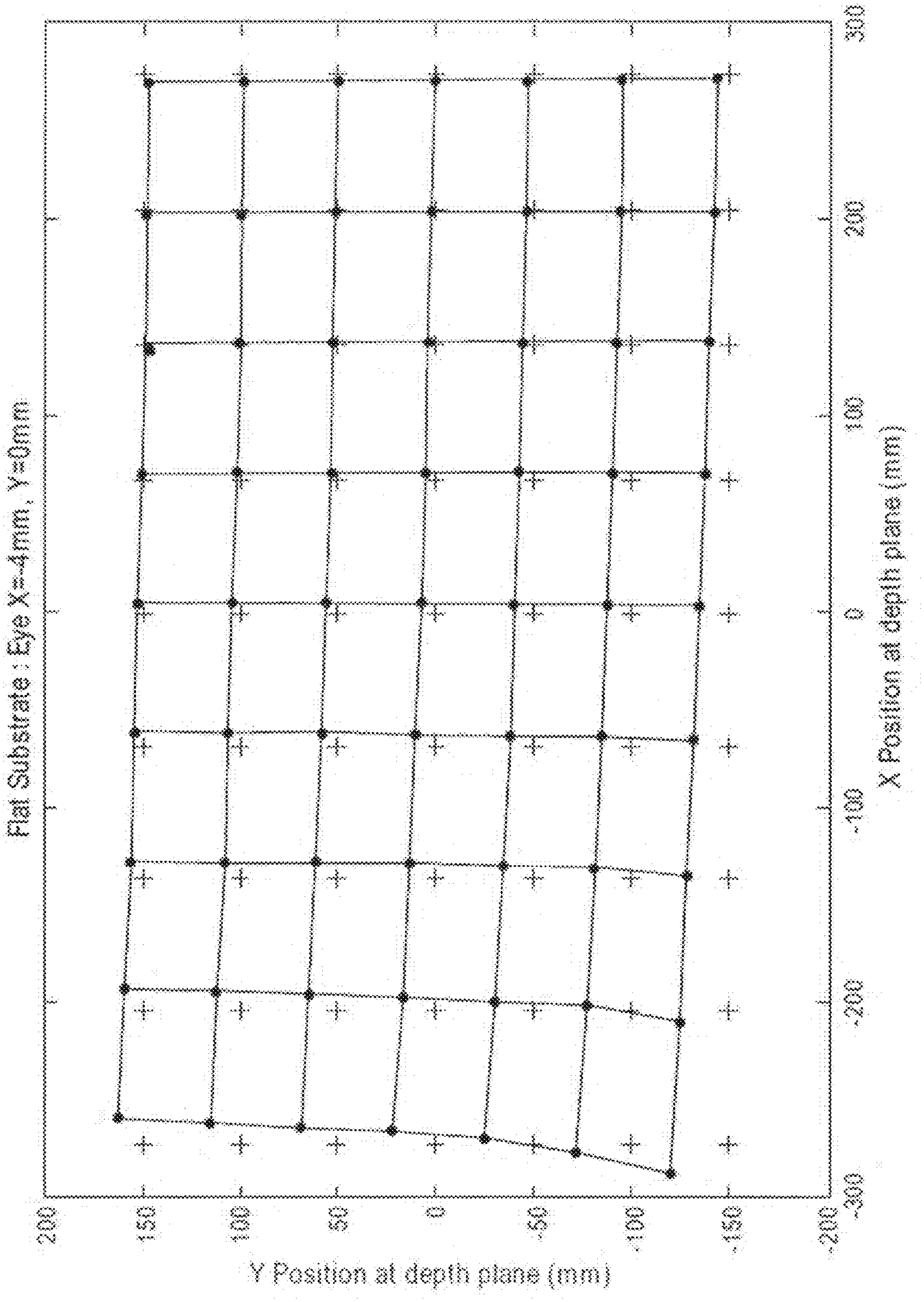

FIG. 116A is a graph illustrating the total thickness variation (TTV) effect on field distortion for a dome apex in the EPE according to some embodiments of the present invention.

Figure 116B:
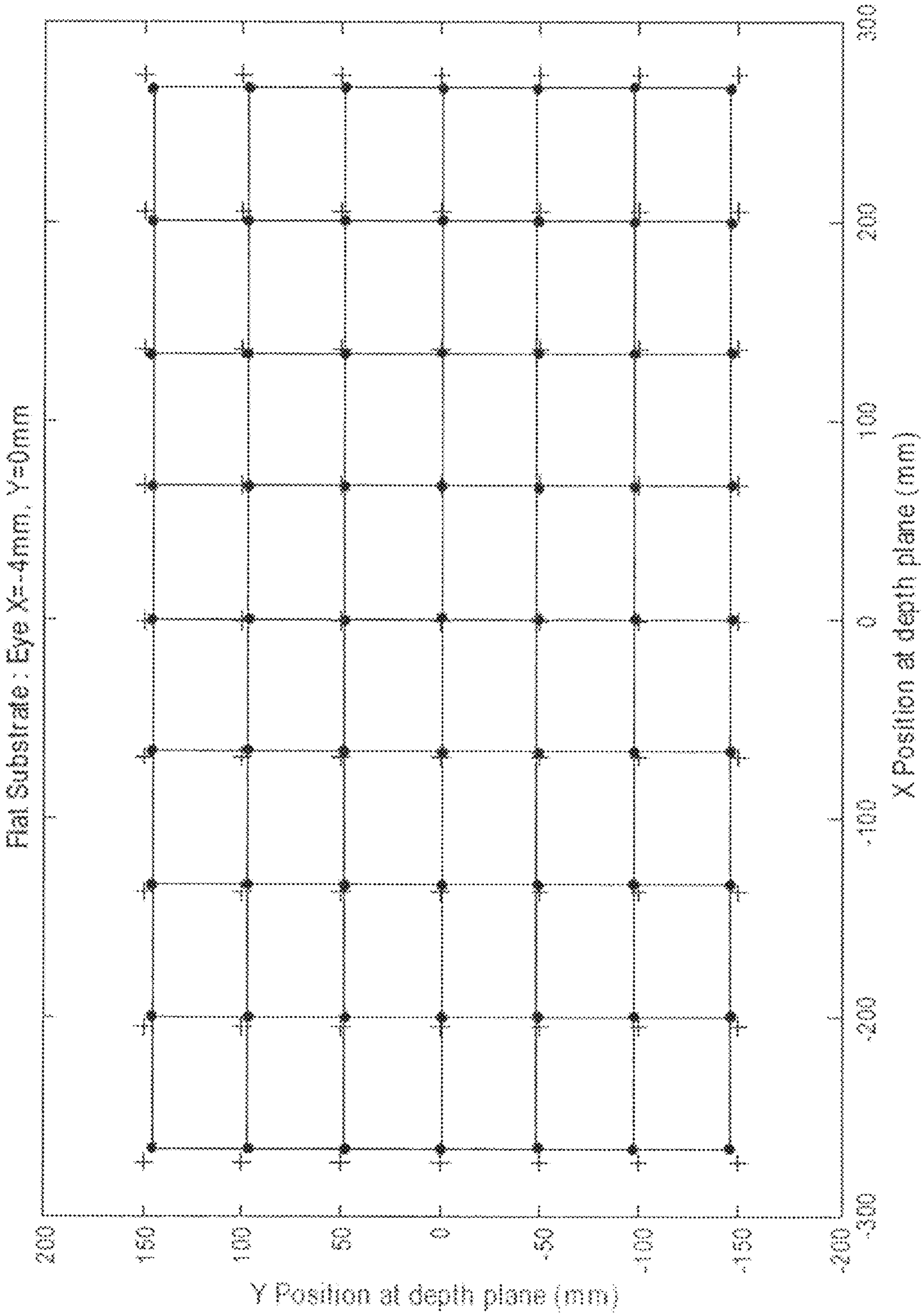

FIG. 116B is a graph illustrating the TTV effect on field distortion for a flat substrate according to some embodiments of the present invention.

Figure 116C:
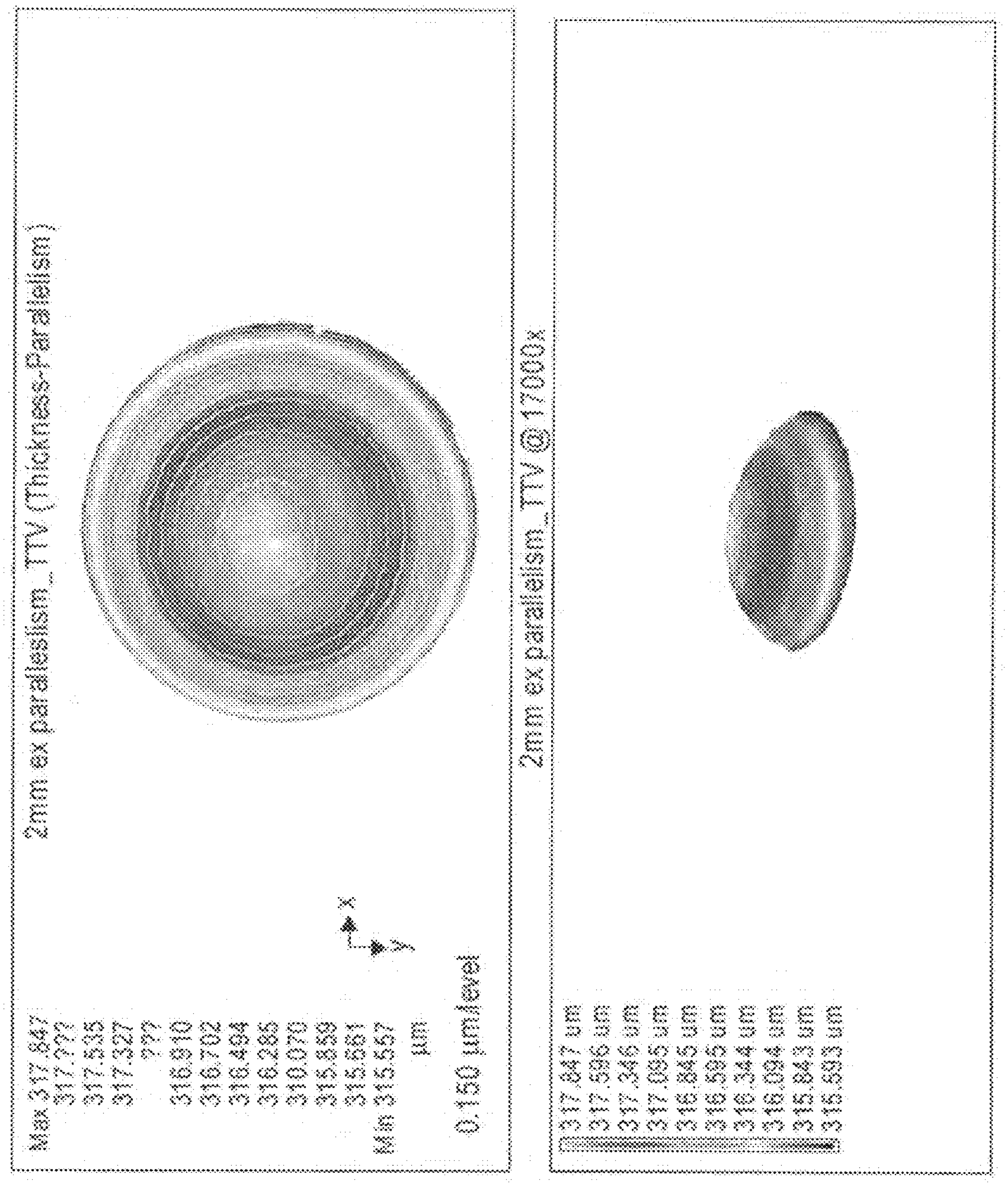

FIG. 116C is a graph illustrating measured TTV according to some embodiments of the present invention.

Figure 117A:
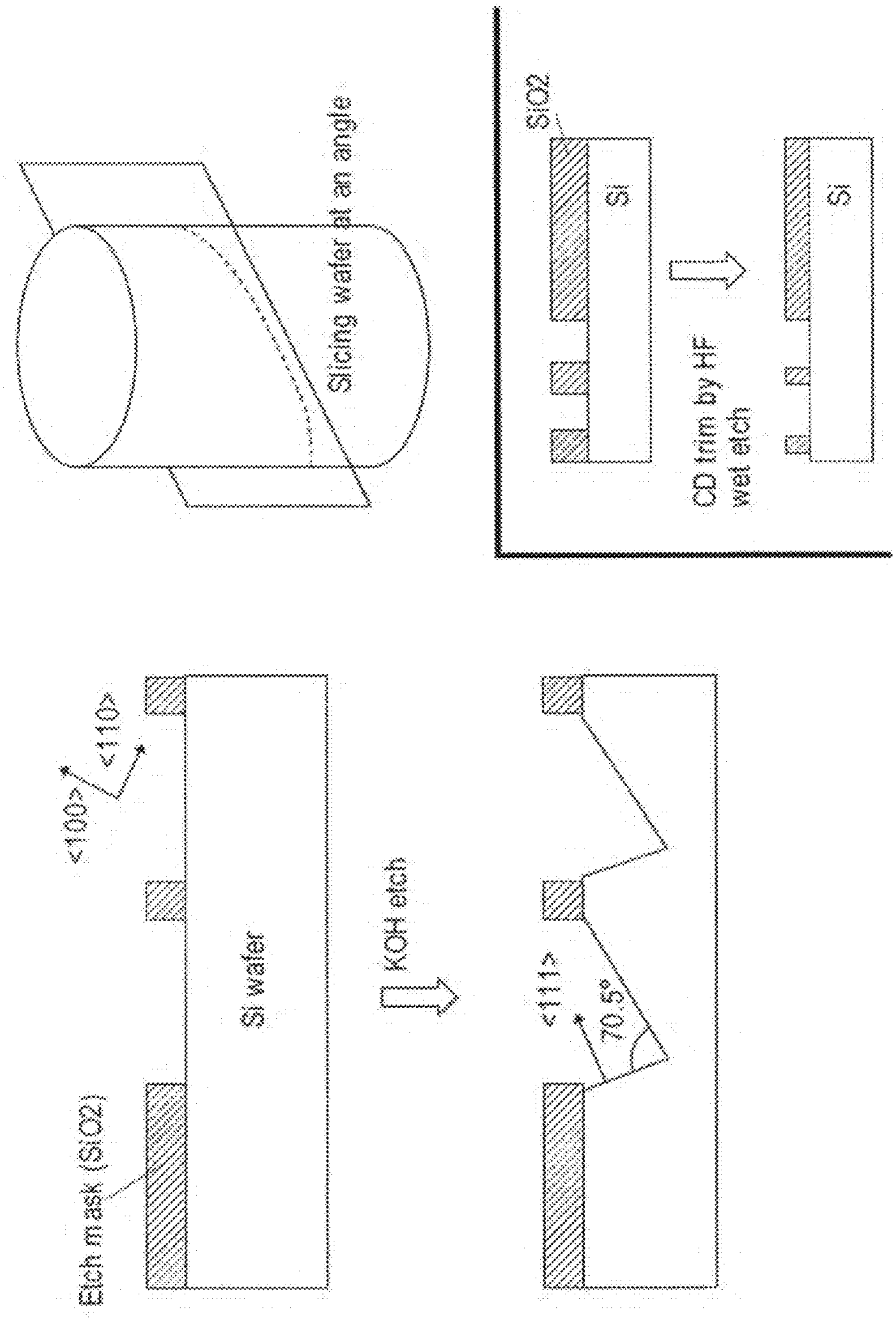

FIG. 117A is a simplified diagram illustrating a manufacturing process for a blazed grating structure according to some embodiments of the present invention.

Figure 117B:
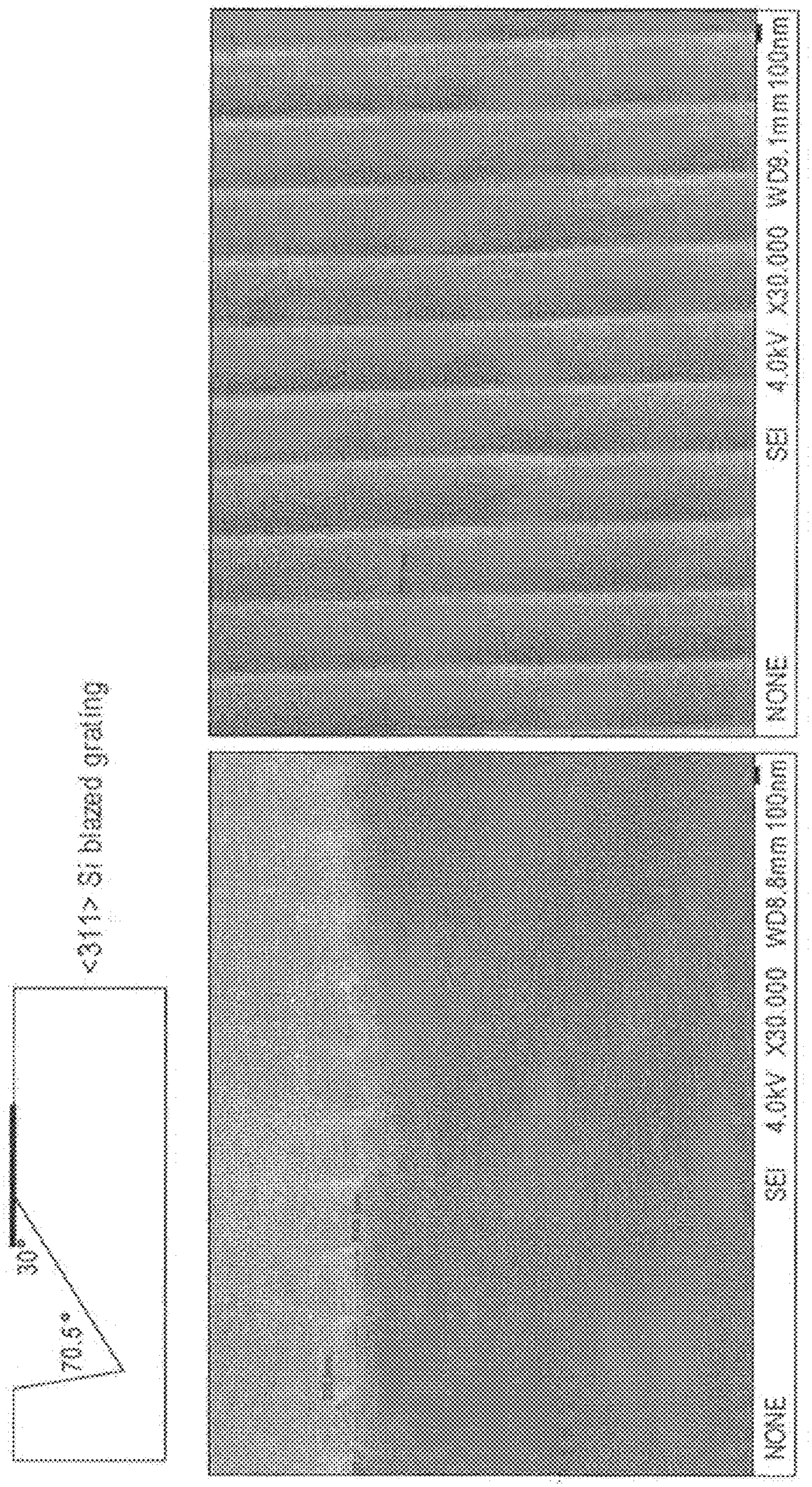

FIG. 117B shows photographs illustrating a blazed grating structure according to some embodiments of the present invention.

Figure 117C:
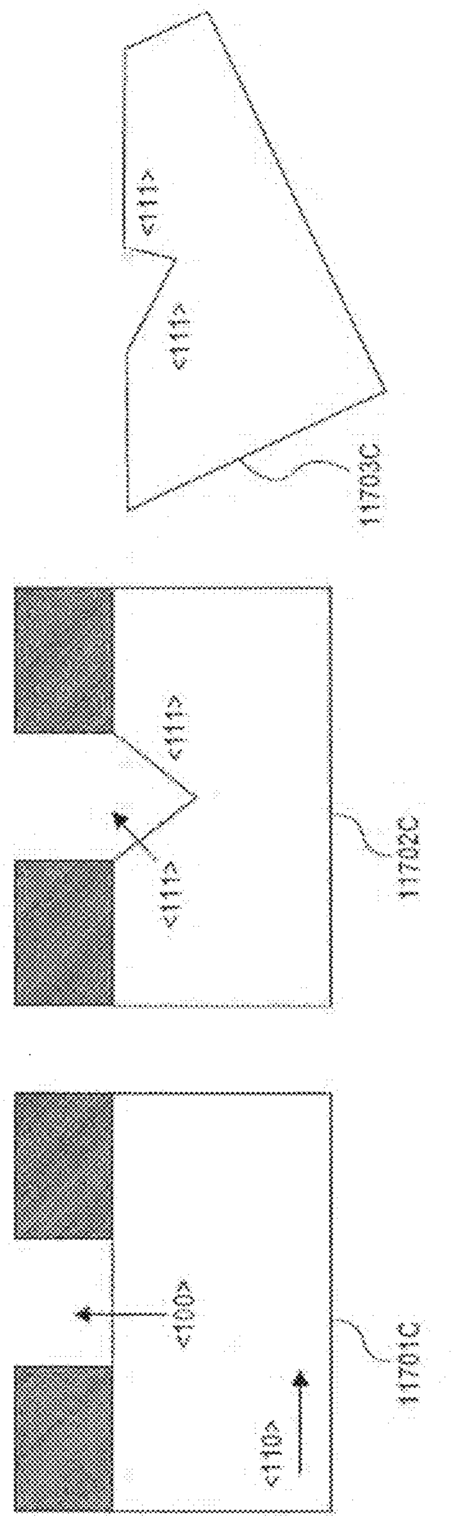

FIG. 117C is a simplified diagram comparing a manufacturing process of a triangular grating structure to a blazed grating structure according to some embodiments of the present invention.

Figure 117D:
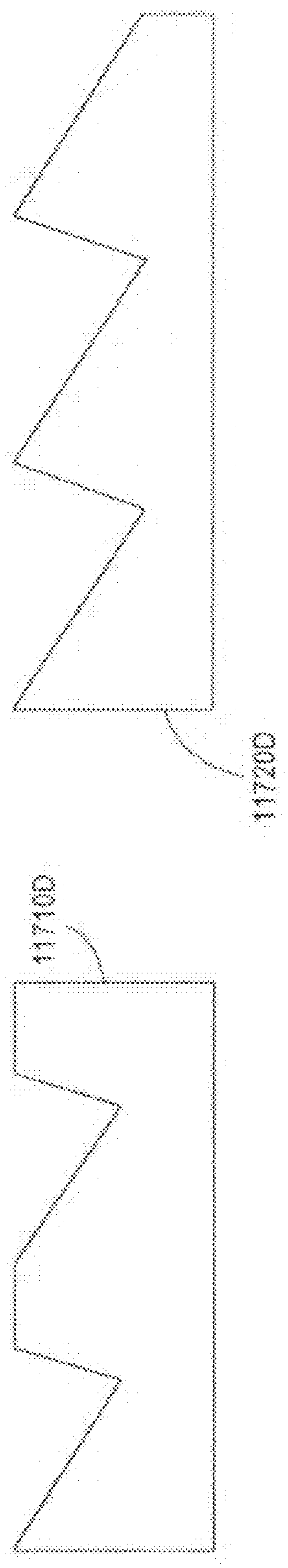

FIG. 117D is a simplified diagram illustrating a flat-top ICG structure as compared to a point-top ICG structure according to some embodiments of the present invention.

Figure 118:
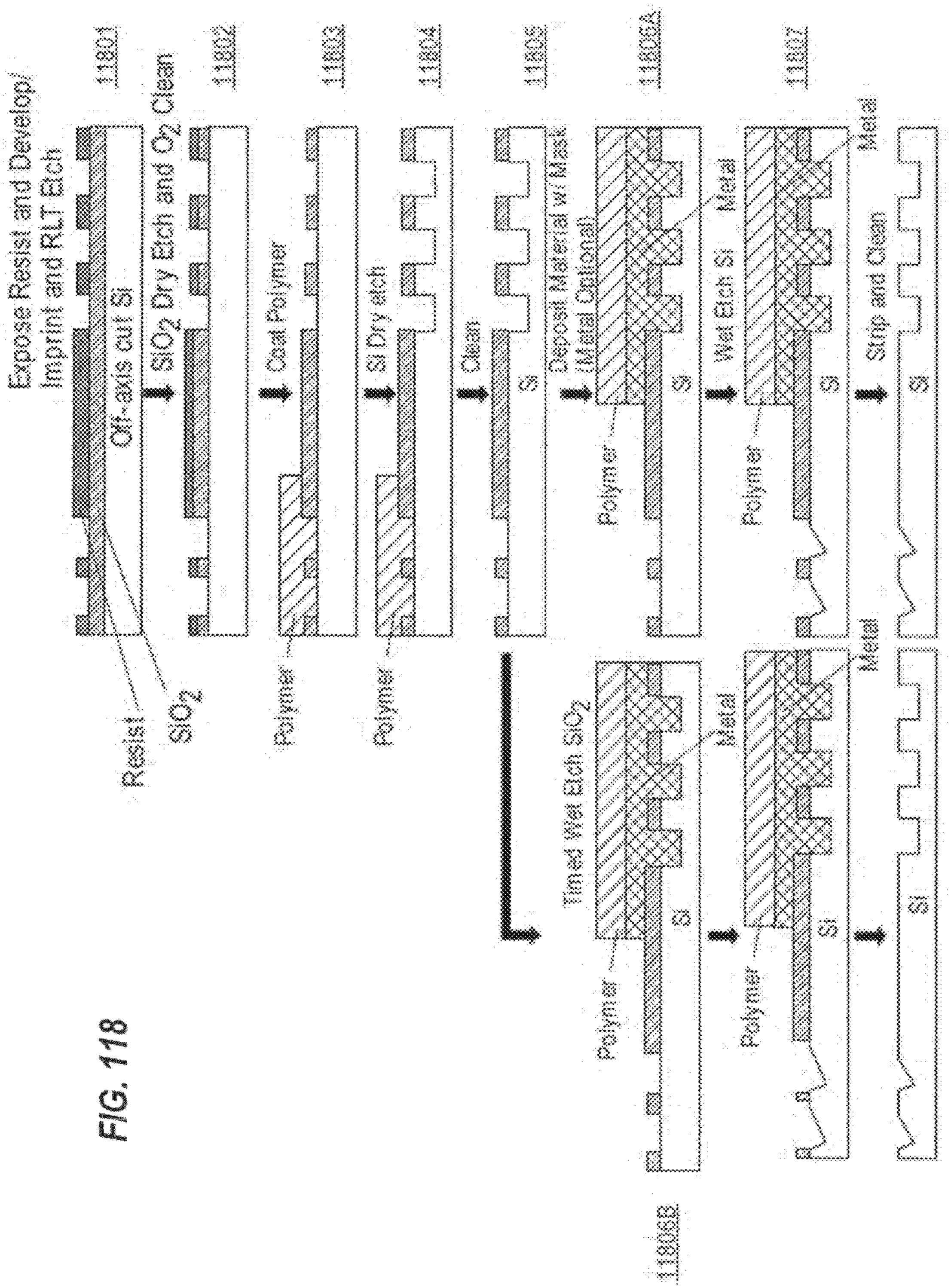

FIG. 118 is a simplified process flow diagram illustrating a manufacturing process of a blazed grating structure according to some embodiments of the present invention.

Figure 119A:
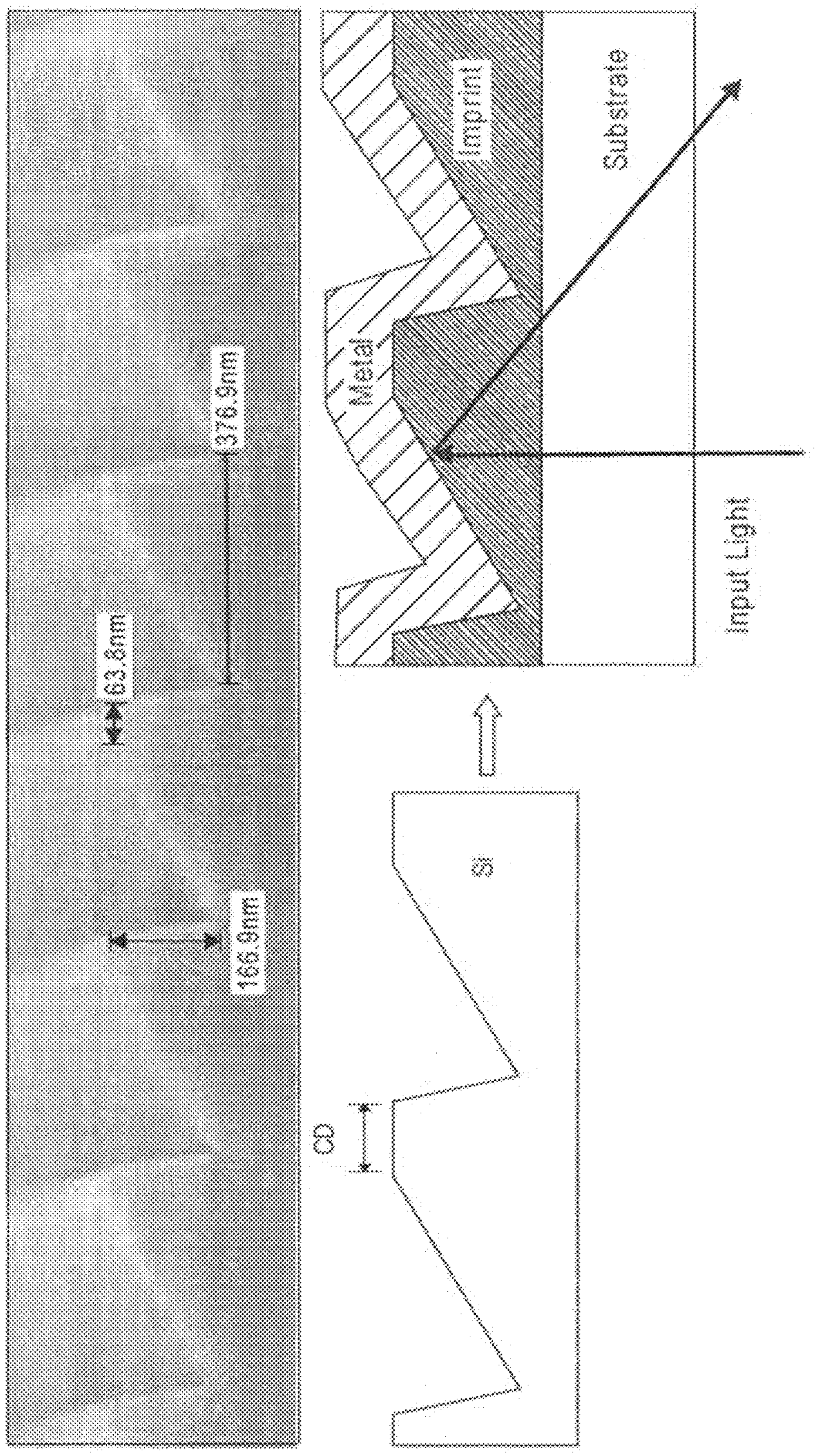

FIG. 119A shows photographs illustrating how a blaze geometry looks once wet etched according to some embodiments of the invention.

Figure 119B:
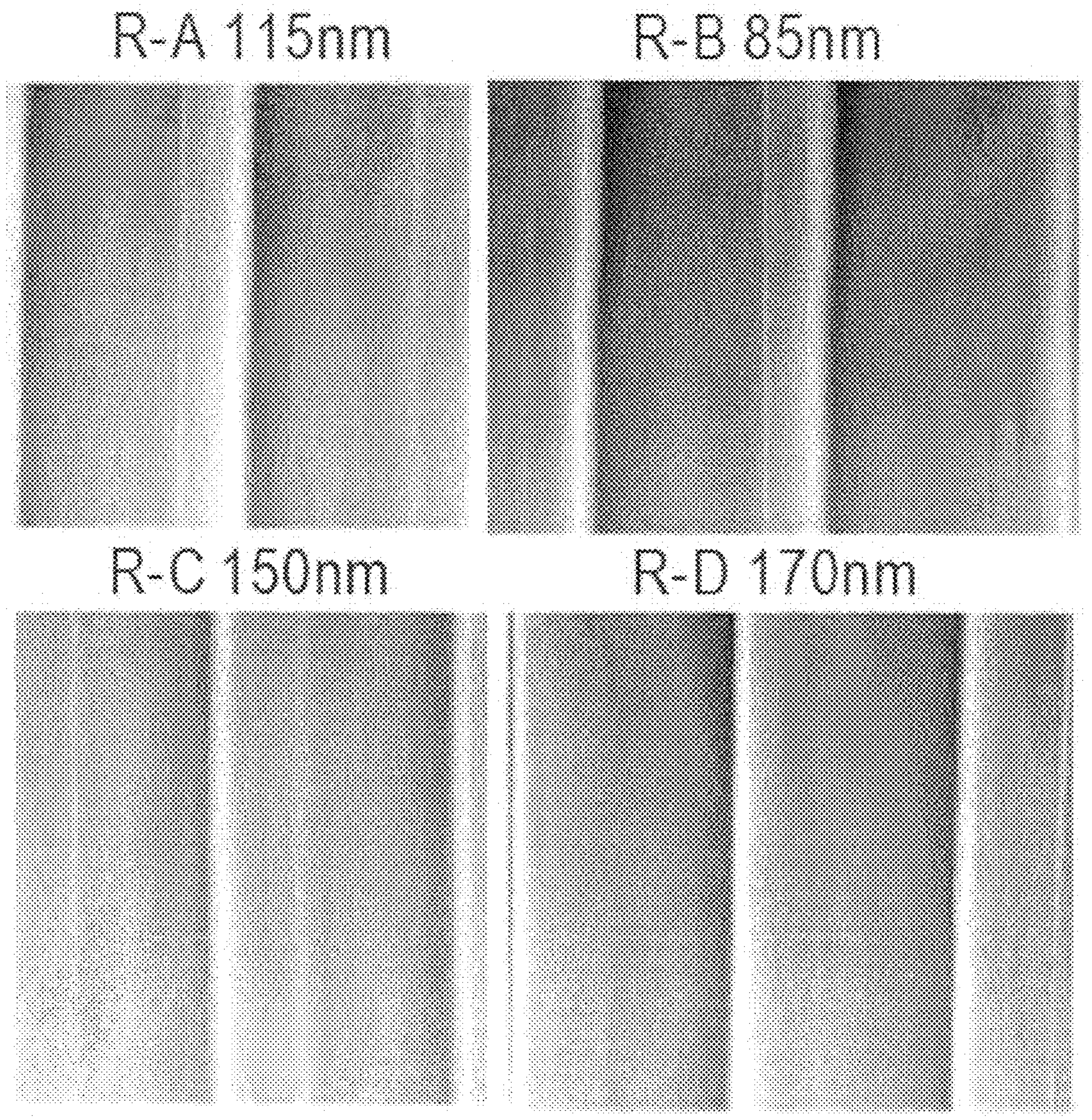

FIG. 119B shows photographs illustrating exemplary scanning electron microscope (SEM) images of four different critical dimensions (CDs) according to some embodiments of the invention.

FIG. 119C shows the control of CD of the input coupler (IC) in silicon dioxide creating high efficiency IC according to some embodiments of the invention.

Figure 120:
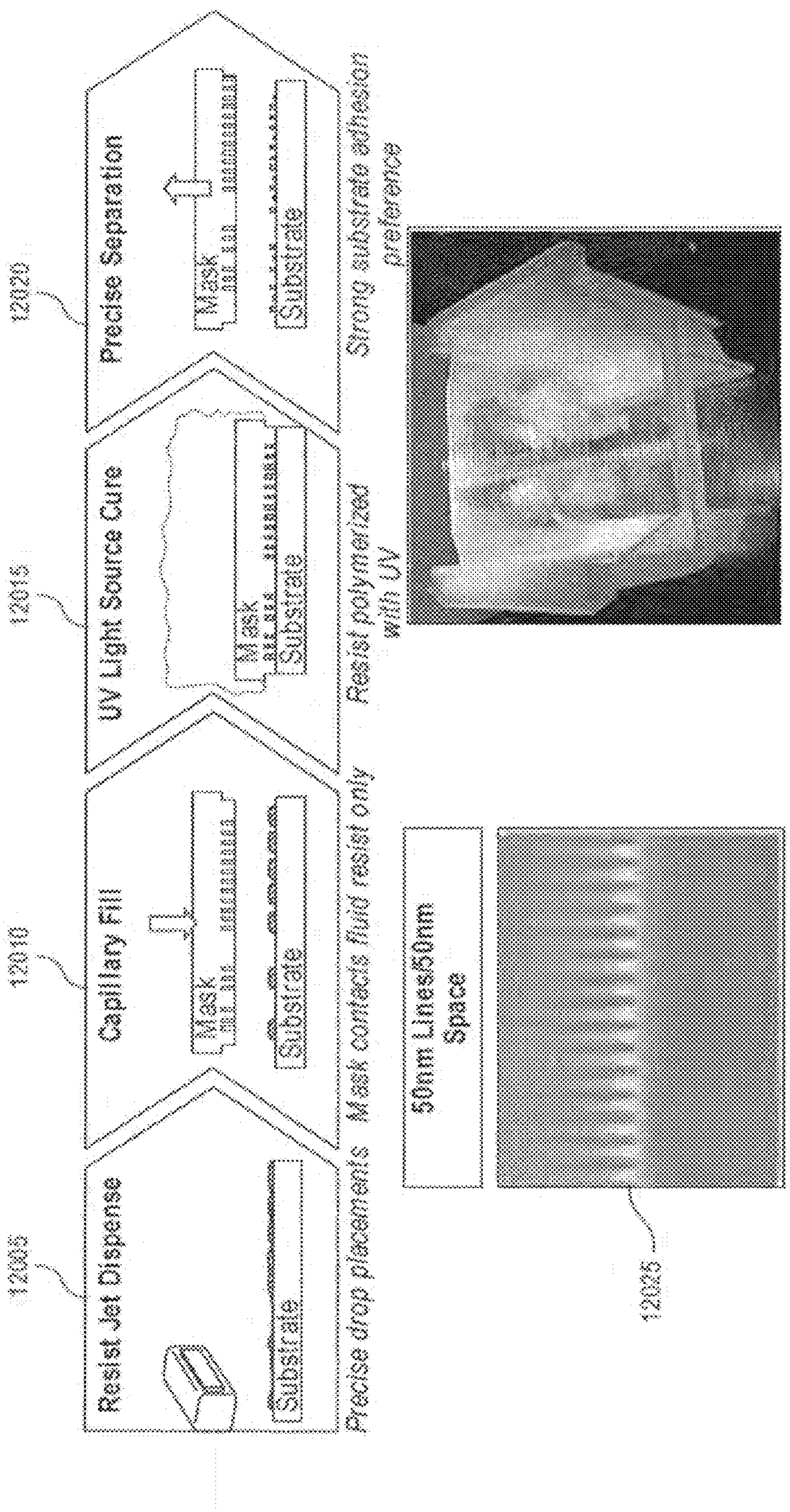

FIG. 120 is a simplified diagram illustrating imprint-based manufacturing according to some embodiments of the invention.

Figure 121A:
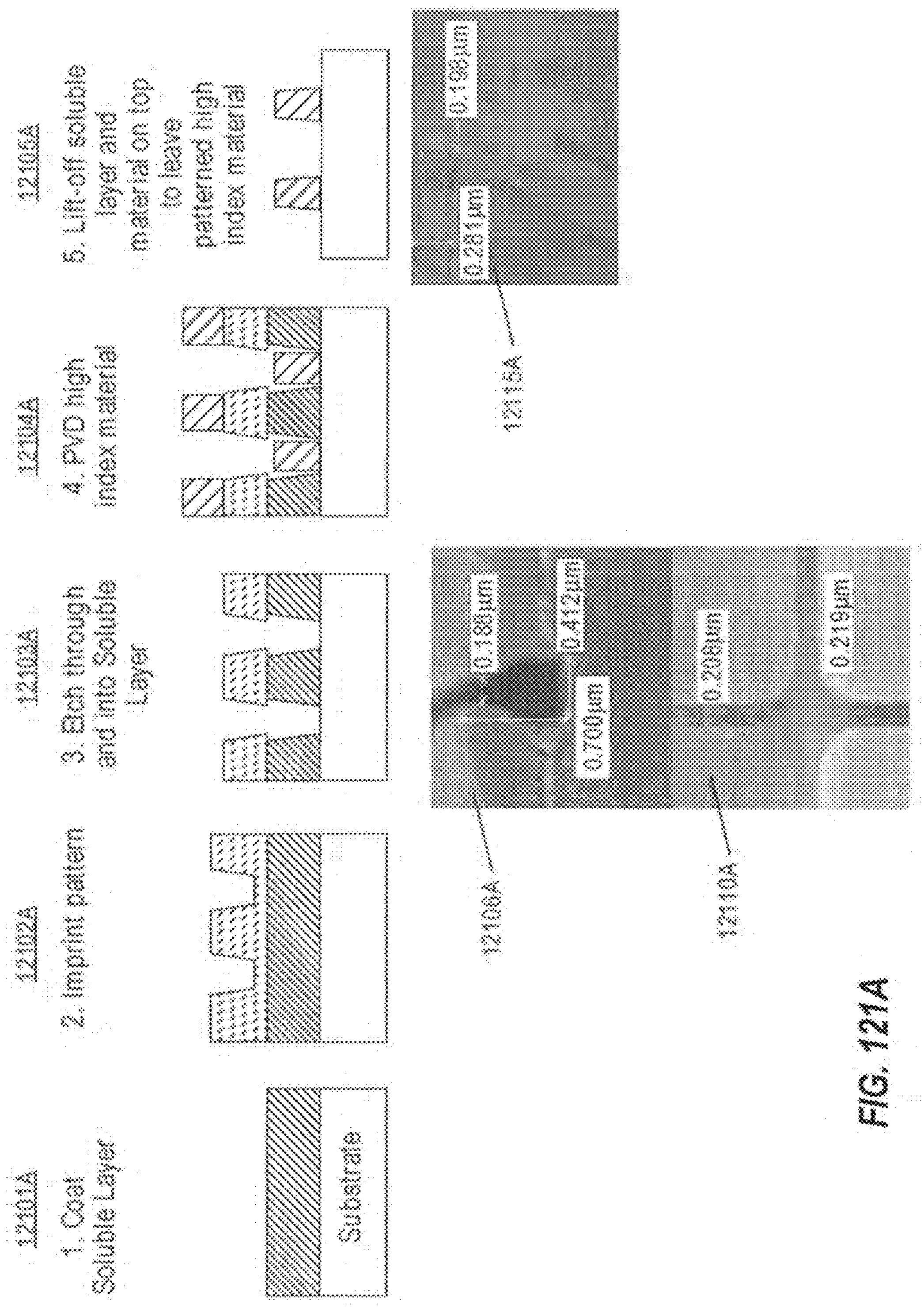

FIG. 121A is a simplified process flow diagram illustrating a manufacturing process of a patterned grating structure for a waveguide according to some embodiments of the invention.

Figure 121B:
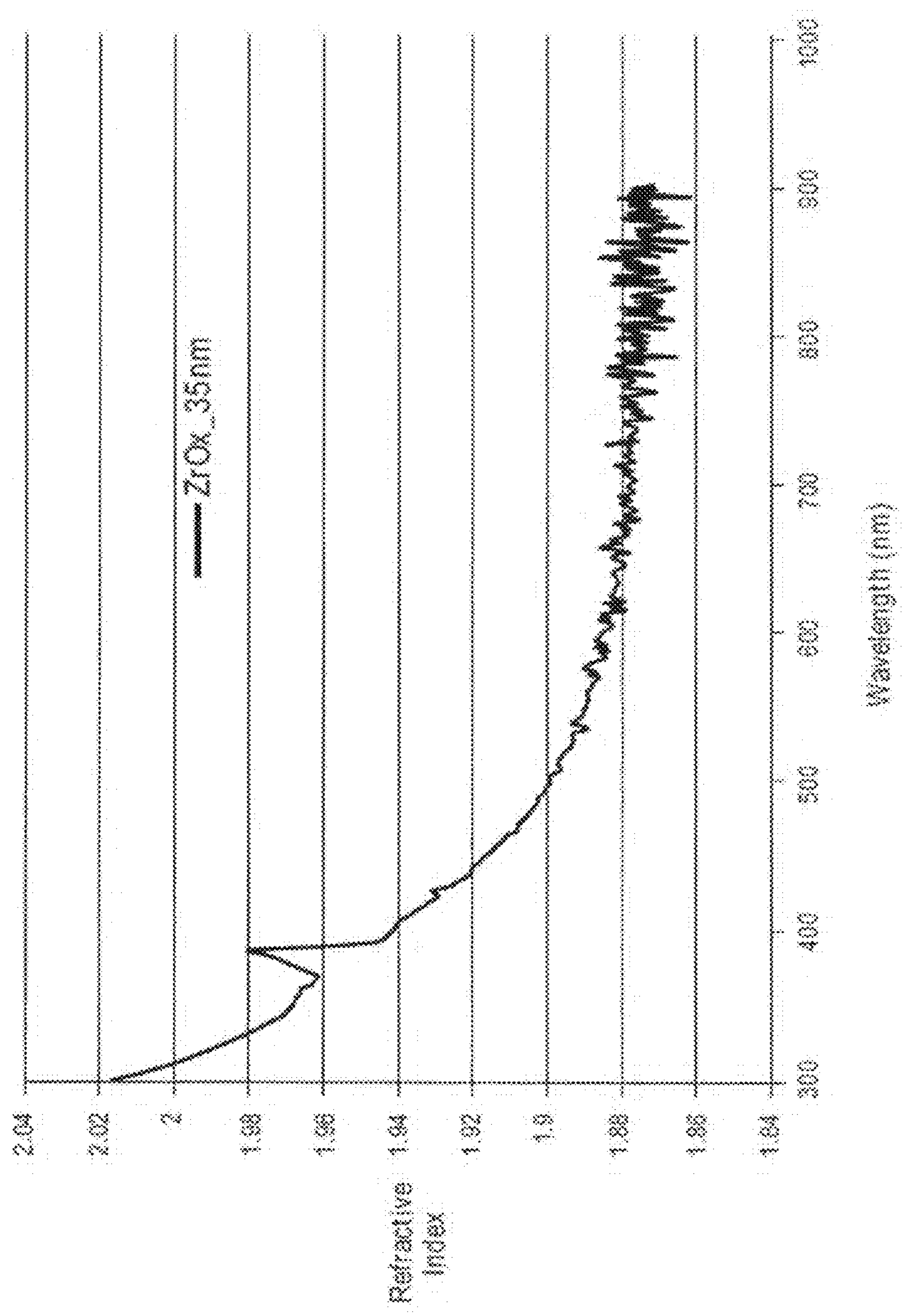

FIG. 121B is a graph illustrating the refractive index of a ZrOx film deposited using a PVD type process according to some embodiments of the invention.

Figure 121C:
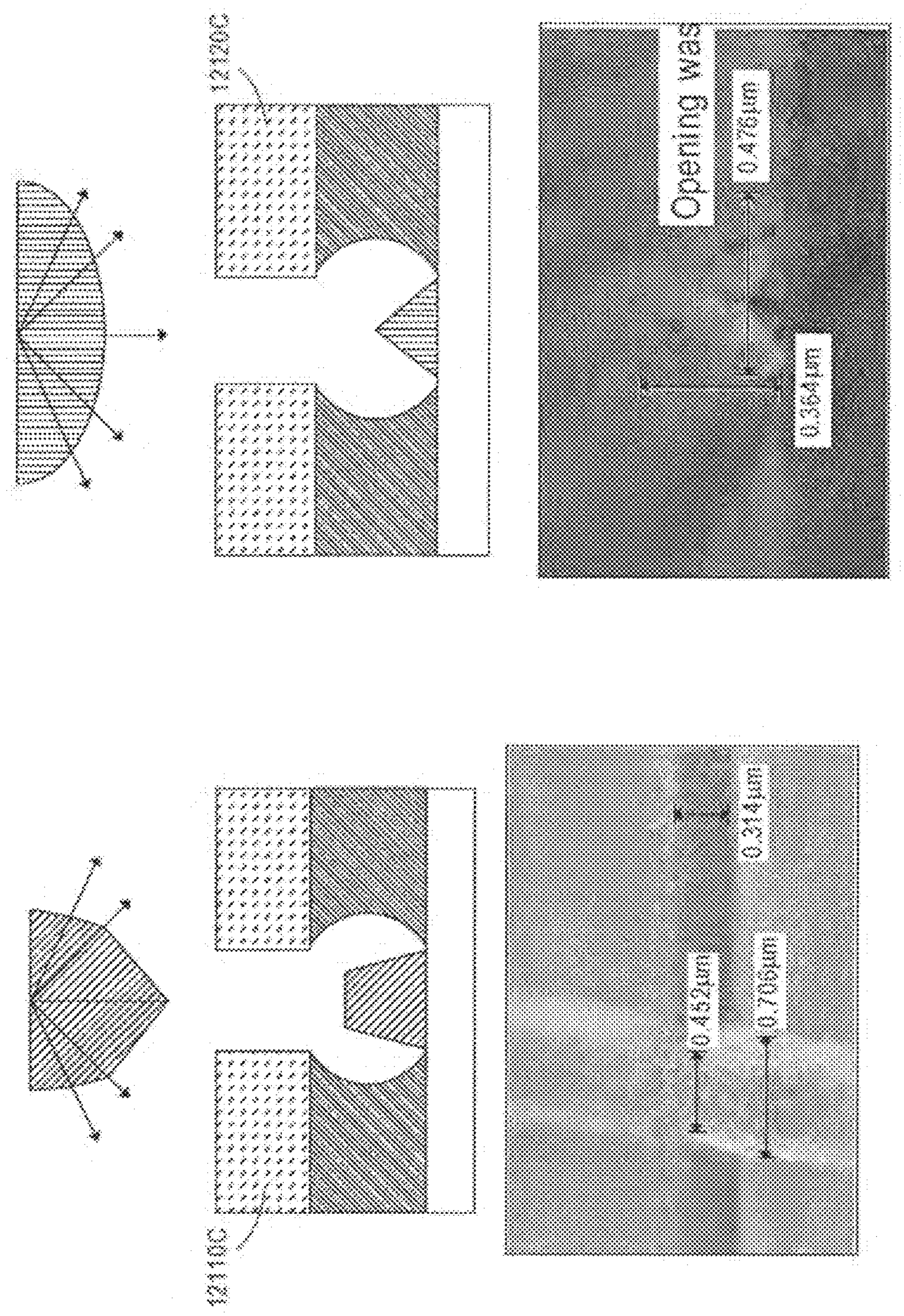

FIG. 121C is a simplified diagram illustrating varying profiles of material deposited based on deposition parameters and etch profile according to some embodiments of the invention.

Figure 121D:
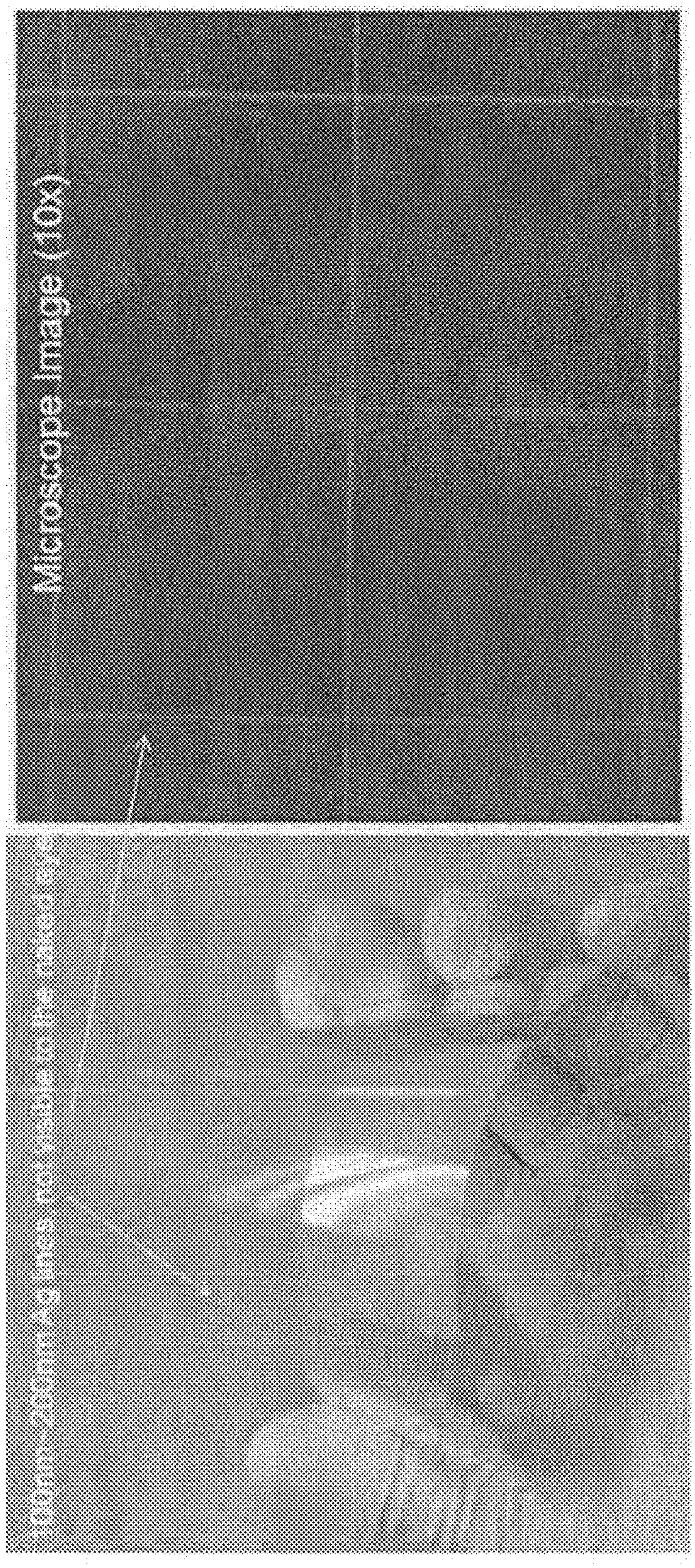

FIG. 121D shows photographs of high index lines patterned over a large area on a substrate according to some embodiments of the invention.

Figure 122:
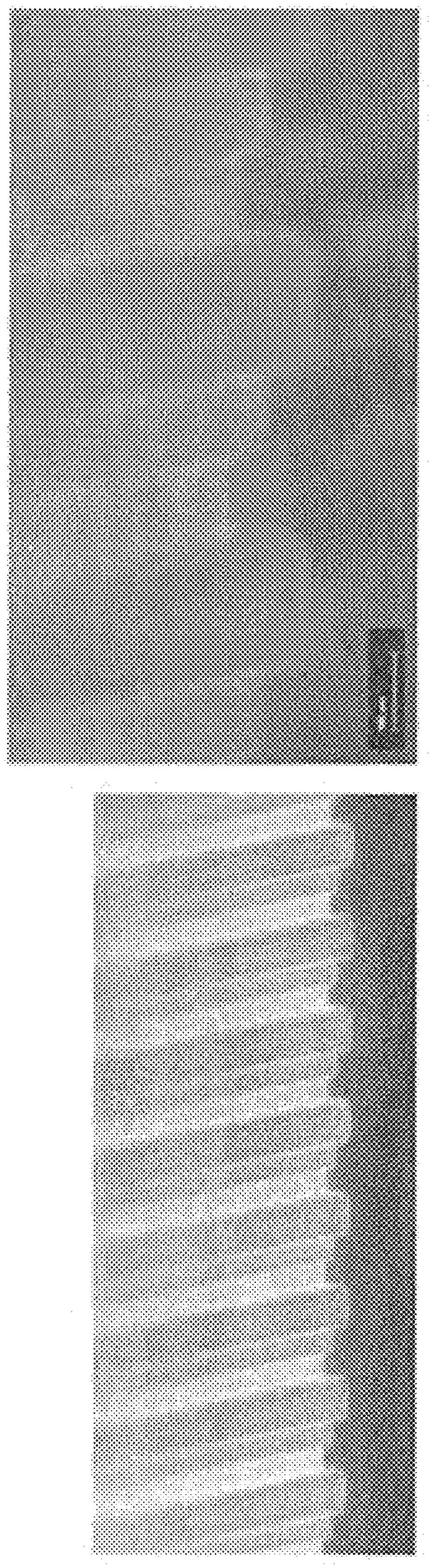

FIG. 122 shows photographs of multi-level binary gratings according to some embodiments of the invention.

Figure 123:
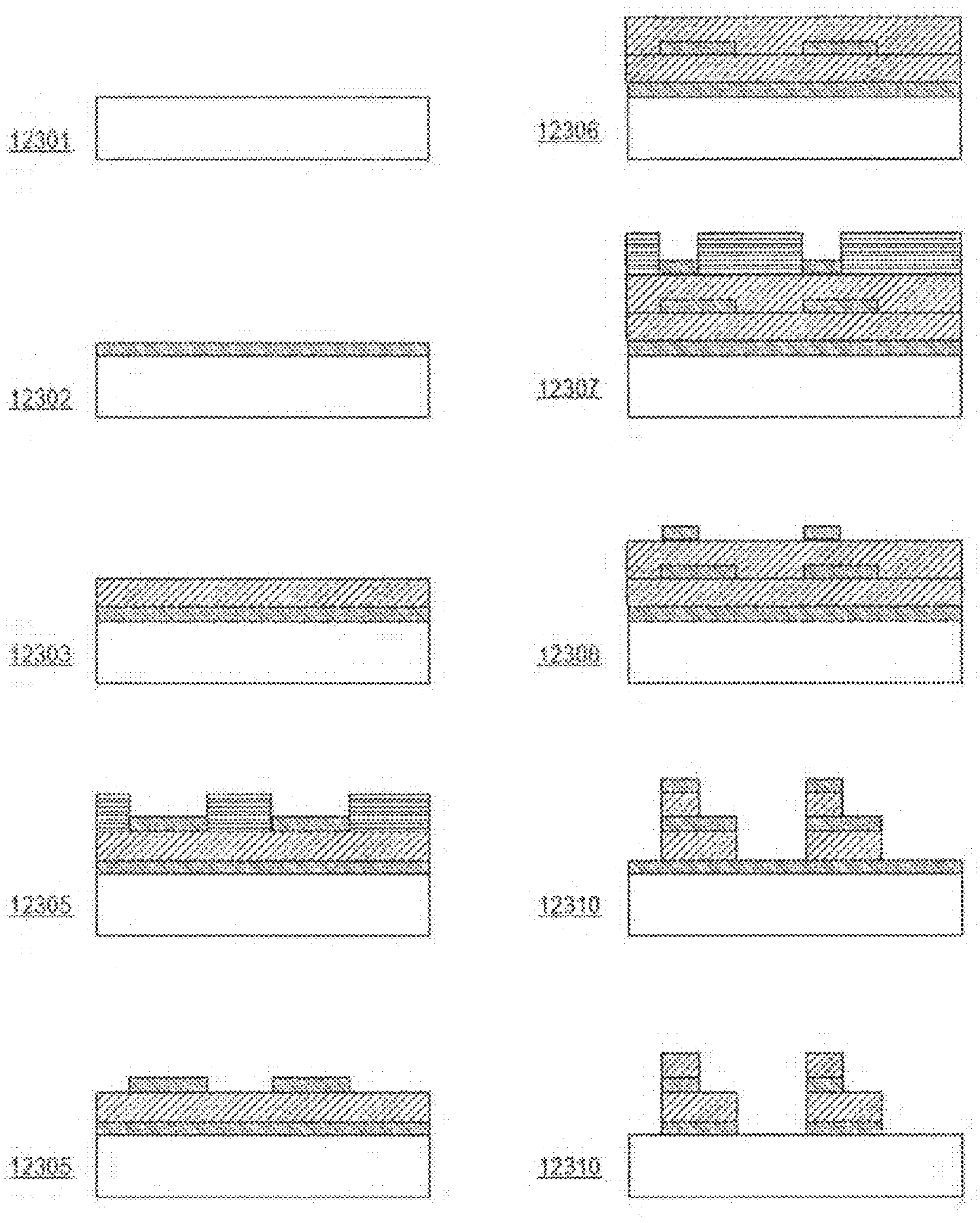

FIG. 123 is a simplified process flow diagram illustrating a manufacturing process of a multi-level binary grating structure using a stack of stop layers according to some embodiments of the invention.

Figure 124:
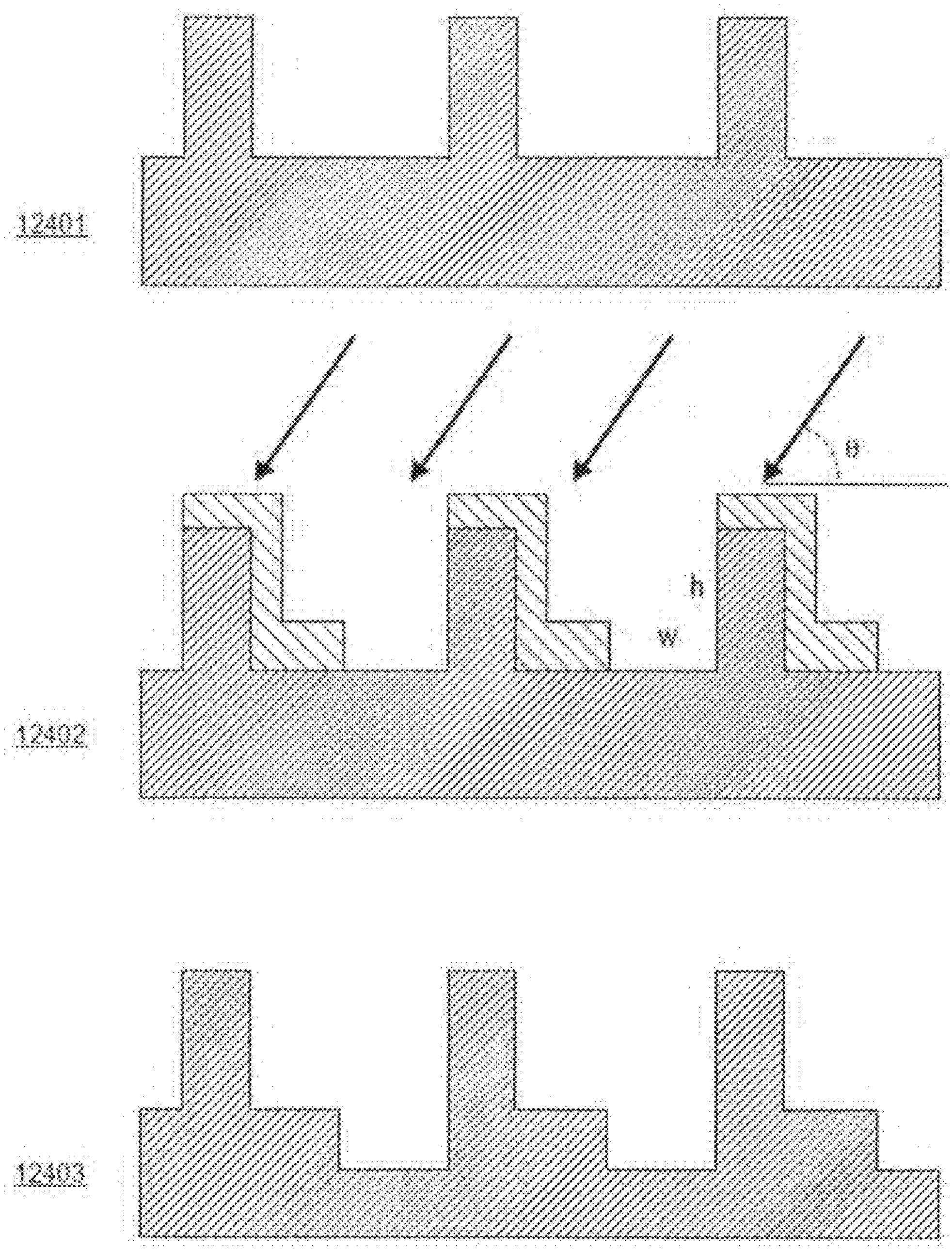

FIG. 124 is a simplified process flow diagram illustrating a manufacturing process of a multi-level binary grating structure using an etching mask according to some embodiments of the invention.

Figure 125:
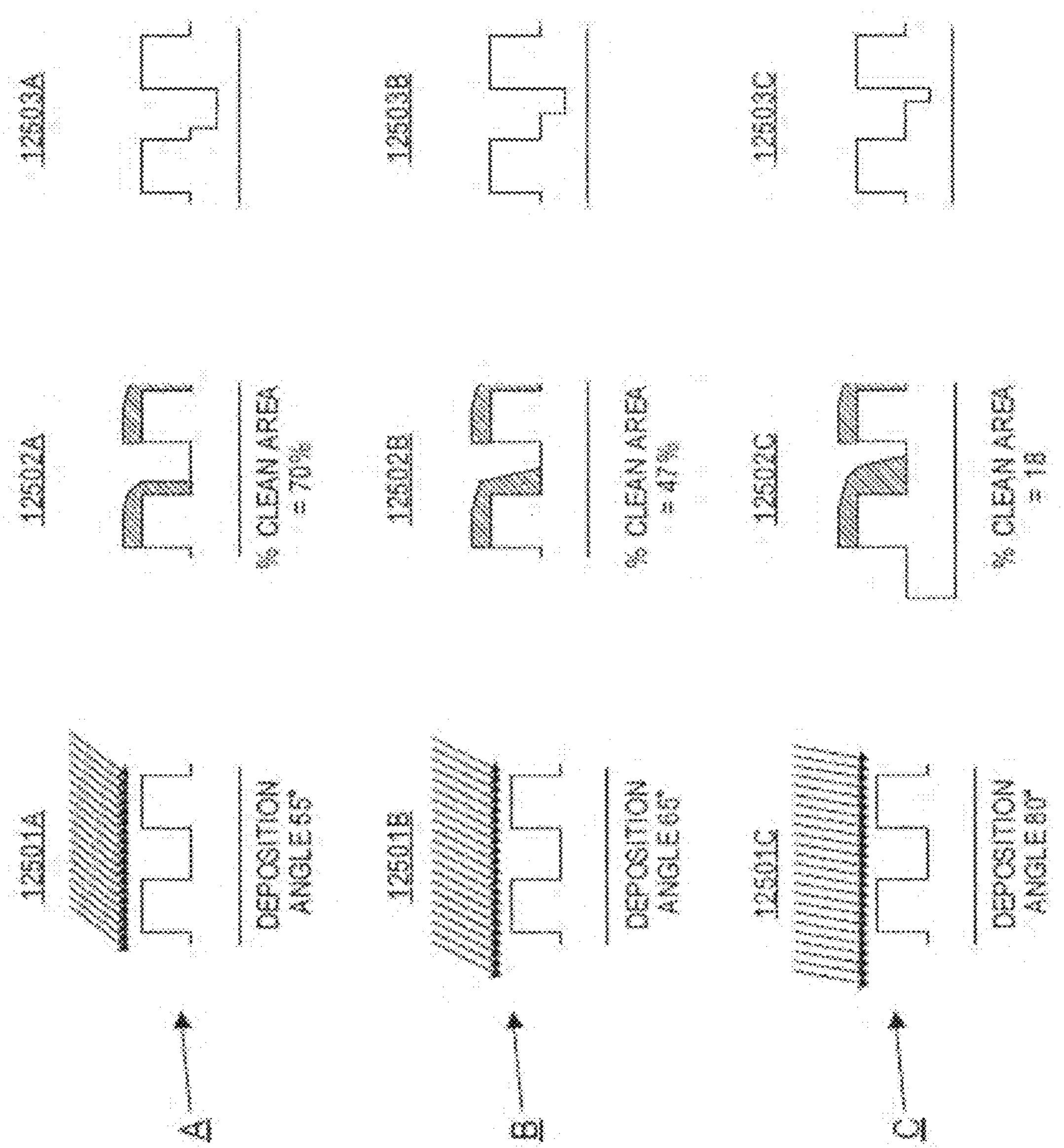

FIG. 125 shows simplified process flow diagrams illustrating different grating structures due to different deposition angles of an etching mask according to some embodiments of the invention.

Figure 126B:
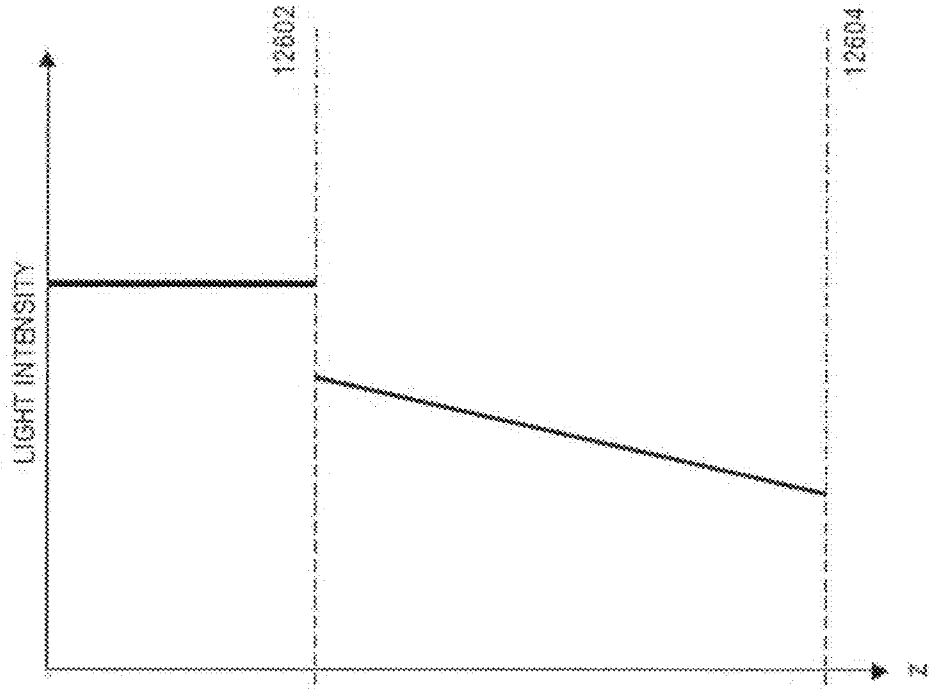
Figure 126A:
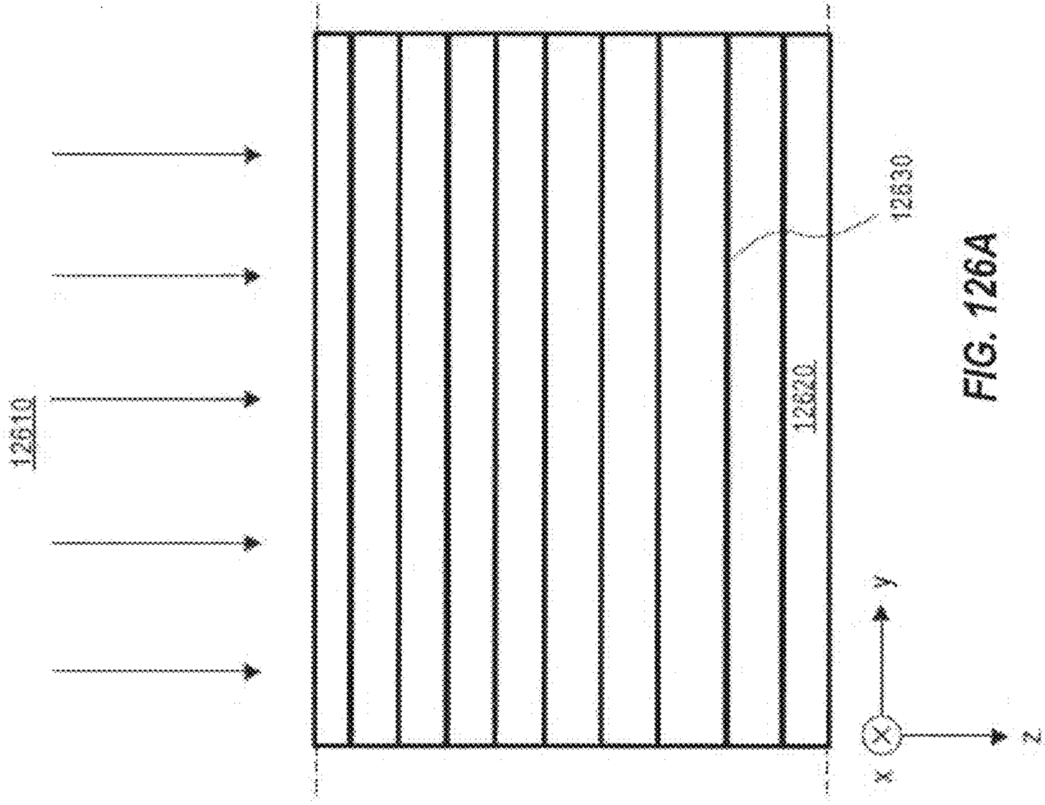

FIG. 126A is a simplified plan view diagram illustrating a constant grating structure according to some embodiments of the invention.

FIG. 126B is a graph illustrating light intensity through a constant grating structure according to some embodiments of the invention.

Figures 127A, 127B:
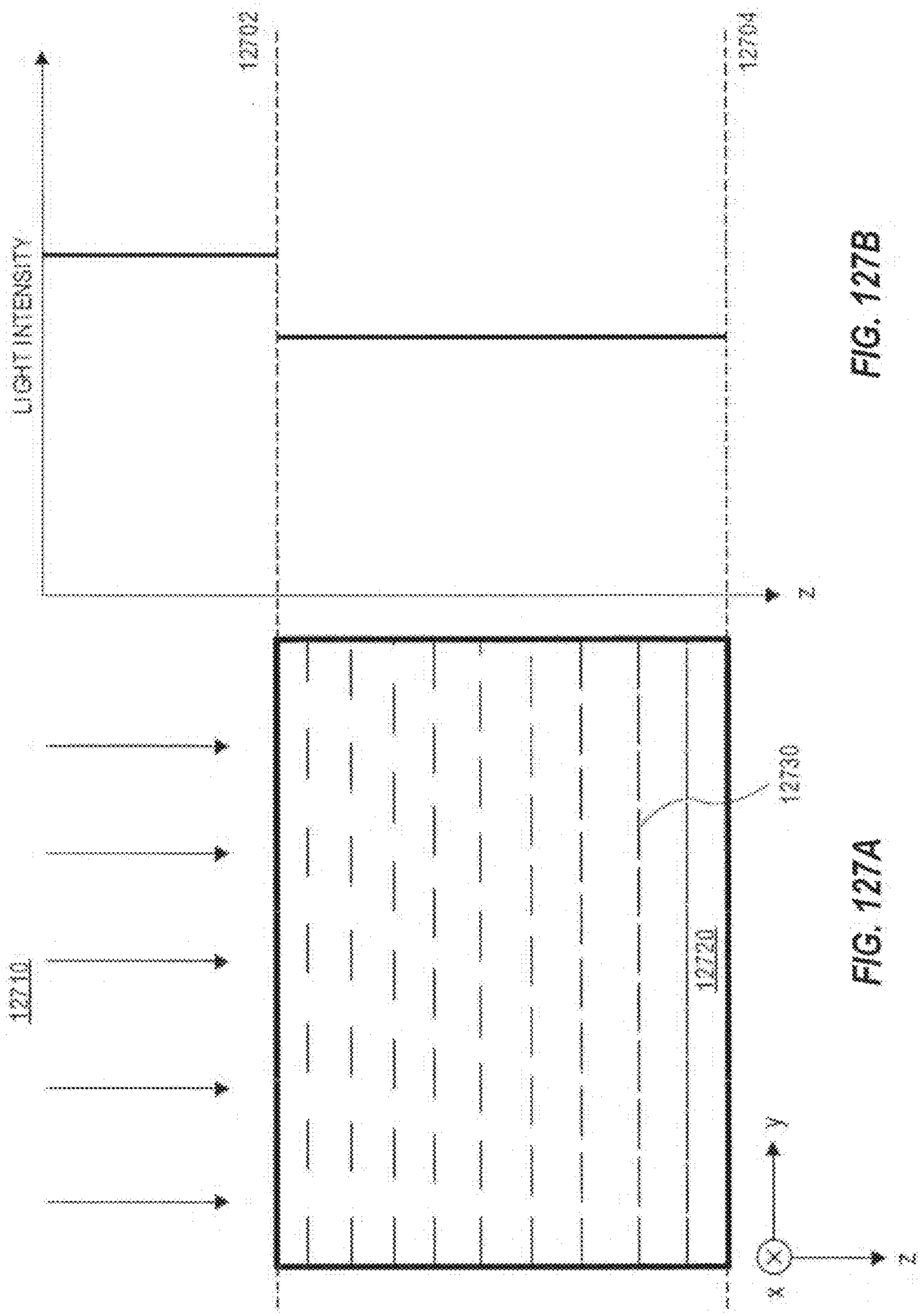

FIG. 127A is a simplified plan view diagram illustrating a grating structure with a graded duty cycle according to some embodiments of the invention.

FIG. 127B is a graph illustrating light intensity through a grating structure with a graded duty cycle according to some embodiments.

Figure 127C:
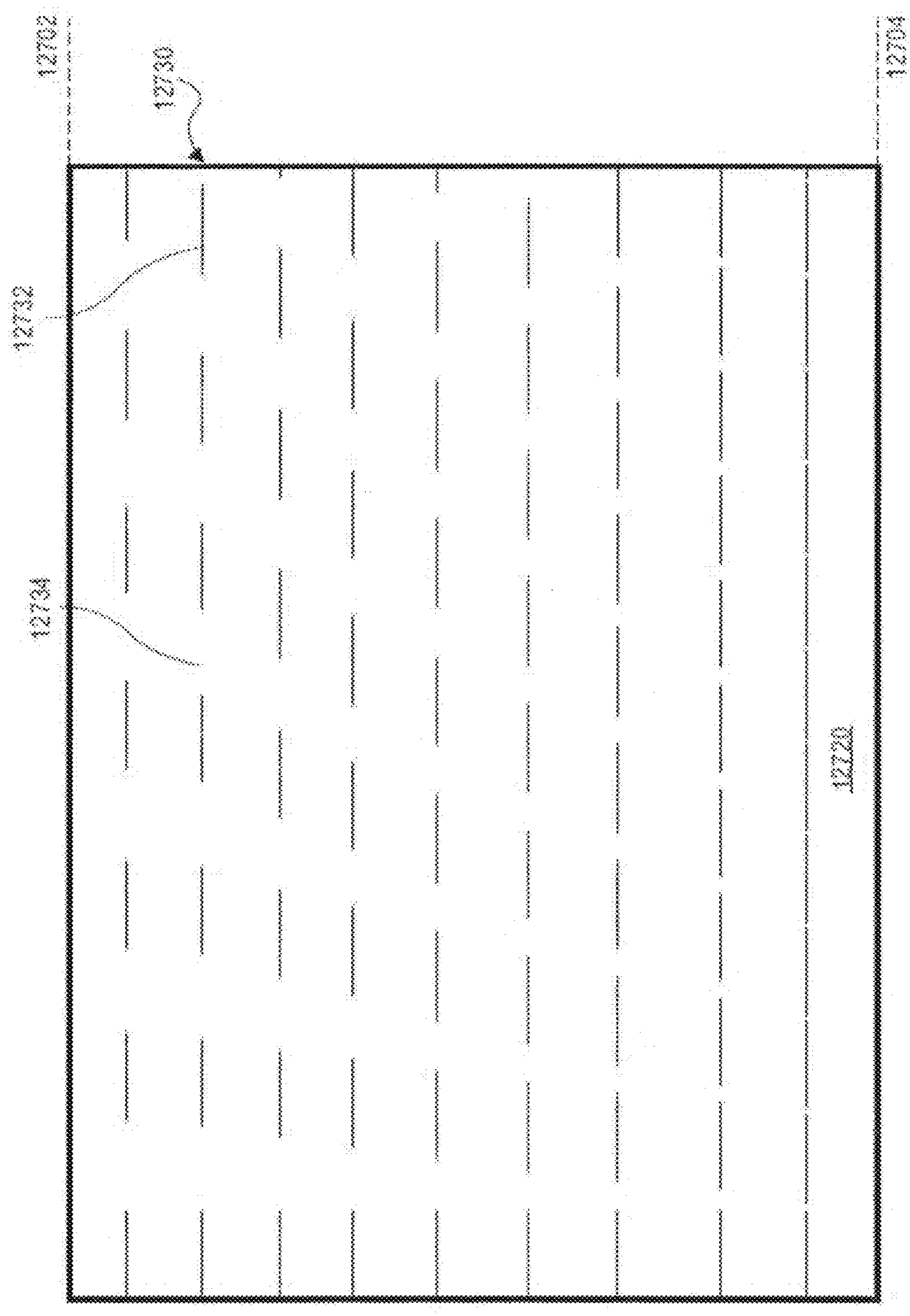

FIG. 127C is a zoomed in, simplified diagram illustrating a grating structure with a graded duty cycle according to some embodiments of the invention.

Figure 128:
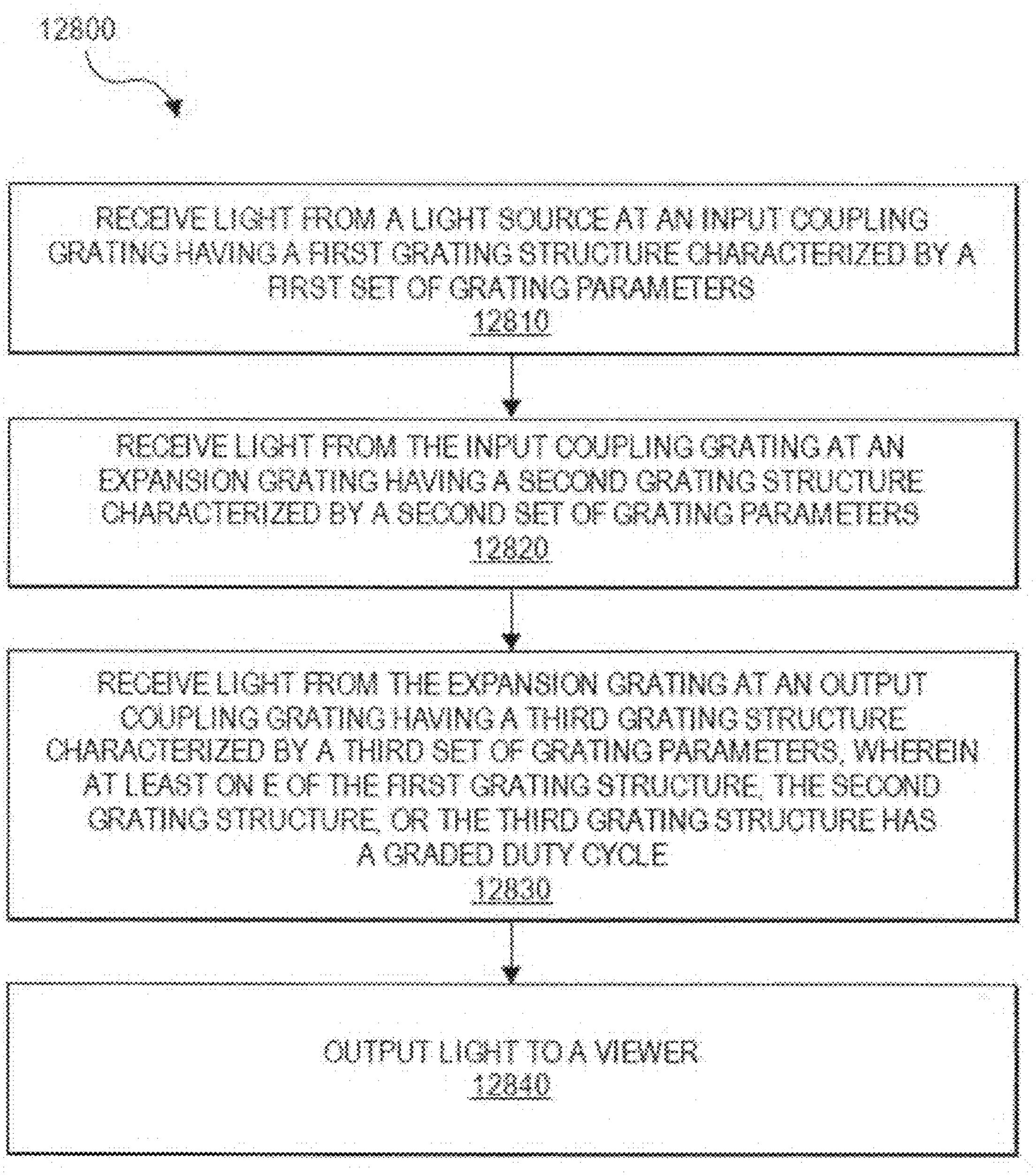

FIG. 128 is a flow diagram of an exemplary method of manipulating light by an eyepiece layer having a grating structure with a graded duty cycle according to some embodiments of the present invention

DETAILED DESCRIPTION OF SPECIFIC EMBODIMENTS

Figure 1:
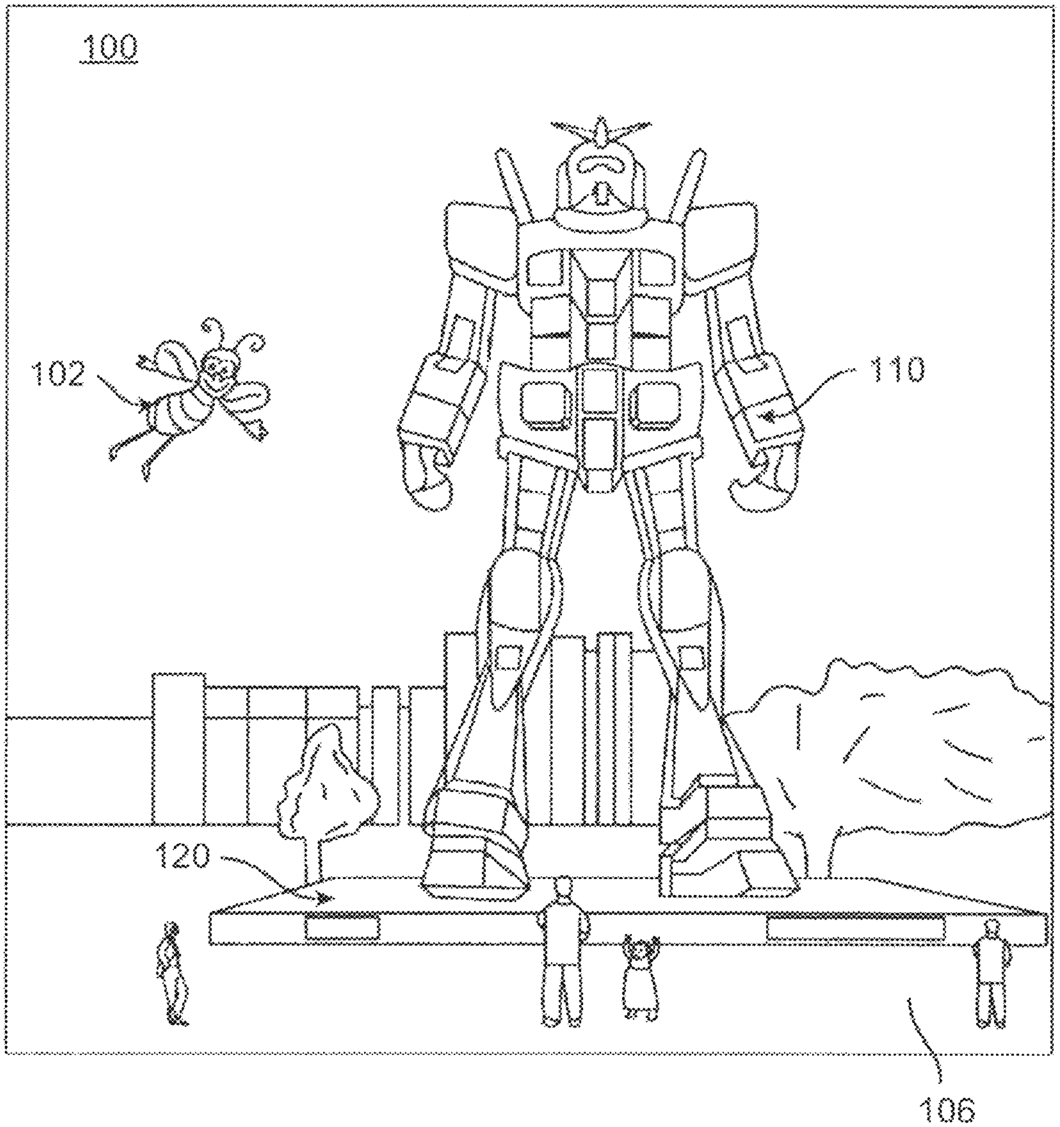
FIG. 1 is a drawing illustrating an augmented reality (AR) scene as viewed through a wearable AR device according to an embodiment described herein.

FIG. 1 is a drawing illustrating an augmented reality (AR) scene as viewed through a wearable AR device according to an embodiment described herein. Referring to FIG. 1, an augmented reality scene 100 is depicted wherein a user of an AR technology sees a real-world park-like setting 106 featuring people, trees, buildings in the background, and a concrete platform 120. In addition to these items, the user of the AR technology also perceives that he "sees" a robot statue (110) standing upon the real-world platform (120), and a cartoon-like avatar character (102) flying by, which seems to be a personification of a bumble bee, even though these elements (102, 110) do not exist in the real world. Due to the extreme complexity of the human visual perception and nervous system, it is challenging to produce a VR or AR technology that facilitates a comfortable, natural-feeling, rich presentation of virtual image elements amongst other virtual or real-world imagery elements.

Figure 2B:
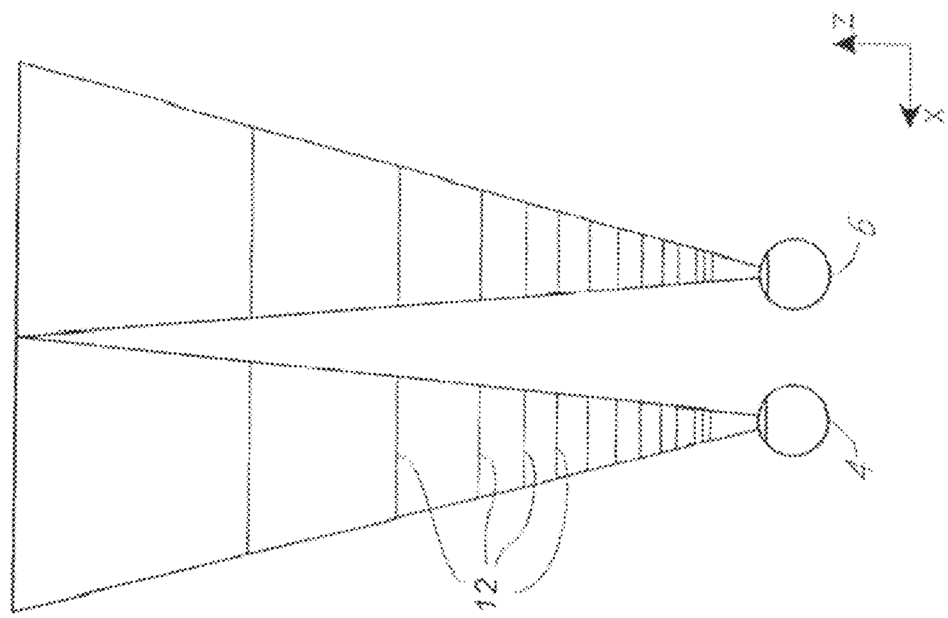
FIG. 2B illustrates variable depth plane accommodation distances.
Figure 2A:
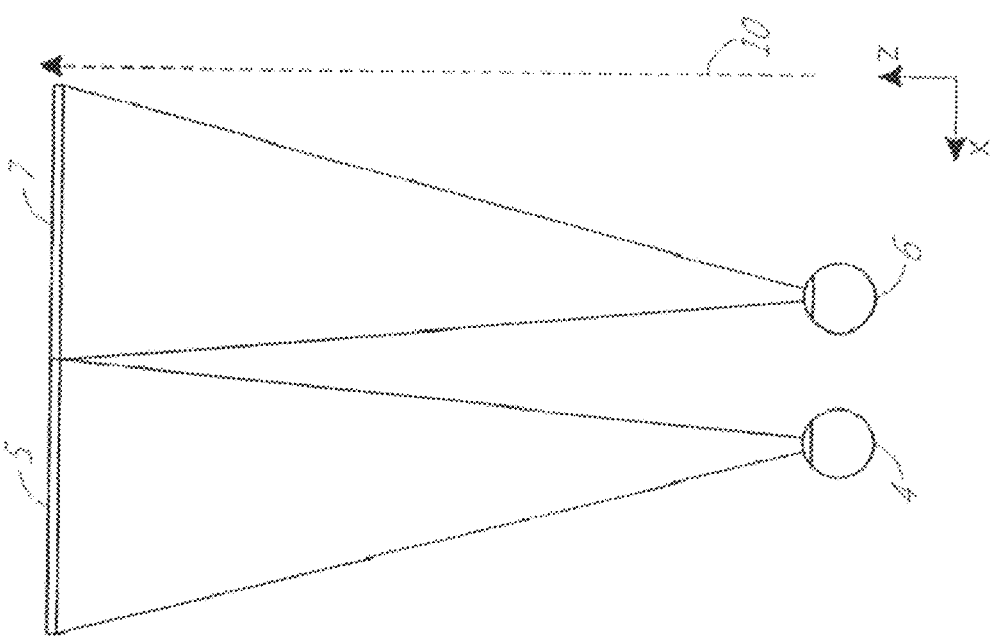
FIG. 2A illustrates stereoscopic three-dimensional (3D) displays.

FIG. 2A illustrates a conventional display system for presenting 3D imagery to a user. Two distinct images 5 and 7, one for each eye 4 and 6, are displayed to the user. The images 5 and 7 are spaced from the eyes 4 and 6 by a distance 10 along an optical or z-axis parallel to the line of sight of the viewer. The images 5 and 7 are flat and the eyes 4 and 6 may focus on the images by assuming a single accommodated state, triggering a vergence reflex to match the accommodated state. Such systems rely on the human visual system to combine the images 5 and 7 to provide a perception of depth for the combined image.

It will be appreciated, however, that the human visual system is more complicated and providing a realistic perception of depth is more challenging. For example, many viewers of conventional 3D display systems depicted in FIG. 2A find such systems to be uncomfortable or may not perceive a sense of depth at all due to a mismatch in accommodation and vergence, that is, the line of sight to look at an object on a particular depth plane may not be the optimal accommodation distance to focus on the same depth plane. As depicted in FIG. 2B, a system that can display content at a variable or plurality of depth planes 12 can provide an accommodation-vergence state more similar to the eye's natural function.

Figure 3B:
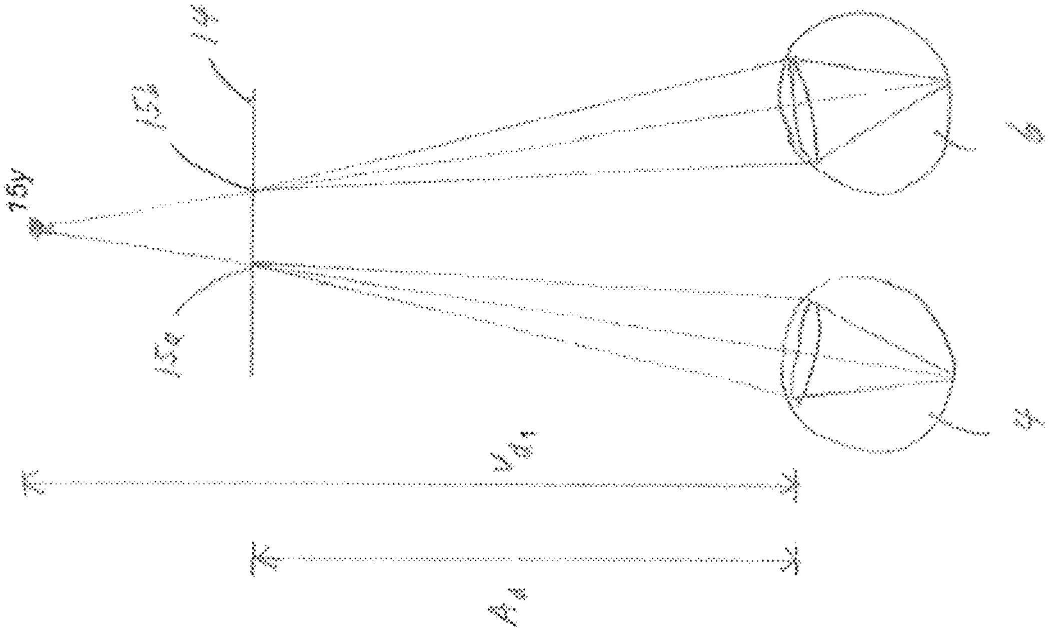
FIG. 3B illustrates accommodation-vergence mismatch relative to a given depth plane.
Figure 3A:
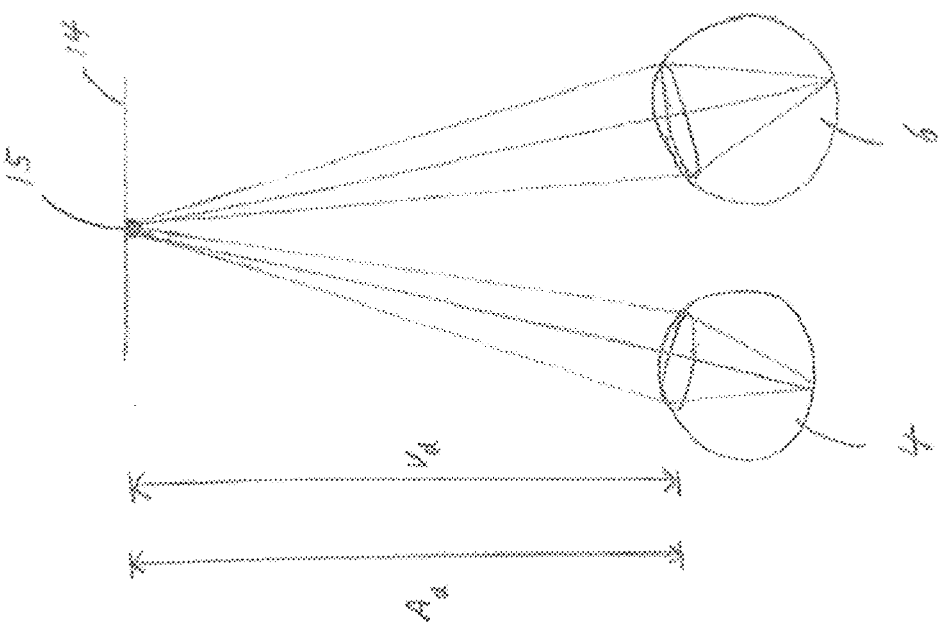
FIG. 3A illustrates accommodation-vergence focus at a given depth plane.

For example, FIG. 3A depicts eyes 4 and 6 observing content 15 at depth plane 14. As depicted, content 15 is located at depth plane 14, where depth plane 14 may be the depth plane of a given 3D system with a single depth plane such as a stereoscopic system. The accommodation distance $A_d$, the distance eyes 4 and 6 focus at, is the same as vergence distance $V_d$, the distance eyes 4 and 6 look at. However, in FIG. 3B content 15*y* is intended to be perceived further away than depth plane 14, for example a stereoscopic 3D system is configured for a depth plane at two meters but content is intended to appear 3 m away from the user. As depicted, each of eye 4 and 6 will have an accommodation distance $A_d$ to focus on depth plane 14, but each of eye 4 and 6 will have a respective vergence point 15*a* and 15*b* on depth plane 14, and an overall vergence distance $V_{d1}$. The ratio of $V_{d1}$ to $A_d$ may be referred to as "accommodation-vergence mismatch" (AVM) and at certain AVMs the user may no longer perceive depth of content 15*y* or may experience discomfort as the visual and nervous systems attempt to correct the large AVM.

It will be appreciated then, the conventional 3D stereoscopic displays work against the accommodation-vergence reflex and induce accommodation-vergence mismatch. Display systems that provide a better match between accommodation and vergence may form more realistic and comfortable simulations of 3D imagery.

Figure 4:
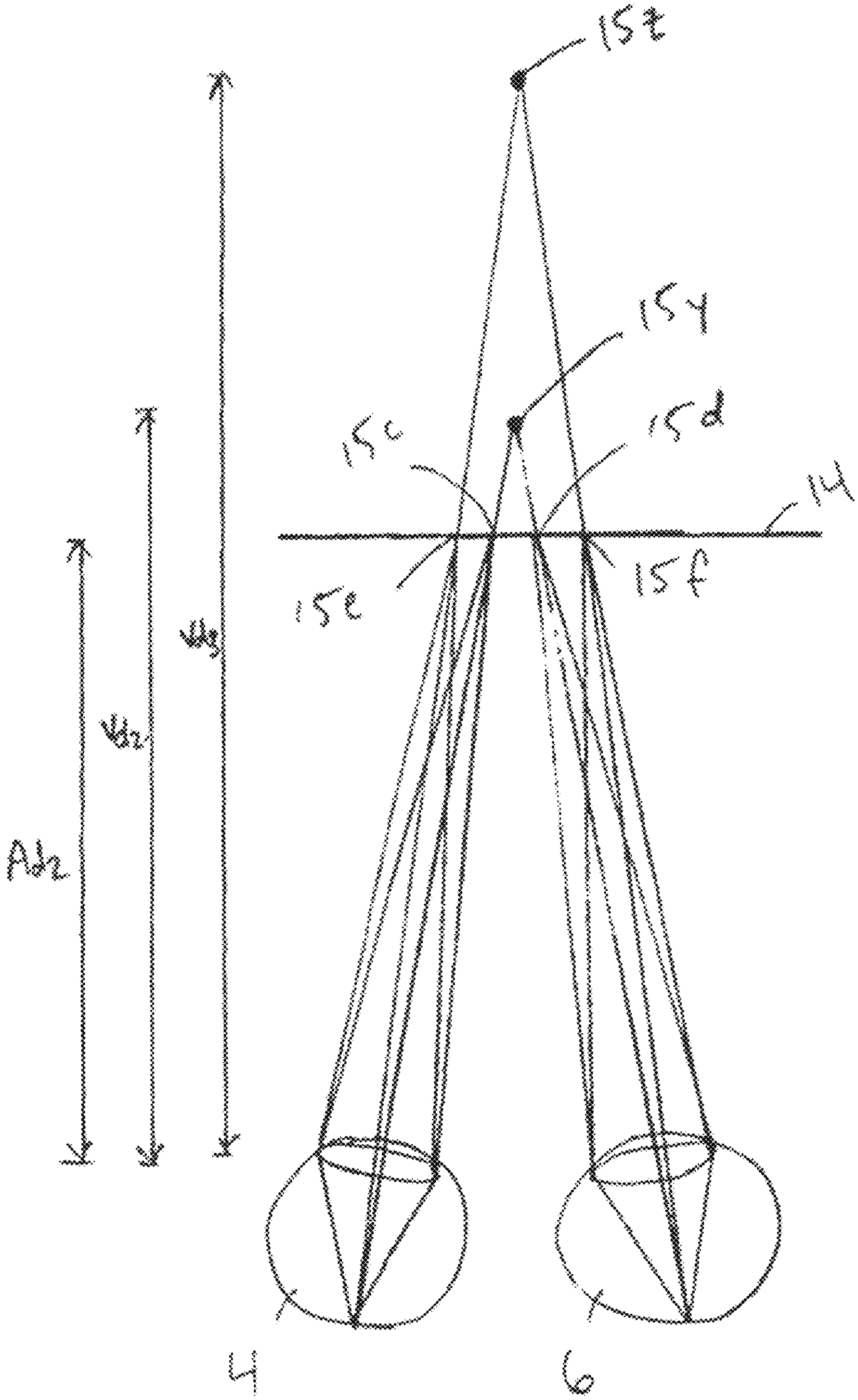
FIG. 4 illustrates comparative accommodation-vergence mismatch between two objects beyond a given depth plane.

FIG. 4 illustrates the benefits of simulating three-dimensional imagery using multiple depth planes. With reference to FIG. 4, content 15*y* and 15*z* are placed at respective vergence distances $V_{d2}$ and $V_{d3}$ from eyes 4 and 6, but the system has only one depth plane 14 to create accommodation distance $A_{d2}$. The eyes 4 and 6 assume particular accommodated states to bring 15*y* and 15*z* into focus along the z-axis. Consequently, to focus on 15*y* the eyes 4 and 6 assume vergence positions of 15*c* and 15*d* on depth plane 14; to focus on 15*z* the eyes 4 and 6 assume vergence positions of 15*e* and 15*f* on depth plane 14. It is readily apparent that the eyes 4 and 6 have a wider vergence stance 15*e* and 15*f* to observe 15*z*, as compared to the vergence stance 15*c* and 15*d* to observe 15*y*, and that for depth plane 14 natural viewing would be felt if 15*e* and 15*f* were collocated on depth plane 14. This difference in vergence stance, and the ratio of $V_{d3}$ to $A_{d2}$ and $V_{d2}$ to $A_{d2}$ are all illustrative of AVM.

Figure 5:
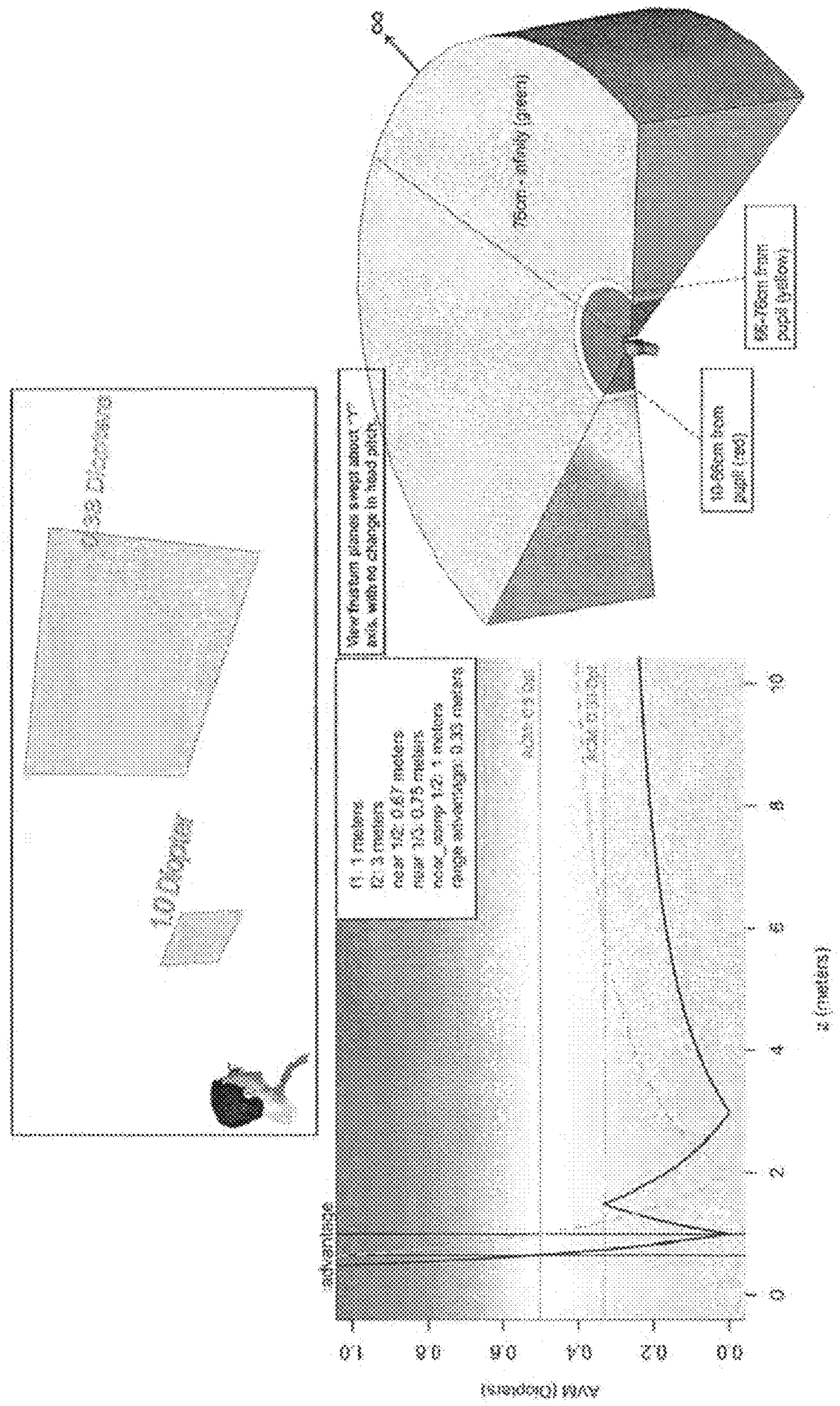
FIG. 5 illustrates depth plane selection and effects on accommodation-vergence mismatch according to some embodiments.

To create as natural a 3D experience as possible, some embodiments implement multiple depth planes to cap AVM below given thresholds and reduce user discomfort that may otherwise result from AVM. For example, FIG. 5 depicts one embodiment in which tolerated AVM is configured as 0.333 diopters. This diopter distance corresponds to three meters from a user, where AVM would be zero for content rendered at that depth plane. As diopter-to-distance is an inverse relationship, AVM will asymptotically approach but never be more than 0.333 diopters as content approaches optical infinity. As content is rendered closer to a user than 3 m, a second depth plane can be implemented so that content may be displayed at that second depth plane without rising above the 0.333 diopter AVM. Content will then increase in AVM as it is brought in even closer from that second depth plane, just as naturally occurs with objects very close to an eye. For example when bringing a finger in from arm's length towards the eye, the eyes will have a harder and harder time maintaining the same quality of focus on the eye, the finger may appear to jump between focus of a dominant and non-dominant eye or the field of view of the user or may split into two images completely. One of skill in the art will appreciate that additional AVM thresholds are possible and will induce depth plane placements at different distances corresponding to that AVM threshold, or that even more depth planes to render content even closer to the eyes within a particular AVM threshold is possible. FIG. 5 merely illustrates one embodiment with depth planes at 0.333 and 1 diopter (3 meters and 1 meter respectively) to maintain all rendered content beyond seventy-six centimeters below an AVM threshold of 0.333 diopters.

Figure 6B:
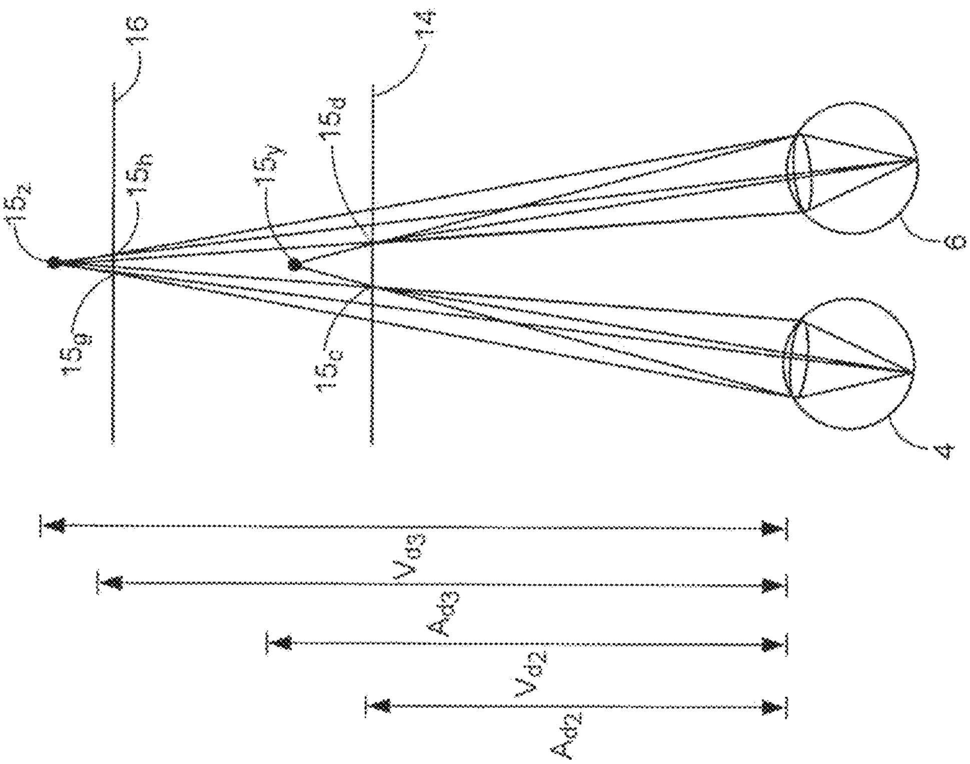
FIGS. 6A-B illustrate comparative accommodation-vergence mismatch between two objects given certain depth planes according to some embodiments.
Figure 6A:
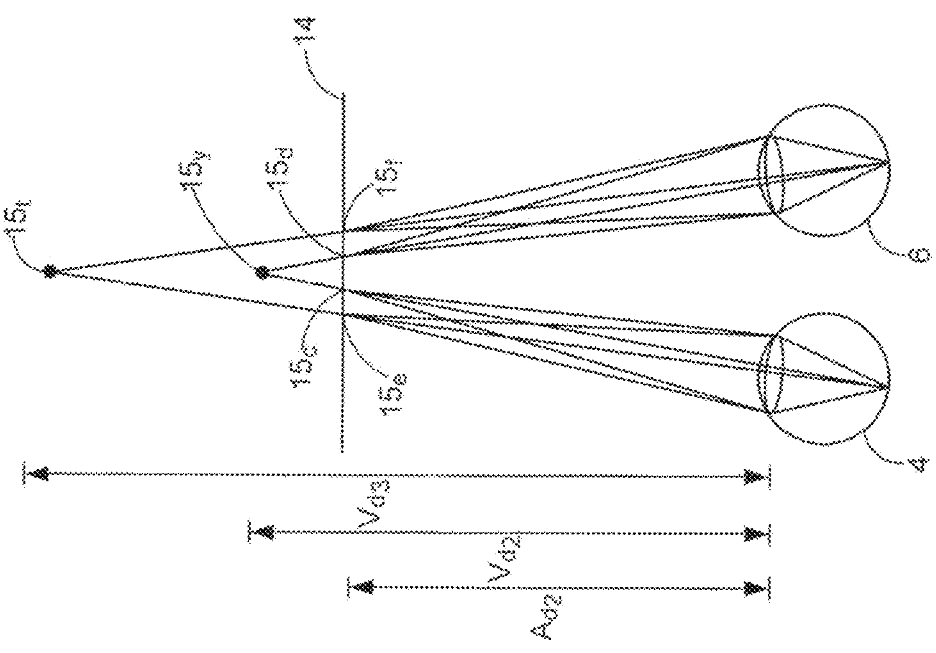

FIG. 6B depicts the benefits of multiple depth planes. FIG. 6A is a duplicate of FIG. 4, re-displayed for ease of comparison to FIG. 6B. In FIG. 6B, a second depth plane 16 is added, at an accommodation distance $A_{d3}$ from eyes 4 and 6. To focus on content 15*z*, the eyes 4 and 6 no longer need to assume a vergence stance of 15*e* and 15*f* as in FIG. 6A, but instead can assume the vergence stance 15*g* and 15*h*. With the ratio of $V_{d3}$ to $A_{d3}$ lower as compared to $V_{d3}$ to $A_{d2}$ of FIG. 6A, a user can focus on the more distant content 15*z* at depth plane 16 with the almost same visual perception required to focus on nearer content 15*y* at depth plane 14. In other words, the vergence position of 15*g* and 15*h* is much smaller and more natural than the vergence position 15*e* and 15*f* to view the same content 15*z*, by virtue of the multiple depth plane system of FIG. 6B.

Figure 7A:
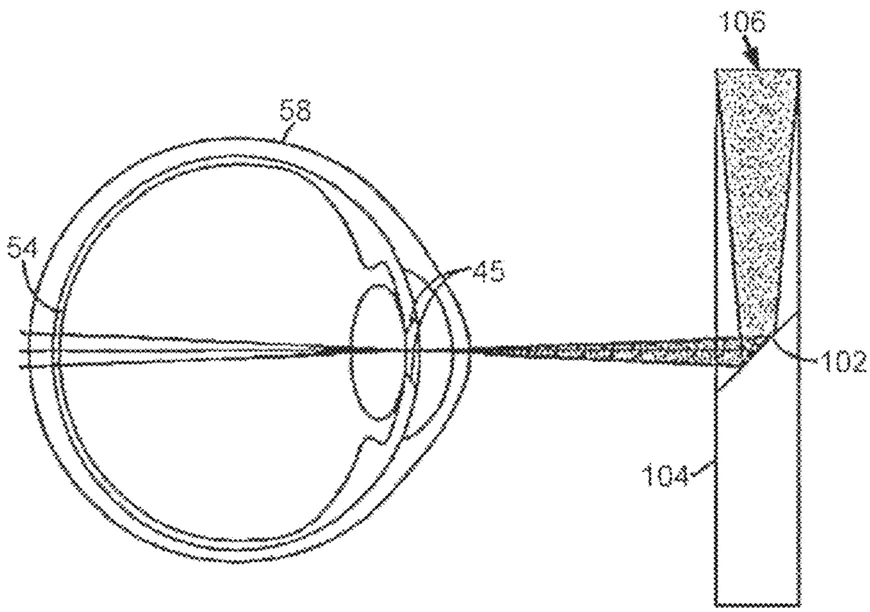
FIGS. 7A-B illustrate cross section views of light projection into a user's eye through a waveguide according to some embodiments.

FIG. 7A depicts a simplified display configuration to present the human eyes with an external light pattern that can be comfortably perceived as augmentations to physical reality, with high levels of image quality and 3D perception, as well as being capable of letting real world light and images be perceived. As depicted, a single at least partially transparent waveguide 104 receives a light pattern 106, and a diffraction grating 102 within waveguide 104 outcouples the light to eye 58. In some embodiments, diffraction grating 102 is configured for a particular depth plane, such that when lens 45 focuses through accommodation-vergence reflex on the light pattern it receives, retina 54 processes the light pattern as an image located at the configured depth plane. In some embodiments, light pattern 106 is configured for a particular depth plane, such that when lens 45 focuses through accommodation-vergence reflex on the light pattern it receives, retina 54 processes the light pattern as an image located at the configured depth plane.

As depicted, for illustrative purposes only, light pattern 106 is a photon-based radiation pattern into waveguide 104 but one of skill in the art will appreciate that light pattern 106 could easily be a single beam of light injected into waveguide 104 and propagates to diffraction grating 102 by total internal reflection before outcoupling to eye 58. One of skill in the art will further appreciate that multiple diffractive gratings 102 may be employed to direct light pattern 106 to eye 58 in a desired manner.

Figure 7B:
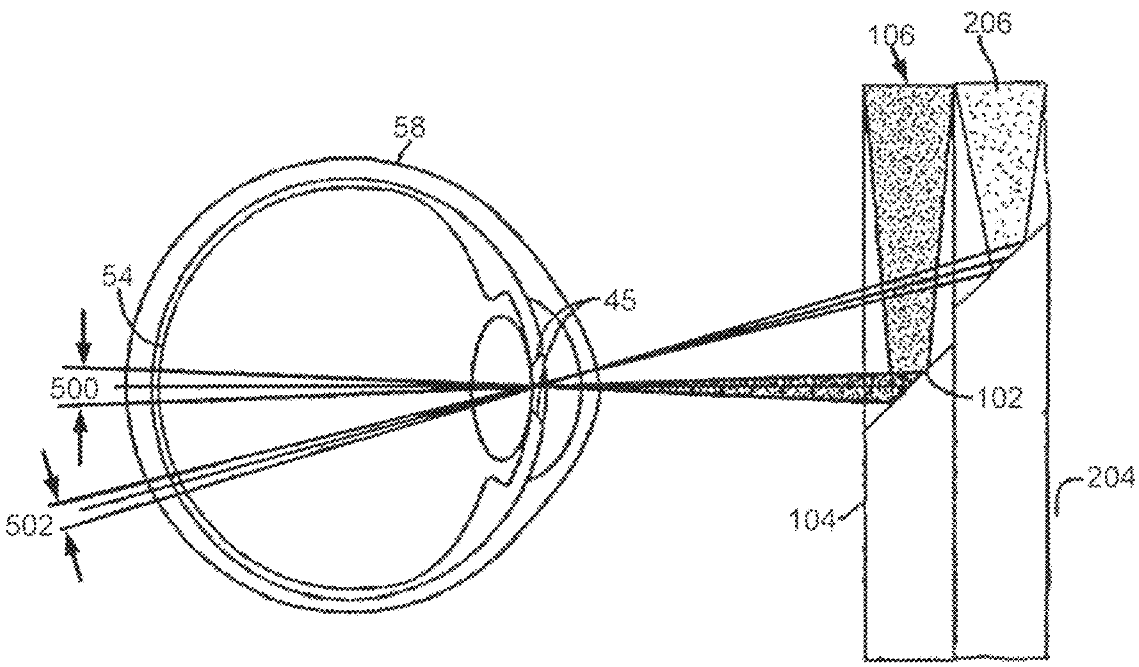

To create richer fields of view for such a system, FIG. 7B depicts a second at least partially transparent waveguide 204 configured to outcouple light pattern 206 to eye 58 in much the same way as depicted in FIG. 6A. Second waveguide 204 outcouples light pattern 206 to eye 58 by diffraction grating 202. Eye 58 receives light pattern 206 on retina 54, but lens 45 perceives light 206 at a different depth plane through a different accommodation-vergence reflex than that required for light pattern 106. For example, light pattern 106 is gathered in one part of the retina 54 with a first depth perception 500, whereas light pattern 206 is gathered in a second part of the retina 54 with a second depth perception 502. In instances where light patterns 106 and 206 correspond to the same rendered augment reality content, the depth richness creates a more realistic and comfortable to perceive image than that simply produced as depicted in FIG. 6A by a single depth plane. Furthermore, in some embodiments, a frame-sequential configuration of light pattern 106 and 206 may present eye 58 with a sequence of frames at high frequency that provides the perception of a single coherent augmented reality scene, or augmented reality content in motion, across multiple depths and fuller field of view than a narrow projection perceived by a retina 54 at a single depth plane.

Figure 8:
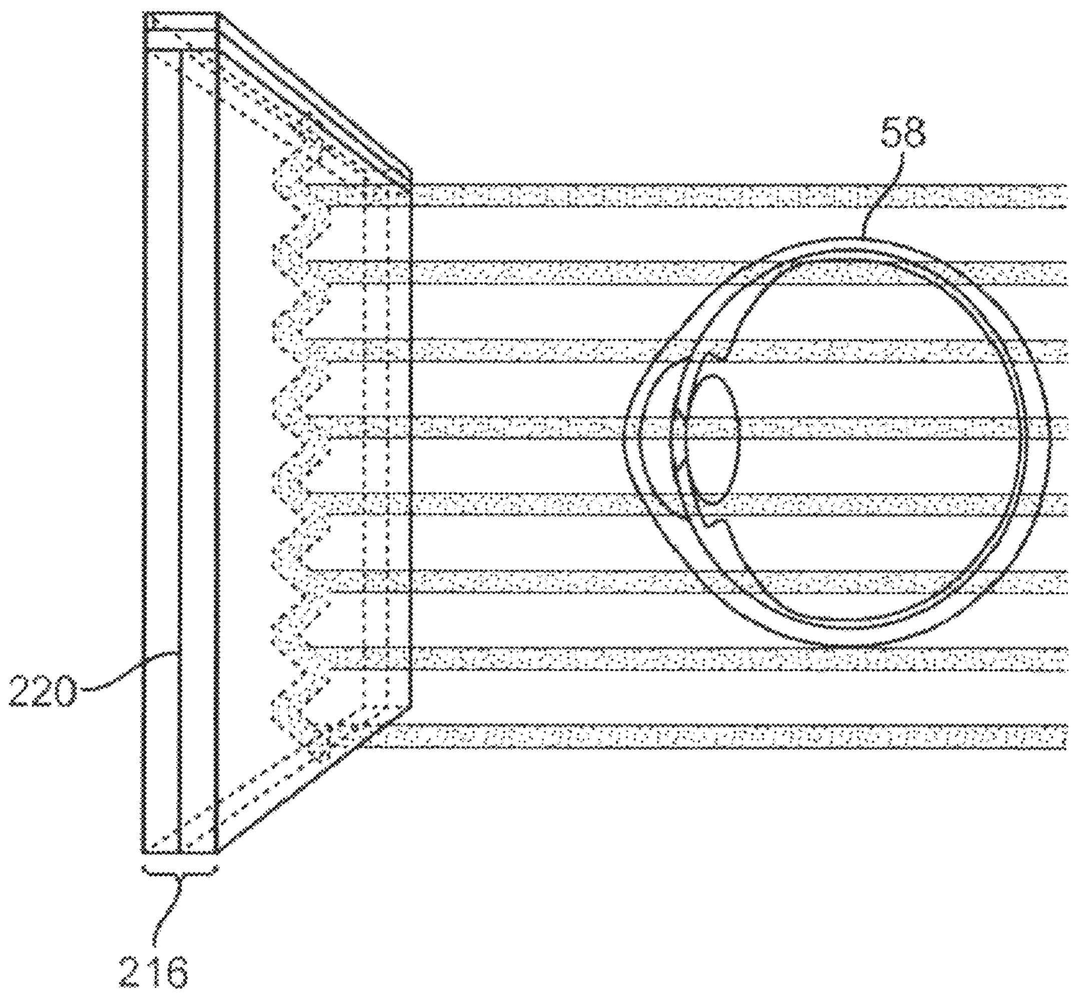
FIG. 8 illustrates a light field projected to a user's eye by a diffractive optical element (DOE) in a waveguide according to some embodiments.

FIG. 8 further depicts a simplified version of a planar waveguide 216, which may comprise at least two waveguides configured to propagate light of a particular wavelength, but at different depth planes relative to eye 58. As depicted, a diffraction grating 220, which may be a diffractive optical element (DOE) has been embedded within the entire vertical length of planar waveguide 216 such that as a light pattern is totally internally reflected along planar waveguide 216, it intersects the DOE 220 at a multiplicity of locations. As light is outcoupled to eye 58, portions may nonetheless continue to propagate due to the diffraction efficiency of the DOE 220 within planar waveguide 216. As portions continue to totally internally reflect through planar waveguide 216, they may encounter the additional DOE 220 gratings and outcouple to the eye, or other portions may continue to propagate by total internal reflection along the length of planar waveguide 216.

Preferably, DOE 220 has a relatively low diffraction efficiency so that only a portion of the light pattern propagating within planar waveguide 216 is diffracted away toward the eye 58 at any given intersection of the DOE 220, while the rest continues to move through the planar waveguide 216 via total internal reflection. The light pattern carrying any image information is thus divided into a number of related light beams that exit planar waveguide 216 at a multiplicity of locations and the result is a large pattern of outcoupled light incident upon eye 58 to create a rich image perception from a single light pattern.

Figure 9:
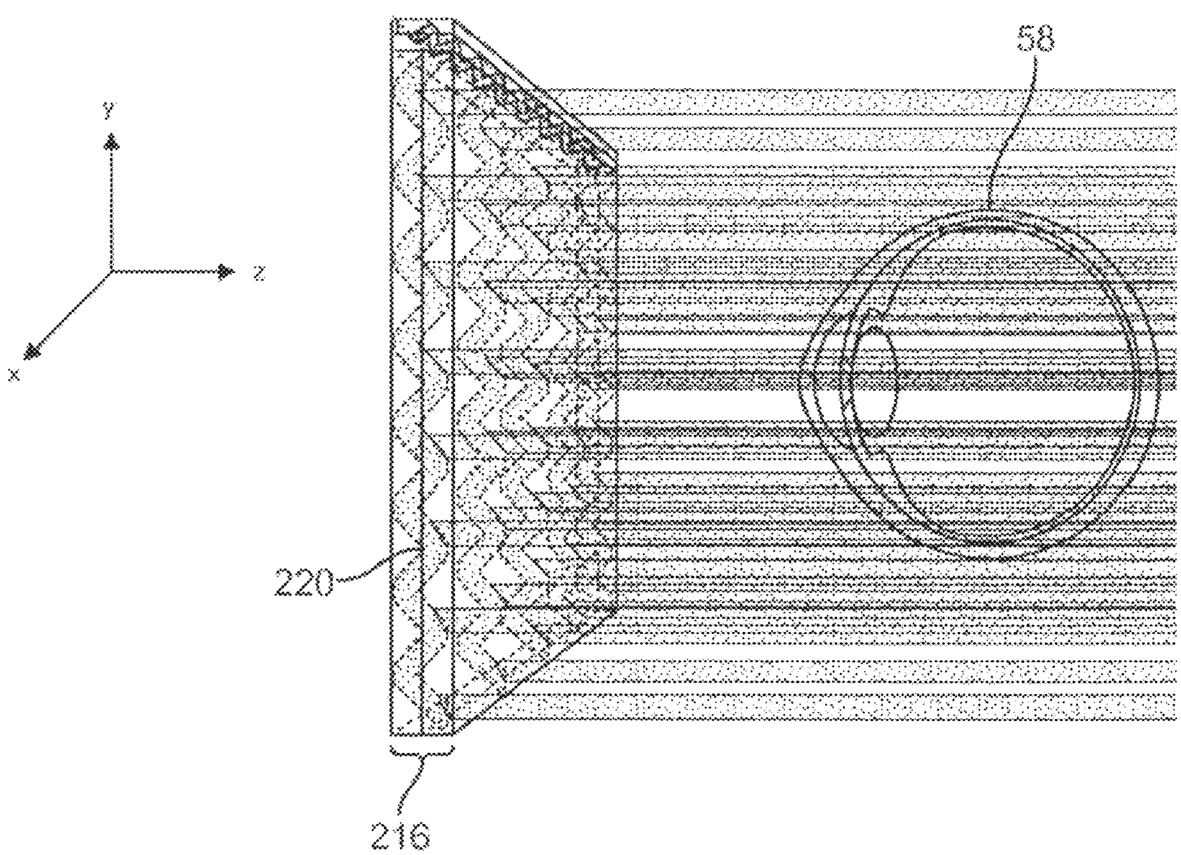
FIG. 9 illustrates a wide light field projected to a user's eye by a plurality of DOEs in a waveguide according to some embodiments.

FIG. 9 depicts a plurality of outcoupled light patterns, illustrating the even richer light field incident upon eye 58 when light propagates a waveguide in both an x and y direction before outcoupling in a z direction towards eye 58. Embodiments with a series of DOEs 220 configured to permit partial diffraction of light patterns outcoupled in a z direction, and permit other portions to totally internally reflect in an x or y direction before outcoupling in a z direction create imagery across an entire retina of eye 58.

Figure 10:
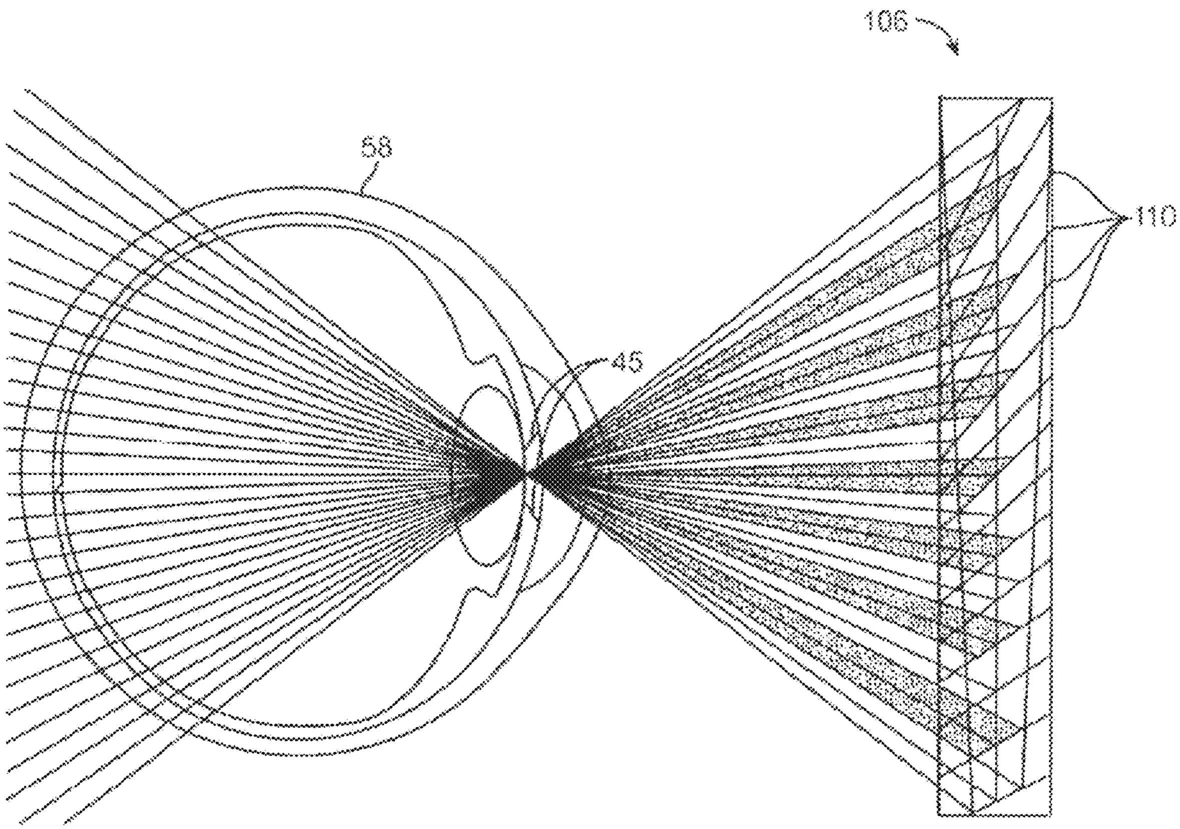
FIG. 10 illustrates a focused light pattern outcoupled to a user's eye by a DOE within a waveguide according to some embodiments.
Figure 11:
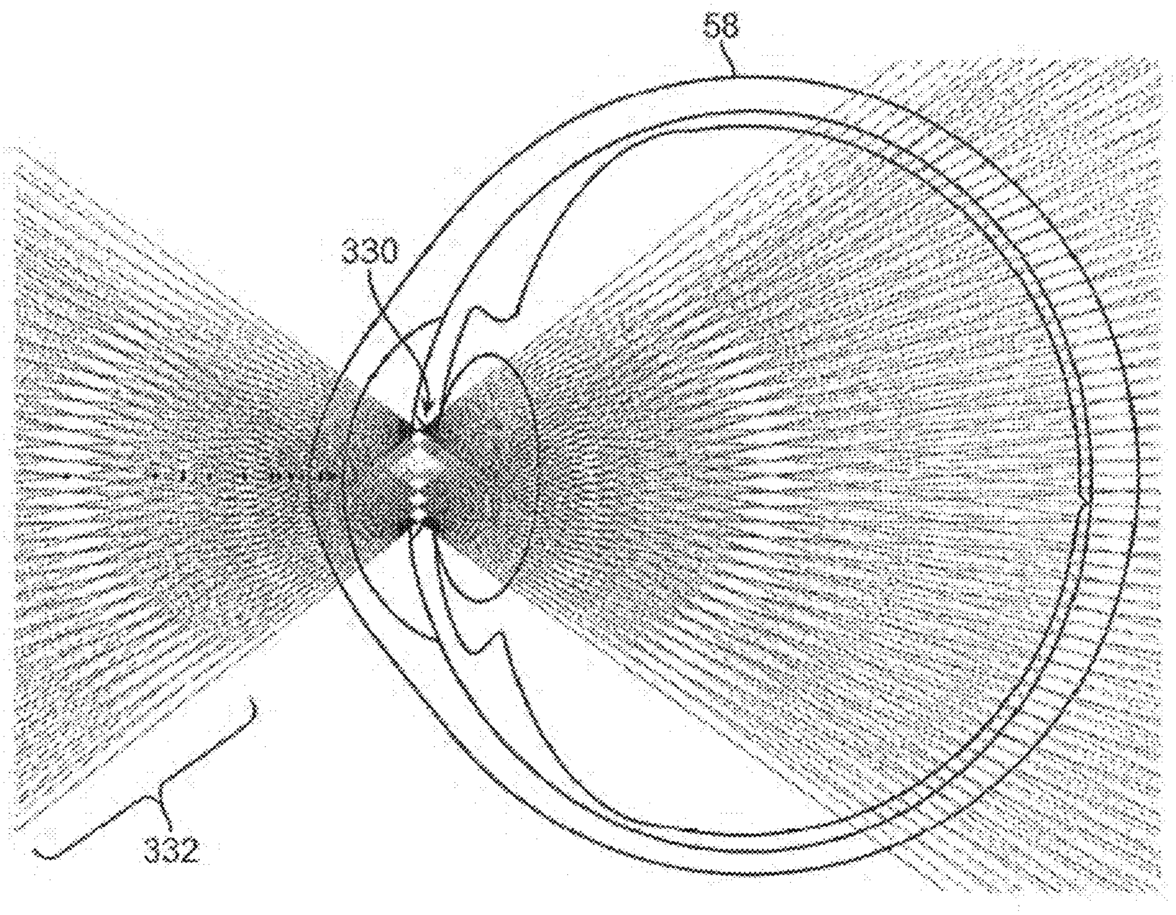
FIG. 11 illustrates beamlets injected into a plurality of subpupils of a user's eye according to some embodiments.

FIG. 10 depicts the retinal pattern of a plurality of outcoupled light patterns from outcoupling DOEs 110 from waveguide 106; as depicted, FIG. 10 illustrates the multiple retinal areas that may activated by a single light pattern 106, enabling wider fields of view or time sequential framing of light patterns to excite different part of the retina to perceive motion of rendered augmented reality content. One of skill in the art will appreciate that when combined with the rich field of view patterns depicted in FIG. 9, the retina can receive a large amount of light patterns by virtue of the DOEs 110 throughout waveguide 106. As depicted, FIG. 10 illustrates all light focusing in lens 45 of eye 58. FIG. 11 illustrates a "sub-pupil" system wherein a multiplicity of incoming light pattern beamlets 332 enters the eye through separate small exit pupils 330 of eye 58 at discrete vertical focal points. By doing so, smaller beamlets of a light pattern, which may be easier to project and diffract through a waveguide or can carry specific light pattern properties such as wavelength, can be aggregated to be perceived as a larger diameter beam. For example, whereas the light pattern of FIG. 7A produced a focal point in lens 45 from a light pattern 106; the beamlets 332 may be much smaller and still produce the same effect by creating a plurality of sub-pupils 330.

In other words, a set of multiple narrow beams may be used to emulate what is going on with a larger diameter variable focus beam; if the beamlet diameters are kept to a maximum of about 0.5 mm, they maintain a relatively static focus level, and to produce the perception of out-of-focus when desired, the beamlet angular trajectories may be selected to create an effect much like a larger out-of-focus beam (such a defocussing treatment may not be the same as a Gaussian blur treatment as for a larger beam, but will create a multimodal point spread function that may be interpreted in a similar fashion to a Gaussian blur).

In a some embodiments, the beamlets are not mechanically deflected to form this aggregate focus effect, but rather the eye receives a superset of many beamlets that includes both a multiplicity of incident angles and a multiplicity of locations at which the beamlets intersect the pupil; to represent a given pixel from a particular viewing distance, a subset of beamlets from the superset that comprise the appropriate angles of incidence and points of intersection with the pupil (as if they were being emitted from the same shared point of origin in space) are matched by color and intensity to represent that an aggregate wavefront, while beamlets in the superset that are inconsistent with the shared point of origin are not matched with that color and intensity and will not be perceived.

Figure 12:
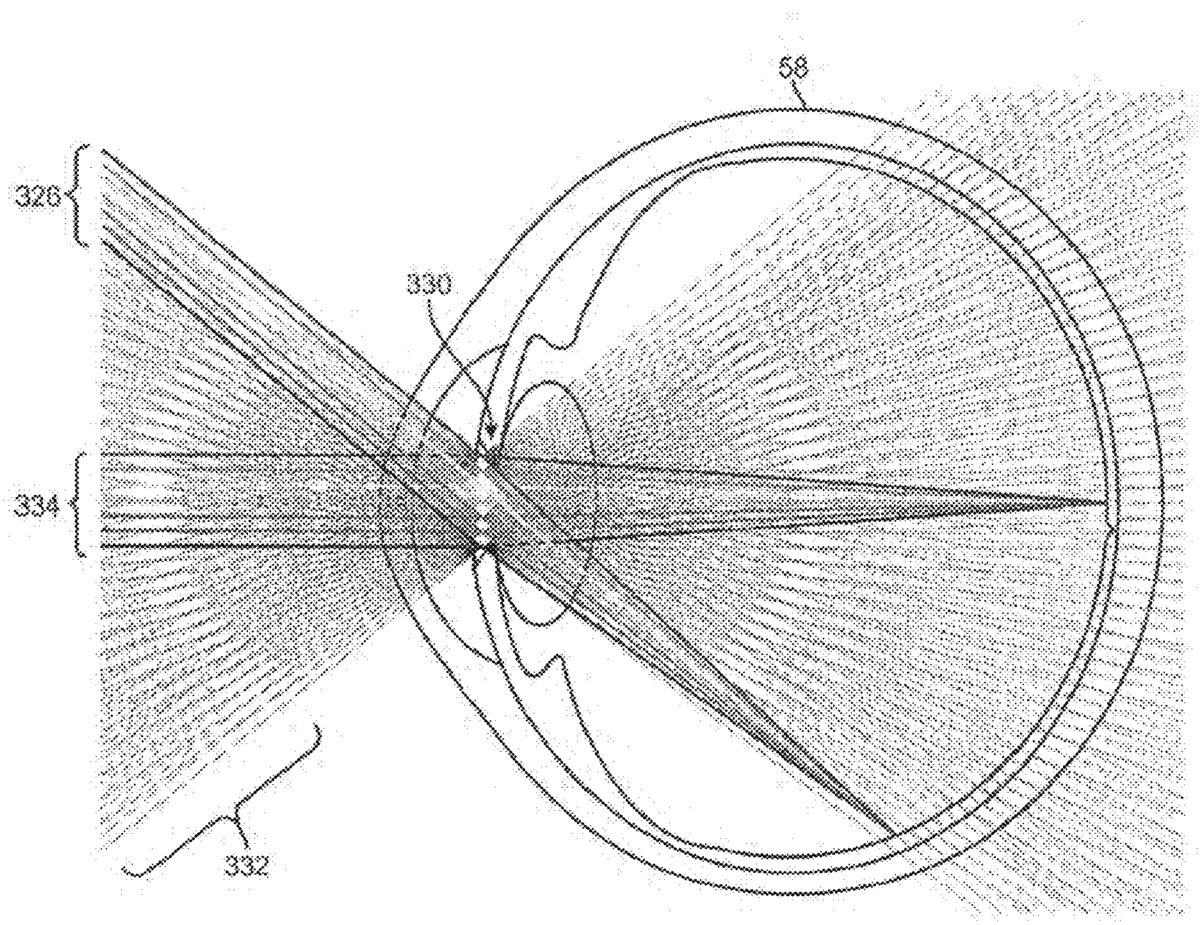
FIG. 12 illustrates focusing certain collimated beamlets through subpupils as if the aggregate beamlets were a larger diameter single beam according to some embodiments.

FIG. 12 shows another subset of beamlets representing an aggregated collimated beam 334 in the field of view of eye 58. Here, the eye 58 is accommodated to infinity to account for collimated beam 334, so the beamlets within the collimated beam 334 fall on the same spot of the retina, and the pixel created by the beamlets is perceived to be in focus. Similarly, collimated beam 326 falls on a different part of the retina to perceive a pixel in that area of the field of view. If, in contrast, a different subset of beamlets were chosen that were reaching the eye as a diverging fan of rays, those beamlets would not fall on the same location of the retina and not be perceived as in focus until the eye were to shift accommodation to a near point that matches the geometrical point of origin of that fan of rays.

Figure 13:
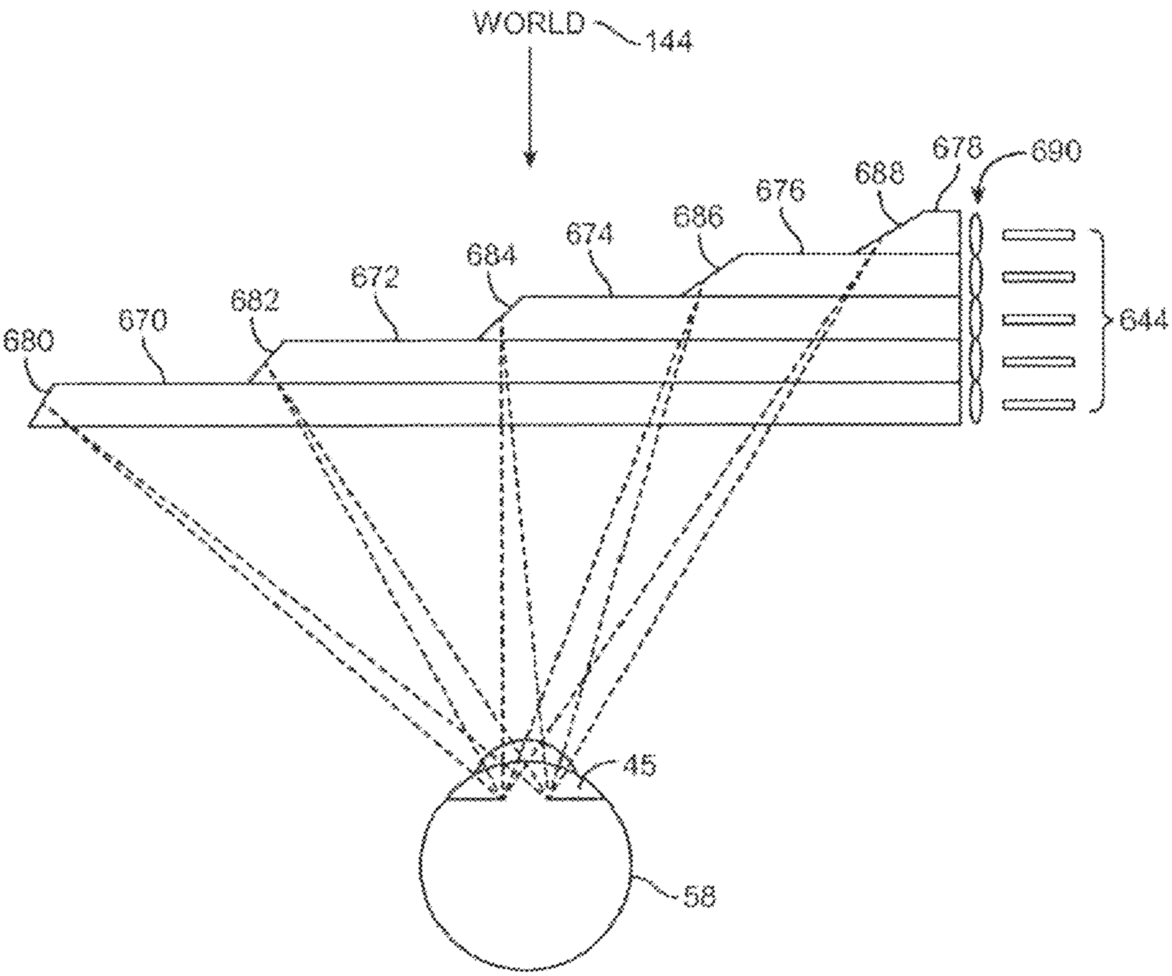
FIG. 13 illustrates a stack of waveguides outcoupling light to a user's eye while also permitting world light to permeate through the stack to the user's eye according to some embodiments.

FIG. 13 depicts a stack 664 of planar waveguides each fed a light pattern by an incoupling DOE 690 diffracting light of a particular wavelength into a planar waveguide of stack 644. Each waveguide comprises a plurality of DOEs 680, 682, 684, 686, and 688 configured to diffract light through the respective planar waveguide and outcouple towards eye 58 to create the perception of augmented reality content across a field of view or at multiple depth planes. FIG. 13 depicts five waveguides within stack 644 for illustrative purposes only, preferably a stack 664 comprises six waveguides, corresponding to two waveguides associated with a depth plane at each of a red, green, and blue wavelength of light. World light 144 may also permeate and transmit through stack 644, as each waveguide within stack 644 is at least partially transparent to permit rendering of augmented reality content in conjunction with natural perception of the real world environment.

Figure 14:
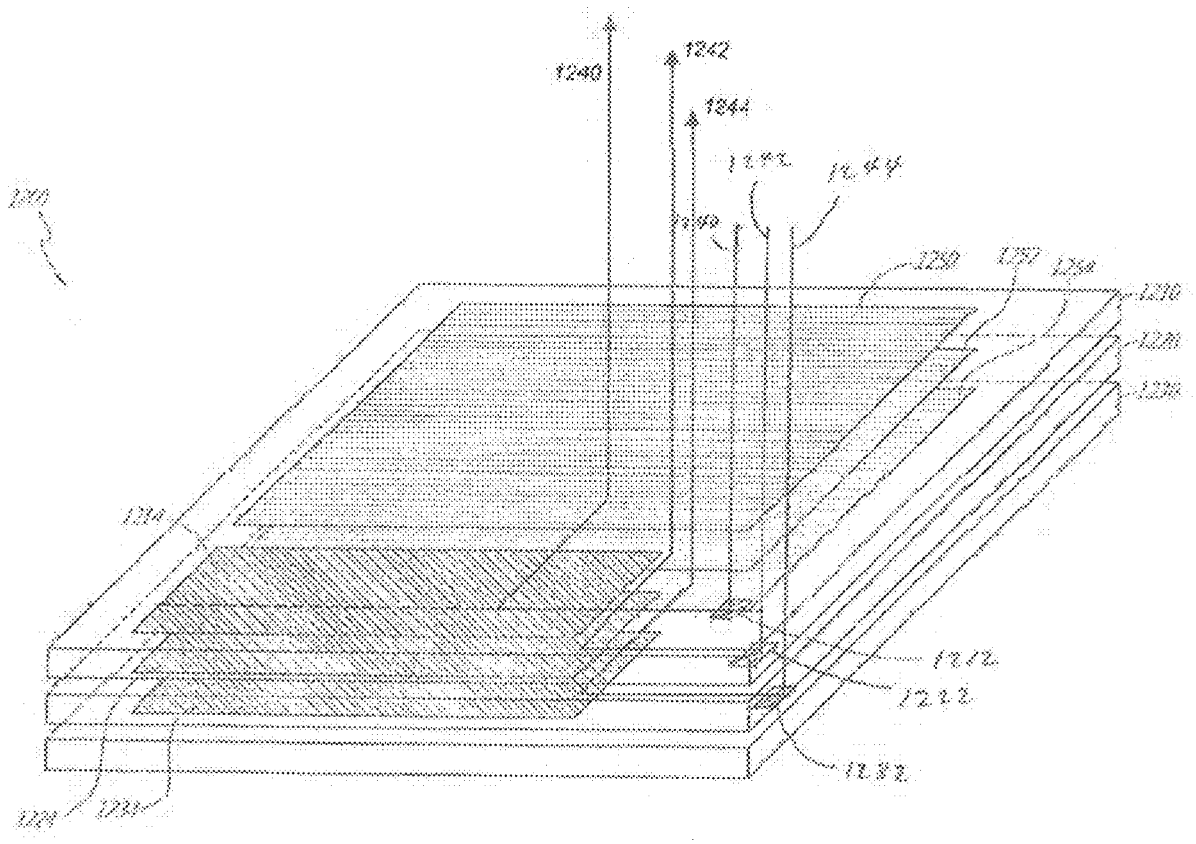
FIG. 14 illustrates an incoupling DOE, an orthogonal DOE, and an exit DOE configured to redirect injected light into, through, and out of a plurality of waveguides according to some embodiments.

In some embodiments, and as depicted in FIG. 14, an eyepiece 1200 to an augmented reality display system may comprise a plurality of DOE types disposed on a waveguide to direct light with particular properties to a user's eye. A plurality of light patterns 1240, 1242 and 1244 are injected into a waveguide stack comprising waveguides 1210, 1220, and 1230. In some embodiments, plurality of light patterns 1240, 1242, and 1244 are injected from a common light source, but represent different wavelengths within the common light source. In some embodiments, each of light pattern 1240, 1242 and 1244 are separate light beams in a particular wavelength, for example red, green and blue light. In some embodiments, each of light patterns 1240, 1242, and 1244 are injected to respective waveguide 1210, 1220, and 1230 by incoupling DOEs 1212, 1222, and 1232. Each incoupling DOE 1212, 1222, and 1232 diffracts at least a portion of light of a particular wavelength of light pattern 1240, 1242, or 1244 into one of waveguide 1210, 1220, or 1230 configured to propagate the incoupled light of the same wavelength of incoupling DOE 1212, 1222, and 1232. In some embodiments, after incoupling, light patterns 1240, 1242, and 1244 propagate into OPE 1214, 1224, and 1234 respectively. OPE 1214, 1224 and 1234 diffract a portion of light into EPE 1250, 1252, and 1254 respectively, where light patterns 1240, 1242, and 1244 are outcoupled in a z direction towards the eye of a user.

In some embodiments, the net effect of the plurality of light patterns diffracted through a series of waveguides and a plurality of DOEs and then outcoupled to the eye of a user creates a field of view rendering and depth plane placement of virtual or augmented reality content comfortably perceived by the user.

Figure 15:
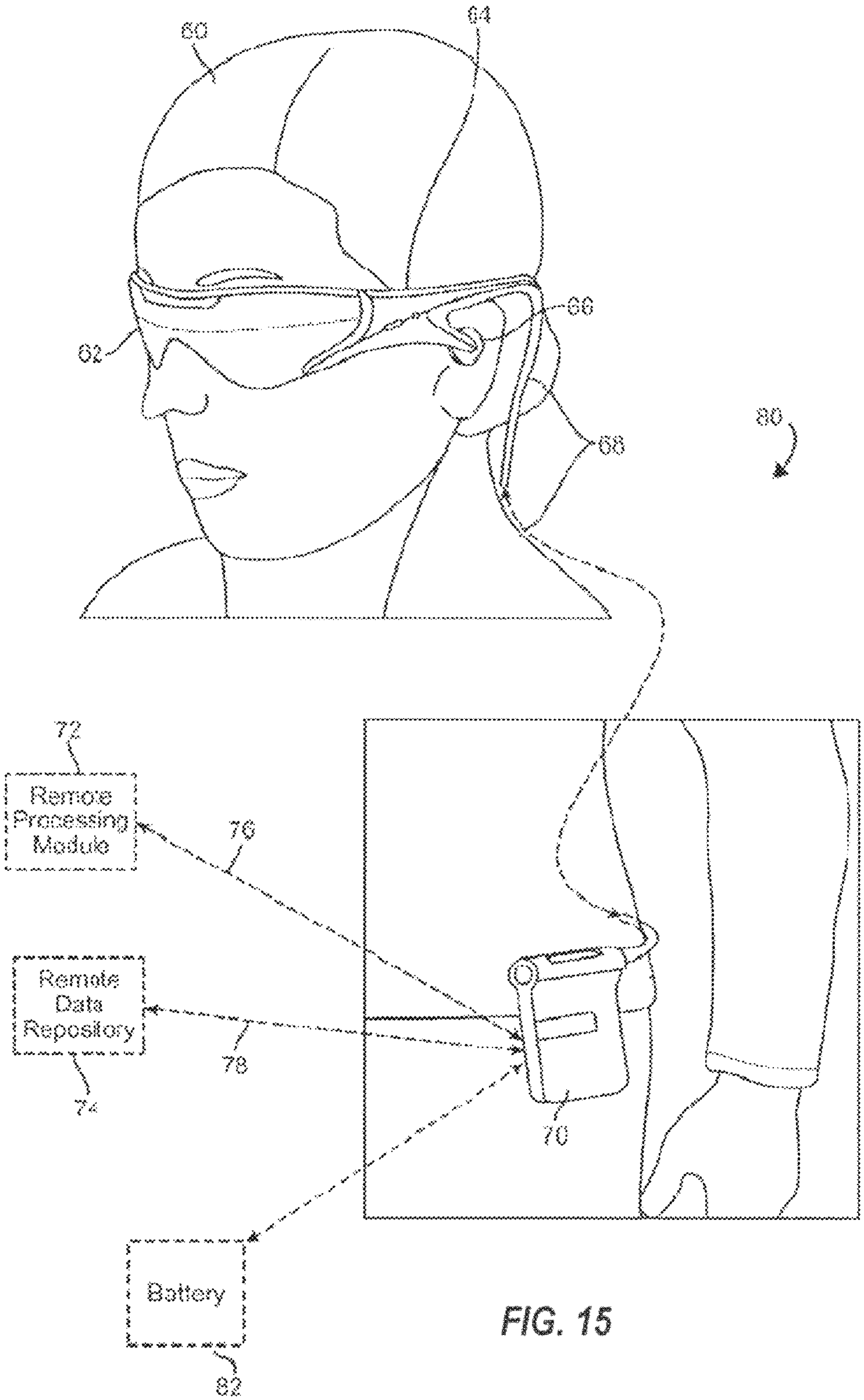
FIG. 15 illustrates a wearable augmented reality display system according to some embodiments.

FIG. 15 illustrates an example of wearable display system 80. The display system 80 includes a head mounted display 62, and various mechanical and electronic modules and systems to support the functioning of that display 62. The display 62 may be coupled to a frame 64, which is wearable by a display system user or viewer 60 and configured to position the head mounted display 62 in front of the eyes of the user 60. In some embodiments, a speaker 66 is coupled to the frame 64 and positioned proximate the ear canal of the user (in some embodiments, another speaker, not shown, is positioned adjacent the other ear canal of the user to provide for stereo/shapeable sound control). The head mounted display 62 is operatively coupled 68, such as by a wired lead or wireless connectivity, to a local data processing module 70 which may be mounted in a variety of configurations, such as fixedly attached to the frame 64, fixedly attached to a helmet or hat worn by the user, embedded in headphones, or otherwise removably attached to the user 60 (e.g., in a backpack-style configuration, in a belt-coupling style configuration).

The local data processing module 70 may comprise a processor, as well as digital memory, such as non-volatile memory (e.g., flash memory), both of which may be utilized to assist in the processing, caching, and storage of data. The data include data a) captured from sensors (which may be, e.g., operatively coupled to the frame 64) or otherwise attached to the user 60, such as image capture devices (such as cameras), microphones, inertial measurement units, accelerometers, compasses, GPS units, radio devices, and/or gyros; and/or b) acquired and/or processed using remote processing module 72 and/or remote data repository 74, possibly for passage to the display 62 after such processing or retrieval. The local data processing module 70 may be operatively coupled by communication links 76, 78, such as via a wired or wireless communication links, to the remote processing module 72 and remote data repository 74 such that these remote modules 72, 74 are operatively coupled to each other and available as resources to the local processing and data module 70.

In some embodiments, the local data processing module 70 may comprise one or more processors configured to analyze and process data and/or image information. In some embodiments, the remote data repository 74 may comprise a digital data storage facility, which may be available through the internet or other networking configuration in a "cloud" resource configuration. In some embodiments, all data is stored and all computations are performed in the local processing and data module, allowing fully autonomous use from a remote module.

In some embodiments, local data processing module 70 is operatively coupled to battery 82. In some embodiments, battery 82 is a removable power source, such as over the counter batteries. In other embodiments, battery 82 is a lithium-ion battery. In some embodiments, battery 82 comprises both an internal lithium-ion battery chargeable by user 60 during non-operation times of wearable display system 80 and removable batteries such that a user may operate wearable display system 80 for longer periods of time without having to be tethered to a power source to charge the lithium-ion battery or having to shut the wearable display system off to replace batteries.

Figure 16A:
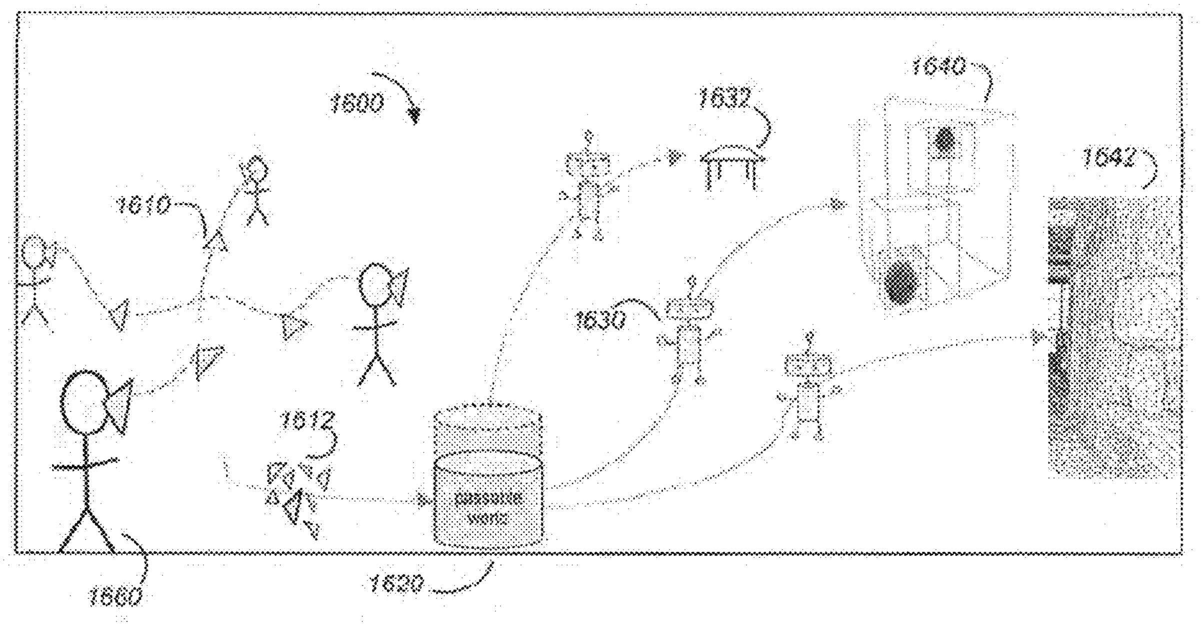
FIG. 16A illustrates an interaction of a user of an augmented reality display system interacting with a real world environment according to some embodiments.

FIG. 16A depicts a user 1660 wearing an augmented reality display system rendering augmented reality content as user 1660 moves through a real world environment 1600.

The user positions the augmented reality display system at positions 1610, and the augmented reality display system records ambient information of the passable world relative to positions 1610 such as pose relation to mapped features or directional audio inputs. Positions 1610 are aggregated to data inputs 1612 and processed at least by passable world module 1620, such as in remote processing module 72 depicted in FIG. 15. Passable world module 1620 determines where and how augmented reality content 1630 can be placed in the real world as determined from inputs 1612, such as on a fixed element 1632 (a table as depicted in FIG. 16A) or within structures not yet within a field of view 1640 or relative to mapped mesh model of the real world 1642. As depicted, fixed elements 1632 serves as a proxy for any fixed element within the real world which may be stored in passable world module 1620 so that user 1660 can perceive content on table 1632 without having to map table 1632 each time user 1660 sees it. Fixed content 1632 may, therefore, be a mapped mesh model from a previous modeling session or determined from a separate user but nonetheless stored on passable world module 1620 for future reference by a plurality of users. Therefore, passable world model could recognize the environment 1600 from a previously mapped environment and display augmented reality content without the user's device mapping the environment 1600 first, saving computation process and cycles and avoiding latency of any rendered augmented reality content.

Similarly, mapped mesh model of the real world 1642 can be created by the augmented reality display system and appropriate surfaces and metrics for interacting and displaying augmented reality content 1630 can be mapped and stored in the passable world module 1620 for future retrieval by the user or other users without the need to re-map or model. In some embodiments aggregated data inputs 1612 are inputs such as geolocation, user identification, and current activity to indicate to passable world module 1620 which fixed elements 1632 are available, which augmented reality content 1630 has last been placed on fixed element 1632 and whether to display that same content (such augmented reality content being "persistent" content regardless of user viewing a particular passable world model).

Figure 16B:
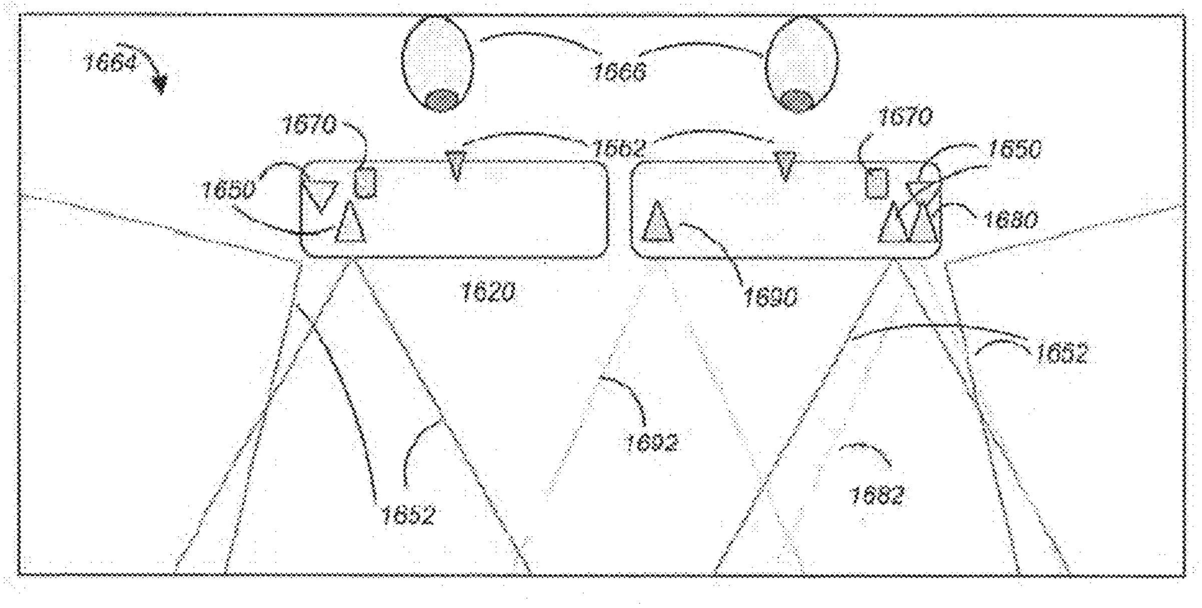
FIG. 16B illustrates components to a viewing optics assembly according to some embodiments.

FIG. 16B depicts a schematic of a viewing optics assembly 1664 and the attendant components. Oriented to user eyes 1666, in some embodiments, two eye tracking cameras 1662 detect metrics of user eyes 1666 such as eye shape, eyelid occlusion, pupil direction and glint on user eyes 1666. In some embodiments, a depth sensor 1690, such as a time of flight sensor, emits relay signals to the world to determine distance to given objects. In some embodiments, world cameras 1650 record a greater-than-peripheral view to map the real world environment and detect inputs that may affect augmented reality content. Camera 1680 may further capture a specific timestamp of real world images within a user field of view. Each of world cameras 1650, camera 1680 and depth sensor 1690 have respective fields of view of 1652, 1682, and 1692 to collect data from and record a real world scene, such as real world environment 1600 depicted in FIG. 16A.

Inertial measurement units 1670 may determine movement and orientation of viewing optics assembly 1664. In some embodiments, each component is operatively coupled to at least one other component; for example depth sensor 1690 is operatively coupled to eye tracking cameras 1662 as a confirmation of measured accommodation against actual distance a user eyes 1666 are looking at.

Figure 17:
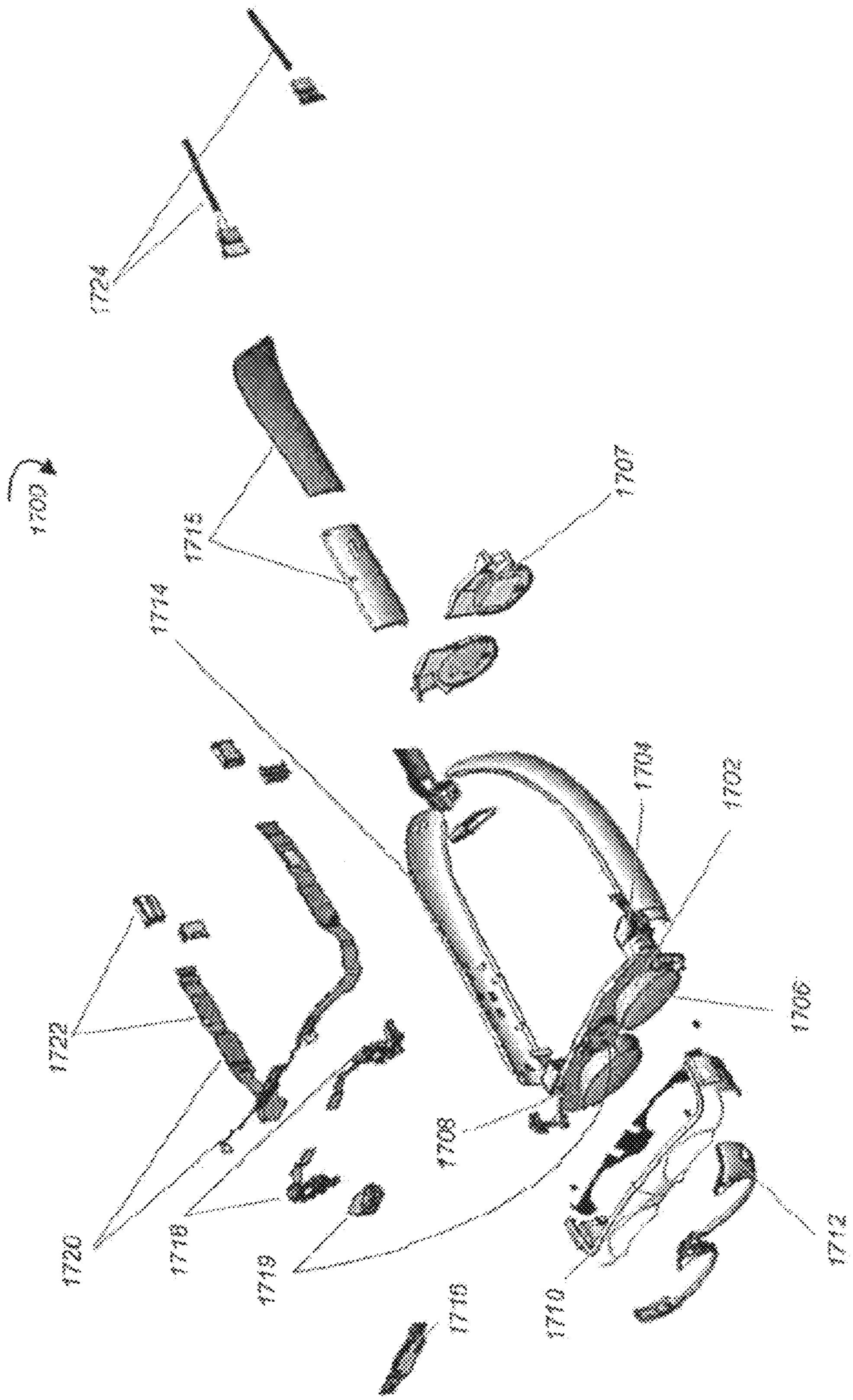
FIG. 17 illustrates an exploded view of a head mounted display with certain components according to some embodiments.

FIG. 17 depicts a head mounted display 1700, such as the head mounted display 62 depicted in FIG. 15. Viewing optics assembly 1702 comprises rigid frame 1708 to which projectors 1704 are coupled. In some embodiments, projectors 1704 comprise an LCOS mechanism with LED illuminators and spatial light modulators. In some embodiments, viewing optics assembly 1702 further comprises eyepieces 1706. In some embodiments, eyepieces 1706 are comprise a plurality of waveguides configured to direct light from projectors 1704 to an eye of a user of head mounted display 1700. In some embodiments, viewing optics assembly 1702 further comprises eye tracking cameras (not depicted) configured to collect eye tracking data of a wearer of head mounted display 1700, such as eyelid position or pupil direction.

In some embodiments, viewing optics assembly 1702 hosts additional sensors and components arranged on rigid frame 1708, such as primary control board (PCB) 1716. PCB 1716 hosts various processors and circuitry to operate the various components assembled within viewing optics assembly 1702 and rigid frame 1708. In some embodiments, world cameras 1718 attach to rigid frame 1708 at either end of viewing optics assembly 1702. In some embodiments, world cameras 1718 are instead disposed between eyepieces 1706 of viewing optics assembly 1702. In some embodiments, depth sensor 1719 is attached to rigid frame 1708 between eyepieces 1706. In some embodiments, depth sensor 1719 is a vertical cavity surface emitting laser (VCSEL), in some embodiments depth sensor 1719 is an edge-emitting laser or other time of flight sensor. One of skill in the art will appreciate other sensors and components that may be hosted within viewing optics assembly 1702 and operably controlled by primary control board 1716, for example, IMUS or picture cameras may be disposed on viewing optics assembly 1702 or attached to rigid frame 1708.

In some embodiments, front band 1710 couples to viewing optics assembly 1702. Front band 1710 both protects components of viewing optics assembly 1702 from external elements, but also serves as a thermal barrier between a user of head mounted display 1700 and viewing optics assembly 1702. In some embodiments, sensor cover 1712 attaches to front band 1710 to further protect viewing optics assembly 1702 and components thereon.

In some embodiments, arms 1714 are coupled to rigid frame 1708 and are configured to traverse the head of a user of head mounted display system 1700 and maintain eyepieces 1706 in front of a user's eyes. In some embodiments, arms 1714 are configured to rest on the ears of a user; in some embodiments, frame arms 1714 are configured to retain inward tension to grip the head of the user to maintain a secure position on a user's head. In some embodiments, pads 1715 are attached to the inside of arms 1714 (inside being the side of arms 1714 in contact with the user). In some embodiments, pads 1715 comprise heat spreaders to mitigate thermal effects within head mounted display 1700. In some embodiments, pads 1715 are made from a soft foam or coated with a rubber interface to semi-deform when placed in compression against a user's head from inward tension of arms 1714 and still produce a comfortable feel to the user.

In some embodiments, audio assembly 1720 is coupled to rigid frame 1708 and traverse either of arms 1714 to place speakers 1722 proximate to an ear of a user of head mounted display system 1700. In some embodiments, PCB 1716 further controls audio inputs and outputs to audio assembly 1720. In some embodiments audio assembly 1720 comprises a microphone to record sounds from the external world and relay them to primary control board 1716. Primary control board 1716, given such audio inputs may perform a variety of functions. For example, given microphone inputs from audio assembly 1720, head mounted display 1700 can store them for future retrieval (such as in remote data repository 74 depicted in FIG. 15), alter augmented reality content performance in response to given audio input (e.g. a verbal "off" command could shut the entire system down), or transmit the audio input to other user of communications devices (e.g. phone calls, voice messaging for electronic delivery). Cables 1724 facilitate communication between components throughout head mounted display 1700, as well as communication to a local data processing module such as local data processing module 70 depicted in FIG. 15.

In some embodiments, inner covers 1707 may provide further optical effects to a user. For example, inner covers 1707 may include a prescriptive lens to adjust optical properties of augmented reality content to a particular vision prescription of a user. Such a prescriptive lens would be disposed between the eye of a user and a eyepiece 1706 of head mounted display 1700. In some embodiments, inner covers 1707 may include detachable light modifiers, such as polarized lens to reflect or absorb certain light.

Figure 18:
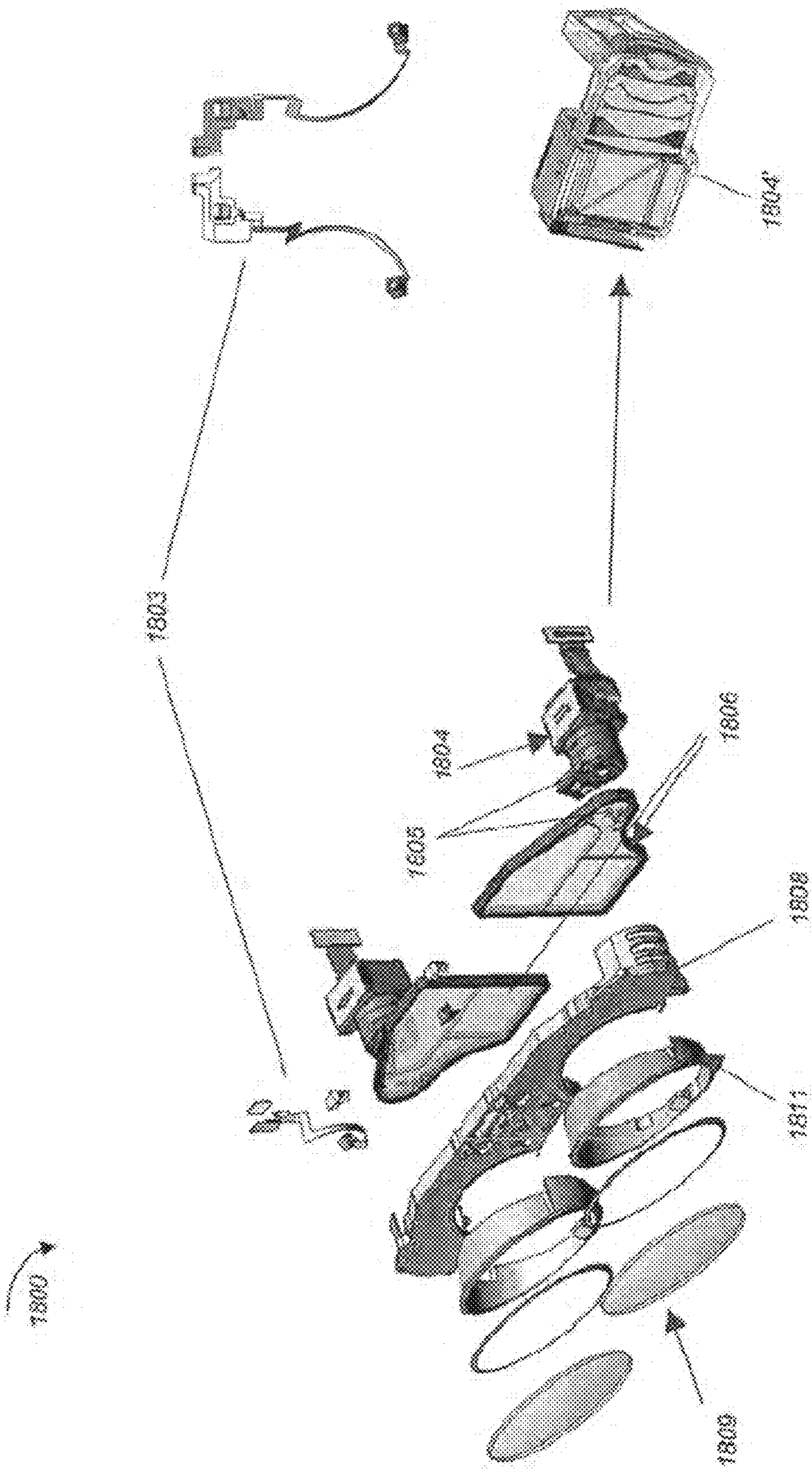
FIG. 18 illustrates an exploded view of a viewing optics assembly according to some embodiments.

FIG. 18 depicts an exploded view of viewing optics assembly 1800. Rigid frame 1808 houses eyepieces 1806, which may comprise a plurality of waveguides for incoupling light into the eye of a user of head mounted display 1700 (depicted in FIG. 17) to which viewing optics assembly 1800 is a part of Projector 1804, depicted at 1804' in a cross section view as an LCOS system with a polarized beam splitter and plurality of lens, optically couples to eyepieces 1806 at incoupling point 1805. In some embodiments, incoupling point 1805 is the entry point for injected light into the eyepiece 1806 and waveguides within the eyepiece 1806.

Eyepieces 1806 are affixed to rigid frame 1808. Rigid frame 1808 further houses mounting structure 1811. Mounting structure 1811 may house cover lens 1809, disposed on the world side of viewing optics assembly 1800, or inner cover 1707 depicted in FIG. 17 on the user side of a viewing optics assembly. In some embodiments, cover lens 1809 may comprise anti-scratch material or other protective covering to prevent contact of the eyepieces 1806 such as with oils from fingertips or dust and debris from the external environment. In some embodiments, cover lens 1809 may include light modifiers, such as polarized lens to reflect or absorb certain light. In some embodiments, eyepieces 1806 comprise such a protective cover lens in addition to the plurality of waveguides. In some embodiments, eye tracking system 1803 couples to mounting structure 1811 to dispose a pair of eye tracking cameras at the bottom of mounting structure 1811 looking upward into the eyes of a user.

Figure 19:
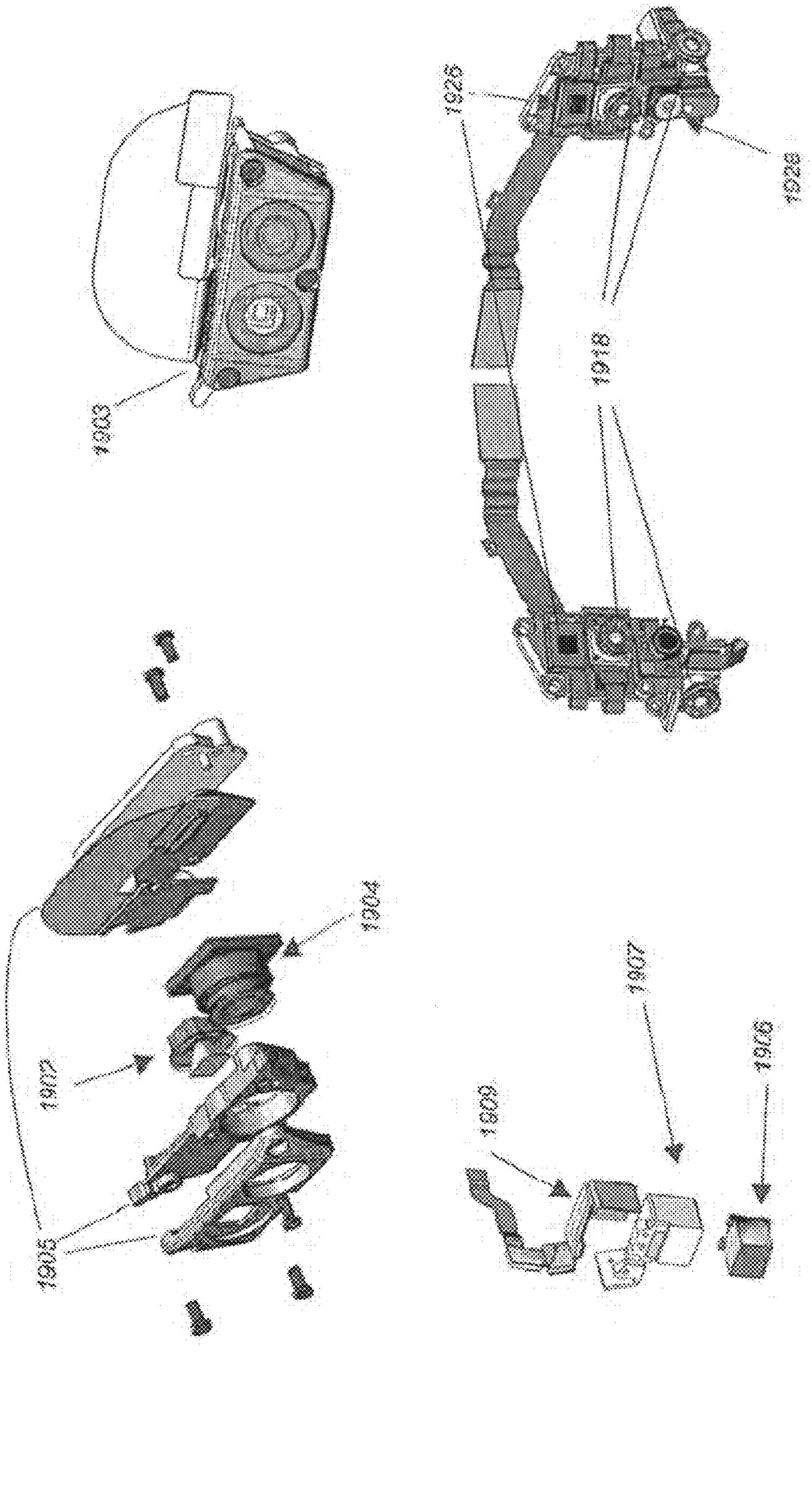
FIG. 19 illustrates a world camera assembly according to some embodiments.

FIG. 19 further depicts various sensors and components that may be attached to a viewing optics assembly or rigid frame of a head mounted display system in closer detail. Depth sensor 1903 is shown fully assembled as a depth sensor that may be attached to a viewing optics assembly or rigid frame. Depth sensor 1903 may further be comprised of depth sensor housing assembly 1905, vertical cavity surface emitting laser (VCSEL) 1902, and depth imager 1904.

Six degree of freedom (6DoF) sensor 1906 is housed within 6DoF housing 1907 and operatively coupled to viewing optics assembly (or primary control board 1716 as depicted in FIG. 17) through 6DoF flex 1909. 6DoF sensor 1906 may provide inertial measurement unit information to a head mounted display to provide information on location, pose, and motion of a user to a head mounted display. In some embodiments inertial measurements are provided by IMUs 1926 coupled to world camera assembly 1918. IMUs 1926 provide positional information through accelerometer and gyro measurements, and in some embodiments operatively couple to 6 DoF sensor 1909 to initiate a change to a sensor or component position within a viewing optics assembly. For example, a measurement of IMU 1926 indicating that a user is rotating the head pose to look down may prompt 6DoF sensor 1906 to redirect depth sensor 1902 to adjust depth measurements downward as well, in time with or even in front of the IMU 1926 measurements to avoid latency in measuring. In other words, if the IMU 1926 is detecting motion, 6DoF sensor 1906 is configured to manipulate any one or more of the sensors and components within a viewing optics assembly to continue rendering accurate content matching the detected motion with no latency in augmented reality content detectable by the user. Viewing optics display may host one or more 6DoF sensors 1906 or IMUs 1926.

FIG. 19 further depicts world camera assembly 1918. In some embodiments, world camera assembly 1918 comprises four world cameras, two disposed to look substantially outward relative to a user's field of view, and two disposed to look substantially obliquely to provide a greater-than-peripheral field of view information to the viewing optics assembly. Additional, or fewer, world cameras are of course possible. A picture camera 1928 may be coupled to world camera assembly 1918 to capture real time images or videos within a field of view of the user or picture camera 1928. World camera assembly 1918 may provide visual information to measured sensor information, or activate certain sensors. For example, a world camera may provide constraints on sensors to only detect and gather information within the field of view of the world cameras, or may communicate with a projector to only use processor power to render content within the field of view. For example, a graphics processor unit (GPU) within a local data processing module 70 as depicted in FIG. 15 may only be activated to render augmented reality content if world cameras bring certain objects into certain fields of view; whereas depth sensors and accelerometers and geolocators within a head mounted display or wearable display system may record input to an environment relative to rendering augmented reality content, a GPU may not be activated until the world cameras actually bring such input into a field of view of the user.

For example, the greater-than-peripheral field of view of the world camera assembly 1918 may begin to process imaging of augmented reality content in a GPU even though the content is not yet within a field of view of a user. In other embodiments, the greater-than-peripheral field of view may capture data and images from the real world and display a prompt to the user's field of view of the activity within the world camera assembly 1918 field of view but outside the user field of view.

Figure 20:
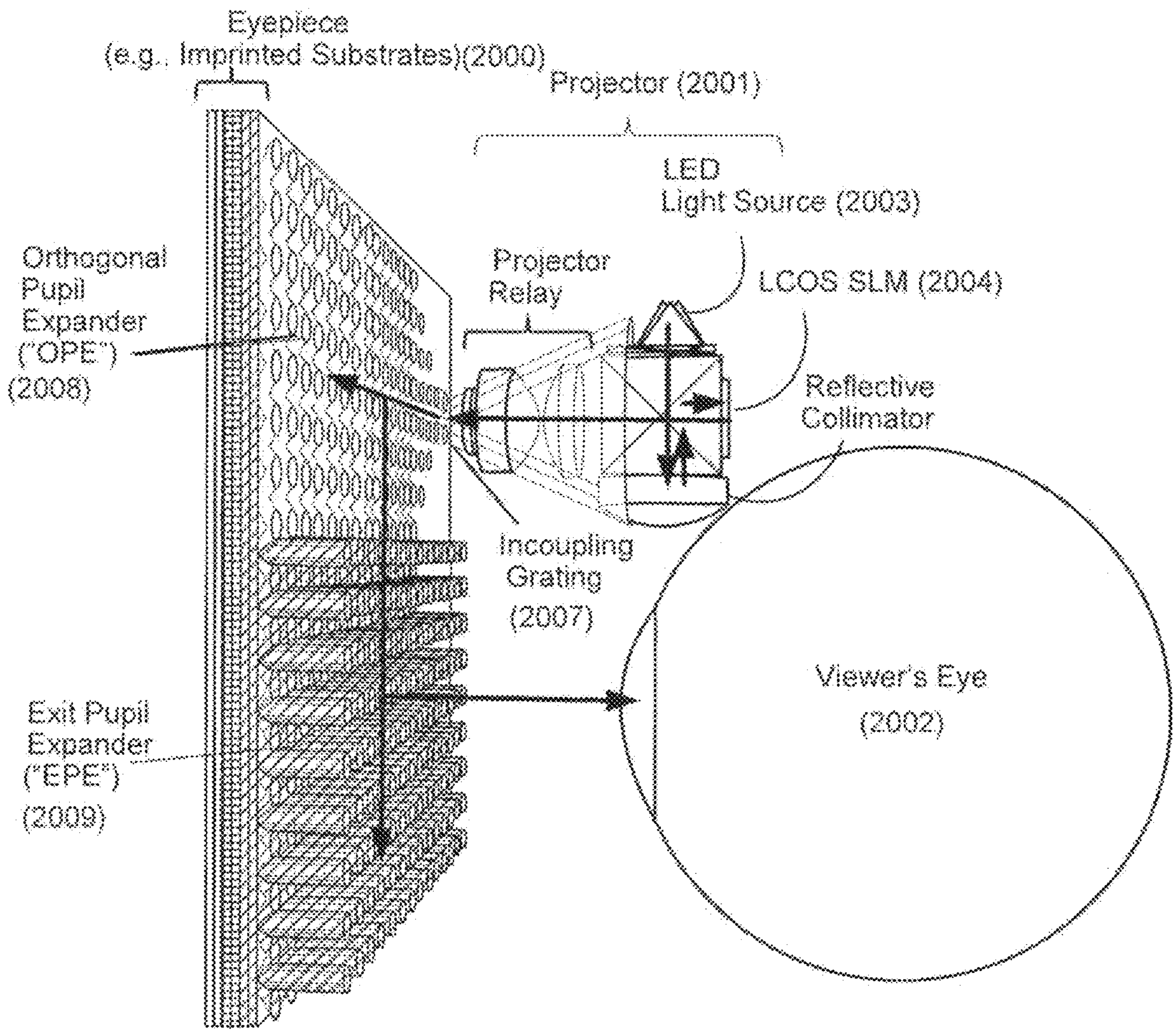
FIG. 20 illustrates schematically the light paths in a viewing optics assembly (VOA) that may be used to present a digital or virtual image to a viewer, according to an embodiment described herein.

FIG. 20 illustrates schematically the light paths in a viewing optics assembly (VOA) that may be used to present a digital or virtual image to a viewer, according to one embodiment. The VOA includes a projector 2001 and an eyepiece 2000 that may be worn by a viewer. In some embodiments, the projector 2001 may include a group of red LEDs, a group of green LEDs, and a group of blue LEDs. For example, the projector 2001 may include two red LEDs, two green LEDs, and two blue LEDs. The eyepiece 2000 may include one or more eyepiece layers. In one embodiment, the eyepiece 2000 includes three eyepiece layers, one eyepiece layer for each of the three primary colors, red, green, and blue. In another embodiment, the eyepiece 2000 may include six eyepiece layers, one set of eyepiece layers for each of the three primary colors configured for forming a virtual image at one depth plane, and another set of eyepiece layers for each of the three primary colors configured for forming a virtual image at another depth plane. In yet another embodiment, the eyepiece 2000 may include three or more eyepiece layers for each of the three primary colors for three or more different depth planes. Each eyepiece layer includes a planar waveguide and may include an incoupling grating (ICG) 2007, an orthogonal pupil expander (OPE) region 2008, and an exit pupil expander (EPE) region 2009.

The projector 2001 projects image light onto the ICG 2007 in an eyepiece layer 2000. The ICG 2007 couples the image light from the projector 2001 into the planar waveguide propagating in a direction toward the OPE region 2008. The waveguide propagates the image light in the horizontal direction by total internal reflection (TIR). The OPE region 2008 also includes a diffractive element that multiplies and redirects image light from the ICG 207 propagating in the waveguide toward the EPE region 2009. In other words, the OPE region 2009 multiplies beamlets in an orthogonal direction that are delivered to the different portions of the EPE. The EPE region 2009 includes an diffractive element that outcouples and directs a portion of the image light propagating in the waveguide in a direction approximately perpendicular to the plane of the eyepiece layer 2000 toward a viewer's eye 2002. In this fashion, an image projected by projector 2001 may be viewed by the viewer's eye 2002.

As described above, image light generated by the projector 2001 may include light in the three primary colors, namely blue (B), green (G), and red (R). Such image light can be separated into the constituent colors, so that image light in each constituent color may be coupled to a respective waveguide in the eyepiece. Embodiments of the present disclosure are not limited to the use of the illustrated projector and other types of projectors can be utilized in various embodiments of the present disclosure.

Although a projector 2001 including an LED light source 2003 and a liquid crystal on silicon (LCOS) spatial light modulator (SLM) 2004, embodiments of the present disclosure are not limited to this projector technology and can include other projector technologies, including fiber scanning projectors, deformable mirror devices, micro-mechanical scanners, use of lasers light sources rather than LEDs, other arrangements of optics, waveguides, and beamsplitters including front lit designs, and the like.

Figure 21:
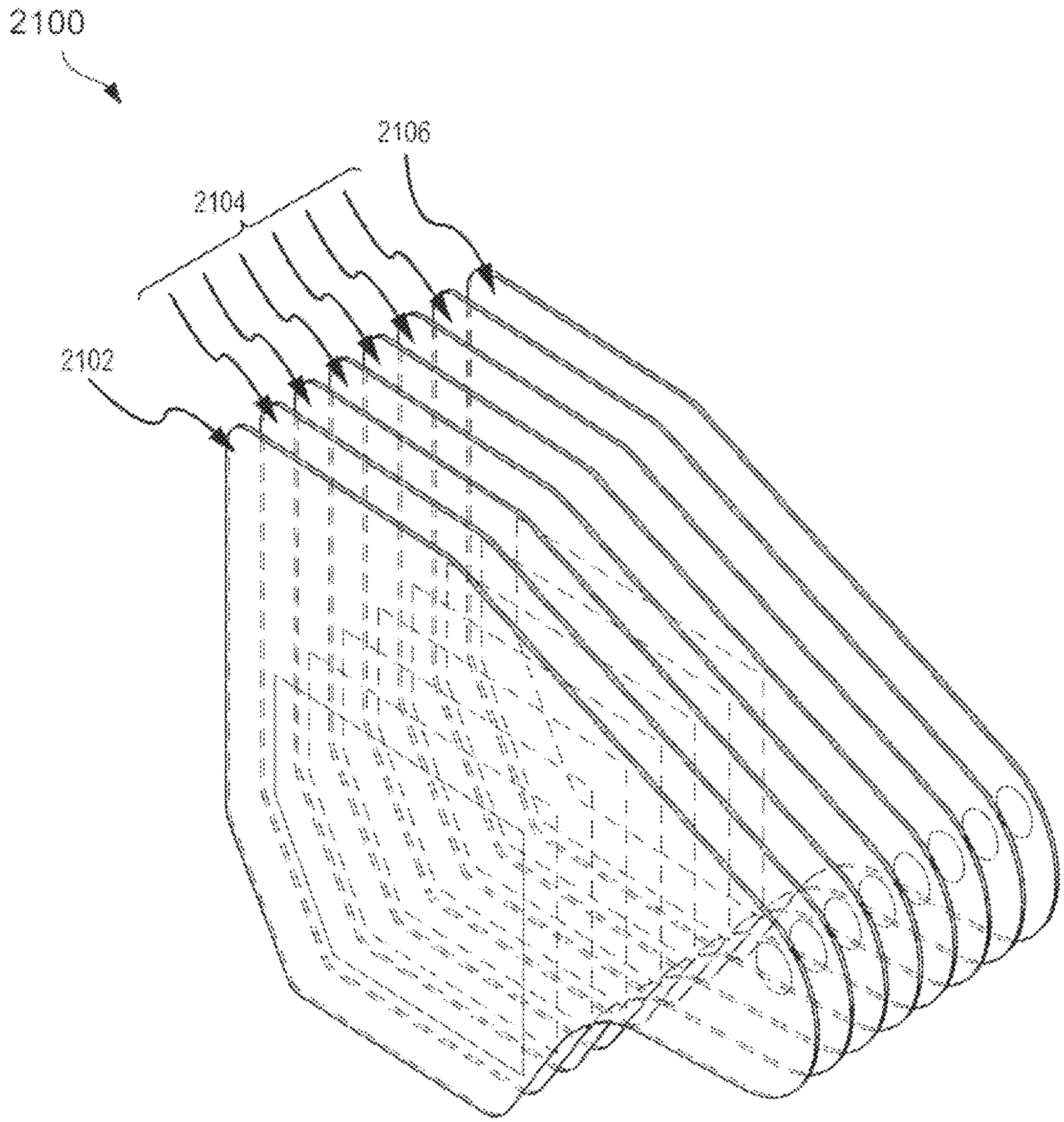
FIG. 21 illustrates an example of an eyepiece according to an embodiment of the present invention.

FIG. 21 illustrates an example of an eyepiece 2100 according to an embodiment of the present invention. The eyepiece 2100 may include a world side cover window 2102 and an eye side cover window 2106 to protect one or more waveguides 2104 positioned between the world side cover window 2102 and the eye side cover window 2106. In some embodiments, the eyepiece 2100 does not include one or both of the world side cover window 2102 and the eye side cover window 2106. The one or more waveguides 2104 may be coupled together in a layered arrangement such that each individual waveguide is coupled to one or both of its neighboring waveguides. In some embodiments, the one or more waveguides 2104 are coupled together via an edge seal (such as edge seal 2208 shown in FIG. 22) such that the one or more waveguides 2104 are not in direct contact with each other.

Figure 22:
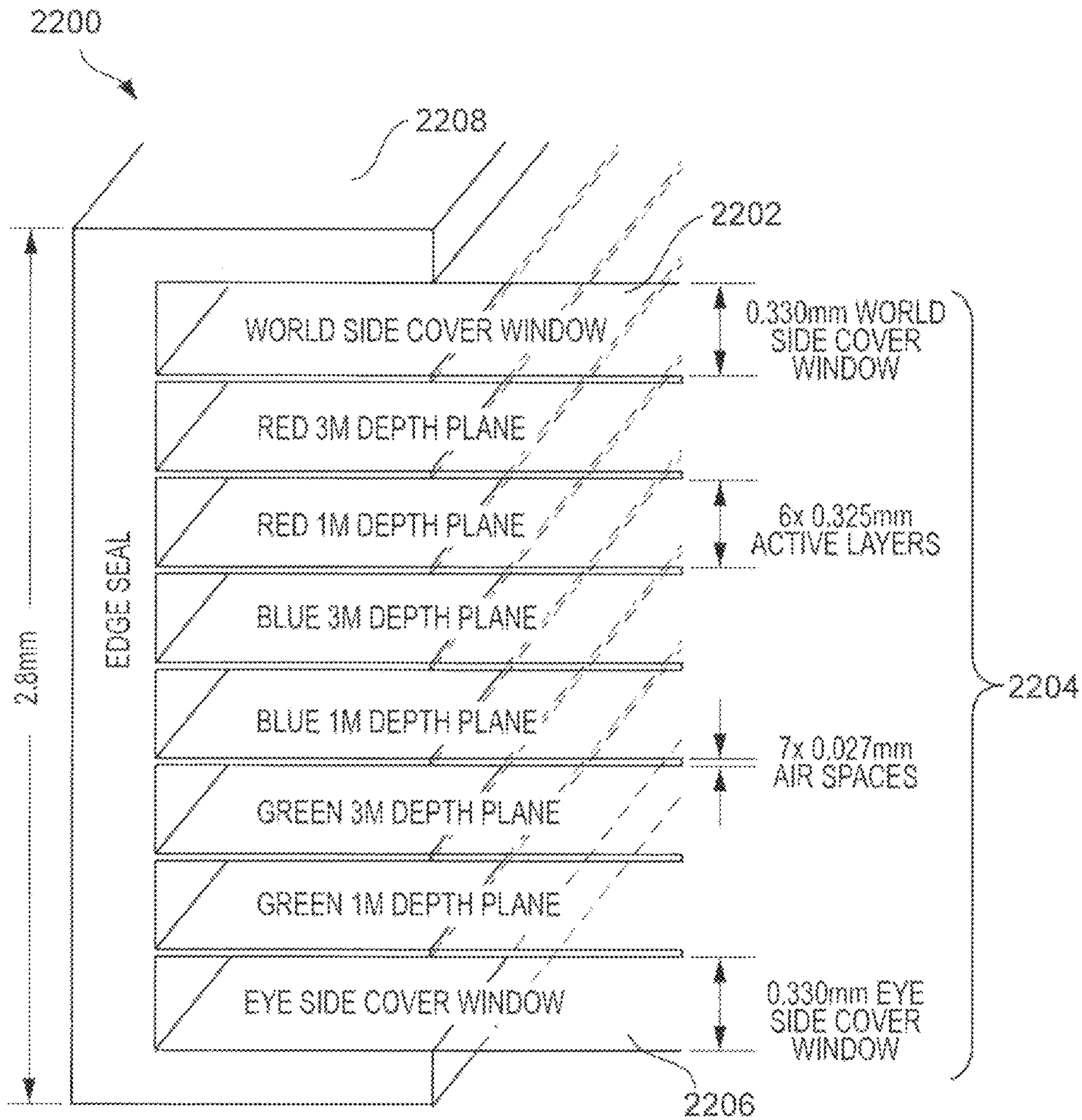
FIG. 22 illustrates an example of layers of waveguides for an eyepiece according to an embodiment of the present invention.

FIG. 22 illustrates an example of layers of waveguides 2204 for an eyepiece 2200 according to an embodiment of the present invention. As can be seen, each waveguide 2204 can be aligned on top of one another with air space or another material disposed between. In one illustrative example, the world side cover window 2202 and the eye side cover window 2206 can be 0.330 mm thick. In such an example, each waveguide 2204 can be 0.325 mm thick. In addition, between each layer can be an air space that is 0.027 mm thick. A person of ordinary skill will recognize that the dimensions can be different. FIG. 22 also illustrates that each waveguide 2204 can be associated with a color and a depth plane. For example, the eyepiece 2200 can include red waveguides for 3 m and 1 m depths planes. The red waveguides can relay red light and outcouple red light to an eye of a user at the designated depths. The eyepiece can further include blue waveguides for 3 m and 1 m depth planes. The blue waveguides can relay blue light and outcouple blue light to the eye of the user at the designated depths. The eyepiece can further include green waveguides for 3 m and 1 m depth planes. The green waveguides can relay green light and outcouple green light to the eye of the user at the designated depths. A person of ordinary skill will recognize that the waveguides can be in a different order than illustrated in FIG. 22. A depth plane relates to the optical power of the respective waveguide, such that light outcoupled from the EPE of that waveguide will diverge and be perceived by a user to originate at a certain distance from the user: one of skill in the art will appreciate that alternative designated depths may be used and that the 3 m and 1 m depth planes used herein and in FIG. 22 are merely for illustrative purposes.

Figure 23:
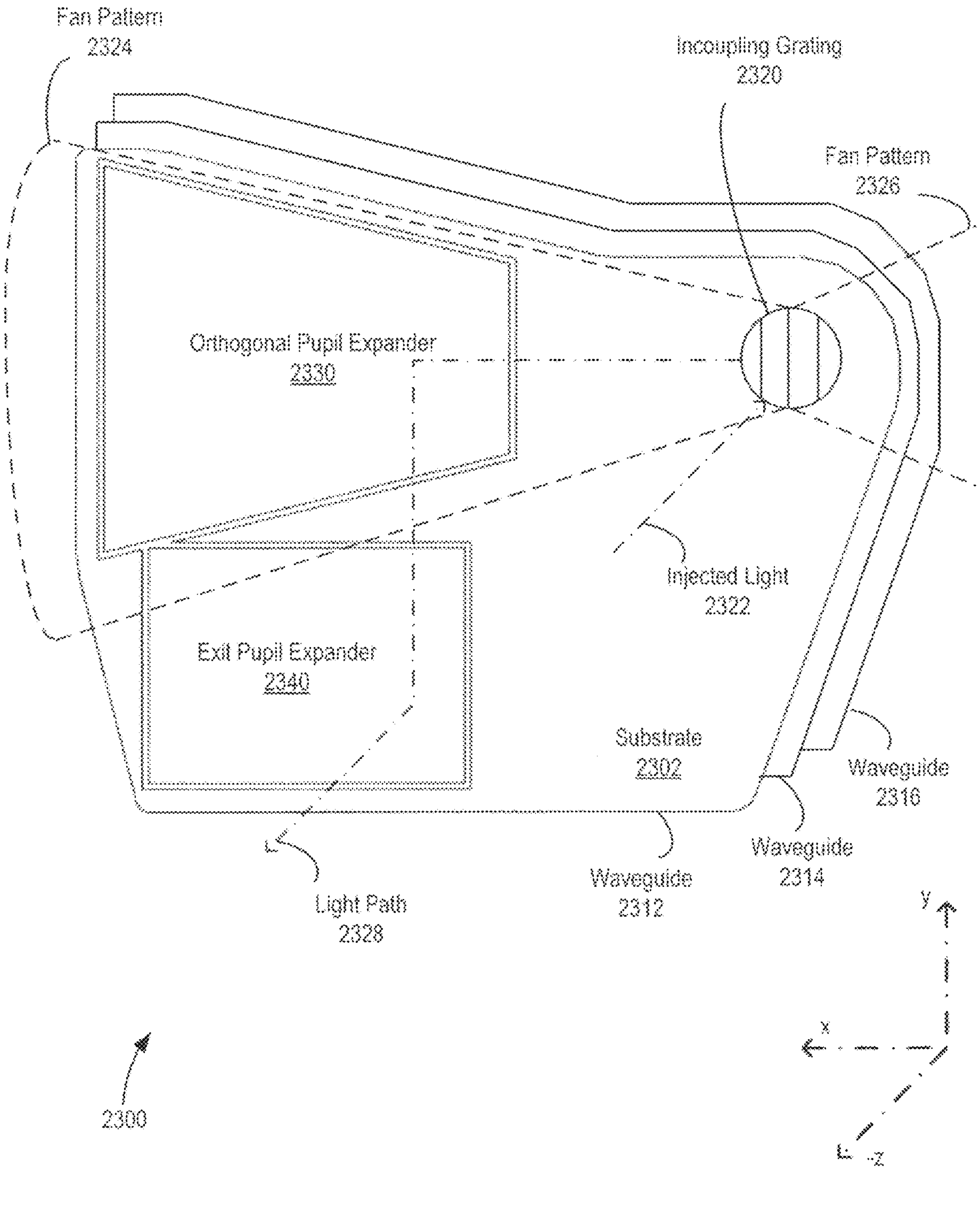
FIG. 23 illustrates an example of a path of a single beamlet of light incoupled into a waveguide of an eyepiece according to an embodiment of the present invention.

FIG. 23 illustrates an example of a path of a single beamlet of light incoupled into a waveguide 2312 of an eyepiece 2300 according to an embodiment of the present invention. The waveguide 2312 can include an ICG 2320, an OPE 2330, and an EPE 2340, each disposed on or within a substrate 2302 comprised of a material capable of guiding optical waves by total internal reflection (typically a dielectric material having a high permittivity). In some embodiments, the eyepiece 2300 can include three waveguides 2312, 2314, and 2316, each waveguide corresponding to a particular wavelength of light. Additional or fewer waveguides are possible. Each of waveguides 2314 and 2316 can include an ICG, an OPE, and an EPE, similar to the waveguide 2312. In some embodiments, injected light 2322 can enter the eyepiece 2300 at the ICG 2320 in a z-direction orthogonal to the depiction of FIG. 23. The injected light 2322 can enter the ICG 2320 where the grating within the ICG 2320 may diffract certain wavelengths of light within the incoupled light 2322, and other wavelengths of the incoupled light 2322 continue through to subsequent waveguide layers of the eyepiece 2310. In some embodiments, the ICG 2320 is a plurality of separate gratings specific to a particular wavelength.

The incoupled light 2322 can be diffracted by the ICG 2320 in certain directions within the waveguide, spanning a range such as depicted by fan pattern 2324 toward the OPE 2330 in a generally +x-direction, but also in a range spanning a fan pattern 2326 away from the OPE 2330 in a generally −x-direction. Other light paths spanning other fan patterns are of course possible and depend on the projection optics, and the particular grating and diffraction pattern configured by the ICG 2320. That is, light does not diffract into the waveguide as a diverging beam, but in some embodiments the progressive distributed sampling of portions of image light may create a progressively expanding distribution pattern of beamlets across an eyepiece. The incoupled light 2322 that is diffracted within the depicted fan pattern 2324 can generally follow a light path 2328 to enter the OPE 2330 and traverse in an +x-direction, with attendant distributed sampling through the OPE 2330 as it strikes the diffractive gratings making up the OPE 2330, with portions periodically directed down to the EPE 2340 and traversing in a −y-direction before outcoupling in a −z-direction towards the eye of a user.

As FIG. 23 depicts, much light in the wavelength corresponding to the waveguide 2312 may be lost either due to directional loss such as light diffracted to the fan pattern 2326 or due to capture loss due to an inadequately positioned or sized OPE 2330 to capture all light within the fan pattern 2324.

Figure 24:
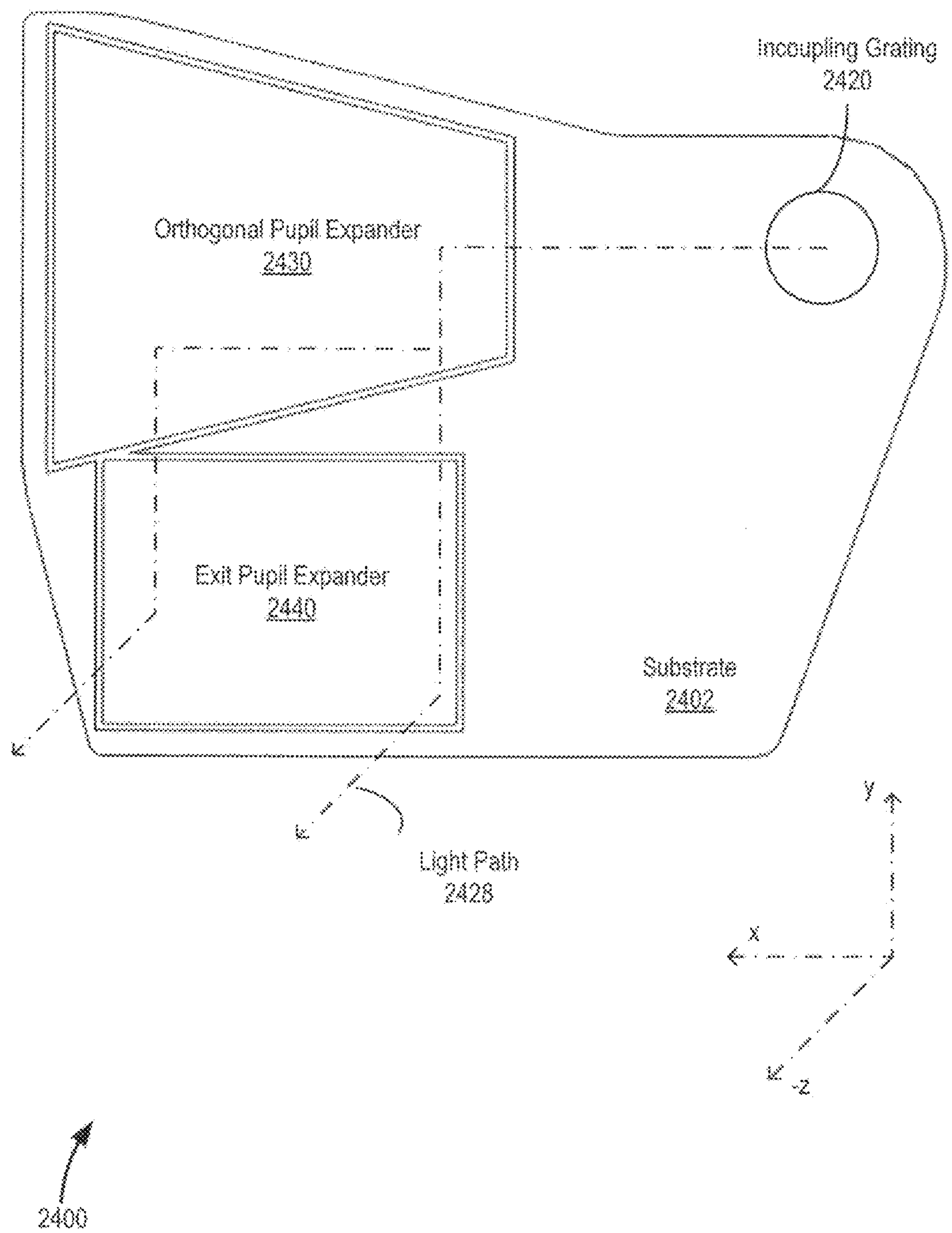
FIG. 24 illustrates an example of an over/under topology for a waveguide according to an embodiment of the present invention.

FIG. 24 illustrates an example of an over/under topology for a waveguide 2400 according to an embodiment of the present invention. In some embodiments, the light can be associated with, or from, a projected image. In some embodiments, an eyepiece, and a waveguide (e.g., the waveguide 2400), can be at least partially transparent such that a user can see through the eyepiece. In some embodiments, the waveguide 2400 can include one or more areas, each area with a particular grating. For example, the waveguide 2400 can include an input area with an incoupling DOE (e.g., ICG 2420). The incoupling DOE can receive light from a projector relay, as described throughout this description. The light can be incoming to the input area orthogonal to the waveguide 2400. The ICG 2420 can incouple the light into the waveguide 2400 (i.e., into the substrate 2402).

In some embodiments, the waveguide 2400 can further include a first area, also referred to as a portion of the waveguide (e.g., an orthogonal pupil expander 2430) having a first grating. The first grating can be disposed within or on a planar surface of the waveguide 2400 to manipulate the light propagating in the waveguide 2400 by total internal reflection after diffraction or incoupling into the planar waveguide by the ICG 2420. In some embodiments, the periodic structures of the first grating redirect image light throughout the first area. Such redirection occurs through diffractive sampling of an incoupled light beam as the incoupled light beam passes a periodic structure of the first grating. Accordingly, gratings described herein may multiply (or clone) the viewing pupil of a projected image by diffracting the beams comprising a projector pupil many times over to create a plurality of beamlets propagating through the waveguide. In many instances, each beamlet carries the image data, and when the plurality of beamlets eventually outcouple from the waveguide 2400 as described below, the user eye perceives the emerging plurality of beamlets as an enlarged sampled pupil conveying the image information. In some embodiments, the first grating can direct at least a portion of the light (e.g., a cloned or sampled beamlet) to a second area (e.g., an EPE 2440). The second area or portion can have a second grating comprising periodic structures. In such embodiments, an orientation of a periodic structure of the first grating can be such that a sampled beamlet is diffracted at a nominally right angle when the beamlet interacts with a portion of the, simultaneously diffracting a beamlet towards the EPE and directing a sample further across the OPE to continue diffracting and sampling, and thus replicating image light within the OPE and diffracting additional beamlets towards the EPE 2440. Although gratings are discussed as exemplary diffractive optical structures in some embodiments, it will be appreciated that the present invention is not limited to diffraction gratings and other diffractive structures (e.g., plurality of islands laid out in a hexagonal grid) can be included within the scope of the present invention.

It will thus be appreciated that according to some embodiments, any one portion of light can be diffracted a multitude of times by the first grating across the first area (e.g. the OPE 2430), For example, and as explained below in relation to FIG. 30C in greater detail, a periodic structure within the first grating can diffract a portion of the image light in a given direction (such as towards the EPE 2440), while transmitting a remaining portion in a second direction. By progressively diffracting the light, the light can be thought of as "stair stepping" cloned beamlets (i.e., multiply or sample a portion of image light by diffraction) across the OPE 2430. For example, each time a ray is diffracted while traveling in the substantially x-direction, some portion of the light can diffract toward the EPE 2440. A portion of the diffracted light continues in the substantially x-direction through the OPE 2430 until it again diffracts a portion toward the EPE 2440 in the substantially y-direction, and a remaining portion continues in the substantially x-direction. In some embodiments, a central ray of the light can be incoupled into the waveguide by the ICG 2420 and be directed toward the OPE 2430. While traveling in the OPE 2430, the central ray may be diffracted at a right angle by the OPE 2430 and be directed toward the EPE 2440 (or, in other embodiments, be diffracted at an acute angle).

In some embodiments, the EPE 2440 can receive light from the OPE 2430. In some embodiments, the second grating of the EPE 2440 can outcouple the light from the waveguide 2400 after such light has traveled in a substantially y-direction in relation to the OPE 2430. In such embodiments, the light can be directed to an eye of a user such that the original projected image incoupled to the eyepiece appears as an enlarged pupil of the projector in a field of view of the user through an eyebox. In some embodiments, the first area and the second area can occupy separate areas of the waveguide 2400.

Figure 25:
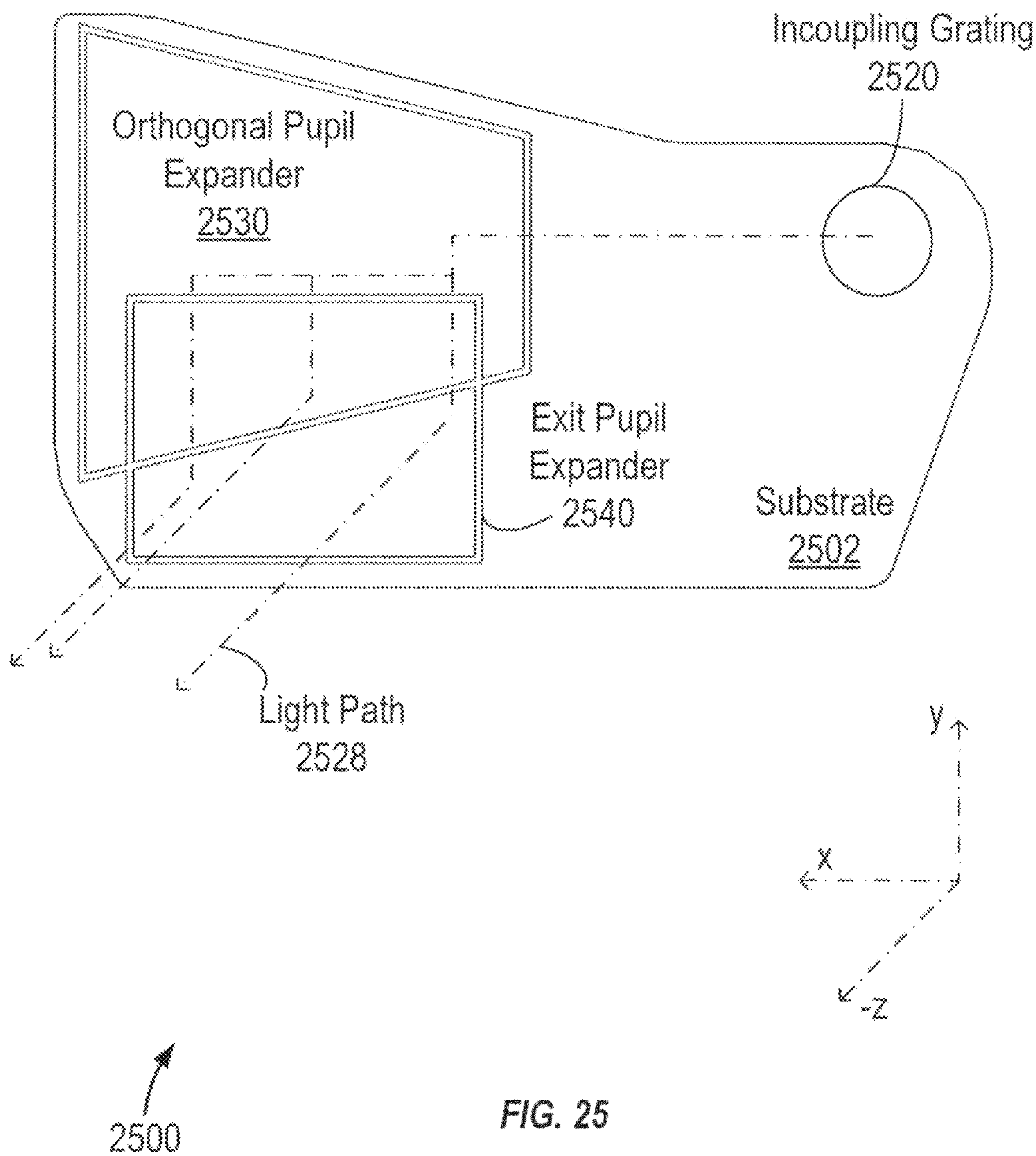
FIG. 25 illustrates an example of an overlap topology for a waveguide according to an embodiment of the present invention.

FIG. 25 illustrates an example of an overlap topology for a waveguide 2500 according to an embodiment of the present invention. An overlapping arrangement, such as illustrated in FIG. 25 when EPE 2540 and OPE 2530 may share a similar region relative to an orthogonal view, permits smaller eyepieces, and fewer sampling instances to direct light to the user's eyebox in a distributed fashion (which may reduce light interference). One of skill in the art will appreciate other advantages. The waveguide 2500 can perform similar to the waveguide 2400.

For example, in some embodiments, the waveguide 2500 can include an ICG 2520, an OPE 2530, and an EPE 2540, each coupled to a substrate 2502. In some embodiments, a first region of the OPE 2530 can occupy a separate region of the waveguide 2500 than a first region of the EPE 2540. In addition, a second region of the OPE 2530 can occupy an overlapped region of the waveguide 2500 that a second region of the EPE 2540 also occupies. In other words, a region of the OPE 2530 can share a region of the waveguide 2500 where the EPE 2540 is. In some embodiments, the region that the OPE 2530 and the EPE 2540 both occupy can be on different planes (e.g., different sides of the substrate 2502). In some embodiments, the OPE 2530 can be on a first plane and the EPE 2540 can be on a second plane. In such embodiments, portions of the light can propagate through the OPE 2530 in the overlapped region while other portions of the light are transmitted out of the waveguide 2500 by the EPE 2540 in the same overlapped region.

In some embodiments, the light outcoupled from the waveguide 2500 can propagate along a transmission direction. The OPE 2530 can be disposed at a first position measured along the transmission direction. In addition, the EPE 2540 can be disposed at a second position measured along the transmission direction. In such embodiments, the second position measured along the transmission direction can be closer to an eye of a user than the first position measured along the transmission direction. In some embodiments, the first position of the OPE 2530 can be on a back side of the waveguide 2500, that is, closer to the world side of the waveguide 2500, and the second position of the EPE 2540 can be on a front side of the waveguide 2500, the side closer to the eye of the user.

In some embodiments, the OPE 2530 can be on a front side of the waveguide 2500 and the EPE 2540 can be on a back side of the waveguide 2500. For example, the light outcoupled from the waveguide 2500 can propagate along a transmission direction. The OPE 2530 can be disposed at a first position measured along the transmission direction. In addition, the EPE 2540 can be disposed at a second position measured along the transmission direction. In such embodiments, the first position measured along the transmission direction can be closer to an eye of a user than the second position measured along the transmission direction.

In some embodiments, a planar waveguide layer can include a first pupil expander (e.g., an OPE) and a second pupil expander (e.g., an EPE). In such embodiments, a first plane of the first pupil expander can be parallel in a z-direction to a second plane of the second pupil expander. In such embodiments, a first region of the first plane can have a first grating disposed on the first region; and a second region of the second plane can have a second grating disposed on the second region. In such embodiments, the first region is configured to diffract light in an x-direction and/or y-direction using the first grating; and the second region is configured to outcouple light to an eye of a user using the second grating. In such embodiments, the first region can spatially overlap with the second region.

In the embodiments described in the preceding paragraph, the light outcoupled to the eye of the user can propagate along a transmission direction. In such an example, the first area of the planar waveguide layer can be disposed at a first position measured along the transmission direction. In addition, the second area of the planar waveguide layer can be disposed at a second position measured along the transmission direction. In such embodiments, the second position measured along the transmission direction can be closer to the eye of the user than the first position measured along the transmission direction as illustrated in FIG. 25. In other embodiments, the first position measured along the transmission direction can be closer to the eye of the user than the second position measured along the transmission direction.

In the embodiments described above, the ICG 2520, the OPE 2530, and the EPE 2540 were not in line. For example, the OPE 2530 was displaced from the ICG 2520 in a first direction (e.g., substantially x-direction) while the EPE 2540 was displaced from the ICG 2520 in a second direction (e.g., a substantially y-direction) that is different from the first direction.

Figure 26:
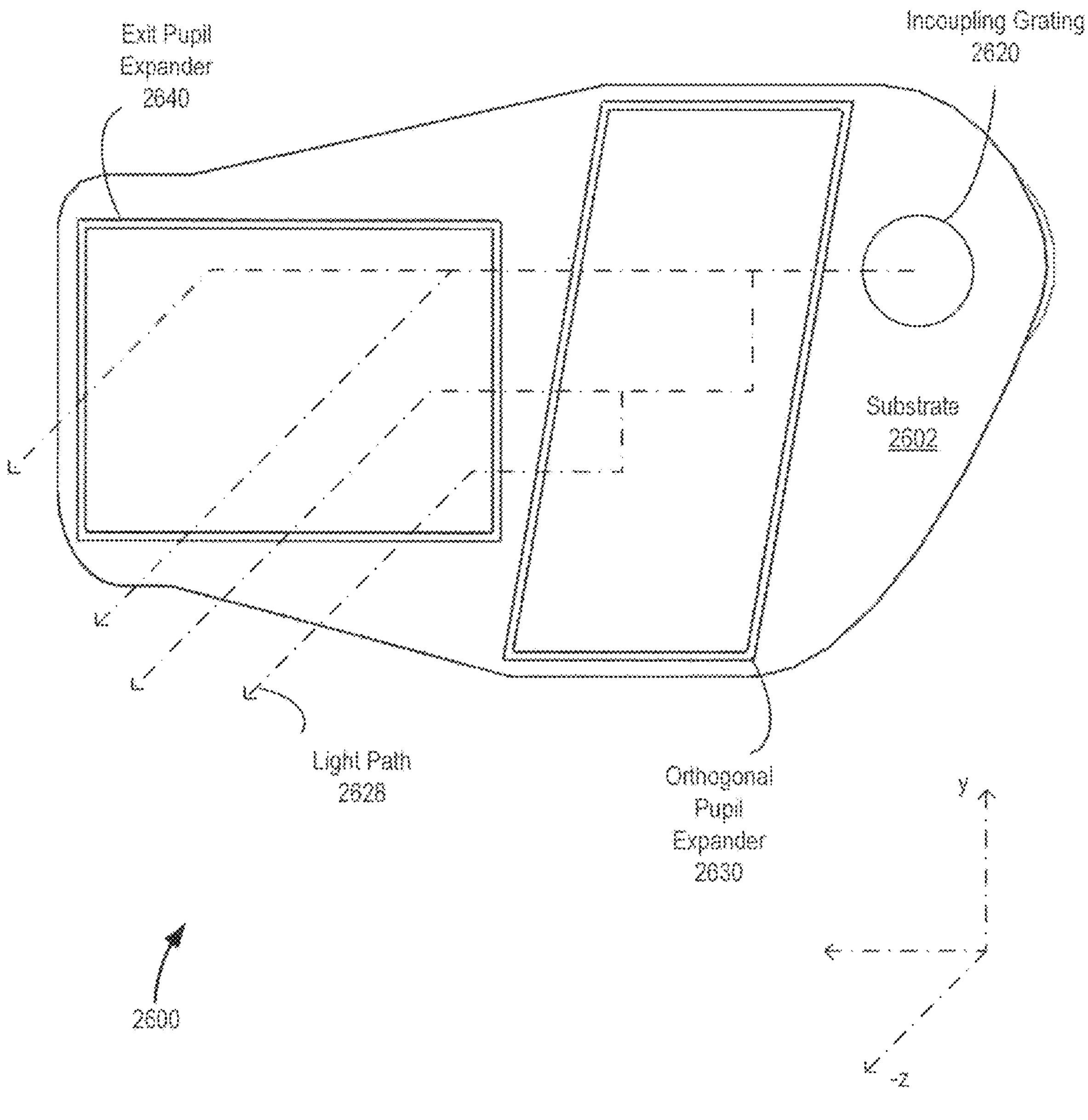
FIG. 26 illustrates an example of an in-line topology for a waveguide according to an embodiment of the present invention.

FIG. 26 illustrates an example of an in-line topology for a waveguide 2600 according to an embodiment of the present invention. In the in-line topology, the OPE 2630 and the EPE 2640 can both be displaced from the ICG 2620 in a first direction. In other words, rather than light ultimately flowing in a first direction on the OPE and a second direction on the EPE, the eyepiece can be structured such that the OPE feeds the EPE in the same direction as the light was originally diffracted into the planar waveguide (i.e., the substrate 2602) by the ICG. In some embodiments, the light can still stair step through the OPE 2630, as described above. In such embodiments, the EPE 2640 can receive light from the same direction as the light was originally going rather than at a right angle relative to how light entered an OPE.

In some embodiments, a planar waveguide layer can include an incoupling DOE (e.g., an ICG) configured to receive incoupled light. The planar waveguide layer can further include a first pupil expander and a second pupil expander. The first pupil expander can be configured to receive light from the incoupling DOE and to diffract light toward the second pupil expander. The second pupil expander can be configured to receive light from the first pupil expander and to outcouple light towards an eye of a user. In some embodiments, the planar waveguide layer can be configured for light to flow from the incoupling DOE to the first pupil expander in a first direction. In such embodiments, the planar waveguide layer can further be configured for light to flow from the first pupil expander to the second pupil expander in the first direction.

In some embodiments, a diffraction efficiency of the OPE 2630 can be configured such that light cannot just penetrate right through the OPE 2630 without any diffractive sampling (stair stepping effect), and configured to create a more uniform distribution of light in the x-direction that diffracts in a y-direction toward the EPE. In some embodiments, the OPE 2630 can have a variable diffraction efficiency based on a location of the grating relative to the proximity of the ICG 2620 to the OPE 2630. For example, a low diffraction efficiency of portions of the OPE 2630 can be used closer to the ICG 2620 to direct portions of light towards the EPE 2640 but permit a substantial portion to traverse the OPE 2630 in a substantially x-direction before higher efficiency diffraction gratings further away from the ICG 2620 direct the light to the EPE 2640. In such an example, the diffraction efficiency can then be varied across the OPE 2630 to ensure a balance and not all light diffracted into the planar waveguide by the ICG 2620 is immediately directed to the EPE 2640, or that by the time light has reached the far end of the OPE 2630 by total internal reflection there is roughly the same amount of light as diffracted to the EPE 2640 by the OPE 2630 across the OPE 2630.

Figure 27:
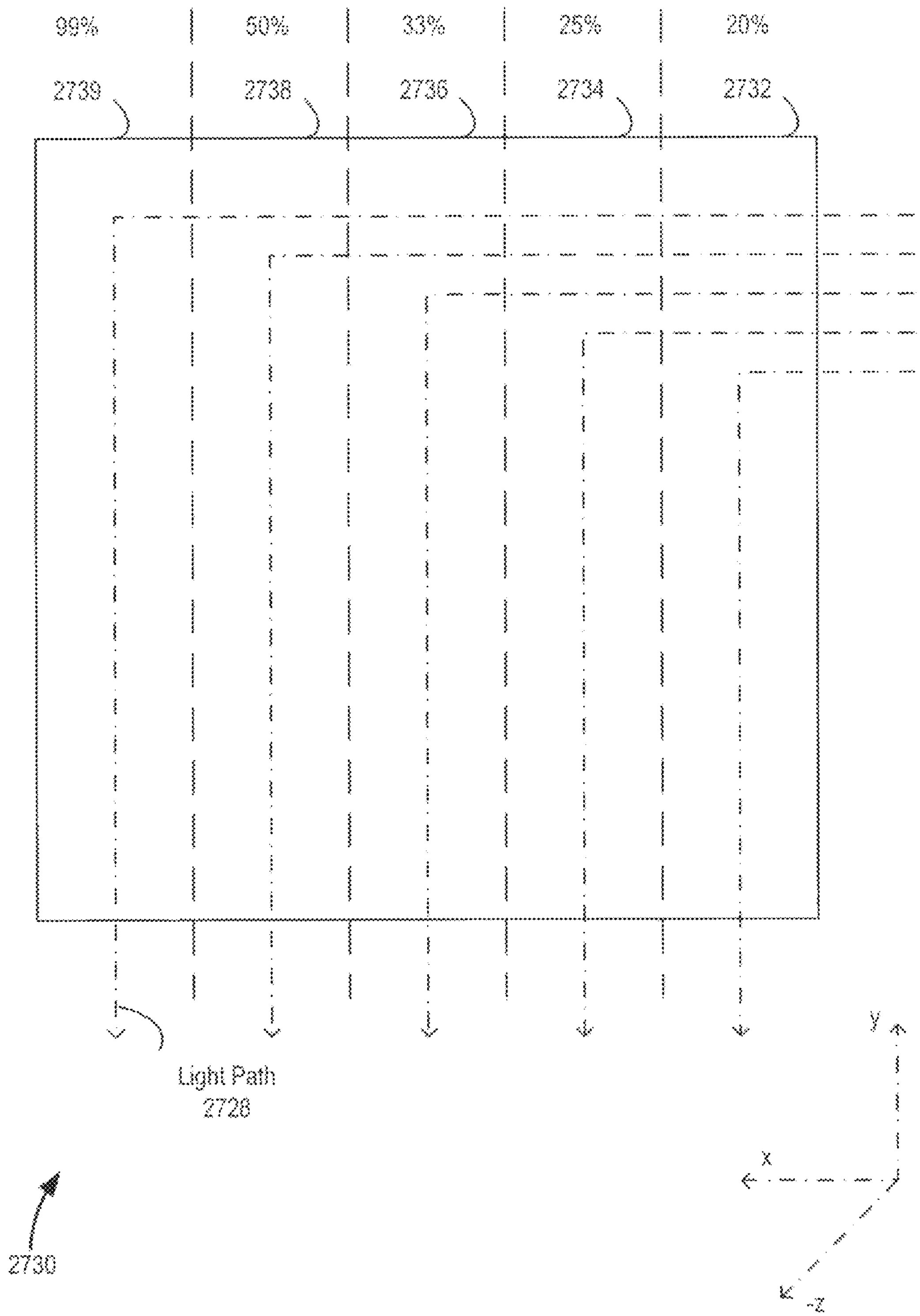
FIG. 27 illustrates an example of an OPE with zones of varying diffraction efficiency according to an embodiment of the present invention.

FIG. 27 illustrates an example of an OPE 2730 with zones of varying diffraction efficiency according to an embodiment of the present invention. A first zone 2732 can have a diffraction efficiency of twenty percent. A second zone 2734 can have a diffraction efficiency of twenty-five percent. A third zone 2736 can have a diffraction efficiency of thirty-three percent. A fourth zone 2738 can have a diffraction efficiency of fifty percent. A fifth zone 2739 can have a diffraction efficiency of ninety-nine percent. As light propagates throughout the OPE 2730 and enters each zone, the diffraction efficiency will diffract a roughly equal amount of light towards the EPE 2740 in each zone, creating a balance across the OPE 2730. If the diffraction efficiency were too high, for example if the first zone 2732 and the second zone 2734 had diffraction efficiencies of 80% each, then very little light would propagate in a substantially x-direction, and a resultant eyebox for a user to view content in would be very narrow as compared to an OPE with lower diffraction efficiencies across its breadth to permit more light to propagate before diffraction to an EPE for outcoupling. One of skill in the art will appreciate that similar varying diffraction efficiencies of an EPE will produce similar desirable effects for outcoupling light from the planar waveguide. One of skill in the art will further appreciate that the percentages listed are illustrative only, and diffraction efficiencies towards the OPE end closer to the ICG may need to be higher as the stair step effect will continue to diffract light away from the ICG, perhaps before reaching the EPE.

Figure 28:
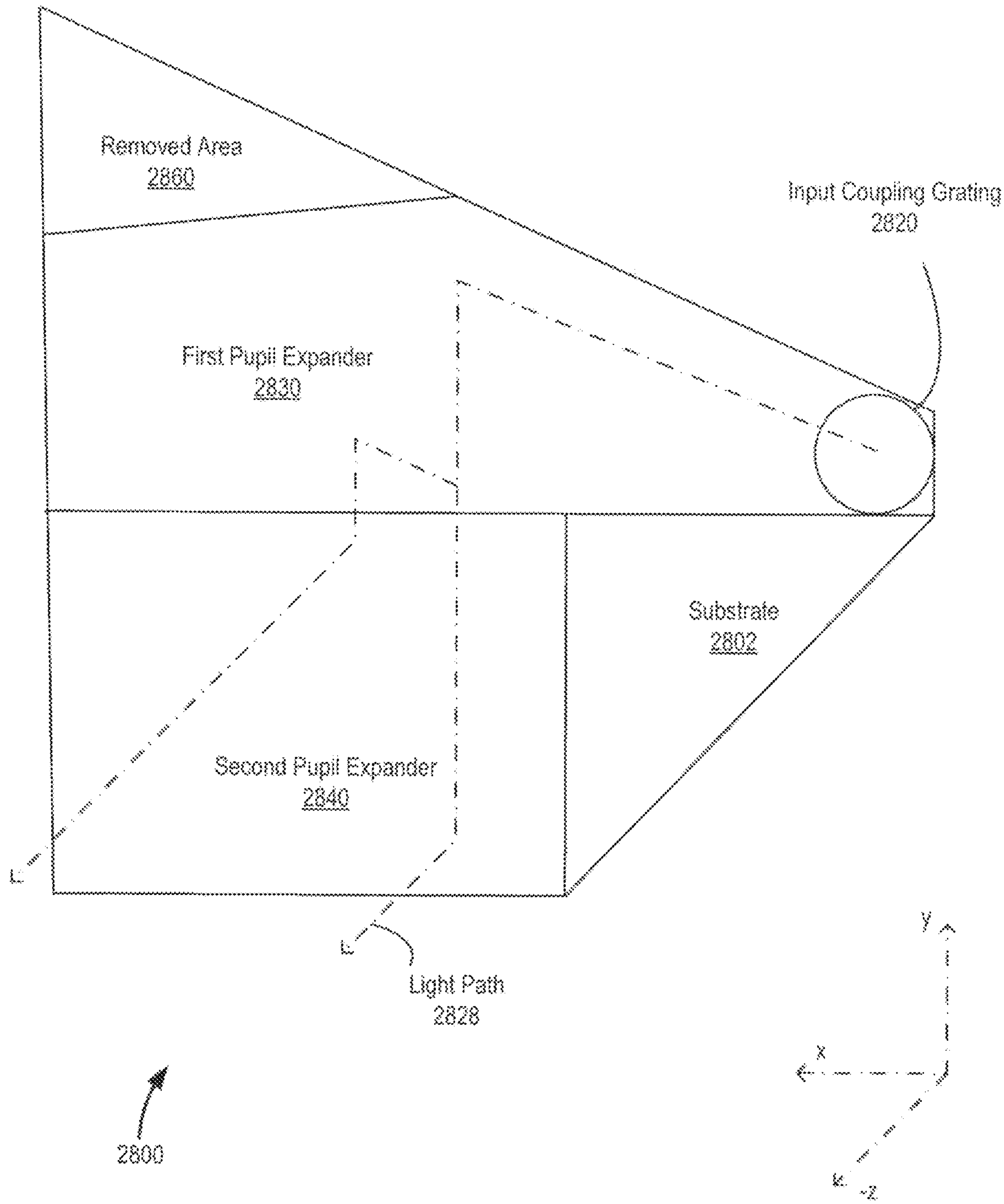
FIG. 28 illustrates an example of a tip and clip topology for a waveguide according to an embodiment of the present invention.

FIG. 28 illustrates an example of a tip and clip topology for a waveguide 2800 according to an embodiment of the present invention. While the waveguide 2800 can include similar components to waveguides described herein, a topology of the waveguide 2800 can be different. For example, one or more components of the waveguide 2800 can be tipped to follow an angle of the fanning of the light into the planar waveguide (i.e., the substrate 2802), such that an edge of the fanning of light from incoupling grating 2820 aligns with a common interface of first pupil expander 2830 and second pupil expander 2840. For comparison, see FIG. 23 which depicts incoupling grating 2320 and resultant fan pattern 2324, orthogonal pupil expander 2330 substantially follows the edges of the fan pattern in its own shape, but leaves a gap between orthogonal pupil expander 2330 and exit pupil expander 2340. In the tip and clip topology of FIG. 28, the gap of FIG. 23 is removed, and the respective pupil expanders may occupy less space, resulting in a smaller form factor. In some embodiments, the fanning (caused by a grating of an ICG 2820) of the waveguide 2800 can be plus or minus 20 degrees in relation to the OPE 2830. The fanning of the waveguide 2800 can be changed such that the fanning can be plus 30 degrees and minus zero degrees in relation to a first pupil expander 2830 (which may correspond to the OPE 2430 of FIG. 24).

The first pupil expander 2830 can perform similarly to the OPE 2430 of FIG. 24. In some embodiments, a first grating disposed within or on a planar surface of a planar waveguide associated with the first pupil expander 2830 can cause a light incoupled into the planar waveguide to be diffracted at an acute angle (in the x-y plane) so as to re-direct in a substantially y-direction towards second pupil expander 2840. A person of ordinary skill in art will recognize that the topology of the waveguide 2800 can cause a plurality of rays multiplied from such central ray by the pupil expander to follow substantially similar paths as the rays of light depicted in FIG. 28. A light path 2828 is illustrated in FIG. 28 to show a direction of a light beam that is incoupled into the waveguide 2800 by the ICG 2820, an subsequently multiplied by the first pupil expander 2830 and then diffracted towards second pupil expander 2840.

By changing the topology of the components of a waveguide, the waveguide 2800 can eliminate space included in the waveguide 2400 between the OPE 2430 and the EPE 2440, as illustrated in FIG. 24. In addition, a portion (i.e., removed area 2860) of the first pupil expander 2830 can be removed (as compared to the OPE 2430 of FIG. 24) to maximize weight and size of the eyepiece relative to marginal amount of light from removed area 2860 that would otherwise be diffracted to the second pupil expander 2840.

In some embodiments, the second pupil expander 2840 can also be tilted to some degree. The second pupil expander 2840 can be tilted an amount independent of the amount the ICG 2820 and/or the first pupil expander 2830 are tilted. In some embodiments, the second pupil expander 2840 can include a portion identified as an eyebox. The eyebox can be where a user's field of view with respect to a particular eye of a user should be located relative to the waveguide. As described previously in this description, the x-axis of the eyebox's dimension in the x-direction is largely a function of the OPE and the amount of light that propagates the planar waveguide in a substantially x-direction, and the eyebox's dimension in the y-direction is largely a function of the EPE and the amount of light that propagates the planar waveguide in a substantially y-direction. One of skill in the art will appreciate the relevance and geometries of the eyebox as and if applied in any of the described waveguides throughout this description.

Figure 29:
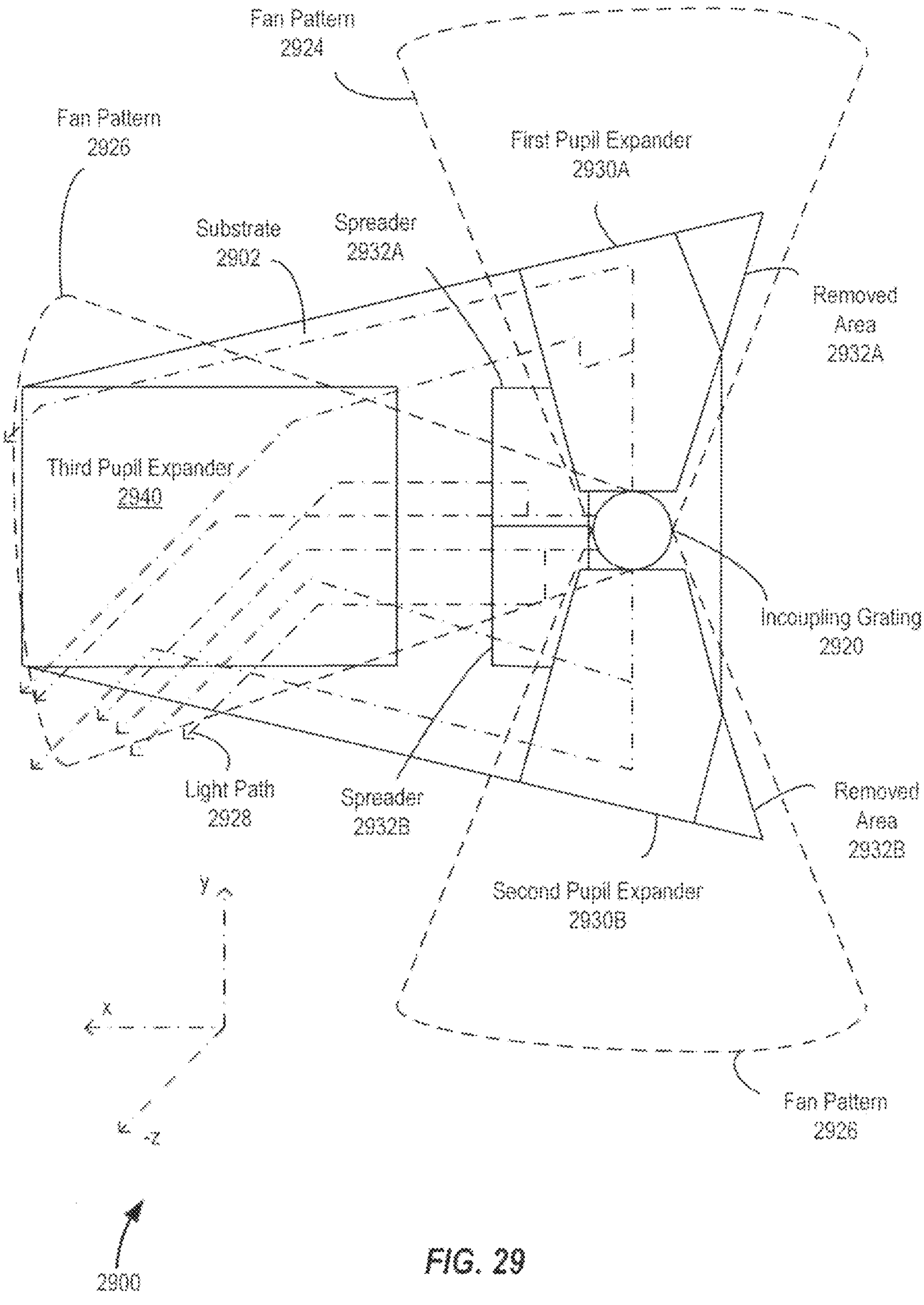
FIG. 29 illustrates an example of a bowtie topology for a waveguide according to an embodiment of the present invention.

FIG. 29 illustrates an example of a bowtie topology for a waveguide 2900 according to an embodiment of the present invention. The waveguide 2900 may mitigate loss present in other waveguide designs by utilizing light that would typically be diffracted away from the pupil expanders. By orienting the ICG 2920 such that the resultant fan patterns are aligned with the y-axis and the x-axis (as shown in FIG. 29), the waveguide 2900 can include a first pupil expander 2930A and a second pupil expander 2930B that capture much more diffracted incoupled light. In some embodiments, the first pupil expander 2930A and the second pupil expander 2930B can be OPEs. In some embodiments, the waveguide 2900 can further include a third pupil expander 2940, such as an EPE.

The waveguide 2900 can reduce the size of a single OPE (such as those described above) because the waveguide 2900 can include two smaller pupil expanders (e.g., the first pupil expander 2930A and the second pupil expander 2930B). In some embodiments, the first pupil expander 2930A and the second pupil expander 2930B can be similar to an OPE with a portion removed (e.g., removed area 2932A and 2932B), as described above. The first pupil expander 2930A and the second pupil expander 2930B can mutiply light received and direct the light to the third pupil expander 2940 (as similarly described above). In some embodiments, the first pupil expander 2930A and the second pupil expander 2930B can direct the light at an angle in the x-y plane rather than in a generally x-direction, as described above. The angle can cause the first pupil expanders 2930A and 2930B to send light to the third pupil expander 2940 as illustrated by light path 2928. In some embodiments, the waveguide 2900 can approximately double an efficiency compared to other waveguides described herein.

In some embodiments, the waveguide 2900 can further include one or more spreaders (e.g., spreader 2932A and spreader 2932B). The one or more spreaders can capture light that is transmitting from the ICG 2920 directly to a center of the third pupil expander 2940. The one or more spreaders can include a grating similar to one or more OPEs described herein. In some embodiments, the grating of the one or more spreaders can similarly stair step the light to the third pupil expander 2940.

In some embodiments, an eyepiece can include a planar waveguide layer. The planar waveguide layer can include a first pupil expander, a second pupil expander, and a third pupil expander. The first pupil expander can be configured to receive light from an incoupling DOE (e.g., ICG). In some embodiments, the first pupil expander can have a first grating configured to diffract light toward the third pupil expander. The second pupil expander can be configured to receive light from the incoupling DOE. In some embodiments, the second pupil expander can have a grating to diffract light toward the third pupil expander. The second pupil expander can be located on an opposite side of the incoupling DOE as the first pupil expander. In some embodiments, the third pupil expander can have a second grating. The third pupil expander can be configured to receive light from the first pupil expander and the second pupil expander. In some embodiments, the third pupil expander can also be configured to outcouple light to an eye of a user using the second grating. In some embodiments, the planar waveguide layer can further include a spreader configured to receive light from the incoupling DOE and to transmit light to an eyebox of the third pupil expander. In some embodiments, the spreader can have a third grating configured to diffract light a plurality of times before directing the light to the third pupil expander. In some embodiments, the spreader cam be located on a different side of the incoupling DOE than the first pupil expander and the second pupil expander.

Figure 30A:
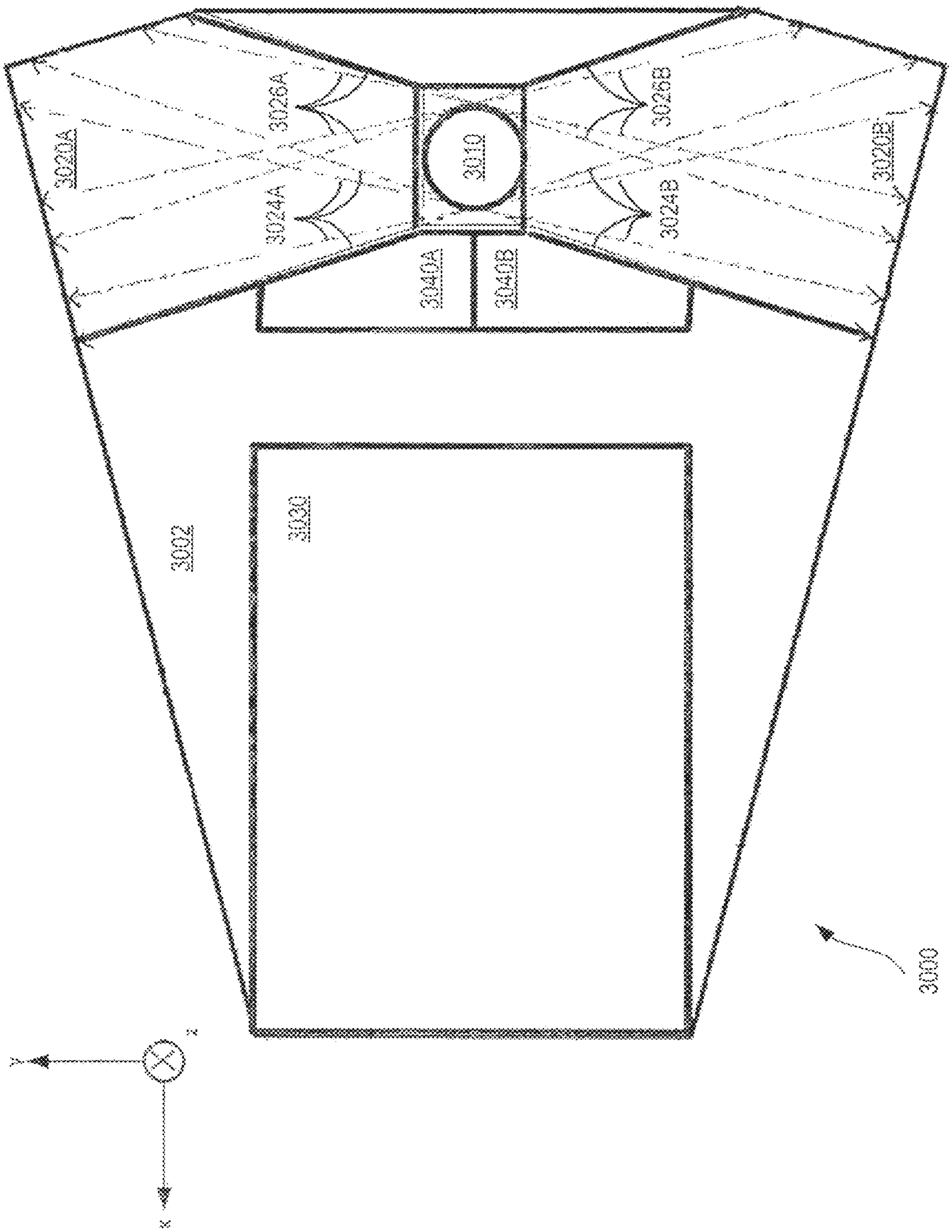
FIG. 30A illustrates an example of a bowtie topology for a waveguide according to an embodiment of the present invention.

FIG. 30A illustrates an example of a bowtie topology for a waveguide 3000 according to an embodiment of the present invention. The waveguide 3000 can include an input coupler region 3010 (including an ICG), an upper OPE region 3020A, a lower OPE region 3020B, and an EPE region 3030. In some embodiments, the waveguide 3000 can also include an upper spreader region 3040A and a lower spreader region 3040B. The waveguide 3000 may be made of a substrate material that is at least partially transparent. For example, the waveguide 3000 can be made of a glass, plastic, polycarbonate, sapphire, etc. substrate 3002. The selected material may have an index of refraction above 1, more preferably a relatively high index of refraction above 1.4, or more preferably above 1.6, or most preferably above 1.8 to facilitate light guiding. The thickness of the substrate 3002 may be, for example, 325 microns or less. Each of the described regions of the waveguide 3000 can be made by forming one or more diffractive structures on or within the waveguide substrate 3002. The specific diffractive structures vary from region to region.

As shown in FIG. 30A, light rays 3024A and 3024B respectively illustrate the paths along which input rays corresponding to the four corners of an input image projected at the 9 o'clock position of the input coupler region 3010 are re-directed toward the upper OPE region 3020A and the lower OPE region 3020B. Similarly, light rays 3026A and 3026B respectively illustrate the paths along which input rays corresponding to the four corners of input imagery projected at the 3 o'clock position of the input coupler region 3010 are re-directed toward the upper OPE region 3020A and the lower OPE region 3020B.

Figure 30B:
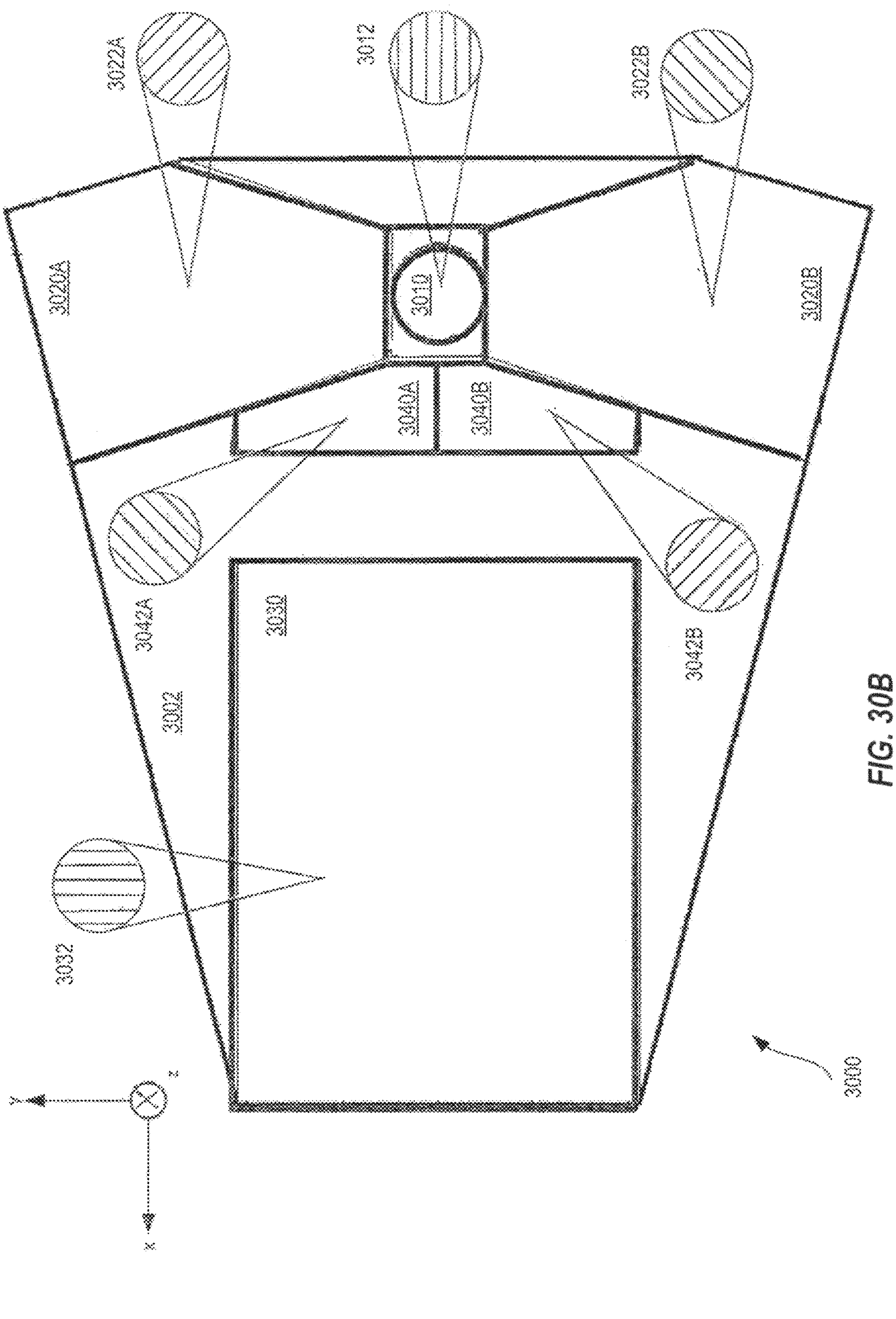
FIG. 30B illustrates various magnified views of diffractive optical features for a waveguide according to an embodiment of the present invention.

FIG. 30B illustrates various magnified views of diffractive optical features for the waveguide 3000 according to an embodiment of the present invention. The diffractive optical features of the waveguide 3000 cause imagery projected into the eyepiece at the input coupler region 3010 to propagate through the waveguide 3000 and to be projected out toward the user's eye from the EPE region 3030. Generally speaking, imagery is projected into the waveguide 3000 via rays of light which travel approximately along the illustrated z-axis and are incident on the input coupler region 3010 from outside of the substrate 3002. The input coupler region 3010 includes diffractive optical features which redirect the input rays of light such that they propagate inside the substrate 3002 of the waveguide 3000 via total internal reflection. In some embodiments, the input coupler region 3010 is symmetrically located between upper and lower OPE regions 3020. The input coupler region 3010 may divide and redirect the input light towards both of these OPE regions 3020.

The OPE regions 3020 include diffractive optical features which perform at least two functions: first, they divide each input ray of light into a plurality of many spaced apart parallel rays; second, they redirect this plurality of rays of light on a path generally toward the EPE region 3030. The EPE region 3030 likewise includes diffractive optical features. The diffractive optical features of the EPE region 3030 redirect the rays of light coming from the OPE regions 3020 such that they exit the substrate 3002 of the waveguide 3000 and propagate toward the user's eye. The diffractive optical features of the EPE region 3030 may also impart a degree of optical power to the exiting beams of light to make them appear as if they originate from a desired depth plane, as discussed elsewhere herein. The waveguide 3000 has the property that the angle of exit at which light rays are output by the EPE region 3030 is uniquely correlated with the angle of entrance of the corresponding input ray at the input coupler region 3010, thereby allowing the eye to faithfully reproduce the input imagery.

The optical operation of the waveguide 3000 will now be described in more detail. First, VR/AR/MR imagery is projected into the waveguide 3000 at the input coupler region 3010 from one or more input devices. The input device can be, for example, a spatial light modulator projector (located in front of, or behind, the waveguide 3000 with respect to the user's face), a fiber scanning projector, or the like. In some embodiments, the input device may use liquid crystal display (LCD), liquid crystal on silicon (LCoS), or fiber scanned display (FSD) technology, though others can also be used. The input device can project one or more rays of light onto a sub-portion of the input coupler region 3010.

A different sub-portion of the input coupler region 3010 can be used to input imagery for each of the multiple stacked waveguides that make up the eyepiece. This can be accomplished by, for each waveguide 3000, providing appropriate diffractive optical features at a sub-portion of the input coupler region 3010 which has been set aside for inputting imagery into that waveguide 3000 of the eyepiece. These sub-portions can be referred to as separated pupils for incoupling light at a particular wavelength and/or depth plane. For example, one waveguide 3000 may have diffractive features provided in the center of its input coupler region 3010, while others may have diffractive features provided at the periphery of their respective input coupler regions at, for example, the 3 o'clock or 9 o'clock positions. Thus, the input imagery intended for each waveguide 3000 can be aimed by the projector at the corresponding portion of the input coupler region 3010 such that the correct imagery is directed into the correct waveguide 3000 without being directed into the other waveguides.

The projector may be provided such that the input rays of light approach the input coupler region 3010 of a substrate 3002 generally along the illustrated z-direction (though there is typically some angular deviation, given that light rays corresponding to different points of an input image will be projected at different angles). The input coupler region 3010 of any given substrate 3002 includes diffractive optical features which redirect the input rays of light at appropriate angles to propagate within the substrate 3002 of the waveguide 3000 via total internal reflection. As shown by magnified view 3012, in some embodiments the diffractive optical features of the input coupler region 3010 may form a diffraction grating made up of many lines which extend horizontally in the illustrated x-direction and periodically repeat vertically in the illustrated y-direction. In some embodiments, the lines may be etched into the substrate 3002 of the waveguide 3000 and/or they may be formed of material deposited onto the substrate 3002. For example, the input coupler grating may comprise lines etched into the back surface of the substrate (opposite the side where input light rays enter) and then covered with sputtered-on reflective material, such as metal. In such embodiments, the input coupler grating acts in reflection mode, though other designs can use a transmission mode. The input coupler grating can be any of several types, including a surface relief grating, binary surface relief structures, a volume holographic optical element (VHOE), a switchable polymer dispersed liquid crystal grating, etc. The period, duty cycle, depth, profile, etc. of the lines can be selected based on the wavelength of light for which the substrate/waveguide is designed, the desired diffractive efficiency of the grating, and other factors.

Input light which is incident upon this input coupler diffraction grating is split and redirected both upward in the +y-direction toward the upper OPE region 3020A and downward in the −y-direction toward the lower OPE region 3020B. Specifically, the input light which is incident upon the diffraction grating of the input coupler region 3010 is separated into positive and negative diffractive orders, with the positive diffractive orders being directed upward toward the upper OPE region 3020A and the negative diffractive orders being directed downward toward the lower OPE region 3020B, or vice versa. In some embodiments, the diffraction grating at the input coupler region 3010 is designed to primarily couple input light into the +1 and −1 diffractive orders. (The diffraction grating can be designed so as to reduce or eliminate the 0th diffractive order and higher diffractive orders beyond the first diffractive orders. This can be accomplished by appropriately shaping the profile of each line.)

The upper OPE region 3020A and the lower OPE region 3020B also include diffractive optical features. In some embodiments, these diffractive optical features are lines formed on or within the substrate 3002 of the waveguide 3000. The period, duty cycle, depth, profile, etc. of the lines can be selected based on the wavelength of light for which the substrate/waveguide is designed, the desired diffractive efficiency of the grating, and other factors. The specific shapes of the OPE regions 3020A and 3020B can vary, but in general may be determined based on what is needed to accommodate rays of light corresponding to the corners of the input imagery, and all the rays of light in between, so as to provide a full view of the input imagery.

As described previously, one purpose of these diffraction gratings in the OPE regions 3020A and 3020B is to split each input light ray into a plurality of multiple spaced apart parallel light rays. This can be accomplished by designing the OPE diffraction gratings to have relatively low diffractive efficiency such that each grating line re-directs only a desired portion of a light ray while the remaining portion continues to propagate in the same direction. (One parameter which can be used to influence the diffractive efficiency of the grating is the etch depth of the lines.) Another purpose of the diffraction gratings in the OPE regions 3020A, 3020B is to direct those light rays along a path generally toward the EPE region 3030. That is, every time a light ray is incident upon a line of the OPE diffraction grating, a portion of it will be deflected toward the EPE region 3030 while the remaining portion will continue to transmit within the OPE region to the next line, where another portion is deflected toward the EPE region and so on. In this way, each input light ray is divided into multiple parallel light rays which are directed along a path generally toward the EPE region 3030. This is illustrated in FIG. 30C.

The orientation of the OPE diffraction gratings can be slanted with respect to light rays arriving from the input coupler region 3010 so as to deflect those light rays generally toward the EPE region 3030. The specific angle of the slant may depend upon the layout of the various regions of the waveguide 3000. In the embodiment illustrated in FIG. 30B, the upper OPE region 3020A extends in the +y-direction, while the lower OPE region 3020B extends in the −y-direction, such that they are oriented 180° apart. Meanwhile, the EPE region 3030 is located at 90° with respect to the axis of the OPE regions 3020A and 3020B. Therefore, in order to re-direct light from the OPE regions 3020A and 3020B toward the EPE region 3030, the diffraction gratings of the OPE regions may be oriented at about +/−45° with respect to the illustrated x-axis. Specifically, as shown by magnified view 3022A, the diffraction grating of the upper OPE region 3020A may consist of lines oriented at approximately +45° to the x-axis. Meanwhile, as shown by the magnified view 3022B, the diffraction grating of the lower OPE region 3020B may consist of lines oriented at approximately −45° to the x-axis.

Figure 30C:
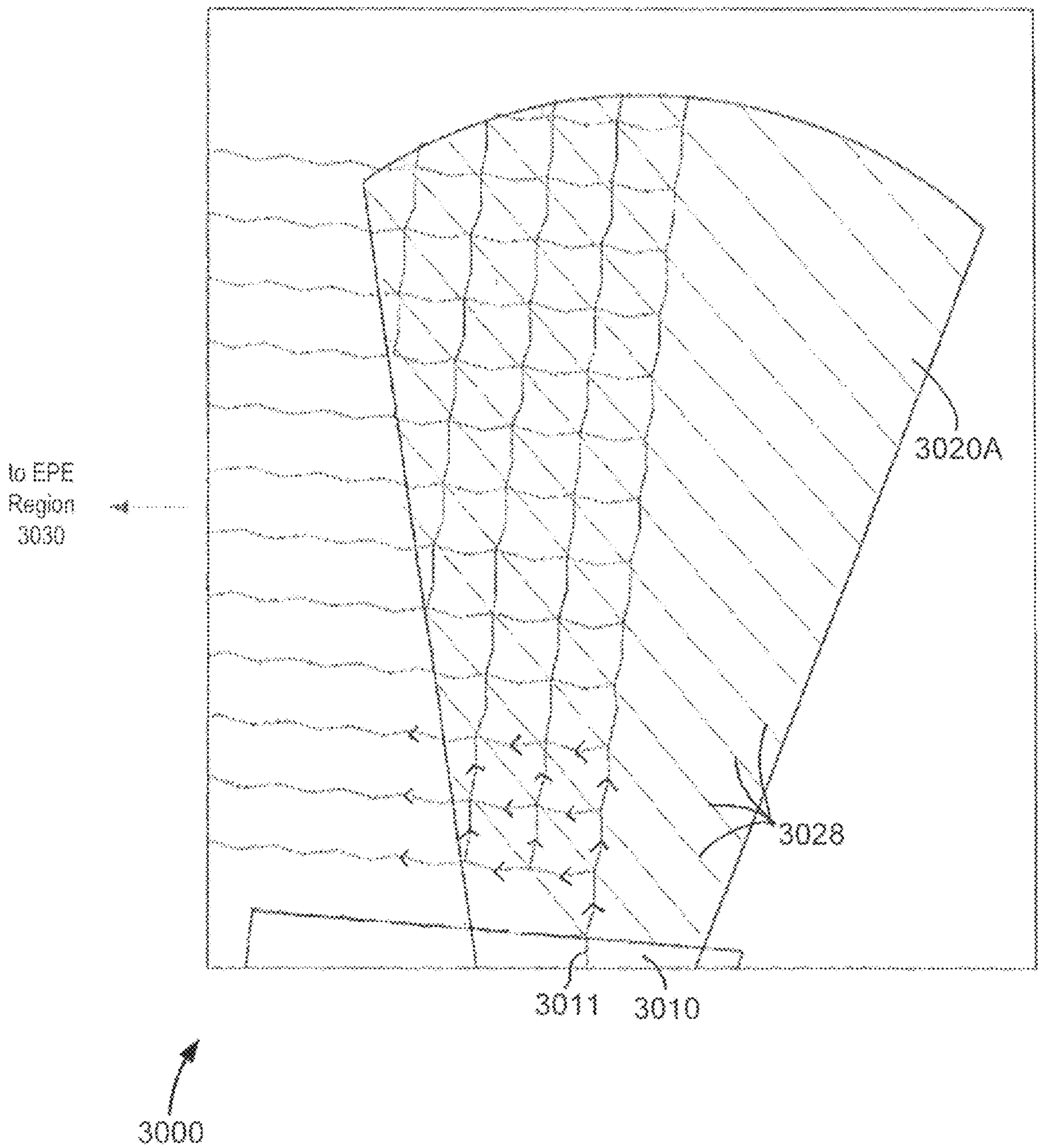
FIG. 30C illustrates the optical operation of the OPE regions for the waveguide according to an embodiment of the present invention.

FIG. 30C illustrates the optical operation of the stair step effect in the OPE regions for the waveguide 3000 according to an embodiment of the present invention. The OPE regions shown in FIG. 30C may correspond to the OPE regions of FIGS. 30A and 30B. As illustrated, an input ray 3011 enters the upper OPE region 3020A from the input coupler region 3010. Each input ray 3011 propagates through the waveguide 3000 via total internal reflection, repeatedly reflecting between the top and bottom surfaces of the substrate 3002. When the input ray 3011 is incident upon one of the lines 3028 depicting a periodic structure of the diffraction grating formed in the upper OPE region 3020A, a portion of the ray is directed toward the EPE region 3030, while another portion of the ray continues along the same path through the OPE region 3020A. This occurs at each line of the diffraction grating, which results in each input ray 3011 being sampled into a plurality of rays or beamlets of the original light. The paths of some of these rays are indicated in FIG. 30C by arrows.

With reference back to FIG. 30B, in some embodiments it may be advantageous that the input coupler region 3010 be located between two OPE regions because this allows the waveguide 3000 to efficiently make use of light from positive and negative diffractive orders from the input coupler region 3010, as one OPE region receives positive diffractive orders and the other OPE region receives negative diffractive orders from the input coupler region 3010. The light from the positive and negative diffractive orders can then be recombined at the EPE region 3030 and directed to the user's eye. Although the position of the input coupler region 3010 between the upper and lower OPE regions 3020A and 3020B is advantageous in this regard, it can result in the input coupler region 3010 effectively shadowing the central portion of the EPE region 3030. That is, because input rays are separated into positive and negative diffractive orders by the input coupler and are first directed in the +y-direction or the −y-direction before being redirected in the +x-direction toward the EPE region 3030, fewer light rays may reach the central portion of the EPE region which is located directly to the left of the input coupler region 3010 in FIGS. 30A and 30B. This may be undesirable because if the center of the EPE region 3030 is aligned with the user's eye, then fewer light rays may ultimately be directed to the user's eye due to this shadowing effect which is caused by the position of the input coupler region 3010 between the OPE regions 3020. As a solution to this problem, the waveguide 3000 may also include upper and lower spreader regions 3040A and 3040B. These spreader regions can re-direct light rays from the OPE regions so as to fill in the central portion of the EPE region 3030. The upper and lower spreader regions 3040A and 3040B accomplish this task with diffractive features which are illustrated in FIG. 30B.

As shown in magnified view 3042A, the upper spreader region 3040A can include a diffraction grating whose grating lines are formed at approximately −45° to the x-axis, orthogonal to the grating lines in the neighboring upper OPE region 3020A from which the upper spreader region 3040A primarily receives light. Like the OPE gratings, the efficiency of the gratings in the spreader regions can be designed such that only a portion of the light rays incident on each line of the grating is re-directed. Due to the orientation of the diffraction grating lines in the upper spreader region 3040A, light rays from the upper OPE region 3020A are re-directed somewhat in the −y-direction before continuing on in the +x-direction toward the EPE region 3030. Thus, the upper spreader region 3040A helps to increase the number of light rays which reach the central portion of the EPE region 3030, notwithstanding any shadowing caused by the position of the input coupler region 3010 with respect to the EPE region 3030. Similarly, as shown in magnified view 3042B, the lower spreader region 3040B can include grating lines which are formed at approximately +45° to the x-axis, orthogonal to the grating lines in the neighboring lower OPE region 3020B from which the lower spreader region 3040B primarily receives light. The diffraction grating lines in the lower spreader region 3040B cause light rays from the lower OPE region 3020B to be re-directed somewhat in the +y-direction before continuing on in the +x-direction toward the EPE region 3030. Thus, the lower spreader region 3040B also helps to increase the number of light rays which reach the central portion of the EPE region 3030.

Figure 31A:
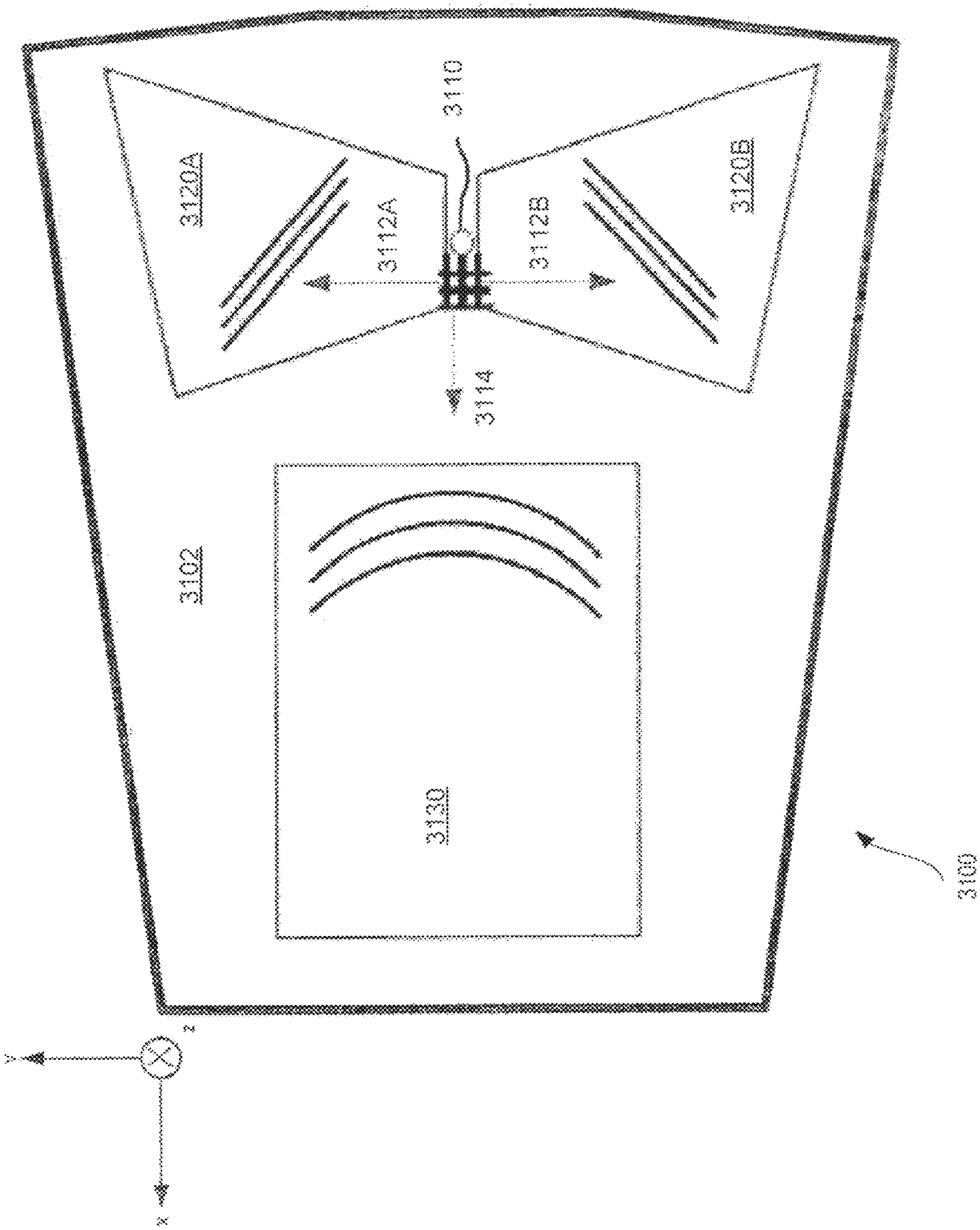
FIG. 31A illustrates an example of a waveguide which includes an input coupler region having two superimposed diffraction gratings according to an embodiment of the present invention.

Light rays from the OPE regions 3020A and 3020B and the spreader regions 3040A and 3040B propagate through the substrate 3002 of the waveguide 3000 until ultimately reaching the EPE region 3030. The EPE region 3030 can include diffractive optical features which redirect the light rays out of the waveguide 3000 and toward the user's eye. As shown in magnified view 3032, the diffractive optical features of the EPE region 3030 can be vertical grating lines which extend in the y-direction and exhibit periodicity in the x-direction. Alternatively, as shown in FIG. 31A, the lines of the diffraction grating in the EPE region 3030 can be somewhat curved in order to impart optical power to the imagery. The period, duty cycle, depth, profile, etc. of the lines can be selected based on the wavelength of light for which the substrate/waveguide is designed, the desired diffractive efficiency of the grating, and other factors. A portion of the light rays which are incident on each of these grating lines in the EPE region 3030 is re-directed out of the substrate 3002 of the waveguide 3000. The specific angle at which each output ray exits the EPE region 3030 of the waveguide 3000 is determined by the angle of incidence of the corresponding input ray at the input coupler region 3010.

FIG. 31A illustrates an example of a waveguide 3100 which includes an input coupler region 3110 having two superimposed diffraction gratings according to an embodiment of the present invention. The waveguide 3100 is formed with a substrate 3102 and includes the input coupler region 3110, an upper OPE region 3120A, a lower OPE region 3120B, and an EPE region 3130. Except where noted otherwise, the waveguide 3100 can function similarly to the waveguide 3000 illustrated in FIGS. 30A-30C. The design of the waveguide 3100 represents another way to increase the amount of light that is directed toward the central portion of the EPE region 3130 (located directly to the left of the input coupler region 3110) without necessarily using the types of spreader regions 3040A and 3040B discussed with respect to FIGS. 30A-30C.

A principal difference between the waveguide 3100 in FIG. 31A as compared to the waveguide 3000 in FIGS. 30A, 30B, and 30C is the design of the input coupler region 3110. In the waveguide 3000, the input coupler region 3010 was designed so as to re-direct input light primarily to the upper and lower OPE regions 3020A and 3020B. In contrast, the input coupler region 3110 shown in FIG. 31A is designed to direct input light both to the upper and lower OPE regions 3120A and 3120B and directly to the EPE region 3130. This can be accomplished by superimposing two diffraction gratings on one another in the input coupler region 3110.

Figure 31B:
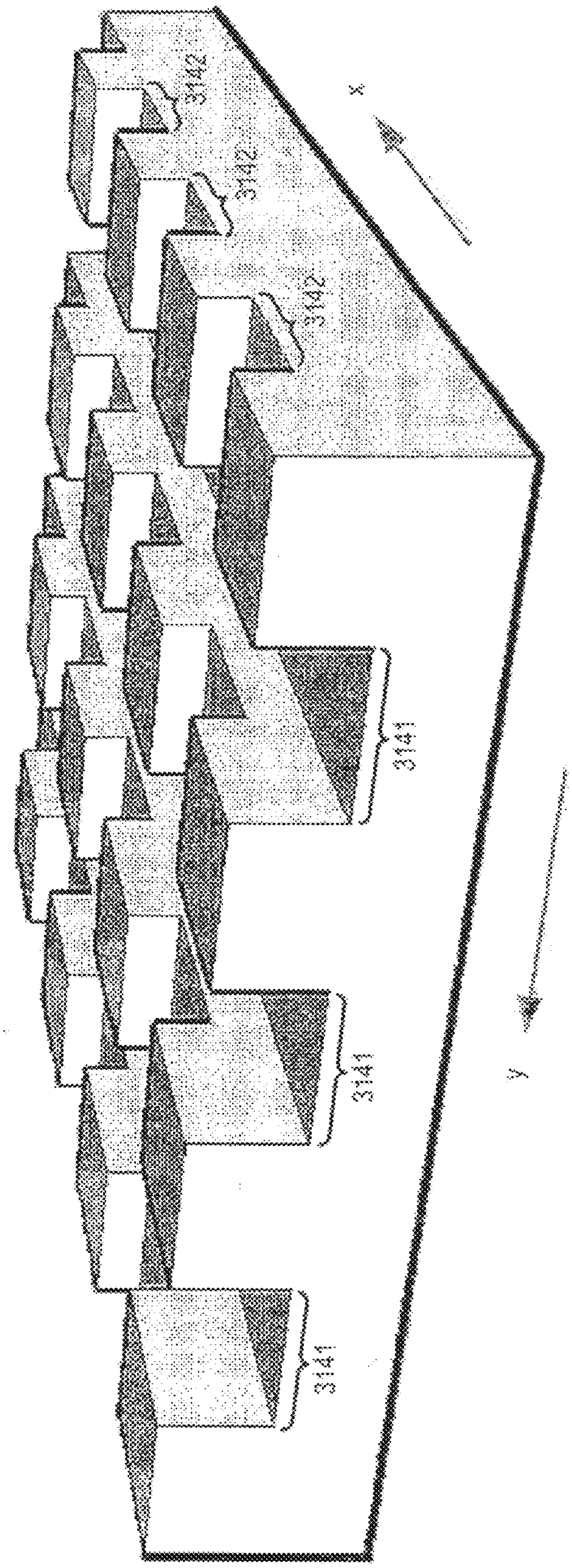
FIG. 31B illustrates a perspective view of an example of an input coupler region made up of two superimposed diffraction gratings according to an embodiment of the present invention.

FIG. 31B illustrates a perspective view of an example of an input coupler region 3110 made up of two superimposed diffraction gratings according to an embodiment of the present invention. The first diffraction grating 3141 can be formed similarly to the one illustrated with respect to FIGS. 30A-30C. Specifically, it can consist of lines extending in the x-direction and repeating periodically in the y-direction such that the two superimposed diffraction gratings are orthogonal to each other. This first diffraction grating 3141 splits input light into positive and negative diffractive orders which are respectively directed toward the upper and lower OPE regions 3120A and 3120B. The first diffraction grating 3141 can have a first diffractive efficiency to control the proportion of input light which it re-directs toward the OPE regions 3120A and 3120B.

The second diffraction grating 3142 can consist of lines extending in the y-direction and repeating periodically in the x-direction. In other words, the second diffraction grating 1342 can be oriented at approximately 90° to the first diffraction grating. This orientation of the second diffraction grating 1342 causes input rays of light to be re-directed toward the EPE region 3130, which in this embodiment is located in a direction substantially 90° from the directions in which the OPE regions 3120A and 3120B are located with respect to the input coupler region 3110, without first passing through the OPE regions. (The second diffraction grating 3142 could also have other orientations depending on the direction in which the EPE region 3130 is located in other embodiments.) The second diffraction grating 3142 can be designed to have a second diffractive efficiency which may be different from the first diffraction efficiency. In some embodiments, the second diffraction grating 3142 can be designed to be less efficient than the first diffraction grating 3141. This can be accomplished by, for example, making the lines of the second diffraction grating 3142 shallower than those of the first diffraction grating, as shown in FIG. 31B, causing most of the input light to be re-directed toward the upper and lower OPE regions 3120A and 3120B by the first diffraction grating 3141 (represented by light rays 3112A and 3112B, respectively), while a lesser portion of the input light is re-directed directly toward the EPE region 3130 by the second diffraction grating 3142 (represented by light ray 3114). Because the input coupler region 3110 re-directs some of the input light directly toward the EPE region 3130, the afore-described shadowing of the central portion of the EPE region by the input coupler region can be reduced.

Figure 32A:
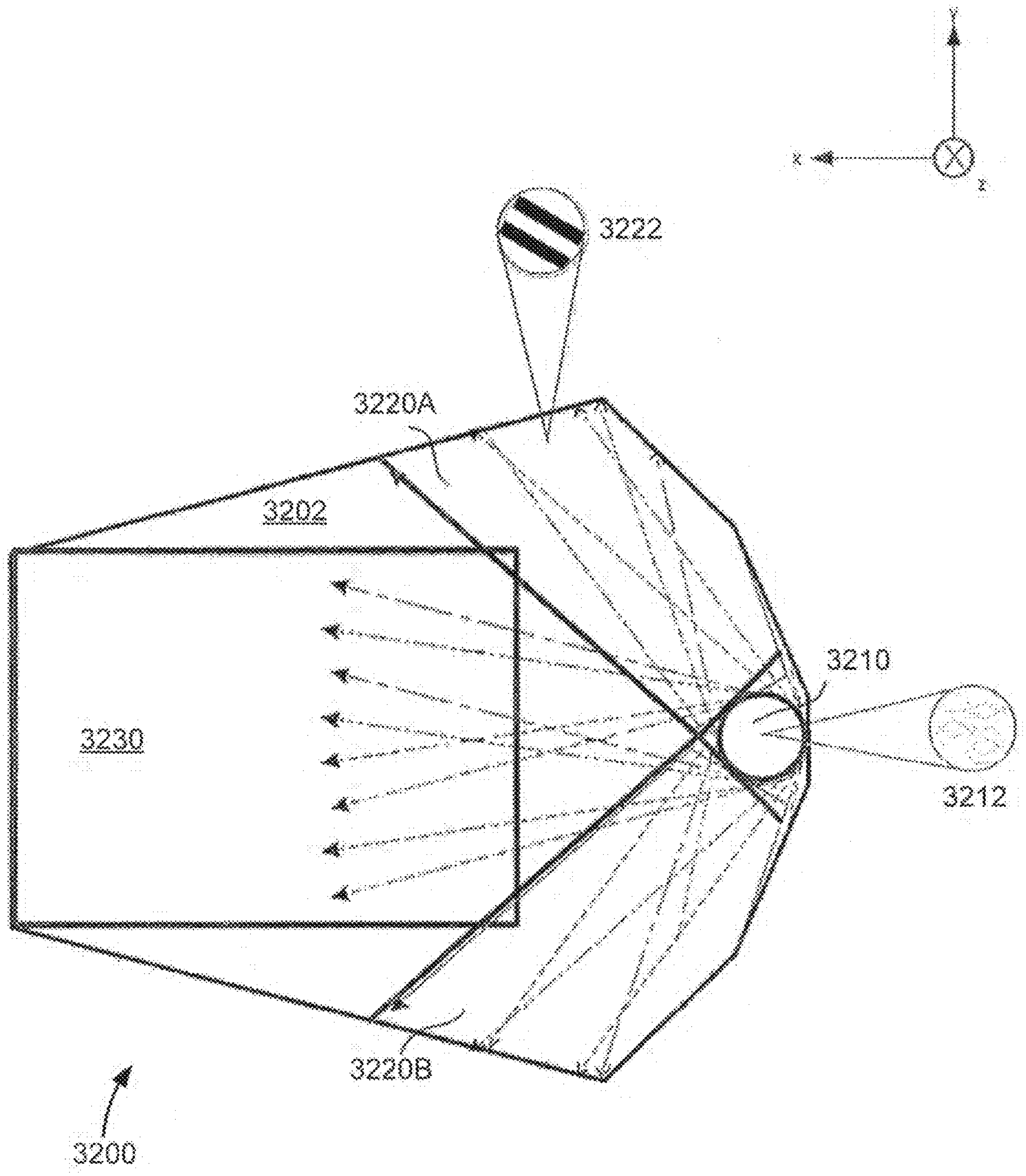
FIG. 32A illustrates an example of a waveguide having a compact form factor according to an embodiment of the present invention.

FIG. 32A illustrates an example of a waveguide 3200 having a compact form factor by angling the upper and lower OPE regions toward the EPE region according to an embodiment of the present invention. The waveguide 3200 is formed with a substrate 3202 and includes an input coupler region 3210, an upper OPE region 3220A, a lower OPE region 3220B, and an EPE region 3230. Except where noted otherwise, the waveguide 3200 shown in FIG. 32A can function similarly to the waveguide illustrated in FIGS. 30A-30C.

A principal difference between the waveguide 3200 in FIG. 32A as compared to the waveguide 3000 in FIGS. 30A-30C is that the OPE regions 3220A and 3220B are angled toward the EPE region 3230. In the embodiment shown in FIG. 32A, each OPE region is tilted from the y-axis by about 30 degrees. Thus, rather than being separated by about 180 degrees, as in the embodiment illustrated in FIGS. 30A-30C, the upper OPE region 3220A and the lower OPE region 3220B are separated by about 120 degrees. For example, the input coupler region 3210 may be configured to diffract the incoupled light related to the projected image into the substrate 3202 in multiple directions, including a first direction (upward, 30 degrees from the y-axis), a second direction (downward, 30 degrees from the y-axis), and a third direction (in the +x-direction). In some embodiments, the first direction forms a 120 degree angle with the second direction. In some embodiments, the third direction forms a 60 degree angle with each of the first direction and the second direction. While the precise amount of angling of the OPE regions 3220A and 3220B toward the EPE region 3230 can vary, in general such angling may allow the waveguide 3200 to achieve a more compact design. This can be advantageous because it may allow the head-mounted display of a VR/AR/MR system to be made less bulky.

The design of the diffractive features in the input coupler region 3210 can be modified so as to match the angles at which input rays of light are transmitted into the substrate 3202 of the waveguide 3200 such that they correspond with the directions in which the OPE regions 3220A and 3220B are located with respect to the input coupler region 3210. An example embodiment of the diffractive features of the input coupler region 3210 is shown in the magnified view 3212 in FIG. 32B.

Figure 32B:
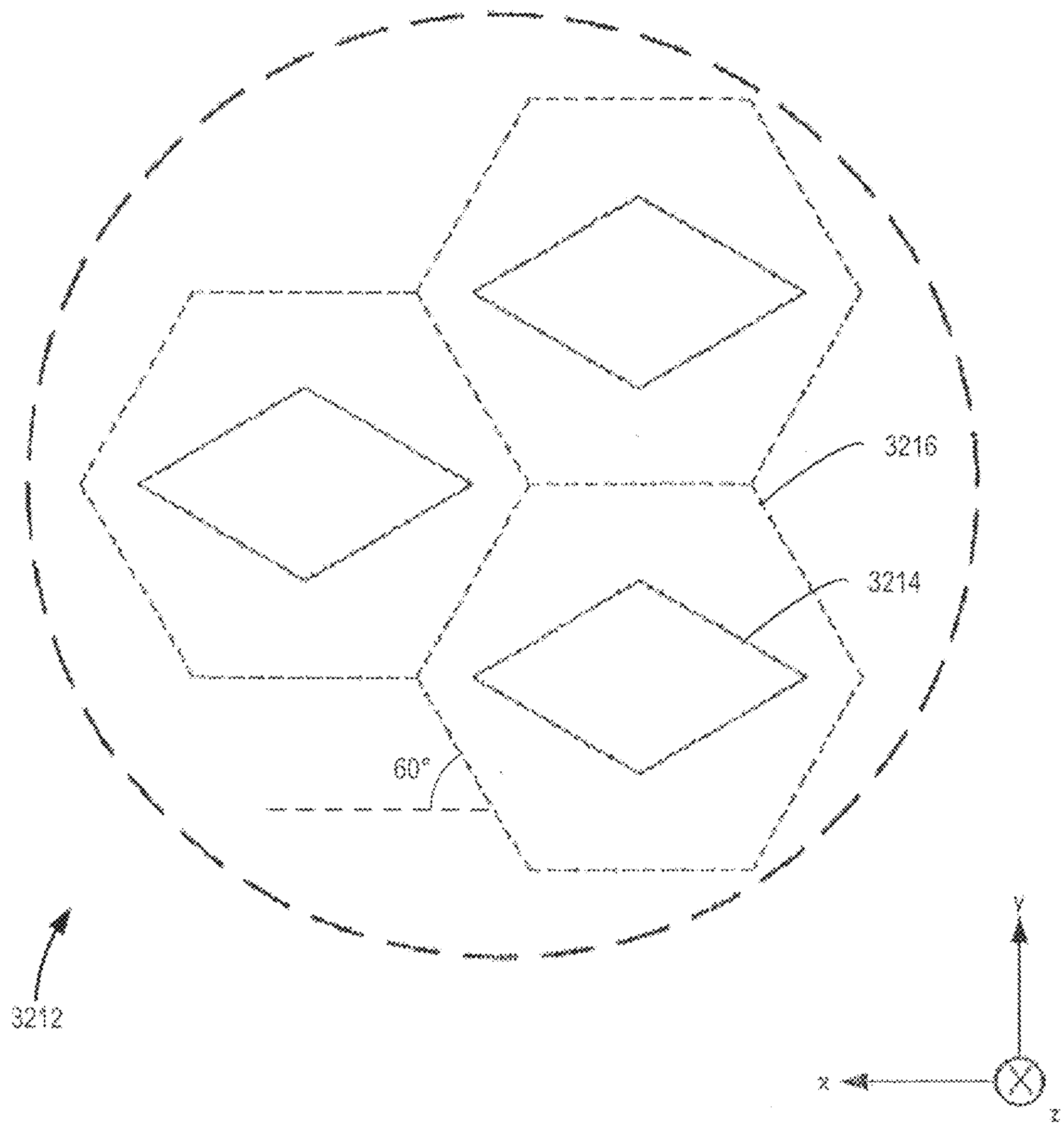
FIG. 32B illustrates an example of diffractive optical features of an input coupler region of a waveguide according to an embodiment of the present invention.

FIG. 32B illustrates an example of the diffractive optical features of the input coupler region 3210 of the waveguide 3200 shown in FIG. 32A according to an embodiment of the present invention. In the illustrated embodiment, the input coupler region 3210 has a plurality of islands 3214 laid out in a hexagonal grid 3216 (note that the dashed lines around each island 3214 are intended to illustrate the hexagonal grid, not necessarily to correspond to any physical structure along the dashed lines). The hexagonal grid 3216 of the diffractive features causes the input rays of light that are incident on the input coupler region 3210 to be transmitted into the substrate 3202 of the waveguide 3200 in multiple directions at 60 degree intervals. Thus, as shown in FIG. 32A, a first set of input rays are launched towards the upper OPE region 3220A at approximately 60 degrees to the x-axis, a second set of input rays are launched toward the lower OPE region 3220B at approximately −60 degrees to the x-axis, and a third set of input rays are launched directly toward the EPE region 3230 generally along the x-axis.

Other tessellated configurations can also be used, depending on the shape of the waveguide 3200 and the direction(s) from the input coupler region 3210 to the OPE region(s) 3220. The specific shape of the islands 3214 determines the efficiency with which light is re-directed into each of these directions. In the illustrated embodiment, each of the islands 3214 is a rhombus, but other shapes are also possible (e.g., circle, square, rectangle, etc.). In addition, the islands 3214 can be single or multi-leveled. In some embodiments, the diffractive features of the input coupler region 3210 are formed by etching the islands 3214 into the back surface of the substrate 3202 (on the opposite side from where input rays enter the substrate 3202 from an input device). The etched islands on the back surface of the substrate 3202 can then be coated with and then adding a reflective material. In this way, input rays of light enter the front surface of the substrate and reflect/diffract from the etched islands on the back surface to the surface of the substrate such that the diffractive features operate in a reflection mode. The upper OPE region 3220A and the lower OPE region 3220B may include diffractive optical features as described previously. The diffractive features of the upper OPE region 3220A are illustrated in magnified view 3222 in FIG. 32C.

Figure 32C:
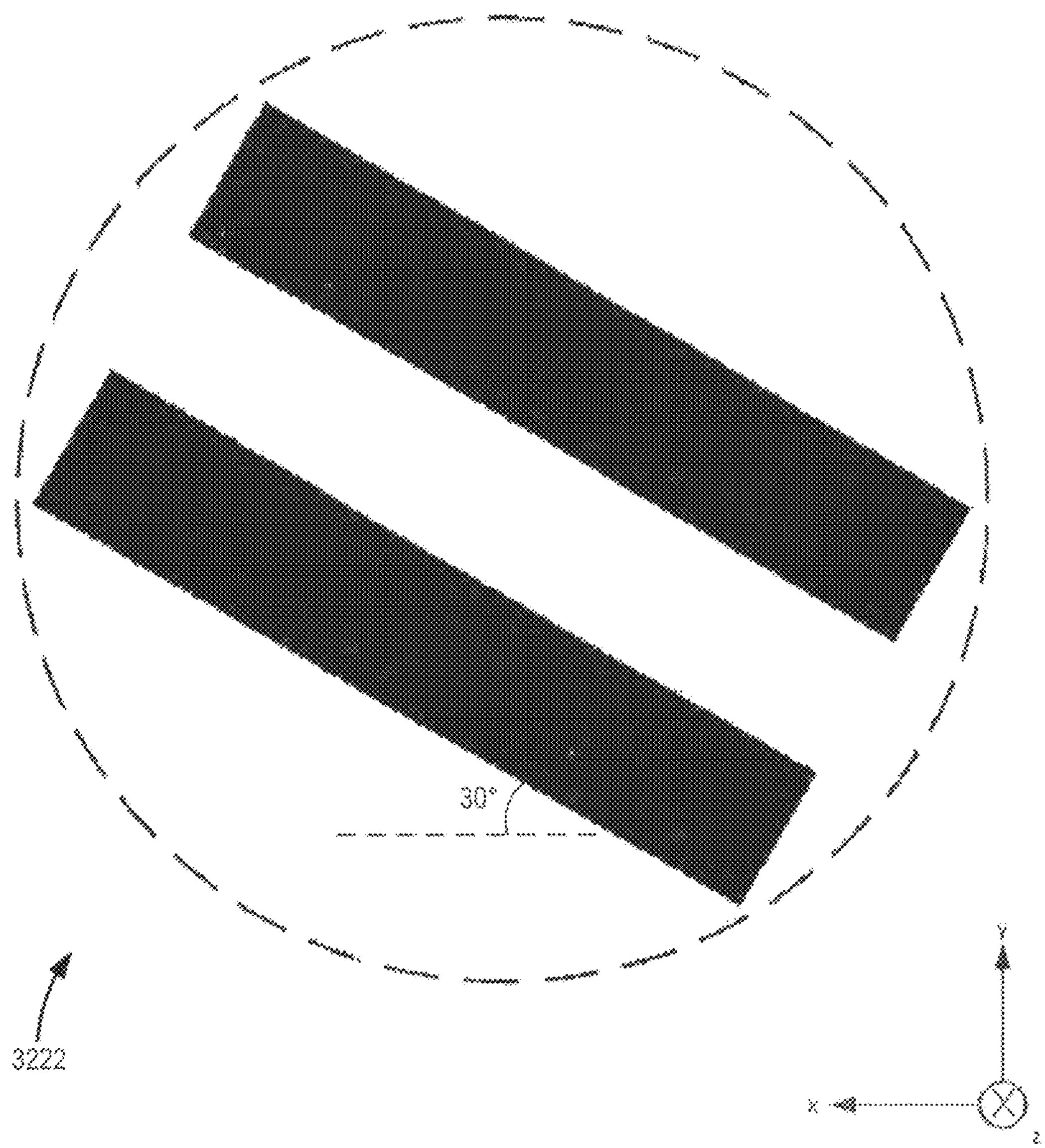
FIG. 32C illustrates an example of diffractive optical features of an OPE region of a waveguide according to an embodiment of the present invention.

FIG. 32C illustrates an example of the diffractive optical features of the OPE region 3220A of the waveguide 3200 shown in FIG. 32A according to an embodiment of the present invention. As was the case with the diffractive features of the OPE regions of the waveguide 3000, the diffractive features of the OPE regions 3220A and 3220B of the waveguide 3200 shown in FIG. 32A are likewise a periodically repeating pattern of lines which form a diffraction grating. In this case, however, the angle at which the lines are oriented has been adjusted in view of the slanted orientation of the OPE region 3220A so as to still re-direct rays of light toward the EPE region 3230. Specifically, the lines of the diffraction grating in the upper OPE region 3220A are oriented at approximately +30 degrees with respect to the x-axis. Similarly, the lines of the diffraction grating in the lower OPE region 3220B are oriented at approximately −30 degrees with respect to the x-axis.

Figure 33A:
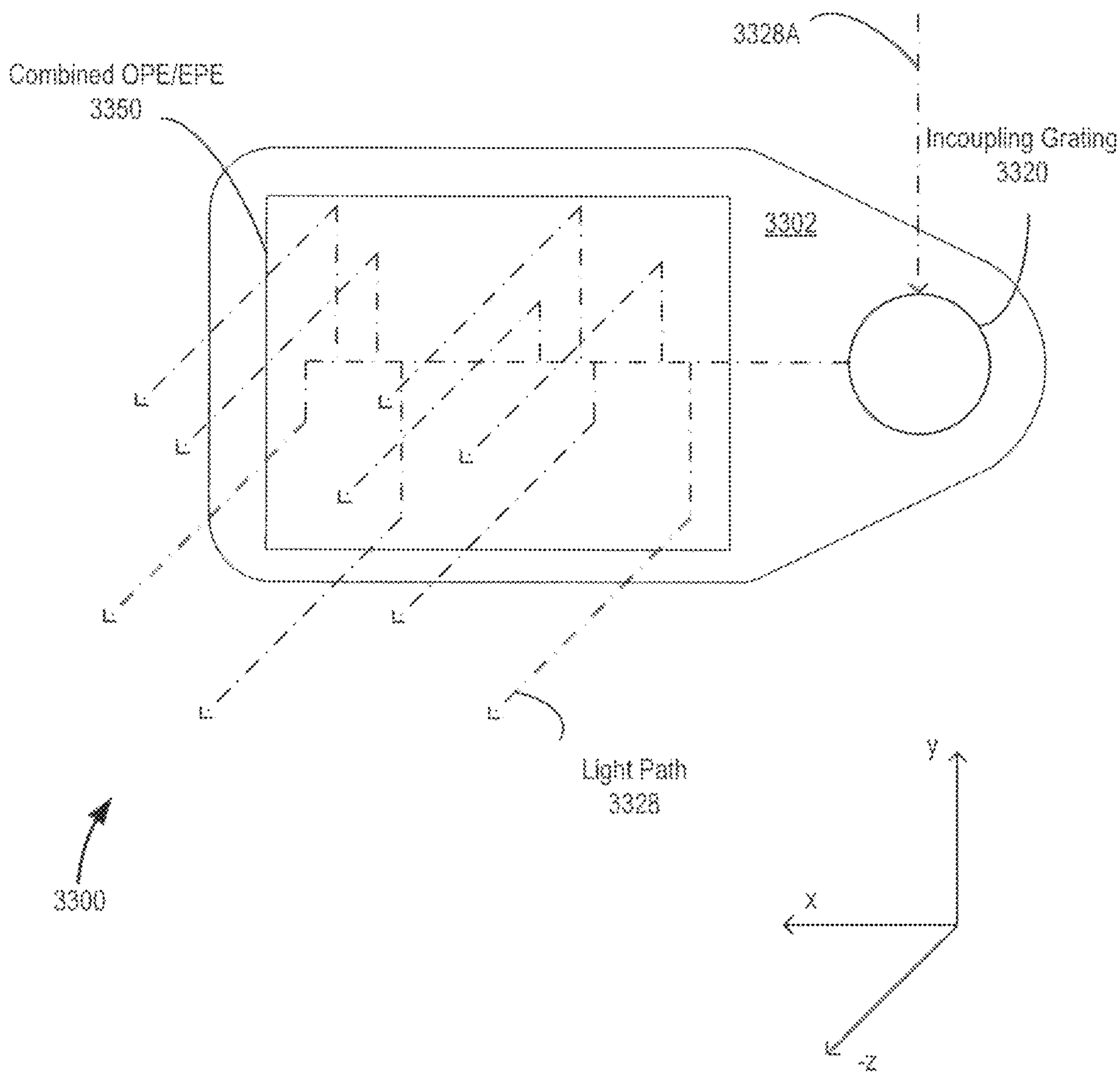
FIG. 33A illustrates an example of a waveguide having a combined OPE/EPE region in a single-sided configuration according to an embodiment of the present invention.

FIG. 33A illustrates an example of a waveguide 3300 having a combined OPE/EPE region 3350 in a single-sided configuration according to an embodiment of the present invention. The combined OPE/EPE region 3350 includes gratings corresponding to both an OPE and an EPE that spatially overlap in the x-direction and the y-direction. In some embodiments, the gratings corresponding to both the OPE and the EPE are located on the same side of a substrate 3302 such that either the OPE gratings are superimposed onto the EPE gratings or the EPE gratings are superimposed onto the OPE gratings (or both). In other embodiments, the OPE gratings are located on the opposite side of the substrate 3302 from the EPE gratings such that the gratings spatially overlap in the x-direction and the y-direction but are separated from each other in the z-direction (i.e., in different planes). Thus, the combined OPE/EPE region 3350 can be implemented in either a single-sided configuration or in a two-sided configuration. One embodiment of the two-sided configuration is shown in reference to FIGS. 34A and 34B.

Figure 33B:
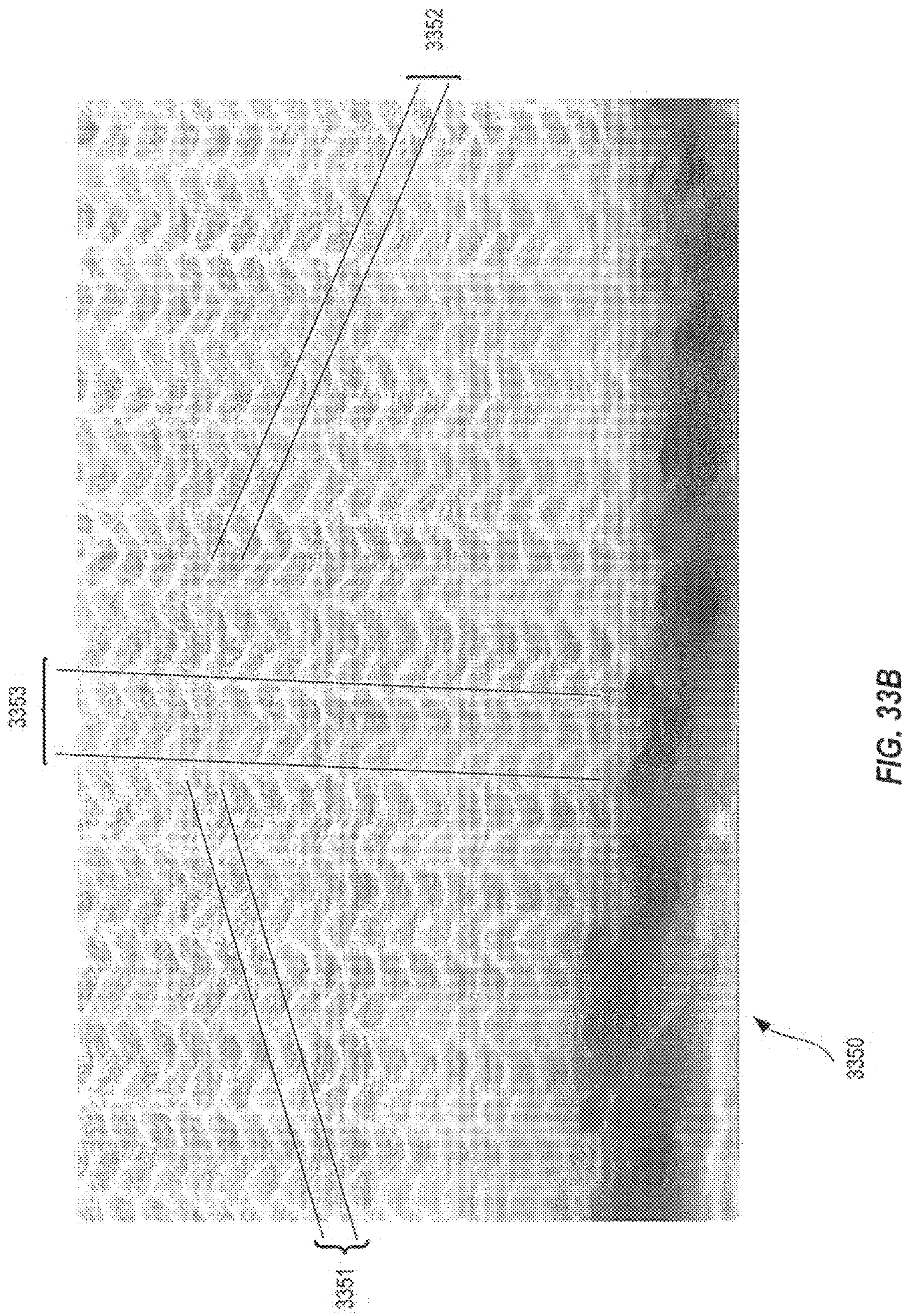
FIG. 33B illustrates an example of a combined OPE/EPE region in a single-sided configuration, captured by an SEM according to an embodiment of the present invention.

FIG. 33B illustrates an example of the combined OPE/EPE region 3350 in a single-sided configuration, captured by a scanning electron microscope (SEM) according to an embodiment of the present invention. The combined OPE/EPE region 3350 may include three sets of gratings: a first OPE grating 3351, a second OPE grating 3352, and an EPE grating 3353. By superimposing the three sets of gratings onto each other, the three sets of gratings are integrated together to form a 3D grating nanostructure with herringbone ridges. The parallel lines displayed in FIG. 33B show the periodicity of the three sets of gratings. In some embodiments, the three sets of gratings are generated using an interference lithography technique on the substrate 3302. In some instances, the three sets of gratings are generated sequentially. For example, using interference lithography, the first OPE grating 3351 may be generated first. After completion of the first OPE grating 3351, the second OPE grating 3352 may be generated using interference lithography directly on top of the finished first OPE grating 3351. Finally, after completion of the second OPE grating 3352, the EPE grating 3353 may be generated using interference lithography. In this manner, the three sets of gratings may be superimposed onto each other. In some embodiments, performance of the combined OPE/EPE region 3350 is improved by generating the EPE grating 3353 after completion of the first OPE grating 3351 and the second OPE grating 3352, thereby retaining most of the functionality of the EPE grating 3353.

In some embodiments, the three sets of gratings are all generated simultaneously during a single processing using interference lithography. For example, prior to performing interference lithography, the desired grating structure may be computed using a computational device. The desired grating structure may include a sum or average of the three sets of gratings. After computing the desired grating structure, interference lithography may be used to generated the desired grating structure onto the substrate 3302. In this manner, the three sets of gratings may be superimposed onto each other. In some embodiments, performance of the combined OPE/EPE region 3350 is improved by first generating a combination of the first OPE grating 3351 and the second OPE grating 3352 using the described technique, and then subsequently generating the EPE grating 3353 after completion of the combined OPE gratings, thereby retaining most of the functionality of the EPE grating 3353. In some embodiments, performance of the combined OPE/EPE region 3350 is improved by increasing the minima and maxima of the EPE grating 3353 toward the edges of the combined OPE/EPE region 3350, thereby increasing the probability of outcoupling light along the edges of the combined OPE/EPE region 3350.

Although not shown in FIG. 33B, in some embodiments the combined OPE/EPE region 3350 includes diffractive mirrors along the edges of the combined OPE/EPE region 3350 (e.g., along the four sides). The diffractive mirrors may include a series of very fine pitch gratings for diffracting the light backwards back into the combined OPE/EPE region 3350, causing light that would otherwise exit the waveguide 3300 to continue to propagate within the waveguide 3300. Inclusion of one or more diffractive mirrors increases waveguide efficiency and improves coherent light artifacts by creating a more random array of exit pupils. As will be evident to one of skill in the art, the present invention is not limited to the superposition of three grating structures, for example other numbers of grating or other diffractive structures can be superimposed. One of ordinary skill in the art would recognize many variations, modifications, and alternatives.

Figure 33C:
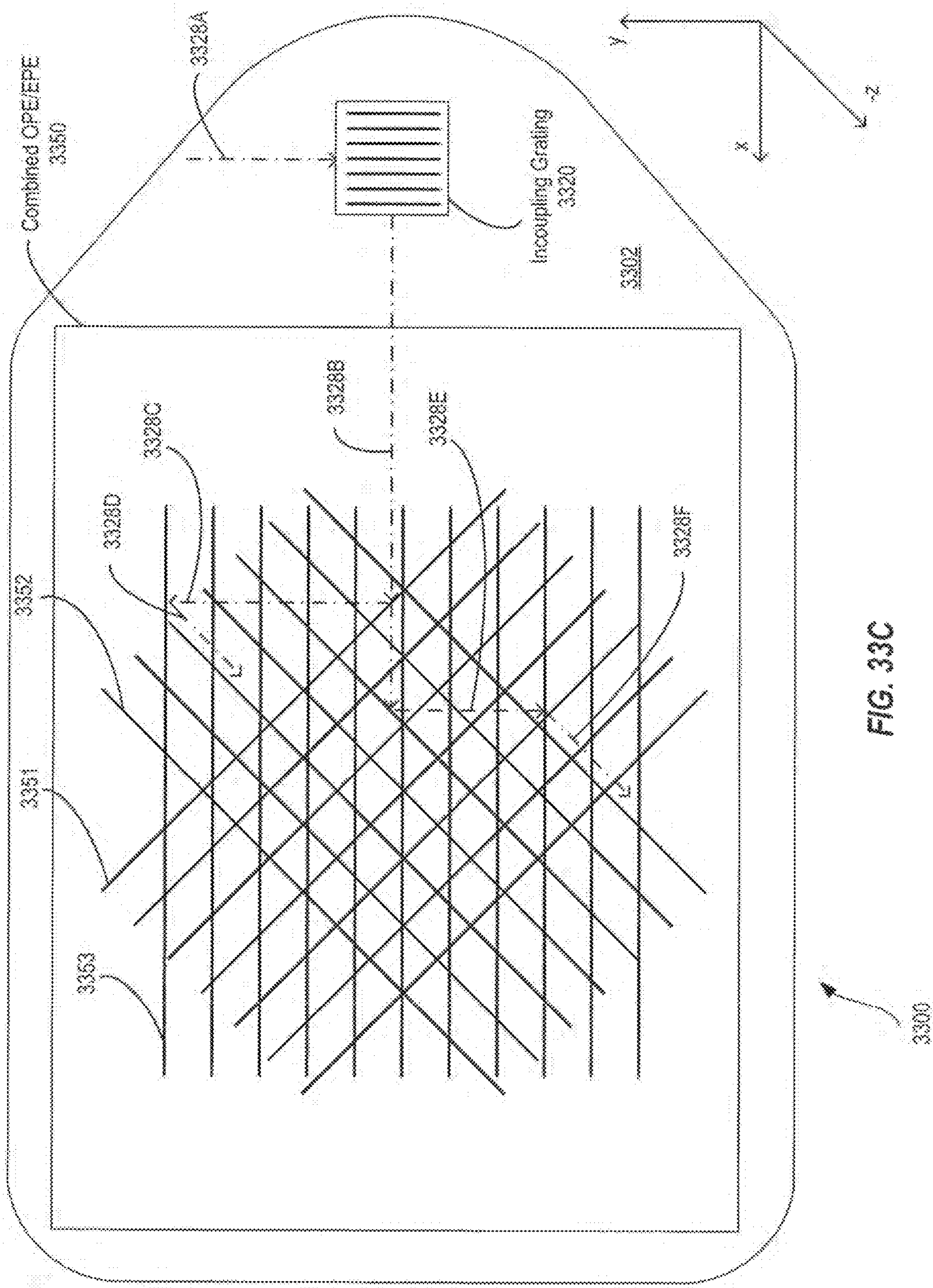
FIG. 33C illustrates an example of a light path within a waveguide according to an embodiment of the present invention.

FIG. 33C illustrates an example of the light path 3328 within the waveguide 3300 according to an embodiment of the present invention. The light path 3328 includes an incident light (denoted as 3328A) that is coupled into the substrate 3302 at the ICG 3320. The incoupled light (denoted as 3328B) propagates toward the gratings 3351, 3352, and 3353 by total internal reflection. When these rays encounter the first OPE grating 3351, light is diffracted in the +y-direction (denoted as 3328C) and is subsequently diffracted in the −z-direction (denoted as 3328D) by the EPE grating 3353 out of the waveguide 3300 toward the user's eye. Similarly, the incoupled light (denoted as 3328B) may alternatively encounter the second OPE grating 3352 and be diffracted in the −y-direction (denoted as 3328E). Light that is diffracted in the −y-direction (denoted as 3328E) may be diffracted by the EPE grating 3353 out of the waveguide 3300 toward the user's eye. Whether light is diffracted in the +y-direction (by the first OPE grating 3351) or in the −y-direction (by the second OPE grating 3352) is probabilistic and is governed by the grating structures. In general, performance of the combined OPE/EPE region 3350 is improved when the incoupled light (denoted as 3328B) has a 50% chance of diffracting in either the +y-direction or the −y-direction. In some instances, this is achieved when the first OPE grating 3351 and the second OPE grating 3352 are perpendicular to each other.

Although waveguide 3300 is illustrated as having only a single ICG 3320, in some embodiments it may be preferable for waveguide 3300 to include a second ICG on the opposite side of the combined OPE/EPE region 3350 as the ICG 3320. The second ICG may be identical in form and function as the ICG 3320 and may be a mirrored version of the ICG 3320. For example, whereas the ICG 3320 is configured to diffract an incoupled light related to a projected image into the substrate 3302, the second ICG 3320 may be configured to diffract an incoupled light related to a mirrored version of the projected image (e.g., flipped in the x-direction). In contrast to the light path 3328 associated with the ICG 3320, the light path associated with the second ICG may include an incident light that is coupled into the substrate 3302 at the second ICG. The incoupled light propagates toward the gratings 3351, 3352, and 3353 by total internal reflection. When these rays encounter the first OPE grating 3351, light is diffracted in the −y-direction and is subsequently diffracted in the −z-direction by the EPE grating 3353 out of the waveguide 3300 toward the user's eye. Similarly, the incoupled light may alternatively encounter the second OPE grating 3352 and be diffracted in the +y-direction. Light that is diffracted in the +y-direction may be diffracted by the EPE grating 3353 out of the waveguide 3300 toward the user's eye.

Figure 33D:
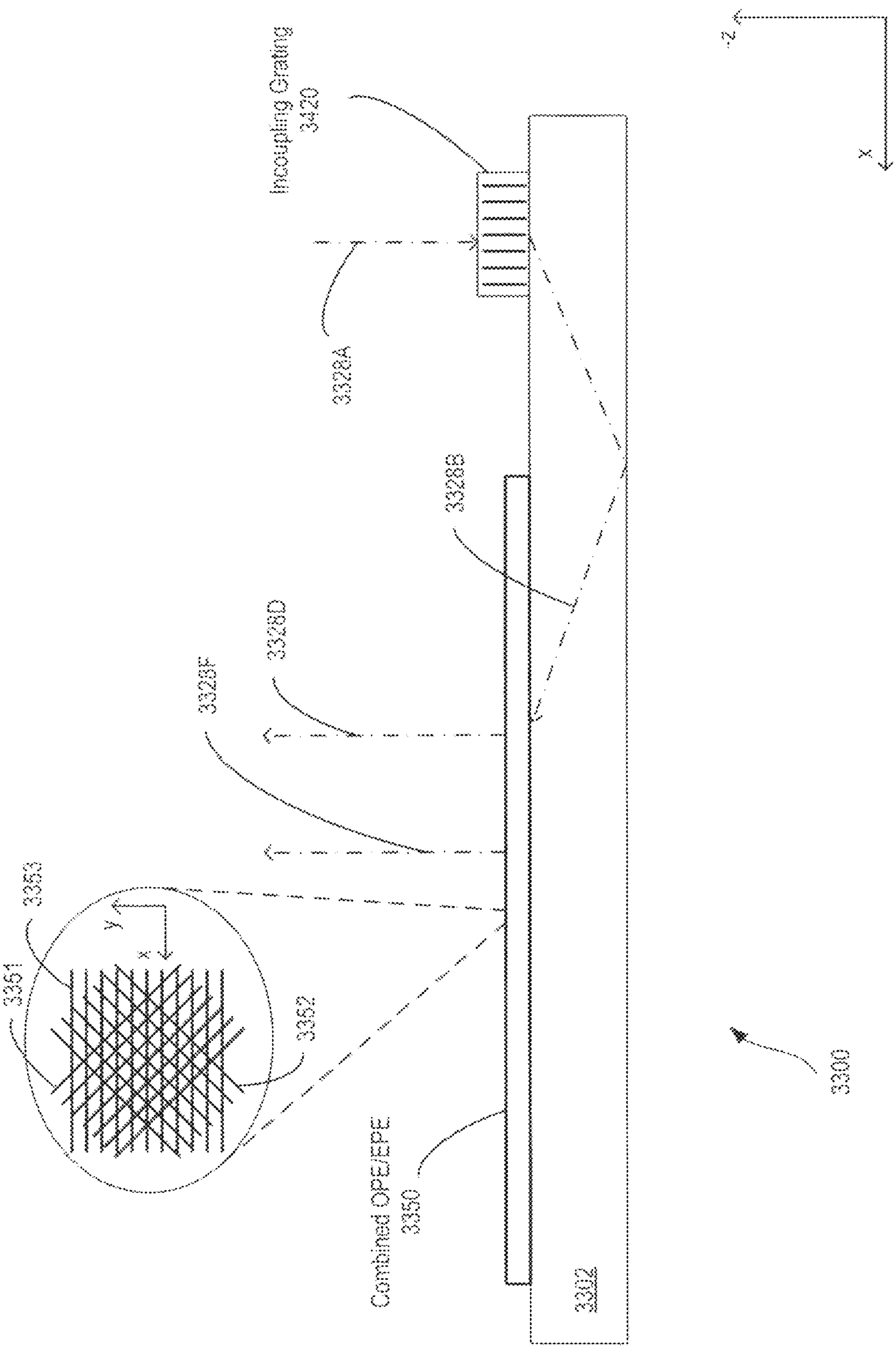
FIG. 33D illustrates a side view of an example of a light path within a waveguide according to an embodiment of the present invention.

FIG. 33D illustrates a side view of the example of the light path 3328 within the waveguide 3300 shown in FIG. 33C according to an embodiment of the present invention. As the incoupled light (denoted as 3328B) propagates toward the gratings 3351, 3352, and 3353, it may reflect multiple times off of one or both of the bottom side and the top side of the substrate 3302 or other waveguide elements.

Figure 34A:
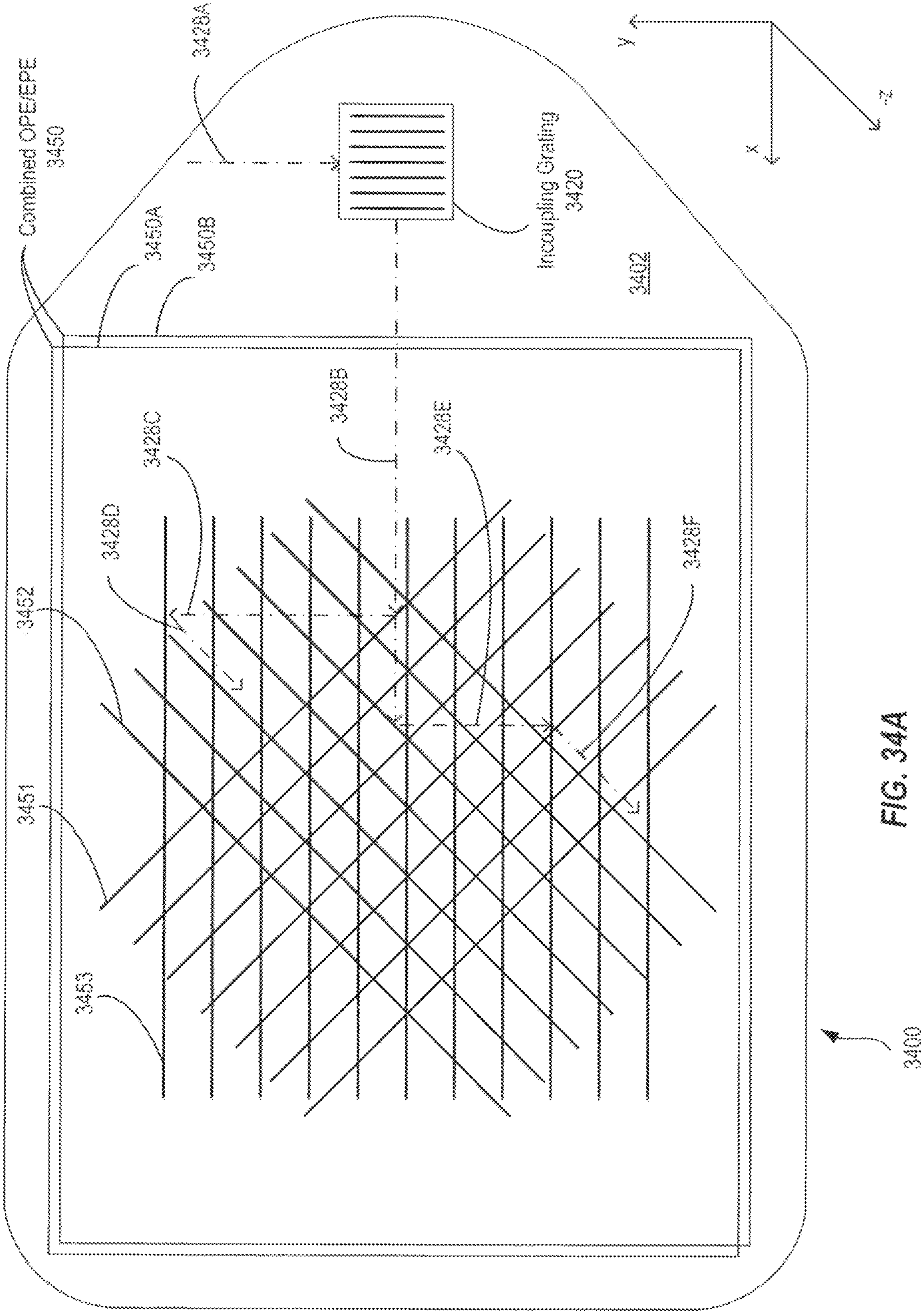
FIG. 34A illustrates an example of a waveguide having a combined OPE/EPE region in a two-sided configuration according to an embodiment of the present invention.

FIG. 34A illustrates an example of a waveguide 3400 having a combined OPE/EPE region 3450 in a two-sided configuration according to an embodiment of the present invention. The waveguide 3400 may differ from the waveguide 3300 shown in reference to FIGS. 33A-33D in that the three sets of gratings in the combined OPE/EPE region 3450 (a first OPE grating 3451, a second OPE grating 3452, and an EPE grating 3453) are distributed between the two sides of the substrate 3402. For example, in some embodiments, the combined OPE/EPE region 3450 includes an OPE component 3450A and an EPE component 3450B such that the OPE component 3450A (including the OPE gratings) is located on one side of the substrate 3402 and the EPE component 3450B (including the EPE gratings) is located on the other side of the substrate 3402. The OPE component 3450A may be generated using interference lithography by generating the two sets of OPE gratings (the first OPE grating 3451 and the second OPE grating 3452) sequentially or by generating the two sets of OPE gratings simultaneously, similar to the technique described in reference to the waveguide 3300.

An example of a light path 3428 within the waveguide 3400 is shown in reference to FIG. 34A. The light path 3428 includes an incident light (denoted as 3428A) that is coupled into the substrate 3402 at the ICG 3420. The incoupled light (denoted as 3428B) propagates toward the gratings 3451, 3452, and 3453 by total internal reflection. When these rays encounter the first OPE grating 3451, light is diffracted in the +y-direction (denoted as 3428C) and is subsequently diffracted in the −z-direction (denoted as 3428D) by the EPE grating 3453 out of the waveguide 3400 toward the user's eye. Similarly, the incoupled light (denoted as 3428B) may alternatively or additionally encounter the second OPE grating 3452 and be diffracted in the −y-direction (denoted as 3428E). Light that is diffracted in the −y-direction (denoted as 3428E) may be diffracted by the EPE grating 3453 out of the waveguide 3400 toward the user's eye.

Figure 34B:
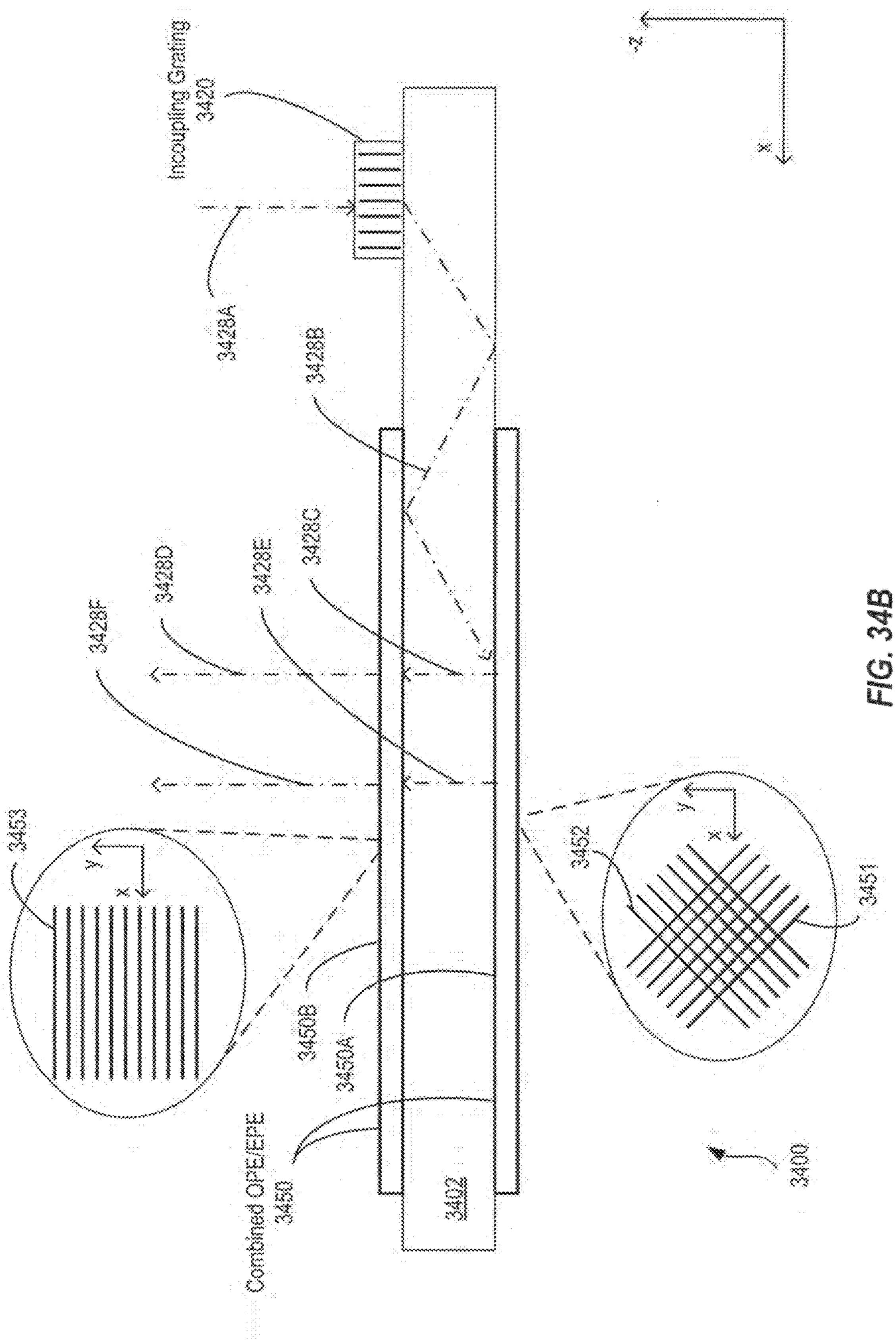
FIG. 34B illustrates a side view of a waveguide and a light path according to an embodiment of the present invention.
Figure 35A:
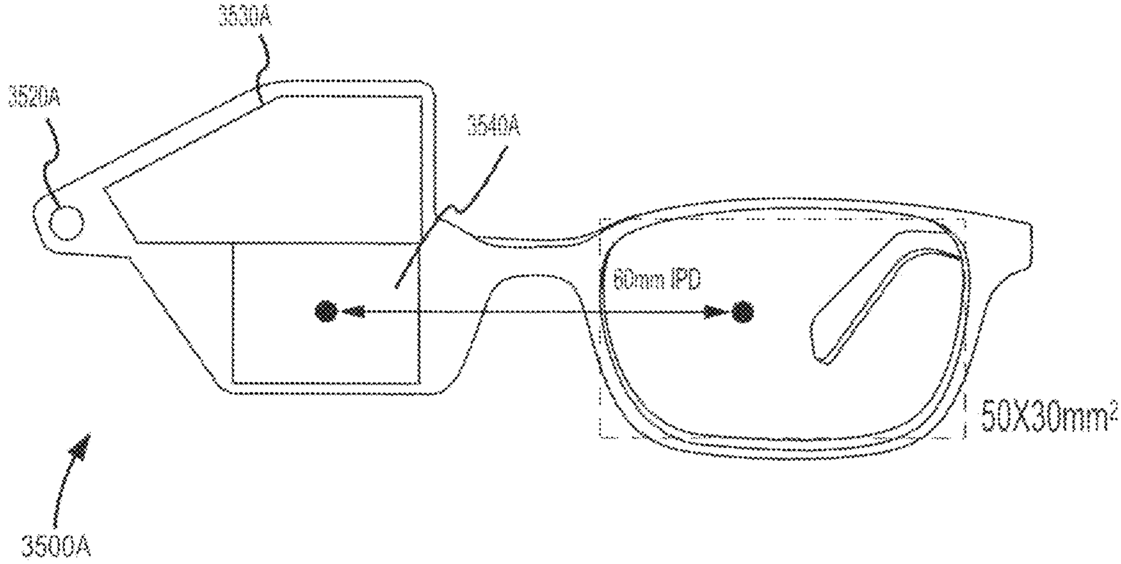
FIGS. 35A-35J illustrate various designs of waveguides for implementation in an eyepiece according to an embodiment of the present invention.
Figure 35B:
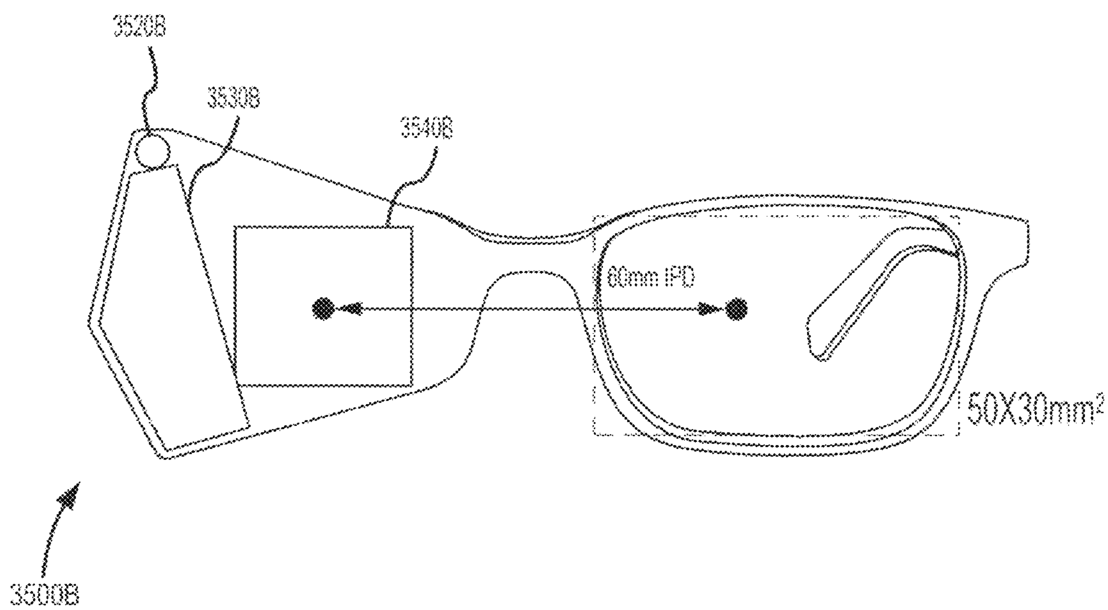
Figure 35C:
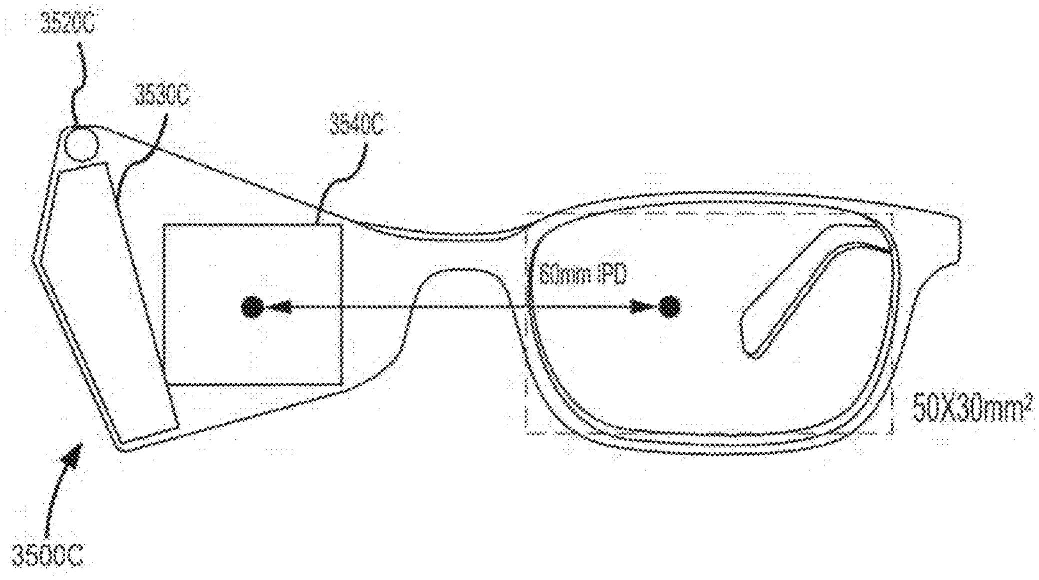
Figure 35D:
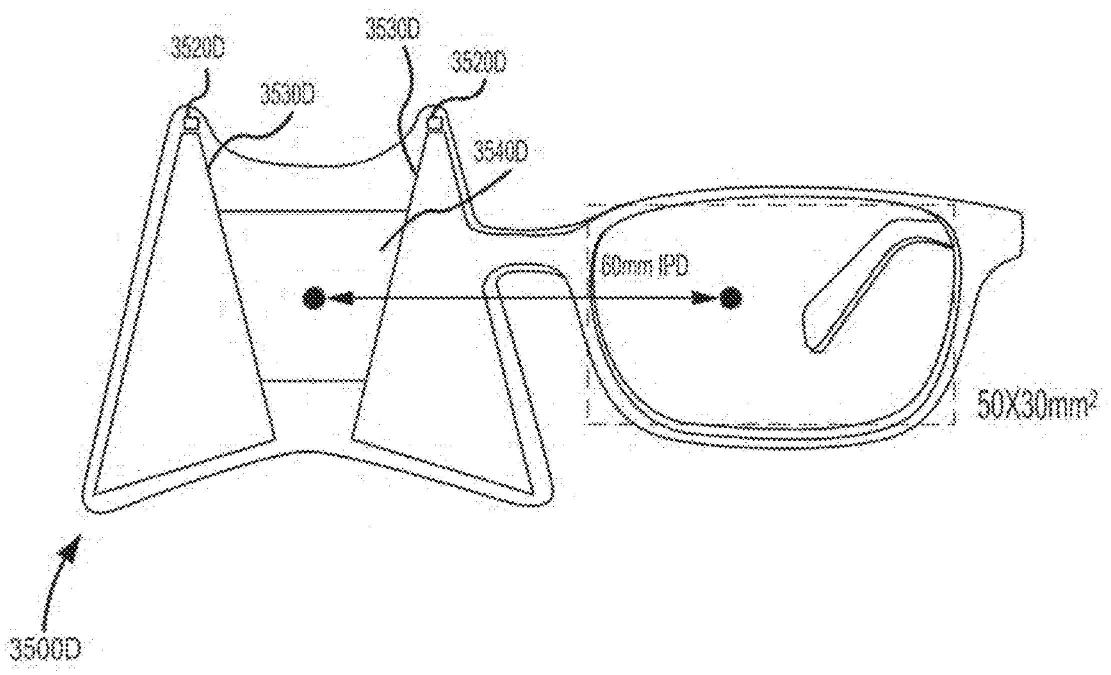
Figure 35E:
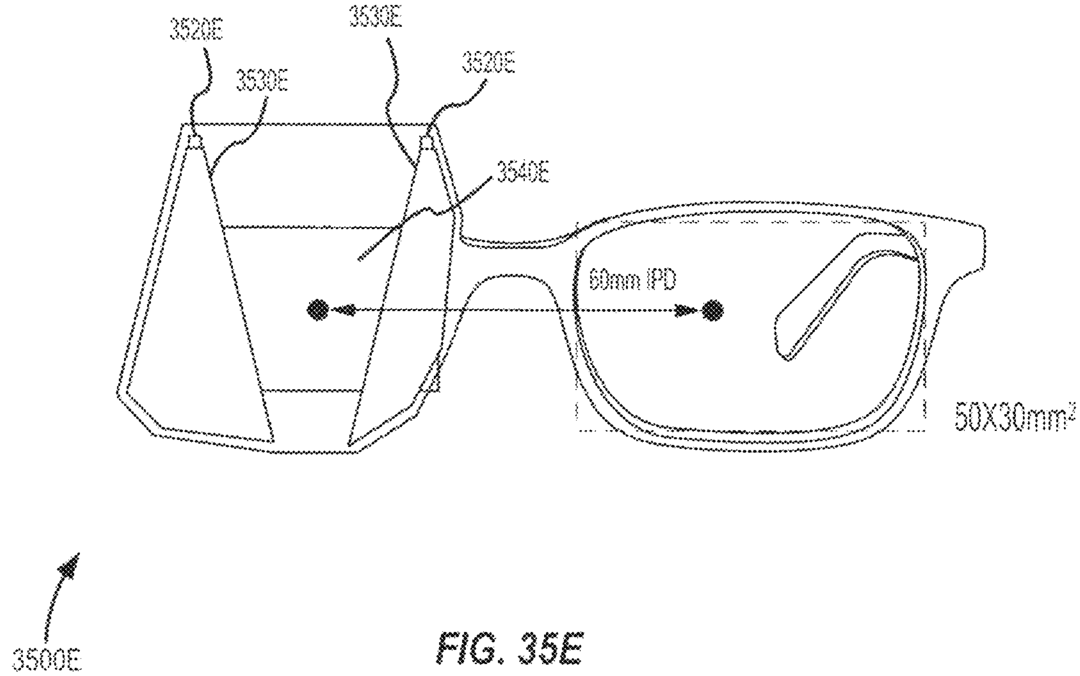
Figure 35F:
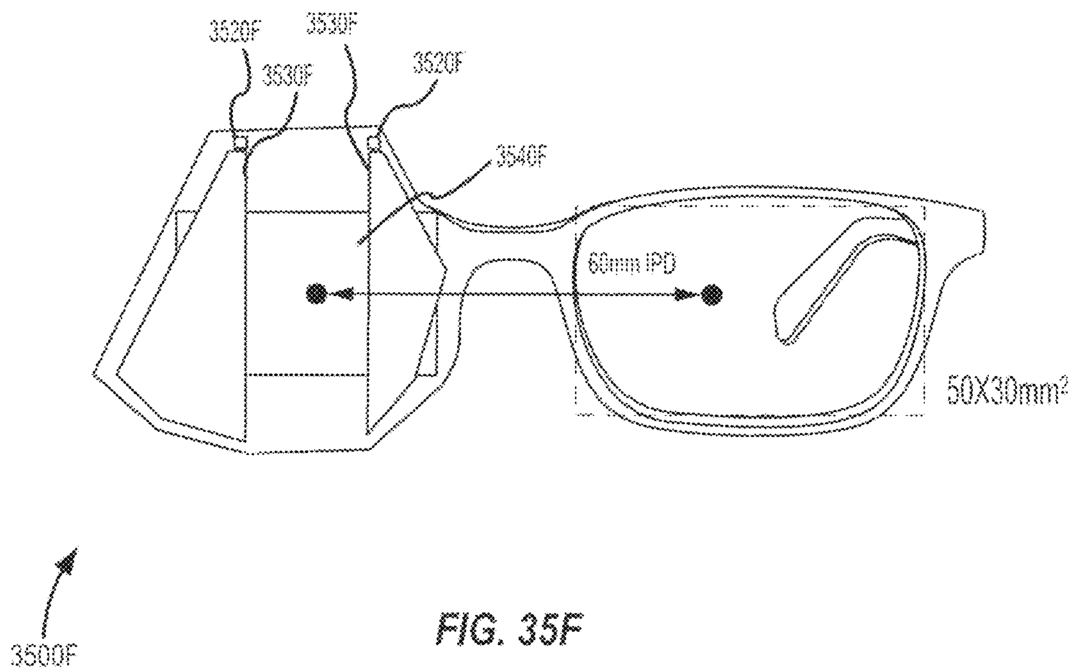
Figure 35G:
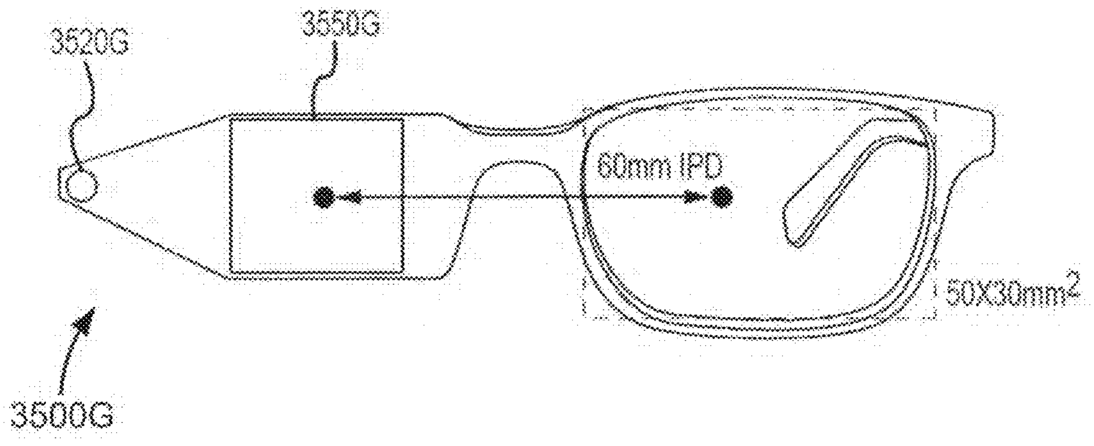
Figure 35H:
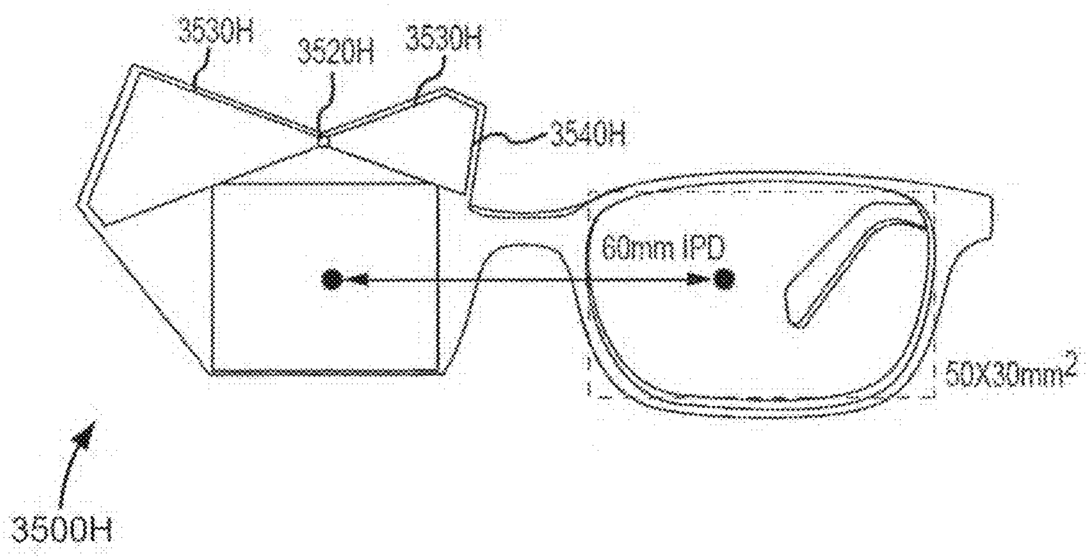
Figure 35I:
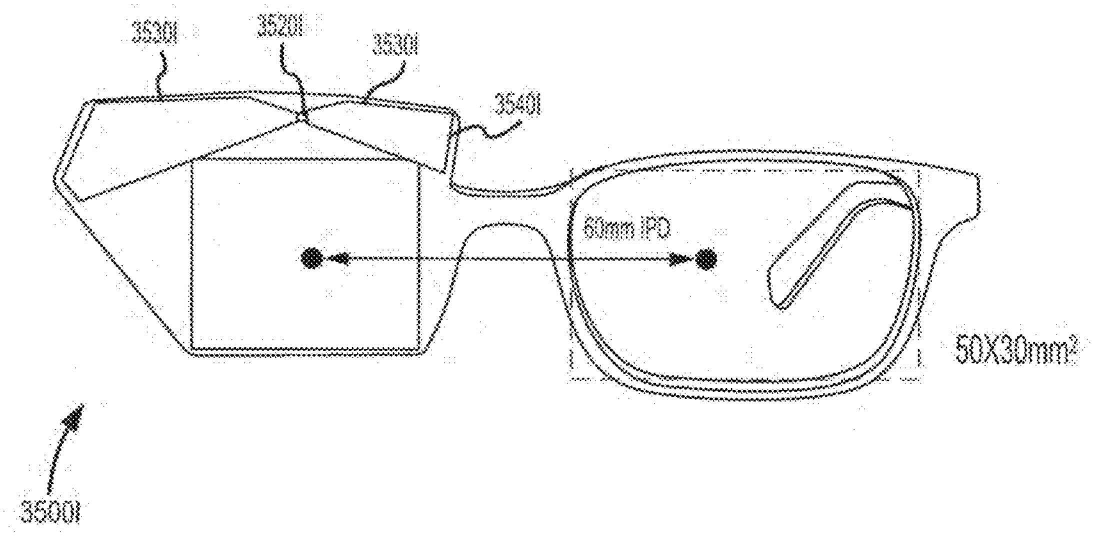
Figure 35J:
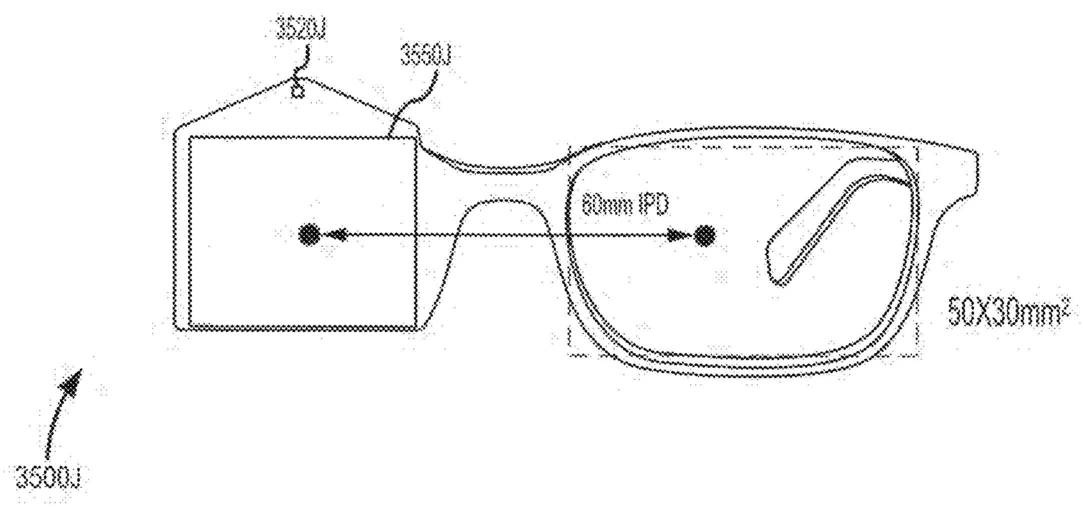

FIG. 34B illustrates a side view of the waveguide 3400 and the light path 3428 shown in FIG. 34A according to an embodiment of the present invention. In some embodiments, the first OPE grating 3451 and the second OPE grating 3452 are disposed on or within the same side of the substrate 3402 such that they are superimposed onto each other, forming a 2D grating on one side of the substrate 3402. In some embodiments, the EPE grating 3453 is disposed on the opposite side of the substrate 3402, forming a 1D grating. As the incoupled light (denoted as 3428B) propagates toward the gratings 3451, 3452, and 3453, it may reflect multiple times off of one or both of the bottom side and the top side of the substrate 3402. In some instances, when the rays of the incoupled light are diffracted in the +y-direction by the first OPE grating 3451 and in the −y-direction by the second OPE grating 3452, they may propagate across the substrate 3402 in the −z-direction (as shown by paths 3428C and 3428E, respectively).

FIGS. 35A-35J illustrate various designs of waveguides 3500 for implementation in an eyepiece according to an embodiment of the present invention. Each of the waveguides 3500 may be similar to one or more embodiments described herein, and may include, for example, one or more ICGs 3520, one or more OPEs 3530, an EPE 3540, and/or a combined OPE/EPE region 3550. For example, the waveguides 3500A, 3500B, and 3500C (illustrated in FIGS. 35A, 35B, and 35C, respectively) each include a single ICG 3520 positioned vertically above and to the side of the EPE 3540 such that the OPE 3530 diffracts light at an angle toward the EPE 3540. In the waveguide 3500A, the OPE 3530A may partially overlap the EPE 3540A, whereas the OPE may not overlap the EPE in the waveguides 3500B and 3500C. The waveguides 3500D, 3500E, and 3500F (illustrated in FIGS. 35D, 35E, and 35F) each include two ICGs 3520 positioned vertically above and to each of the two sides of the EPE 3540, and also include two OPEs 3530 positioned along the two sides of the EPE 3540. The OPEs 3530 may each diffract the incoupled light inward toward the EPE 3540. The waveguide 3500E may correspond to a cropped version of the waveguide 3500D.

The waveguide 3500G (illustrated in FIG. 35G) may include a single ICG 3520G positioned laterally to the side of a combined OPE/EPE region 3550G, similar to the waveguide 3300 described in reference FIGS. 33A-33D and/or the waveguide 3400 described in reference to FIGS. 34A and 34B. The waveguides 3500H and 35001 (illustrated in FIGS. 35H and 351, respectively) each include a single ICG 3520 positioned vertically above the EPE 3540 and two OPEs 3530 positioned vertically above and to the sides of the EPE 3540. The waveguide 3500I may correspond to a cropped version of the waveguide 3500H. The waveguide 3500J (illustrated in FIG. 35J) may include a single ICG 3520J positioned vertically above a combined OPE/EPE region 3550J, similar to the waveguide 3300 described in reference FIGS. 33A-33D and/or the waveguide 3400 described in reference to FIGS. 34A and 34B, with a rotation by 90 degrees.

Optical Systems

An image projector is an optical device that may project an image (or moving images) for a user to view. Recently, innovations have allowed a head-mounted device (i.e., a near-to-eye display device) to include an image projector. Such image projectors can project images to the eyes of a user wearing the head-mounted device. However, such head-mounted devices may cause wave interference-based image artifacts and patterns.

Figure 37:
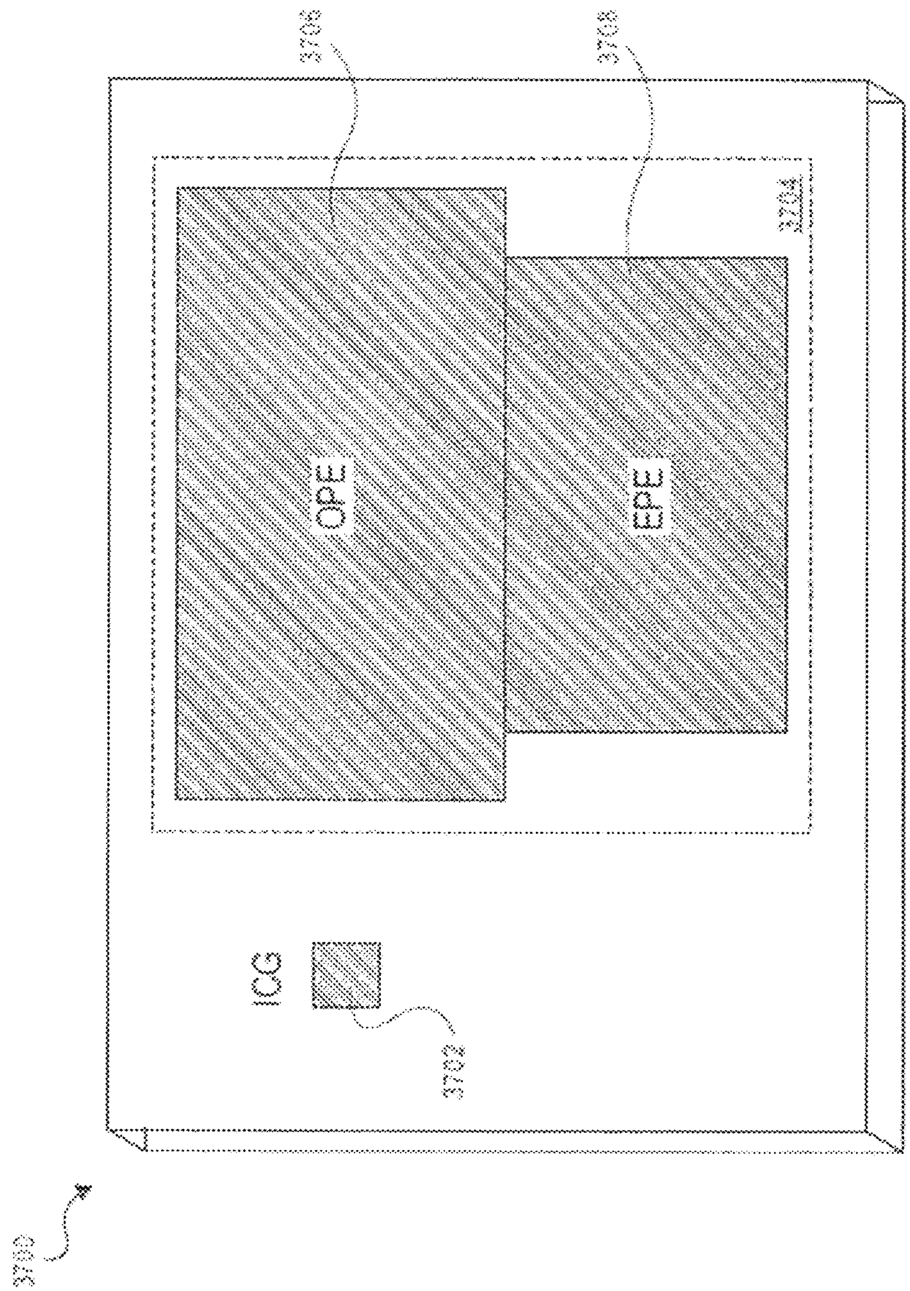
FIG. 37 is a schematic diagram of an exemplary optical system using diffractive structures on a substrate according to some embodiments of the present invention.

FIG. 37 shows an example optical system 3700 using diffractive structures, e.g., diffraction gratings on or in a substrate, e.g., a waveguide. The optical system 3700 can be used for virtual and augmented reality applications. In some implementations, the optical system 3700 has an eyepiece including an in-coupling grating (ICG) element 3702 and a diffractive optical element (DOE) 3704. The eyepiece can be implemented as described in U.S. patent application Ser. No. 14/726,424, entitled "Methods and systems for generating virtual content display with a virtual or augmented reality apparatus", filed on May 29, 2015, which is hereby incorporated by reference in its entirety.

The ICG 3702 and DOE 3704 can be implemented in or on a substrate 3710. The substrate 3710 can be made of glass, polymer, or crystal. In some cases, the substrate 3710 is transparent. In some cases, the substrate 3710 can be also semi-transparent. In some implementations, the substrate 3710 includes a slab waveguide. The waveguide can be made of material with a refractive index within a range from about 1.5 to 4. The waveguide can have a thickness of about 100 nm to 1 mm. The waveguide can have any suitable two-dimensional top-view shape, e.g., rectangular, square, circular, or elliptical.

The DOE 3704 can have one or more layers, and each layer can include an orthogonal pupil expansion (OPE) diffractive element 3706 and an exit pupil expansion (EPE) diffractive element 3708. The ICG element 3702 is configured to receive input light beams, e.g., from a projector, and transmit the input light beams to the DOE 3704 in the substrate 3710. As noted above, the substrate 3710 can include a waveguide, and the ICG element 3702 transmits the input light beams into the waveguide that is coupled to the DOE 3704.

In some examples, the input light beams have the following properties: 1) a finite beam with an FWHM (full-width-at-half-maximum) of about 200 nm to 2 mm; 2) a wavelength within a range of about 400 nm to 2 μm; 3) an incident polar angle that enables the input light beams to be totally-internally-reflected inside the waveguide. The polar angle can be within a range from about 35 to 89 degrees; and/or 4) an azimuthal angle that enables the input light beams to propagate within a range from −30 to 30 degrees in the waveguide.

The input light beams can travel in the waveguide by total internal reflection (TIR). The OPE diffractive element 3706 on a layer is configured to deflect some of the input light beams to the EPE diffractive element 3708 that is configured to in turn deflect some of the deflected light beams out of the substrate 3710, e.g., toward a user's eye(s). To get an output image with uniform luminance in the user's eye(s), multiple output deflected light beams from the EPE diffractive element 3708 may have uniform intensity.

The OPE diffractive element 3706 and the EPE diffractive element 3708 can be arranged in co-planar or side-by-side on the same layer. To get light beams out of the substrate, the DOE 3704 is configured to diffract the light beams across the DOE 3704, e.g., with selective distributions of diffraction. In some embodiments, the distribution of diffracted light is substantially uniform. In some embodiments, the amount of diffracted light is variable across a profile of the DOE 3704, e.g., in an increasing gradient or randomized fashion. For example, as the intensity of the light beams decreases when the light beams propagate in the DOE 3704 and are gradually deflected by the OPE diffractive element 3706 and the EPE diffractive element 3708, the diffractive efficiency of the DOE 3704 can be configured to gradually increase along the propagation path of the light beams.

In some implementations, the OPE diffractive element 3706 includes a first diffraction grating positioned along a first direction, e.g., from bottom to top, as shown in FIG. 37. The EPE diffractive element 3708 includes a second diffraction grating positioned along a second direction, e.g., from left to right, as shown in FIG. 37. An angle between the first direction and the second direction can be within a range of 0 to 90 degree. In some cases, the angle is between 45 degree and 90 degree. In some cases, the angle is between 80 degree and 90 degree. In a particular example, the second direction is perpendicular to the first direction. The first diffraction grating can be a diffraction grating with linearly varying depths along the first direction, thus the first diffraction grating can have a gradually increasing diffraction efficiency along the first direction. The second diffraction grating can be a diffraction grating with linearly varying depths along the second direction, thus the second diffraction grating can have a gradually increasing diffraction efficiency along the second direction.

In some implementations, the OPE diffractive element 3706 and the EPE diffractive element 3708 include linear diffractive structures, circular diffractive structures, radially symmetric diffractive structures, or any combination thereof. The OPE diffractive element 3706 and the EPE diffractive element 3708 can include both the linear grating structures and the circular or radially symmetric diffractive elements to both deflect and focus light beams.

The diffractive structures in the DOE 3704 can have periods within a range of from about 50 nm to 500 nm. In some examples, the diffractive structures have periodic oscillation of refractive index that has a dielectric index contrast between 0.1 and 3. In some examples, the diffractive structures can be made of a dielectric material with a periodic metal pattern. The dielectric material can have a refractive index of about 1.5 to 4. In some implementations, the diffractive optical element (DOE) 3704 including the OPE diffractive element 3706 and the EPE diffractive element 3708 has an area of region from about 0.1 $mm^2$ to 1 $m^2$, which can be used for any suitable size display system such as a smaller display system or a larger display system.

As noted above, to get an output image with uniform luminance in the user's eye(s) or other viewing screens, multiple output deflected light beams from the EPE diffractive element 3708 may need to have uniform intensity. The OPE diffractive element 3706 can include a first diffractive structure having a first periodic structure configured to deflect an input light beam propagating in the substrate 3710 into a plurality of output light beams. The output light beams are deflected out of the OPE diffractive element 3706 at respective positions that are spaced from each other. Each of the spaced output light beams can be a result of an interference among multiple coincident light beams that are generated from the input light beam and deflected by the first diffractive structure out from the OPE diffraction element 3706 at the respective position. The output light beams from the OPE diffractive element 3706 are spaced from each other and thus do not interfere with each other. The spaced output light beams enter into the EPE diffractive element 3708 and are further deflected by a second diffractive structure in the EPE diffractive element 3708 and out of the substrate 3710 from respective positions that are also spaced from each other. Thus, the output light beams from the EPE diffractive element 908 are also at different positions in space and incoherent with each other. Accordingly, there is no interference among these output light beams from the EPE diffractive element 3708. Therefore, the properties of the output light beams from the EPE diffractive element 3708 can substantially depend on the properties of the output light beams from the OPE diffractive element 3708.

Figure 43:
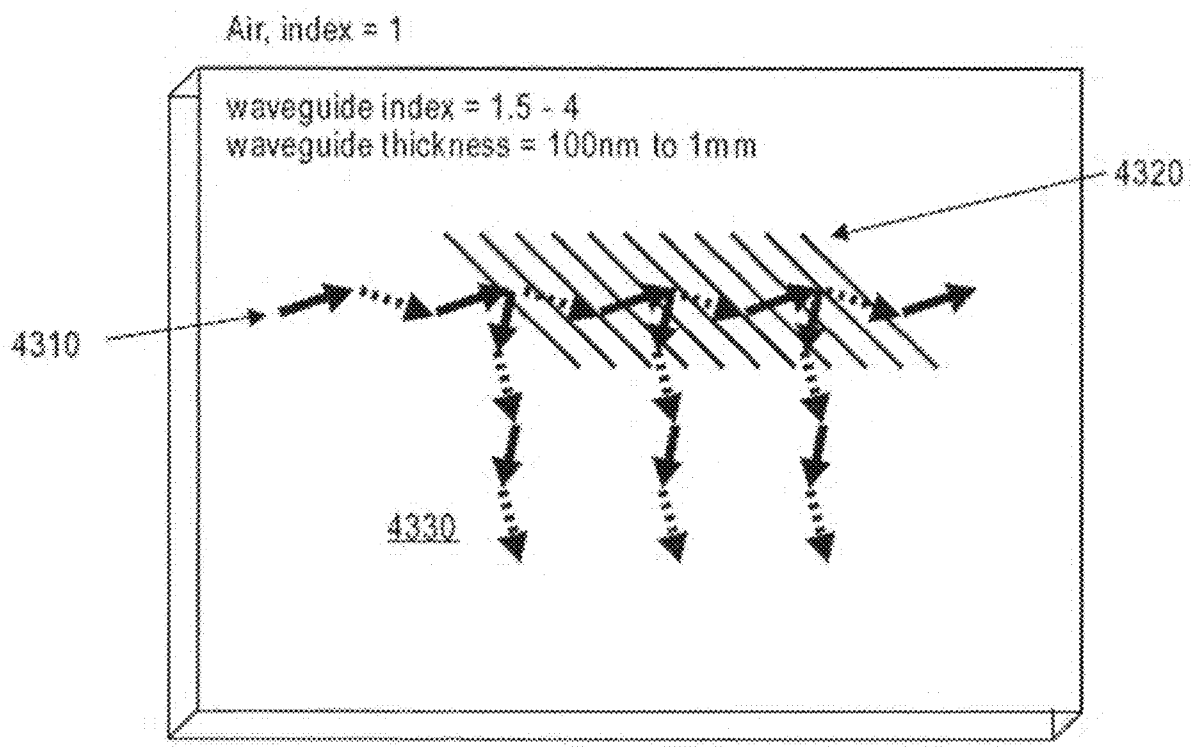
FIG. 43 is a schematic diagram of light diffracted in an example device including a diffractive structure in a waveguide according to some embodiments of the present invention.
Figure 44A:
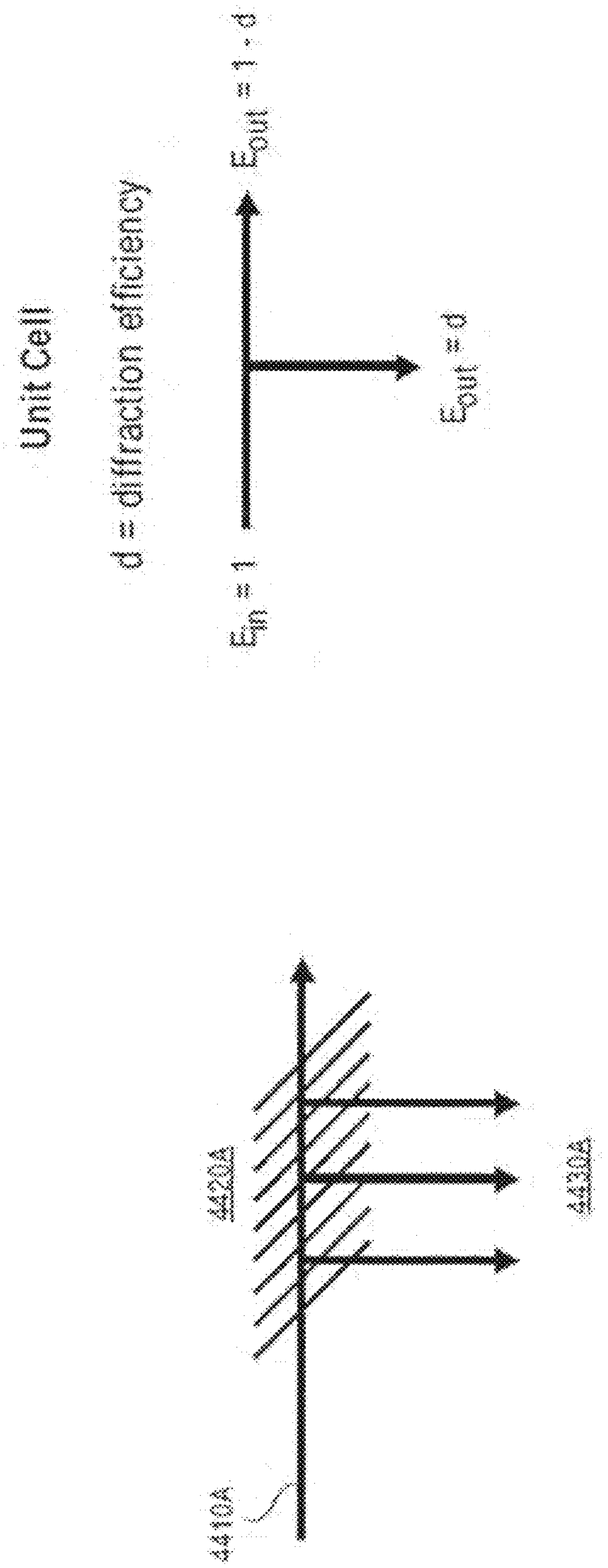
FIG. 44A is a simplified diagram illustrating light paths through a beam multiplier according to some embodiments of the present invention.

In some implementations, diffractive structures in the OPE diffractive element 3706 have a periodic structure which may manipulate amplitudes of output diffracted light beams, without manipulating phases of the output diffracted light beams, e.g., as illustrated in FIGS. 43 and 44A. In these cases, for each of the output light beam, there may exist constructive interference or destructive interference among the respective multiple coincident light beams forming the output light beam.

Dithering

A diffractive waveguide may include uniform gratings in the OPE. An ideal output image has constant luminance. Because the gratings in the OPE are uniform, however, the actual output image may have non-uniform luminance.

Figure 38:
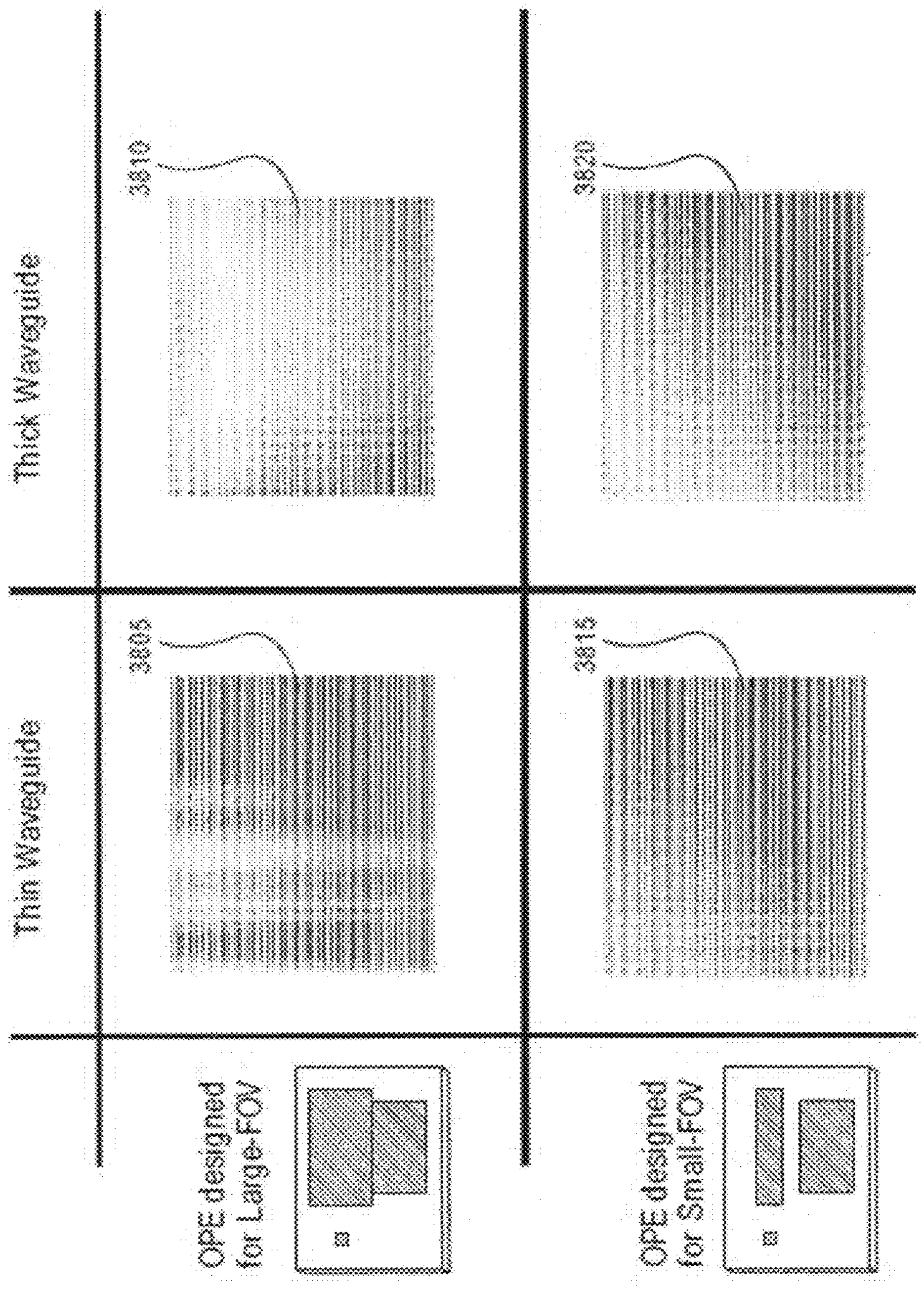
FIG. 38 shows photographs of electric field intensity exhibiting wave interference for different fields-of-view and different thicknesses of waveguides according to some embodiments of the present invention.

FIG. 38 illustrates simulated electric field intensities in the exit pupil expander (EPE) exhibiting wave interference caused by uniform grating in the OPE. Electric field intensity 3805 is observed as a result of a thin waveguide and an OPE designed for large field-of-view (e.g., 40 degrees by 40 degrees). As can be seen from electric field intensity 3805, bad luminance artifacts can be observed, as well as strong wave interference. Electric field intensity 3810 is observed as a result of a thick waveguide and an OPE designed for large field-of-view. The thick waveguide exhibits weak wave interference. Electric field intensity 3815 is observed as a result of a thin waveguide and an OPE designed for small field-of-view (e.g., 5 degrees by 5 degrees). The thin waveguide exhibits strong wave interference. Electric field intensity 3820 is observed as a result of a thick waveguide and an OPE designed for small field-of-view. The thick waveguide exhibits weak wave interference.

The simulated results in FIG. 38 show that using thinner waveguide as the substrate causes stronger wave interference than using thicker waveguide. The simulated results in FIG. 38 also show that an OPE diffractive element designed for a larger FOV, e.g., a longer width along Y axis, causes stronger wave interference than an OPE diffractive element designed for a smaller FOV, e.g., a shorter width along Y axis. The OPE designed for larger FOV with thinner waveguide as the substrate causes the strongest wave interference among the four scenarios shown in FIG. 38. A strong wave interference in the electric field intensity can cause luminance artifacts or non-uniformity on a viewing screen, e.g., a user's eye(s), which may affect the performance of the optical system. In other words, the wave interference problem is worst in large field-of-view, ultra-thin displays, which are most desirable for see-through mixed-reality displays.

The wave interference may be decreased, and luminance uniformity of the output image may be increased, for example, by creating patterns in the grating on the waveguide. These patterns improve diffusion of light, thus increasing uniformity in the output image. For example, a beam splitter may be used to split a laser beam into two component beams while preserving path length. If the two component beams are recombined, destructive interference results and the two beams cancel each other out. This approach may be used to create a luminance modulator. However, by even making a very subtle change in the path length of one laser beam with respect to the other, the two beams can be brought into perfect phase, or 90 degrees out of phase so that they cancel each other out.

A Mach-Zehnder interferometer manipulates the path length of one beam to vary the intensity of the output beam (i.e., the recombined beam). With uniform 45 degree grating, the OPE acts as a Mach-Zehnder structure because the rays are stair stepping through the OPE and propagating along the OPE. In other words, a plurality of cloned beams are created that all have a phase relationship to one another, and that all came from the same original emitter. An arbitrary beam that is flowing down into the EPE from the OPE is actually a composite of multiple diffracted beams that have come to that point through independent paths. Some of the beams have stair stepped through the OPE, and some of them have gone straight across the OPE and taken a right angle turn downward. Those beams are recombining as they propagate downward.

One method of breaking up the symmetry of the OPE is to dither the OPE structure itself. One exemplary dither is a sinusoidal dither of the structure across space. A structured variation may be created by changing the etch depth of the OPE so that at the low points, the etch depth would be very narrow, and at the high points, there would be full etch depth, thus increasing the fraction efficiency.

For illustration purposes only, in the following, examples of phase perturbation methods by adding phase variation patterns to diffractive structures, e.g., diffraction gratings, of the OPE diffractive element are illustrated to improve luminance uniformity and/or eliminate luminance artifacts for the optical system. The phase variation patterns have periods substantially larger than periods of the OPE gratings. For example, the periods of the OPE gratings can be within a range from about 50 nm to 500 nm, and the periods of the phase variation patterns can be within a range from about 100 μm to 5 cm in some embodiments.

Figure 39A:
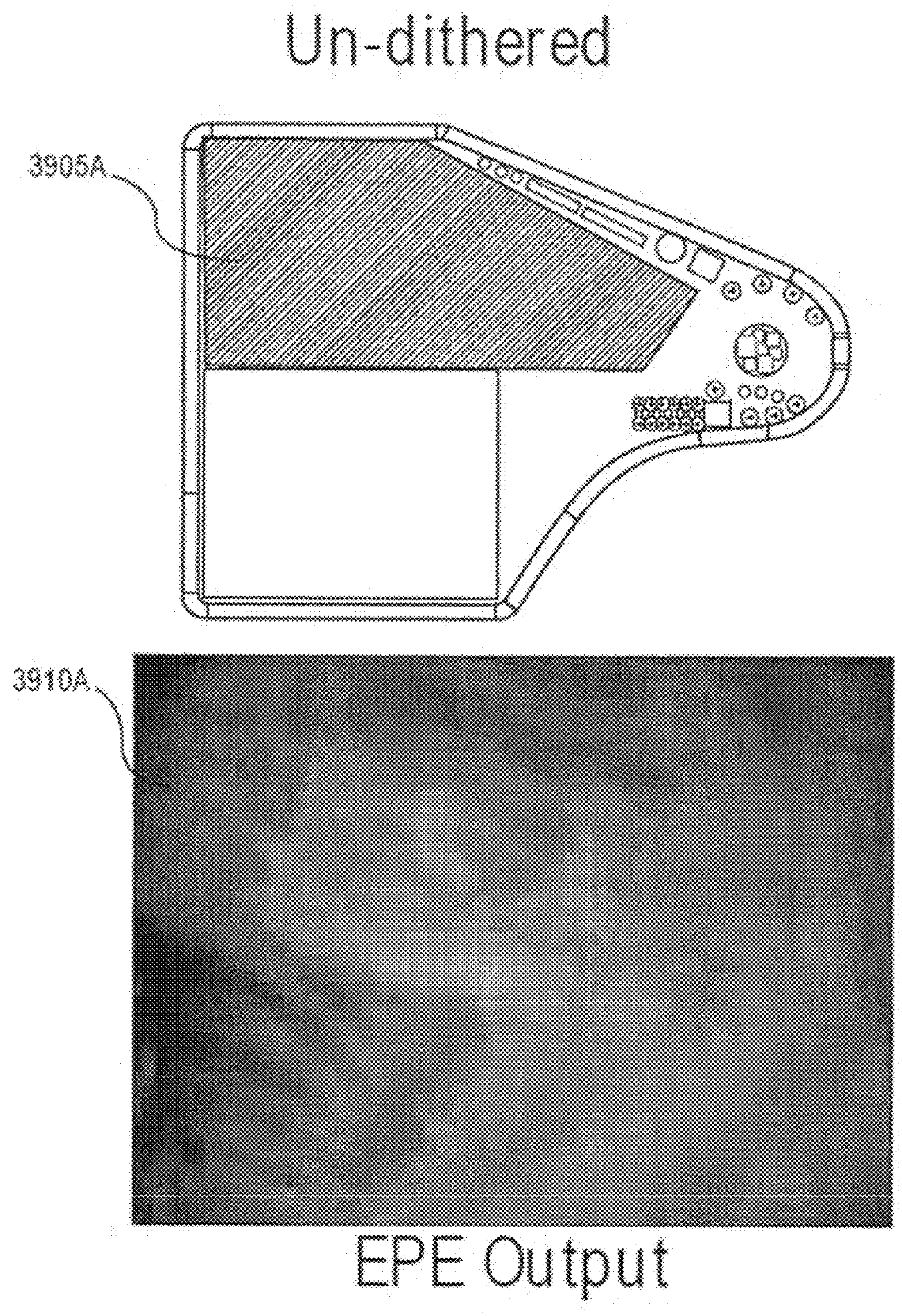
FIG. 39A is a simplified diagram illustrating an undithered OPE and its output image according to some embodiments of the present invention.
Figure 39B:
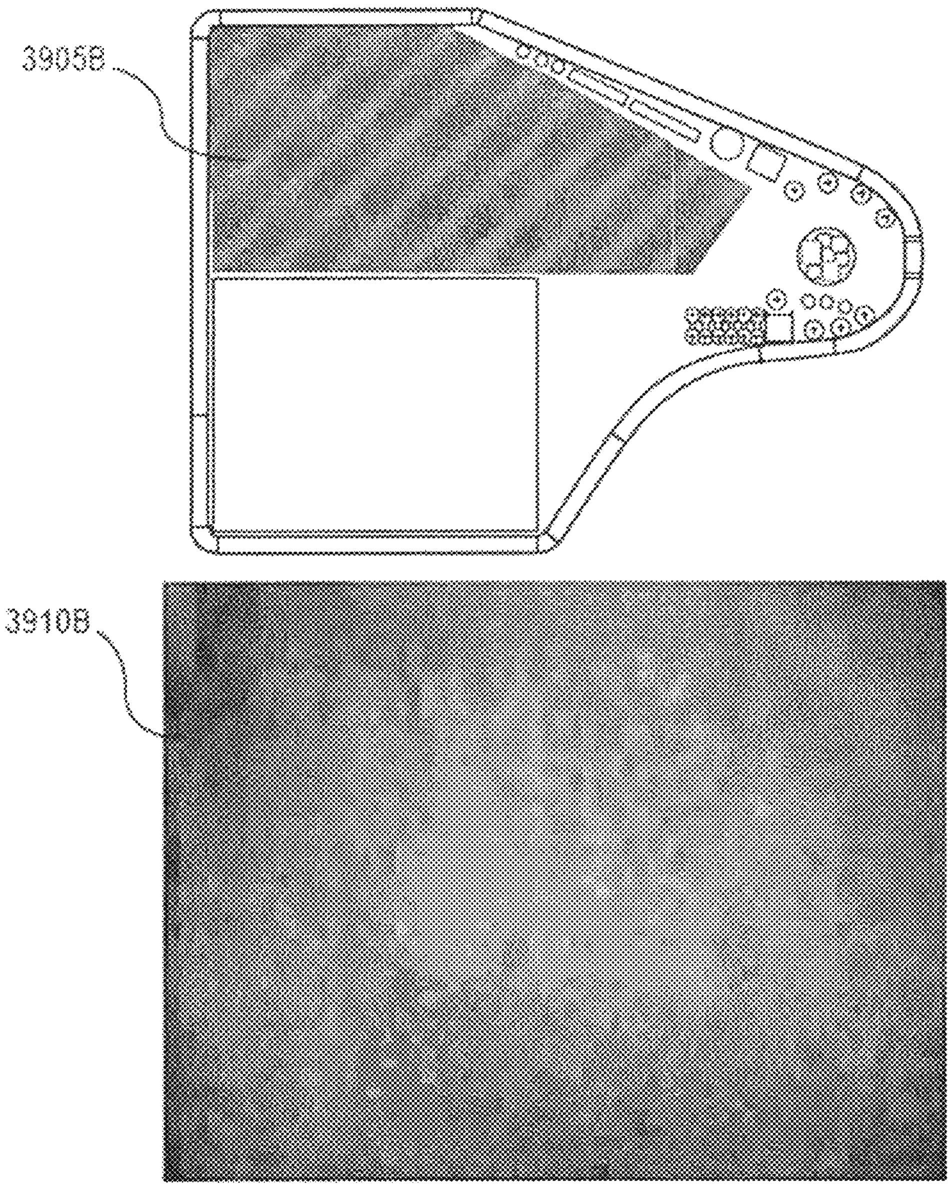
FIG. 39B is a simplified diagram illustrating a sinusoidally dithered OPE and its output image according to some embodiments of the present invention.
Figure 39C:
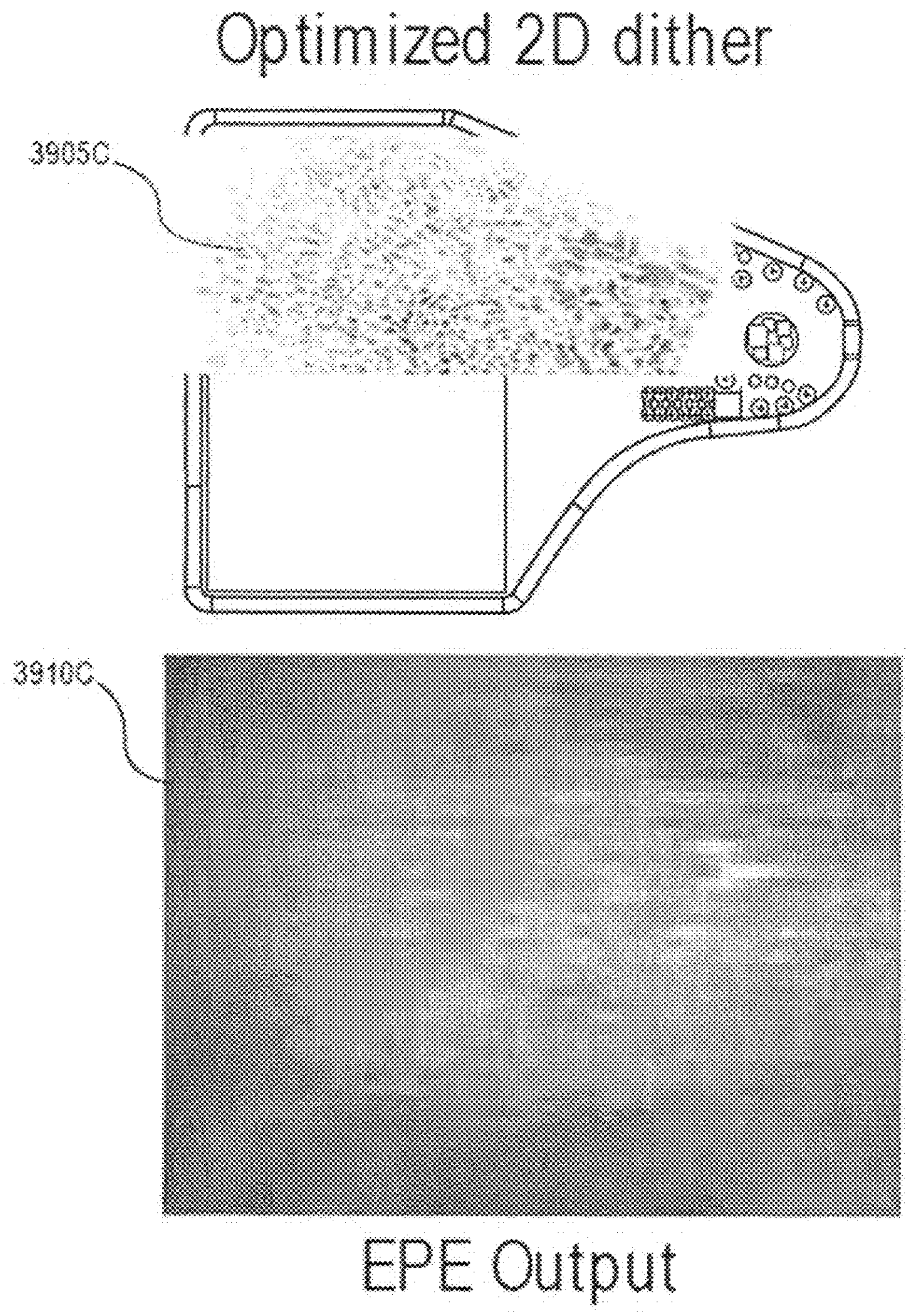
FIG. 39C is a simplified diagram illustrating an optimized 2D-dithered OPE and its output image according to some embodiments of the present invention.
Figure 39D:
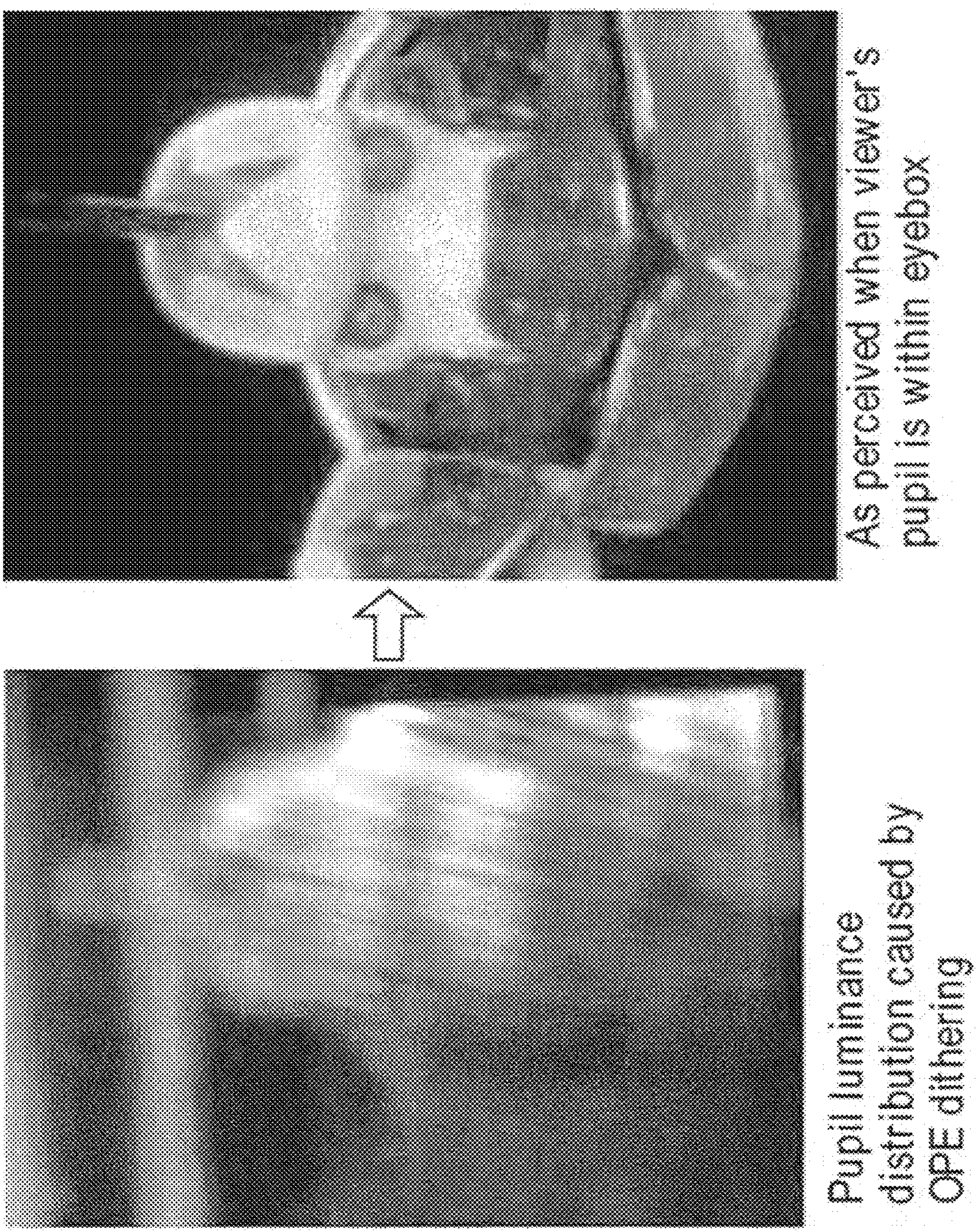
FIG. 39D shows photographs comparing an image with many artifacts and an image with fewer artifacts according to some embodiments of the present invention.

FIG. 39A illustrates an undithered OPE 3905A and the output image 3910A from the undithered OPE 3905A. The output image 3910A has a fair amount of nonuniformity including some odd striation patterns. Ideally, the output image should be uniform. FIG. 39B illustrates an OPE with a sinusoidal dither 3905B and the output image 3910B from the dithered OPE 3905B. The output image 3910B has improved luminance uniformity. FIG. 39C illustrates an OPE with an a semi-randomized (e.g., optimized) 2D dither 3905C and the output image 3910C from the dithered OPE 3910C. The output image 3910C also has increased overall luminance uniformity. FIG. 39D illustrates that if the viewer is well-centered within the eyebox, then the viewer will not observe any or a reduced number of artifacts associated with the dither. In some embodiments, the dither may be selected considering a trade-off between luminance uniformity and final sharpness of the image, as well as contrast efficiency.

Figure 40A:
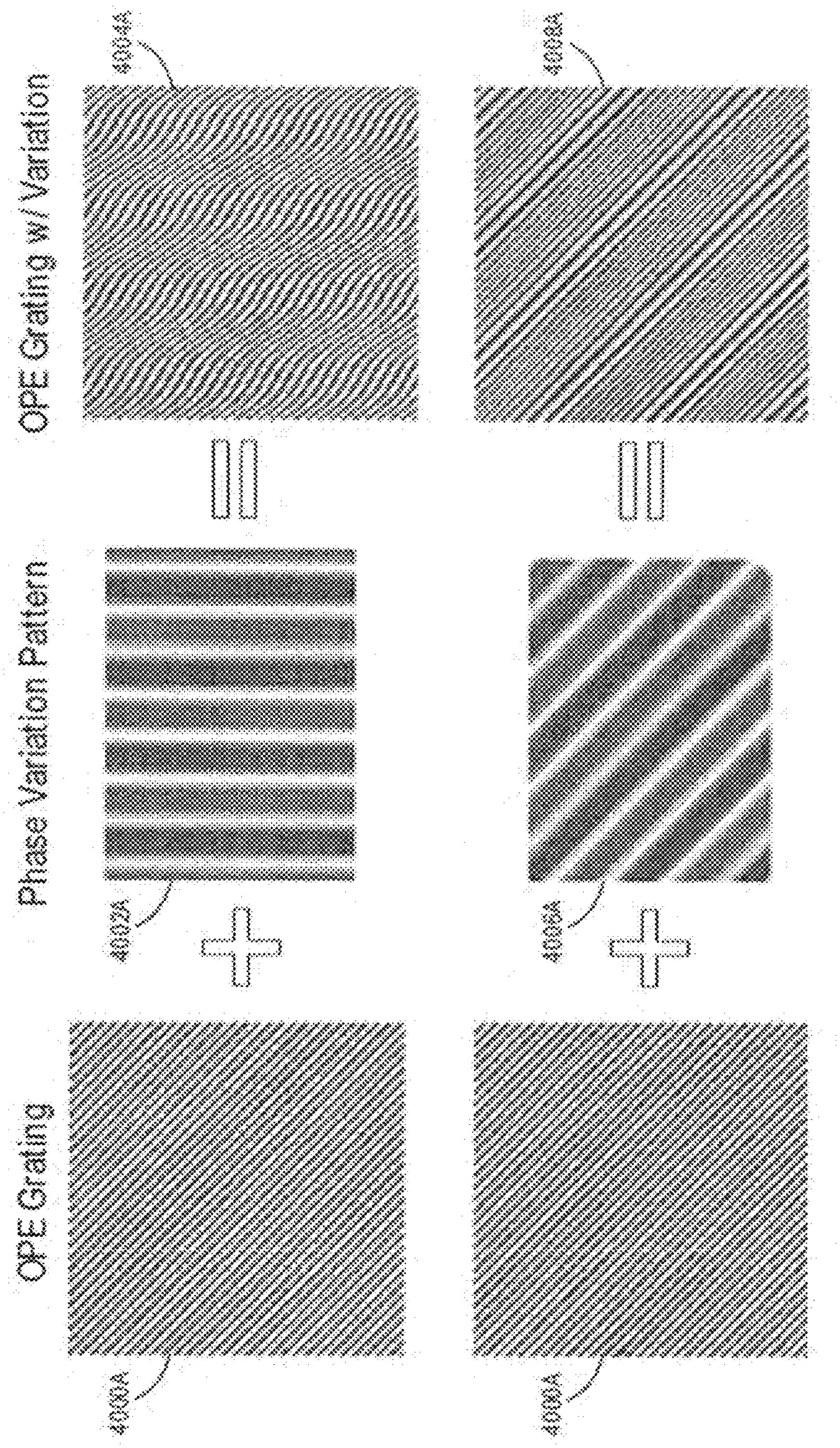
FIG. 40A shows an example of adding continuous phase variation patterns to a diffractive structure according to some embodiments of the present invention.

FIG. 40A shows an example of adding continuous phase variation patterns to a diffractive structure, e.g., a diffraction grating, of the OPE diffractive element, that is, an OPE grating 4000A. The OPE grating 4000A has a periodic structure longitudinally extending along a first direction. Pattern 4002A is an example continuous phase variation pattern that has a periodic pattern longitudinally extending along a second direction. There is an angle between the first direction and the second direction. When the phase variation pattern 4002A is added to the OPE grating 4000A, the OPE grating 4000A becomes grating 4004A that has a wave-like grating shape and is different from the OPE grating 4000A.

Pattern 4006A is another example continuous phase variation pattern that has a periodic pattern longitudinally extending along a third direction. The third direction is substantially parallel to the first direction. When the phase variation pattern 4006A is added to the OPE grating 4000A, the OPE grating 4000A becomes grating 4008A that has a modulated grating structure and is different from the OPE grating 4000A.

Figure 40B:
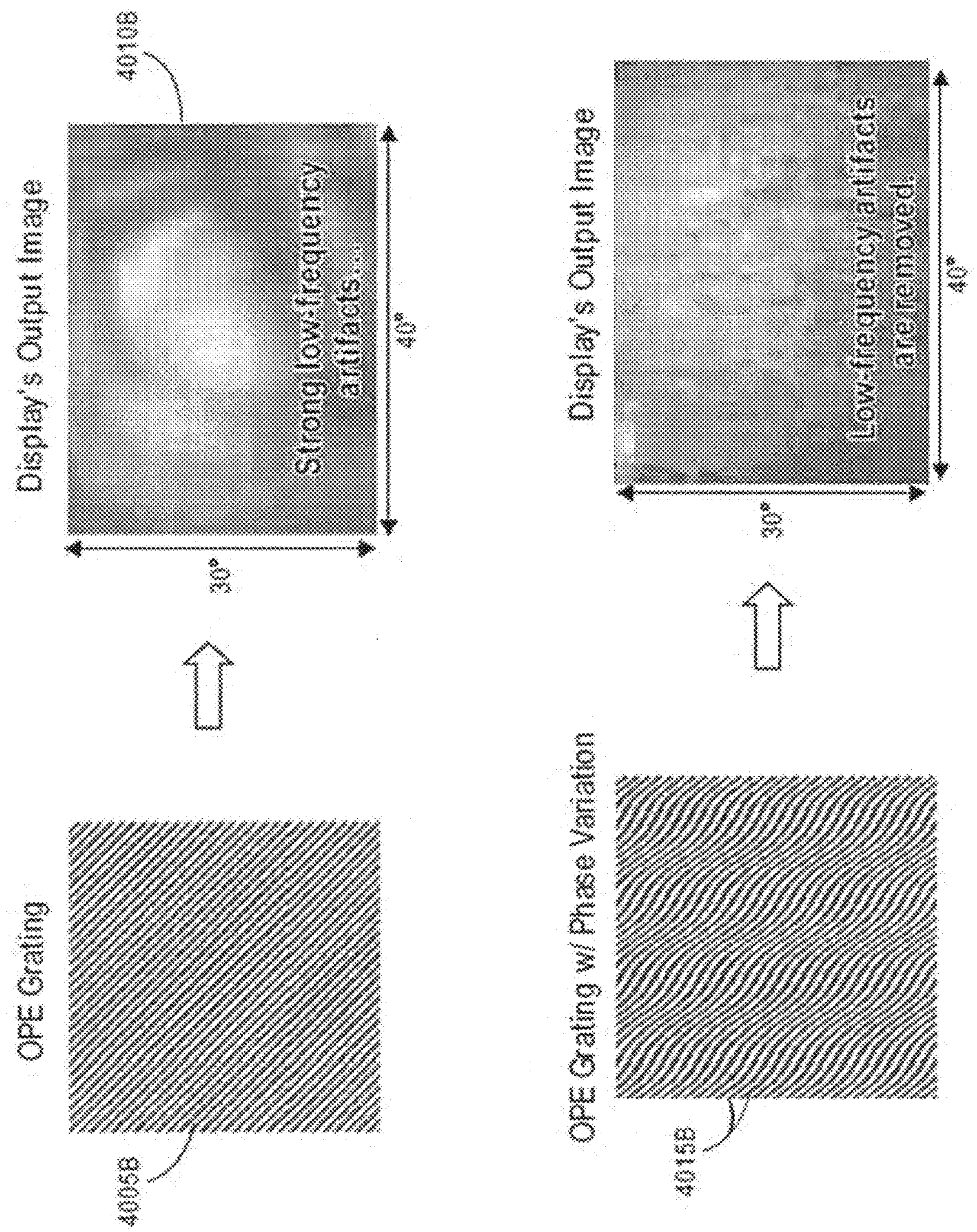
FIG. 40B shows output images from an optical system having a diffractive structure without and with phase variations according to some embodiments of the present invention.

FIG. 40B illustrates, at top, an undithered OPE 4005B and the output image 4010B from the undithered OPE 4005B. The undithered OPE 4005B may have, for example, a binary multi-level grating. The output image 4010B has strong low-frequency artifacts and/or luminance non-uniformity.

FIG. 40B illustrates, at bottom, a dithered OPE 4015B and the output image 4020B from the dithered OPE 4015B. The dithered OPE 4015B has low frequency spatial variation of grating angle (i.e., rotation of the grating as opposed to tilt) and pitch. Thus, the output image 4020B has less low frequency artifacts and the luminance uniformity is substantially improved when the phase modulated, dithered OPE 4015B is implemented in the optical system.

Figure 40C:
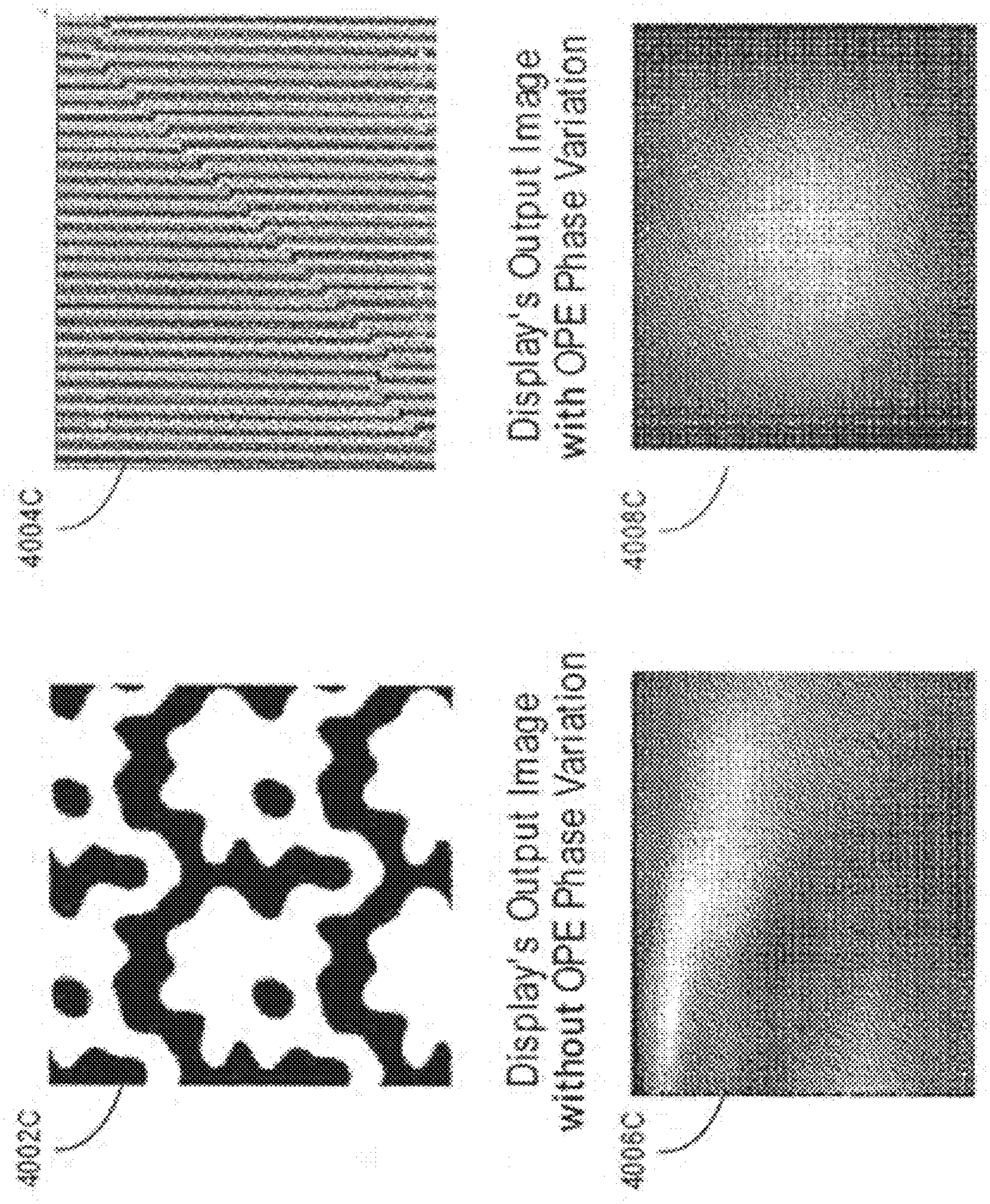
FIG. 40C shows an example of adding a discrete phase variation pattern to a diffractive structure according to some embodiments of the present invention.

FIG. 40C shows an example of adding discrete phase variation pattern 4002C to a diffractive structure, e.g., a diffraction grating, of the OPE diffractive element, that is, the OPE grating. When the discrete phase variation pattern 4002C is added to the OPE grating, the OPE grating becomes grating 4004C that has a changed structure and is different from the periodic structure of the OPE grating 4000A.

Image 4006C shows the output image from the optical system having the OPE grating without phase variation, while image 4008C shows the output image from the optical system having the modulated OPE grating 4004C with phase variation. The two images show that low-frequency artifacts can be substantially removed or eliminated by adding phase variation to the periodic structure of the OPE grating and luminance uniformity can be also substantially improved.

In some implementations, the OPE diffractive element includes a phase-dithered grating. The EPE diffractive element can also include a phase-dithered grating. In some implementations, phase perturbations or variation methods, e.g., those for the OPE diffractive element, are also implemented in diffractive structures of the EPE diffractive element to improve luminance uniformity and/or eliminate luminance artifacts for the optical system.

Exemplary Phase Variation Patterns

Phase variations (or perturbations) within diffractive regions (e.g., a periodic structure) of a diffractive structure, e.g., a diffractive beam multiplier or a diffraction grating, can be achieved by implementing a phase variation pattern into the diffractive regions of the diffractive structure. As discussed in further detail herein, the phase variation pattern can be designed or determined based on properties and/or performance of the diffractive structure. The phase variation pattern can have a substantially larger period than a period of the diffractive structure. In some examples, a diffraction grating has a grating period within a range from about 50 nm to 500 nm, while the phase variation pattern has a period within a range from about 100 μm to 5 cm.

Figure 41A:
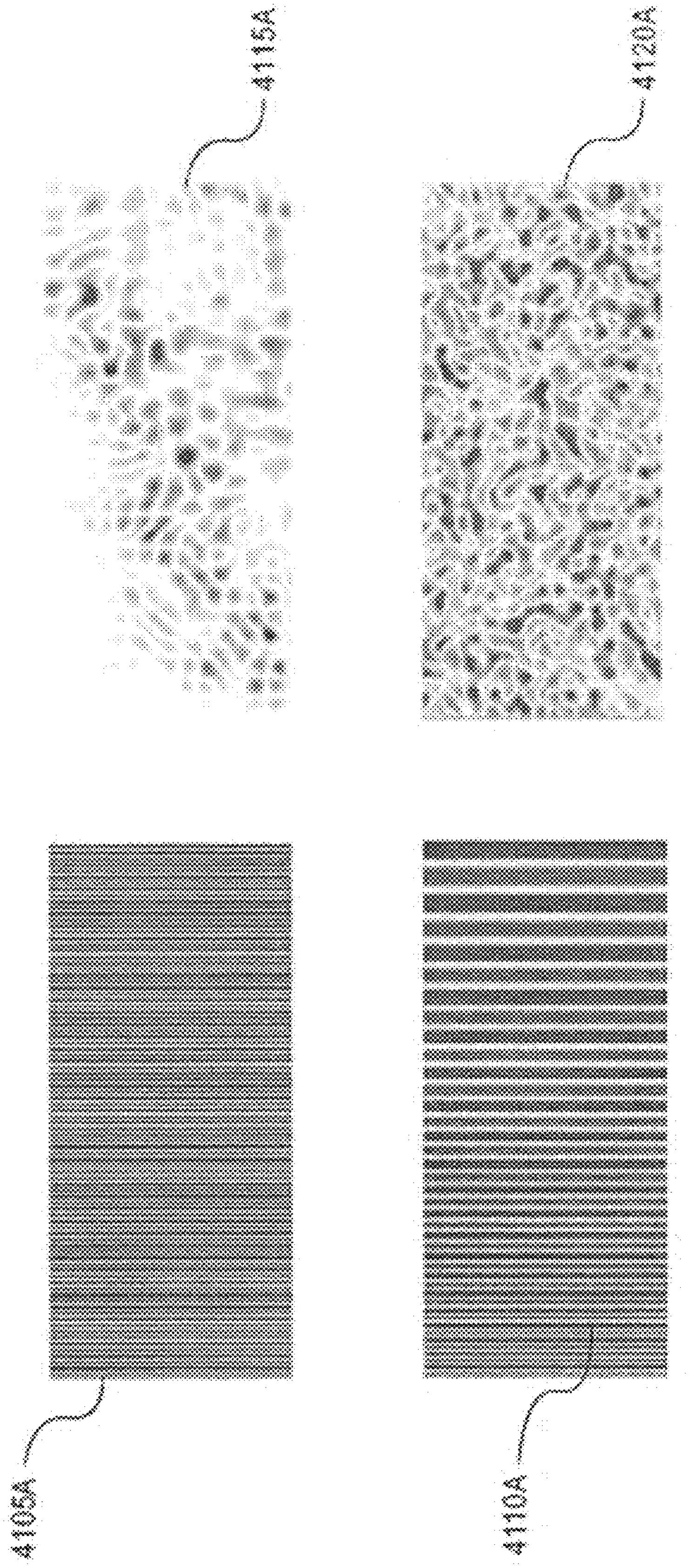
FIG. 41A show simplified diagrams illustrating different slowly-varying dither patterns for gratings according to some embodiments of the present invention.

FIG. 41A illustrates slow variation patterns that may be used to create dithering in grating structures according to some embodiments of the invention. Slow variation may be, for example, 20 nm variation over 1 mm, or variation less than 0.02%. Variation pattern 4105A illustrates periodic dithering in a grating structure that includes alternating pairs of first and second portions that cause different phase variations or perturbations on the periodic structures. Each pair has the same periods. The first and second portions can have the same width and/or length. Variation pattern 4110A illustrates graded periodic dithering in a grating structure. Compared to variation pattern 4105A, the phase variation in variation pattern 4110A has an increased period along a direction, e.g., from left to right. Variation pattern 4115A illustrates computationally optimized dithering in a grating structure. Different portions of the pattern may cause different phase variations or perturbations on the periodic structures. This pattern can be designed and/or generated by phase attributable algorithms or computational holography. In some examples, the optimized phase variation pattern is a computational hologram. Variation pattern 4120A illustrates random dithering in a grating structure. The random pattern can be designed and/or generated by random algorithms. The random pattern can act as a diffuser.

Figure 41B:
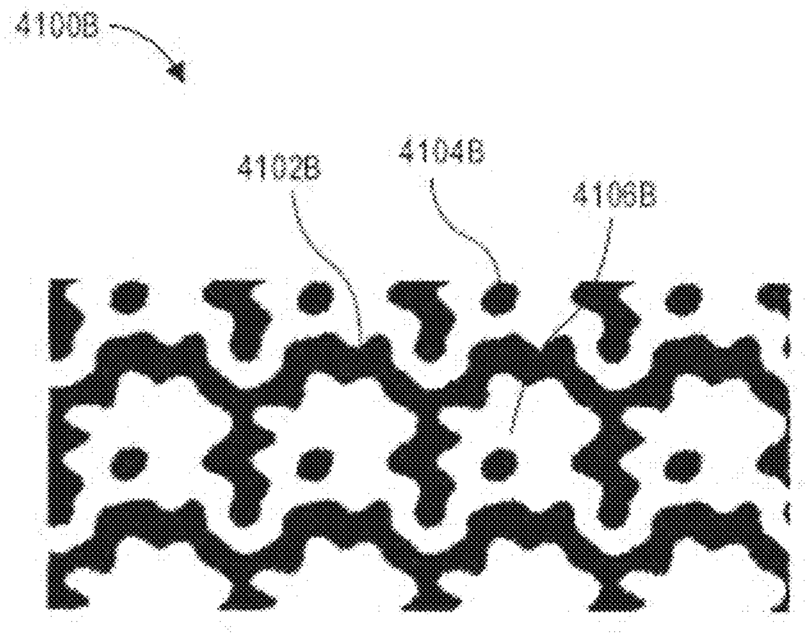
FIGS. 41B-C show different types of discrete phase variation patterns that can be implemented in diffractive structures according to some embodiments of the present invention.
Figure 41C:
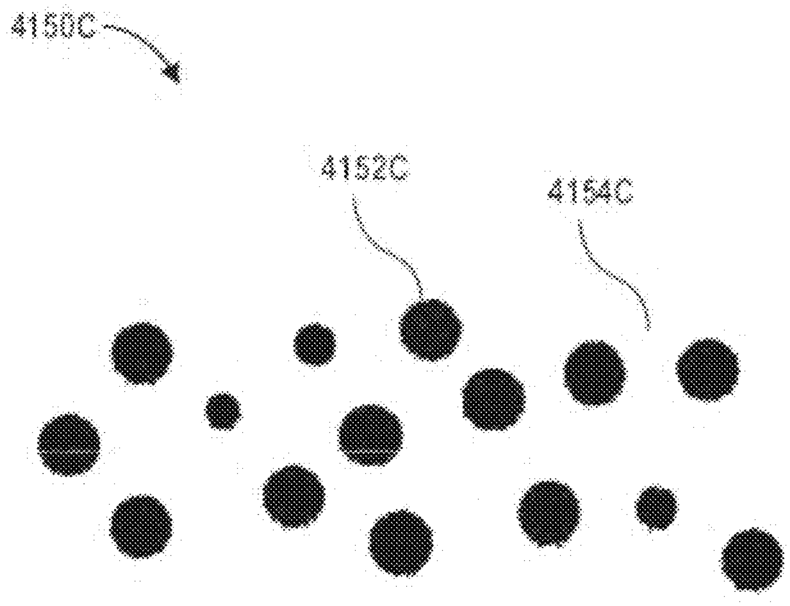

FIGS. 41B-C illustrate different types of discrete phase variation patterns that can be implemented in diffractive structures to cause phase variations or perturbations on part of periodic structures of the diffractive structures, thereby affecting phase shifts of light beams diffracted by the part of the periodic structures. Different from continuous phase variation patterns, the discrete phase variation patterns include portions that cause no phase variation or perturbation on some part of the periodic structure and portions that cause phase perturbation on the other part of the periodic structure.

FIG. 41B shows an example discrete phase variation pattern 4100B that includes first pattern portions 4102B and second pattern portions 4104B and a blank portion 4106B. The first pattern portions 4102B and second pattern portions 4104B can cause phase perturbations on the periodic structure, while the blank portions 4106B cause no phase perturbation on the periodic structure. Each of the first pattern portions 4102B can be discrete or separated from each other, each of the second pattern portions 4104B can be discrete or separated from each other. Each of the first pattern portions 4102B can be separated from each of the second pattern portions 4104B.

FIG. 41C shows another example discrete phase variation pattern 4150C that includes a plurality of discrete pattern portions 4152C and one or more blank portions 4154C. The discrete pattern portions 4152C can include different or same sizes of circles or other shapes that can cause phase perturbations on the periodic structure.

Besides implementing a phase variation pattern into a periodic structure of a diffractive structure, phase variations or perturbations within the periodic structure of the diffractive structure can be also achieved by other phase variation methods. These methods can be used individually or in any suitable combinations with each other and/or with any suitable phase variation pattern to implement the phase variations or perturbations on the periodic structure of the diffractive structure.

In some implementations, freeform diffractive lens are used for the diffractive structure, e.g., positioned before and/or after the diffractive structure or within the diffractive structure. The diffractive lens can include small angular variations, e.g., up to ±⅓ degree, and/or small pitch variations, e.g., up to ±1%, which may cause phase perturbations on light beams diffracted by the periodic structure of the diffractive structure.

Figure 42A:
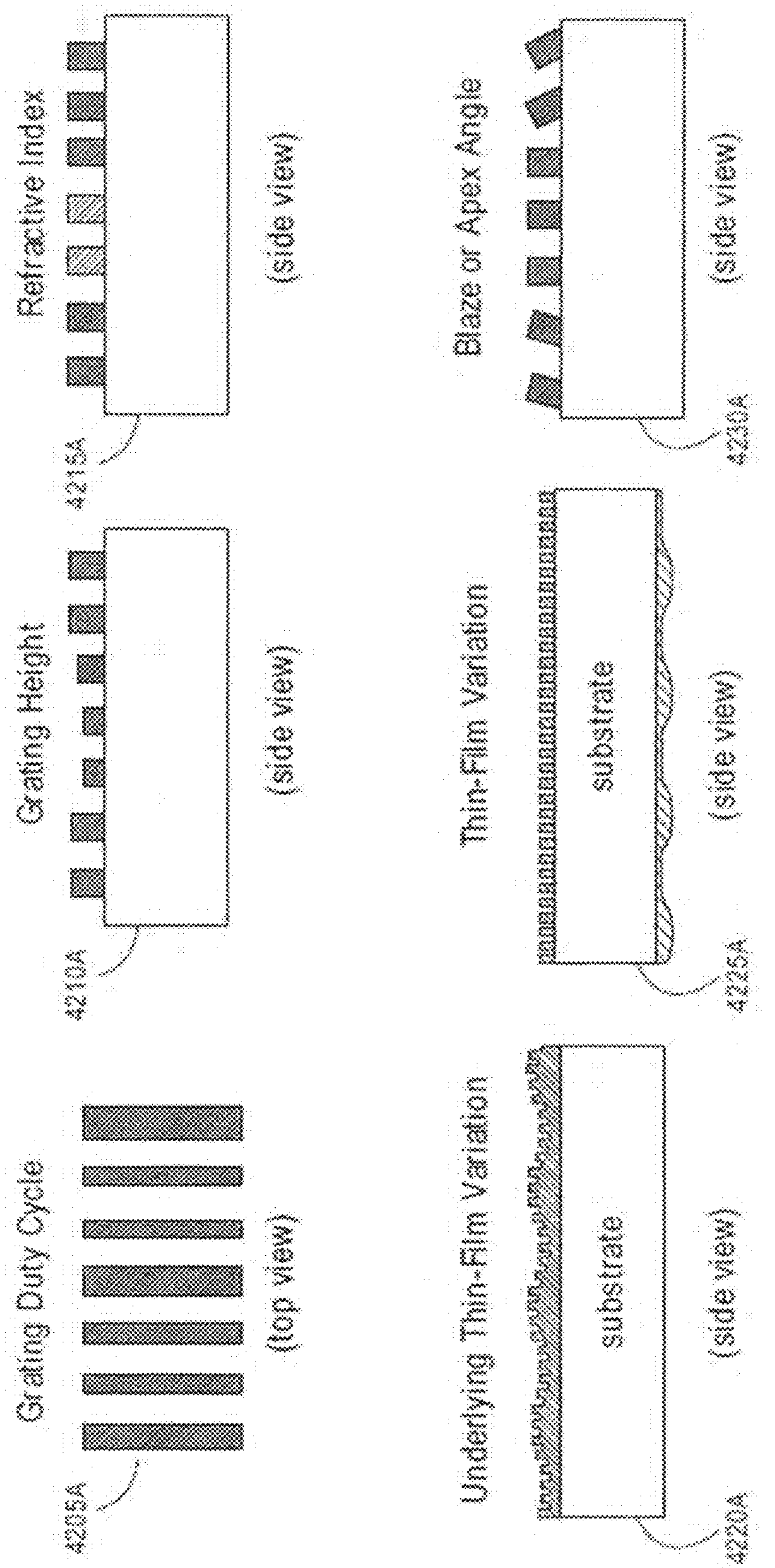
FIG. 42A is a simplified diagram illustrating additional dither variation patterns for gratings according to some embodiments of the present invention.

In some implementations, direct modification of periodic structures of the diffractive structure is used to generate phase perturbations on the periodic structure. FIG. 42A shows various phase variation methods by changing periodic structures of example diffraction gratings. The diffraction gratings referenced by 4205A, 4210A, 4215A, 4220A, and 4225A can be binary gratings, and the diffraction grating referenced by 4230A can be a non-binary grating.

Variation pattern 4205A illustrates variation in grating duty cycle. Variation pattern 4205A may be created, for example, according to a geometric file in which each line is treated as a polygon. Variations of the duty cycles can be within 1 to 99%, in some embodiments. Variation pattern 4210A illustrates variation in grating height. The grating heights may vary from 10 to 200 nm, in some embodiments. Variation pattern 4210A may be created, for example, by using a variable etch rate, variable doping, and/or a variable resist height on top of the grating. Variation pattern 4215A illustrates variation in refractive index within the grating. The refractive index may vary from 1.5 to 4, in some embodiments. Variation pattern 4215A may be created, for example, with consecutive deposition of materials with different refractive indexes. Variation pattern 4220A illustrates underlying thin-film thickness variation on a substrate. The underlying thin film may be arranged (positioned or fabricated) between the diffraction grating and the substrate. The thin film can have a refractive index, e.g., within a range of 1.5 to 4. The thickness of the thin film along the diffraction grating may vary within 1 nm to 10 μm, in some embodiments. Variation pattern 4225A illustrates thin-film variation on the backside of a substrate in which grating on the front is uniform. The thin film can have a refractive index, e.g., within a range of 1.5 to 4. The thickness of the thin film along the diffraction grating may vary within 1 nm to 10 μm, in some embodiments. Variation pattern 4220A and/or variation pattern 4225A may be created, for example, by inkjet deposition of a polymer on a wafer. Variation pattern 4230A illustrates variation in blaze or apex angle (i.e., tilting the grating), pitches, and/or widths of the grating. Variation pattern 4230A may be a non-binary grating. Variation pattern 4230A may be created, for example, by masking out portions of the wafer and etching the remaining portions at various angles across the wafer. In some examples, a diffraction grating includes a periodic structure, and a phase variation pattern of the diffraction grating can be based on a variation of a pitch of the periodic structure or a variation of a grating vector angle of the periodic structure.

Figure 42B:
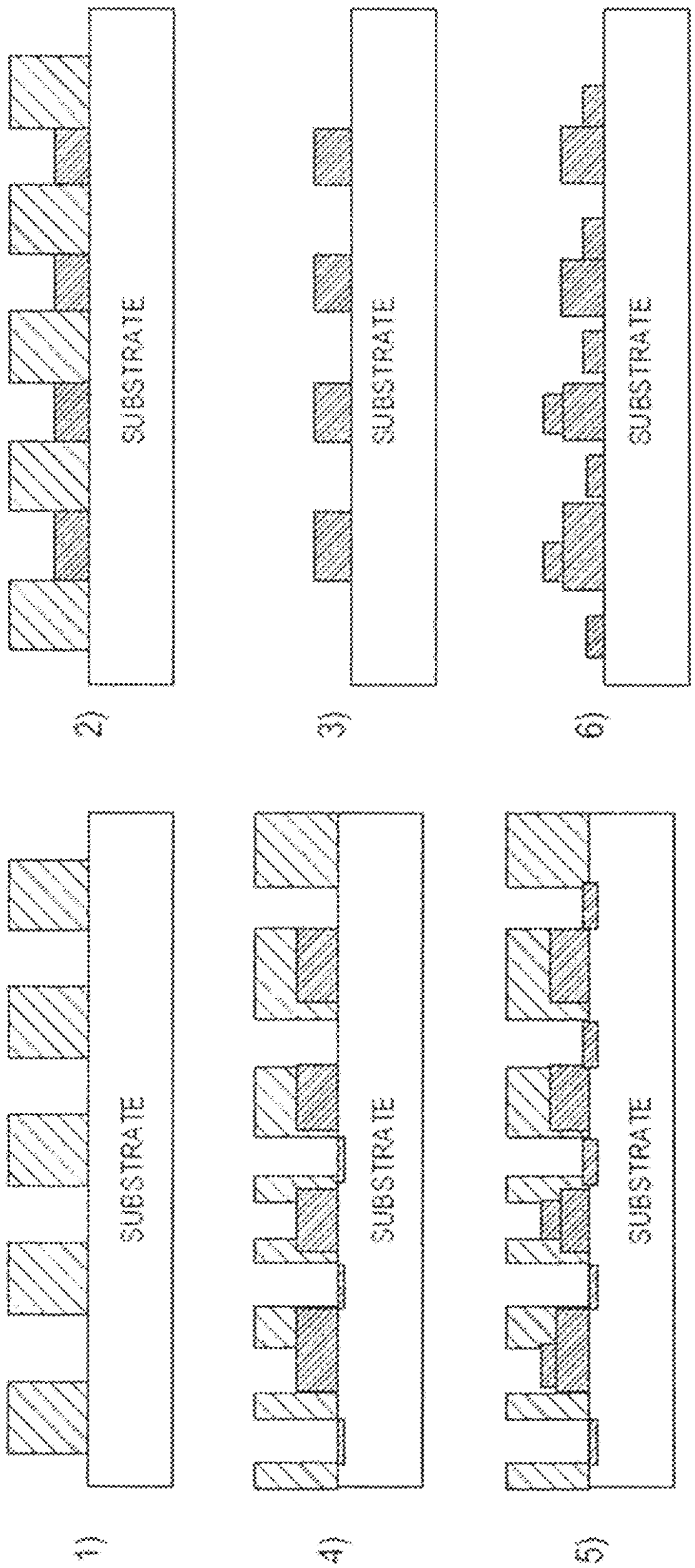
FIG. 42B shows an example method of fabricating a diffraction grating with varying grating heights to implement phase perturbations in the diffraction grating according to some embodiments of the present invention.

FIG. 42B shows an example method of fabricating a diffraction grating with varying grating heights to implement phase variations or perturbations in a periodic structure of the diffraction grating. In some examples, the fabrication method includes a multi-height level manufacturing method. A large number (N) of height levels (N) in the diffraction grating can be achieved with a limited number (n) of lithography steps with N=2'. Other methods can be also used to create multiple levels of heights.

As shown in FIG. 42B, 4 different height levels in the grating can be achieved with 2 lithography steps: first, a first patterned protective layer is formed on a substrate; second, a first layer of material is selectively deposited on unprotected areas on the substrate to form a grating structure; third, the first patterned protective layer is removed; fourth, a second patterned protective layer is formed on the substrate and the grating structure; fifth, a second layer of material is selectively deposited on unprotected areas; sixth, the second patterned protective layer is removed to get a diffraction grating with 4 height levels.

Figure 42C:
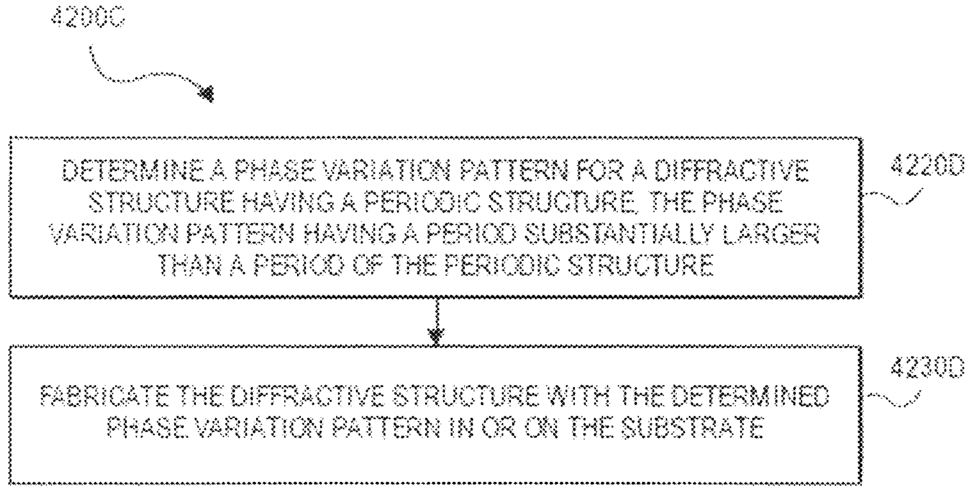
FIG. 42C is a flow diagram of an exemplary method of fabricating a diffractive structure with a phase variation pattern according to some embodiments of the present invention.

FIG. 42C is a flow diagram 4200C of an example method of fabricating a diffractive structure with a phase variation pattern. The diffractive structure can be a diffraction grating or a diffractive beam multiplier. The diffractive structure can be applied in a display system or optical system. The phase variation pattern can be like the phase variation patterns shown and described herein.

The method comprises determining a phase variation pattern for the diffractive structure (4202C). The diffractive structure may have a periodic structure configured to deflect an input light beam into a plurality of output light beams. Each output light beam may be a result of an interference among multiple coincident light beams that are generated from the input light beam and deflected by the diffractive structure. The phase variation pattern may have a period that is substantially larger than a period of the periodic structure. The phase variation pattern may be configured to cause phase perturbations on the periodic structure, such that, for each of the output light beams, the interference among the multiple coincident light beams can be leveraged and at least an optical power or a phase of the output light beam can be adjusted.

In some implementations, determining a phase variation pattern for a diffractive structure may include designing the phase variation pattern based on one or more properties of the diffractive structure. The one or more properties of the diffractive structure may include the period of the periodic structure, a duty cycle, a height of the periodic structure, a blazed or apex angle, and/or interference pattern of output light beams from the periodic structure. By phase attributable algorithms or computational holography, the pattern variation pattern may be designed or determined, such that artifacts, e.g., low frequency artifacts, in the wave in the interference pattern can be mitigated or eliminated.

In some implementations, the diffractive structure may include a first diffractive portion and a second diffractive portion adjacent to the first diffractive portion. The first diffractive portion may be configured to cause a first light beam to diffract with a first phase shift at a first diffraction order, and the second diffractive portion is configured to cause a second light beam to diffract with a second phase shift at a second diffraction order. The second diffraction order may be the same as the first diffraction order, but the second phase shift is different from the first phase shift. A difference between the first phase shift and the second phase shift may be associated with the phase variation pattern.

In some implementations, the first diffractive portion may be configured to deflect the first light beam into a first diffracted light beam at the first diffraction order. The second diffractive portion may be configured to deflect the first diffracted light beam into a second diffracted light beam at a negative order of the second diffraction order, and the second diffracted light beam may have a phase change compared to the first light beam, the phase change being the first phase shift minus the second phase shift.

In some examples, the period of the periodic structure may be within a range from 50 nm to 500 nm, and the period of the phase variation pattern may be within a range from 100 μm to 5 cm.

In some examples, the phase variation pattern may be designed to be a continuous phase variation pattern. The continuous phase variation pattern can include at least one of: a periodic or graded periodic pattern, a heuristic pattern, a computational hologram, or a random pattern like a diffuser.

In some examples, the phase variation pattern may be designed to be a discrete phase variation pattern. The discrete phase variation pattern may include at least a first portion and a second portion. The first portion may be configured to cause phase perturbations on the periodic structure, and the second portion may be configured to cause no phase perturbations on the periodic structure.

In some examples, the phase variation pattern may be designed to be based on at least one of: a variation of a pitch of the periodic structure, a variation of a grating vector angle of the periodic structure, a variation of a duty cycle of the periodic structure, a height variation of the periodic structure, a refractive index variation of the periodic structure, or a blaze or apex angle variation of the periodic structure.

The method further comprises fabricating the diffractive structure with the determined phase variation pattern in or on a substrate (4204C). The fabrication method may include lithography, holography, nanoimprinting, and/or other suitable methods.

In some embodiments, the fabricated diffractive structure may be tested. For example, an input light may be injected onto the fabricated diffractive structure and output light beams can be displayed on a viewing screen. Based on the properties of interference patterns of the output light beams, e.g., whether or not there exists low frequency artifacts, the phase variation pattern can be redesigned. The process can return to step 4202C in some embodiments.

In some implementations, the method may include fabricating a waveguide as the substrate. The waveguide may be configured to guide the input light beam via total internal reflection into the diffractive structure. The waveguide may be a slab waveguide and can have a thickness within a range from 100 nm to 1 mm. The waveguide may be made of transparent glass, polymer, or crystal.

In some implementations, the method may further include fabricating a second diffractive structure having a second periodic structure in or on the substrate. The second diffractive structure is configured to deflect the plurality of output light beams from the diffractive structure out of the substrate. The diffractive structure can be an OPE diffractive element, and the second diffractive structure may be an EPE diffractive element. The phase variation pattern of the diffractive structure can be designed or determined such that the plurality of output light beams from the diffractive structure and consequently out from the second diffractive structure have equal optical powers.

In some cases, the substrate including the fabricated first diffractive structure and the fabricated second diffractive structure may be tested to determine actual properties of the output light beams that are consequently out from the second diffractive structure. A new phase variation pattern may be determined for the diffractive structure based on one or more properties of the actual output light beams.

Figure 42D:
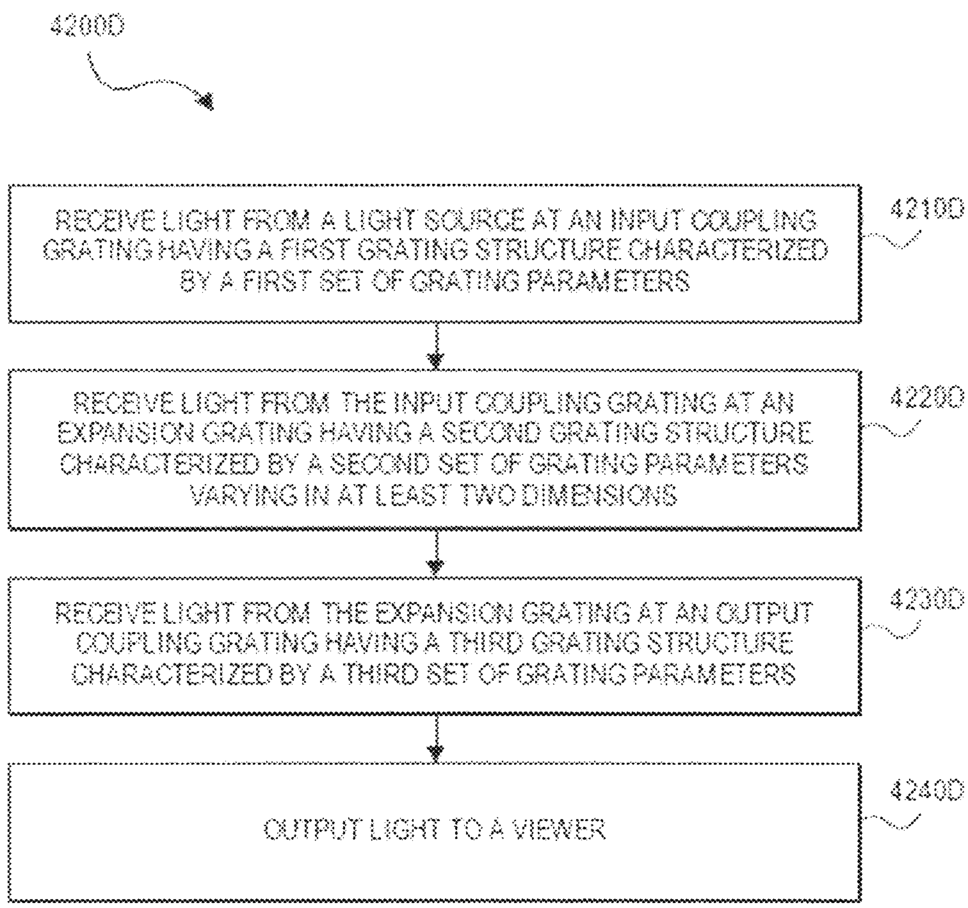
FIG. 42D is a flow diagram of an exemplary method of manipulating light by a dithered eyepiece layer according to some embodiments of the present invention.

FIG. 42D is a flow diagram 4200D of an exemplary method of manipulating light by a dithered eyepiece layer according to some embodiments of the present invention. The method includes receiving light from a light source at an input coupling grating having a first grating structure characterized by a first set of grating parameters at an input coupling grating (4210D).

The method further comprises receiving light from the input coupling grating at an expansion grating having a second grating structure characterized by a second set of grating parameters varying in at least two dimensions (4220D). In some embodiments, the at least two dimensions includes at least two of pitch, apex angle, refractive index, height, and duty cycle. In some embodiments, the second grating structure has a phase variation pattern. In some embodiments, a period of the phase variation pattern is within a range from 100 μm to 5 cm. In some embodiments, the phase variation pattern comprises a continuous phase variation pattern that includes at least one of a periodic or graded periodic pattern, a heuristic pattern, a computational hologram, and a random pattern. In some embodiments, the second grating structure has a periodic structure. In some embodiments, a period of the periodic structure is within a range from 50 nm to 500 nm. In some embodiments, the second grating structure includes a phase-dithered grating.

In some embodiments, the second grating structure comprises a first diffractive portion and a second diffractive portion adjacent to the first diffractive portion, wherein the first diffractive portion is configured to cause a first light beam to diffract with a first phase shift at a first diffraction order, wherein the second diffractive portion is configured to cause a second light beam to diffract with a second phase shift at a second diffraction order, wherein the second diffraction order is similar to the first diffraction order, and wherein the second phase shift is different than the first phase shift, and wherein a difference between the first phase shift and the second phase shift is associated with the phase variation pattern. In some embodiments, the first diffractive portion is configured to deflect the first light beam into a first diffracted light beam at the first diffraction order, wherein the second diffractive portion is configured to deflect the first diffracted light beam into a second diffracted light beam at a negative order of the second diffraction order, and wherein the second diffracted light beam has a phase change as compared to the first light beam, the phase change being the first phase shift minus the second phase shift.

The method further comprises receiving light from the expansion grating at an output coupling grating having a third grating structure characterized by a third set of grating parameters (4230D). The method further comprises outputting light to a viewer (4240D).

FIGS. 43-45 further explain embodiments of the invention from a high level. FIG. 43 is a simplified diagram illustrating a diffractive beam multiplier in a waveguide. Light 4310 is input as a collimated beam that is totally internally reflected inside the waveguide. The input light 4310 enters a diffractive structure 4320, and is output 4330 as multiple copies of the input beam. There is a 1-to-1 transfer function of the input angle to output angle.

The diffractive structure 4320 has a periodic structure defining a plurality of portions P1, P2, . . . , Pn that are adjacent together. The portions S1-Sn can have a tilted angle over a longitudinal direction of the diffraction grating 4320. In some implementations, the waveguide is made of a material having an index, e.g., n=1.5 to 4, higher than an index of air, e.g., n=1. The waveguide can have a thickness of 100 nm to 1 mm. The diffraction grating 4320 can have a period of 50 nm to 500 nm.

The device of FIG. 43 can be operated in air. An input light beam 4310, e.g., a collimated light beam from a laser source, can propagate from the air into the waveguide. The input light beam 4310 can travel within the waveguide, e.g., via total internal reflection (TIR). When the input light beam 4310 travels through the diffraction grating 4320, the input light beam 4310 can be deflected (e.g., split and diffracted) by the portions P1, P2, . . . , Pn of the diffraction grating 4320. At each portion, the input light beam 4310 can be split and diffracted into different orders of diffracted light beams, e.g., 0, +1, +2. The 0th order diffracted light beam of the input light 4310 can be further deflected by sequential portions along the longitudinal direction. The higher-order, e.g., +1 or −1 order, diffracted light beam of the input light beam can be diffracted out of the periodic structure of the diffraction grating 4320.

FIG. 44A is a simplified diagram illustrating the paths of light through a beam multiplier that manipulates diffraction efficiency. Input light 4410A is sent through a diffractive component 4420A that manipulates amplitude, resulting in output light 4430A that includes multiple copies of the input light 4410A.

FIG. 44A illustrates how a diffraction grating 4420A with a periodic structure manipulates an amplitude of a diffracted light beam. An input light 4410A is deflected at portions of the diffraction grating 4420A. As FIG. 44A shows, for each unit cell, e.g., at each portion, assuming that the electric field amplitude of the input light Ein is 1 and the portion of the grating has a diffraction efficiency d, the higher-order diffracted light beam has an amplitude $E_{out}$=d, and the $0^{th}$ order diffracted light beam has an amplitude $E_{out}$=1−d. In a system like this, there are no wave interference effects in producing the output copies of the input light beam 4410A.

In the present disclosure, a diffractive structure is presented that can manipulate both amplitude and phase of an input light, thereby manipulating wave interference of output light beams. The diffractive structure can have a phase variation pattern over a periodic structure of the diffractive structure. The phase variation pattern can have a period that is substantially larger than a period of the periodic structure, such that properties of the periodic structure have no or minor change but artifacts or non-uniformity in the wave interference pattern can be substantially reduced or eliminated.

Figure 44B:
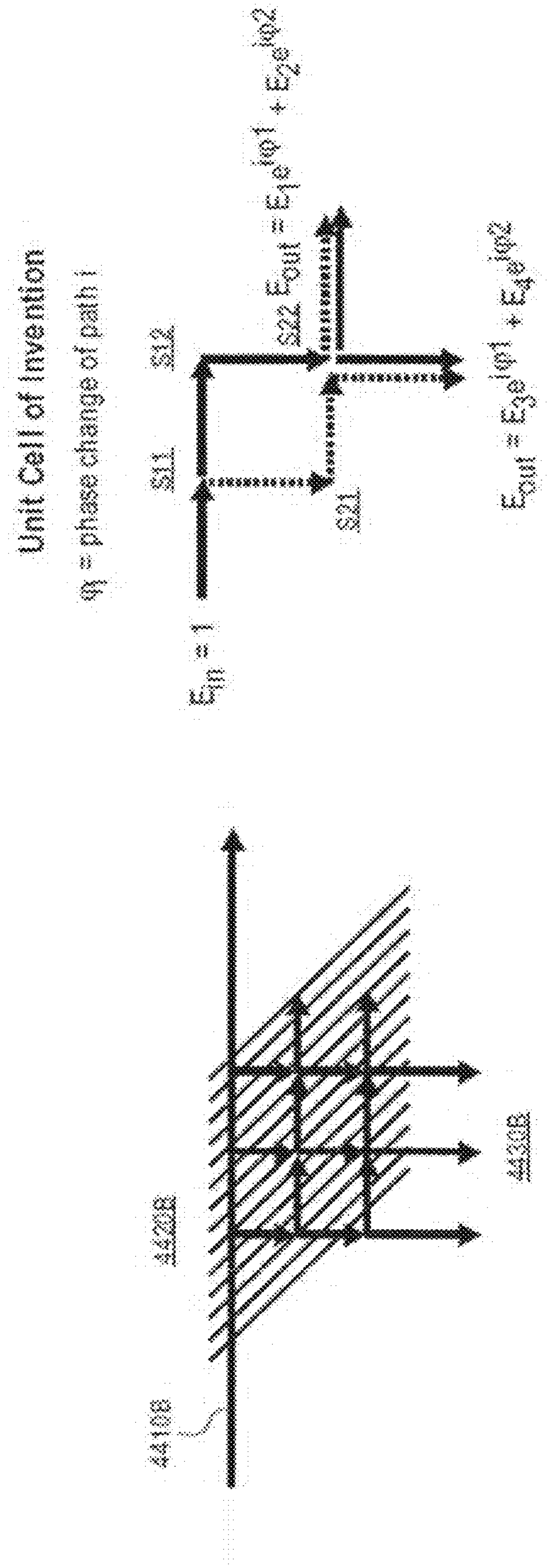
FIG. 44B is a simplified diagram illustrating light paths through a beam multiplier that manipulated wave interference according to some embodiments of the present invention.

FIG. 44B is a simplified diagram illustrating the paths of light through a beam multiplier that manipulates wave interference according to some embodiments of the invention. Input light 4410B is sent through a diffractive component 4420B that manipulates amplitude and phase, resulting in output light 4430B that includes multiple copies of the input light.

FIG. 44B illustrates how a diffraction grating 4420B manipulates both amplitude and phase of a diffracted light beam. As shown in FIG. 44B, an input light beam 4410B can be deflected (e.g., split and diffracted) at first sub-sections of the diffraction grating 4420B along a first direction into first deflected (or diffracted) light beams. The first sub-sections are configured to cause different phase shifts among the first deflected light beams. Then the first deflected light beam at each first sub-section can be further deflected at second sub-sections of the diffraction grating along a second direction into second deflected light beams. The second sub-sections are configured to cause different phase shifts among the second deflected light beams. The second direction can be perpendicular to the first direction. The second deflected light beams can be further deflected at other sub-sections of the diffraction grating 4420B. Eventually, a plurality of output light beams 4430B are deflected out of the diffractive structure 4420B from respective positions that are spaced from each other. Each output light beam 4430B can be a result of an interference among multiple coincident light beams that are generated from the input light beam 4410B and deflected by the diffraction grating 4420B. That is, each output light beam 4430B can be the superposition of multiple coincident light beams from a number of pathways through repeated diffraction events in the grating 4420B.

FIG. 44B shows an optical transformation function of one unit cell of a Mach-Zender-like interference which can mathematically describe how optical phase can affect the output light beam amplitude. As an example shown in FIG. 44B, each unit cell of the diffraction grating includes four sub-sections S11, S12, S21, and S22. Each sub-section may have identical grating pitch and angle, but diffracts light with different amplitudes and phase shifts.

An input light beam is deflected at the four sub-sections S11, S12, S21, and S22 into four light beams. Two light beams are coincident and form an output light beam, e.g., the output light beam. Each of the light beams experiences a different light path. For example, the input light beam is first deflected at sub-section S11 into a first $0^{th}$ order light beam and a first higher order diffracted light beam. The first $0^{th}$ order light beam is further deflected at sub-section S12 to form a second higher order diffracted light beam that is further deflected at sub-section S22 into a third higher order diffracted light beam and a third 0th order light beam. The first higher order diffracted light beam is further deflected at sub-section S21 to form a fourth higher order diffracted light beam that is further deflected at sub-section S22 into a fifth $0^{th}$ order light beam 352 and a fifth higher order diffracted light beam.

Assuming that the electric field of the input light has an input amplitude Ein=1 and an input phase $\phi_0=0$, the electric fields of the four output light beams can be $E_1e^{i\Phi1}$, $E_2e^{i\Phi2}$, $E_3e^{i\Phi3}$ and $E_4e^{i\Phi4}$, respectively, where $E_1$, $E_2$, $E_3$, and $E_4$ are the amplitudes of the output light beams, and $\phi_1$, $\phi_2$, $\phi_3$, and $\phi_4$ are the phases of the output light beams, which are also the phase changes of the four different light paths. A first output light including two of the diffracted light beams has an electric field $E_{out}=E_1e^{i\Phi1}+E_2e^{i\Phi2}$, and a second output light including the other two of the diffracted light beams has an electric field $E_{out}=E_3e^{i\Phi3}+E_4e^{i\Phi4}$. Thus, controlling phase shifts of sub-sections within the diffraction grating, e.g., by engineering phase variations of the periodic structure of the diffraction grating, enables controlling amplitudes and phases of the diffracted light beams and accordingly the interference among the multiple diffracted light beams that are coincident can be leveraged and an optical power and/or a phase of the output light can be controlled or adjusted.

Figure 45A:
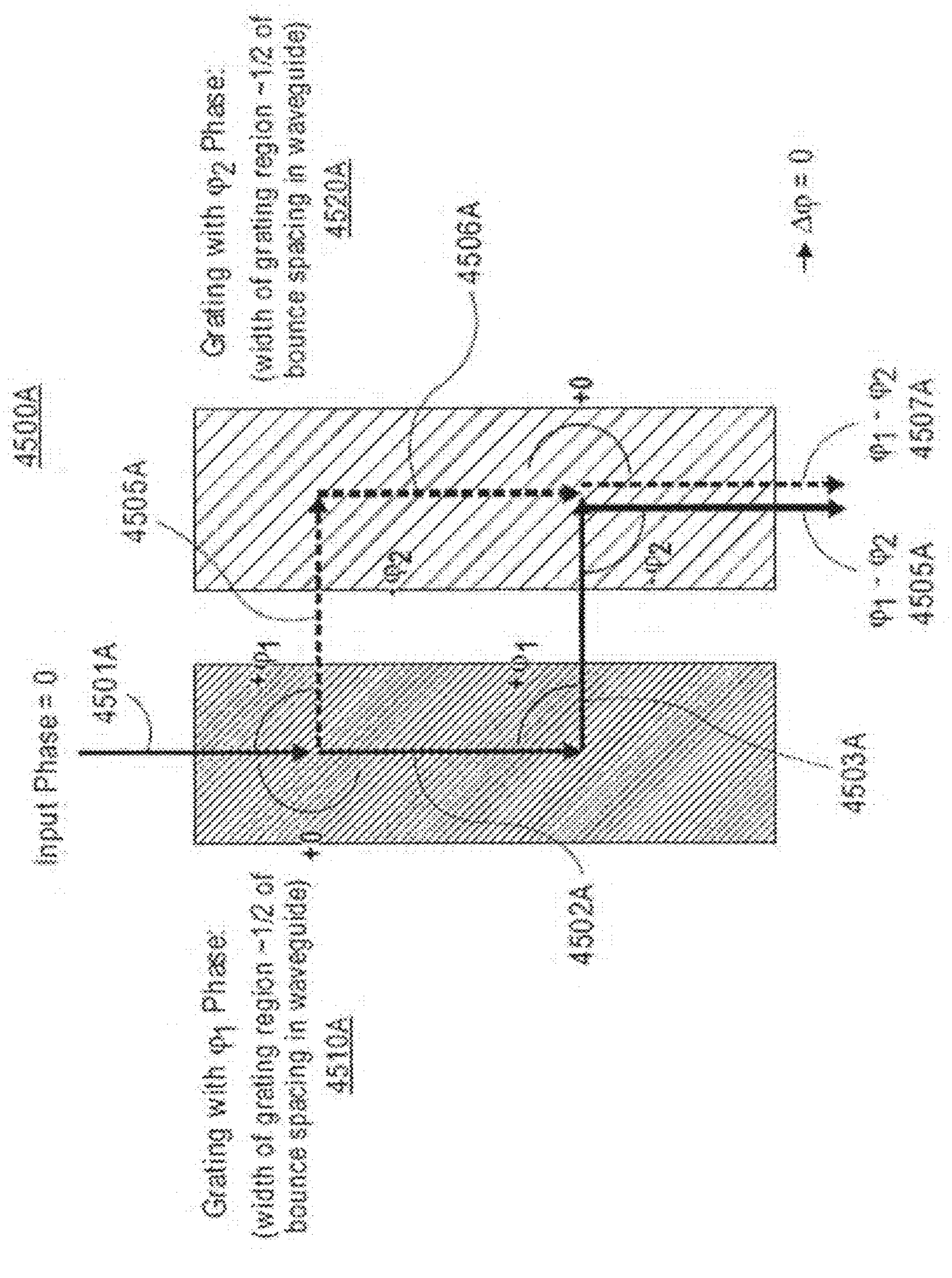
FIGS. 45A-B are a simplified diagrams comparing light paths through dithering of a grating structure according to some embodiments of the present invention.
Figure 45B:
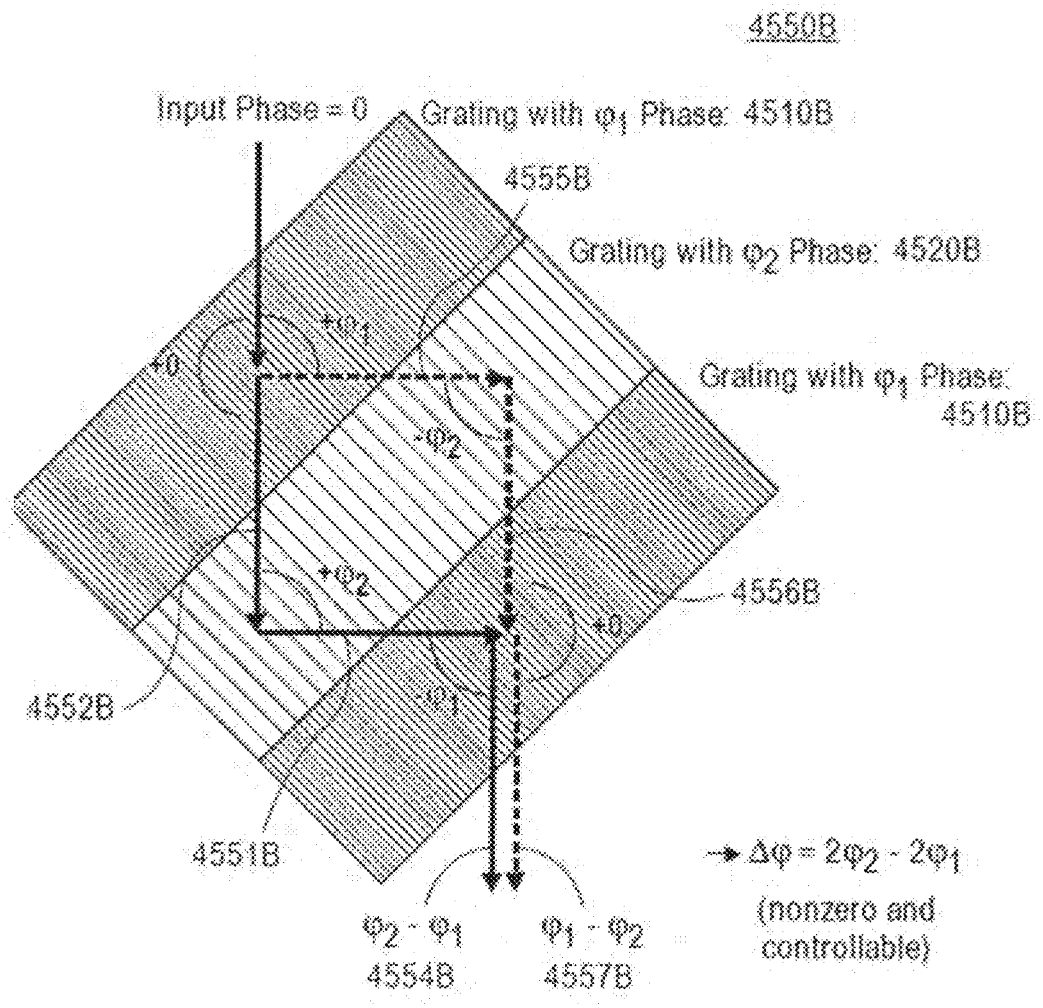

FIGS. 45A-B show examples of simple phase variation patterns in one unit cell. FIG. 45A shows an example phase variation pattern that produces zero relative phase difference between coincident output beams. FIG. 45B shows an example phase variation pattern that produces a non-zero phase different between two coincident output light beams that interfere with each other. Thus, FIG. 45B shows how phase variations of a grating structure can controllably manipulate the amplitude of output light beams.

A phase-dithered grating can cause no phase shift for diffracted light with 0th order, a positive phase shift for diffracted light with a positive order, and a negative phase shift for diffracted light with a negative order. For example, as FIG. 45A shows, one unit cell 4500A of the grating can include a first grating portion 4510A and a second grating portion 4520A adjacent to the first grating portion 4510A. Sub-sections within the first grating portion 4510A are configured to cause 0, $+\phi_1$ $-\phi_1$ phase shifts for $0^{th}$ order, positive order, and negative order, respectively. Subsections within the second grating portion 4520A are configured to cause 0, $+\phi_2$, $-\phi_2$ phase shifts for $0^{th}$ order, positive order, and negative order, respectively. Due to dithering, the first grating portion 4510A and the second grating portion 4520A have phase variations, where phase shift $\phi_1$ is not identical to phase shift $\phi_2$.

An input light 4501A can be normally incident on the unit cell 4500A and can be deflected by a sub-section in the first grating portion 4510A into a diffracted beam 4502A with zero phase change at $0^{th}$ order and diffracted beam 4505A with $+\phi_1$ phase change at a positive order. Diffracted beam 4502A is further deflected at a sub-section in the first grating portion 4510A to get diffraction beam 4503A with $+\phi_1$ phase change. Diffraction beam 4503A is further deflected at a subsection in the second grating portion 4510A to get diffraction beam 404 with $\phi_2$ phase change. Assuming the input light 4501A has an input phase being 0, diffraction beam 4504A has a phase change $\phi_1-\phi_2$ compared to the input light 4501A, thus having an output phase $\phi_1-\phi_2$. Similarly, diffraction beam 4505A is deflected by a sub-section in the second grating portion 4520A to get diffraction beam 4506A with $\phi_2$ phase change. Diffraction beam 4506A is deflected by a sub-section to get diffraction beam 4507A with zero phase change. Thus, diffraction beam 4507A also has a phase change $\phi_1-\phi_2$ compared to the input light 4501A, thus having an output phase $\phi_1-\phi_2$, same as diffraction beam 4505A. That is, the phase difference between the diffraction beams 4504A and 4507A $\Delta\phi$ is 0.

FIG. 45B is a simplified diagram illustrating the paths of light through a correctly dithered grating structure according to some embodiments of the invention. In FIG. 45B, symmetry is broken and output is changed. The outputs are nonzero and controllable. In this embodiment, engineered phase perturbations within the diffractive region allows for controllable constructive or destructive interference, which controls the output luminance of the output ports.

FIG. 45B shows another unit cell 4550B of a phase-dithered grating. The unit cell 4550B includes two first grating portions 4510B and one second grating portion 4520B. The second grating portion 4520B is sandwiched by (or positioned between) the two first grating portions 4510B. Sub-sections within the first grating portion 4510B are configured to cause 0, $\phi_1$, $\phi_2$ phase shifts for $0^{th}$ order, positive order, and negative order, respectively. Sub-sections within the second grating portion 4520B are configured to cause 0, $+\phi_2$, $-\phi_2$ phase shifts for 0th order, positive order, and negative order, respectively.

An input light 4551B can be incident on the unit cell 4550B with a tilted angle. The input light 4551B can be deflected by a sub-section in the first grating portion 4510B into diffracted beam 4552B with zero phase change at 0th order and diffracted beam 4555B with $+\phi_1$ phase change at a positive order. Diffracted beam 4552B is further deflected at a sub-section in the second grating portion 4520B to get diffraction beam 4553B with $+\phi_2$ phase change. Diffraction beam 4553B is further deflected at a sub-section in the other first grating portion 4510B to get diffraction beam 4554B with −fit phase change. Assuming the input light 4551B has an input phase being 0, diffraction beam 4554B has a phase change $\phi_2-\phi_1$ compared to the input light 4551B, thus diffraction beam 4554B has an output phase $\phi_2-\phi_1$.

Similarly, diffraction beam 4555B is deflected by a sub-section in the second grating portion 4520B to get diffraction beam 4556B with $-\phi_2$ phase change. Diffraction beam 4556B is deflected by a sub-section to get diffraction beam 4557B with zero phase change. Thus, diffraction beam 4557B has a phase change $\phi_1-\phi_2$ compared to the input light 4551B, thus having an output phase $\phi_1-\phi_2$. As a result, the phase difference between diffraction beam 4554B and 4557B is $\Delta\phi=2(\phi_2-\phi_1)$. As the grating is dithered, that is, the first grating portion 4510B causes different phase shifts from the second grating portion 4520B. That is, $\phi_1\neq\phi_2$. Thus, there is a nonzero phase difference between the output diffraction beams 4554B and 4557B.

If the phase variation between $\phi_1$ and $\phi_2$ can be controlled, the phase difference between the output diffraction beams 4554B and 4557B can be controllable, accordingly interference between the output diffraction beams 4554B and 4557B can be also controllable. That is, engineered phase variations (or perturbations) within the diffractive regions of the diffractive structure allow controllable constructive or destructive interference thus controllable output luminance.

Embodiments of the invention further provide methods of producing GDS files for grating patterns perturbed by a specified continuous phase function. A linear grating with grating vector $\vec{k}$ ($|\vec{k}|=2\pi/\Lambda$ and $\Lambda$ is the grating pitch) can be specified as the isocontours of a scalar function of space:

$$\phi_0(\vec{r})=\vec{k}\cdot\vec{r} \quad \text{Equation 1:}$$

For a 50% duty cycle linear grating, the points within the lines of the grating are defined by:

$$\bigcup_j line_j, \text{ where } line_j = \{\vec{r}: 2\pi j \le \phi_0(\vec{r}) \le 2\pi(j+0.5)\} \quad \text{Equation 2}$$

For a generically perturbed grating, the lines are defined by:

$$\bigcup_j line_j\ line_j = \{\vec{r}: 2\pi j \le \phi_0(\vec{r}) + \nabla\phi(\vec{r}) \le 2\pi[j + d(\vec{r})]\}, \quad \text{Equation 3}$$

where $\phi(\vec{r})$: $\mathbb{R}^2 \rightarrow \mathbb{R}$ is a scalar function of space that represents the perturbation, and $d(\vec{r})$ is the (possibly spatially varying) duty cycle of the grating in the range of (0, 1).

The depth function in the exit pupil expander (EPE) is implemented by an even aspheric lens function perturbation of the form:

$$\phi(\vec{r}) = c_1\rho^2 + c_2\rho^4 + \ldots, \quad \text{Equation 4:}$$

where $\rho = |\vec{r}|$ with the origin at the center of the EPE grating region. The coefficients $c_1$, $c_2$, . . . are generally different for each color and depth plane.

A sinusoidal dither function is implemented by:

$$\phi(\vec{r}) = a\sin\left(\frac{2\pi}{p}\vec{r}\cdot\hat{u}\right), \quad \text{Equation 5}$$

where a is the amplitude of the dither function, p is the period of the sinusoid, and û is a unit vector specifying the direction in which the sinusoid varies. Typically, the period must be limited to being greater than ~0.1 mm in order to not introduce a significant amount of blue into the produced images.

Similar to the above, for a chirped sinusoid, the function used in certain prototypes is:

$$\phi(\vec{r}) = a\sin\left(\frac{2\pi x}{1 + x/43.6}\right), \quad \text{Equation 6}$$

where x is the x-coordinate of a local coordinate system with origin at the corner of the OPE farthest from the ICG and nearest the OPE, in units of millimeters.

For arbitrary functions, similar to the above, we allow $\phi(\vec{r})$ to be an arbitrary function of space. Typically, we require that the highest spatial frequency correspond to a period of ~0.1 mm. In practice, these "band-limited" functions may be produced from an arbitrary function through filtering:

$$\phi_{filtered} = \mathcal{F}^{-1}\{\text{circ}_{1/p_{min}}[\mathcal{F}\phi]\}, \quad \text{Equation 7}$$

where F represents a Fourier transform and $p_{min}$ is the minimum periodicity of spatial frequency allowed.

Since the grating ridge regions are defined as the isosurface contours of a function, a direct approach to pattern generation cannot be used. Since it is assumed that $|\vec{k}|$ is (by far) the highest spatial frequency, then sampling can be performed along the direction of $\vec{k}$ to determine each edge of every grating ridge. Once this set of locations is determined, sampling can be performed at an increment perpendicular to the direction of $\vec{k}$ to obtain a new set of grating ridge edges, and these two sets of edge coordinates can be stitched together to form a set of parallelograms that grows each ridge region by a length of approximately the increment.

In sampling, the large constant linear term can be factored out, and the perturbation from the periodicity can be rapidly determined by a few Newton iterations. This can in addition be warm-started from the adjacent perturbations since the spatial variation of these perturbations is assumed to be slow.

Generation of Multiple Incoherent Images

Some embodiments of the present invention relate to systems and methods for generation of multiple incoherent images in waveguide-based near-to-eye displays. The waveguide-based display may superimpose multiple incoherent optical images to reduce wave interference-based image artifacts that adversely impact the performance of waveguide displays. Waveguide displays typically produce distracting interference patterns. However, according to some embodiments of the invention, a waveguide display is provided that projects many output images, where each individual output image has a unique interference pattern and the summation of all patterns appears as an image with higher luminance uniformity. This may be accomplished by (A) a waveguide display with multiple in-coupling elements, each illuminated with a copy of the desired output image, and/or (B) a waveguide display with a single in-coupling element that generates multiple incoherent copies within the waveguide itself.

Numerous benefits are achieved by way of the present invention over conventional techniques. For example, embodiments of the present invention provide a method for reducing wave interference-based image artifacts in a waveguide display while achieving a large field of view, high sharpness image in a thin waveguide. Other methods of reducing wave interference based image artifacts may have harsh tradeoffs with other important near-to-eye display metrics. Severe wave interference-based image artifacts may occur from self-interference of light within diffractive structures that perform the functionality of an orthogonal pupil expander (OPE). Typically, the magnitude of wave interference in proportional to the size of the OPE subelement with respect to the bounce spacing of light within the waveguide display. There are several ways of reducing the OPE size with respect to bounce spacing: (1) increase the waveguide thickness, which causes a near-to-eye display to be too heavy to comfortable wearing and reduces display brightness; (2) reduce the spatial two-dimensional footprint of the OPE, which reduces the maximum field of view supported by the waveguide display; and/or (3) greatly increase the refractive index, which is not possible within common transparent glasses, polymers, and crystals. Because of these tradeoffs, some diffractive waveguide displays may be thick and only support low field of view images.

A more complex method to reducing wave interference-based image artifacts, even in thin waveguide displays supporting high field of view images, is to add perturbations to the diffractive structures, typically in the form of spatially varying phase or amplitude perturbations in the OPE, in an effort to scramble the interference pattern. This method can successfully remove wave interference-based artifacts, but perturbations in a diffractive structure may also cause distortion and wave-front aberrations of the light beams that propagate inside the waveguide display. Hence, the diffractive perturbation method has a harsh tradeoff with image sharpness, and digital objects viewable through a near-to-eye display using this technique may appear blurry to a user.

Embodiments of the invention may not carry the tradeoffs of other techniques. Previous techniques that interfered with wave interference necessarily perturbed the light, leading to other undesirable image artifacts. Embodiments of the invention use the superposition of many output images, where each individual image exhibits strong unperturbed wave interference, but the incoherent summation of these images by the user's eye masquerades the luminance artifacts that lie within. Some embodiments of the disclosure describe not only the general strategy of superimposing many incoherent output images, but also specific methods to produce incoherent output images within a single waveguide display.

Figure 46:
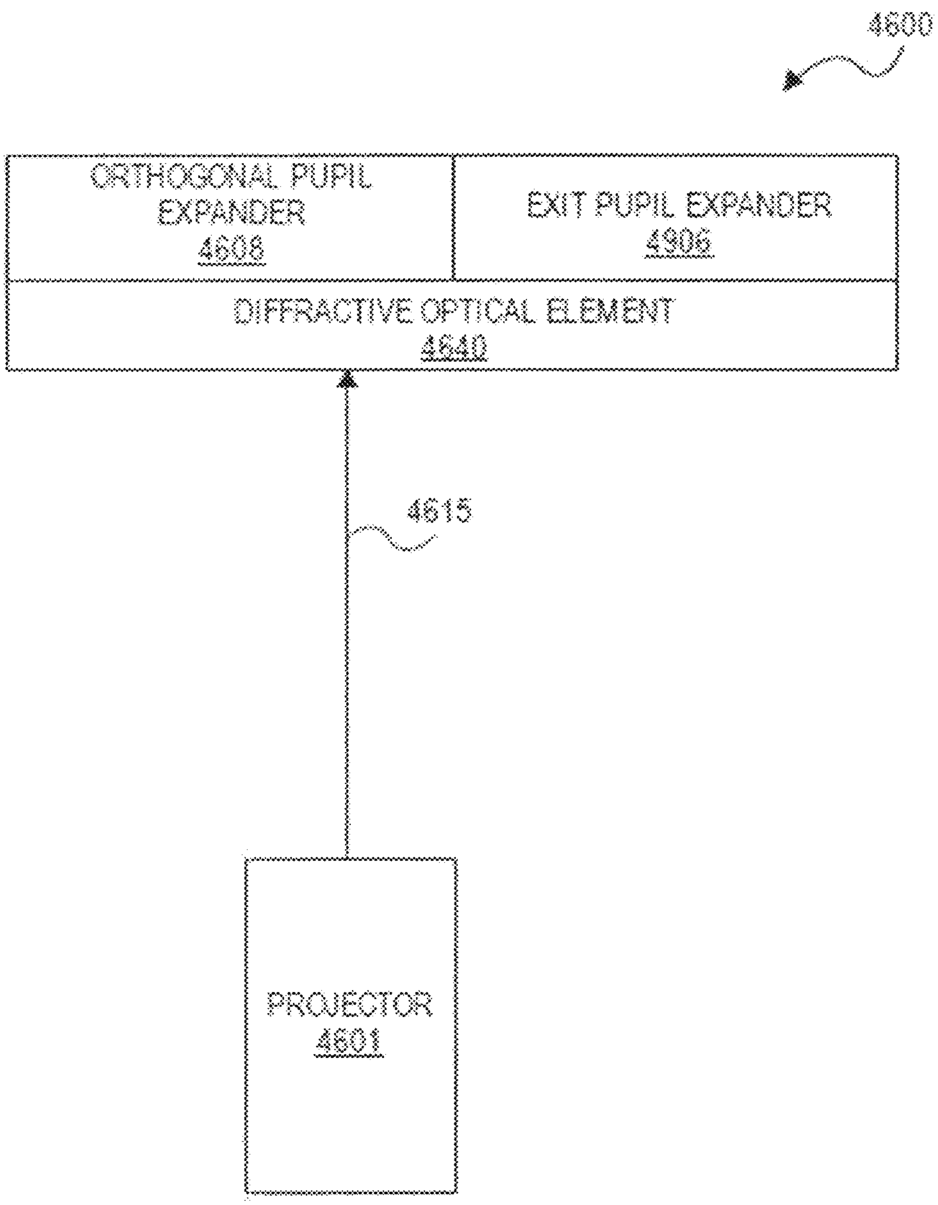
FIG. 46 is a block diagram illustrating a viewing optics system in a near-to-eye display device according to some embodiments of the present invention.

FIG. 46 is a block diagram illustrating a VOA system 4600, in accordance with some embodiments. System 4600 may include a projector 4601 and a waveguide display element. The waveguide display element may include a diffractive optical element 4640, an orthogonal pupil expander (OPE) 4608, and an exit pupil expander (EPE) 4609, as described further herein. The OPE 4608 and/or EPE 4609 may also be considered to be diffractive optical elements, in some embodiments. The projector 4601 and the waveguide display element may be included in a near-to-eye display device, in some embodiments. Additional description related to the VOA is provided in relation to FIG. 20.

Figure 47A:
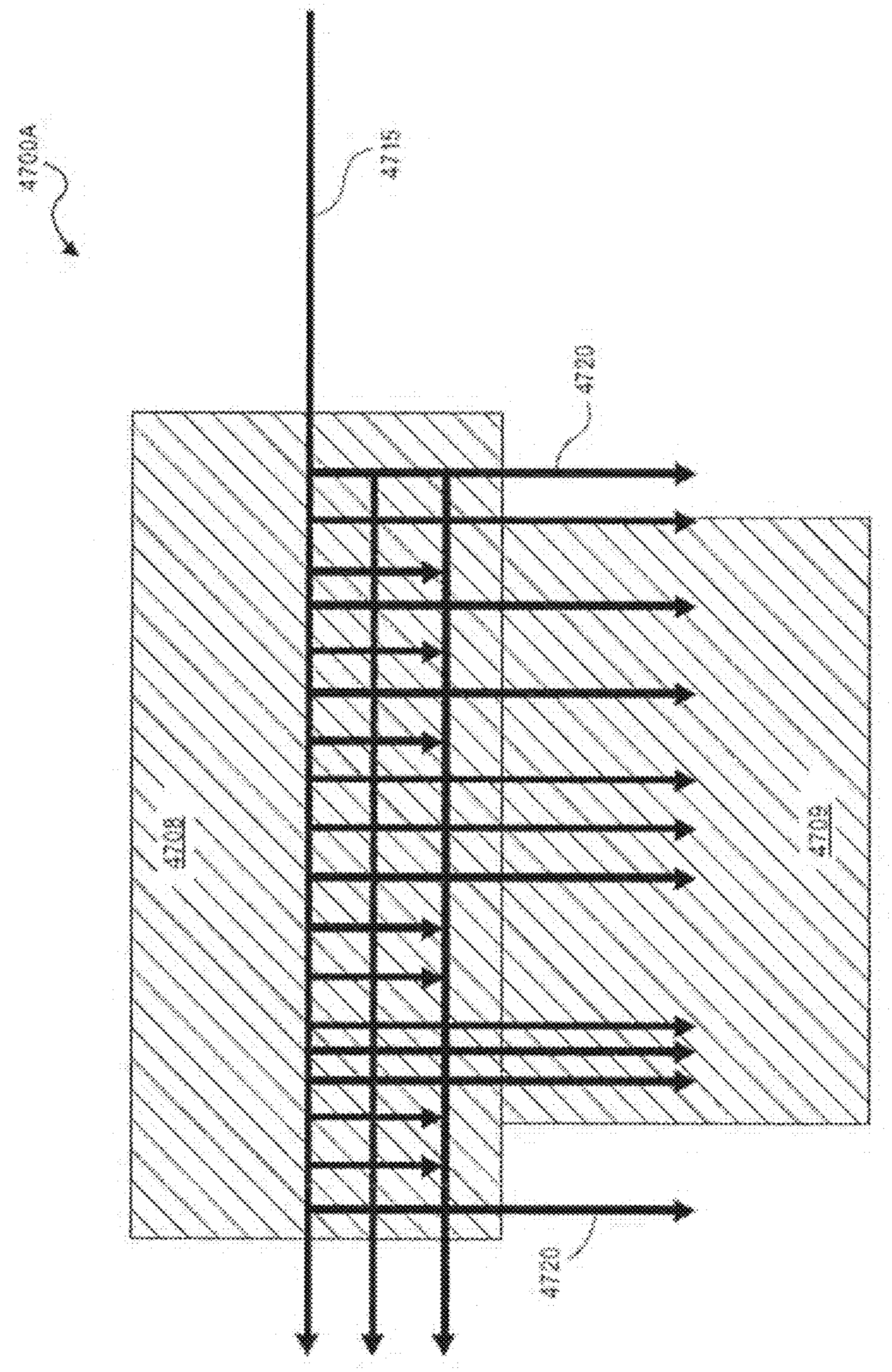
FIG. 47A is a block diagram of a waveguide display according to some embodiments of the present invention.

FIG. 47A is a block diagram of a waveguide display 4700A. Waveguide display 4700A may include an OPE 4708 and an EPE 4709, which together form a pupil expansion device. Pupil expansion in the waveguide display 4700A may typically be performed via cloning of the input light beam 4715 (e.g., of diameter 100 μm to 10 mm), many times, in order to create a two-dimensional array of output light beams 4720 (e.g., covering many square centimeters) to project the image toward the user's eye.

Figure 47B:
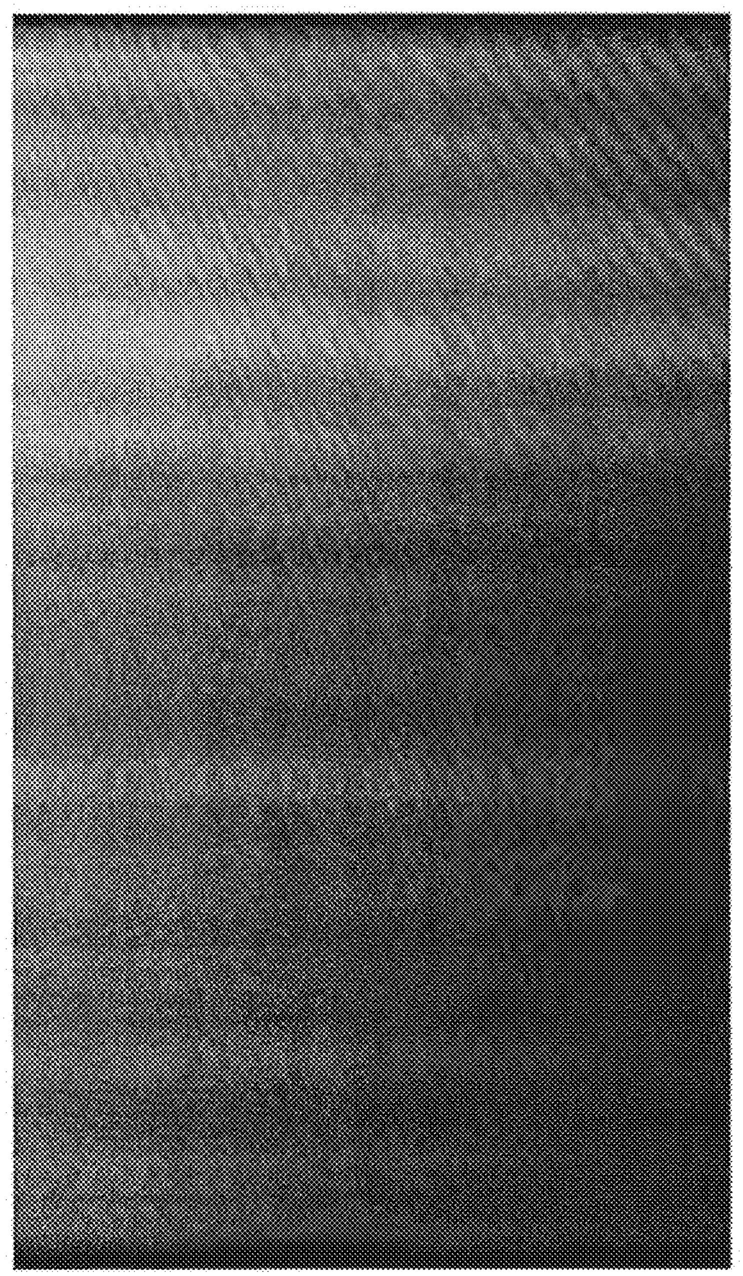
FIG. 47B is an output image produced using a waveguide display according to some embodiments of the present invention.

The inventors have determined that in waveguide displays, such as waveguide display 4700A, the array of output light beams 4720 may not have uniform luminance. Further, because of interference effects within the waveguide display 4700A, the array of output light beams 4720 may have a chaotic luminance profile resembling a random interference pattern. An exemplary interference pattern of this type is illustrated in FIG. 47B, showing the spatial distribution of light exiting the EPE for a single particular projected angle of light. This spatial distribution may be referred to herein as a "near-field pattern". FIG. 47B is non-uniform and includes multiple striations characterized by intensity modulation in the horizontal direction, i.e., the direction substantially along the direction of light propagating into the OPE.

To provide a large field-of-view, the diffractive regions on the waveguide display 4700A may need to be larger in area. However, this may lead to more interactions between the projected light and the diffractive components within the waveguide display 4700A. More interactions with the diffractive components may result in an increase in interference effects.

Mitigating image quality problems from wave interference may not be necessary in small field-of-view waveguide displays (e.g., 20×20 degrees), but may be crucial in large field-of-view waveguide displays (e.g., 40×40 degrees or larger). Thus, one approach that can be used to mitigate interference effects in diffractive waveguide displays, such as waveguide display 4700A, includes reducing the field-of-view. Another approach to mitigating interference includes increasing the waveguide thickness. However, in mixed reality and/or augmented reality near-to-eye display applications, achieving a large field-of-view in combination with or in addition to low weight may be desirable. Accordingly, these approaches may be undesirable.

Another approach to mitigating interference includes adding phase variation to the diffractive regions, which necessarily causes phase errors across a light beam's wave-front. Such phase variation may "scramble" the interference patterns and remove interference effects. However, image sharpness may be reduced, causing the output image to appear blurry or out-of-focus.

Some embodiments of the invention do not aim to scramble the interference pattern, but rather to feed the waveguide display with multiple incoherent inputs. The output image associated with each input may still create an interference pattern in the output image. However, the superposition of many unique interference patterns may appear increasingly uniform as the number of inputs increases.

Figure 48A:
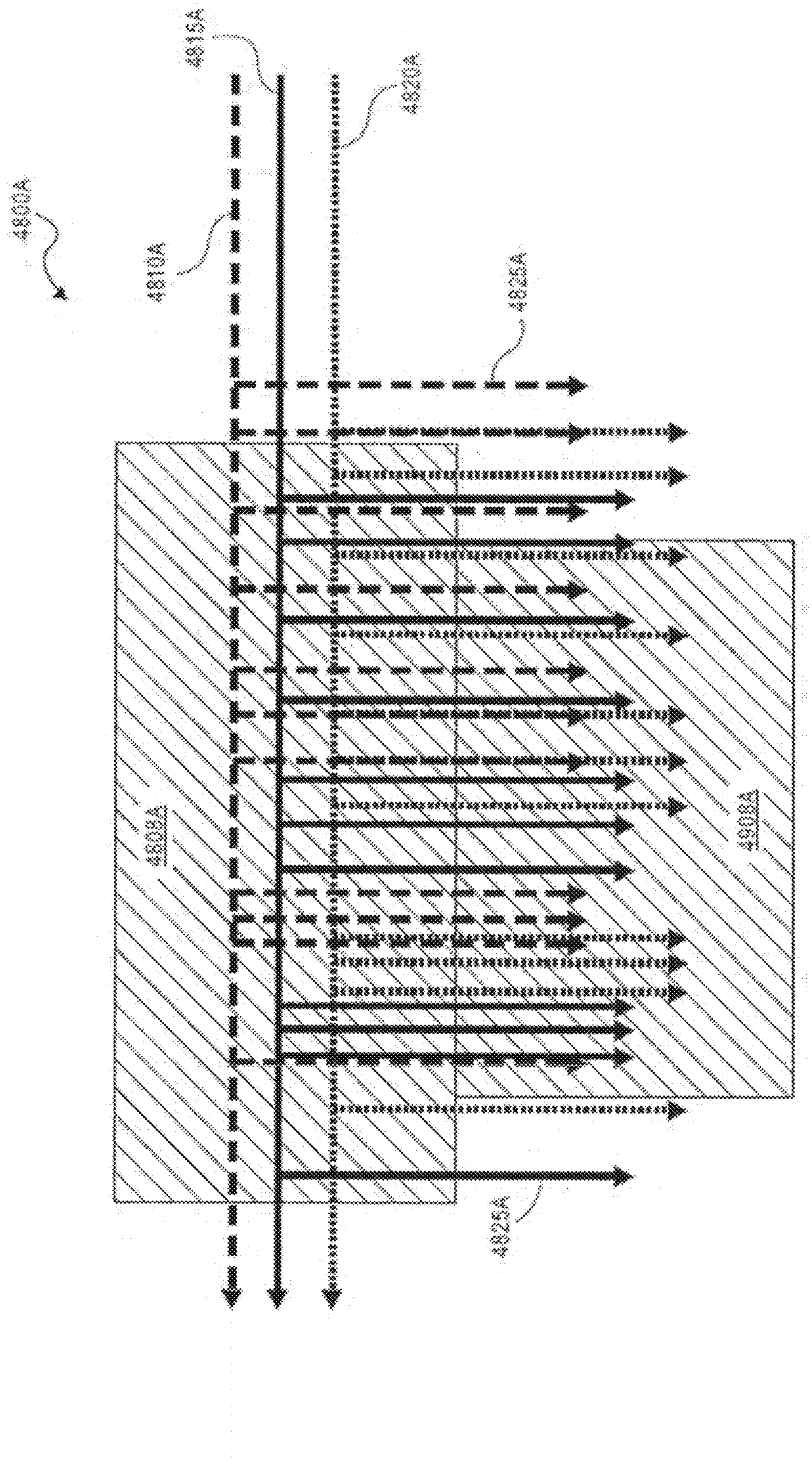
FIG. 48A is a block diagram illustrating multiple inputs into a waveguide display according to some embodiments of the present invention.

FIG. 48A is a block diagram illustrating multiple inputs into a waveguide display 4800A, in accordance with some embodiments. Waveguide display 4800A may include an OPE 4808A and an EPE 4809A, which together form a pupil expansion device. Although shown as having only an OPE 4808A and an EPE 4809A, it is contemplated that the waveguide display 4800A may include any number of in-coupling elements (e.g., diffraction gratings), such as between two and twenty. Waveguide display 4800A may receive multiple light beams 4810A, 4815A, 4820A as input. The light beams 4810A, 4815A, 4820A may be received from multiple light sources (e.g., multiple projectors). Further, the light beams 4810A, 4815A, 4820A may be spatially displaced, and may have a different near-field pattern.

Figure 48B:
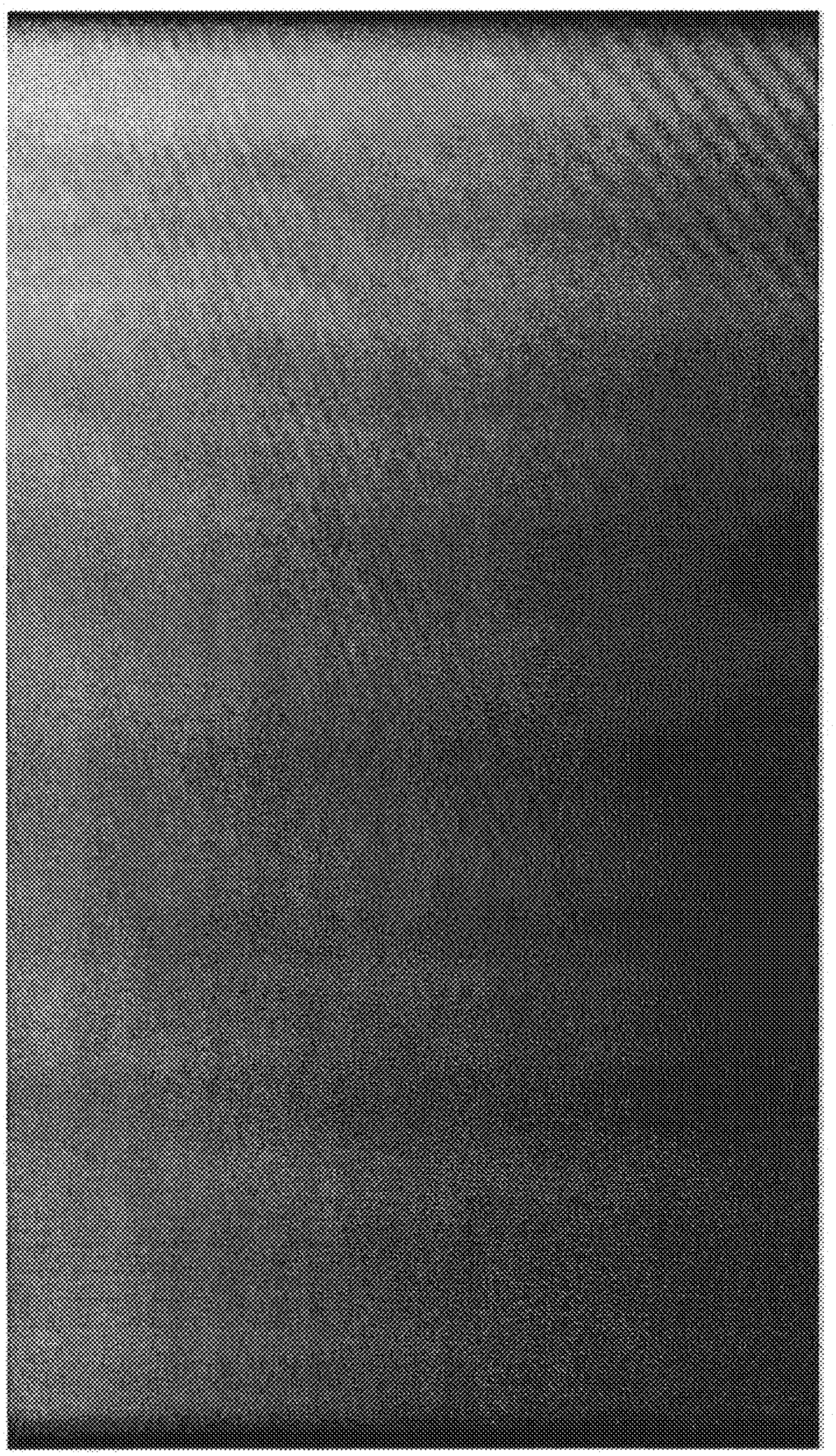
FIG. 48B is an output image from a waveguide display having multiple inputs according to some embodiments of the present invention.

Pupil expansion in the waveguide display 4800A may be performed via cloning of the input light beams 4810A, 4815A, 4820A many times in order to create many output light beams 4825A to project the image toward the user's eye. The output light beams 4825A may create an interference pattern in the output image. However, the superposition of the large number of unique interference patterns created by the many output light beams 4825A may appear substantially uniform. FIG. 48B is an output image from a waveguide display having multiple input light beams, in accordance with some embodiments. As compared to FIG. 47B, FIG. 48B is more uniform and exhibits less striations.

Figure 48C:
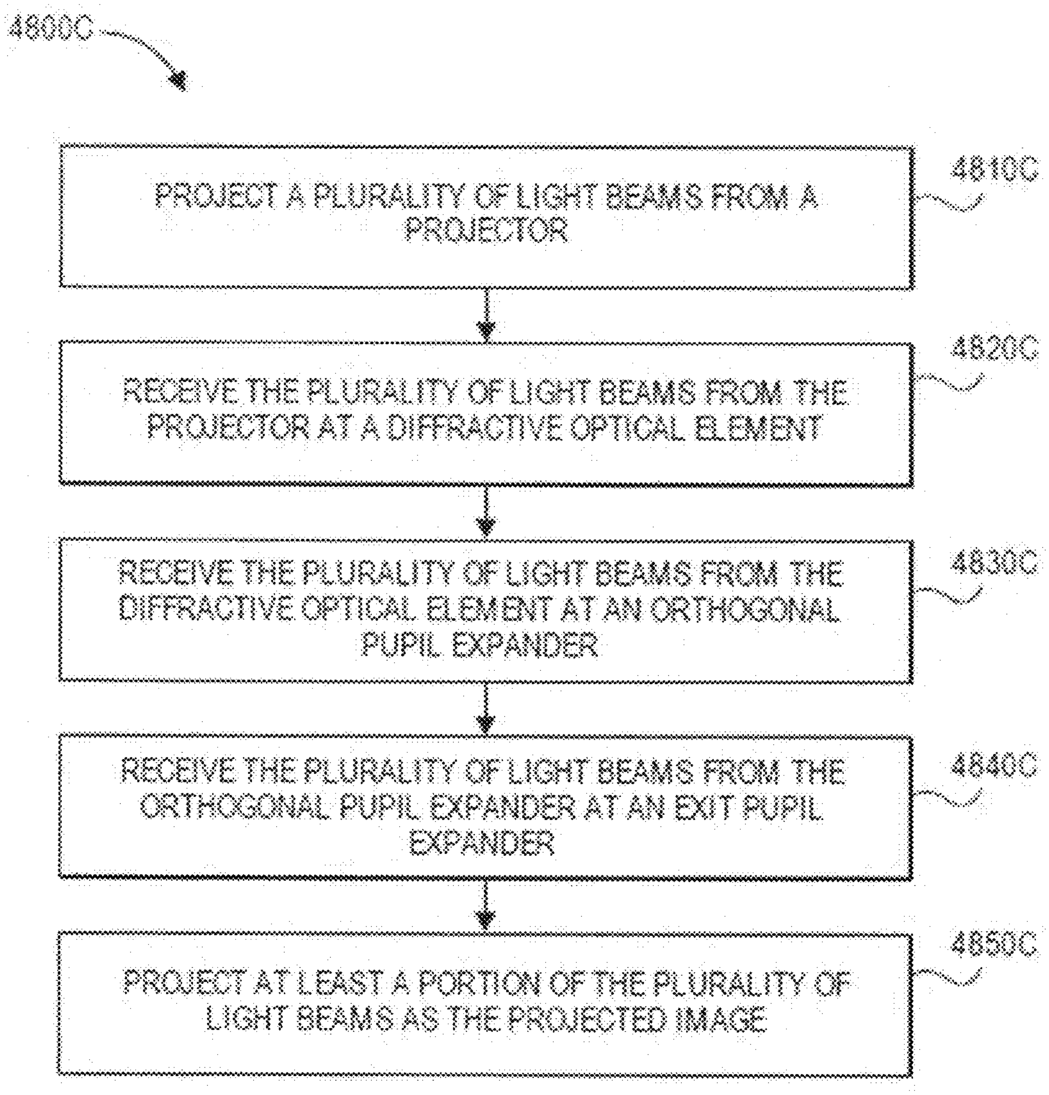
FIG. 48C is a simplified flowchart illustrating a method for generation of multiple incoherent images in a waveguide display using multiple input light beams according to some embodiments of the present invention.

FIG. 48C is a simplified flowchart illustrating a method 4800C for generation of multiple incoherent images in a waveguide display using multiple input light beams, in accordance with some embodiments. The method includes projecting a plurality of light beams from a projector (4810C). In some embodiments, the plurality of light beams are instead projected from a plurality of projectors. In some embodiments, the plurality of light beams are projected from multiple light sources within a single projector.

The method also includes receiving the plurality of light beams from the projector at a diffractive optical element (4820C). The diffractive optical element may be diffractive optical element 4640 of FIG. 46. The diffractive optical element may include a grating (e.g., an incoupling grating) that diffracts the plurality of light beams toward an OPE (e.g., OPE 4608). In some embodiments, the grating may further cause cloning of the plurality of light beams, sending a larger number of light beams into the OPE.

The method further includes receiving the plurality of light beams from the diffractive optical element at the OPE (4830C). The OPE may also include a grating that diffracts the plurality of light beams toward an EPE (e.g., EPE 4609). The grating may further cause cloning of the plurality of light beams, sending a larger number of light beams into the EPE. Additionally, the method includes receiving the plurality of light beams from the OPE at the EPE (4840C).

The method also includes projecting at least a portion of the plurality of light beams as the projected image (4850C). The plurality of light beams, which may also be referred to as the output light beams, may create an interference pattern in the projected image. However, the superposition of the large number of unique interference patterns created by the many output light beams may appear substantially uniform. The many output light beams may be a result of the multiple input light beams and the cloning of the multiple input light beams.

It should be appreciated that the specific steps illustrated in FIG. 48C provide a particular method of generating multiple incoherent images in near-to-eye display devices according to an embodiment of the present invention. Other sequences of steps may also be performed according to alternative embodiments. For example, alternative embodiments of the present invention may perform the steps outlined above in a different order. Moreover, the individual steps illustrated in FIG. 48C may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 49A:
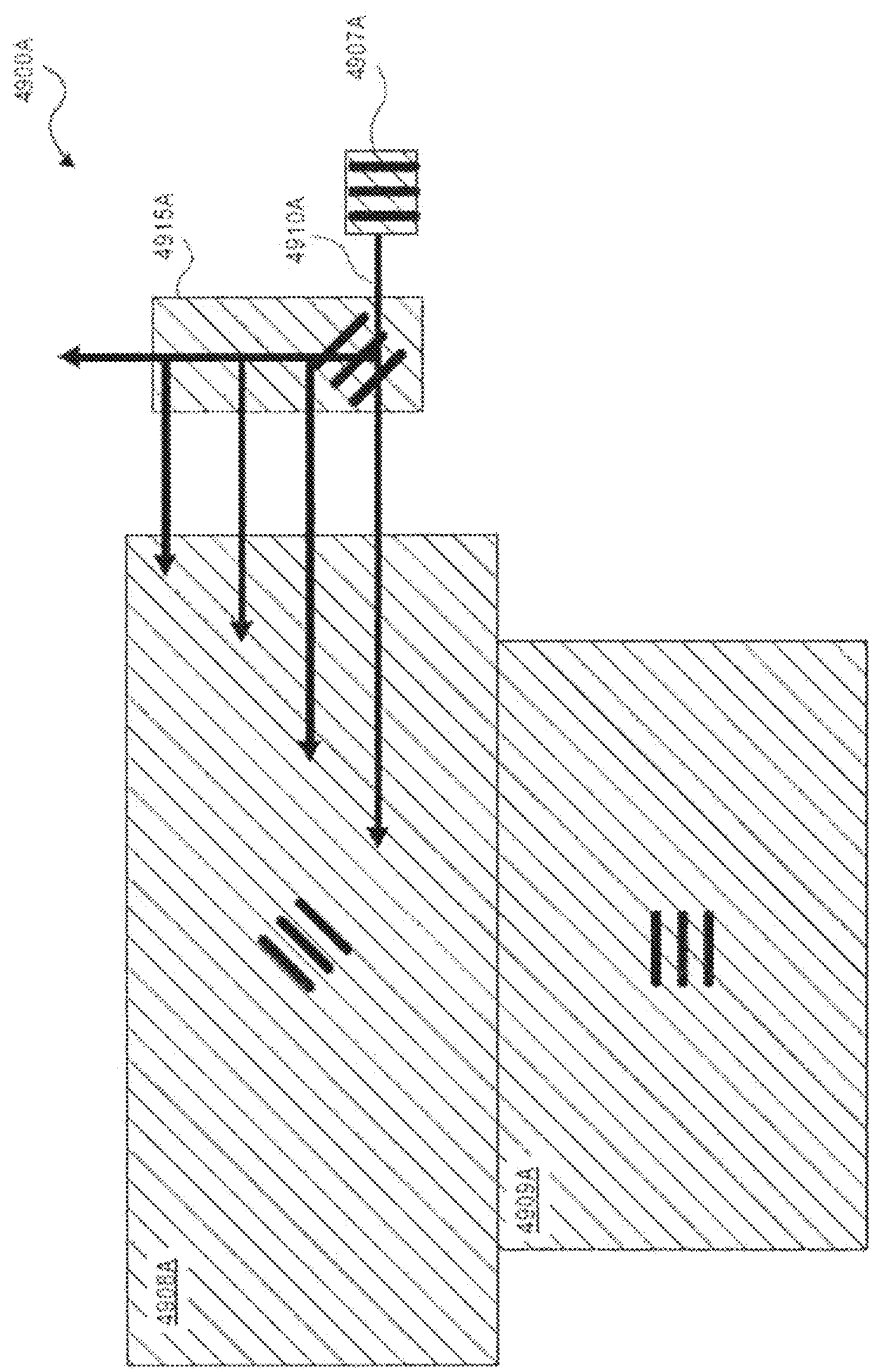
FIG. 49A is a block diagram illustrating a single input into a waveguide display utilizing a diffractive beam splitter according to some embodiments of the present invention.

FIG. 49A is a block diagram illustrating a single light beam 4910A input into a waveguide display 4900A utilizing a diffractive beam splitter 4915A, in accordance with some embodiments. Waveguide display 4900A may include an OPE 4908A and an EPE 4909A, which together form a pupil expansion device. Although shown as having only an OPE 4908A and an EPE 4909A, it is contemplated that the waveguide display 4900A may include any number of in-coupling elements. Waveguide display 4900A may receive a single light beam 4910A as input. The light beam 4910A may be received as input from a single projector (not shown).

A diffractive beam splitter 4915A may be placed downstream of the in-coupling element 4907A and may split the single light beam 4910A into multiple copies. The diffractive beam splitter 4915A may produce incoherent copies of the single light beam 4910A that are spatially separated. Thus, the incoherent copies of the single light beam 4910A may produce unique interference patterns that may sum together incoherently. In some embodiments, the diffractive beam splitter 4915A may include a periodic pattern of pitch 50 nm to 500 nm.

Figure 49B:
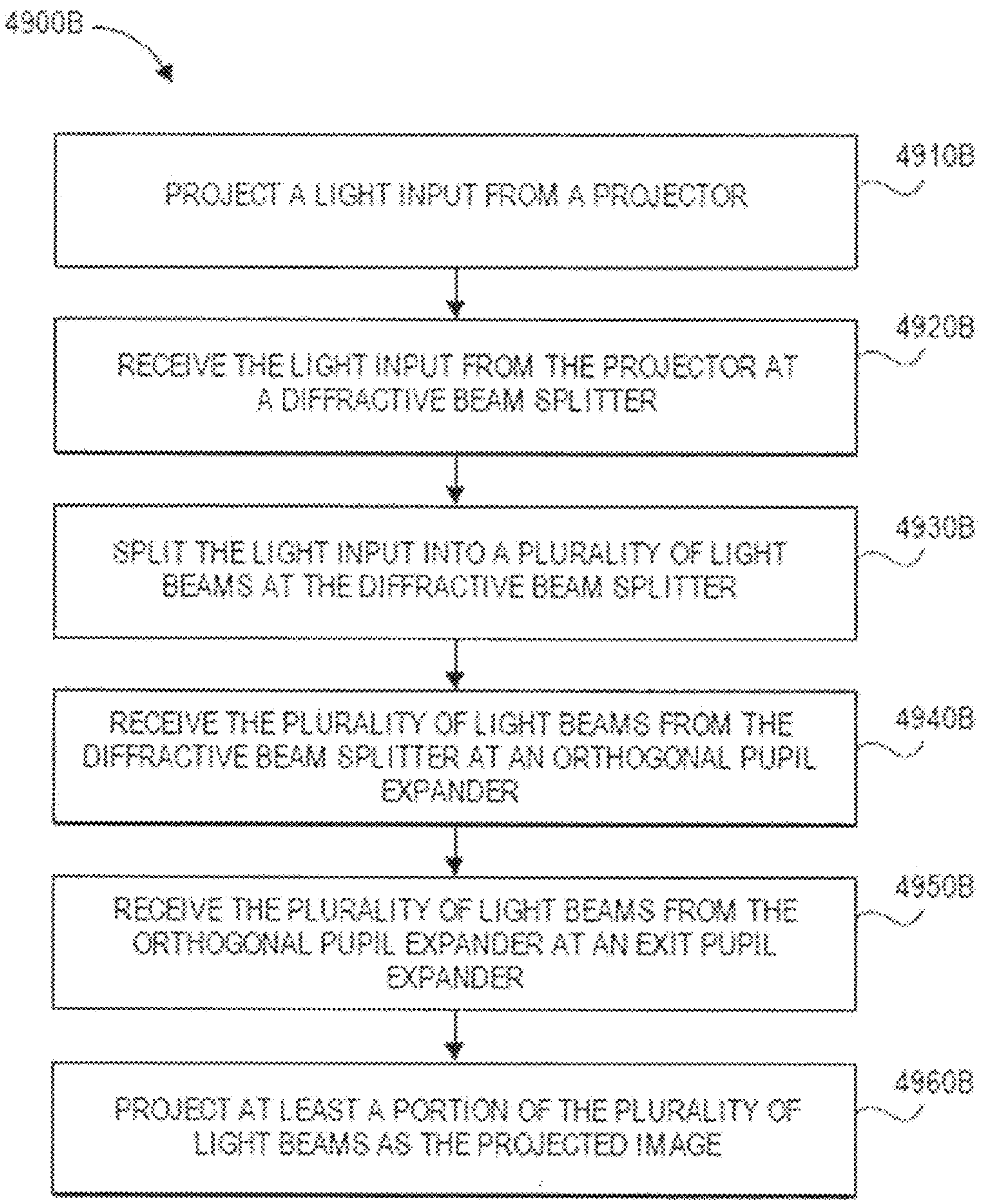
FIG. 49B is a simplified flowchart illustrating a method for generation of multiple incoherent images in a waveguide display using a diffractive beam splitter according to some embodiments of the present invention.

FIG. 49B is a simplified flowchart 4900B illustrating a method for generation of multiple incoherent images in a waveguide display using a diffractive beam splitter, in accordance with some embodiments. The method includes projecting a light input from a projector (e.g., projector 4601) (4910B). In some embodiments, the light input may include a single light beam from a single projector.

The method further includes receiving the light input from the projector at a diffractive beam splitter (e.g., diffractive beam splitter 4915A) (4920B). The method further includes splitting the light input into a plurality of light beams at the diffractive beam splitter (4930B). Specifically, the diffractive beam splitter may produce incoherent copies of the light beam that are spatially separated. Thus, the incoherent copies of the light beam may produce unique interference patterns that may sum together incoherently.

The method further includes receiving the plurality of light beams from the diffractive beam splitter at an OPE (e.g., OPE 4608) (4940B). The OPE may include a grating that diffracts the plurality of light beams toward an EPE (e.g., EPE 4609). The grating may further cause cloning of the plurality of light beams, sending a larger number of light beams into the EPE. The method further includes receiving the plurality of light beams from the OPE at the EPE (4950B).

The method further includes projecting at least a portion of the plurality of light beams as the projected image (4960B). The output light beams may create an interference pattern in the projected image. However, the superposition of the large number of unique interference patterns created by the many output light beams may appear substantially uniform. The many output light beams may be a result of the splitting and cloning of the single input light beam.

It should be appreciated that the specific steps illustrated in FIG. 49B provide a particular method of generating multiple incoherent images in near-to-eye display devices according to an embodiment of the present invention. Other sequences of steps may also be performed according to alternative embodiments. For example, alternative embodiments of the present invention may perform the steps outlined above in a different order. Moreover, the individual steps illustrated in FIG. 49B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 50A:
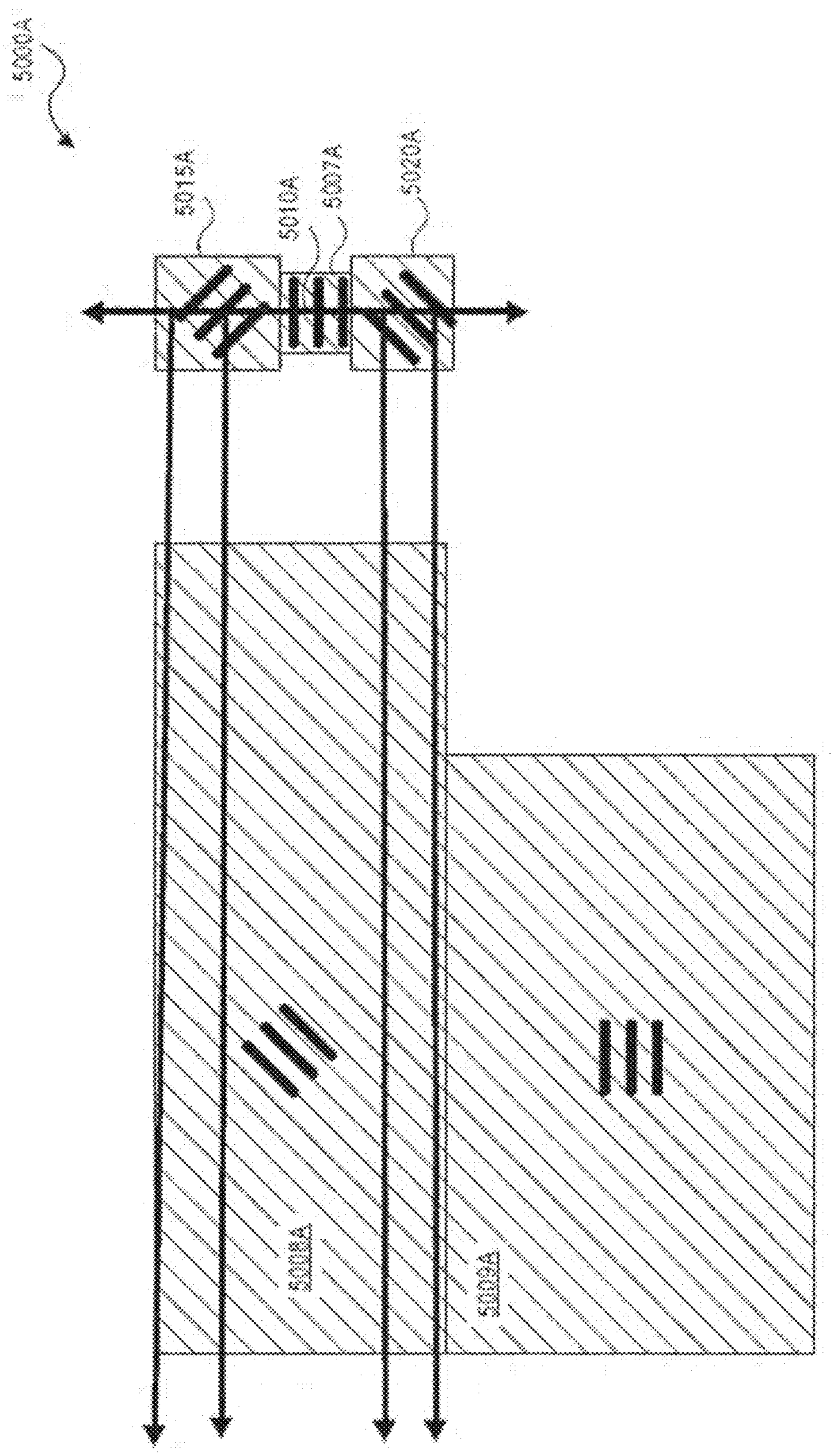
FIG. 50A is a block diagram illustrating a single input into a waveguide display utilizing multiple diffractive beam splitters according to some embodiments of the present invention.

In some embodiments, the waveguide display may include multiple diffractive elements to split the input light beam. FIG. 50A is a block diagram illustrating a single light beam 5010A input into a waveguide display 5000A utilizing two diffractive beam splitters 5015A, 5020A, in accordance with some embodiments. Although illustrated and described as having two diffractive beam splitters 5015A, 5020A, it is contemplated that any number of diffractive beam splitters may be used in accordance with the embodiments discussed herein. Waveguide display 5000A may include an OPE 5008A and an EPE 5009A, which together form a pupil expansion device. Although shown as having only an OPE 5008A and an EPE 5009A, it is contemplated that the waveguide display 5000A may include any number of in-coupling elements. Waveguide display 5000A may receive a single light beam 5010A as input. The light beam 5010A may be received as input from a single projector (not shown).

Two diffractive beam splitters 5015A, 5020A may be placed downstream of the in-coupling element 5007A and may split the single light beam 5010A into multiple copies each. The diffractive beam splitters 5015A, 5020A may produce incoherent copies of the single light beam 5010A that are spatially separated. Thus, the incoherent copies of the light beam 5010A may produce unique interference patterns that may sum together incoherently. In some embodiments, the diffractive beam splitters 5015A, 5020A may include a periodic pattern of pitch 50 nm to 500 nm.

Figure 50B:
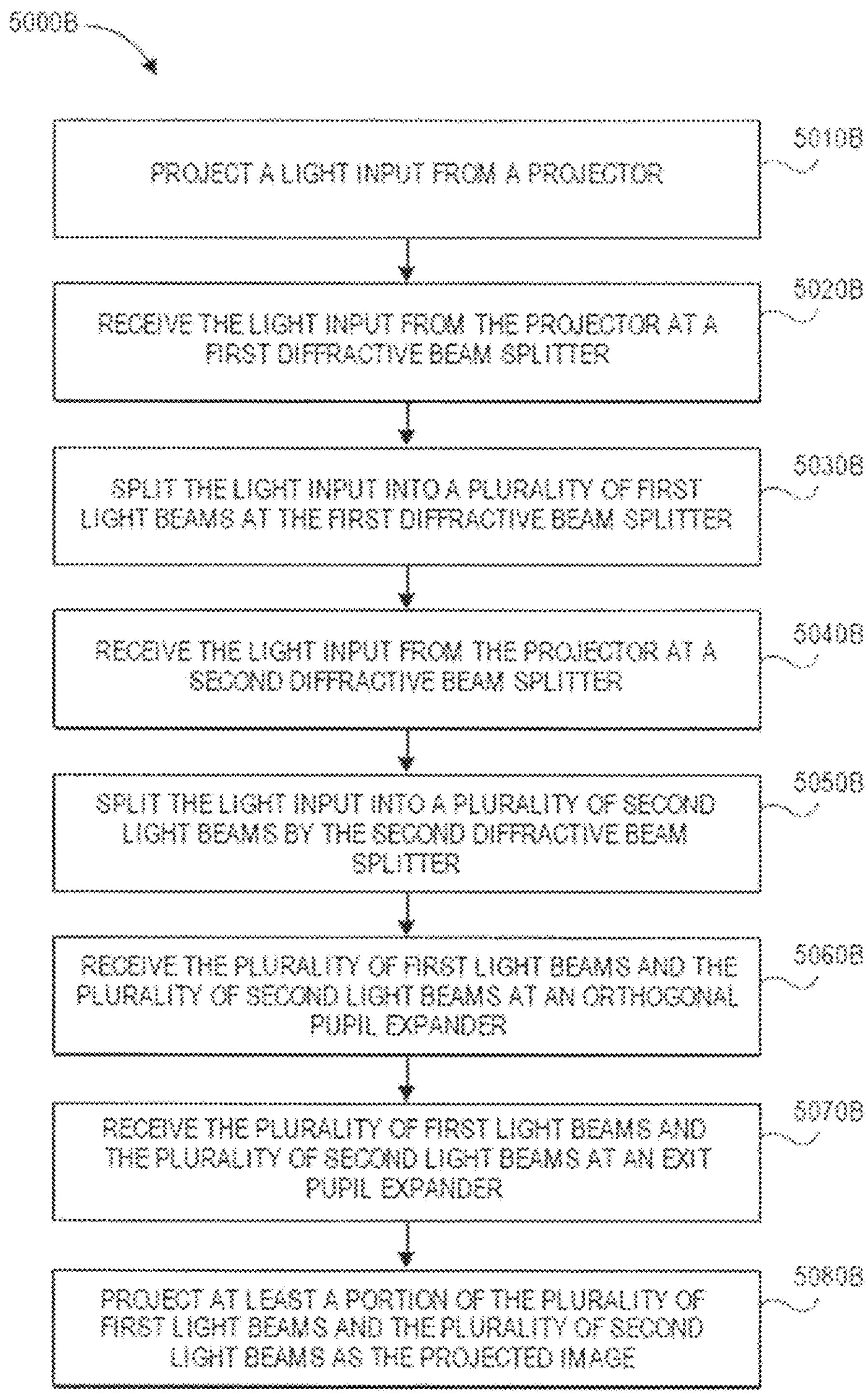
FIG. 50B is a simplified flowchart illustrating a method for generation of multiple incoherent images in a waveguide display using multiple diffractive beam splitters according to some embodiments of the present invention.

FIG. 50B is a simplified flowchart 5000B illustrating a method for generation of multiple incoherent images in a waveguide display using multiple diffractive beam splitters, in accordance with some embodiments. The method includes projecting a light input from a projector (e.g., projector 4601) (5010B). In some embodiments, the light input may include a single light beam from a single projector.

The method further includes receiving the light input from the projector at a first diffractive beam splitter (e.g., diffractive beam splitter 5015A) (5020B). The method further includes splitting the light input into a plurality of first light beams at the first diffractive beam splitter (5030B). Specifically, the first diffractive beam splitter may produce incoherent copies of the light beam that are spatially separated. Thus, the incoherent copies of the light beam may produce unique interference patterns that may sum together incoherently.

The method further includes receiving the light input from the projector at a second diffractive beam splitter (e.g., diffractive beam splitter 5020A) (5040B). The method further includes splitting the light input into a plurality of second light beams at the second diffractive beam splitter (950). Specifically, the second diffractive beam splitter may produce incoherent copies of the light beam that are spatially separated. Thus, the incoherent copies of the light beam may produce unique interference patterns that may sum together incoherently.

The method further includes receiving the plurality of first light beams and the plurality of second light beams from the first and second diffractive beam splitter, respectively, at an OPE (e.g., OPE 5008A) (5060B). The OPE may include a grating that diffracts the plurality of first light beams and the plurality of second light beams toward an EPE (e.g., EPE 5009A). The grating may further cause cloning of the plurality of first light beams and the plurality of second light beams, sending a larger number of light beams into the EPE. The method further includes receiving the plurality of first light beams and the plurality of second light beams from the OPE at the EPE (5070B).

The method further includes projecting at least a portion of the plurality of first light beams and the plurality of second light beams as the projected image (5080B). The output light beams may create an interference pattern in the projected image. However, the superposition of the large number of unique interference patterns created by the many output light beams may appear substantially uniform. The many output light beams may be a result of the splitting and cloning of the single input light beam.

It should be appreciated that the specific steps illustrated in FIG. 50B provide a particular method of generating multiple incoherent images in near-to-eye display devices according to an embodiment of the present invention. Other sequences of steps may also be performed according to alternative embodiments. For example, alternative embodiments of the present invention may perform the steps outlined above in a different order. Moreover, the individual steps illustrated in FIG. 50B may include multiple sub-steps that may be performed in various sequences as appropriate to the individual step. Furthermore, additional steps may be added or removed depending on the particular applications. One of ordinary skill in the art would recognize many variations, modifications, and alternatives.

It is contemplated that the various embodiments described above may be implemented alone or in any combination. For example, it is contemplated that multiple input light beams may be used in a waveguide display in combination with one or more diffractive beam splitters. Further, although described herein as being applicable to near-to-eye displays (e.g., mixed reality, virtual reality, and/or augmented reality wearable devices), it is contemplated that embodiments of the invention may be utilized in far-eye displays (e.g., car windshields), infrared illuminators for eye tracking, three dimensional depth sensing, and/or other computer vision systems.

Suppressing Reflections from Telecentric Projectors

According to some embodiments, systems and methods for suppressing reflections from telecentric projectors in near-to-eye display devices are provided. A diffractive optical element may be used to couple light from the telecentric projector into a waveguide-based near-to-eye display device. Reflections may be prevented from propagating back toward the telecentric projector through one or more of a variety of techniques, such as by implementing gratings on the diffractive optical element.

A telecentric projector is desirable to enable a large field of view near-to-eye display, but is typically plagued by "ghost" image artifacts resultant from back-and-forth reflections between the projector and the waveguide display. There are two conventional techniques to remove reflections in other optical systems that are poor choices in near-to-eye displays. First, a non-telecentric projector may be used, but this may increase the size and weight of the display assembly and significantly limit the maximum field of view of the display. Second, an optical isolator may be used based on a circular polarizer. Circular polarizers work well to prevent back reflections from devices without nano-patterning, like the reflection of light from bare glass or a partial mirror. However, an optical isolator comprising a circular polarizer may be incompatible with the polarization response of diffractive optical elements like 1D gratings that are used in conventional near-to-eye displays. Diffractive components like 1D gratings that are typically used in waveguide displays exhibit high polarization sensitivity, very dissimilar to the polarization response of bare glass without nano-patterning. Embodiments of the invention may use diffractive optical elements that have symmetric polarization responses to mimic that of bare glass that in conjunction with a circular polarizer may successfully remove reflections between a waveguide display and a projector. Further, the unique diffractive optical elements used in embodiments of the invention have an asymmetric in-coupling efficiency to enable a high efficiency of optical coupling to the consequent optical elements within the waveguide display.

Figure 51A:
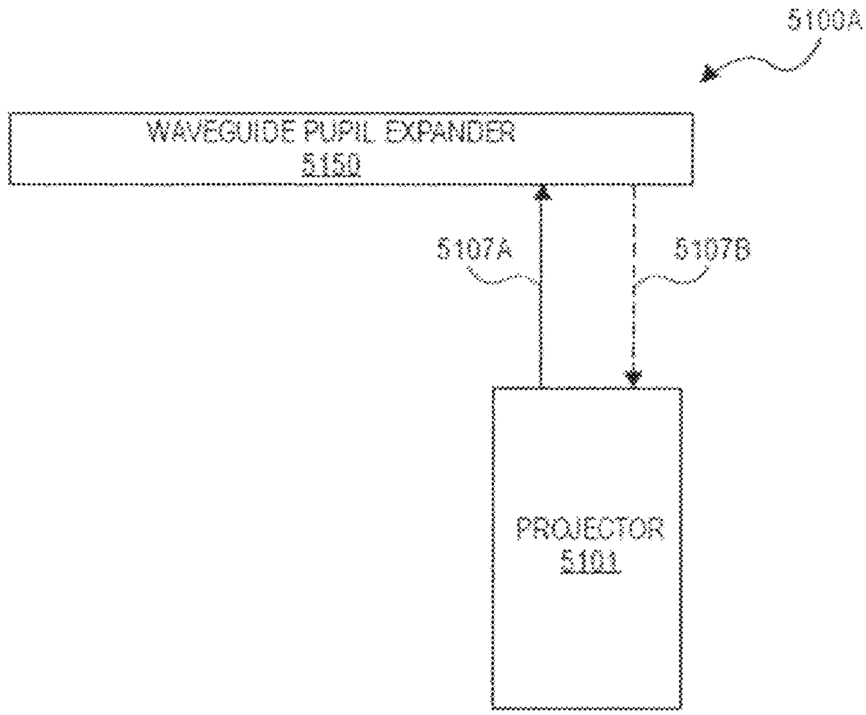
FIG. 51A is a block diagram illustrating a telecentric projector system according to some embodiments of the present invention.

FIG. 51A is a block diagram illustrating a telecentric projector system 5100A, in accordance with some embodiments. Telecentric projector system 5100A may include a projector 5101 and a waveguide display element 5150. The waveguide display element 5150 may include an incoupling grating, an OPE region, and an EPE region, as described further herein. The projector 5101 and the waveguide display element 5150 may be included in a near-to-eye display device, in some embodiments.

The projector 5101 of FIG. 51A is telecentric in that the optical axis of the projector 5101 is coincident with the optical axis of subsequent light manipulation devices (e.g., the waveguide display element 5150). For example, in FIG. 51A, the projector 5101 may project light 5107A perpendicularly to the plane of the waveguide display element 5150. Because of the telecentric orientation, a reflection 5107B of light 5107A may propagate back into the projector 5101 from the waveguide display element 5150. This may cause image artifacts when the reflection 5107B exits the projector 5101 again. These image artifacts may manifest as "ghost" images that may appear as shifted, mirrored or copies of the intended image overlaid upon the intended image. These image artifacts may be distracting and lower the contrast of the overall display system.

Figure 51B:
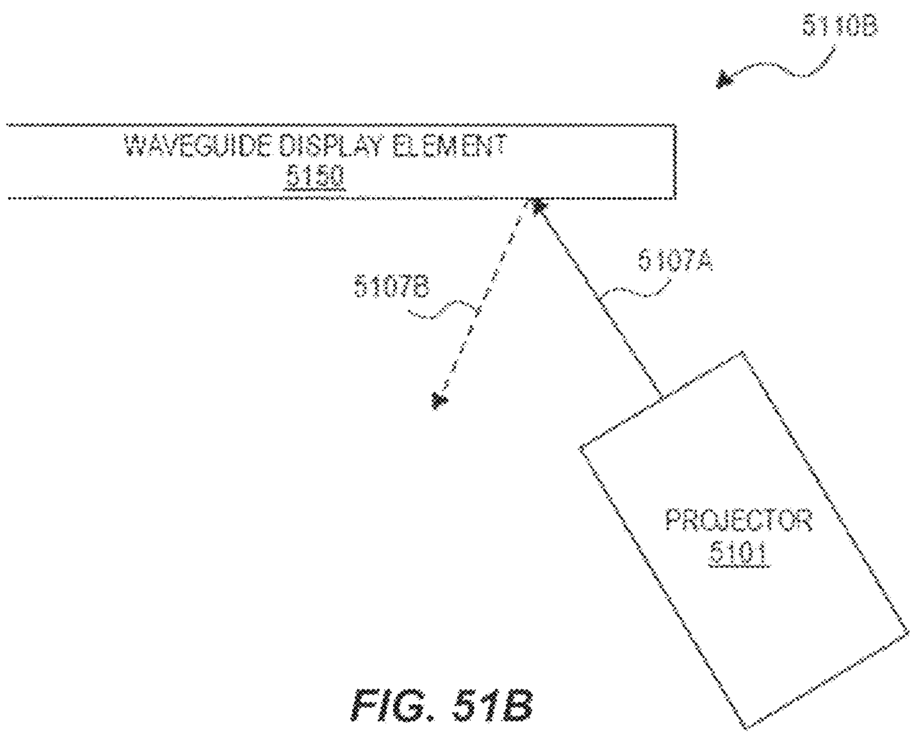
FIG. 51B is a block diagram illustrating a non-telecentric projector system according to some embodiments of the present invention.

One approach to solving problems associated with image artifacts involves using a non-telecentric configuration. FIG. 51B is a block diagram illustrating a non-telecentric projector system 5110B, in accordance with some embodiments. Non-telecentric projector system 5110B may include a projector 5101 and a waveguide display element 5150. The projector 5101 and the waveguide display element 5150 may be included in a near-to-eye display device, in some embodiments.

The projector 5101 of FIG. 51B is non-telecentric in that the optical axis of the projector 5101 is not aligned with the optical axis of subsequent light manipulation devices (e.g., the waveguide display element 5150). For example, in FIG. 51B, the projector 5101 may be oriented at an angle with respect to the perpendicular direction to the waveguide display element 5150. Because of the non-telecentric orientation, a reflection 5107B of light 5107A may be propagated by the waveguide display element 5150 partially or fully away from the projector 5101. However, the non-telecentric configuration may make the design of the projector 5101 more complicated, because aberrations such as chromatic dispersion and field curvature may become more pronounced. In addition, the projector 5101 in a non-telecentric configuration may need to be larger than a projector in a telecentric configuration, and may limit field-of-view to the eyepiece.

Thus, systems and methods are needed for suppressing reflections from telecentric projectors in near-to-eye display devices. Embodiments of the invention meet this need and others by implementing a circular polarizer between a telecentric projector and subsequent light manipulation devices (e.g., a diffractive in coupling element, a waveguide pupil expander, etc.). Further, embodiments of the invention may implement a diffractive in coupling element that exhibits its reflection of circular polarization in a particular polarization handedness (e.g., right-handed or clockwise, left-handed or counterclockwise) with extremely low efficiency into the same direction.

Figure 52:
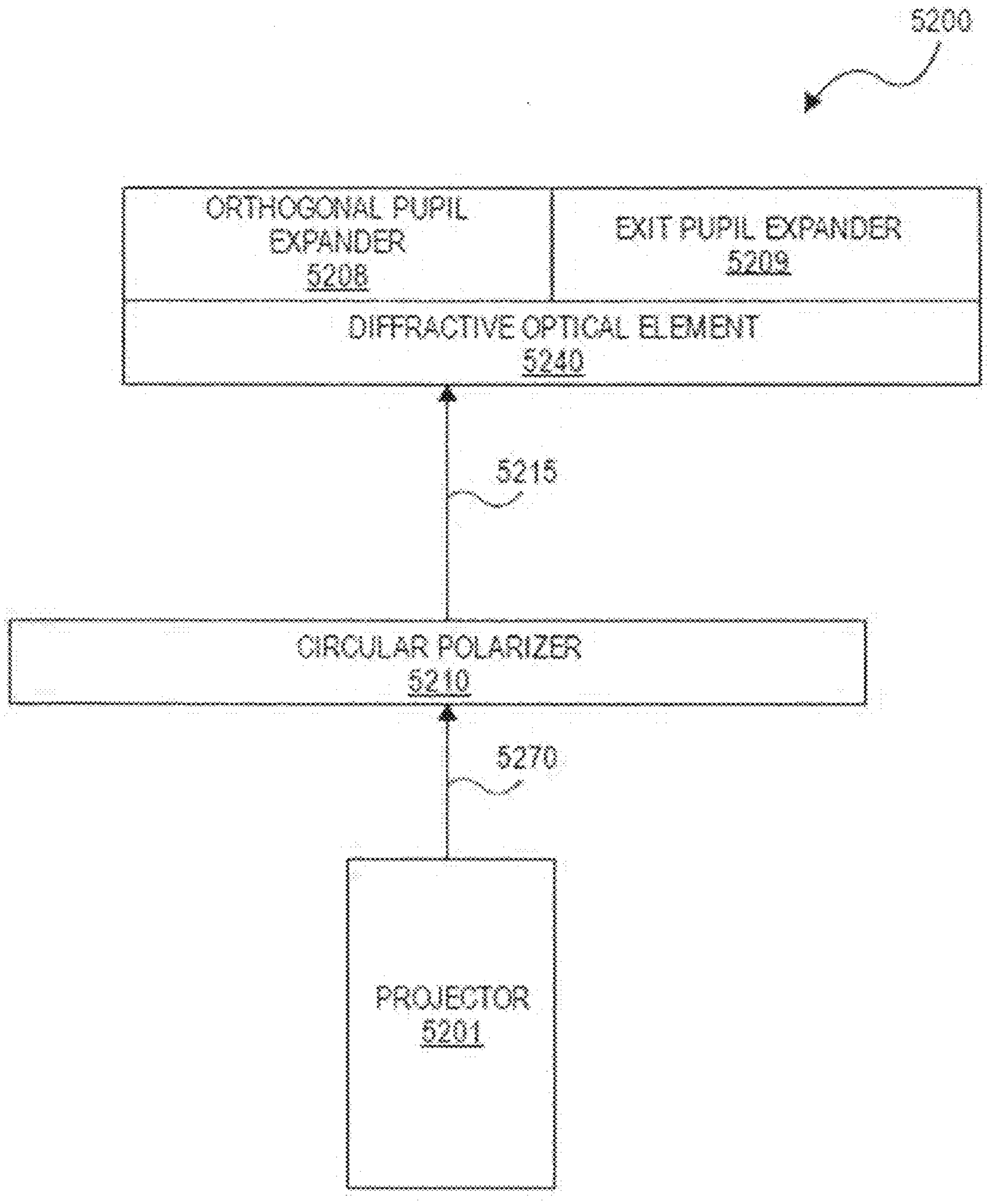
FIG. 52 is a block diagram illustrating a system for suppressing reflections from a telecentric projector in a near-to-eye display device according to some embodiments of the present invention.

FIG. 52 is a block diagram illustrating a system 5200 for suppressing reflections from a telecentric projector 5201 in a near-to-eye display device, in accordance with some embodiments. The system 5200 may include a projector 5201, a circular polarizer 5210, a diffractive optical element 5240, an orthogonal pupil expander 5208, and an exit pupil expander 5209. The diffractive optical element 5240 may include an incoupling grating, as described further herein. In some embodiments, the system 5200 may be included in a near-to-eye display device, such as a head mounted device. Although shown and described as being external to the projector 5201, it is contemplated that the circular polarizer 5210 may be positioned internal to the projector 5201 in some embodiments. In some embodiments, the projector 5201 may include a polarization rotation-based spatial light modulator.

The system 5200 may include a projector 5201 that is designed to project telecentrically, coupled with an orthogonal pupil expander 5208 and exit pupil expander 5209 via a diffractive optical element 5240 located one or more surfaces of the orthogonal pupil expander 5208 and exit pupil expander 5209. These elements may be elements of a waveguide display element, as described further herein. Although shown as only being located on one surface of the orthogonal pupil expander 5208 and exit pupil expander 5209 in FIG. 52, it is contemplated that the diffractive optical element 5240 may be located on two or more surfaces of the orthogonal pupil expander 5208 and exit pupil expander 5209. Further, although shown as fully covering one surface of the orthogonal pupil expander 5208 and exit pupil expander 5209, it is contemplated that the diffractive optical element 5240 may alternatively or additionally cover portions of one or more surfaces of the orthogonal pupil expander 5208 and exit pupil expander 5209.

The optical axis of the projector 5201 may be aligned to the surface normal to the diffractive optical element 5240 and/or the orthogonal pupil expander 5208 and exit pupil expander 5209. A circular polarizer 5210 may be inserted between the diffractive optical element 5240 and the projector 5201. The projector 5201 may project light 5207 onto the circular polarizer 5210. The circular polarizer 5210 may receive the light 5207, circularly polarize the light 5207 into circularly polarized light, and emit light 5215 that is circularly polarized in a particular handedness (e.g., right-handed or clockwise, left-handed or counterclockwise). In some embodiments, the circularly polarized light 5215 may be circularly polarized for a plurality of field-of-view directions. The diffractive optical element 5240 may be designed to couple this circularly polarized light 5215 into totally internally reflected modes of the orthogonal pupil expander 5208 and exit pupil expander 5209.

The circular polarizer 5210 may be implemented by any of a variety of components that have high extinction ratio and may include transparent and/or absorbing materials. For example, the circular polarizer 5210 may include a linear polarizer and a quarter wave plate. In another example, the circular polarizer 5210 may include a zeroth or higher order dichroic polarizer. In another example, the circular polarizer may include a thin film stack of birefringent materials. Hypothetically speaking, if the orthogonal pupil expander 5208, exit pupil expander 5209 and the diffractive optical element 5240 were replaced by a perfect planar mirror oriented with its surface normal aligned with the axis of the projector 5201, then the circularly polarized light 5215 emerging from the circular polarizer 5210 would reflect from the mirror and propagate back toward the projector 5201, with the reflection having an opposite polarization handedness than the circularly polarized light 5215 (e.g., clockwise and counterclockwise). Thus, the circular polarizer 5210 may be selected or configured to absorb incident light having the opposite polarization handedness.

The diffractive optical element 5240 may be designed such that the circularly polarized light 5215 emerging from the circular polarizer 5210 reflects with low efficiency into the same polarization handedness, such that if there is any reflection, it is characterized by the opposite polarization handedness, and may be absorbed by the circular polarizer 5210 after reflection from the diffractive optical element 5240, the orthogonal pupil expander 5208 and/or the exit pupil expander 5209. The geometric structure of the diffractive optical element 5240 may be designed to achieve the desired polarization characteristics. In some embodiments, the diffractive optical element 5240 may include a grating. For example, blazed gratings with a flat top or bottom or crossed grating structures may be implemented on the diffractive optical element 5240, as described further herein. Binary lamellar or blazed gratings with one-dimensional periodicity may be polarization selective with respect to linearly polarized light along or perpendicular to the grating grooves.

In some embodiments, the diffractive optical element 5240 may include polarization-insensitive lattice symmetry. Complete polarization insensitivity may be achieved with gratings with a high degree of symmetry. These gratings may include lattices with square or triangular symmetry, in which the unit cells are squares or regular hexagons. The scattering element within each unit cell may be formed by squares, crosses, octagons, or any other shape having C4 symmetry in the square lattice example. In the triangular lattice example, the scattering element may have C6 symmetry. These gratings may have reflection characteristics that are similar to that of a flat planar interface. Additional description related to the use of circular polarizers is provided in relation to FIG. 95A and the associated description.

Figure 53A:
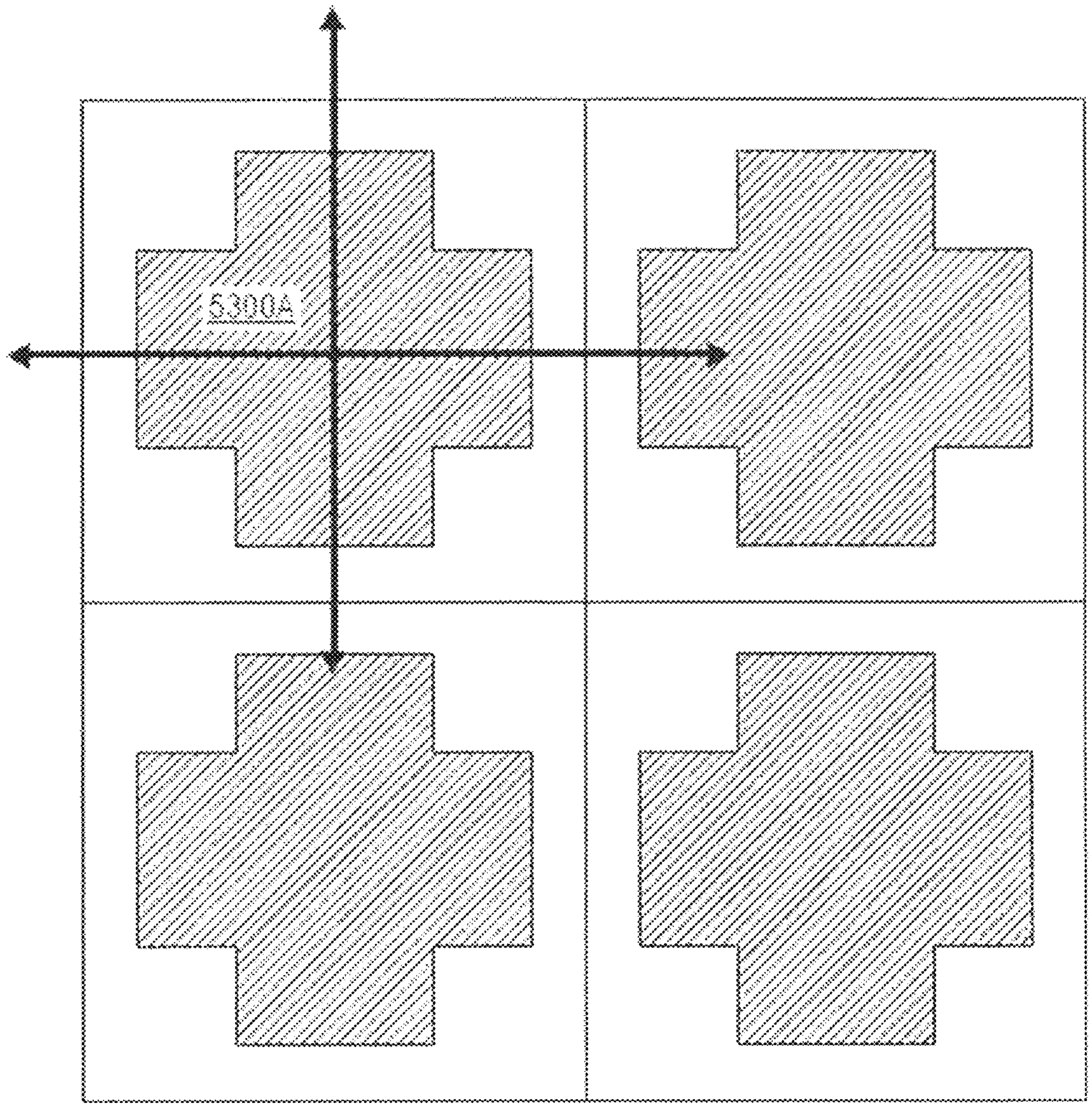
FIG. 53A is a block diagram illustrating a square lattice grating structure on a diffractive optical element according to some embodiments of the present invention.

FIG. 53A is a block diagram illustrating a square lattice grating structure on a diffractive optical element, in accordance with some embodiments. The square lattice grating structure may include a plurality of square lattice elements 5300A. The square lattice element 5300A may have C4 symmetry. Further, the square lattice element 5300A may diffract light substantially equally in the arrowed directions (e.g., horizontally and vertically).

Figure 53B:
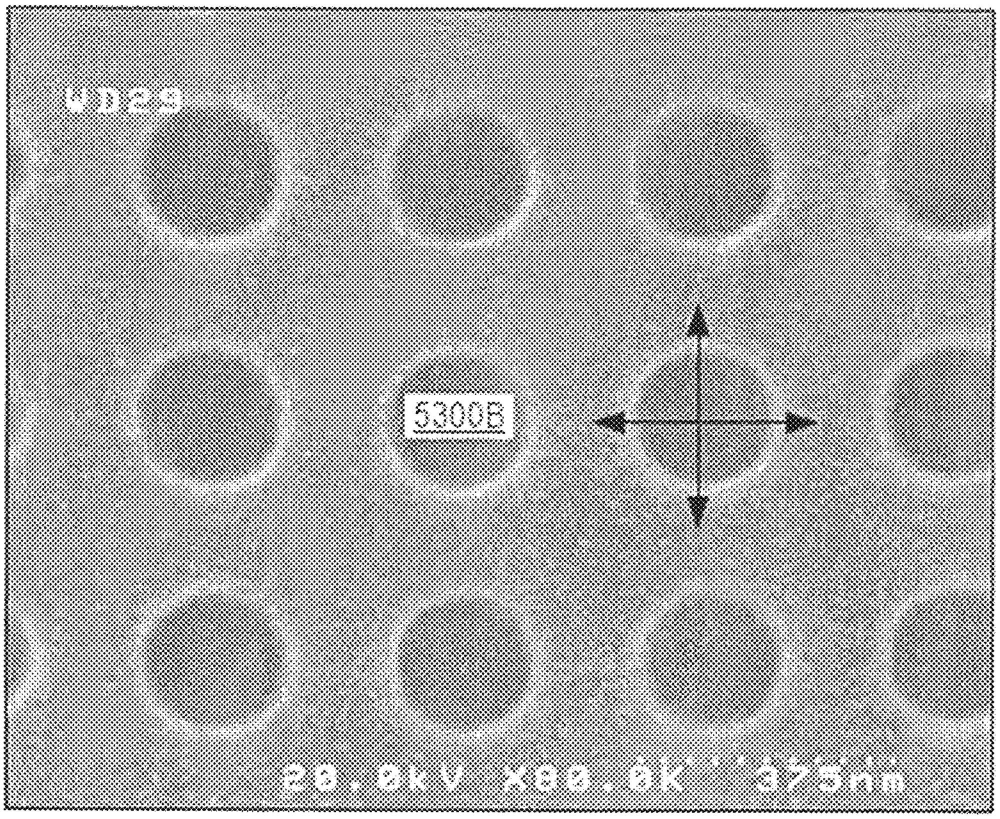
FIG. 53B is a photograph illustrating a circular round element grating structure on a diffractive optical element according to some embodiments of the present invention.

FIG. 53B is a photograph illustrating a circular round element grating structure on a diffractive optical element, in accordance with some embodiments. The circular round element grating structure may include a plurality of circular lattice elements 5300B. The circular lattice element 5300B may have C4 symmetry. Further, the circular lattice element 5300B may diffract light substantially equally in the arrowed directions (e.g., horizontally and vertically).

In some embodiments, the diffractive optical element may include a binary, multiple level, or blazed grating. The grating may be "crossed" or "cross-cut". For example, a blazed grating may have grooves etched perpendicular to the blazed grooves. To optimize diffraction efficiency, the period of the perpendicular grooves may be below the wavelength of light to suppress diffraction along the perpendicular direction. The exact value of the period may depend on the designed field-of-view of the near-to-eye display device, but may be less than the primary grating pitch.

Figure 54A:
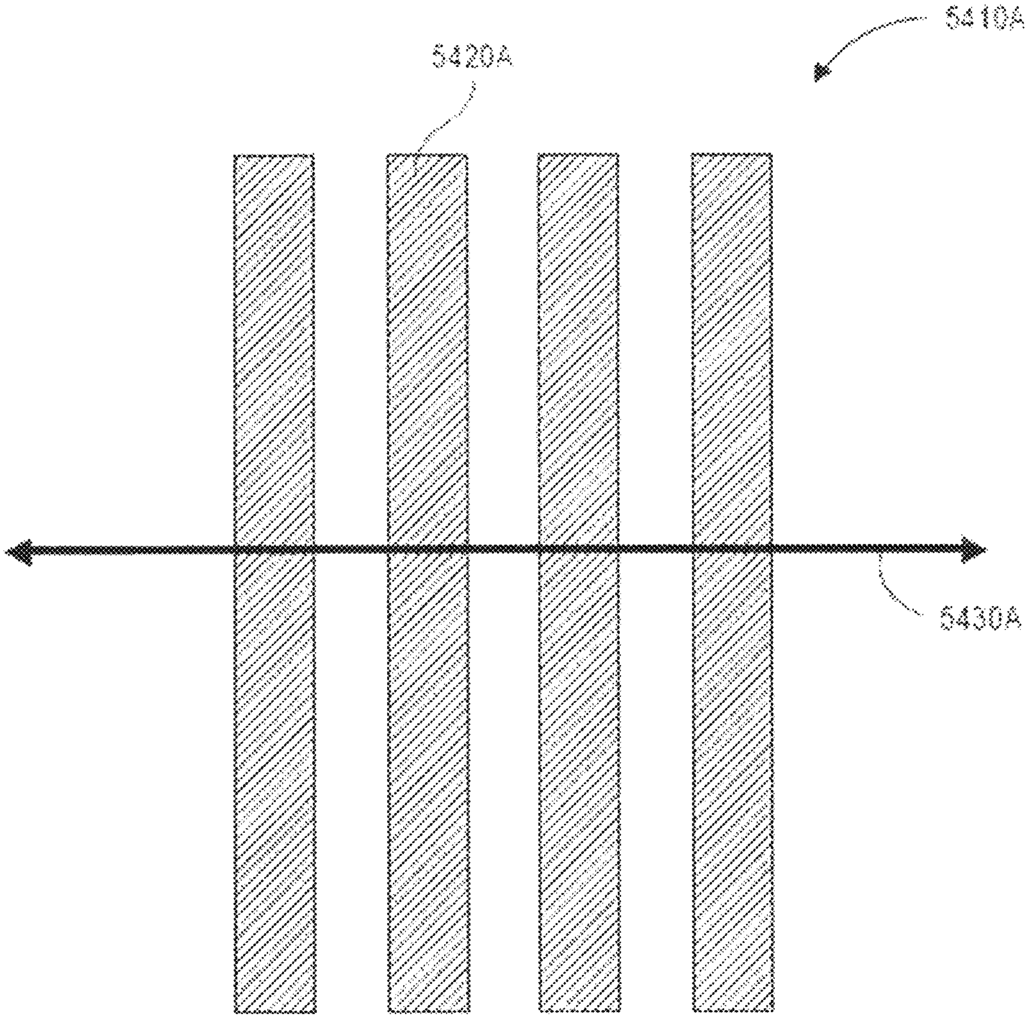
FIG. 54A is a top view of binary grating ridges of a diffractive optical element according to some embodiments of the present invention.
Figure 54B:
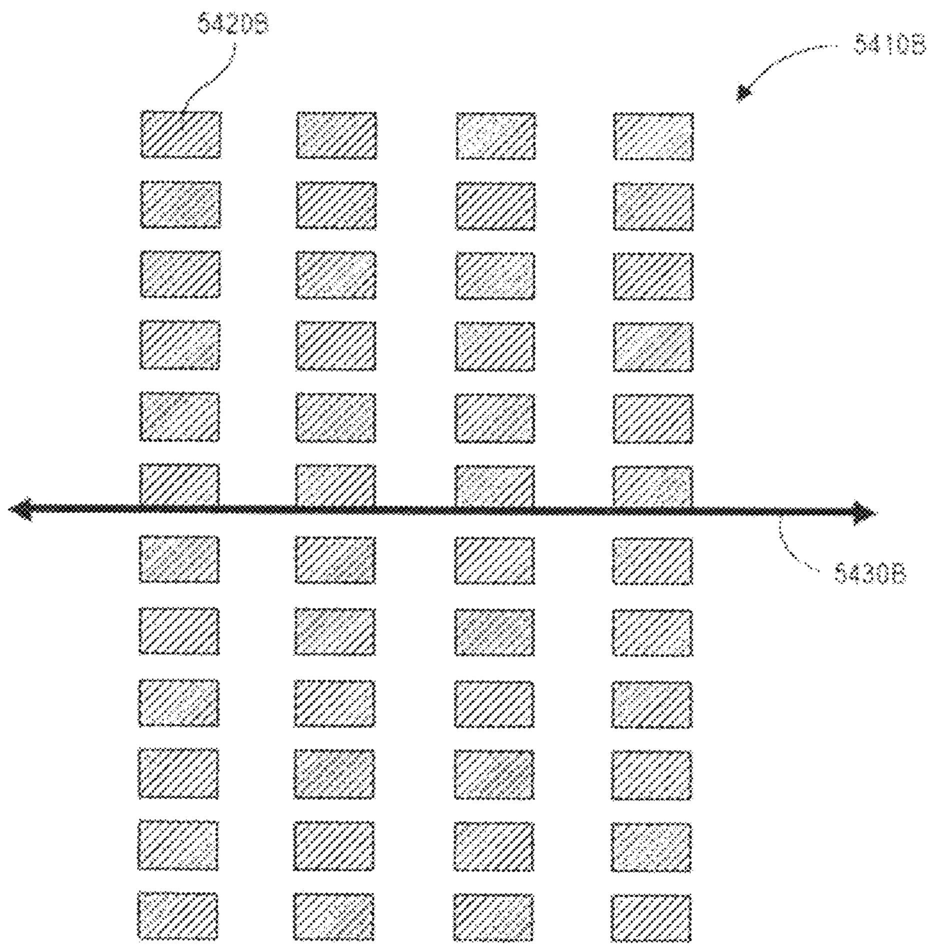
FIG. 54B is a top review of cross-cut binary grating ridges of a diffractive optical element according to some embodiments of the present invention.

FIG. 54A is a top view of binary grating ridges 5420A of a diffractive optical element 5410A, in accordance with some embodiments. The binary grating ridges 5420A may diffract light 5430A equally in the arrowed directions. FIG. 54B is a top view of cross-cut binary grating ridges 5420B of a diffractive optical element 5410B, in accordance with some embodiments. The cross-cut binary grating ridges 5420B of FIG. 54B may be produced by cutting fine lines into the binary grating ridges 5420A of FIG. 54A. The cross-cut binary grating ridges 5420B may have reduced polarization sensitivity, but still diffract light 5430B equally in the arrowed directions. Further, the cross-cut binary grating ridges 5420B may suppress diffraction while simultaneously reducing the reflection into the same polarization state as injected light. The gratings shown in FIGS. 54A and 54B may diffract equally into only two directions, rather than four or six for a lattice with high symmetry.

Figure 55:
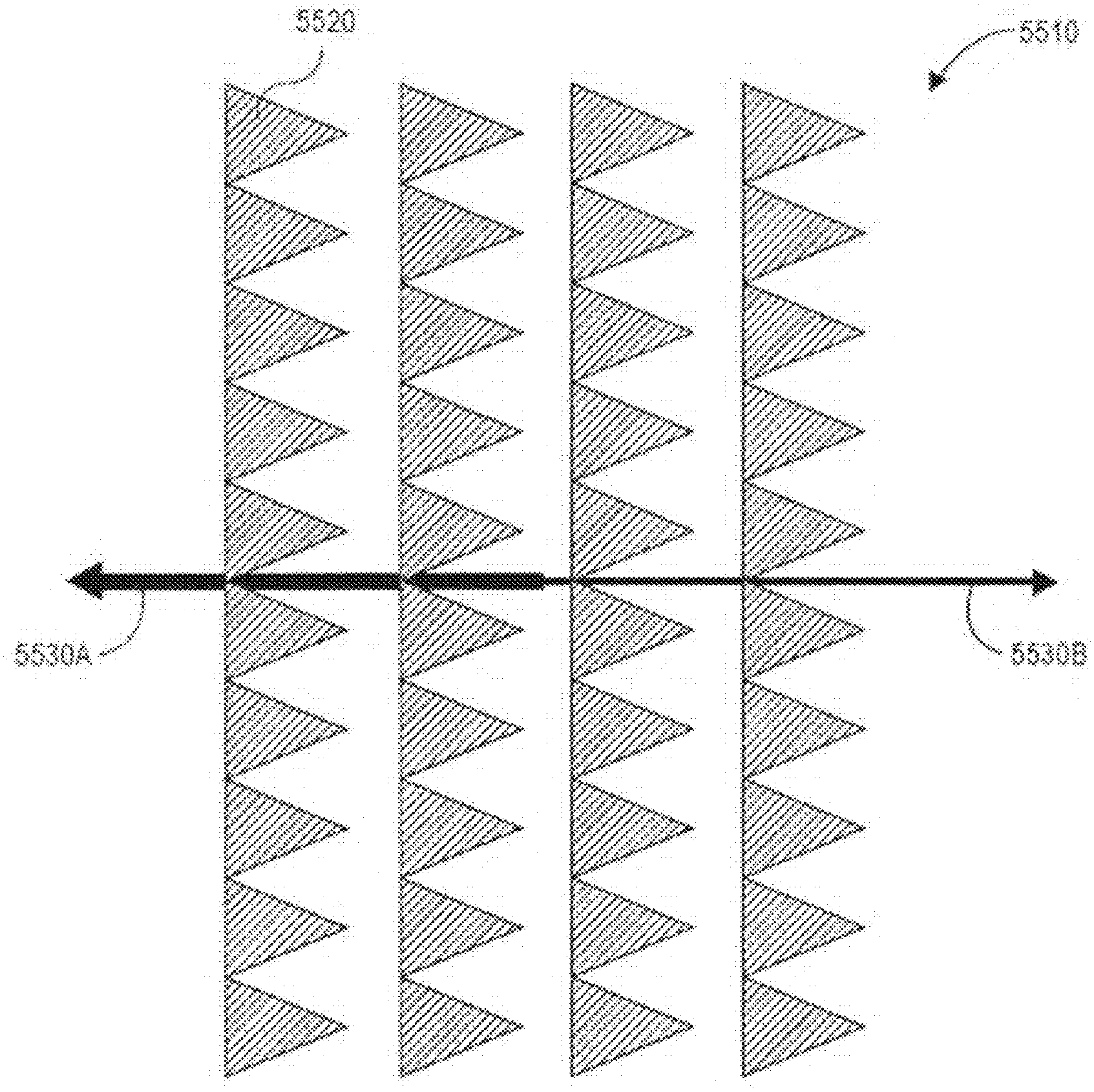
FIG. 55 is a top view of cross-cut biased grating ridges of a diffractive optical element according to some embodiments of the present invention.
Figure 56:
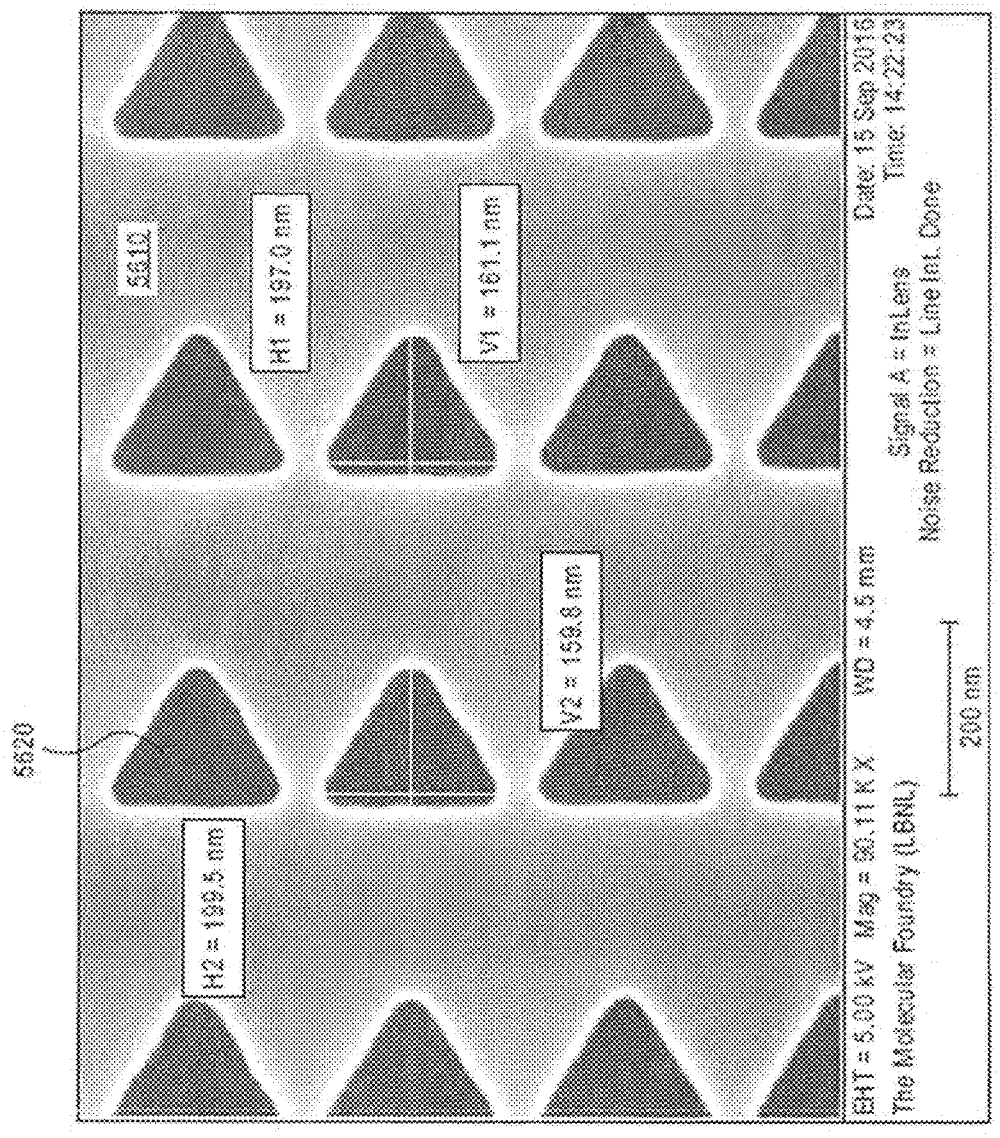
FIG. 56 is a photograph illustrating a triangular element grating structure on a diffractive optical element according to some embodiments of the present invention.
Figure 57:
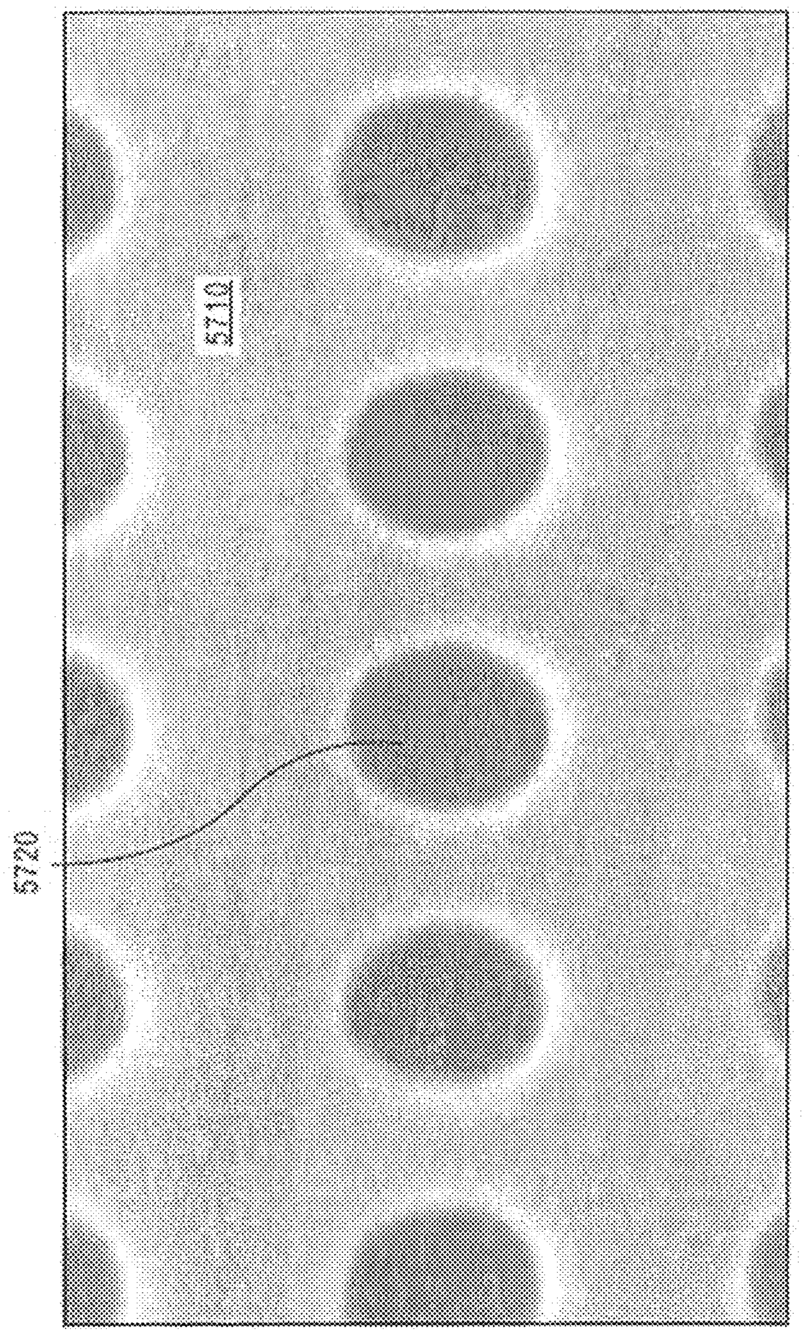
FIG. 57 is a photograph illustrating an oval element grating structure on a diffractive optical element according to some embodiments of the present invention.

In some embodiments, the diffractive optical element may have a grating that is designed to diffract stronger in one direction than other directions. This may preclude the use of a grating with a high degree of lattice symmetry because there is a substantial amount of light that is lost to diffraction into undesired directions. FIG. 55 is a top view of cross-cut biased grating ridges 5520 of a diffractive optical element 5510, in accordance with some embodiments. In FIG. 55, the grating 5520 has been refined to introduce a bias toward one of the two directions (e.g., the left direction 5530A as opposed to the right direction 5530B) by optimizing the shape of the scattering elements that compose the grating. For example, the rectangular elements of FIG. 54B may be replaced with the triangular elements to produce a grating that diffracts more strongly in one direction. FIG. 56 is a photograph illustrating a triangular element grating structure 5620 on a diffractive optical element 5610, in accordance with some embodiments. FIG. 56 may represent the grating structure illustrated in FIG. 55, as fabricated. FIG. 57 is a photograph illustrating an oval element grating structure 5720 on a diffractive optical element 5710, in accordance with some embodiments.

Various processes may be used to fabricate the gratings described herein. For example, electron beam lithography may be used. According to electron beam lithography, an electron beam resist is spun on a wafer, an electron beam is scanned over the pattern area, the resist is developed, then an etch process may be used to transfer the pattern to the wafer. Alternatively, the resist may be used as a surface relief pattern directly. The resist may be positive or negative (i.e., the exposed area may be either a pit or a mesa). The etch process may be dry (e.g., reactive ion etching, chemically assisted ion beam etching, etc.) or wet (e.g., potassium hydroxide bath). This process may produce high resolution pattern, so sharp geometric features may be produced (e.g., down to 20 nm resolution).

In another example, scanning ultraviolet (UV) lithography with reticle photomasks may be used. A reticle photomask may be made of the periodic grating pattern, and in some embodiments, at an enlargement factor (e.g., four or five times). The reticle may be used as a mask in a UV lithography system to expose photoresist that has been spun on a wafer. The resist may be developed, and the pattern may be transferred to the wafer via an etch process, such as that described above. This process may be limited to tens of nanometers in resolution. Multiple exposures may also be employed, as described further herein.

In another example, two photon polymerization may be used. A liquid-phase resist may be spun onto a substrate, and two beams of non-collinear low energy (i.e., energy below half of the polymerization threshold energy) photons are directed at pattern locations. Where the beams intersect, a two-photon chemical process polymerizes the resist, turning it into a cross-linked solid. The resist may be developed and the polymerized patterned areas may remain. The pattern may be used directly or transferred to the substrate using an etch process, such as that described above. This process may be slow, but is capable of very high resolution.

In another example, multiple exposure interference lithography may be used. Two beams of non-collinear coherent light may be directed at a resist-coated substrate. Where the beams interfere constructively, the resist may be exposed, and where the beams interfere destructively, the resist may not be exposed. The beams may be approximate plane waves polarized in the same direction, resulting in interference patterns that consist of a periodic array of lines. This process may be used for one dimensional periodic gratings consisting of lines. This process may be extended by performing multiple exposures where the lines are not perpendicular to each other to, for example, define two dimensional periodic gratings with square or hexagonal unit cells.

In another example, focused ion beam milling may be used. A beam of, for example, gallium ions may be accelerated to strike a substrate and physically sputter or ablate away materials. Patterns may be "dug" out of substrates. This process may be slow, but is high resolution. However, the ablated material may tend to redeposit.

In another example, self-assembled masks may be used. A set of (e.g., polystyrene) beads or particles in suspension may be placed on a substrate. Through evaporation, the particles may tend to self-assemble, due to surface tension, into regular periodic arrays. These self-assembled patterns may possess the correct periodicity to act as either the diffractive structure itself, or a physical etch mask for pattern transfer. These self-assembled structures may also require fixation to prevent them from disassembling.

A grating may also be mass produced. Various techniques may be used to mass produce a grating. For example, nano-imprint lithography may be used. A master template surface relief pattern may be used to stamp replicas. This master template may be stiff (such as directly using an etched silicon wafer to stamp additional wafers), or flexible (such as a surface relief pattern on a roll of polymer substrate). In addition, some diffractive structures may be illuminated to produce a near-field or aerial diffraction pattern that may be used to lithographically expose new patterns.

Figure 58:
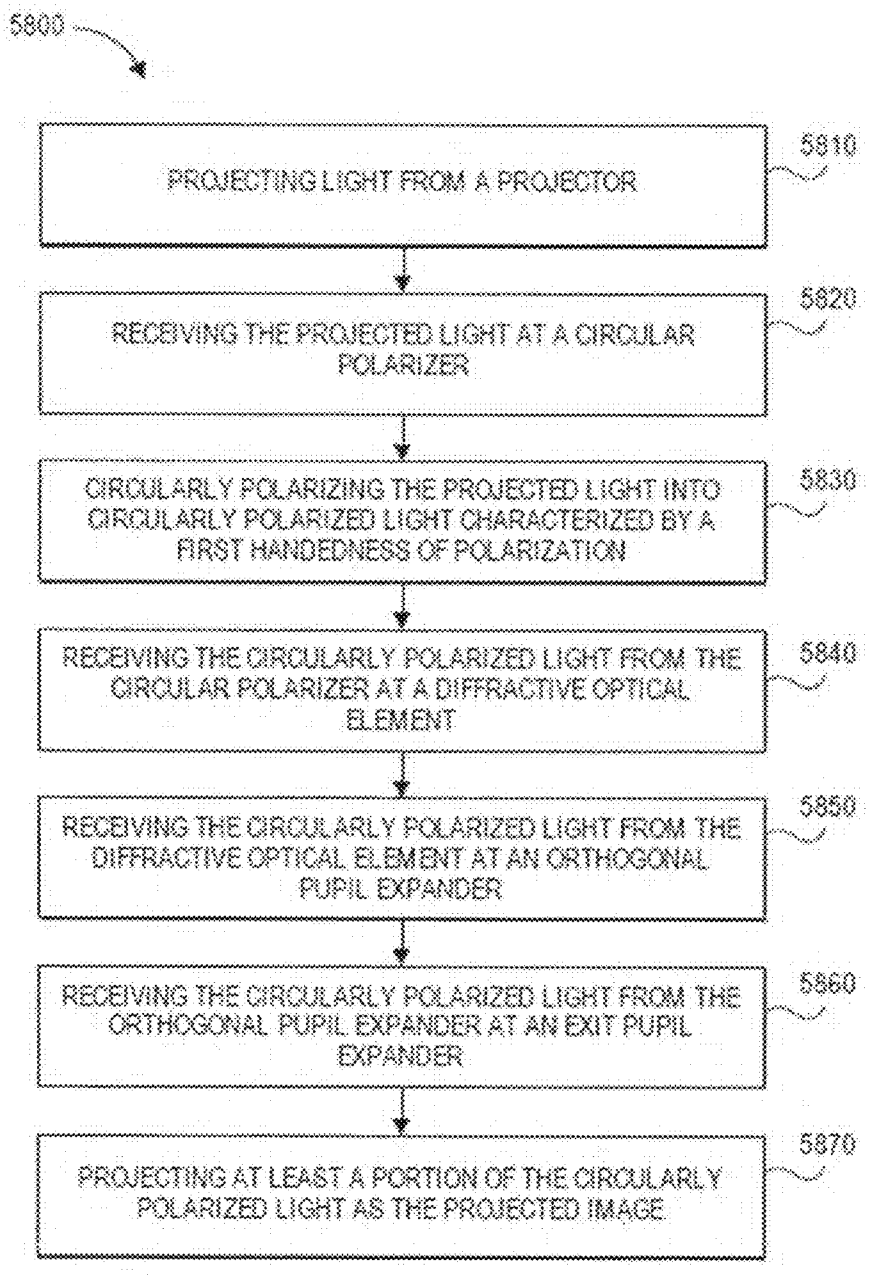
FIG. 58 is a simplified flowchart illustrating a method of suppressing reflections from telecentric projectors in near-to-eye display devices according to some embodiments of the present invention.

FIG. 58 is a simplified flowchart 5800 illustrating a method of suppressing reflections from telecentric projectors in near-to-eye display devices according to an embodiment of the present invention. The method includes projecting light from a projector (5810). The projector may be any of the projectors described herein, for example. The projector may be configured to project the light perpendicular to a diffractive optical element. The projector may include a polarization rotation-based spatial light modulator.

The method further includes receiving the projected light at a circular polarizer (5820). In some embodiments, the circular polarizer may include a linear polarizer and a quarter wave plate. In some embodiments, the circular polarizer may include a zeroth or higher order dichroic polarizer. In some embodiments, the circular polarizer may include a thin film stack or birefringent materials. The circular polarizer may be, for example, any of the circular polarizers described herein.

The method further includes circularly polarizing the projected light into circularly polarized light characterized by a first handedness of polarization (5830). The first handedness of polarization may be right-handed (i.e., clockwise) or left-handed (i.e., counter clockwise). The circularly polarized light may be circularly polarized for a plurality of field-of-view directions.

The method further includes receiving circularly polarized light from the circular polarizer at a diffractive optical element (5840). The diffractive optical element may be, for example, any of the diffractive optical elements described herein. The diffractive optical element may include a grating, such as, for example, an incoupling grating. The grating may include at least one of a binary grating, a multiple level grating, or a blazed grating. The grating may include polarization-insensitive lattice symmetry. The polarization-insensitive lattice symmetry may include at least one of square lattice symmetry or triangular lattice symmetry.

The method further includes receiving the circularly polarized light from the diffractive optical element at an orthogonal pupil expander (5850). The orthogonal pupil expander may be, for example, any of the OPEs described herein. In some embodiments, the diffractive optical element and/or the orthogonal pupil expander may reflect a reflection of the circularly polarized light in a second handedness of polarization opposite to the first handedness of polarization (i.e., the first handedness may be right-handed, while the second handedness may be left-handed, or vice versa). The diffractive optical element may be configured to suppress any reflection of the circularly polarized light in the first handedness of polarization, while passing the reflection of the circularly polarized light in the second handedness of polarization to the circular polarizer. In these embodiments, the circularly polarizer may absorb the reflection of the circularly polarized light in the second handedness of polarization. The method further includes receiving the circularly polarized light from the orthogonal pupil expander at an exit pupil expander (5860). The method further comprises projecting at least a portion of the circularly polarized light as the projected image (5870).

It should be appreciated that the specific steps illustrated in FIG. 58 provide a particular method of suppressing reflections from telecentric projectors in near-to-eye display devices according to an embodiment of the present invention. Other sequences of steps may also be performed according to alternative embodiments. For example, alternative embodiments of the present invention may perform the steps outlined above in a different order. Moreover, the individual steps illustrated in FIG. 58 may include multiple sub-steps that may be performed in various sequences as appropriate to the individual step. Furthermore, additional steps may be added or removed depending on the particular applications. One of ordinary skill in the art would recognize many variations, modifications, and alternatives.

Variable Geometry Diffractive Optical Elements

According to some embodiments of the present invention, methods and systems are provided that improve the image quality of light field waveguide displays by modulating the diffraction efficiency and/or optical phase of diffractive structures (e.g., diffraction grating regions) via spatial modulation of binary grating height. Utilizing grating height modulation, embodiments of the present invention mitigate one or more image artifacts that adversely impact the performance waveguide displays: A) interference-based image artifacts, which often appear as dark bands or striations in the output image, and B) variation in image brightness with respect to eye position. As described herein, methods of fabricating optical structures can include the use of grayscale lithography, the use of multiple lithographic exposures and etching processes, and the like.

Numerous benefits are achieved by way of the present invention over conventional techniques. For example, embodiments of the present invention provide methods and systems that improve the image quality of light field waveguide displays by modulating the diffraction efficiency and/or optical phase of grating regions via spatial modulation of grating height. In typical top-down fabrication processes for gratings, the grating height cannot be specified in lithography, accordingly, embodiments of the present invention provide advanced post-processing techniques suitable for creating spatial variation of the grating height. Hence, typical light field waveguide displays utilizing gratings are limited in design to have only one or a small number of grating heights. Varying diffraction efficiency and/or optical phase among different grating regions in a waveguide display is desirable to produce images with high brightness, high luminance uniformity, high color uniformity, high sharpness and low interference-based image artifacts. In contrast with the embodiments described herein, typical waveguide displays only manipulate diffraction efficiency and/or optical phase between different grating regions by varying grating duty cycle, pitch and angle. Variable grating duty cycle allows for a very small tuning range of diffraction efficiency and optical phase. Varying grating pitch and angle allows for a large tuning range of optical phase, but at the expense of distortion and blur in a waveguide display. Varying grating height allows for a large tuning range of diffraction efficiency and optical phase with negligible distortion and blur.

Some embodiments of the present invention reduce image artifacts by modulating the diffraction efficiency and/or randomizing the relative phases of the multiple propagation paths to reduce or eliminate these interference effects. As described herein, randomization can be achieved by modulating the grating height as a function of position, which results in a variation in diffraction efficiency as desired. For example, a variable distribution of the grating height in each region or sub-section of the OPE will perturb the optical phase and will reduce interference-based image artifacts of the output image as the coherence among all the possible optical paths in the OPE is reduced. Furthermore, a graded variation of the height of the gratings in the EPE will increase the brightness uniformity across the field of view in the output image and the brightness uniformity across different eye positions.

Figure 59A:
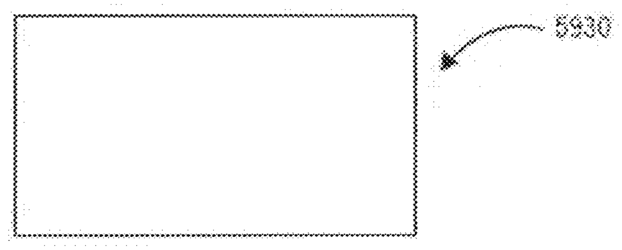
FIG. 59A is a simplified schematic diagram illustrating a plan view of a diffractive structure characterized by a constant diffraction efficiency according to some embodiments of the present invention.

FIG. 59A is a simplified schematic diagram illustrating a plan view of a diffractive structure characterized by a constant diffraction efficiency according to an embodiment of the present invention. In FIG. 59A, the diffractive structure 5930, which can be an element of an OPE or EPE as described herein, or an incoupling grating (ICG), which couples light from the projector into the eyepiece layers, is uniform in diffraction efficiency as a function of lateral (i.e. parallel to the plane of the eyepiece layers) position. As an example, an OPE having a uniform grating depth as a function of position could result in constant diffraction efficiency across the OPE.

Figure 59B:
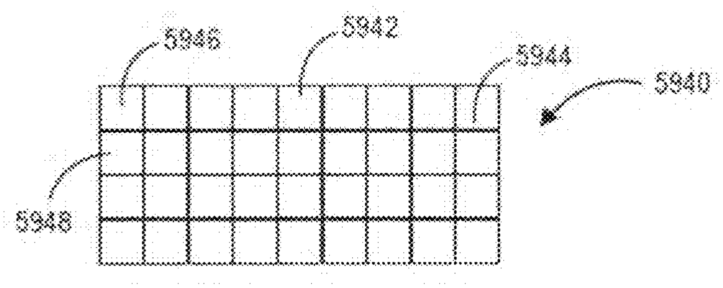
FIG. 59B is a simplified schematic diagram illustrating a plan view of a diffractive structure characterized by regions of differing diffraction efficiency according to some embodiments of the present invention.

FIG. 59B is a simplified schematic diagram illustrating a plan view of a diffractive structure characterized by regions of differing diffraction efficiency according to an embodiment of the present invention. In contrast with the constant diffraction efficiency as a function of position illustrated in FIG. 59A, FIG. 59B illustrates differing diffraction efficiencies as a function of position. In the example illustrated in FIG. 59B, four different diffraction efficiencies are illustrated by regions represented by four different shades of gray (i.e., white (5942), light gray (5944), dark gray (5946), and black (5948)). As an example, white regions 5942 can represent the lowest diffraction efficiency and black regions 5948 can represent the highest diffraction efficiency, with light gray 5944 and dark gray 5946 regions representing intermediate diffraction efficiencies.

The differences in diffraction efficiency between regions can be constant or vary depending on the particular applications. Moreover, although four regions characterized by different diffraction efficiencies are illustrated in FIG. 59B, this is not required by some embodiments of the present invention and a greater number of regions or a lesser number of regions can be utilized. As described more fully herein, in a particular embodiment, a first region (e.g., a white region 5942) has a first grating depth and a second region (e.g., a black region 5948) has a second grating depth greater than the first grating depth, thereby providing a higher diffraction efficiency for the black regions than that achieved for the white regions. One of ordinary skill in the art would recognize many variations, modifications, and alternatives.

In the embodiment illustrated in FIG. 59B, in each region, the diffraction efficiency is constant. The size of the regions can vary depending on the particular application, for example, with dimensions on the order of 10 μm to millimeters. As an example, if the size of the OPE is on the order of 3 mm on a side and the size of the regions is on the order of 0.3 mm on a side, the OPE could include ~100 regions. In the example illustrated in FIG. 59B, the regions characterized by different diffraction efficiencies are distributed randomly, although this is not required by the present invention. In other implementations, the difference in diffraction efficiency between adjacent regions can be set below a predetermined threshold, follow a sinusoidal pattern, be monotonically increasing or decreasing, randomness impressed on a monotonically increasing or decreasing function, be determined by a computational hologram design, be determined by a freeform lens design, or the like.

Thus, as illustrated in FIG. 59B, some embodiments of the present invention spatially vary the height level of a grating structure as a function of lateral position to modify the diffraction efficiency as a function of position. Several different fabrication approaches can be used to spatially control the diffraction efficiency and/or optical phase to improve the image quality of a waveguide display as described more fully herein. As an example, in a waveguide display, the OPE and/or EPE grating regions can be divided into many regions, with each region having a different grating height than one or more other regions making up the OPE and/or EPE.

Figure 59C:
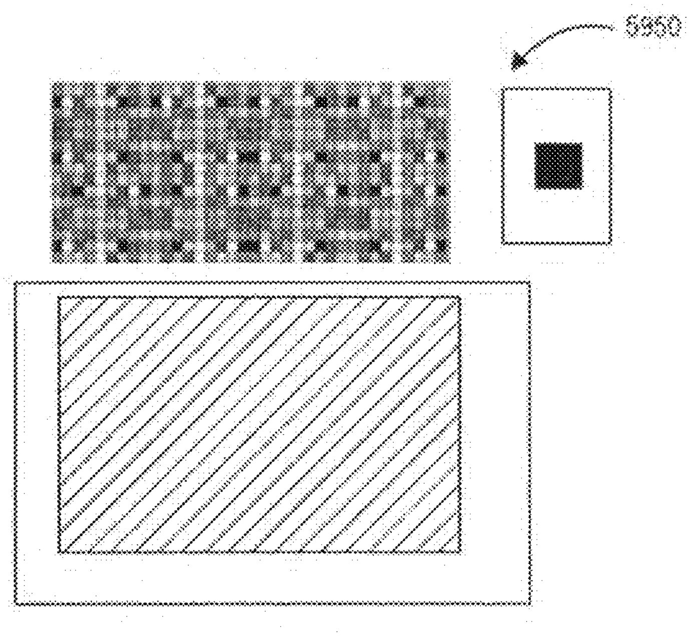
FIG. 59C is a simplified schematic diagram illustrating a plan view of a diffractive structure characterized by regions of differing diffraction efficiency according to some embodiments of the present invention.

FIG. 59C is a simplified schematic diagram illustrating a plan view of a diffractive structure characterized by regions of differing diffraction efficiency according to another embodiment of the present invention. In the embodiment illustrated in FIG. 59C, the region size is smaller than that illustrated in FIG. 59B, resulting in an increased number of regions. For example, for an OPE on the order of 3 mm on a side and a region size on the order of 0.1 mm, the OPE could include ~900 regions. As will be evident to one of skill in the art, the particular region size can be selected depending on the particular application. The number of different diffraction efficiencies can be four different diffraction efficiencies, as illustrated in FIG. 59B, or can be greater or less. In the embodiment illustrated in FIG. 59C, the diffraction efficiency is constant in each region, with the differences between regions providing variation in diffraction efficiency as a function of position. One of ordinary skill in the art would recognize many variations, modifications, and alternatives.

FIGS. 60A-H are simplified process flow diagrams illustrating a process for fabricating variable diffraction efficiency gratings using gray scale lithography according to some embodiments of the present invention.

Figure 60A:
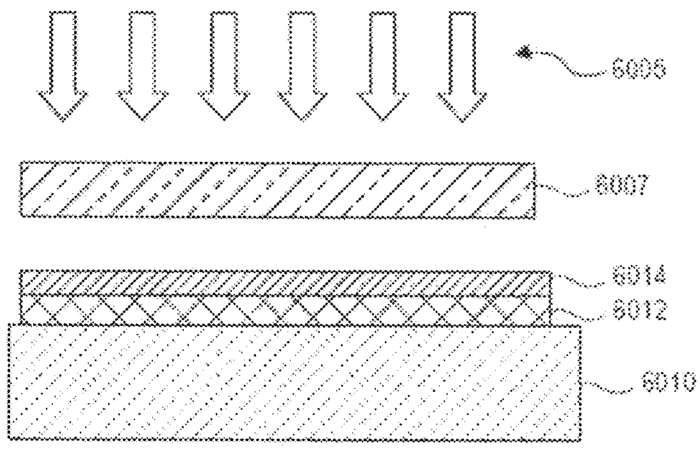
FIGS. 60A-H are simplified process flow diagrams illustrating a process for fabricating variable diffraction efficiency gratings using gray scale lithography according to some embodiments of the present invention.

As illustrated in FIGS. 60A-H, gray scale lithography is utilized to form a diffractive structure (e.g., a diffraction grating) with varying diffraction efficiency as a function of position. As will be evident to one of skill in the art, gray scale lithography is a lithographic technique in which the thickness of the photoresist (i.e., resist) after development is determined by the local exposure dose. The spatial distribution of the dose can be achieved by a photomask in which the transmittance varies in different regions. Referring to FIG. 60A, mask 6007 is exposed to incident light 6005. The mask 6007 has a graded transmittance as a function of position, for example, high transmittance on a first side (e.g., the left side) and a low transmittance on a second side (e.g., the right side). The transmittance can be graded linearly or non-linearly. In addition to gray scale lithography, other direct writing techniques, such e-beam lithography or laser writing, can be used to spatially control the dose distribution and are applicable to embodiments of the present invention.

Substrate 6010 (e.g., silicon, silica, or the like) is coated with a hard mask layer 6012 and a resist layer 6014. In an embodiment, the hard mask layer is formed using $SiO_2$ or other suitable materials. In some embodiments, the hard mask layer can be formed using an oxidation process, thus, the use of the term "coated" includes processes other than deposition. Upon exposure using mask 6007, the resist adjacent the portion of the mask with high transmittance (e.g., the left side) receives a higher dose than the resist adjacent portion of the mask with lower transmittance (e.g., the right side).

Figure 60B:
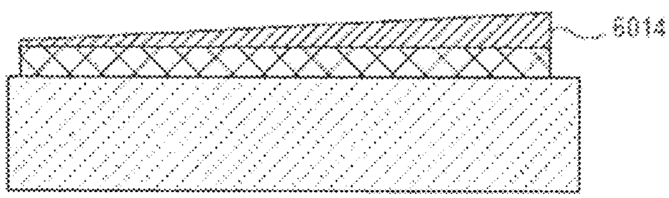

FIG. 60B illustrates the resist profile after exposure and development. Due to the higher dose received adjacent the portion of the mask with high transmittance, the height of the resist layer 6014 is tapered from a thin value to a thicker value as a function of position. Etching of the resist/hard mask layer is then performed.

Figure 60C:
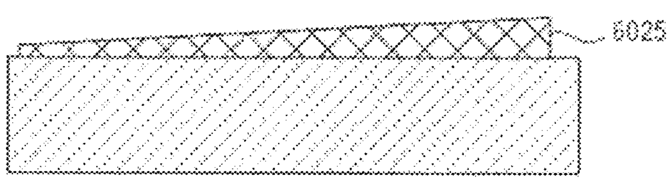
Figure 60D:
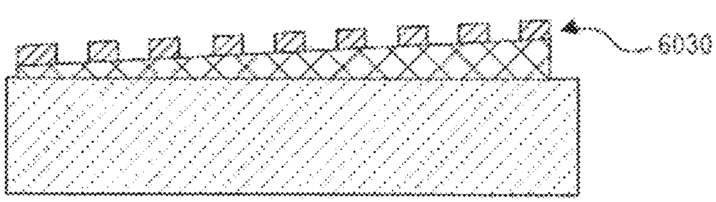

FIG. 60C illustrates an etch profile after etching using the resist profile illustrated in FIG. 60B. The resist profile is transferred to the hard mask layer in this embodiment by "proportional RIE." In this process, the resist will delay the etching of the underlying material and the delay is proportional to the etch thickness. The ratio between the etching rate of the resist and the etching rate of the underlying material determines the vertical proportionality between the resist profile and the etched profile. As shown in FIG. 60C, the height difference present in the resist profile has been transferred to the hard mask layer 6025, resulting in a hard mask layer with a tapered profile as the thickness of the hard mask layer varies as a function of position. FIG. 60D illustrates formation of a diffractive structure defined in resist layer 6030 on the tapered hard mask layer 6025. For example, the patterned resist layer can be formed by spinning and patterning of resist as will be evident to one of skill in the art. It will be noted that lithographic process, including UV, EBL or nanoimprint, can be used to pattern the hard mask layer with the desired diffractive structure.

Figure 60E:
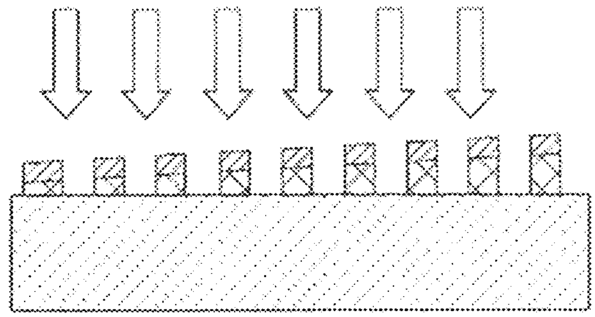

FIG. 60E illustrates the formation of a diffractive structure in the hard mask layer, which will provide a tapered etch mask subsequently used to form a grating structure in the substrate. In FIG. 60E, an etch process is utilized that is characterized by a high etch rate in the hard mask material (e.g., $SiO_2$) and a low etch rate for the substrate material (e.g., silicon). This etch process forms a tapered etch mask that includes the periodicity of the grating structure in a tapered etch mask material that varies in thickness as a function of position.

Figure 60F:
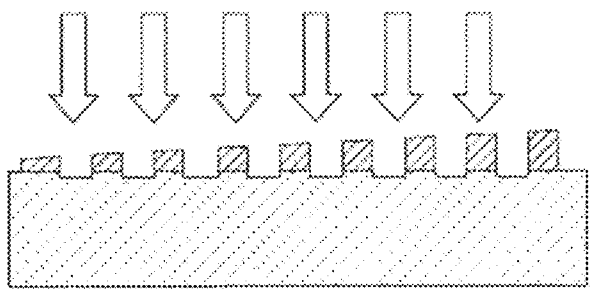
Figure 60G:
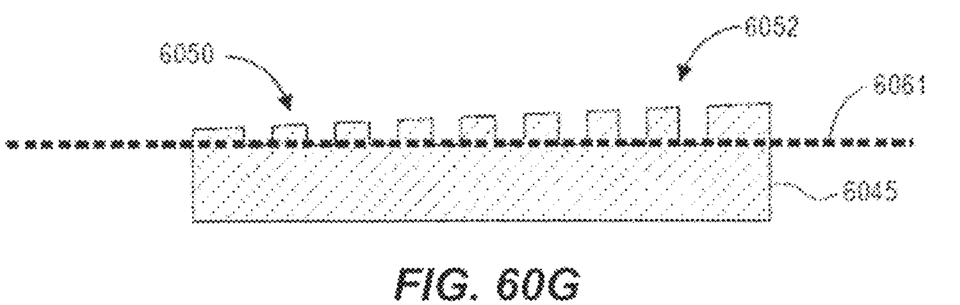

FIG. 60F illustrates removal of the resist layer 6030 and the initial etching of the substrate using the tapered etch mask and a proportional etch process. FIG. 60G illustrates a master 6045 and an etch profile after etching using the tapered etch mask illustrated in FIG. 60F.

As shown in FIG. 60G, the height difference present in the tapered etch mask has been transferred to the substrate, with a shallower etch (i.e., lower grating height) in region 6050 (associated with the higher transmittance region of the gray scale mask) and a deeper etch (i.e., higher grating height) in region 6052. As an example, the variation in height between grating teeth can vary over a predetermined range, for example, from 5 nm to 500 nm. Thus, as illustrated in FIG. 60G, embodiments of the present invention utilize a gray scale lithography process to form a master having a diffractive structure with a varying grating height and, as a result, varying diffraction efficiency, as a function of position. Although a linear increase in grating height is illustrated in FIG. 60G as a result of the linear transmittance variation in the gray scale mask, the present invention is not limited to this linear profile and other profiles having predetermined height variations are included within the scope of the present invention. It should be noted that although a single variable height region is illustrated in FIG. 60G, this single region should be considered in light of FIG. 59B, which illustrates a plurality of regions of differing diffraction efficiency. The tapering of the grating height can thus be combined with a predetermined grating height associated with a particular region to provide variation in diffraction efficiency, both intra-region as well as inter-region. Moreover, as discussed herein, the use of a gray scale mask that varies in transmittance on a length scale less than size of the variable height region illustrated in FIG. 60G, enables the use of a gray scale mask that passes differing amounts of light on a scale of the periodicity of the grating teeth, resulting in a grating height profile that varies on a tooth by tooth basis. Thus, in addition to discrete regions, embodiments of the present invention include continuous variation implementations. One of ordinary skill in the art would recognize many variations, modifications, and alternatives.

Figure 60H:
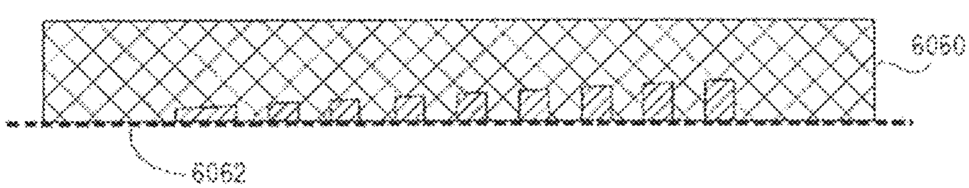

FIG. 60H illustrates a sub-master 6060 that is fabricating using master 6045, which can be used in a replication process to imprint additional copies. As illustrated by sub-master 6060, will have a complement of the predetermined patterned structure present in the master. For example, since the master illustrated in FIG. 60G has a planar surface 6062 aligned with the bottom of the grating structure, the sub-master 6060 has the tops of the grating structure aligned with planar surface 6064.

In the embodiment illustrated in FIG. 60H, the diffractive optical elements are characterized by a planar top surface 6062, with the diffractive structures extending to varying distances in the substrate. In other words, the tops of the grating lines are coplanar. In contrast, in the embodiment illustrated in FIG. 62C, the diffractive optical elements extend to a constant depth in the substrate and the difference in diffraction efficiency results from differences in diffractive element height with respect to the constant depth plane. In other words, the bottoms of the grating lines are coplanar.

It should be noted that a replication process can convert a diffractive structure with the tops of the grating being coplanar into a diffractive structure with the bottoms of the grating being coplanar. An additional replication process can provide for the opposite conversion. Referring to FIGS. 60G and 60H, in FIG. 60G, the bottom of the grating lines are coplanar with plane 6061. If the structure illustrated in FIG. 60G is replicated, the structure illustrated in FIG. 60H is produced, with the tops of the grating lines being coplanar with top surface 6062. As will be evident to one of skill in the art, replication of the structure illustrated in FIG. 60H will result in production of the structure illustrated in FIG. 60G. Thus, two replication processes can produce a copy of the original mold.

Figure 61A:
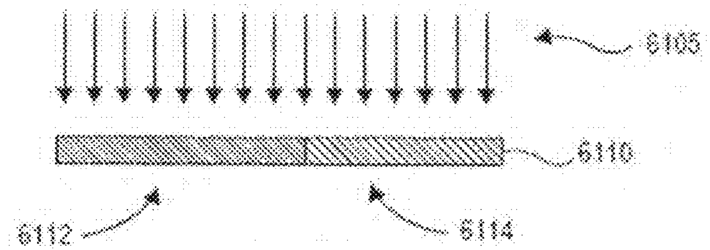
FIGS. 61A-C are simplified process flow diagrams illustrating a process for fabricating regions with differing surface heights according to some embodiments of the present invention.
Figure 61B:
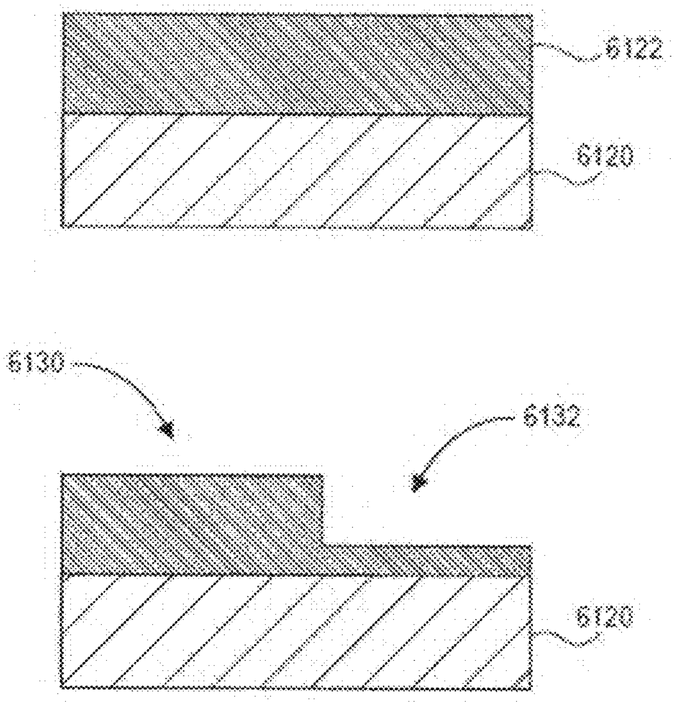
Figure 61C:
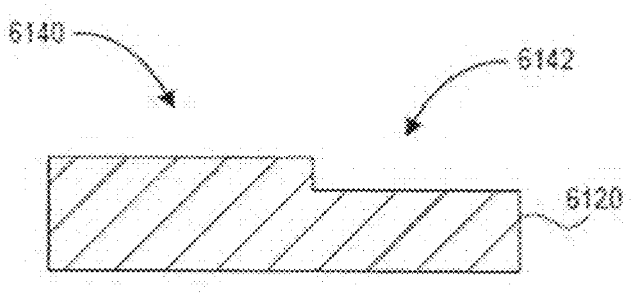

FIGS. 61A-C are simplified process flow diagrams illustrating a process for fabricating regions with differing surface heights according to an embodiment of the present invention. As described herein, gray scale lithography can be utilized to form regions with differing surface heights. Referring to FIG. 61A, mask 6110 is exposed to incident light 6105. The mask 6110 has a first region 6112 characterized by a first transmittance and a second region 6114 characterized by a second transmittance greater than the first transmittance. Substrate 6120 is coated with resist layer 6122. Upon exposure using mask 6110, the resist adjacent second region 6114 receives a higher dose than the resist adjacent first region 6112.

FIG. 61B illustrates the resist profile after exposure and development. Due to the higher dose received adjacent second region 6114, the height of the resist in region 6132 is less than the height of the resist in region 6130.

FIG. 61C illustrates an etch profile after etching using the resist profile illustrated in FIG. 61B. As shown in FIG. 61C, the height difference present in the resist profile has been transferred to the substrate, with a deeper etch (i.e., lower surface height) in region 6142 and a shallower etch (i.e., higher surface height) in region 6140. Thus, embodiments of the present invention utilize a gray scale lithography process to form surface profiles with varying height as a function of the gray scale pattern present in the gray scale mask.

Figure 62A:
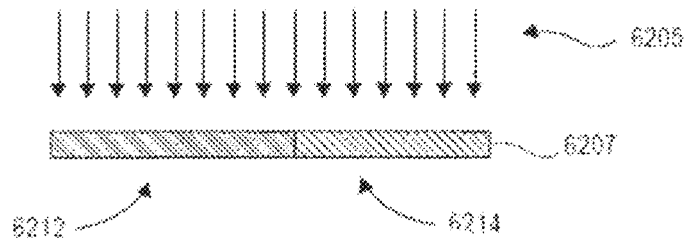
FIGS. 62A-C are simplified process flow diagrams illustrating a process for fabricating regions with gratings having differing diffraction efficiencies according to some embodiments of the present invention.
Figure 62B:
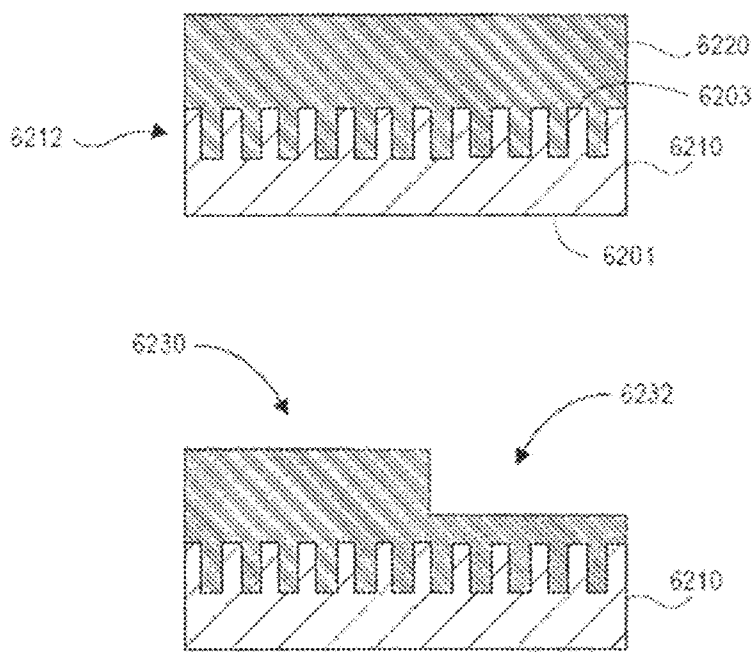
Figure 62C:
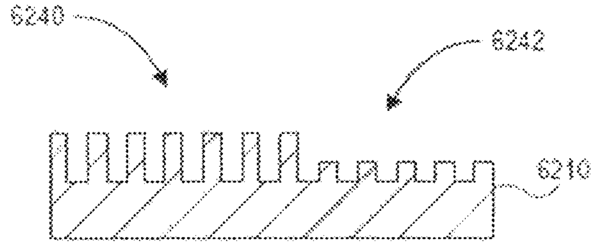

FIGS. 62A-C are simplified process flow diagrams illustrating a process for fabricating regions with gratings having differing diffraction efficiencies according to an embodiment of the present invention. In the embodiment illustrated in FIGS. 62A-C, the substrate 6210 includes a grating structure 6215 that is processed to form a portion of a diffractive optical element.

In FIG. 62A, the fabrication processes starts with a substrate characterized by planar and parallel top and bottom surfaces, i.e., the top surface is not tilted with respect to the bottom surface. The diffractive structures are etched into the substrate such that the top of the grating lines are planar and the variation in grating height is associated with differences in the distance that the grating elements extend into the substrate.

Figure 63A:
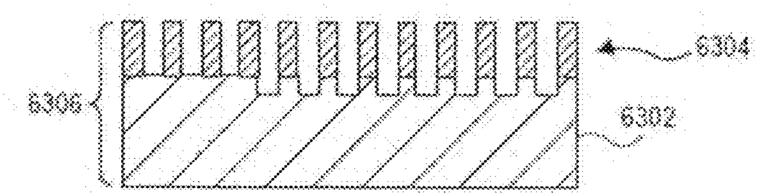
FIGS. 63A-H are simplified process flow diagrams illustrating use of a multi-level etching process to fabricate regions characterized by differing diffraction efficiencies according to some embodiments of the present invention.
Figure 64A:
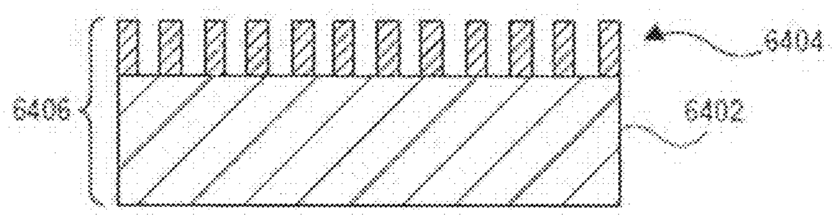
FIGS. 64A-H are simplified process flow diagrams illustrating use of a multi-level etching process to fabricate variable diffraction efficiency gratings according to some embodiments of the present invention.

The substrate 6210 includes a support surface 6201 and a grating surface 6203 opposite the support surface. The grating surface 6203 is aligned with the top of the grating structure, which is characterized by a uniform grating height in this embodiment. Although the grating structure 6215 is illustrated as fabricated in the substrate material in FIG. 62A, this is not required by the present invention and the grating structure can be made from a different material than the substrate as illustrated in FIG. 63A and FIG. 64A and, in some embodiments, used as mask.

Referring to FIG. 62A, mask 6207 is exposed to incident light 6205. The mask 6207 has a first region 6212 characterized by a first transmittance and a second region 6214 characterized by a second transmittance greater than the first transmittance. Substrate 6210 is coated with resist layer 6220. Upon exposure using mask 6207, the resist adjacent second region 6214 receives a higher dose than the resist adjacent first region 6212.

FIG. 62B illustrates the resist profile after exposure and development. Due to the higher dose received adjacent second region 6214, the height of the resist in region 6232 is less than the height of the resist in region 6230.

FIG. 62C illustrates an etch profile after etching using the resist profile illustrated in FIG. 62B. As shown in FIG. 62C, the height difference present in the resist profile has been transferred to the grating structure 6215, with a portion of the grating structure removed in region 6242 and the original grating structure preserved in region 6240. The presence of the resist between the grating teeth enables etching of the tops of the grating structure while preventing etching of the bottom of the grating structure. Accordingly, as illustrated in FIG. 62C, the height of the gratings in region 6242 is less than the height of the gratings in region 6240, resulting in regions in which the gratings have differing diffraction efficiencies.

In the embodiment illustrated in FIG. 62C, two regions 6240 and 6242 with differing grating heights are illustrated, but the present invention is not limited to two regions and additional regions with differing heights can be fabricated. Referring to FIG. 59B, four different types of regions are illustrated as randomly distributed across the diffractive structure. In some embodiments, fewer or greater than four different regions are utilized. Using a single exposure, formation of regions of resist with varying height as a function of position can be accomplished, with the resist variation then transferred into gratings of varying height and corresponding diffraction efficiencies. As discussed herein, variation of the diffraction efficiency between regions can be random, monotonically increasing or decreasing, randomness impressed on a monotonically increasing or decreasing function, a sinusoidal pattern, be determined by a computational hologram design, be determined by a freeform lens design, or the like.

It should be noted that although the regions illustrated in FIG. 62C have uniform grating height within each region 6240 and 6242, this is not required by the present invention. Utilizing a gray scale mask that varies on a length scale less than the region size, variation in the grating height within a region, as well as variation in the grating height between regions can be implemented. In the most general case, a gray scale mask can be used that passes differing amounts of light on a scale of the periodicity of the grating teeth, resulting in a grating height profile that varies on a tooth by tooth basis. Thus, in addition to discrete regions, embodiments of the present invention include continuous variation implementations. One of ordinary skill in the art would recognize many variations, modifications, and alternatives.

Figure 63B:
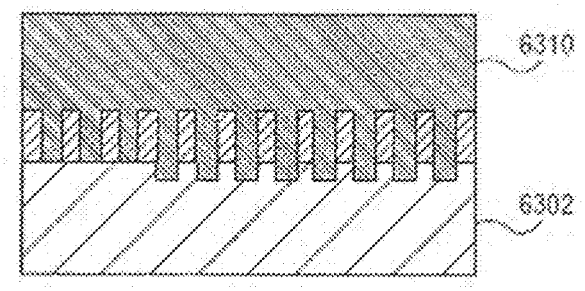
Figure 63C:
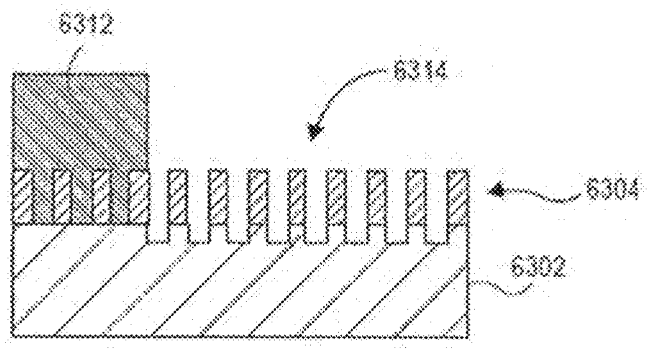

FIGS. 63A-H are a simplified process flow diagram illustrating use of a multi-level etching process to fabricate regions characterized by differing diffraction efficiencies according to an embodiment of the present invention. Referring to FIG. 63A, the fabrication process starts with substrate 6302 on which patterned hard mask 6304 (e.g., an $SiO_2$ hard mask) is present. As an example, the patterned hard mask 6304 can have a pattern associated with a diffractive optical element, which can be a diffraction grating with a predetermined periodicity (e.g., on the order of 200 nm to 400 nm) and height (e.g., on the order of 10 μm to 500 μm). As described below, the use of materials with different properties, including etch rates, enables use of the patterned hard mask as a masking material. The combination of substrate 6302 and patterned hard mask 6304 can be referred to as a substrate structure 6306. FIG. 63B illustrates coating of the substrate structure 6306 with a resist layer 6310. A first lithography process is illustrated in FIG. 63C that defines region 6312 covered by resist layer 6310 and region 6314 in which the resist is removed, exposing portions of the patterned hard mask 6304. It will be appreciated that although only two regions are illustrated in FIG. 63C, the present invention is not limited to just two regions and additional regions can be provided as appropriate to the particular application. One of ordinary skill in the art would recognize many variations, modifications, and alternatives.

Figure 63D:
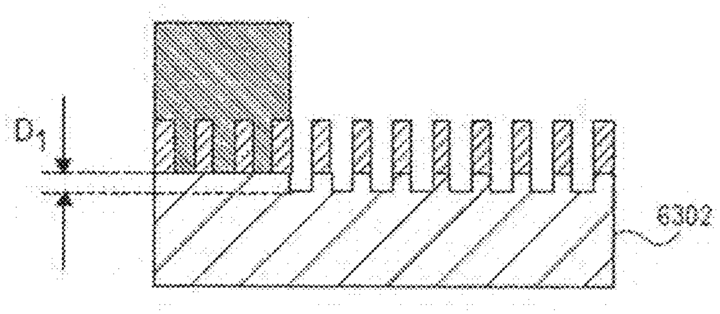

FIG. 63D illustrates a first etching process (Level 1 etch) used to extend grating features in the exposed portions into the substrate by a first distance $D_1$. As illustrated herein, it is generally desirable to use a selective etch process that provides selectivity between the patterned hard mask and the substrate because of the multiple etch process steps.

Figure 63E:
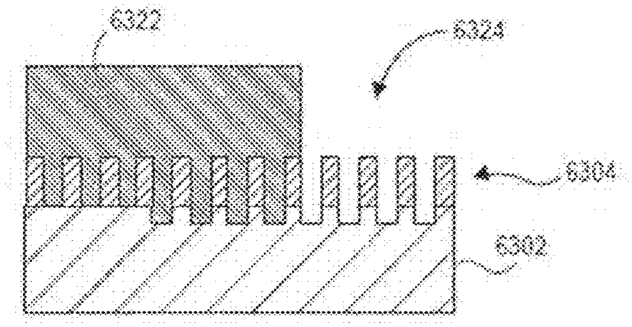
Figure 63F:
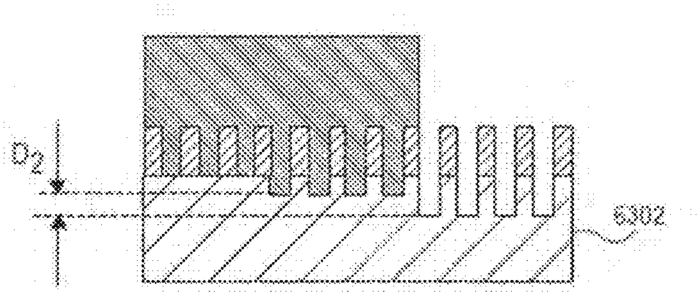

A second lithography process is illustrated in FIG. 63E that defines region 6322 covered by resist (the coating with resist for this second lithography process is not illustrated for purposes of convenience) and region 6324 in which the resist is removed, exposing portions of the patterned hard mask 6304 that are different from the portions exposed during the first lithography process. FIG. 63F illustrates a second etching process (Level 2 etch) used to extend grating features in the exposed portions into the substrate by a second distance $D_2$. Referring to FIGS. 63C and 63F, areas of the substrate in which regions 6314 and 6324 overlap are etched in both the first and second etching processes, resulting in grating features that extend to a distance of $D_1+D_2$.

Figure 63G:
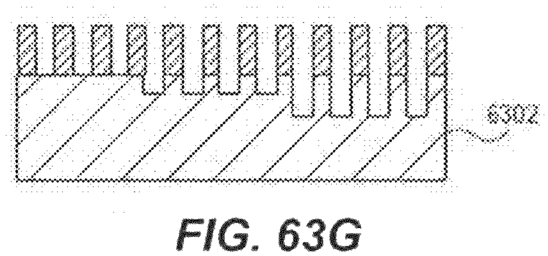
Figure 63H:
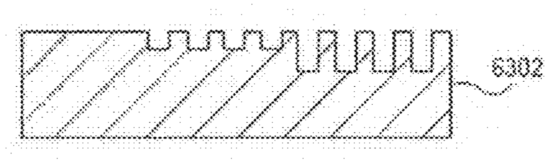

FIG. 63G illustrates removal of the resist and FIG. 63H illustrates removal of the patterned hard mask to provide a master with a predetermined patterned structure.

Embodiments of the present invention enable the transfer of a predetermined profile using an initially uniform grating structure in order to form a grating profile that includes predetermined height variations, and diffraction efficiency as a result. This process can be viewed in Boolean logic terms as effectively performing an "AND" operation in which the profile associated with the gray scale mask is combined with the grating structure as an "AND" operation.

In some embodiments, additional etching processes are performed, forming grating features that extend N additional distances (i.e., $D_3, D_4, \ldots, D_N$) into the substrate, after resist coating (not shown) and the N additional lithography processes (not shown) have been performed. N can be greater than or equal to 3 in these embodiments. Accordingly, embodiments of the present invention provide an N-level etching process in which the depth of the grating features vary as a function of the number of etching levels and the lithography processes used to define the etched areas.

The master can be used in a replication process to imprint copies. The copies will have a complement of the predetermined patterned structures. For example, since the master illustrated in FIG. 63H has a planar surface aligned with the top of the patterned structure, the copy would have the bottoms of the patterned structure aligned.

As an example, a replication process could be used to create a sub-master (with a complementary patterned structure), which can then be used to create a copy that reproduces the predetermined patterned structure from the master.

FIGS. 64A-H are a simplified process flow diagram illustrating use of a multi-level etching process to fabricate variable diffraction efficiency gratings according to an embodiment of the present invention.

Figure 64B:
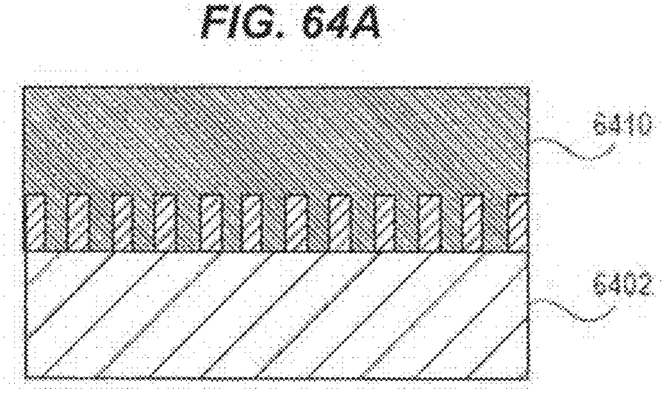
Figure 64C:
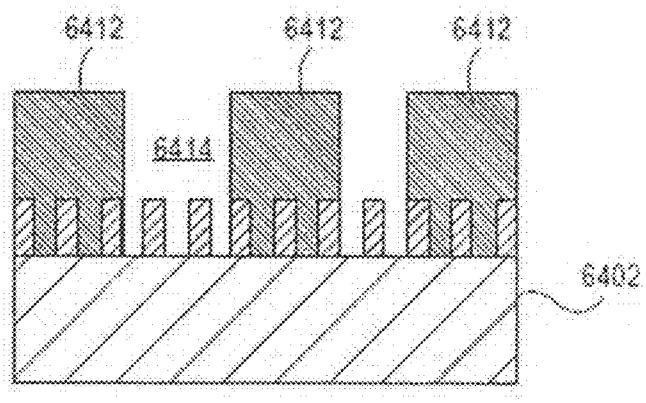

Referring to FIG. 64A, the fabrication process starts with substrate 6402 on which patterned hard mask 6404 (e.g., an $SiO_2$ hard mask) is present. As an example, the patterned hard mask 6404 can have a pattern associated with a diffractive optical element, which can be a diffraction grating with a predetermined periodicity (e.g., on the order of 200 nm to 400 nm) and height (e.g., on the order of 10 μm to 500 μm). As described below, the use of materials with different properties, including etch rates, enables use of the patterned hard mask as a masking material. The combination of substrate 6402 and patterned hard mask 6404 can be referred to as a substrate structure 6406. FIG. 64B illustrates coating of the substrate structure 6406 with a resist layer 6410. A first lithography process is illustrated in FIG. 64C that defines regions 6412 covered by resist layer 6410 and regions 6414 in which the resist is removed, exposing portions of the patterned hard mask 6404.

Figure 64D:
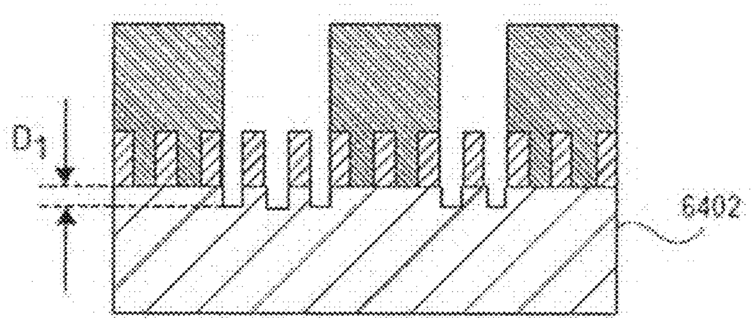
Figure 64E:
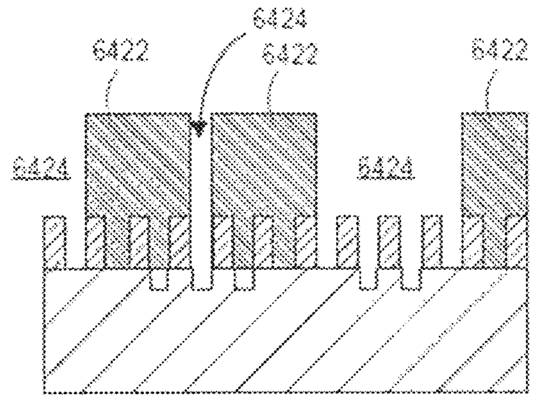
Figure 64F:
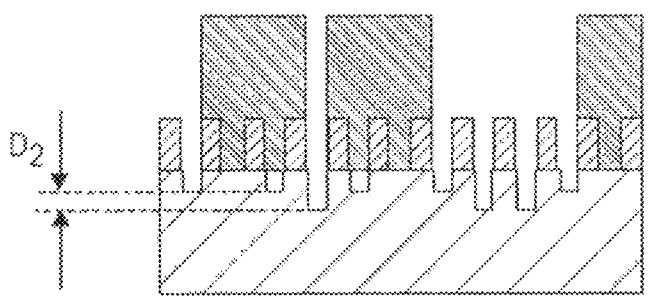

FIG. 64D illustrates a first etching process (Level 1 etch) used to extend grating features in the exposed portions into the substrate by a first distance $D_1$. As illustrated herein, it is generally desirable to use a selective etch process that provides selectivity between the patterned hard mask and the substrate because of the multiple etch process steps. A second lithography process is illustrated in FIG. 64E that defines regions 6422 covered by resist (the coating with resist for this second lithography process is not illustrated for purposes of convenience) and regions 6424 in which the resist is removed, exposing portions of the patterned hard mask 6404 that are different from the portions exposed during the first lithography process. FIG. 64F illustrates a second etching process (Level 2 etch) used to extend grating features in the exposed portions into the substrate by a second distance $D_2$. Referring to FIG. 64F, areas of the substrate in which regions 6414 and 6424 overlap are etched in both the first and second etching processes, resulting in grating features that extend to a distance of $D_1+D_2$.

Figure 64G:
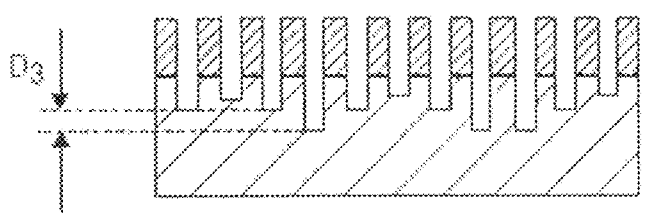
Figure 64H:
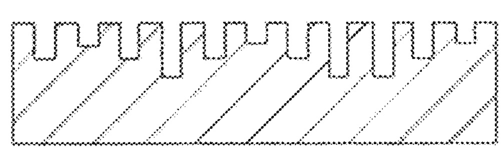

FIG. 64G illustrates the completion of a third etching process, forming grating features that extend an additional distance $D_3$ in the substrate, after resist coating (not shown) and a third lithography process (Level 3 etch, not shown) have been performed. FIG. 64H illustrates removal of the patterned hard mask 6404 to provide a master with a predetermined patterned structure. Accordingly, embodiments of the present invention provide an N-level etching process in which the depth of the grating features vary as a function of the number of etching levels and the lithography processes used to define the etched areas.

The master can be used in a replication process to imprint copies. The copies will have a complement of the predetermined patterned structures. For example, since the master illustrated in FIG. 64H has a planar surface aligned with the top of the patterned structure, the copy would have the bottoms of the patterned structure aligned.

As an example, a replication process could be used to create a sub-master (with a complementary patterned structure), which can then be used to create a copy that reproduces the predetermined patterned structure from the master.

For a uniform diffraction efficiency, the diffractive optical element is spatially invariant. Embodiments of the present invention break the spatial invariance by introducing differing diffraction efficiencies as a function of lateral position. Accordingly, spatial coherence, which can lead to undesired effects, can be reduced. In other words, by introducing spatially non-uniform diffraction efficiencies, the interference effects that light experiences will be different in different regions, thereby modifying the interference effects and reducing the spatial coherence.

By adjusting the depth of the grating, it is possible to adjust the diffraction efficiency and produce a diffractive optical element characterized by a diffraction efficiency that varies in a predetermined manner as a function of position. Embodiments of the present invention can utilize either amplitude variation or phase variation to produce differences in the diffraction efficiency.

In an embodiment, the diffraction efficiency as a function of position is varied monotonically, for example, increasing the diffraction efficiency as light propagates further into the diffractive optical element. In this embodiment, since the intensity of light propagating in the diffractive optical element decreases as a function of position as a result of light being diffracted by the diffractive optical element, the increase in diffraction efficiency can result in an improvement in output uniformity. Thus, embodiments of the present invention provide for either monotonic variation or non-monotonic variation depending on the particular application. As a particular example, a random variation could be impressed on a monotonically increasing diffraction efficiency profile. Thus, although the diffraction efficiency will be generally increasing as light propagates into the diffractive optical element, the random variations will result in a diffraction efficiency profile that is non-monotonic. One of ordinary skill in the art would recognize many variations, modifications, and alternatives.

In some embodiments, the variation in diffraction efficiency is implemented in a predetermined manner such that variation in the diffraction efficiency (e.g., the region size) is on the order of the bounce spacing for light propagating in the planar waveguide. Thus, in some embodiments, for a waveguide thickness on the order of 0.3 mm, the bounce spacing will be on the order of 0.6 mm. Accordingly, if the region dimensions are on the order of 0.6 mm, light will experience a different diffraction efficiency after propagation by a distance of approximately two bounce spacings. As light propagates through the planar waveguide, partially diffracting off of the diffractive optical element during propagation, the varying diffraction efficiency will result in differing intensities being diffracted by the structure as propagation occurs. The spatial non-homogeneity produced using embodiments of the present invention, which can be random, thus reduces unwanted coherence effects.

Figure 65:
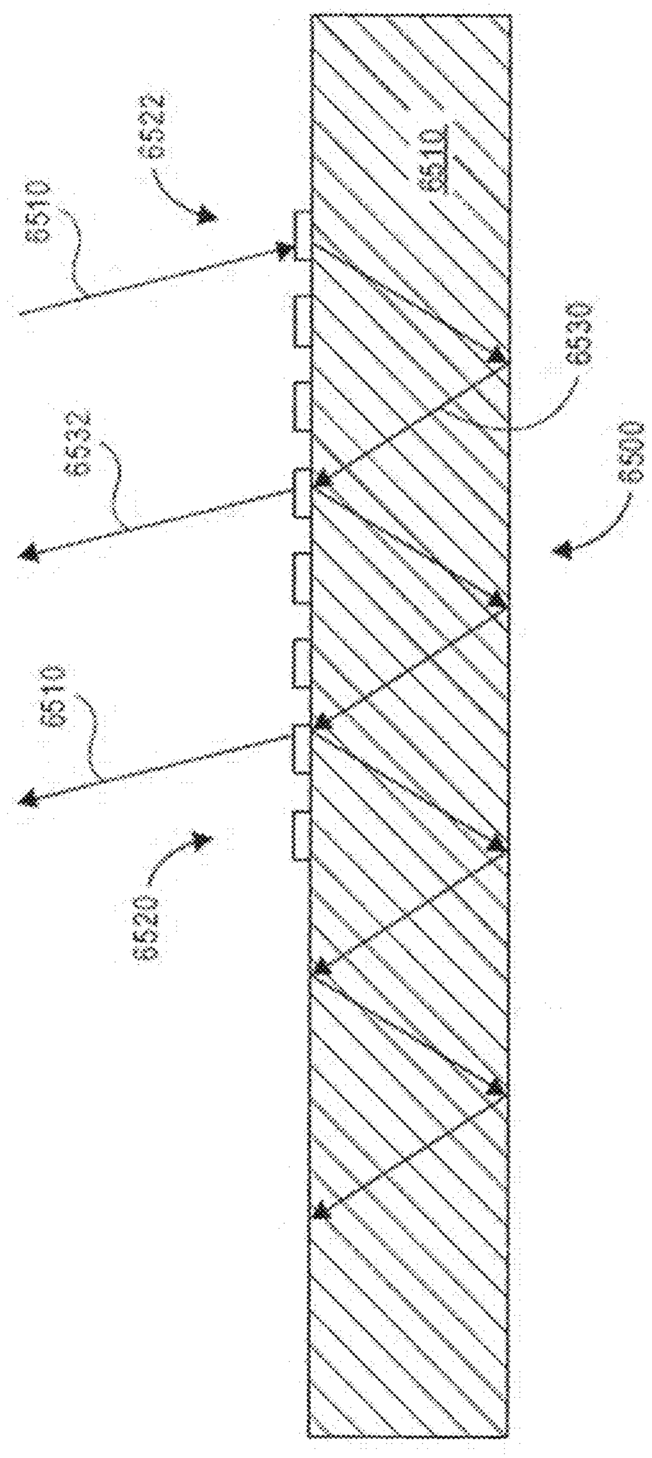
FIG. 65 is a simplified cross-sectional view of an incoupling grating according to some embodiments of the present invention.

FIG. 65 is simplified cross-sectional view of an incoupling grating according to an embodiment of the present invention. As discussed herein, the ICG couples the image light from the projector into the planar waveguide. In the embodiments illustrated in FIG. 65, light propagates from the ICG towards the OPE. As illustrated in FIG. 65, the grating structure utilized for the ICG is characterized by varying diffraction efficiency as a function of position, for example, lower diffraction efficiency in region 6520 and higher diffraction efficiency in region 6522, providing an ICG with a graded diffraction efficiency across the ICG.

Referring to FIG. 65, consider light incident on the side of the ICG farthest from the OPE, i.e., region 6522. Light incident in this region re-encounters the ICG multiple times before leaving the grating region as illustrated by waveguide rays 6530. Each time this light re-encounters the ICG, some portion of the light is diffracted by the ICG and exits the waveguide as illustrated by ray 6532. This effect will decrease the amount of light propagating toward the OPE, and eventually to the user.

Accordingly, embodiments of the present invention utilize an ICG with a varying diffraction efficiency, for example, lower diffraction efficiency on the side of the ICG near the OPE (i.e., region 6520), and higher diffraction efficiency on the side of the ICG farthest from the OPE (i.e., region 6522). As light propagates in the waveguide from region 6522 toward the OPE, the decreasing diffraction efficiency of the ICG as the light approaches region 6520 will result in less light being diffracted out of the grating region. In addition to higher throughput to the OPE, some embodiments may also provide increased uniformity as certain incident angles will experience higher net incoupling efficiency. As the incoupling as a function of incident angle varies, the total uniformity of the ICG will improve. In one implementation, the grating height (or depth) would be graded, with the lower grating height in region 6520 near the OPE and higher grating depth in region 6522 farther from the OPE.

Figure 66:
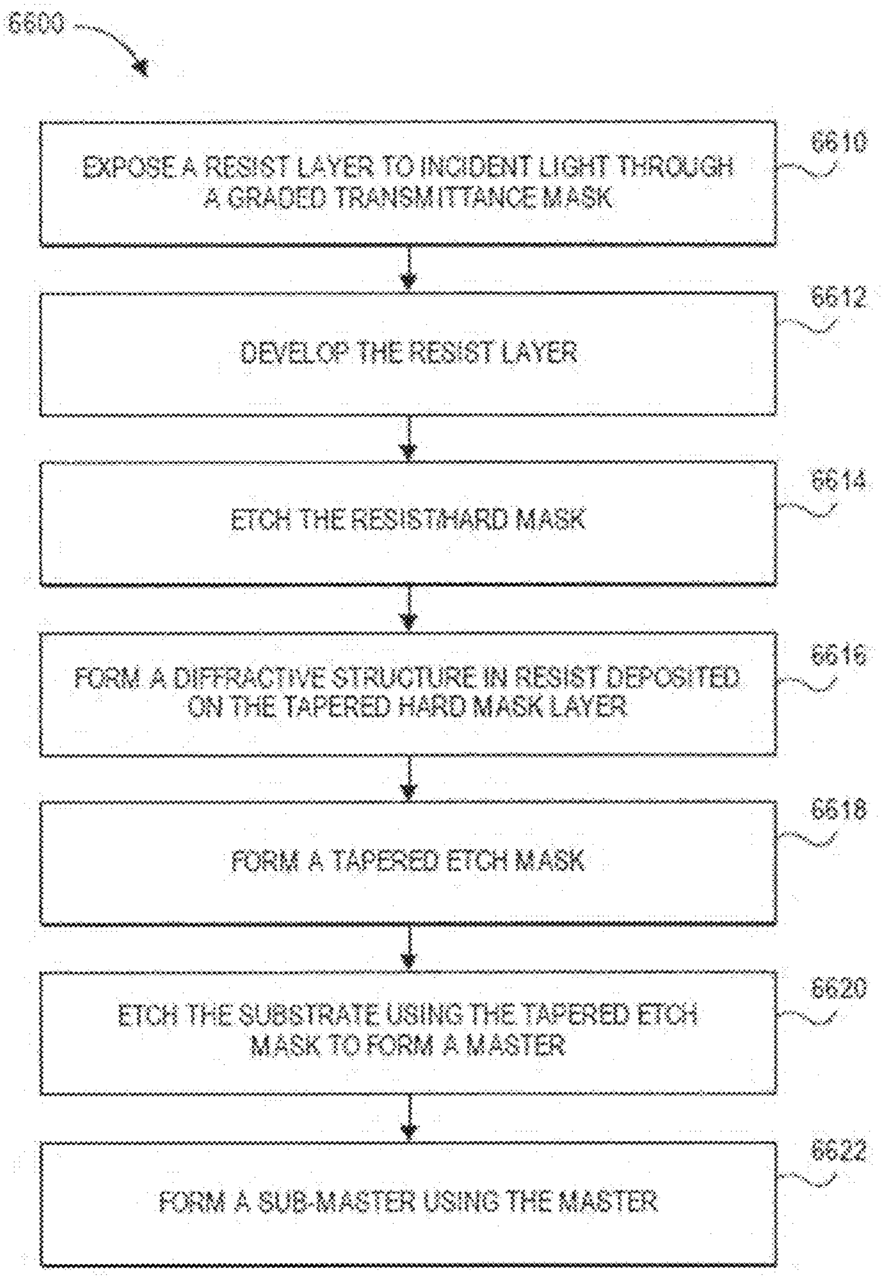
FIG. 66 is a simplified flowchart illustrating a method of fabricating a diffractive structure with varying diffraction efficiency according to some embodiments of the present invention.

FIG. 66 is a simplified flowchart illustrating a method of fabricating a diffractive structure with varying diffraction efficiency according to an embodiment of the present invention. The method is used in conjunction with a substrate that is coated with a hard mask layer and a resist layer. The method 6600 includes exposing the resist layer to incident light through a graded transmittance mask (6610). The mask has a graded transmittance as a function of position, for example, high transmittance on a first side (e.g., the left side) and a low transmittance on a second side (e.g., the right side). The transmittance can be graded linearly or non-linearly.

It should be noted that in addition to gray scale lithography, other direct writing techniques, such e-beam lithography or laser writing, can be used to spatially control the dose distribution and are applicable to embodiments of the present invention. In these alternative approaches, 6610 can be replaced by the appropriate technique to provide the resist layer with a graded profile.

The method also includes developing the resist layer (6612). As a result of the exposure using the graded transmittance mask, the resist profile after exposure and development will be characterized by a height that is tapered from a thin value to a thicker value as a function of position. The method further includes etching of the resist/hard mask layer (6614). The tapered resist profile is transferred to the hard mask layer in this embodiment by "proportional ME." In this process, the resist will delay the etching of the underlying material and the delay is proportional to the etch thickness. The ratio between the etching rate of the resist and the etching rate of the underlying material determines the vertical proportionality between the resist profile and the etched profile. Thus, the height difference present in the resist profile will be transferred to the hard mask layer, resulting in a hard mask layer with a tapered profile as the thickness of the hard mask layer varies as a function of position.

The method also includes forming a diffractive structure defined in a second resist layer deposited on the tapered hard mask layer (6616). The method further includes forming a tapered etch mask that includes the periodicity of the grating structure (6618). This tapered etch mask material will vary in thickness as a function of position. The method includes etching of the substrate using the tapered etch mask (6620). As will be evident to one of skill in the art, the resist layer can be removed before etching of the substrate. Thus, using embodiments of the present invention, a master is formed by transferring the height difference present in the tapered etch mask to the substrate, with a shallower etch (i.e., lower grating height) in one region (e.g., associated with the higher transmittance region of the gray scale mask) and a deeper etch (i.e., higher grating height) in a second region (associated with the lower transmittance region of the gray scale mask).

Thus, as illustrated, for example, in FIG. 60G, embodiments of the present invention utilize a gray scale lithography process to form a master having a diffractive structure with a varying grating height and, as a result, varying diffraction efficiency, as a function of position.

In an alternative embodiment, the master is used to fabricate a sub-master (6622), which can be used in a replication process to imprint copies.

It should be appreciated that the specific steps illustrated in FIG. 66 provide a particular method of fabricating a diffractive structure with varying diffraction efficiency according to an embodiment of the present invention. Other sequences of steps may also be performed according to alternative embodiments. For example, alternative embodiments of the present invention may perform the steps outlined above in a different order. Moreover, the individual steps illustrated in FIG. 66 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 67:
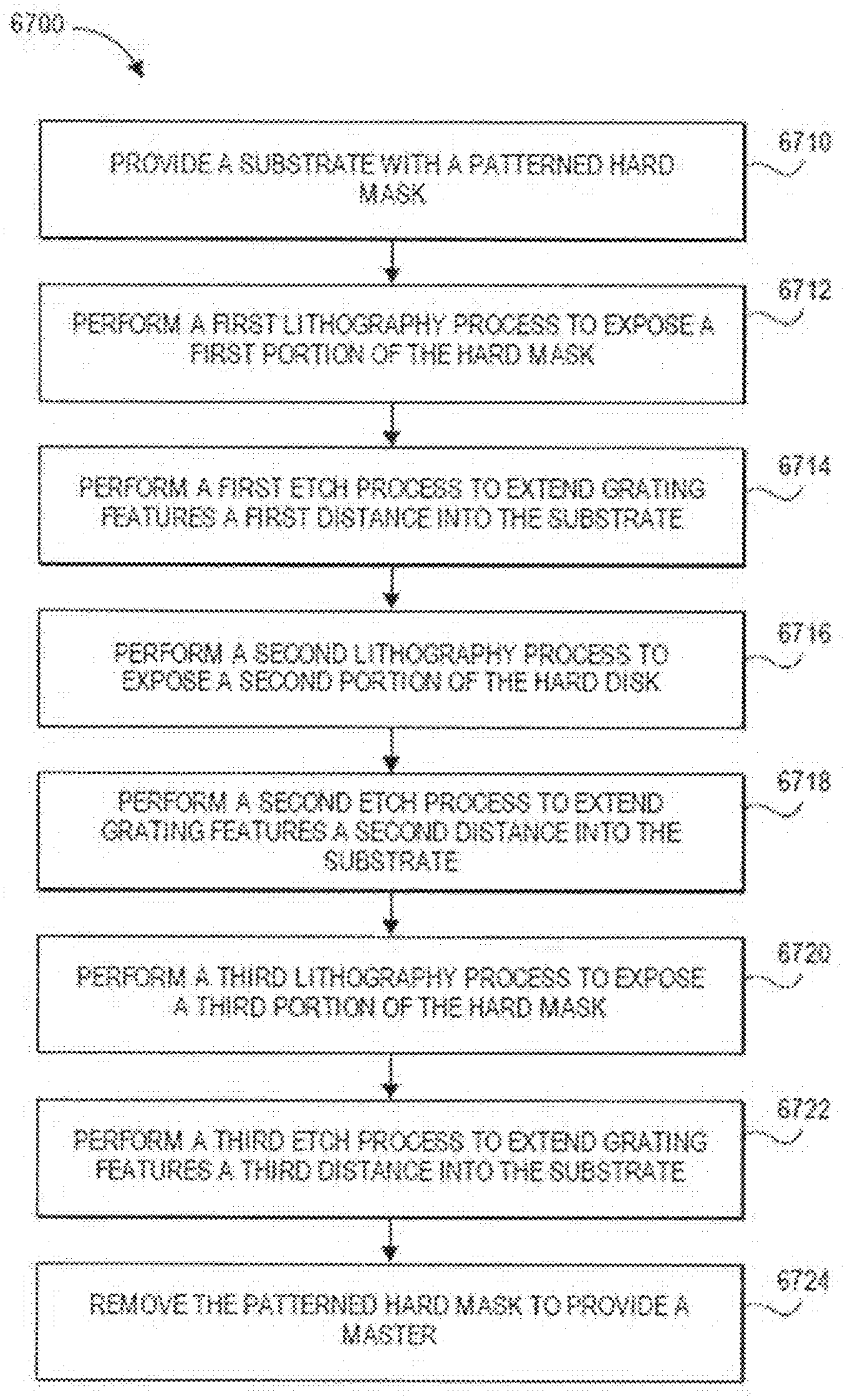
FIG. 67 is a simplified flowchart illustrating a method of fabricating a diffractive structure characterized by regions of differing diffraction efficiency according to some embodiments of the present invention.

FIG. 67 is a simplified flowchart illustrating a method of fabricating a diffractive structure characterized by regions of differing diffraction efficiency according to an embodiment of the present invention. The method 6700 includes providing a substrate with a patterned hard mask (6710), which can be referred to as a substrate structure. As an example, the patterned hard mask can have a pattern associated with a diffractive optical element, which can be a diffraction grating with a predetermined periodicity (e.g., on the order of 200 nm to 400 nm) and height (e.g., on the order of 10 μm to 500 μm). In an embodiment, the patterned hard mask includes $SiO_2$. The method also includes performing a first lithography process comprising coating the substrate structure with a resist layer and removing at least a portion of the resist layer to form an exposed portion of the patterned hard mask (6712).

The method further includes performing a first etching process to extend grating features a first predetermined distance into the exposed portions of the substrate (6714). It is generally desirable to use a selective etch process that provides selectivity between the patterned hard mask and the substrate because of the multiple etch process steps utilized as discussed below.

The method includes performing a second lithography process to expose portions of the patterned hard mask that are different from the portions exposed during the first lithography process (6716). The exposed portions differ, but can share common areas. The method also includes performing a second etching process extend grating features a second predetermined distance into the exposed portions of the substrate (6718). In areas of the substrate in which the portion exposed in the first lithography process and the portion exposed in the second lithography process overlap, the grating features extend to a distance equal to the sum of the first predetermined distance and the second predetermined distance.

The method further includes, in some embodiments, performing a third lithography process to expose portions of the patterned hard mask that are different from the portions exposed during the second lithography process (6720) (and/or the first lithography process) and performing a third etching process extend grating features a third predetermined distance into the exposed portions of the substrate (6722).

Removal of the patterned hard mask provides a master with a predetermined patterned structure (6724). Accordingly, embodiments of the present invention provide an N-level etching process in which the depth of the grating features vary as a function of the number of etching levels and the lithography processes used to define the etched areas.

It should be appreciated that the specific steps illustrated in FIG. 67 provide a particular method of fabricating a diffractive structure characterized by regions of differing diffraction efficiency according to an embodiment of the present invention. Other sequences of steps may also be performed according to alternative embodiments. For example, alternative embodiments of the present invention may perform the steps outlined above in a different order. Moreover, the individual steps illustrated in FIG. 67 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 68A:
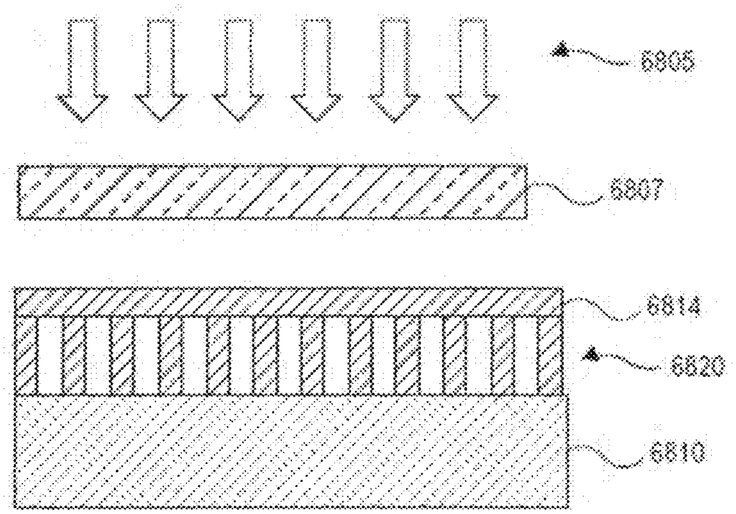
FIGS. 68A-D are simplified process flow diagrams illustrating a process for fabricating variable diffraction efficiency gratings using gray scale lithography according to some embodiments of the present invention.

FIGS. 68A-D are a simplified process flow diagram illustrating a process for fabricating variable diffraction efficiency gratings using gray scale lithography according to another embodiment of the present invention. As illustrated in FIGS. 68A-D, gray scale lithography is utilized to form a diffractive structure (e.g., a diffraction grating) with varying diffraction efficiency as a function of position. Referring to FIG. 68A, mask 6807 is exposed to incident light 6805. The mask 6807 has a graded transmittance as a function of position, for example, high transmittance on a first side (e.g., the left side) and a low transmittance on a second side (e.g., the right side). The transmittance can be graded linearly or non-linearly. In addition to gray scale lithography, other direct writing techniques, such e-beam lithography or laser writing, can be used to spatially control the dose distribution and are applicable to embodiments of the present invention.

Referring to FIG. 68A, substrate 6810 and patterned hard mask 6820 (e.g., an $SiO_2$ hard mask) form a substrate structure. As an example, the patterned hard mask 6820 can have a pattern associated with a diffractive optical element, which can be a diffraction grating with a predetermined periodicity (e.g., on the order of 200 nm to 400 nm) and height (e.g., on the order of 10 μm to 500 μm). As described below, the use of materials with different properties, including etch rates, enables use of the patterned hard mask as a masking material. The substrate structure is coated with a resist layer 6814.

Figure 68B:
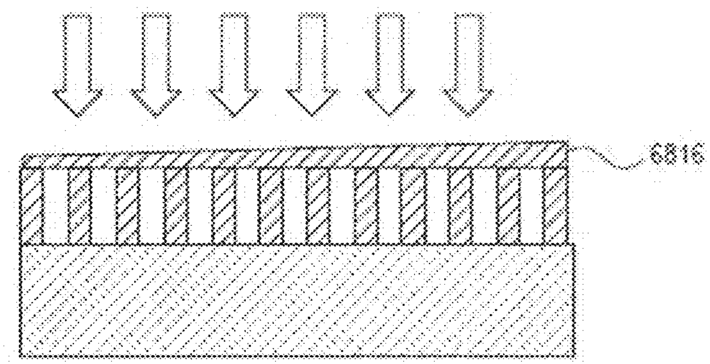

Upon exposure using mask 6807, the resist adjacent the portion of the mask with high transmittance (e.g., the left side) receives a higher dose than the resist adjacent portion of the mask with lower transmittance (e.g., the right side). FIG. 68B illustrates the resist profile 6816 after exposure and development. Due to the higher dose received adjacent the portion of the mask with high transmittance, the height of the resist layer 6816 is tapered from a thin value to a thicker value as a function of position. Etching of the resist/patterned hard mask layer is then performed.

Figure 68C:
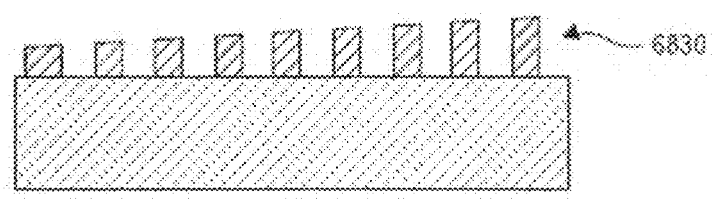

FIG. 68C illustrates an etch profile after etching using the resist profile illustrated in FIG. 68B. The resist profile is transferred to the patterned hard mask layer in this embodiment by "proportional RIE." In this process, the resist will delay the etching of the underlying material and the delay is proportional to the etch thickness. The ratio between the etching rate of the resist and the etching rate of the underlying material determines the vertical proportionality between the resist profile and the etched profile. As shown in FIG. 68C, the height difference present in the resist profile has been transferred to the patterned hard mask layer producing a tapered hard mask 6830, i.e., a hard mask layer with a tapered profile as the thickness of the hard mask layer varies as a function of position.

Figure 68D:
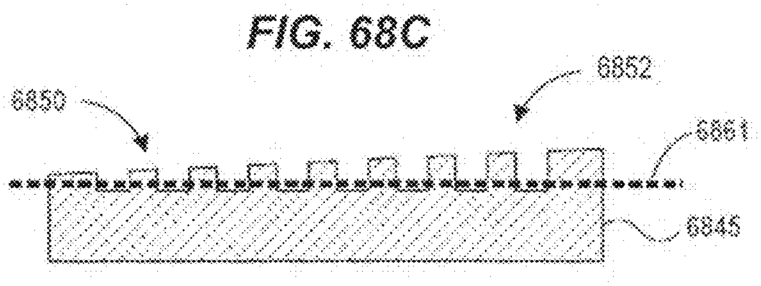

FIG. 68D illustrates the formation of a diffractive structure in the substrate 6845 via a proportional etch process using the tapered hard mask layer. This etch process forms a tapered etch mask that includes the periodicity of the grating structure in a tapered etch mask material that varies in thickness as a function of position. As shown in FIG. 68D, the height difference present in the tapered hard mask layer has been transferred to the substrate, with a shallower etch (i.e., lower grating height) in region 6850 (associated with the higher transmittance region of the gray scale mask) and a deeper etch (i.e., higher grating height) in region 6852. As an example, the variation in height between grating teeth can vary over a predetermined range, for example, from 5 nm to 500 nm. Thus, as illustrated in FIG. 68D, embodiments of the present invention utilize a gray scale lithography process to form a master having a diffractive structure with a varying grating height and, as a result, varying diffraction efficiency, as a function of position. Although a linear increase in grating height is illustrated in FIG. 68D as a result of the linear transmittance variation in the gray scale mask, the present invention is not limited to this linear profile and other profiles having predetermined height variations are included within the scope of the present invention.

It should be noted that although a single variable height region is illustrated in FIG. 68D, this single region should be considered in light of FIG. 59B, which illustrates a plurality of regions of differing diffraction efficiency. The tapering of the grating height can thus be combined with a predetermined grating height associated with a particular region to provide variation in diffraction efficiency, both intra-region as well as inter-region. One of ordinary skill in the art would recognize many variations, modifications, and alternatives.

Referring to FIG. 68D, the bottom of the grating lines are coplanar with plane 6861. Accordingly, a sub-master can be fabricating using the master illustrated in FIG. 68D and will have a complement of the grating lines present in the master. Accordingly, a sub-master can be created with a planar surface aligned with the tops of the grating structure.

Figure 69:
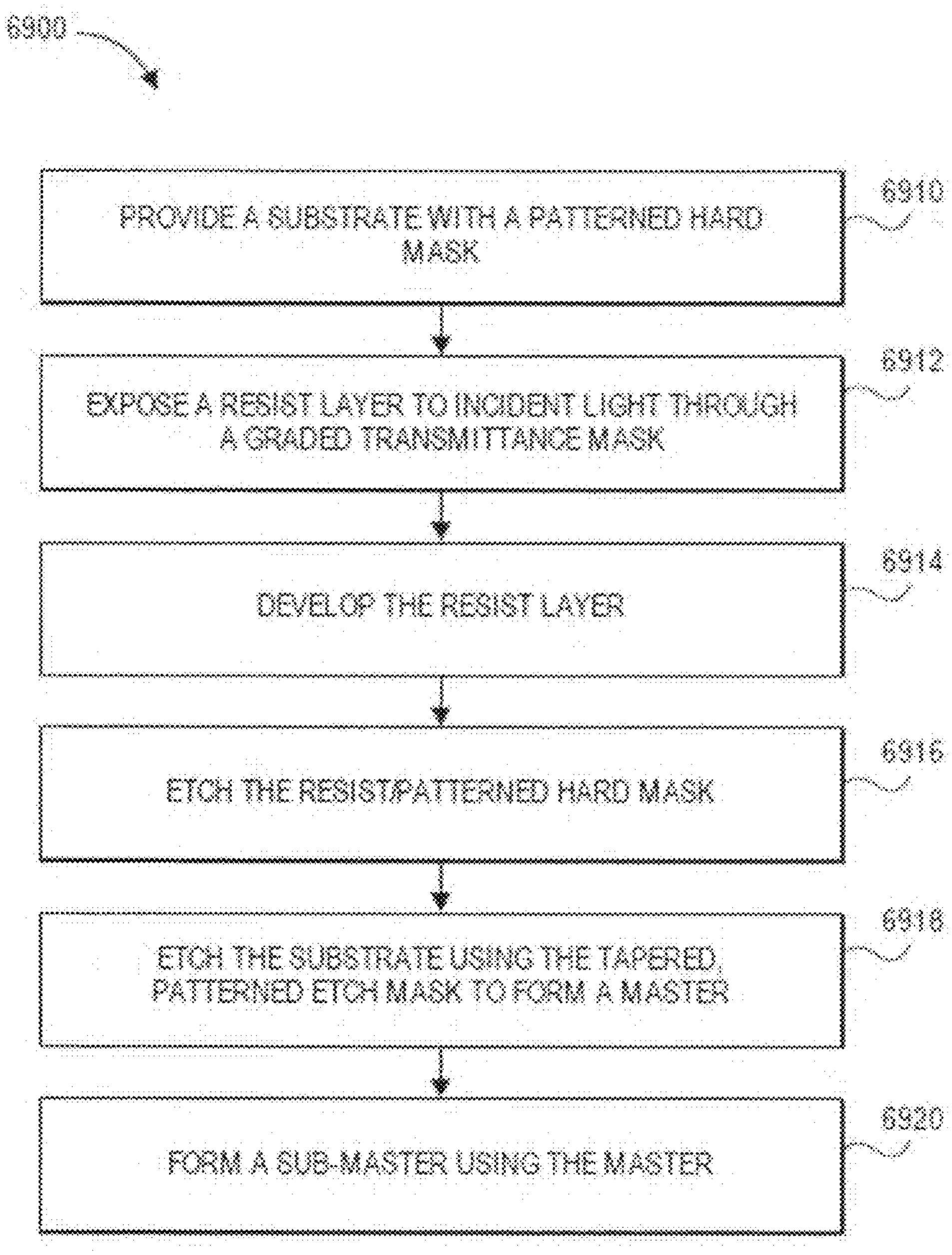
FIG. 69 is a simplified flowchart illustrating a method of fabricating a diffractive structure with varying diffraction efficiency according to some embodiments of the present invention.

FIG. 69 is a simplified flowchart illustrating a method of fabricating a diffractive structure with varying diffraction efficiency according to another embodiment of the present invention. The method 6900 includes providing a substrate with a patterned hard mask (6910), which can be referred to as a substrate structure. As an example, the patterned hard mask can have a pattern associated with a diffractive optical element, which can be a diffraction grating with a predetermined periodicity (e.g., on the order of 200 nm to 400 nm) and height (e.g., on the order of 10 μm to 500 μm). In an embodiment, the patterned hard mask includes $SiO_2$.

The method also includes exposing the resist layer to incident light through a graded transmittance mask (6912). The mask has a graded transmittance as a function of position, for example, high transmittance on a first side (e.g., the left side) and a low transmittance on a second side (e.g., the right side). The transmittance can be graded linearly or non-linearly.

It should be noted that in addition to gray scale lithography, other direct writing techniques, such e-beam lithography or laser writing, can be used to spatially control the dose distribution and are applicable to embodiments of the present invention. In these alternative approaches, 6912 can be replaced by the appropriate technique to provide the resist layer with a graded profile.

The method also includes developing the resist layer (6914). As a result of the exposure using the graded transmittance mask, the resist profile after exposure and development will be characterized by a height that is tapered from a thin value to a thicker value as a function of position. The method further includes etching of the resist/patterned hard mask layer (6916). The tapered resist profile is transferred to the patterned hard mask layer in this embodiment by "proportional RIE." In this process, the resist will delay the etching of the underlying material and the delay is proportional to the etch thickness. The ratio between the etching rate of the resist and the etching rate of the underlying material determines the vertical proportionality between the resist profile and the etched profile. Thus, the height difference present in the resist profile will be transferred to the partnered hard mask layer, resulting in a patterned hard mask layer with a tapered profile as the thickness of the hard mask layer varies as a function of position.

The method further includes etching the substrate using the tapered hard mask layer (6918). Thus, using embodiments of the present invention, a master is formed by transferring the height difference present in the tapered, patterned hard mask layer to the substrate, with a shallower etch (i.e., lower grating height) in one region (e.g., associated with the higher transmittance region of the gray scale mask) and a deeper etch (i.e., higher grating height) in a second region (associated with the lower transmittance region of the gray scale mask).

Thus, as illustrated, for example, in FIG. 68D, embodiments of the present invention utilize a gray scale lithography process to form a master having a diffractive structure with a varying grating height and, as a result, varying diffraction efficiency, as a function of position.

In an alternative embodiment, the master is used to fabricate a sub-master (6920), which can be used in a replication process to imprint copies.

It should be appreciated that the specific steps illustrated in FIG. 69 provide a particular method of fabricating a diffractive structure with varying diffraction efficiency according to another embodiment of the present invention. Other sequences of steps may also be performed according to alternative embodiments. For example, alternative embodiments of the present invention may perform the steps outlined above in a different order. Moreover, the individual steps illustrated in FIG. 69 may include multiple sub-steps that may be performed in various sequences as appropriate to the individual step. Furthermore, additional steps may be added or removed depending on the particular applications. One of ordinary skill in the art would recognize many variations, modifications, and alternatives.

Varying Refractive Indices

According to some embodiments of the present invention, films with varying index of refraction, which are suitable for use with diffractive elements as described herein, are formed using a drop on demand process, for example, inkjet printing of liquids, such as UV curable organic polymers, for instance using a jet and flash imprint lithography (J-FIL) process. These films with varying index of refraction can be formed by dispensing liquids spatially in the form of a 2D array, followed by patterning with a diffractive structure, for example, a diffraction grating structure, which may be referred to as relief feature. Embodiments disclosed herein provide flexibility in modulating the amplitude and phase of light propagating through the diffractive structure by utilizing imprinted materials of varying indices and controlled volume in combination with a desired waveguide diffraction structure pattern, which can be defined by a master template.

In one embodiment, the liquid is dispensed as drops, typically having a volume of 2-100 picoliters and ranging in diameter from about 10 μm to about 500 μm. These drops then spread to an area of several hundred microns and yield a film with a thickness in the range of ~5 nm to ~5 μm. In some embodiments, more than one liquid may be selectively dropped onto the substrate. For example, as will be described in further detail herein, multiple different liquids having different refraction indices may be used. As light travels through the film with varying index of refraction that is thus formed, interaction with the diffractive structures (e.g., during TIR through a high index waveguide layer) may cause the light to undergo modulation in amplitude and phase as discussed herein. This dithering of the index of refraction facilitates spreading of the light as it is coupled out of the diffractive structure, thereby controllably forming a virtual image with increased coherence. It should be noted that the methods and systems described herein to achieve a film with varying index of refraction enable spatial control over index of refraction. Selectively varying the index of refraction over different areas may reduce the potential negative impact of phase and amplitude modulation on other optical properties of the diffractive structure, including contrast of the image being displayed, while improving the overall uniformity and brightness.

Figures 36A, 36B, 36C:
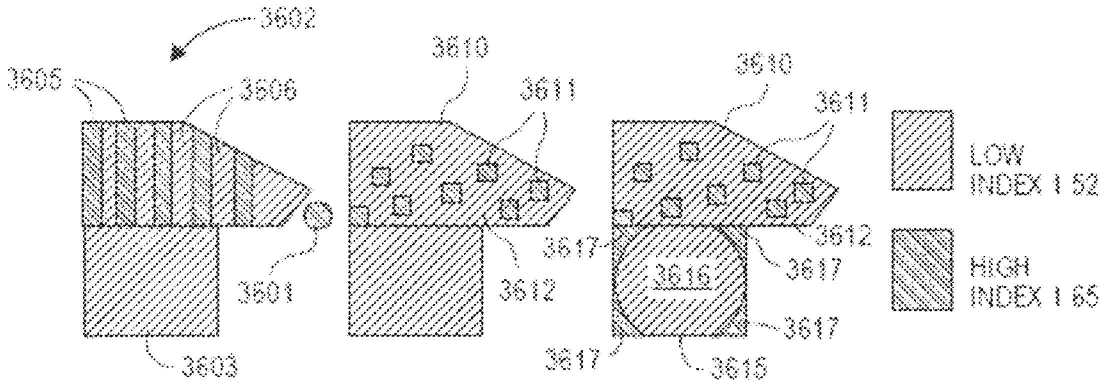
FIG. 36A is a simplified plan view diagram illustrating a diffractive element with a periodically varying index of refraction according to an embodiment of the present invention.
FIG. 36B is a simplified plan view diagram illustrating a diffractive element with a distributed variation in index of refraction according to an embodiment of the present invention.
FIG. 36C is a simplified plan view diagram illustrating a set of diffractive elements with varying index of refraction according to an embodiment of the present invention.

FIG. 36A is a simplified plan view diagram illustrating a diffractive element with a periodically varying index of refraction according to an embodiment of the present invention. In FIG. 36A, diffractive element 3602 can be an OPE of an eyepiece that includes ICG 3601 and EPE 3603. As illustrated in FIG. 36A, different regions of diffractive element 3602 are characterized by differing indices of refraction resulting in modulated amplitude of light through diffractive element 3602. Regions 3605 are characterized by a high index (e.g., n=1.65) and regions 3606 are characterized by a low index (e.g., n=1.52). These regions can be formed by dispensing controlled volume drops of material with high and low index in a 2D spatial pattern to form a layer that is subsequently imprinted with a diffractive structure such as a diffraction grating pattern. Upon imprinting, the layer of varying index of refraction will have a predetermined residual layer thickness (RLT) ranging in some embodiments from ~5 nm to ~5 μm.

In FIG. 36A, region 3605 can be formed by placing drops of high index material using a drop on demand process such that after imprinting, the borders of region 3605 are formed in a generally rectangular layout. Region 3606 can be formed by placing drops of low index material using the drop on demand process in a similar manner. The arrays of drops consisting of higher index material (e.g., n=1.65) can have drop dimensions on the order of ~10 μm to ~100 μm in diameter and can be arrayed so that regions 3605 have dimensions on the order of 0.5 mm to 5 mm. The array of lower index material regions (e.g., n=1.52) are formed in a similar manner. When imprinted, the drops in the sets of arrays spread and bond to the boundary of adjacent arrays to form a continuous film with regions of varying index of refraction. The drop on demand processes enable control of the volume and the film thickness in which the diffractive structures are imprinted. Although embodiments of the present invention are discussed in terms of the imprinting of diffractive structures in the varying index film, it should be noted that the present invention is not limited to this design and planar surfaces can abut the varying index film as discussed in relation to FIG. 36E. The diffractive structures can include nano-features including gratings, holes, pillars, and the like.

Although an example of diffractive element 3602 is an OPE, the variation in index of refraction can be utilized in additional diffractive elements making up an eyepiece, including the ICG and the EPE or other diffractive elements. For example, in the OPE, the variation may be random, whereas in the EPE, specific areas may be designated for variation in refraction. One of ordinary skill in the art would recognize many variations, modifications, and alternatives. Moreover, although only two index of refraction materials are illustrated in this and other embodiments, the present invention is not limited to the use of only two materials, but can utilize additional numbers of materials with varying indices of refraction. As an example, three or four different materials can be utilized in some embodiments. Typically, embodiments of the utilize materials used have refraction indices ranging from about 1.49 to about 1.7.

Figure 36D:
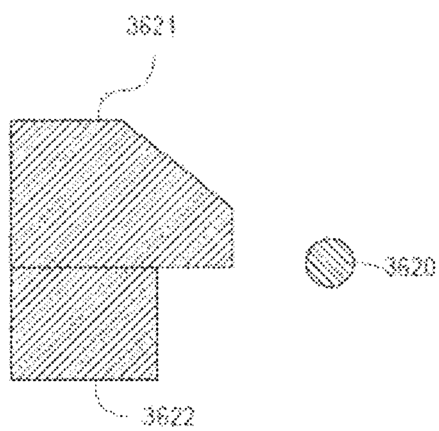
FIG. 36D is a simplified plan view diagram illustrating a set of diffractive elements having different uniform index of refractions according to an embodiment of the present invention.
Figure 36E:
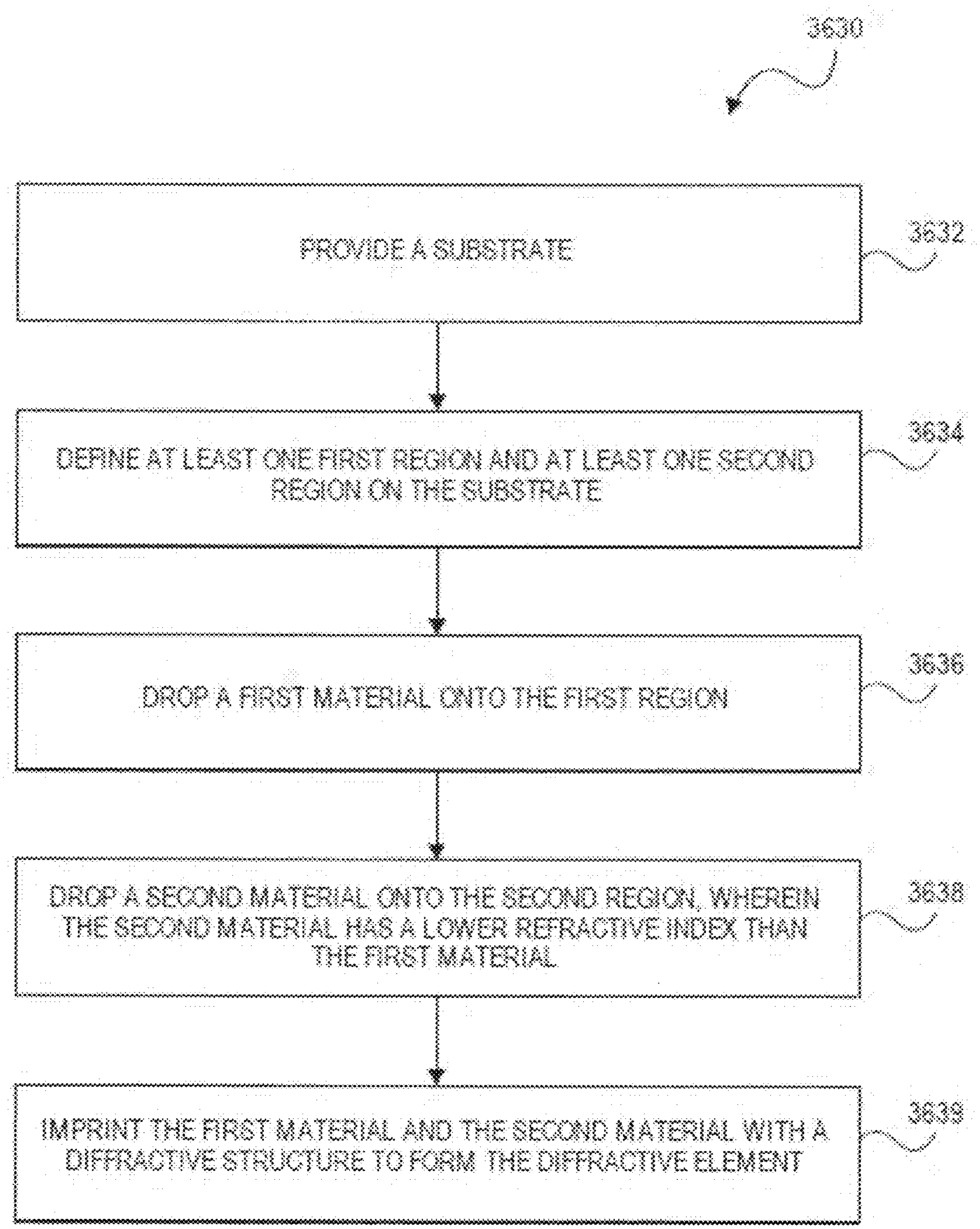
FIG. 36E is a simplified flowchart illustrating a method of fabricating a diffractive element with varying index of refraction according to an embodiment of the present invention.
Figures 36F, 36G, 36H, 36I:
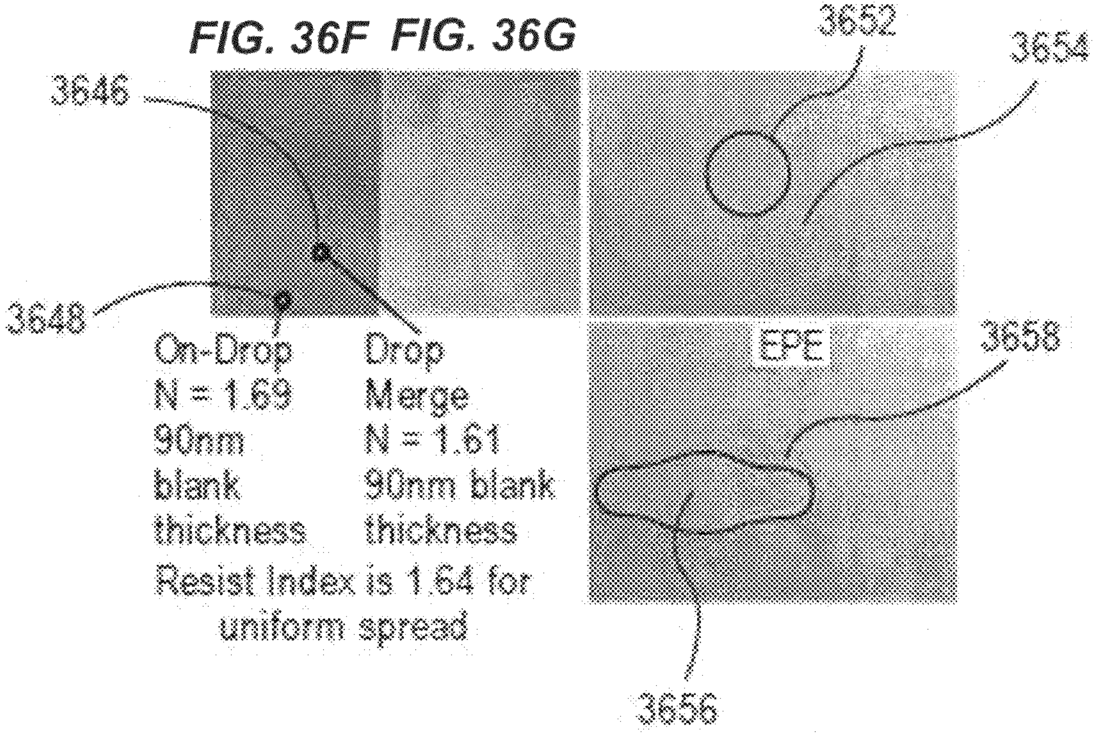
FIG. 36F is an image illustrating a film of varying index of refraction abutting a planar substrate according to an embodiment of the present invention.
FIG. 36G is an image illustrating a film of varying index of refraction abutting a diffractive substrate according to an embodiment of the present invention.
FIG. 36H is an image illustrating a film of varying index of refraction in a first diffractive element according to an embodiment of the present invention.
FIG. 36I is an image illustrating a film of varying index of refraction in a second diffractive element according to an embodiment of the present invention.
Figure 36J:
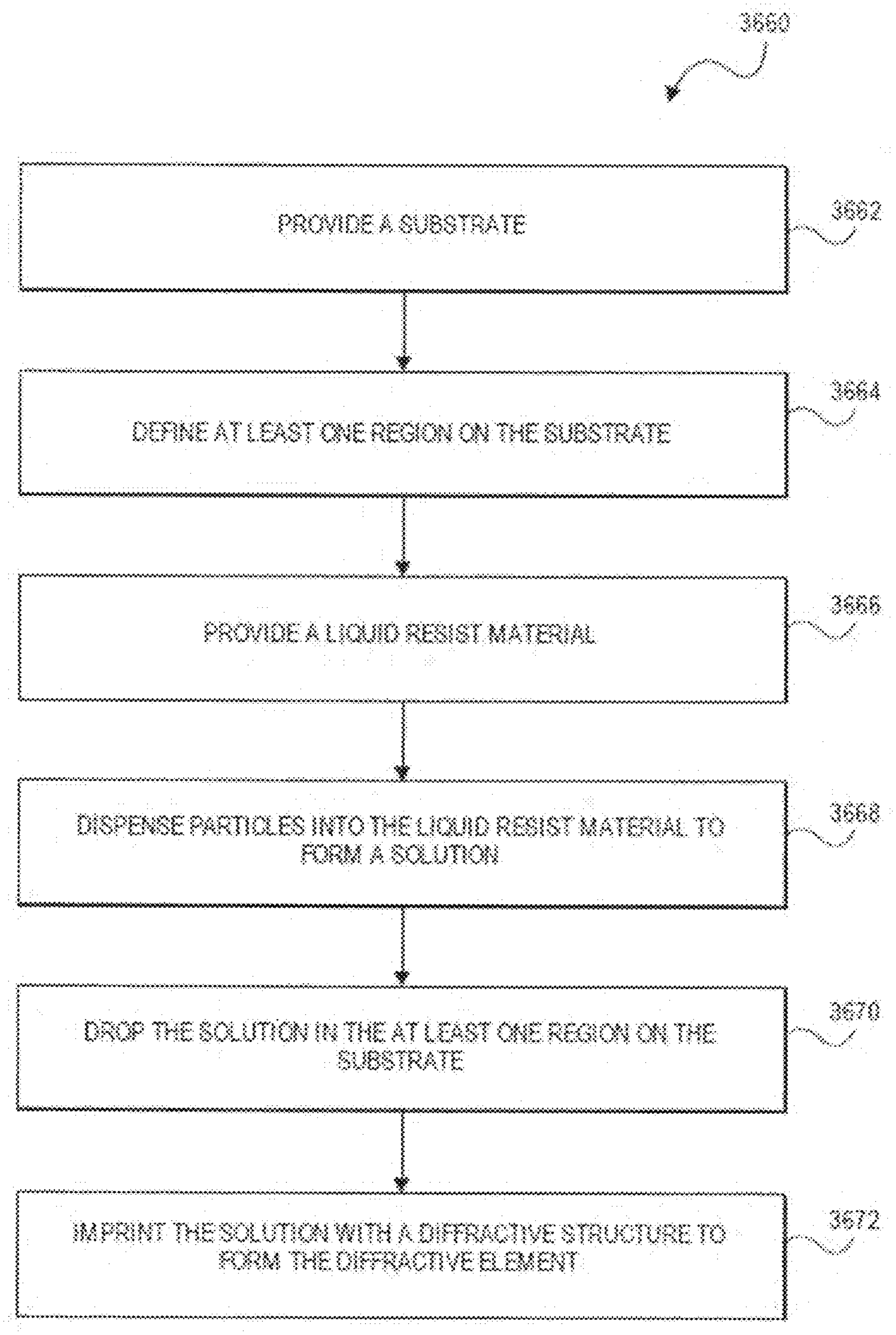
FIG. 36J is a simplified flowchart illustrating a method of fabricating a diffractive element with varying index of refraction according to an embodiment of the present invention.
Figure 36K:
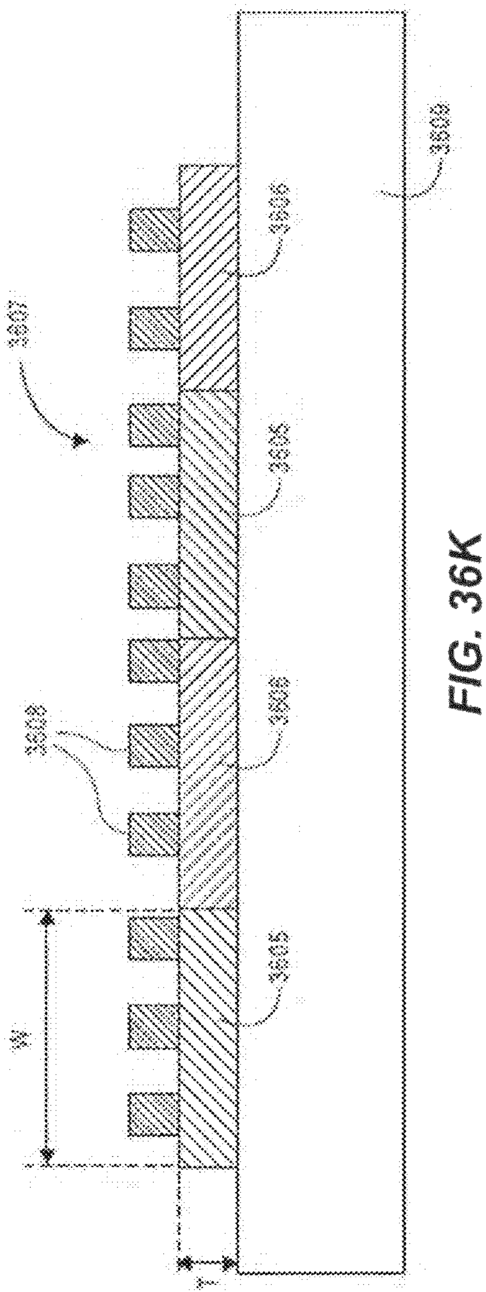
FIG. 36K is a simplified side view diagram illustrating a variable index of refraction structure for a diffractive element according to an embodiment of the present invention.

FIG. 36K is a simplified side view diagram illustrating a variable index of refraction structure for a diffractive element according to an embodiment of the present invention. As illustrated in FIG. 36K, a plurality of regions of a high index of refraction 3605 are interspersed on a substrate 3609 with a plurality of regions of a low index of refraction 3606 in relation to the regions of high index of refraction. A diffractive structure 3607, which can include, for example, a plurality of diffractive elements 3608 (e.g., grating elements), is disposed adjacent the regions 3605 and 3606. In some embodiments, the template used to imprint the diffractive structure planarizes regions 3605 and 3606 to provide a uniform thickness film T on the order of a few nanometers to thousands of nanometers, e.g., 5 nm to 1,000 nm, for instance, 10 nm to 100 nm as a function of position on the substrate as discussed in relation to FIG. 36A.

As will be evident to one of skill in the art, the drawing is not to scale since the width W of regions 3605 and 3606 can be on the order of 0.5 mm-5 mm, whereas the pitch of grating elements 3608 can be on the order of 300 nm to 1500 nm. Additionally, as will be evident to one of skill in the art, embodiments of the present invention are not limited to two different indices of refraction and the regions of differing index of refraction can be made up of three or more different indices of refraction. Moreover, although a diffractive structure is imprinted on the regions of differing index of refraction, the diffractive structure can be replaced with a planar structure. In both implementations, embodiments of the present invention provide a predetermined geometry of varying index of refraction with a controllable film thickness. The pitch of the diffractive structure can be varied as a function of position as discussed in other embodiments of the present invention.

FIG. 36B is a simplified plan view diagram illustrating a diffractive element with a distributed variation in index of refraction according to an embodiment of the present invention.

In contrast with the arrayed regions in FIG. 36A, the illustrated embodiment includes a diffractive element 3610 having a set of high index of refraction islands 3611 interspersed within a background of low index of refraction material 3612. As discussed above, the set of high index of refraction islands 3611 and the surrounding low index of refraction material 3612 can be characterized by a uniform thickness as a function of position, providing a film of uniform thickness but having varying indices of refraction as a function of position. The variation in index of refraction can be characterized by a consistent distribution (e.g., by uniformly spacing the high index of refraction islands 3611) or by a non-consistent distribution (e.g., by a random or semi-random spacing of the high index of refraction islands). As discussed above, although only two index of refraction materials are illustrated in this embodiment, the present invention is not limited to the use of only two materials, but can utilize additional numbers of materials with varying indices of refraction. As an example, two or more different materials can be utilized to form the islands dispersed in the surrounding material.

According to some embodiments, the lateral dimensions of the high index of refraction islands 3611 measured in the plane of the figure are on the order of tens of microns to thousands of microns, e.g., 0.5 mm-5 mm. As discussed in relation to FIG. 36K, the thickness T of the high index of refraction islands 3611 and the surrounding low index of refraction material 3612 is on the order of a few nanometers to thousands of nanometers, e.g., 5 nm to 1,000 nm, for instance, 10 nm to 100 nm.

FIG. 36C is a simplified plan view diagram illustrating a set of diffractive elements varying index of refraction according to an embodiment of the present invention. In a manner similar to that illustrated in FIG. 36B, diffractive element 3610 includes a set of high index of refraction islands 3611 interspersed with a surrounding low index of refraction material 3612. In addition to the variation of index of refraction present in diffractive element 3610, additional diffractive element 3615 may include regions with differing indices of refraction. For example, FIG. 36C shows an additional diffractive element 2615 that includes a low index of refraction central region 3616 and a set of high index of refraction peripheral regions 3617. As an example, diffractive element 3610 can be an OPE and additional diffractive element 3615 can be an EPE of an eyepiece.

In some diffractive element designs, the intensity of light outcoupled at the edges or corners of the element may be less than the intensity outcoupled at central portions of the element, thereby impacting image quality. The set of peripheral regions 3617, which are characterized by a high index of refraction, increase the coupling coefficient of the diffractive structure with respect to the central portion, resulting in increased outcoupling in these peripheral regions 3617, which can improve image uniformity. In some embodiments, regions having high index or refraction may be asymmetric. For example, in some embodiments, larger or differently shaped regions may be used having high index of refraction in areas of the diffractive element furthest from a light source.

The diffractive element 3610 and the additional diffractive element 3615 can be imprinted at the same time and can have different diffractive structures, for example, diffraction gratings with different periodicities and orientations. One of ordinary skill in the art would recognize many variations, modifications, and alternatives.

FIG. 36D is a simplified plan view diagram illustrating a set of diffractive elements having different uniform index of refractions according to an embodiment of the present invention. In this embodiment, a first diffractive element 3620 (e.g., an ICG) can have a uniform high index of refraction while second and third diffractive elements 3621 and 3622 (e.g., an OPE and an EPE, respectively), have a uniform low index of refraction. In this design, the eyepiece including these three diffractive elements will have, in the same plane, diffractive elements with differing index of refraction, and as a result, differing coupling coefficients. In this example, the high index of refraction material in the ICG will provide for high coupling efficiency from the projector into the eyepiece and different (e.g., lower) coupling efficiencies for the OPE and EPE. Since all three diffractive elements can be imprinted concurrently, the film thickness can be uniform as a function of position, providing unique benefits including high brightness as a result of the differing indices of refraction that are not available using conventional techniques.

It should be noted that embodiments of the present invention provide combinations of the techniques described herein. As an example, a high index of refraction material with a uniform spatial profile as a function of position can be provided in the ICG to increase the diffractive coupling, a varied index of refraction spatial profile as a function of position can be provided in the OPE to provide a dithering effect, and a uniform spatial profile as a function of position can be provided in the EPE. Other combinations are also included with the scope of the present invention. Accordingly, each of the elements of the eyepiece can be optimized for their particular function using embodiments of the present invention.

FIG. 36E is a simplified flowchart 3630 illustrating a method of fabricating a diffractive element with varying index of refraction according to an embodiment of the present invention. The method includes providing a substrate (3632). The method further includes defining at least one first region and at least one second region on the substrate (3634).

The method further includes dropping a first material onto the first region (3636). The method further includes dropping a second material onto the second region (3638). The first material and the second material may be dropped as controlled volume droplets in some embodiments. The second material may have a lower refractive index than the first material. For example, the first material may have a refractive index of n=1.65, whereas the second material may have a refractive index of n=1.52. In some embodiments, the first material and the second material may have lower refractive indices than the substrate.

The method further includes imprinting the first material and the second material with a diffractive structure to form the diffractive element (3639). The diffractive element may be or include, for example, an OPE, an EPE, and/or an ICG. For different diffractive elements, however, the variation in refractive indices may be different. For example, in the OPE, the variation may be random, whereas in the EPE, specific area may be designated for variation in refraction. In some embodiments, more than one diffractive element may be fabricated in a single process.

The diffractive structure may include, for example, one or more grating patterns, hole, and/or pillar patterns (i.e., a constant, varying, or random pattern). When imprinted, the drops of the first material and the drops of the second material may spread and bond to the boundary of adjacent drops to form a continuous film with regions of varying indices of refraction. Upon imprinting, the first material and the second material may have a predetermined residual layer thickness (RLT) ranging in some embodiments from ~5 nm to ~5 μm.

According to the method described with respect to flowchart 3630, a diffractive element having varying refractive indices may be obtained. By implementing varying refractive indices, a more uniform spread of light through the diffractive element may be obtained, enabling control over image coherence over the desired field of view. Furthermore, this method of manufacture may be more inexpensive and less time consuming than contact nanoimprint lithography processes.

It should be appreciated that the specific steps illustrated in FIG. 36E provide a particular method of fabricating a diffractive element with varying index of refraction according to an embodiment of the present invention. Other sequences of steps may also be performed according to alternative embodiments. For example, alternative embodiments of the present invention may perform the steps outlined above in a different order. Moreover, the individual steps illustrated in FIG. 36E may include multiple sub-steps that may be performed in various sequences as appropriate to the individual step. Furthermore, additional steps may be added or removed depending on the particular applications. One of ordinary skill in the art would recognize many variations, modifications, and alternatives.

Another method for forming a variable refraction index film is disclosed herein. A liquid resist having nanoparticles therein may be dropped onto a substrate. The liquid component of the resist may have a lower viscosity than the nanoparticle component, allowing different rates of spreading between the resist components when imprinting occurs.

FIG. 36F is an image illustrating a film of varying index of refraction abutting a planar substrate according to an embodiment of the present invention. The film illustrated in FIG. 36F includes a plurality of regions of high and low index of refraction materials. In order to fabricate this film, a high index liquid including components of varying index of refraction was provided. As an example, a fluid (e.g., photoresist) including nanoparticles (e.g., titanium oxide, zirconium oxide, or the like) having an index of refraction higher than the index of refraction of the fluid can be used. For instance, the fluid may be a photoresist with an index of refraction of 1.50 and nanoparticles in the fluid may have an index of refraction of 2.0. The high index nanoparticles are preferably uniformly distributed in the fluid with minimal agglomeration to facilitate inkjet dispensing and later imprinting with diffractive structures. The presence of the high index of refraction nanoparticles results in the fluid/nanoparticle mixture having a higher index of refraction than the fluid component alone. Alternatively, a fluid with different constituents can be used. In some embodiments, constituents may include long molecular chain polymers or highly functionalized polymers with a high index of refraction and shorter molecular chain polymers or lightly functionalized polymers with a lower index of refraction can be utilized. In some embodiments, the surface tension of the materials are varied to result in differing indices of refraction. One of ordinary skill in the art would recognize many variations, modifications, and alternatives.

After initial deposition by the drop on demand process, the drops, which initially may have a diameter of 10 μm-100 μm, will spread to form a film with a range in the hundreds of nanometers or less. As the drop spreads, an index of refraction variation is created, which may be related, without limiting the present invention, to a liquid phase diffusion process similar to a liquid phase chromatography process. In other words, as the drop spreads to a thin film with a thickness that is small (e.g., at the nanometer scale) in comparison with the lateral dimensions (e.g., at the micron scale), phase separation of the material occurs such that the center of the initial drop is characterized by a higher concentration of the nanoparticles than the peripheral portions of the drop after spreading. Accordingly, the peripheral portions are characterized by a lower concentration of nanoparticles. The non-uniform distribution of nanoparticles as a volume fraction results in a non-uniform index of refraction as a function of position in the drop after spreading. When the material in the film is cured, a solid patterned film of varying index of refraction is thus formed. Diffraction structures can be imprinted on the solid patterned film as described herein.

Referring to FIG. 36F, the image is associated with a film 90 nm in thickness. The central portion 3642 is associated with the location at which the drop was initially deposited and the peripheral portion 3644 is associated with the locations to which the drop spreads. As a result of the liquid phase diffusion process, the index of refraction in the central portion 3642 including a higher concentration of nanoparticles is 1.69, whereas in the peripheral portion 3644 where adjacent drops merge and the concentration of nanoparticles is lower, the index of refraction is 1.61. Initially, the index of refraction of the drop was 1.64. The planar substrate abutting the varying index of refraction film results in generally uniform spreading of the drops, which are generally circular in shape after spreading. As will be evident to one of skill in the art, the diffraction structure imprinted on top of the film is not visible at the image scale since the periodicity on the diffraction structure is on the sub-micron scale.

Control of the positions of the regions of varying index of refraction is provided by predetermined placement of drops of controlled volume. The positions can be arrayed uniformly or varied in a random or semi-random manner as appropriate to the particular application. In some implementations, both uniform arrays and random or semi-random distribution can be combined to provide the desired variation in index of refraction as a function of position. Placement of drops close to each other can result in a merged region in which several drops are combined, enabling regions of predetermined dimensions. One of ordinary skill in the art would recognize many variations, modifications, and alternatives.

FIG. 36G is an image illustrating a film of varying index of refraction abutting a diffractive substrate according to an embodiment of the present invention. In FIG. 36G, an ICG is illustrated with drops that have spread into regions several hundred microns on a side. Central portions 3646 associated with the location at which the drop was initially deposited are characterized by a high index of refraction and peripheral portions 3648 associated with the locations to which the drop spreads and adjacent drops merge are characterized by a lower index of refraction. The diffraction structure imprinted on top of the film is not visible at the image scale since the periodicity on the diffraction structure is on the sub-micron scale. However, the presence of the diffraction structure is illustrated by the generally oval shape of the drops after spreading since the diffractive elements (e.g., grating lines) support fluid flow parallel to the direction of the diffractive elements (e.g., grating lines) preferentially with respect to fluid flow perpendicular to the diffractive elements (e.g., grating lines). In the illustrated embodiment, the diffraction structure has diffractive elements arrayed in a generally vertical direction, enabling higher fluid flow in the vertical direction than in the horizontal direction.

FIG. 36H is an image illustrating a film of varying index of refraction in a first diffractive element according to an embodiment of the present invention. In FIG. 36H, an OPE is illustrated with drops that have spread into regions several hundred microns on a side. Central portions 3652 associated with the location at which the drop was initially deposited are characterized by a high index of refraction and peripheral portions 3654 associated with the locations to which the drop spreads and adjacent drops merge are characterized by a lower index of refraction. The presence of the diffraction structure is illustrated by the generally oval shape of the drops after spreading since the diffractive elements (e.g., grating lines) support fluid flow parallel to the direction of the grating lines preferentially with respect to fluid flow perpendicular to the grating lines. In the illustrated embodiment, the diffraction structure has diffractive elements arrayed at an angle of approximately 45 degrees to the vertical direction, enabling higher fluid flow along the direction ~45 degrees to the vertical direction.

FIG. 36I is an image illustrating a film of varying index of refraction in a second diffractive element according to an embodiment of the present invention. In FIG. 36H, an EPE is illustrated with drops that have spread into regions several hundred microns on a side. Central portions 3656 associated with the location at which the drop was initially deposited are characterized by a high index of refraction and peripheral portions 3658 associated with the locations to which the drop spreads and adjacent drops merge are characterized by a lower index of refraction. The presence of the diffraction structure is illustrated by the generally oval shape of the drops after spreading since the diffractive elements (e.g., grating lines) support fluid flow parallel to the direction of the grating lines preferentially with respect to fluid flow perpendicular to the grating lines. In the illustrated embodiment, the diffraction structure has diffractive elements has diffractive elements arrayed in a generally horizontal direction, enabling higher fluid flow in the horizontal direction than in the vertical direction.

FIG. 36J is a simplified flowchart 3660 illustrating a method of fabricating a diffractive element with varying index of refraction according to an embodiment of the present invention. The method includes providing a substrate (3662). In some embodiments, the substrate may have a high or low refractive index (e.g., n=1.8 or n=1.5). The method further includes defining at least one region on the substrate (3664).

The method further includes providing a liquid resist material (3666). The method further includes dispersing particles into the liquid resist material to form a solution (3668). The particles may be uniformly distributed in the liquid resist material and may not agglomerate within the liquid resist material. In some embodiments, the solution may have a refractive index of n=1.65 or higher. The particles may be, for example, nanoparticles, such as titanium oxide nanoparticles.

The method further includes dropping the solution in the at least one region on the substrate (3670). The solution may be dropped as controlled volume droplets in some embodiments. The drops may be, for example, 4 pL (~10 μm diameter) drops. In some embodiments, the solution may have a higher refractive index than the substrate.

The method further includes imprinting the solution with a diffractive structure to form the diffractive element (3672). In some embodiments, the drops of the solution may be imprinted to a certain residual layer thickness (e.g., 100 nm), causing phase separation. This imprinting process may cause the solution to experience liquid chromatography, such that the solution is separated out into separate zones. Individual zones may be richer in nanoparticles than other zones due to refractive index variation within each drop as it is spreading.

The diffractive element may be or include, for example, an OPE, an EPE, and/or an ICG. For different diffractive elements, however, the variation in refractive indices may be different. For example, in the OPE, the variation may be random, whereas in the EPE, specific areas may be designated for variation in refraction. In some embodiments, more than one diffractive element may be fabricated in a single process.

The diffractive structure may include, for example, one or more grating patterns (i.e., a constant, varying, or random grating pattern). When imprinted, the drops of the solution may spread and bond to the boundary of adjacent drops to form a continuous film with regions of varying indices of refraction.

According to the method described with respect to flowchart 3660, a diffractive element having varying refractive indices may be obtained. A phase varying pattern may be created for light exiting through or interacting at the surface of the diffractive element. By implementing varying refractive indices, a more uniform spread of light through the diffractive element may be obtained, enabling control over image coherence over the desired field of view.

Furthermore, this method of manufacture may be more inexpensive and less time consuming than contact nanoimprint lithography processes.

It should be appreciated that the specific steps illustrated in FIG. 36J provide a particular method of fabricating a diffractive element with varying index of refraction according to an embodiment of the present invention. Other sequences of steps may also be performed according to alternative embodiments. For example, alternative embodiments of the present invention may perform the steps outlined above in a different order. Moreover, the individual steps illustrated in FIG. 36J may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 36L:
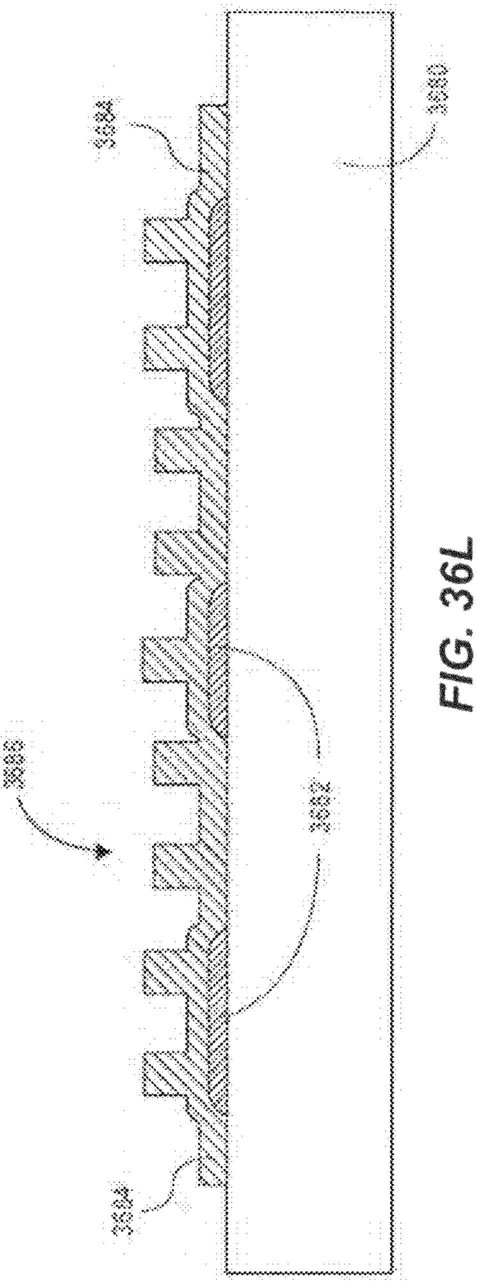
FIG. 36L is a simplified side view diagram illustrating a multi-layer variable index of refraction structure for a diffractive element according to an embodiment of the present invention.

FIG. 36L is a simplified side view diagram illustrating a multi-layer variable index of refraction structure for a diffractive element according to an embodiment of the present invention. Referring to FIG. 36L, a plurality of regions of high index of refraction material 3682 are disposed on a substrate 3680. The plurality of regions of high index of refraction material can be formed using the drop on demand processes discussed herein. An additional layer of low index of refraction material 3684 is deposited over the plurality of regions of high index of refraction material 3682. Diffractive structure 3686 is imprinted in the additional layer of low index of refraction material. In some embodiments, the thickness of the plurality of regions of high index of refraction material is controlled to a predetermined thickness, for example, by spreading initial drops using a planar surface abutting the drops to form the film. In other embodiments, a single imprinting process is used to control the thickness of both the plurality of regions of high index of refraction material and the additional layer of low index of refraction material. One of ordinary skill in the art would recognize many variations, modifications, and alternatives.

Figure 70:
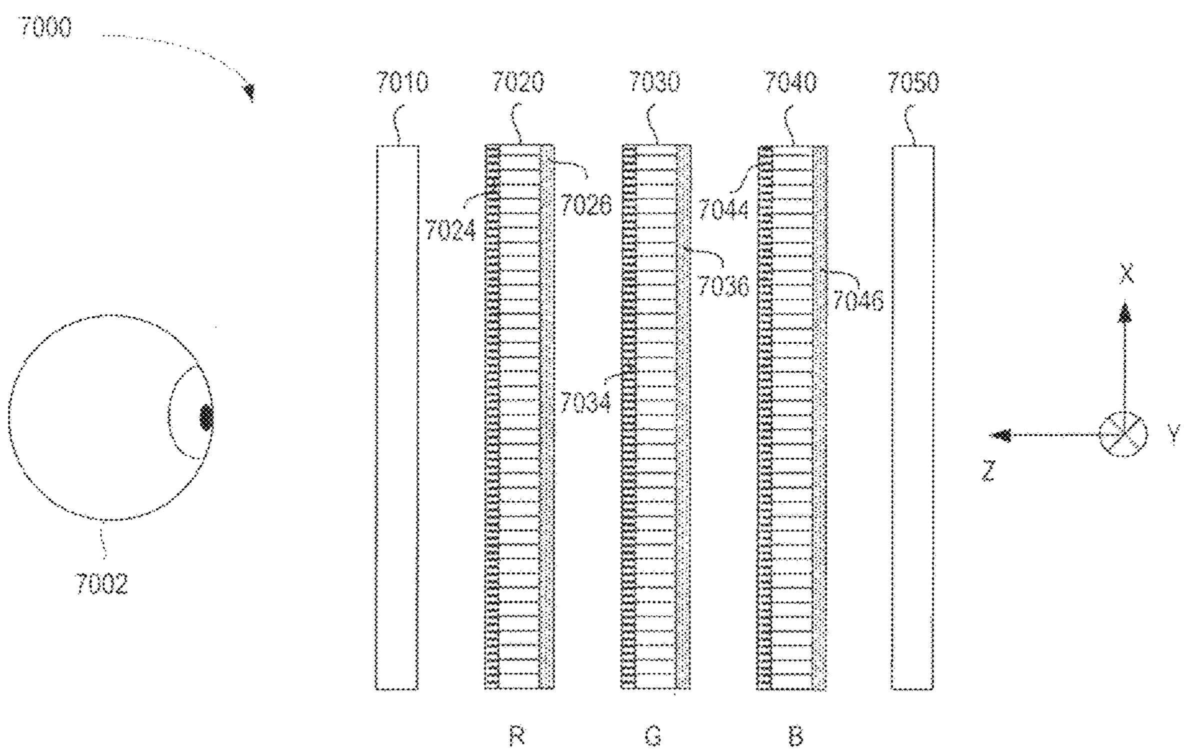
FIG. 70 illustrates schematically a partial cross-sectional view of an eyepiece according to some embodiments.

FIG. 70 illustrates schematically a partial cross-sectional view of a structure of an eyepiece 7000 according to some embodiments of the present invention. The region shown in the cross-sectional view corresponds to the EPE region 2009 of eyepiece 2000 as illustrated in FIG. 20. As shown in FIG. 70, the eyepiece 7000 may include a first planar waveguide 7020, a second planar waveguide 7030, and a third planar waveguide 7040. Each waveguide 7020, 7030, or 7040 may lie in an X-Y plane in a Cartesian coordinate system, as illustrated in FIG. 70 (the Y-axis points into the page). Each waveguide 7020, 7030, or 7040 has a back surface facing the viewer's eye 7002, and a front surface facing the opposite direction. The eyepiece 7000 may also include a back cover 7010, and a front cover 7050.

The eyepiece 7000 may also include a first grating 7024 disposed on the back surface of the first waveguide 7020, a second grating 7034 disposed on the back surface of the second waveguide 7030, and a third grating 7044 disposed on the back surface of the third waveguide 7040. The first grating 7024 may be configured to diffract a first portion of the light propagating in the first waveguide 7020 toward the viewer's eye 7002 (e.g., substantially along the positive Z-axis). Similarly, the second grating 7034 may be configured to diffract a first portion of the light propagating in the second waveguide 7030 toward the viewer's eye 7002, and the third grating 7044 may be configured to diffract a first portion of the light propagating in the third waveguide 7040 toward the viewer's eye 7002. In this configuration, each of the first grating 7024, the second grating 7034, and the third grating 7044 may be said to be operating in transmission mode, as it is a transmission diffractive order that is directed toward the viewer's eye.

The first grating 7024 may also diffract a second portion of the light propagating in the first waveguide 7020 (i.e., a reflection diffractive order) away from the viewer's eye 7002 (e.g., substantially along the negative Z-axis). Similarly, the second grating 7034 may diffract a second portion of the light propagating in the second waveguide 7030 away from the viewer's eye 7002, and the third grating 7044 may diffract a second portion of the light propagating in the third waveguide 7040 away from the viewer's eye 7002.

Although FIG. 70 illustrates gratings 7024, 7034, and 7044 formed on the back surfaces of the waveguides 7020, 7030, and 7040, respectively, this is not required by the present invention. In some embodiments, the gratings or other diffractive structures, including diffractive optical elements, are formed on the inner side of the back surface, the outer side of the back surface, or disposed inside the waveguide and positioned at a predetermined distance from the back surface. Accordingly, when reference is made to diffractive structures formed on the back surface, this should be understood to include diffractive structures formed inside the waveguide adjacent the back surface. One of ordinary skill in the art would recognize many variations, modifications, and alternatives.

In some embodiments, each waveguide 7020, 7030, or 7040, as well as each grating 7024, 7034, or 7044, may be wavelength selective, such that it selectively propagates or diffract light in a given wavelength range. In some embodiments, each of the waveguides 7020, 7030, and 7040 may be configured for a respective primary color. For example, the first waveguide 7020 may be configured for propagating red (R) light, the second waveguide 7030 may be configured for propagating green (G) light, and the third waveguide 7040 may be configured for propagating blue (B) light. It will be appreciated that the eyepiece 7000 may include two or more waveguides for red light, two or more waveguides for green light, and two or more waveguides for blue light, for different depth planes, as described above. In some other embodiments, other colors, including magenta and cyan, may be used in addition to or may replace one or more of red, green, or blue. One of skill in the art will also appreciate alternative orderings of the waveguides 7020, 7030, and 7040.

It will be appreciated that references to a given color of light in this disclosure will be understood to encompass light of one or more wavelengths within a range of wavelengths that are perceived by a viewer as being of that given color. For example, red light may include light in the wavelength range of about 620-780 nm; green light may include light in the wavelength range of about 492-577 nm, and blue light may include light in the wavelength range of about 435-493 nm.

In some embodiments, each grating 7024, 7034, or 7044 may comprise a surface relief grating, such as a binary or two-level metasurface phase grating or the like. For a two-level phase grating, the diffraction efficiency in a transmission order may be substantially the same as the diffraction efficiency in a reflection order. Thus, about an equal amount of virtual image light may be out-coupled from each waveguide 7020, 7030, or 7040 toward the viewer's eye 7002 and away from the viewer's eye 7002. Even for blazed gratings (e.g., three-level metasurface phase gratings), a substantial amount of virtual image light may still be out-coupled away from the viewer's eye 7002. Therefore, it may be desirable to redirect at least some of the virtual image light directed away from the viewer's eye 7002 back toward the viewer's eye 7002 in order to enhance the brightness of a virtual image. At the same time, it may be desirable to transmit as much natural light from the world as possible toward the viewer's eye 7002.

According to some embodiments, the eyepiece 7000 may include a first wavelength-selective reflector 7026 disposed at the front surface of the first waveguide 7020 for reflecting at least a portion of the virtual image light diffracted by the first grating 7024 away from the viewer's eye 7002 back toward the viewer's eye. Similarly, the eyepiece 7000 may include a second wavelength-selective reflector 7036 disposed at the front surface of the second waveguide 7030, and a third wavelength-selective reflector 7046 disposed at the front surface of the third waveguide 7040.

Each wavelength-selective reflector 7026, 7036, or 7046 may be configured to reflect light of a given color and transmit light in other wavelengths. For example, the first wavelength-selective reflector 7026 may be configured to reflect red light; the second wavelength-selective reflector 7036 may be configured to reflect green light; and the third wavelength-selective reflector 7046 may be configured to reflect blue light. As such, part of the virtual image in red light diffracted by the first grating 7024 away from the viewer's eye 7002 (i.e., substantially in the negative Z-axis) may be reflected by the first wavelength-selective reflector 7026 back toward the viewer's eye 7002 (i.e., substantially in the positive Z-axis). Similarly, part of the virtual image in green light diffracted by the second grating 7034 away from the viewer's eye 7002 may be reflected by the second wavelength-selective reflector 7036 back toward the viewer's eye 7002, and part of the virtual image in blue light diffracted by the third grating 7044 away from the viewer's eye 7002 may be reflected by the third wavelength-selective reflector 7046 back toward the viewer's eye 7002.

As discussed above, if the wavelength-selective reflectors 7026, 7036, and 7046 are properly aligned with respect to the gratings 7024, 7034, and 7044 (which may be achieved if the front surface and the back surface of each waveguide 7020, 7030, and 7040 are parallel to each other), ghost images may be avoided and the brightness of a virtual image may be enhanced.

Figure 71:
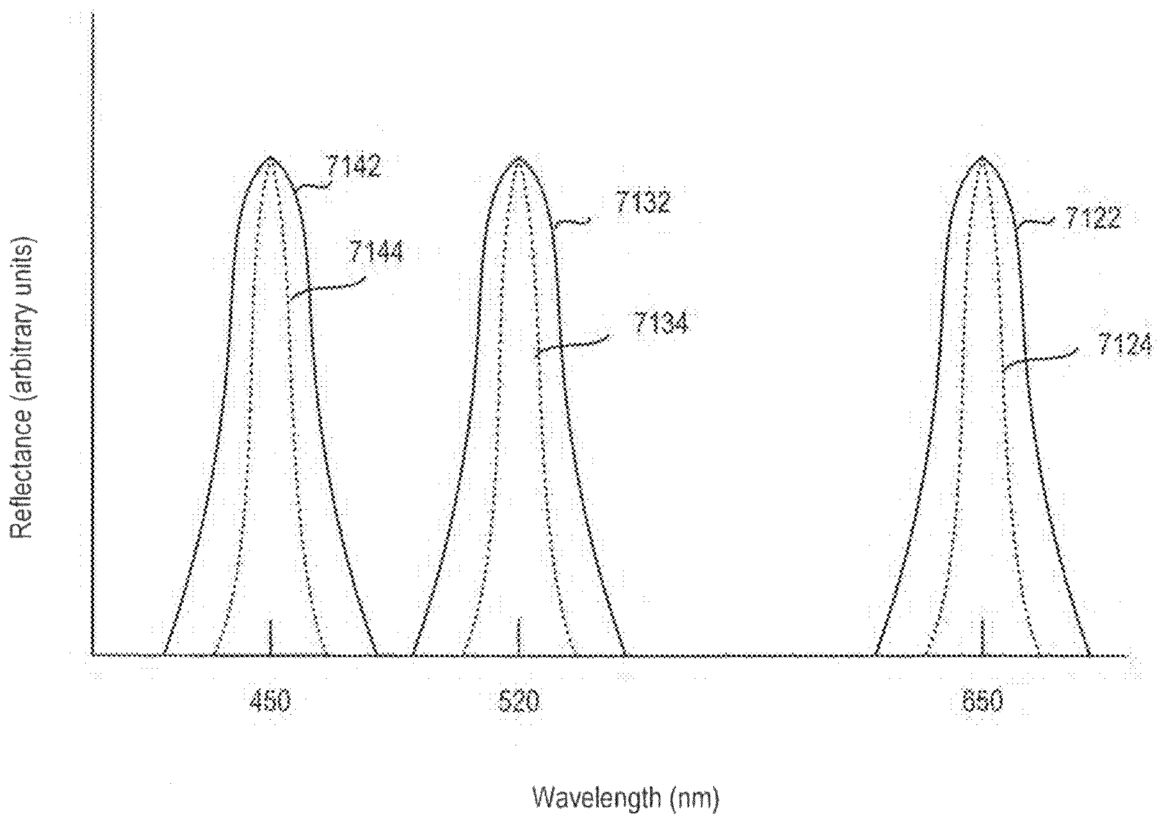
FIG. 71 illustrates schematically exemplary reflectance spectra of some wavelength-selective reflectors according to some embodiments.

FIG. 71 illustrates schematically some exemplary reflectance spectra of the first wavelength-selective reflector 7026, the second wavelength-selective reflector 7036, and the third wavelength-selective reflector 7046, according to some embodiments of the present invention. As illustrated, the first wavelength-selective reflector 7026 may be characterized by a first reflectance spectrum 7122 having a reflectance peak in the red wavelength region, the second wavelength-selective reflector 7036 may be characterized by a second reflectance spectrum 7132 having a reflectance peak in the green wavelength region, and the third wavelength-selective reflector 7046 may be characterized by a third reflectance spectrum 7142 having a reflectance peak in the blue wavelength region.

Because of the relatively narrow reflectance bands of the wavelength-selective reflectors 7026, 7036, and 7046, the eyepiece 7000 may strongly reflect virtual image light in the selected wavelength ranges, and transmit light in all other wavelength ranges. Therefore, natural light from the world outside the reflectance bands of the wavelength-selective reflectors can still reach the viewer's eye. For example, the first wavelength-selective reflector 7026 may strongly reflect virtual image light in the red wavelength range and transmit light in other wavelengths, including natural light from the world in the other wavelengths as well as green and blue virtual image light diffracted by the second grating 7034 and the third grating 7044, respectively. Similarly, the second wavelength-selective reflector 7036 may strongly reflect virtual image light in the green wavelength range and transmit light in other wavelengths, including natural light from the world in the other wavelengths as well as blue virtual image light diffracted by the third grating 7044; and the third wavelength-selective reflector 7046 may strongly reflect virtual image light in the blue wavelength range and transmit light in other wavelengths, including natural light from the world in the other wavelengths.

In some embodiments, reflectance as high as 100% may be achieved within a selected spectral band. Therefore, it may be possible to nearly double the intensity of a virtual image without a reflector. In addition, as world light in the wavelength ranges of the virtual image are reflected away from the viewer's eye 7002, the virtual image may be perceived by the viewer with higher contrast.

In some embodiments, each wavelength-selective reflector 7026, 7036, or 7046 may be advantageously designed such that the band width of its reflectance spectrum substantially matches the spectral width of the corresponding LED in the projector 2001 illustrated in FIG. 20. In some other embodiments, the projector 2001 may use laser sources instead of LEDs. Laser sources may have much narrower emission bands than those of LEDs. In those cases, each wavelength-selective reflector 7026, 7036, or 7046 may be configured to have a narrower band width, such as that represented by the reflectance curve 7124, 7134, or 7144 illustrated in FIG. 71.

Because the reflectance spectrum of a wavelength-selective reflector may shift as a function of angle of incidence, there may be a tradeoff between wavelength spectral width and angular spectral width. In some embodiments, each wavelength-selective reflector 7026, 7036, or 7046 may be configured to have a wider band width in order to accommodate a wider field of view.

Figure 72:
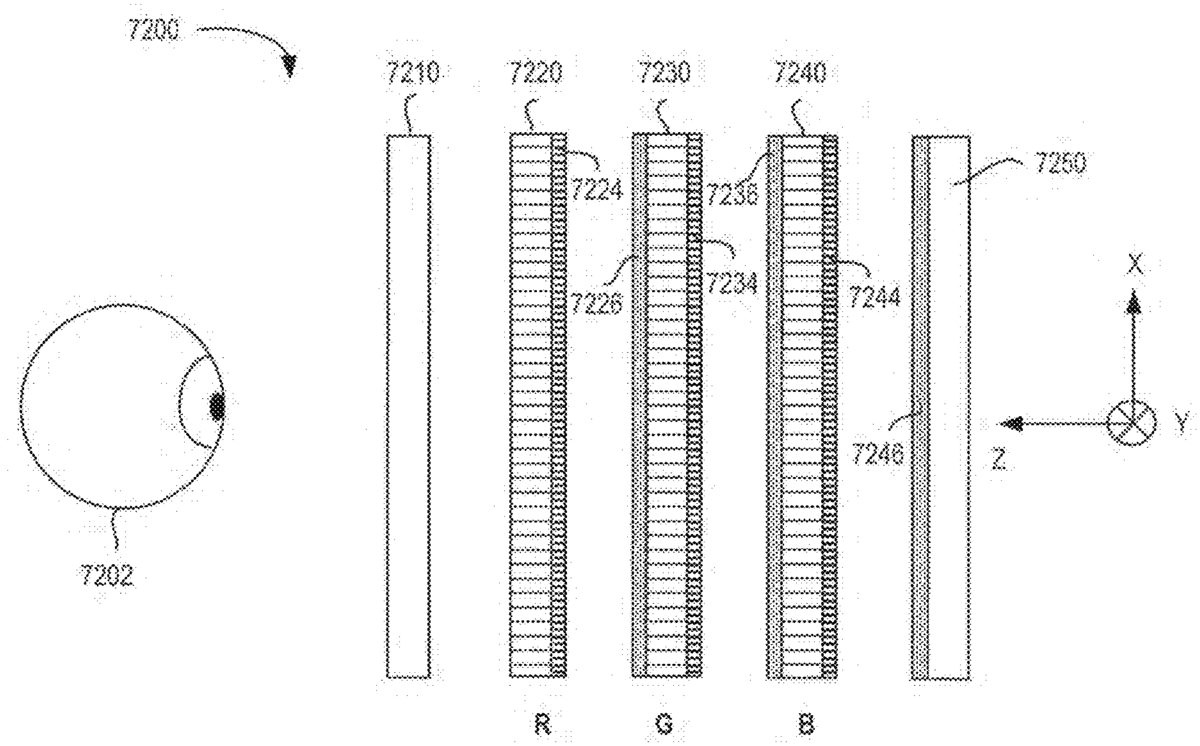
FIG. 72 illustrates schematically a partial cross-sectional view of an eyepiece according to some other embodiments.

FIG. 72 illustrates schematically a partial cross-sectional view of a structure of an eyepiece 7200 according to some other embodiments of the present invention. Similar to the eyepiece 7000, the eyepiece 7200 may include a first waveguide 7220, a second waveguide 7230, and a third waveguide 7240, as well as a back cover 7210 and a front cover 7250.

The eyepiece 7200 further includes a first grating 7224 disposed on the front surface of the first waveguide 7220, a second grating 7234 disposed on the front surface of the second waveguide 7230, and a third grating 7244 disposed on the front surface of the third waveguide 7240. In this configuration, each of the first grating 7224, the second grating 7234, and the third grating 7244 may be said to be operating in reflection mode, as it is the reflection diffractive order that is directed toward the viewer's eye.

The eyepiece 7200 may further include a first wavelength-selective reflector 7226 disposed on the back surface of the second waveguide 7230. The first wavelength-selective reflector 7226 may be optimized for red light so that part of the virtual image in red light diffracted by the first grating 7224 away from the viewer's eye 7202 may be reflected by the first wavelength-selective reflector 7226 back towards the viewer's eye 7202. Similarly, the eyepiece 7200 may further include a second wavelength-selective reflector 7236 optimized for green light disposed on the back surface of the third waveguide 7240, and a third wavelength-selective reflector 7246 optimized for blue light disposed on the back surface of the front cover 7250. One of skill in the art will appreciate alternative pairings or combinations of wavelength-selective reflectors on a particular waveguide or cover.

In this configuration, it may be more important to ensure that the wavelength-selective reflectors 7226, 7236, and 7246 are properly aligned with respect to the gratings 7224, 7234, and 7244, respectively, in order to avoid ghost images.

Figure 73:
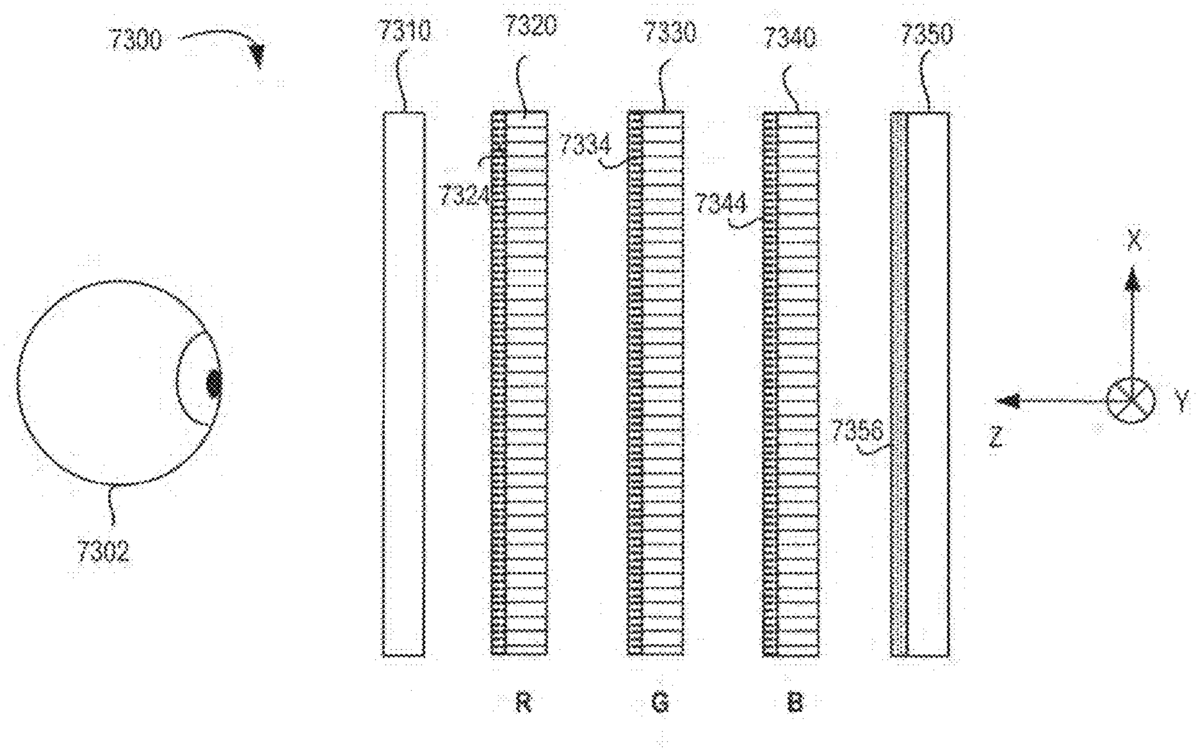
FIG. 73 illustrates schematically a partial cross-sectional view of an eyepiece according to some other embodiments.

FIG. 73 illustrates schematically a cross-sectional view of a structure of an eyepiece 7300 according to some other embodiments of the present invention. Similar to the eyepiece 7000, the eyepiece 7300 may include a first waveguide 7320, a second waveguide 7330, and a third waveguide 7340, as well as a back cover 7310 and a front cover. The eyepiece 7300 may further include a first grating 7324 disposed on the back surface of the first waveguide 7320, a second grating 7334 disposed on the back surface of the second waveguide 7330, and a third grating 7344 disposed on the back surface of the third waveguide 7340.

Here, instead of having a wavelength-selective reflector on each of the waveguides 7320, 7330, and 7340, the eyepiece 7300 may include a wavelength-selective reflector 7356 disposed at a back surface of the front cover 7350. The wavelength-selective reflector 7356 may be configured to have a reflectance spectrum that exhibits three reflectance peaks in wavelength ranges corresponding to red light, green light, and blue light, as illustrated in FIG. 71. Alternatively, the wavelength-selective reflector 7356 may be disposed on the front surface of the third waveguide 7340.

Figure 74:
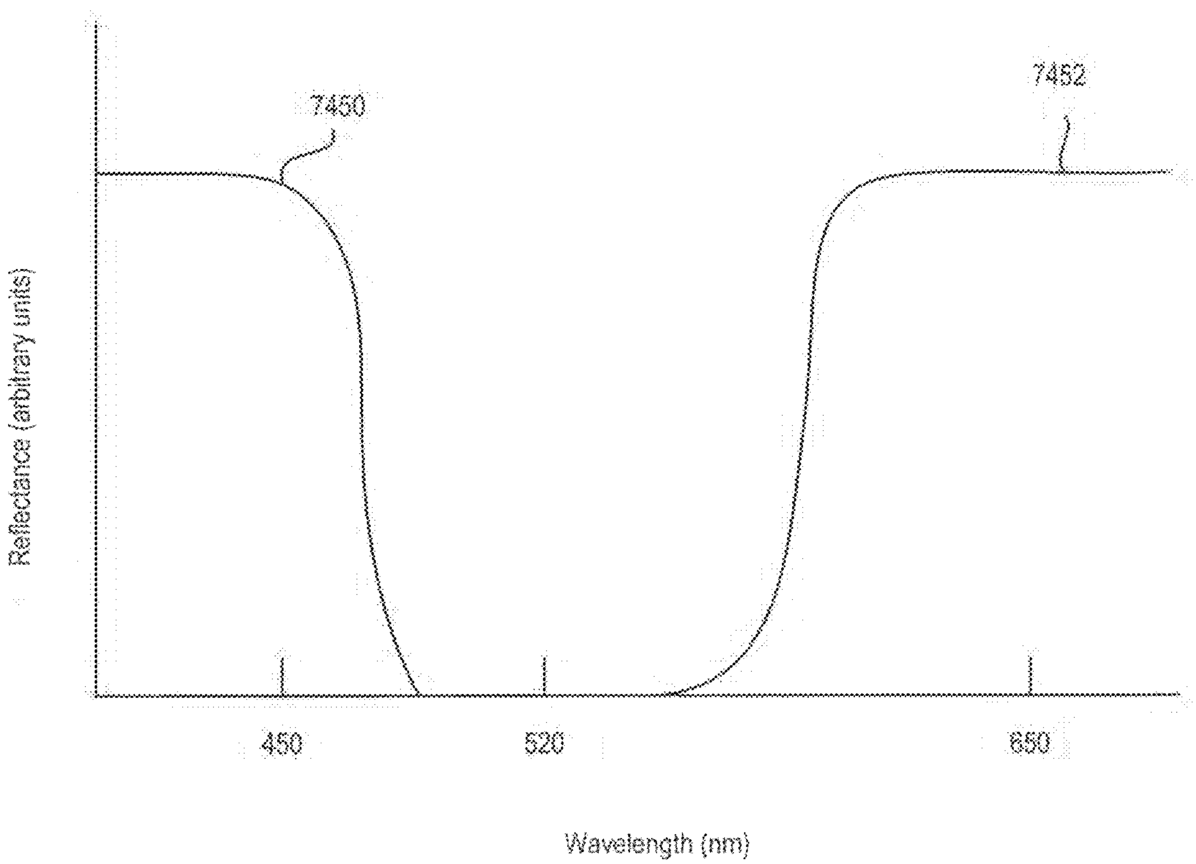
FIG. 74 illustrates schematically exemplary reflectance spectra of a long-pass filter and of a short-pass filter, according to some embodiments.

In some other embodiments, long-pass filters and short-pass filters may be used in place of the narrow-band reflectors. FIG. 74 illustrates schematically exemplary reflectance spectra of a long-pass filter and a short-pass filter. The reflectance curve 7450 represents a long-pass filter which reflects most of the light below about 470 nm, and transmits most of the light above about 470 nm. Thus, the long-pass filter may reflect blue light and transmit green and red light. The reflectance curve 7452 represents a short-pass filter which reflects most of the light above about 590 nm, and transmits most of the light below about 590 nm. Thus, the short-pass filter may reflect red light and transmit green and blue light. The long-pass filter and the short-pass filter may be disposed on appropriate waveguides 7320, 7330, and 7340, and/or the front cover 7350 to achieve desired wavelength selectivity. One of ordinary skill in the art would appreciate various combinations or alternate wavelength thresholds for reflecting or transmitting through a long-pass or short-pass filter.

In some embodiments, each wavelength-selective reflector 7026, 7036, or 7046 (as illustrated in FIG. 70), 7226, 7236, or 7246 (as illustrated in FIG. 72), or 7356 (as illustrated in FIG. 73) may exhibit polarization-dependent reflectance spectra. In cases where the light provided by the LEDs or lasers in the projector 2001 is substantially linearly polarized or circularly polarized, the wavelength-selective reflectors may be designed to have high reflectance for light of that polarization state, and transmit light of the orthogonal polarization state, thus allowing natural light from the world in the orthogonal polarization state to come through the eyepiece 7000, 7200, or 7300.

According to various embodiments, each wavelength-selective reflector illustrated in FIGS. 70, 72, and 73 may comprise a multilayer thin film or a metasurface. A multilayer thin film may comprise a periodic layer system composed from two materials, one with a high refractive index and the other one with a low refractive index. This periodic system may be engineered to significantly enhance the reflectivity in a desired wavelength range, whose width is determined by the ratio of the two indices only, while the maximum reflectivity may be increased up to nearly 100% with increasing number of layers in the stack. The thicknesses of the layers are generally quarter-wave, designed such that reflected beams constructively interfere with one another to maximize reflection and minimize transmission.

A metasurface is an optically thin subwavelength structured interface. Metasurfaces are generally created by assembling arrays of miniature, anisotropic light scatterers (i.e., resonators such as optical antennas). The spacing between antennas and their dimensions are much smaller than the wavelength. The metasurfaces, on account of Huygens principle, are able to mold optical wavefronts into arbitrary shapes with subwavelength resolution by introducing spatial variations in the optical response of the light scatterers. Metasurfaces may allow controlling the polarization, phase and amplitude of light. The factors that can be used to manipulate the wavefront of the light include the material, size, geometry and orientation of the nano structures.

The resonant wavelength of a metasurface can be engineered by changing the geometric sizes of its constituent nano structures, thereby providing wavelength selectivity. For example, metasurfaces may be engineered to be highly wavelength-selective in redirecting light. Thus, metasurfaces can be used as wavelength-selective incoupling optical elements and outcoupling optical elements. Similarly, metasurfaces may also be engineered to have reflectance spectra that exhibit sharp reflectance peaks in the visible wavelength region.

In conventional optical elements such as lenses and waveplates, the wavefront is controlled via propagation phases in a medium much thicker than the wavelength. Unlike conventional optical elements, metasurfaces instead induce phase changes in light using subwavelength-sized resonators as phase shift elements. Because metasurfaces are formed of features that are relatively thin and uniform in thickness, they can be patterned across a surface using thin film processing techniques such as semiconductor processing techniques, as well as direct-printing techniques such as nanoimprint techniques.

Figure 75:
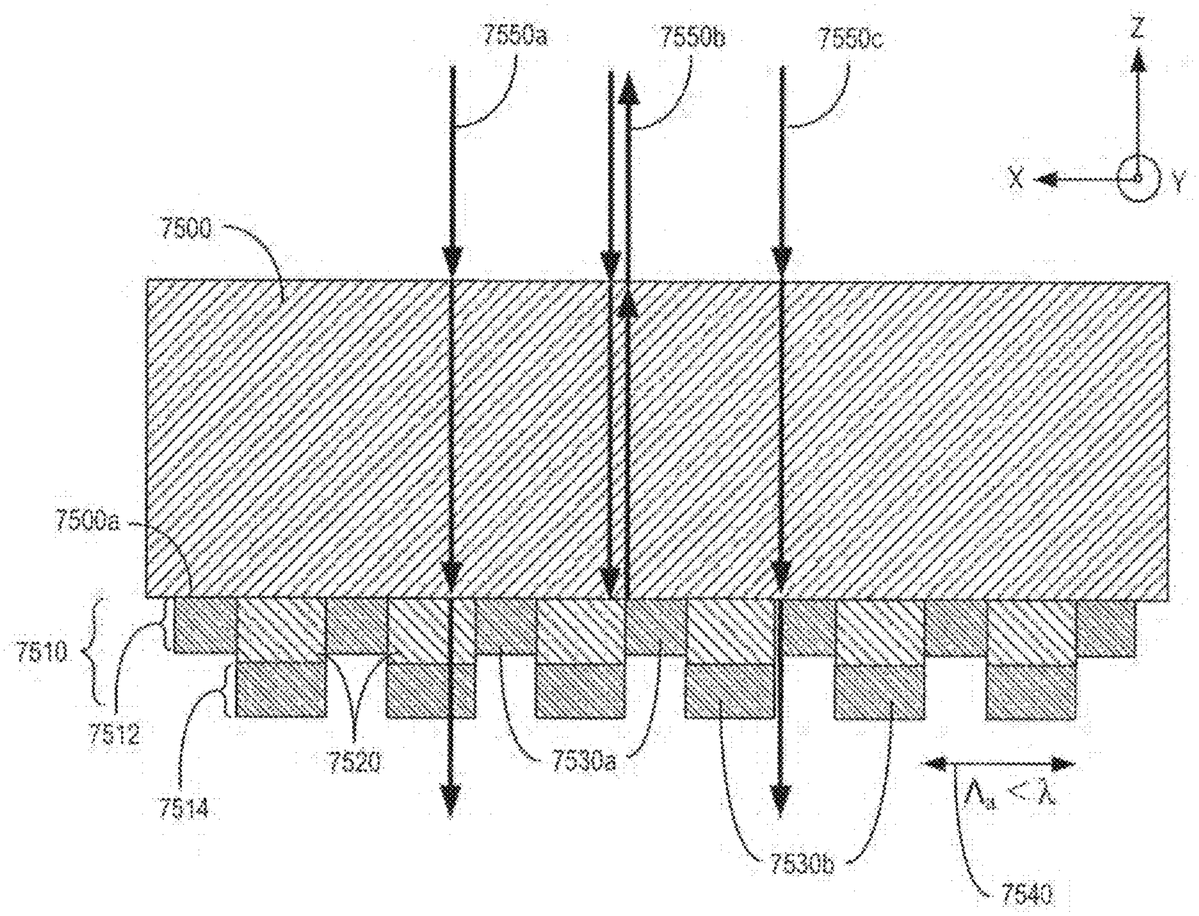
FIG. 75 illustrates an example of a metasurface according to some embodiments.

FIG. 75 illustrates an example of a metasurface according to some embodiments, as described in more detail in U.S. Patent Application No. 2017/0131460, the content of which is incorporated herein in its entirety for all purposes. A substrate 7500 has a surface 7500*a* on which a metasurface 7510 is deposed. The metasurface 7510 includes a plurality of levels of optically transmissive materials. As illustrated, in some embodiments, the metasurface is a bi-level structure having first level 7512 and a second level 7514. The first level 7512 includes a plurality of protrusions 7520 formed of a first optically transissive material and masses 7530*a* of a second optically transmissive material between the protrusions. The second level 7514 is on the protrusions (spaced away and separated from the substrate by the first level) and includes second level masses 7530*b* of the second optically transmissive material formed on the protrusions 7520. The protrusions 7520 may be ridges (or nanowires), which are laterally elongated into and out of the page and define trenches between neighboring protrusions. As illustrated, on the second level 7514, the masses 7530*b* of the second optically transmissive material may be localized on the surface of the protrusions 7520, forming plateaus of material spaced apart from other localized deposits (or plateaus) of the second optically transmissive material.

Preferably, the refractive index of the second optically transmissive material forming the masses 7530*a*, 7530*b* is higher than the refractive index of both the first optically transissive material forming the protrusions 7520 and of the material forming the substrate 7500. In some embodiments, the refractive index of the first optically transissive material is lower than or similar to the refractive index of the material forming the substrate 7500. It will be appreciated that the substrate 7500 may be a waveguide, and may correspond to the waveguides 7020, 7030, 7040 (FIG. 70), 7220, 7230, 7240, (FIG. 72), and/or waveguides 7320, 7330, and 7340, (FIG. 73). In such applications, the substrate preferably has a relative high refractive index, e.g., higher than 1.5, 1.6, 1.7, 1.8, or 1.9, which can provide benefits for increasing the field of view of a display outputting light from that substrate 7500 to form an image. In some embodiments, the substrate 7500 is formed of glass (e.g., doped glass), lithium niobate, plastic, a polymer, sapphire, or other optically transmissive material. Preferably, the glass, plastic, polymer, sapphire, or other optically transmissive material has a high refractive index, e.g., a refractive index higher than 1.5, 1.6, 1.7, 1.8, or 1.9.

With continued reference to FIG. 75, the first optically transissive material of the protrusions 7520 is preferably a material that may be patterned, e.g., by lithography and etch processes. More preferably, the first optically transmissive material is a nanoimprint resist that may be patterned by nanoimprinting. As discussed herein, the second optically transmissive material forming the masses 7530*a*, 7530*b* has a higher refractive index than both the first optically transissive material of the protrusions 7520 and the material forming the substrate 7500. In some embodiments, the refractive index of the second optically transmissive material is higher than 1.6, 1.7, 1.8, or 1.9. Examples of materials for the second optically transmissive material include semiconductor materials, including silicon-containing materials and oxides. Examples of silicon-containing materials include silicon nitride and silicon carbide. Examples of oxides include titanium oxide, zirconium oxide, and zinc oxide. In some embodiments, the second optically transmissive material may have lower optical transparency. For example, the second optically transmissive material may be silicon or its derivatives. In some embodiments, the first and second optically transmissive materials 7520, 7530 are amorphous solid state materials, or crystalline solid state materials. Amorphous materials may be desirable in some applications, since they may be formed at lower temperatures and over a wider range of surfaces than some crystalline materials. In some embodiments, each of the first and second optically transmissive materials forming the features 7520, 7530*a*, 7530*b* may be one of an amorphous or crystalline semiconductor material.

With continued reference to FIG. 75, the protrusions have a pitch 7540. As used herein, pitch refers to the distance between similar points on two immediately neighboring structures. It will be appreciated that the similar points are similar in that they are at similar parts (e.g., a left or right edge) of structures that are substantially identical. For example, the pitch of the protrusions 7520 is equal to the total width defined by a protrusion 7520 and the immediately neighboring separation between that protrusion and an immediately neighboring similar protrusion 7520. Stated another way, the pitch may be understood to be the period corresponding to the width of repeating units (e.g., the sum of the width of a protrusion 7520 and a mass 7530*a*) of the array of features formed by those protrusions 7520.

As illustrated, light of different wavelengths (corresponding to different colors) may impinge on the metasurface and, as discussed herein, the metasurface is highly selective in redirecting light of specific wavelengths. This selectivity may be achieved based upon the pitch and physical parameters of the features of the first and second levels 7512, 7514, as discussed herein. The pitch of the protrusions 7520 is less than the wavelength of light desired for light redirection of zero order reflection, in some embodiments. In some embodiments, the geometric size and periodicity increases as wavelengths become longer, and the height or thickness of one or both of the protrusions 7520 and masses 7530*a*, 7530*b* also increase as wavelengths become longer. The illustrated light rays 7550*a*, 7550*b*, and 7550*c* correspond to light of different wavelengths and colors in some embodiments. In the illustrated embodiment, the metasurface has a pitch that causes light ray 7550*b* to be reflected, while the light rays 7550*a* and 7550*c* propagate through the substrate 7500 and the metasurface 7510.

Figure 76:
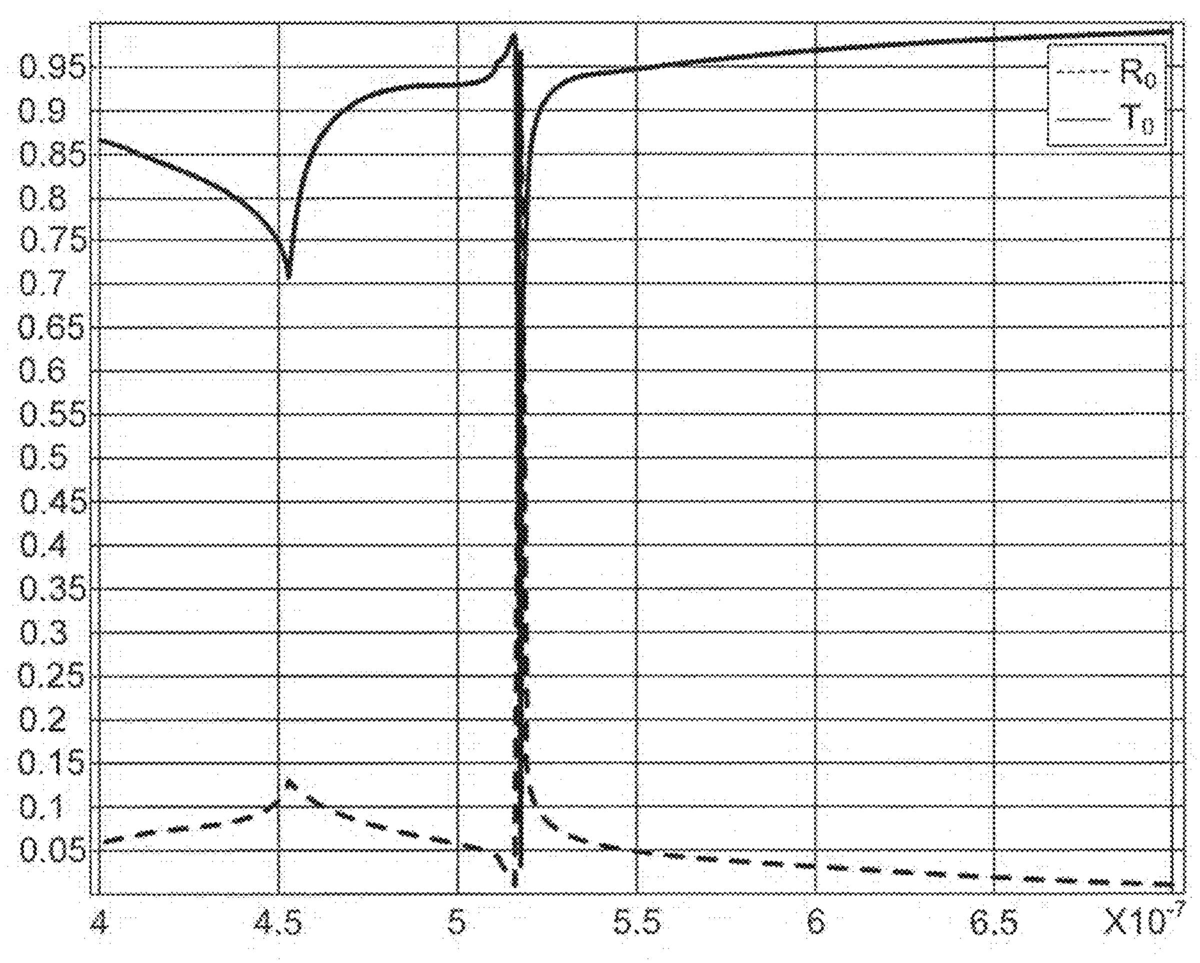
FIG. 76 shows plots of transmission and reflection spectra for a metasurface having the general structure shown in FIG. 75 according to some embodiments.

Advantageously, the multi-level metasurface is highly selective for particular wavelengths of light. FIG. 76 shows plots of transmission and reflection spectra for a metasurface having the general structure shown in FIG. 75 according to some embodiments. In this example, the protrusions 7520 have a width of 125 nm, a thickness of 25 nm, and are formed of resist; the masses of material 7530*a* and 7530*b* have a thickness of 75 nm and are formed of silicon nitride; the pitch is 340 nm; and air gaps separate the masses 7530*b*. The horizontal axis indicates wavelength and the vertical axis indicates transmission (on a scale of 0-1.00, from no reflection to complete reflection) for normal incidence (i.e., at zero degree angle of incidence). Notably, a sharp peak in reflection $R_0$ (at 517 nm), and a concomitant reduction in transmission $T_0$, is seen for a narrow band of wavelengths while other wavelengths are transmitted. Light is reflected when the wavelength is matched with the resonant wavelength (about 517 nm in this example). The protrusions 7520 and overlying structures 7530 are arranged with subwavelength spacing, and there is only zero order reflection and transmission. As shown in FIG. 76, the reflection spectrum shows a sharp peak across the visible wavelength region, which is a signature of optical resonance.

Figure 77A:
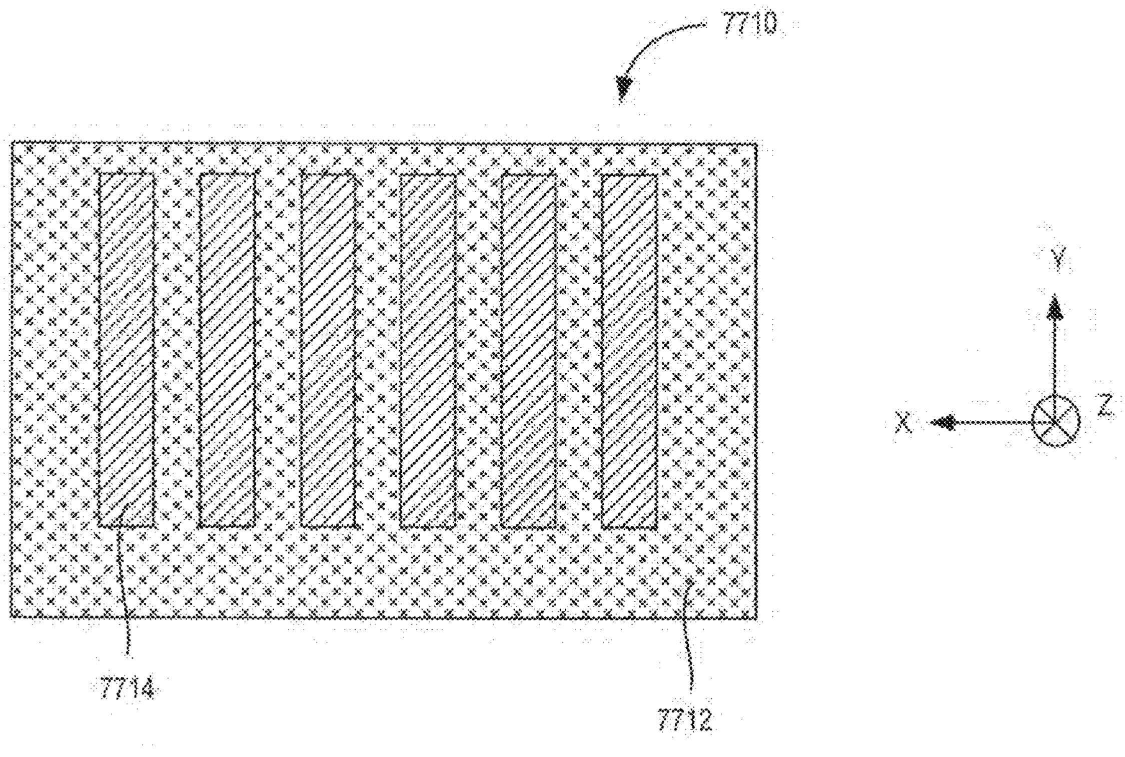
Figure 77B:
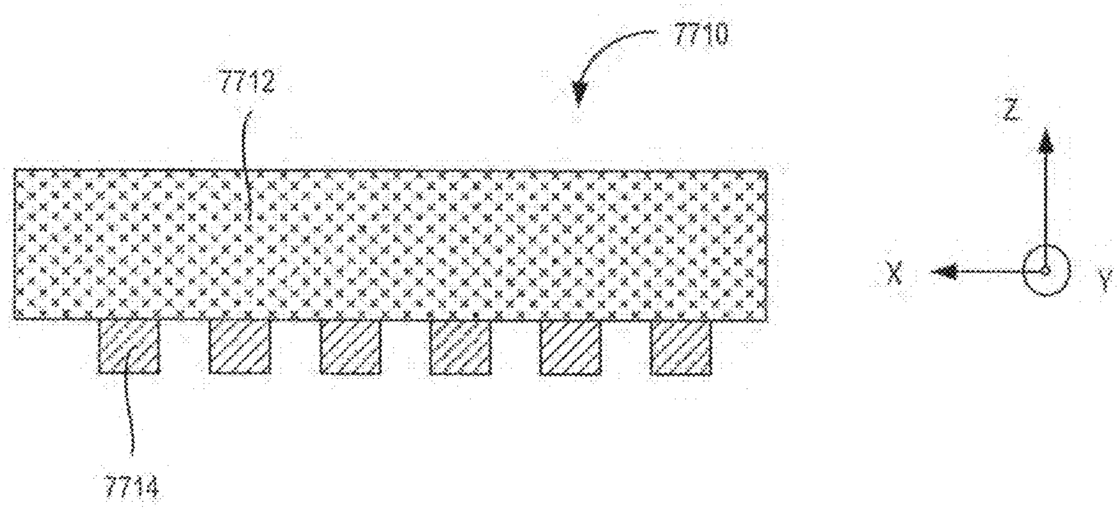

Metasurfaces may be formed in one-dimensional (1D) nano structures or two-dimensional (2D) nano structures. FIGS. 77A and 77B show a top view and a side view, respectively, of a metasurface 7710 that is formed by one-dimensional nanobeams 7714 according to some embodiments. As illustrated, a plurality of nanobeams 7714 are formed on a surface of a substrate 7712 (e.g., a waveguide). Each nanobeam 7714 extends laterally along the Y-axis and protrudes from the surface of the substrate 7712 along the negative Z-direction. The plurality of nanobeams 7714 are arranged as a periodic array along the X-axis. In some embodiments, the nanobeams 7714 may comprise silicon (e.g., amorphous silicon), $TiO_2$, $Si_3N_4$, or the like. The metasurface 7710 may be referred to as a single layer metasurface as it includes a single-layer of nano structure formed on the substrate 7712.

Figure 77C:
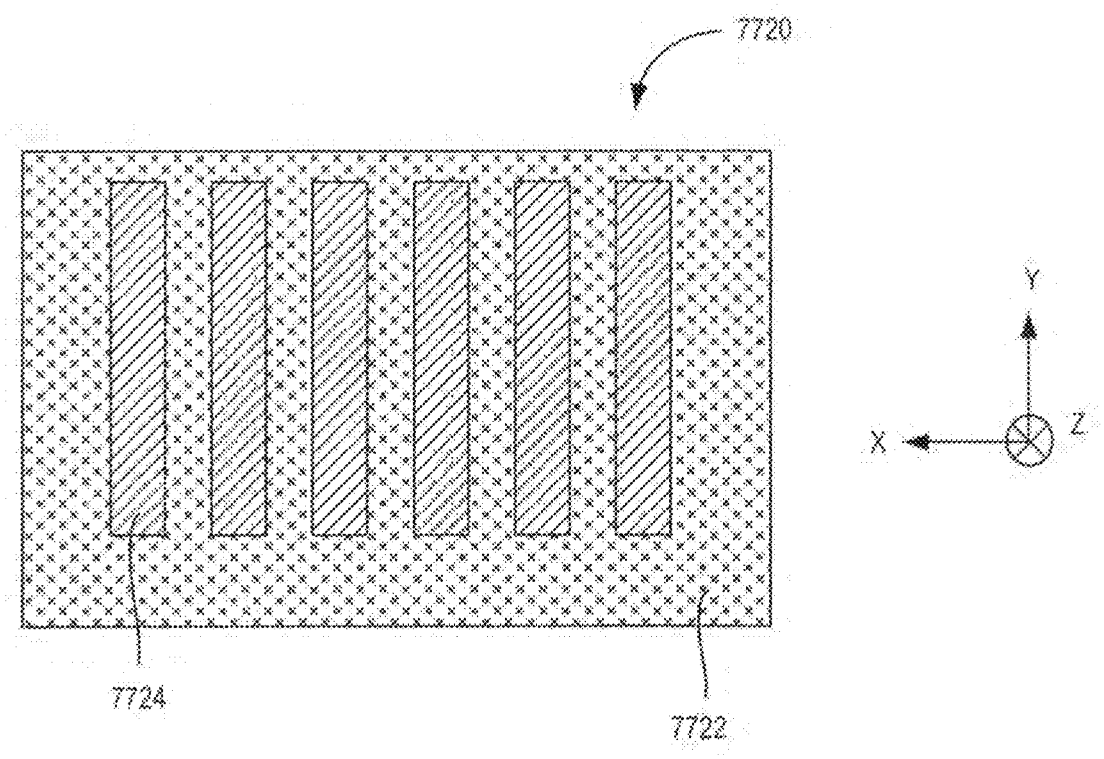
Figure 77D:
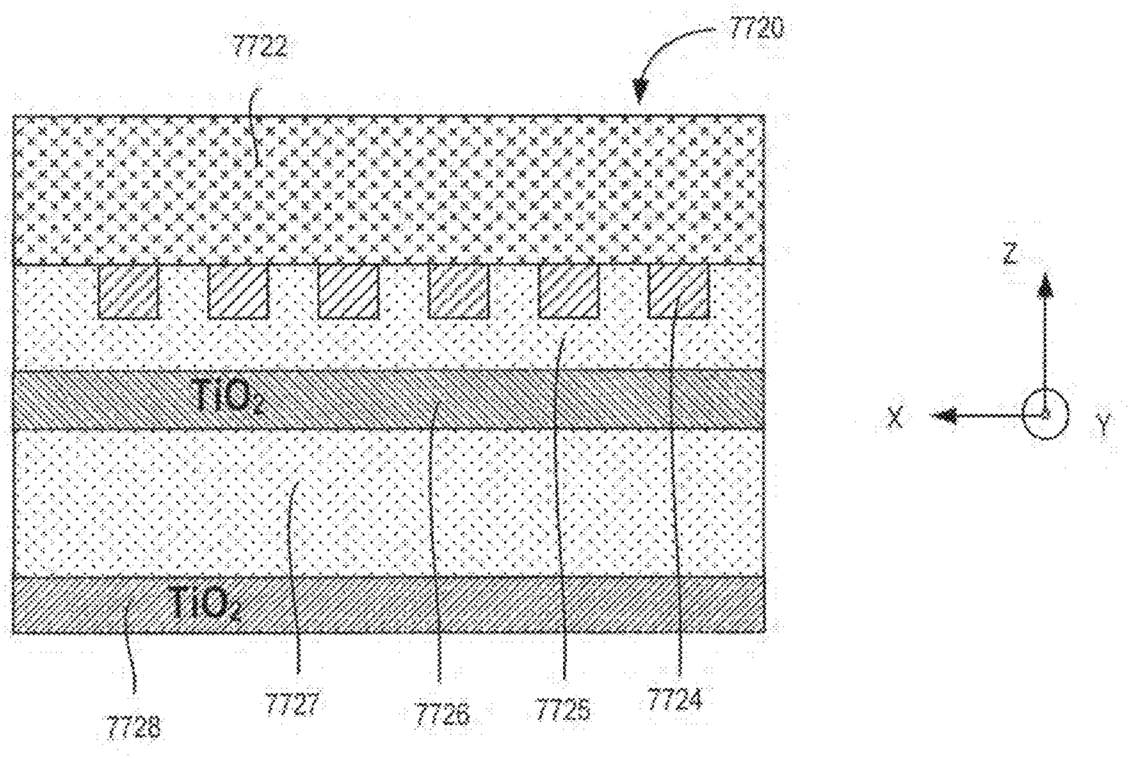

FIGS. 77C and 77D show a plan view and a side view, respectively, of a metasurface 7720 that is formed by one-dimensional nanobeams 7724 according to some other embodiments. A plurality of nanobeams 7724 are formed on a surface of a substrate 7722 (e.g., a waveguide). Each nanobeam 7724 extends laterally along the Y-axis and protrudes from the surface of the substrate 7722 along the negative Z-direction. The plurality of nanobeams 7724 are arranged as a periodic array along the X-axis. In some embodiments, the nanobeams 7724 may comprise silicon (e.g., amorphous silicon), $TiO_2$, $Si_3N_4$, or the like.

The metasurface 7720 may further include a first dielectric layer 7725 that fills the region between the nanobeams 7724 and covers the nanobeams 7724, a second dielectric layer 7726 disposed over the first dielectric layer 7725, a third dielectric layer 7727 disposed over the second dielectric layer 7726, and a fourth dielectric layer 7728 disposed over the third dielectric layer 7727. In some embodiments, the nanobeams 7724 may comprise silicon (e.g., amorphous silicon); the first dielectric layer 7725 and the third dielectric layer 7727 may comprise a photoresist, or the like; the second dielectric layer 7726 and the fourth dielectric layer 7728 may comprise $TiO_2$, and the like. In some embodiments, the first dielectric layer 7725 and the third dielectric layer 7727 may comprise a material having a refractive index in a range between 1.4 and 1.5. The second dielectric layer 7726 and the fourth dielectric layer 7728 may serve to increase the reflectivity of the metasurface 7720. In some embodiments, each of the second dielectric layer 7726 and the fourth dielectric layer 7728 may have a thickness of about 160 nm; the first dielectric layer 7725 may have a thickness of about 60 nm. The metasurface 7720 may be referred to as a multilayer metasurface, as it includes multiple layers formed on the substrate 7722.

Figure 78A:
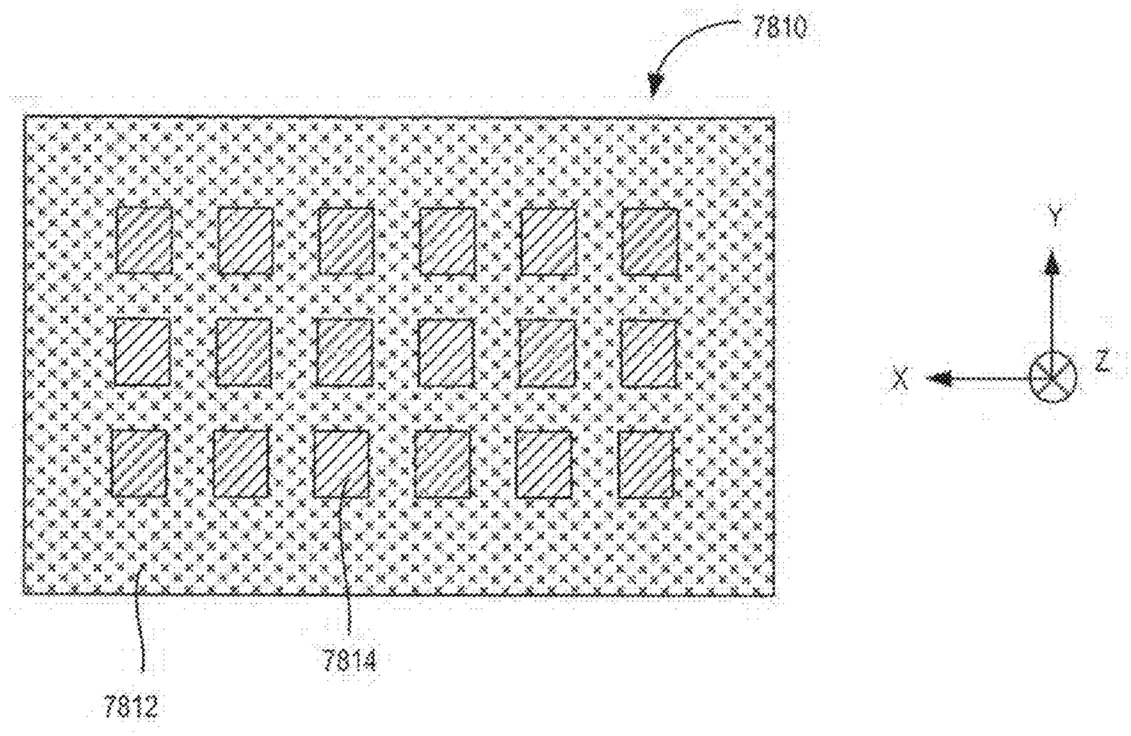
Figure 78B:
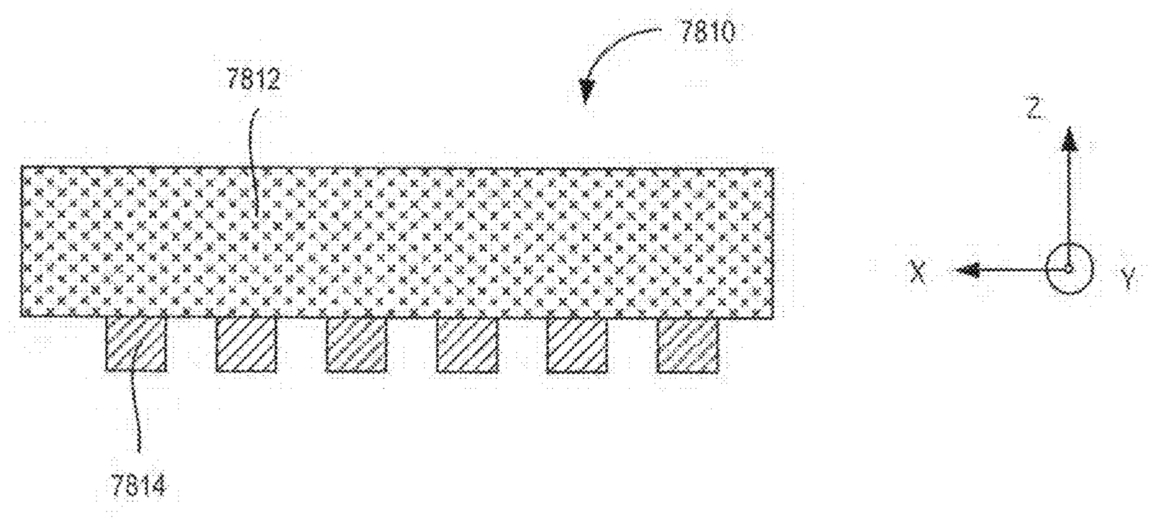

FIGS. 78A and 78B show a top view and a side view, respectively, of a single-layer two-dimensional metasurface 7810 that is formed by a plurality of nano antennas 7814 formed on a surface of a substrate 7812 (e.g., a waveguide) according to some embodiments. The plurality of nano antennas 7814 are arranged as a two-dimensional array in the X-Y plane. In some embodiments, each nano antenna 7814 may have a rectangular shape as illustrated in FIG. 78A. The nano antennas 7814 may have other shapes, such as circular, elliptical, and the like, according to various other embodiments.

Figure 78C:
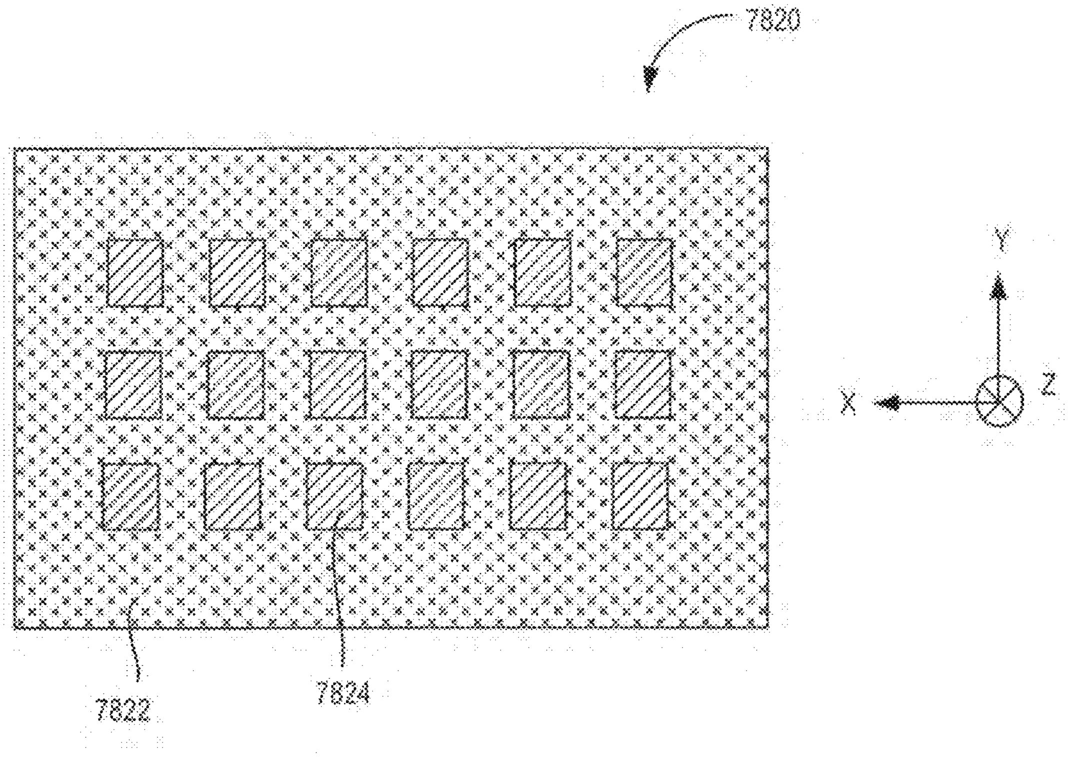
Figure 78D:
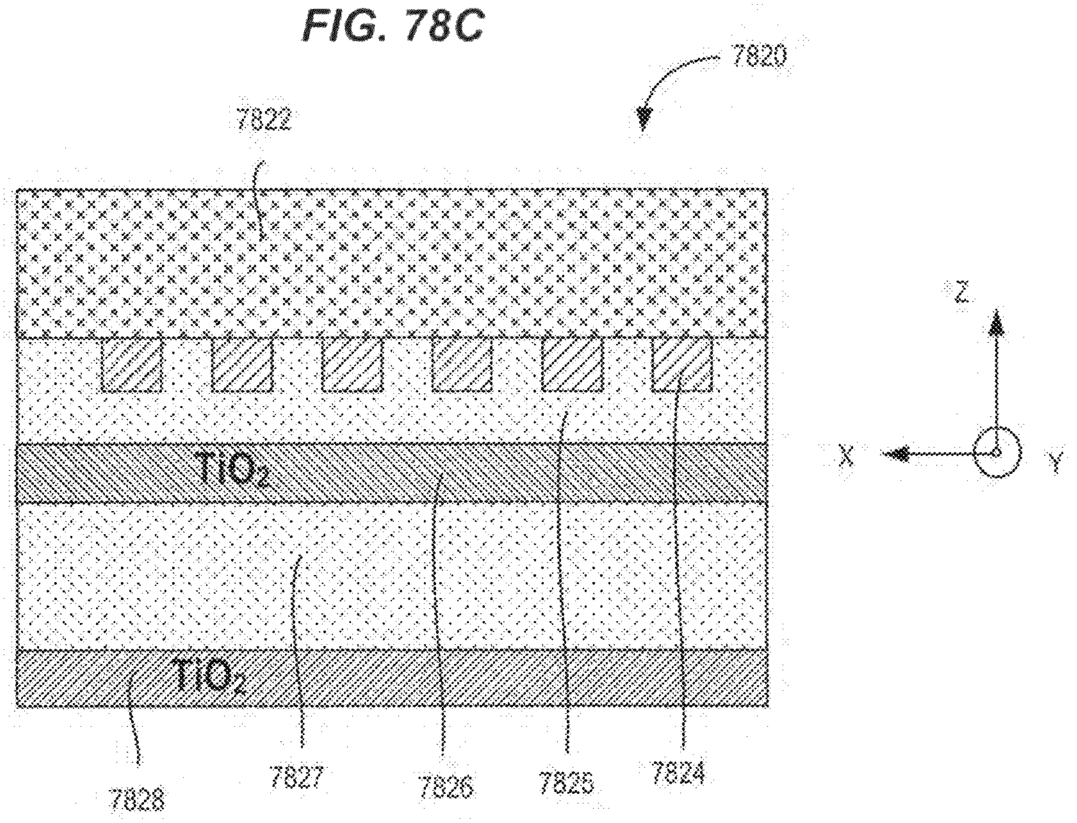

FIGS. 78C and 78D show a plan view and a side view, respectively, of a multilayer two-dimensional metasurface 7820 according to some embodiments. A plurality of nano antennas 7824 are arranged as a two-dimensional array in the X-Y plane on a surface of a substrate 7822 (e.g., a waveguide). The metasurface 7820 may further include a first dielectric layer 7825 that fills the region between the nano antennas 7824 and covers the nano antennas 7824, a second dielectric layer 7826 disposed over the first dielectric layer 7825, a third dielectric layer 7827 disposed over the second dielectric layer 7826, and a fourth dielectric layer 7828 disposed over the third dielectric layer 7827. In some embodiments, the nano antennas 7824 may comprise silicon (e.g., amorphous silicon); the first dielectric layer 7825 and the third dielectric layer 7827 may comprise a photoresist, or the like; the second dielectric layer 7826 and the fourth dielectric layer 7828 may comprise $TiO_2$, and the like. The second dielectric layer 7826 and the fourth dielectric layer 7828 may serve to increase the reflectivity of the metasurface 7820.

The single-layer one-dimensional metasurface 7710 illustrated in FIGS. 77A and 77B may exhibit a sharp reflectance peak at certain wavelength for a given angle of incidence, similar to that illustrated in FIG. 76. However, the peak wavelength may shift as the angle of incidence is varied. This angle dependence may limit the effective angular field of view. Adding additional layers of dielectric materials on top of the nanostructures can give another degree of freedom to tune the reflection spectrum. For example, the multilayer one-dimensional metasurface 7720 illustrated in FIGS. 77C and 77D may be configured to have a reflectance spectrum that is substantially angle-insensitive for a range of angles of incidence, as discussed further below. The multilayer two-dimensional metasurface 7820 illustrated in FIGS. 78C and 78D can also provide additional degrees of freedom to tune the reflection spectrum.

Figure 79:
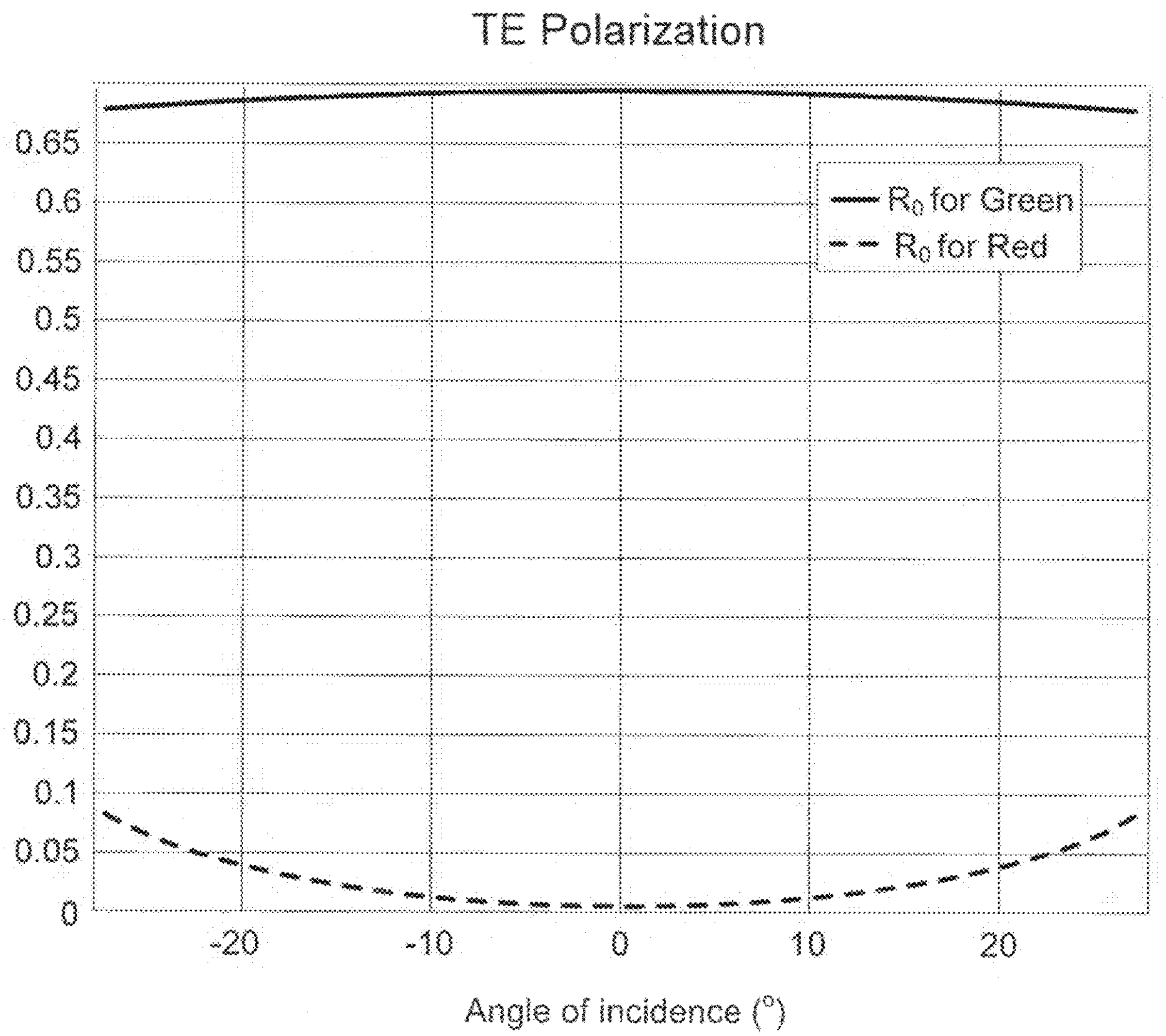

FIG. 79 shows plots of simulated reflectance as a function of angle of incidence for a wavelength corresponding to green color (e.g., at about 520 nm) (solid line), and for a wavelength corresponding to red color (e.g., at about 650 nm) (dashed line) of the multilayer one-dimensional metasurface 7720 illustrated in FIGS. 77C and 77D, for TE polarization, according to some embodiments. As illustrated, the reflectance for the green wavelength remains fairly flat (e.g., at approximately 70%) for the angular range from about −30 degrees to about 30 degrees. In the same angular range, the reflectance for the red wavelength remains fairly low (e.g., below about 10%).

Figure 80:
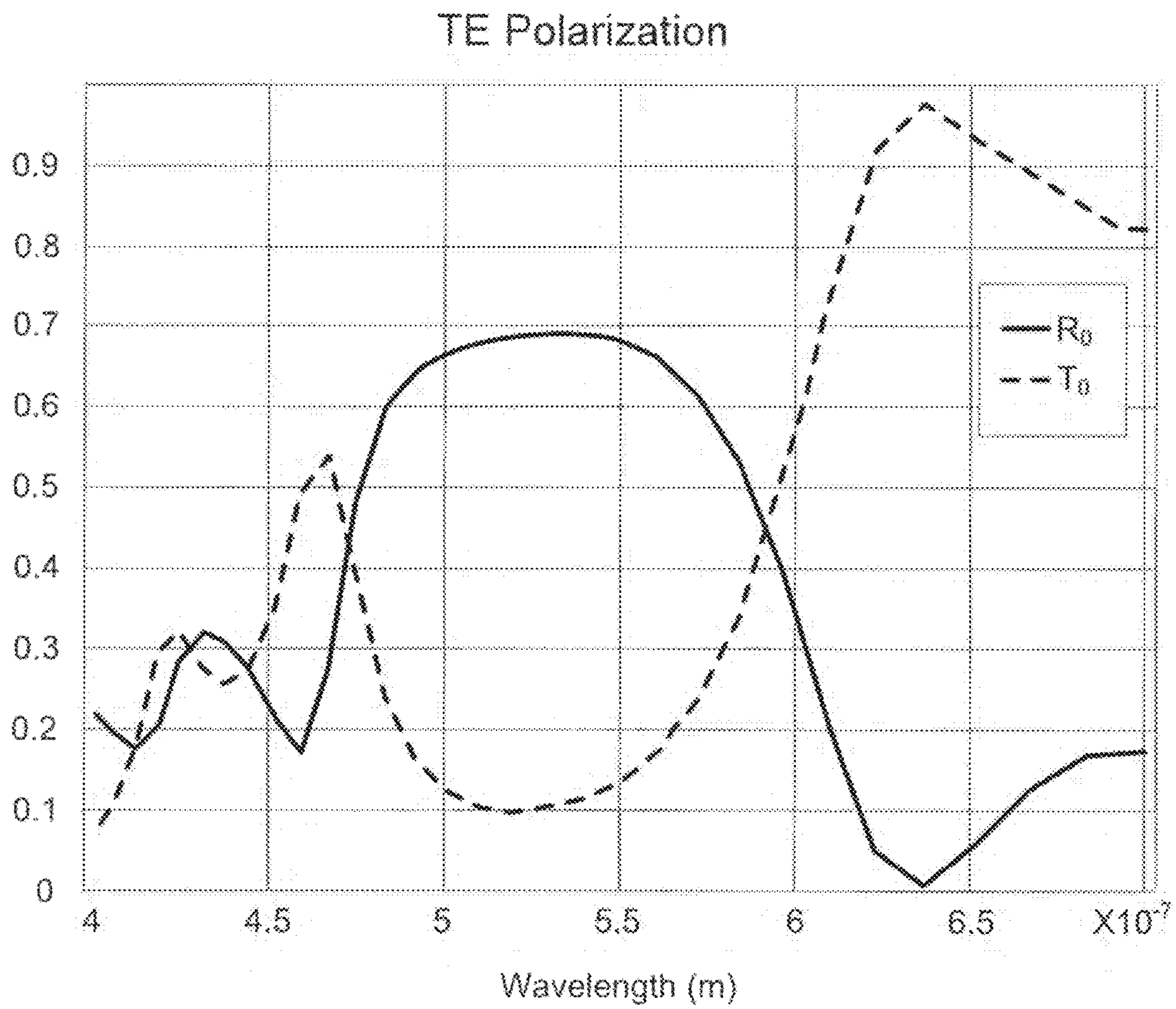

FIG. 80 shows plots of a simulated reflectance spectrum (solid line) and a simulated transmission spectrum (dashed line) of the multilayer one-dimensional metasurface 7720 illustrated in FIGS. 77C and 77D, for TE polarization, according to some embodiments. As illustrated, the reflectance spectrum shows a broad peak from about 480 nm to about 570 nm. Correspondingly, the transmission spectrum shows a broad valley in the same wavelength range. Thus, angle insensitivity may be achieved at the expense of a wider band width in the reflectance spectrum. For an augmented reality system, a wider reflectance band width means that more natural light from the world may be reflected by the wavelength-selective reflector and thus may not reach a viewer's eye.

Figure 81:
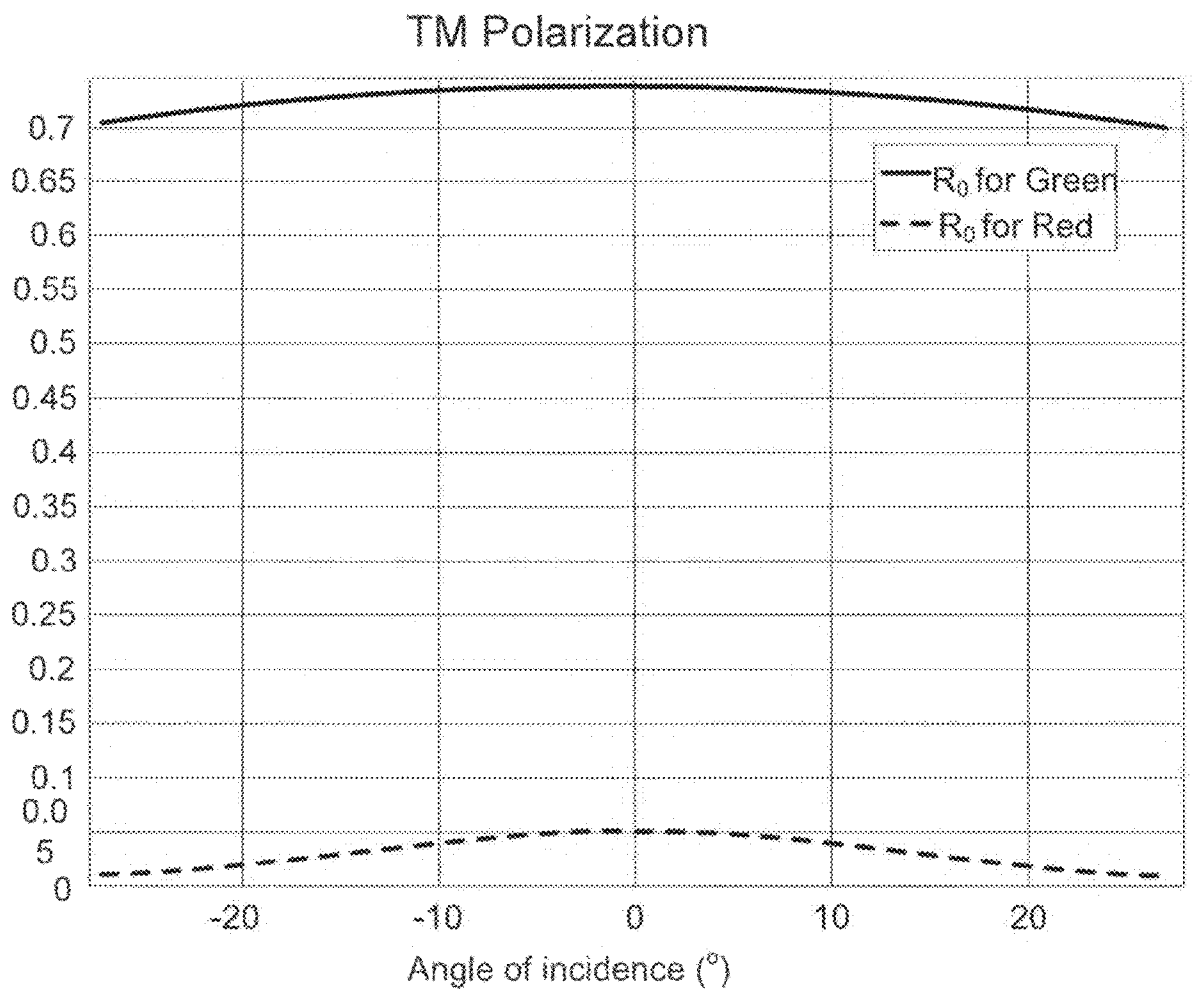

FIG. 81 shows plots of simulated reflectance as a function of angle of incidence for a wavelength corresponding to green color (e.g., at about 520 nm) (solid line), and for a wavelength corresponding to red color (e.g., at about 650 nm) (dashed line) of the multilayer one-dimensional metasurface 7720 illustrated in FIGS. 77C and 77D, for TM polarization, according to some embodiments. As illustrated, the reflectance for the green wavelength remains fairly flat (e.g., at approximately 75%) for the angular range from about −30 degrees to about 30 degrees. In the same angular range, the reflectance for the red wavelength remains fairly low (e.g., below about 5%). Compared to FIG. 79, the peak reflectance value for the green wavelength is slightly higher for TM polarization (e.g., at about 75%) than its counterpart for TE polarization (e.g., at about 70%).

Figure 82:
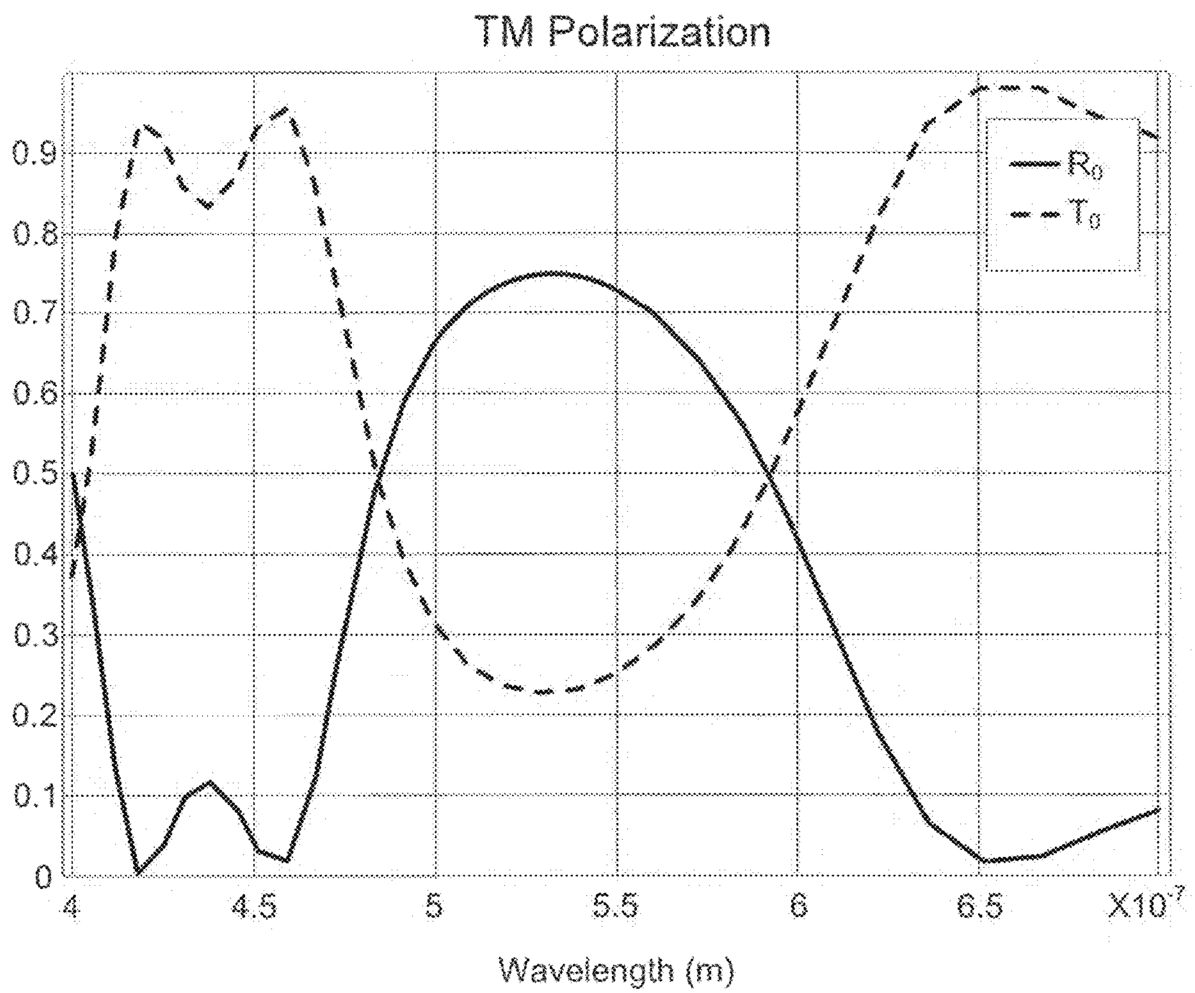

FIG. 82 shows plots of a simulated reflectance spectrum (solid line) and a simulated transmission spectrum (dashed line) of the multilayer one-dimensional metasurface 7720 illustrated in FIGS. 77C and 77D, for TM polarization, according to some embodiments. As illustrated, the reflectance spectrum shows a broad peak from about 480 nm to about 570 nm. Correspondingly, the transmission spectrum shows a broad valley in the same wavelength range. Compared to the FIG. 80, the reflectance spectrum for TM polarization exhibits a more rounded peak than its counterpart for TE polarization. Also, the transmission spectrum for TM polarization exhibits higher values outside the reflectance band as compared to its counterpart for TE polarization. In general, the resonant wavelength (e.g., the wavelength at which a reflection peak occurs) may shift to longer wavelength for increasing geometry sizes of the nanostructures. The bandwidth of the reflectance spectrum and the angular width of the angular spectrum may increase for decreasing aspect ratio of the nanostructures.

In some embodiments, multiple metasurfaces may be interleaved to form a composite metasurface to achieve desired spectral properties. FIGS. 83A-83F illustrate schematically how a composite metasurface may be formed by interleaving two sub-metasurfaces according to some embodiments.

Figures 83A, 83B, 83C, 83D, 83E, 83F:
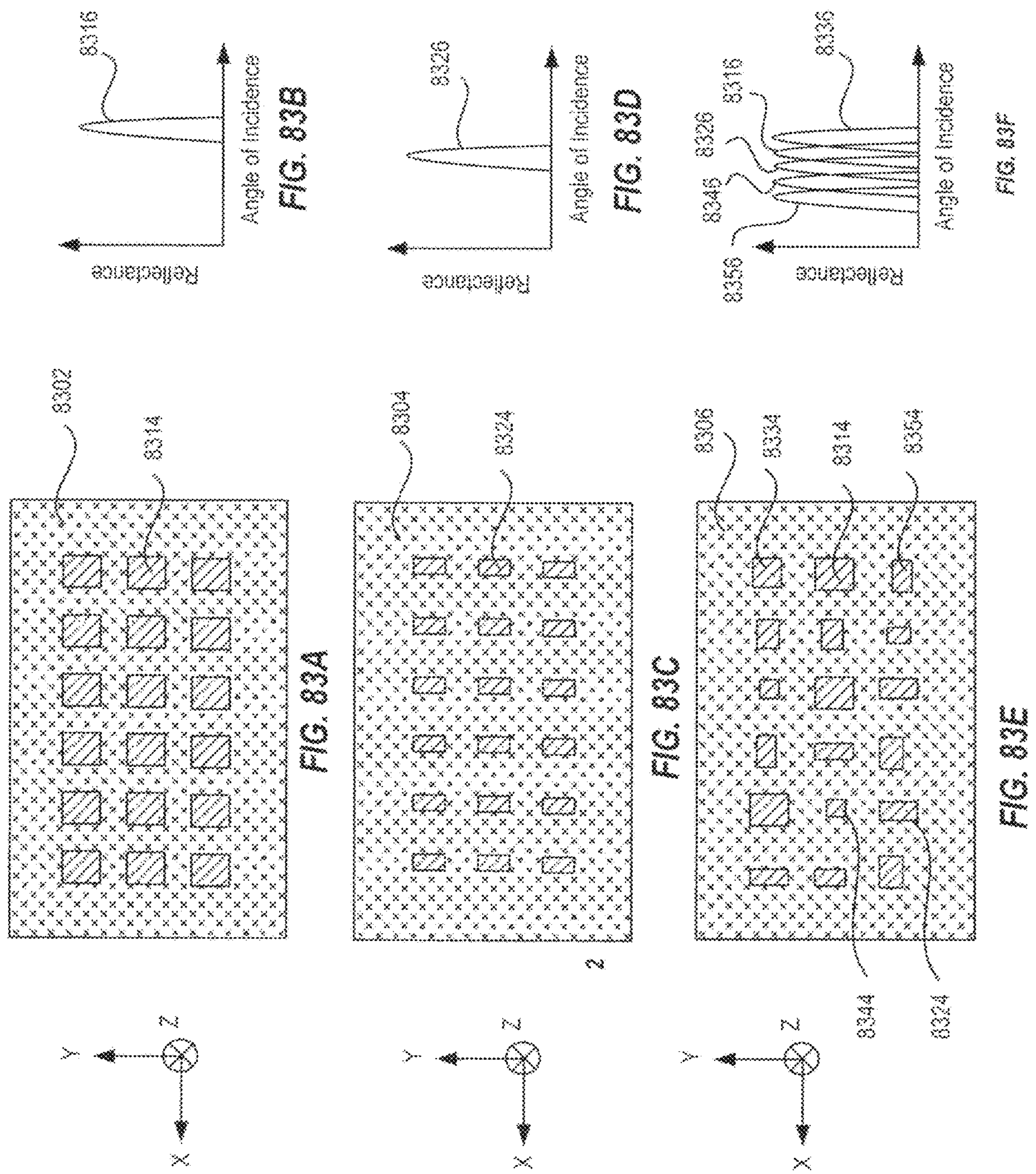

FIG. 83A shows a top view of a first sub-metasurface 8310 that includes a plurality of first nano antennas 8314 formed on a substrate 8302. Each first nano antenna 8314 has a rectangular shape with a first aspect ratio. FIG. 83B illustrates schematically a reflectance spectrum of the first sub-metasurface 8310 as a function of angle of incidence. As illustrated, the geometry of the first nano antennas 8314 may be designed such that the reflectance spectrum exhibits a peak at a first angle of incidence.

FIG. 83C shows a top view of a second sub-metasurface 8320 that includes a plurality of second nano antennas 8324 formed on a substrate 8304. Each second nano antenna 8324 has a rectangular shape with a second aspect ratio that is greater than the first aspect ratio (e.g., it is more elongated). FIG. 83D illustrates schematically a reflectance spectrum of the second sub-metasurface 8320 as a function of angle of incidence. As illustrated, the geometry of the second nano antennas 8324 may be designed such that the reflectance spectrum exhibits a peak at a second angle of incidence different from the first angle of incidence.

FIG. 83E shows a top view of a composite metasurface 8330 that includes a plurality of first nano antennas 8314, a plurality of second nano antennas 8324, as well as a plurality of third nano antennas 8334, a plurality of fourth nano antennas 8344, and a plurality of fifth nano antennas 8354, formed on a substrate 8306. The composite metasurface 8330 may be viewed as a composite of the first sub-metasurface 8310, the second sub-metasurface 8320, and so on and so forth. The nano antennas of each sub-metasurface may be randomly interleaved with each other. FIG. 83F illustrates schematically a reflectance spectrum of the composite metasurface 8330 as a function of angle of incidence. As illustrated, the composite metasurface 8330 may be characterized by a plurality of reflectance peaks 8316, 8326, 8336, 8346, and 8356 at a plurality of angles of incidence, each reflectance peak corresponding to a respective constituent sub-metasurface. The composite metasurface 8330 may include more than or fewer than five sub-metasurfaces according to various embodiments. In some embodiments, the reflectance spectrum as a function of wavelength for each sub-metasurface may exhibit a reflectance peak with a relatively narrow bandwidth, and the plurality of sub-metasurfaces may be configured to exhibit a reflectance peak at about the same wavelength range.

Multiple metasurfaces may be multiplexed to form a composite metasurface with desired spectral properties. FIGS. 84A and 84B show a top view and a side view, respectively, of a metasurface 8400 according to some embodiments. The metasurface 8400 may include a first array of first nano antennas 8410 arranged in a first lateral region on a surface of a substrate 8402, a second array of second nano antennas 8420 arranged in a second lateral region next to first lateral region, a third array of third nano antennas 8430 arranged in a third lateral region next to the second lateral region, a fourth array of fourth nano antennas 8440 arranged in a fourth lateral region next to the third lateral region, a fifth array of fifth nano antennas 8450 arranged in a fifth lateral region next to the fourth lateral region, and a sixth array of sixth nano antennas 8460 arranged in a sixth lateral region next to the fifth lateral region.

Figure 84C:
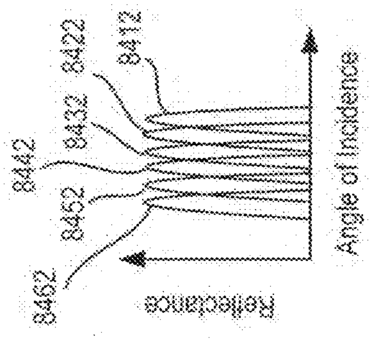
Figure 84B:
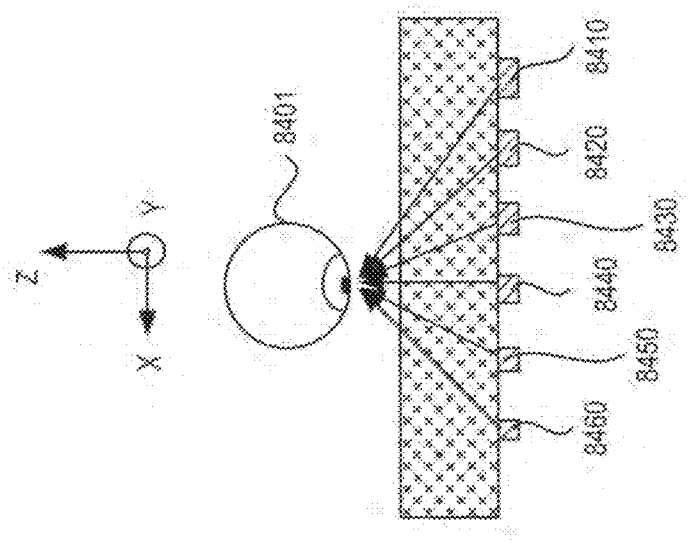
Figure 84A:
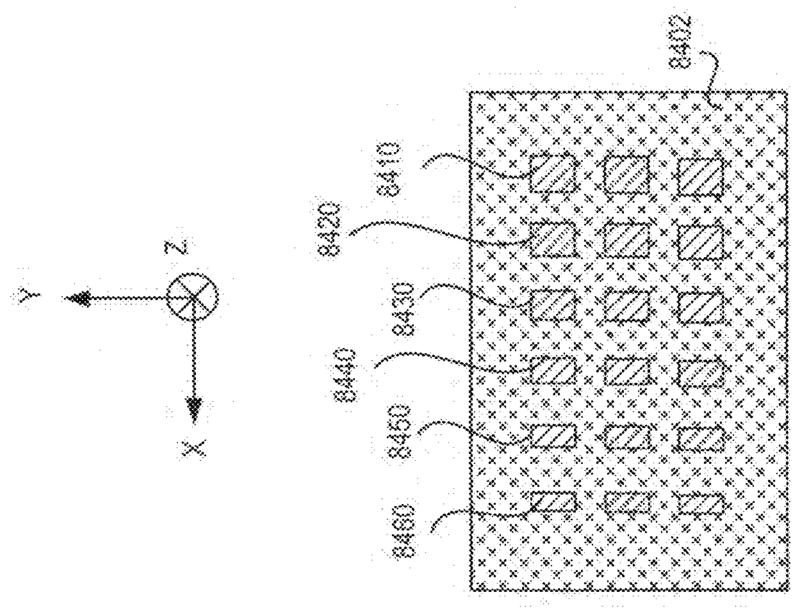

Each first nano antenna 8410 may have a rectangular shape with a first aspect ratio designed such that the first array of first nano antennas 8410 is characterized by a first reflectance spectrum 8412 having a peak at a first angle of incidence 8412, each second nano antenna 8420 may have a rectangular shape with a second aspect ratio designed such that the second array of first nano antennas 8420 is characterized by a second reflectance spectrum 8422 having a peak at a second angle of incidence 8422, and so on and so forth, as illustrated in FIG. 84C. In this manner, each array of nano antennas 8410, 8420, 8430, 8440, 8450, or 8460 is optimized for light rays that may reach a viewer's eye 8401, as illustrated in FIG. 84B.

FIG. 85A illustrates schematically a partial side view of an eyepiece 8500 according to some embodiments. The eyepiece includes a waveguide 8510, a grating 8520 formed on a back surface of the waveguide 8510, and a wavelength-selective reflector 8530 formed on a front surface of the waveguide 8510. FIG. 85B illustrates schematically a top view of the wavelength-selective reflector 8530 according to some embodiments. The wavelength-selective reflector 8530 may include a plurality of overlapping regions 8532. Each region 8532 may comprise a metasurface optimized to have a reflectance peak at a respective angle of incidence corresponding to light rays that may reach a viewer's eye 8501, both laterally (e.g., along the Y-axis) and vertically (e.g., along the X-axis, as illustrated in FIG. 85A). For example, each region 8532 may include an array of nano antennas with a respective aspect ratio, similar to the first array of first antennas 8410, the second array of second antennas 8420, the third array of third antennas 8430, the fourth array of fourth antennas 8440, the fifth array of fifth antennas 8450, or the sixth array of sixth antennas 8460, as illustrated in FIG. 84A. In some embodiments, the size of each region 8532 may be advantageously designed to match the diameter of the pupil of the viewer's eye 8501 plus a predetermined margin.

In some embodiments, a wavelength-selective reflector may comprise a volume phase hologram (may also be referred to as volume phase grating). Volume phase holograms are periodic phase structures formed in a layer of transmissive medium, usually dichromatic gelatin or holographic photopolymer, which is generally sealed between two layers of clear glass or fused silica in the case of dichromatic gelatin. The phase of incident light is modulated as it passes through the optically thick film that has a periodic refractive index, hence the term "volume phase." This is in contrast to a conventional grating, in which the depth of a surface relief pattern modulates the phase of the incident light. Volume phase holograms can be designed to work at different wavelengths by adjusting the period of the refractive index modulation and the index modulation depth (i.e. the difference between high and low index values) of the medium. The period of the reflective volume phase hologram is determined by the wavelength of the recording laser and the recording geometry. The modulation depth (which affects both the diffraction efficiency and the effective spectral bandwidth) may be determined by the material properties of the recording medium and the total exposure (typically expressed as $mJ/cm^2$). The spectral and angular selectivity of the volume phase hologram may be determined by the thickness of the recording medium. The relationship between all of these parameters is expressed by Kogelnik's coupled wave equations, which are available from the literature (see, e.g., H. Kogelnik, Bell Syst. Tech. J. 48, 2909, 1969). The angular and wavelength properties of volume phase holograms are generally referred to as "Bragg selectivity" in the literature. Because of Bragg selectivity, volume phase holograms can be designed to have a high reflectance efficiency for a desired wavelength at a desired angle of incidence. More details about volume phase holograms that may be used in an eyepiece for an augmented reality system are provided in U.S. Provisional Patent Application No. 62/384,552, the content of which is incorporated herein in its entirety for all purposes.

FIG. 86A illustrates schematically a partial cross-sectional view of a first volume phase hologram 8610 formed on a substrate 8602 (e.g., a waveguide) according to some embodiments. The first volume phase hologram 8610 may have a first modulated index pattern 8612 designed to produce a high reflectance peak at a first angle of incidence, as illustrated schematically in FIG. 86B. For example, the first modulated index pattern 8612 may comprise periodic index stripes titled at a first tilting angle with respect to the Z-axis in order to reflect light within a specific wavelength range and over a predetermined range of angles back towards the viewer. In this case, the angular range of the reflected light is related to the tilt of the index modulation planes. Volume phase holograms can be made very selective by choosing an appropriate material thickness. In some embodiments, the medium thickness may be in a range from about 8 microns to about 50 micros to achieve the desired angular and spectral selectivity.

FIG. 86C illustrates schematically a partial cross-sectional view of a second volume phase hologram 8620 according to some embodiments. The second volume phase hologram 8620 may have a second modulated index pattern 8622 designed to produce a high reflectance peak at a second angle of incidence different from the first angle of incidence, as illustrated schematically in FIG. 86D. For example, the second modulated index pattern 8622 may comprise periodic index stripes titled at a second tilting angle with respect to the Z-axis that is greater than the first tilting angle as illustrated in FIGS. 86A and 86C.

FIG. 86E illustrates schematically a partial cross-sectional view of a composite volume phase hologram 8630 according to some embodiments. FIG. 86F illustrates schematically a side view of a composite volume phase hologram 8630 formed on a surface of a waveguide 8602 according to some embodiments. (Note FIG. 86E and FIG. 86F have different scales along the Z-axis). The composite volume phase hologram 8630 may include a plurality of regions 8631-8637. Each region 8631-8637 may be optimized for a respective angle of incidence corresponding to light rays that may reach a viewer's eye 8601, as illustrated in FIG. 86F. For example, each region 8631-8637 may comprise periodic index stripes tilted at a respective tilting angle with respect to the Z-axis, where the tilting angles of the plurality of regions 8631-8637 are different from each other as illustrated in FIG. 86E.

In some embodiments, it may be also possible to multiplex multiple index modulation profiles within the same volume phase hologram. Each separate modulation profile can be designed to reflect light within a narrow wavelength range during hologram recording by choosing an appropriate exposure wavelength. Preferably the corresponding exposures are performed simultaneously (using separate lasers). It may also be possible to sequentially record the gratings. Such a multiplexed volume phase hologram may be used for the wavelength-selective reflector 7356 illustrated in FIG. 73.

Similar to the metasurface illustrated in FIGS. 85A and 85B, a composite volume phase hologram may comprise overlapping regions arranged as a two-dimensional array in some embodiments. Each region may be optimized to have a reflectance spectrum exhibiting a peak at a respective angle of incidence corresponding to light rays that may reach a viewer's eye, both laterally (e.g., along the Y-axis) and vertically (e.g., along the X-axis).

FIG. 87 is a schematic diagram illustrating a projector 8700, according to one embodiment. The projector 8700 includes a set of spatially displaced light sources 8705 (e.g., LEDs, lasers, etc.) that are positioned in specific orientations with a predetermined distribution as discussed below in relation to FIGS. 90A-90C. The light sources 8705 can be used by themselves or with sub-pupil forming collection optics, such as, for example, light pipes or mirrors, to collect more of the light and to form sub-pupils at the end of the light pipes or collection mirrors. For purposes of clarity, only three light sources are illustrated. In some embodiments, quasi-collimation optics 8725 are utilized to quasi-collimate the light emitted from the light sources 8705 such that light enters a polarizing beam splitter (PBS) 8710 in a more collimated like manner so that more of the light makes it to the display panel 8707. In other embodiments, a collimating element (not shown) is utilized to collimate the light emitted from the light sources after propagating through portions of the PBS 8710. In some embodiments, a pre-polarizer may be between the quasi-collimating optics 8725 and the PBS 8710 to polarize the light going into the PBS 8710. The pre-polarizer may also be used for recycling some the light. Light entering the PBS 8710 reflects to be incident on the display panel 8707, where a scene is formed. In some embodiments, time sequential color display can be used to form color images.

Light reflected from the display panel 8707 passes through the PBS 8710 and is imaged using the projector lens 8715, also referred to as imaging optics or a set of imaging optics, to form an image of the scene in a far field. The projector lens 8715 forms roughly a Fourier transform of the display panel 8707 onto or into an eyepiece 8720. The projector 8700 provides sub-pupils in the eyepiece that are inverted images of the sub-pupils formed by the light sources 8705 and the collection optics. As illustrated in FIG. 87, the eyepiece 8720 includes multiple layers. For example, the eyepiece 8720 includes six layers or waveguides, each associated with a color (e.g., three colors) and a depth plane (e.g., two depth planes for each color). The "switching" of colors and depth layers is performed by switching which of the light sources is turned on. As a result, no shutters or switches are utilized in the illustrated system to switch between colors and depth planes.

Additional discussion related to the projector 8700 and variations on architectures of the projector 8700 are discussed herein.

FIG. 88 is a schematic diagram illustrating a projector 8800, according to another embodiment. In the embodiment illustrated in FIG. 88, a display panel 8820 is an LCOS panel, but the disclosure is not limited to this implementation. In other embodiments, other display panels, including frontlit LCOS (FLCOS), DLP, and the like can be utilized. In some embodiments, a color sequential LCOS design is utilized as discussed in relation to the time sequential encoding discussed in relation to FIG. 91, although other designs can be implemented in which all colors (e.g., RGB) are displayed concurrently. As color filters improve in performance and pixel sizes are decreased, system performance will improve and embodiments of the present disclosure will benefit from such improvements. Thus, a number of reflective or transmissive display panels can be utilized in conjunction with the distributed sub-pupil architecture disclosed herein. One of ordinary skill in the art would recognize many variations, modifications, and alternatives.

Light emitted by light sources 8810, in some embodiments including collection optics, and polarized by a pre-polarizer 8825 propagates through a polarizing beam splitter (PBS) 8830, passes through a quarter waveplate 8827, and impinges on a collimator 8832, which can be implemented as, for example, a mirrored lens, a reflective lens, or curved reflector. The spatial separation between the light sources 8810 enables a distributed sub-pupil architecture. The collimator 8832, which is a reflective collimator in some embodiments, quasi-collimates or collects the beam emitted by the light sources 8810 and directs the collimated beams back through the quarter waveplate 8827 again into the PBS 8830 with a polarization state changed to direct the light onto the display panel 8820.

As the collimated beams propagate through the PBS 8830, they are reflected at an interface 8831 and directed towards the display panel 8820. The display panel 8820 forms a scene or a series of scenes that can be subsequently imaged onto an eyepiece. In some embodiments, time sequential image formation for different colors and depth planes is accomplished by sequentially operating the light sources 8810 in conjunction with operation of the display panel. In some embodiments, a compensation element is placed at the PBS 8830 or attached to the display panel 8820 to improve the performance of the display panel 8820. After reflection from the display panel 8820, the light propagates through the interface 8831 and exits the PBS 8830 at side 8804. Optical lens 8840, also referred to as projector lens 8840, is then utilized to form a Fourier transform of the display and in conjunction with the collimator 8832 to form an inverted image of the sub-pupils of the light sources 8810 at or into the eyepiece. The interface 8831 can be implemented using polarizing films, wire grid polarizers, dielectric stacked coatings, combinations thereof, and the like.

According to some embodiments, a projector assembly is provided. The projector assembly includes a PBS (e.g., the PBS 8830). The projector assembly also includes a set of spatially displaced light sources (e.g., the light sources 8810) adjacent the PBS 8830. The light sources 8810 can be different color LEDs, lasers, or the like. In some embodiments, the spatially displaced light sources 8810 are adjacent a first side 8801 of the PBS 8830. The PBS 8830 passes the light emitted by the light sources 8810 during a first pass.

The collimator 8832, which can be a reflective mirror, is disposed adjacent the PBS 8830 and receives the light making a first pass through the PBS 8830. The collimator 8832 is adjacent a second side 8802 of the PBS 8830, which is opposite the first side 8801 adjacent the spatially displaced light sources 8810. The collimator 8832 collimates and collects the emitted light and directs the collimated light back into the second side 8802 of the PBS 8830.

The projector assembly also includes the display panel 8820 adjacent a third side 8803 of the PBS 8830 positioned between the first side 8801 and the second side 8802. The display panel can be an LCOS panel. During a second pass through the PBS 8830, the collimated light reflects from the internal interface in the PBS 8830 and is directed toward the display panel due to its change in polarization states caused by double passing the quarter waveplate 8827.

The projector assembly further includes the projector lens 8840 adjacent a fourth side 8804 of the PBS 8830 that is positioned between the first side 8801 and the second side 8802 and opposite to the third side 8803. The position of the projector lens 8840 between the PBS 8830 and the eventual image formed by the projection display assembly denotes that the illustrated system utilizes a PBS 8830 at the back of the projector assembly.

The projector assembly forms an image of the sub-pupils and a Fourier transform of the display panel 8820 at an image location. An incoupling interface to an eyepiece is positioned near the image location. Because light emitted by the spatially displaced light sources 8810 propagates through different paths in the projector assembly, the images associated with each light source of the light sources 8810 are spatially displaced at the image plane of the system, enabling coupling into different waveguides making up the eyepiece.

FIG. 89 is a schematic diagram illustrating multiple colors of light being coupled into corresponding waveguides using an incoupling element disposed in each waveguide, according to one embodiment. A first waveguide 8910, a second waveguide 8920, and a third waveguide 8930 are positioned adjacent each other in a parallel arrangement. In an example, the first waveguide 8910 can be designed to receive and propagate light in a first wavelength range 8901 (e.g., red wavelengths), the second waveguide 8920 can be designed to receive and propagate light in a second wavelength range 8902 (e.g., green wavelengths), and the third waveguide 8930 can be designed to receive and propagate light in a third wavelength range 8903 (e.g., blue wavelengths).

Light in all three wavelength ranges 8901, 8902, and 8903 are focused due to the Fourier transforming power of the projector lens 8940 onto roughly the same plane but displayed in the plane by roughly the spacing of the sub-pupils in the light module and the magnification, if any, of the optical system. The incoupling gratings 8912, 8922, and 8932 of the respective layers 8910, 8920, and 8930 are placed in the path that corresponds to the correct color sub-pupil so as to capture and cause a portion of the beams to couple into the respective waveguide layers.

The incoupling element, which can be an incoupling grating, can be an element of an incoupling diffractive optical element (DOE). When a given light source is turned on, the light from that light source is imaged at the corresponding plane (e.g., red LED #1, first waveguide 8910 at a first depth plane). This enables switching between colors by merely switching the light sources off and on.

In order to reduce the occurrence and/or impact of artifacts, also referred to as ghost images or other reflections, embodiments of the present disclosure utilize certain polarization filters and/or color filters. The filters may be used in single pupil systems.

FIGS. 90A-90C are top views of distributed sub-pupil architectures, according to some embodiments. The distributed sub-pupils can be associated with different sub-pupils and are associated with different light sources (e.g., LEDs or lasers) operating at different wavelengths and in different positions. Referring to FIG. 90A, this first embodiment or arrangement has six sub-pupils associated with two depth planes and three colors per depth plane. For example, two sub-pupils 9010 and 9012 associated with a first color (e.g., red sub-pupils), two sub-pupils 9020 and 9022 associated with a second color (e.g., green sub-pupils), and two sub-pupils 9030 and 9032 associated with a third color (e.g., blue sub-pupils). These sub-pupils correspond to six light sources that are spatially offset in an emission plane. The illustrated six sub-pupil embodiment may be suitable for use in a three-color, two-depth plane architecture. Additional description related to distributed sub-pupil architectures is provided in U.S. Patent Application Publication No. 2016/0327789, published on Nov. 10, 2016, the disclosure of which is hereby incorporated by reference in its entirety for all purposes.

As an example, if two light sources are positioned opposite each other with respect to an optical axis, it is possible that light from one of the light sources (i.e., a first light source) can propagate through the optical system, reflect off of the eyepiece, for example, an incoupling grating or other surface of the eyepiece, and propagate back through the optical system and then reflect again at the display panel to reappear at the location. This double reflection appearing in a location of another sub-pupil will create a ghost image since the light was originally emitted by the first light source. In the arrangement illustrated in FIG. 90A, since sub-pupils 9010/9012, 9020/9022, and 9030/9032 are positioned opposite each other with respect to the center of the optical axis and the sub-pupil distribution, light from sub-pupil 9010 can be coupled to sub-pupil 9012, from 9020 to 9022, and from 9030 to 9032. In this case, artifacts, also referred to as ghost images, can be formed in the optical system. It should be noted that in an alternative arrangement, the light sources can be positioned such that different colored sub-pupils are located opposite to each other with respect to the optical axis.

Referring to FIG. 90B, a nine sub-pupil embodiment is illustrated, which would be suitable for use in a three-color, three-depth plane architecture. In this embodiment, a first set of sub-pupils including sub-pupils 9040, 9042, and 9044 associated with a first color (e.g., red sub-pupils) are positioned at 120° with respect to each other. A second set of sub-pupils including sub-pupils 9050, 9052, and 9054 associated with a second color (e.g., green) are positioned at 120° with respect to each other and the distribution is rotated 60° from the first color. Accordingly, if light from sub-pupil 9040 is reflected in the system and reappears at sub-pupil 9054 opposite to sub-pupil 9040, no overlap in color will be present. A third set of sub-pupils including sub-pupils 9060, 9062, and 9064 associated with a third color (e.g., blue) are positioned inside the distribution of the first and second sub-pupils and positioned 120° with respect to each other.

FIG. 90C illustrates a six sub-pupil arrangement in which sub-pupils 9070 and 9072 associated with a first color (e.g., red) are positioned at two corners of the sub-pupil distribution, sub-pupils 9080 and 9082 associated with a second color (e.g., green) are positioned at the other two corners of the sub-pupil distribution, and sub-pupils 9090 and 9092 associated with a third color (e.g., blue) are positioned along sides of the rectangular sub-pupil distribution. Thus, sub-pupil arrangement, as illustrated in FIGS. 90B-90C, can be utilized to reduce the impact from ghost images. Alternative sub-pupil arrangements may also be utilized, such as, for example, sub-pupil arrangements in which sub-pupils of different colors are opposite each other across the optical axis. Ghosting can be reduced by using color selective elements (e.g., a color selective rotator) or color filters at each respective incoupling grating.

FIG. 91 is a schematic diagram illustrating time sequential encoding of colors for multiple depth planes, according to one embodiment. As illustrated in FIG. 91, the depth planes (three in this illustration) are encoded into least significant bit (LSB) per pixel via a shader. The projector assembly discussed herein provides for precise placement of pixels for each color in a desired depth plane. Three colors are sequentially encoded for each depth plane—(R0, G0, B0 for plane 0) 9102, (R1, G1, B1 for plane 1) 9104, and (R2, G2, B2 for plane 2) 9106. Illumination of each color for 1.39 ms provides an illumination frame rate 9108 of 720 Hz and a frame rate for all three colors and three depth planes 9110 of 80 Hz (based on 12.5 ms to refresh all colors and planes). In some embodiments, a single color for a single depth plane per frame may be used by only using light sources associated with that particular color for that particular depth plane.

In some embodiments, multiple depth planes can be implemented through the use of a variable focus lens that receives the sequentially coded colors. One of ordinary skill in the art would recognize many variations, modifications, and alternatives.

FIG. 92A is a schematic diagram illustrating a projector assembly, according to one embodiment. FIG. 92B is an unfolded schematic diagram illustrating the projector assembly shown in FIG. 92A. As illustrated in FIG. 92A, a projector architecture 9200 includes an illumination source 9210, which can emit a collimated set of light beams, such as, for example, lasers. In this embodiment, since light the system is already collimated, a collimator can be omitted from the optical design. The illumination source 9210 can emit polarized, unpolarized, or partially polarized light. In the illustrated embodiment, the illumination source 9210 emits light 9212 polarized with a p-polarization. A first optical element 9215 (e.g., a pre-polarizer) is aligned to pass light with p-polarization to a polarizing beam splitter (PBS) 9220. Initially, light passes through an interface 9222 (e.g., a polarizing interface) of the PBS 9220 and impinges on a spatial light modulator (SLM) 9230. The SLM 9230 impresses a spatial modulation on the signal to provide an image. In an on state, the SLM 9230 modulates input light from a first polarization state (e.g., p-polarization state) to a second polarization state (e.g., s-polarization state) such that a bright state (e.g., white pixel) is shown. The second polarization state may be the first polarization state modulated (e.g., shifted) by 90°. In the on state, the light having the second polarization state is reflected by the interface 9222 and goes downstream to projector lens 9240. In an off state, the SLM 9230 does not rotate the input light from the first polarization state, thus a dark state (e.g., black pixel) is shown. In the off state, the light having the first polarization state is transmitted through the interface 9222 and goes upstream to the illumination source 9210. In an intermediate state, the SLM 9230 modulates the input light from the first polarization to a certain elliptical polarization state. In the intermediate state, some of the light having the elliptical polarization state (e.g., p-polarization state) is reflected by the interface 9222 and goes upstream to the illumination source 9210 and some of the light having the elliptical polarization state (e.g., s-polarization state) is transmitted through the interface 9222 goes downstream to projector lens 9240.

After reflection from the SLM 9230, reflected light 9214 is reflected from the interface 9222 and exits the PBS 9220. The emitted light passes through projector lens 9240 and is imaged onto an incoupling grating 9250 of an eyepiece (not shown).

FIG. 92B illustrates imaging of light associated with a first sub-pupil 9211 of the illumination source 9210 onto the incoupling grating 9250 of the eyepiece. Light is collected before entry into the PBS 9220, reflects from SLM 9230, passes through projector lens 9240, and is relayed onto the incoupling grating 9250. The optical axis 9205 is illustrated in FIG. 92B.

FIG. 93A is a schematic diagram illustrating back reflections in a projector assembly.

For purposes of clarity, reference numbers used in FIG. 92A are also used in FIG. 93A. Referring to FIG. 93A, in a manner similar to the operation of the projector assembly 9200 in FIG. 92A, s-polarization light from the spatial light modulator (SLM) 9230, also referred to as a display panel, is reflected at interface 9222 inside the PBS 9220. It should be noted that the tilting of the rays after reflection from interface 9222 are merely provided for purposes of clarity. Most of the light emitted from the PBS 9220 passes through projector lens 9240 and is relayed by projector lens 9240 to provide an image of the sub-pupils at the incoupling grating 9250 of the eyepiece.

A portion of the light emitted from the PBS 9220 is reflected at one or more surfaces 9242 of projector lens 9240 and propagates back toward the PBS 9220. This reflected light 9302 reflects off of interface 9222, SLM 9230, interface 9222 a second time, passes through projector lens 9240, and is relayed by projector lens 9240 to provide an image of the sub pupil at second incoupling grating 9252 of the eyepiece, which is laterally offset and positioned opposite to the incoupling grating 9250 with respect to the optical axis. Since the source of light at both incoupling gratings 9250 and 9252 is the same, the light at incoupling grating 9252 appears to be originating in the SLM 9230, thereby producing an artifact or ghost image.

FIG. 93B is an unfolded schematic diagram illustrating artifact formation in the projector assembly shown in FIG. 93A. Light from first sub-pupil 9211 of the illumination source 9210 is collected by first optical element 9215, propagates through the PBS 9220, reflects off the SLM 9230, makes another pass through the PBS 9220, reflecting off interface 9222 (not shown), and passes through projector lens 9240, which images the sub-pupil of the light source at the IG 9250 (not shown).

Light reflected from one or more surfaces of projector lens 9240 passes through the PBS 9220, and reflects off of the SLM 9230. After reflection in the PBS 9220, the light propagates in the downstream path through projector lens 9240 and is relayed by projector lens 9240 to provide a defocused image of the sub-pupil at a second incoupling grating 9252 of the eyepiece, which is laterally offset and positioned opposite to the first incoupling grating 9250 with respect to the optical axis. Since, in this case, the light source at both incoupling gratings 9250 and 9252 is the same, the light at incoupling grating 9252 appears to be originating in the SLM 9230, thereby producing an artifact or ghost image.

FIG. 94 illustrates presence of an artifact in a scene for the projector assembly illustrated in FIG. 93A. As seen in FIG. 94, the text "9:45 AM" is intended for display by the projector. In addition to the intended text 9410, an artifact 9420 is displayed. The artifact 9420 also has the text "9:45 AM" but with reduced intensity and flipped with respect to the intended text 9410.

FIG. 95A is a schematic diagram illustrating a projector assembly with artifact prevention 9500, also referred to as ghost image prevention, according to one embodiment. The projector assembly illustrated in FIG. 95A shares some common elements with the projector assembly illustrated in FIG. 92A and the description provided in FIG. 92A is applicable to the projector assembly in FIG. 95A as appropriate. As described herein, the projector assembly with artifact prevention 9500 includes a circular polarizer 9510 that enables attenuation or blocking of light propagating in the upstream path in specific polarizations that can be reflected from projector lens 9240.

Light from a projector assembly creates an image at the image plane, for example, the incoupling grating 9250 of the eyepiece, where the eyepiece is positioned. Some of the light from the projector assembly can be reflected from the elements 9242 of projector lens 9240 and return upstream towards the projector assembly. If the reflected light 9502 is not blocked, it could travel to and reflect off the SLM 9230 and go downstream towards, for example, the incoupling grating 9252, resulting in artifacts or ghost images that are produced in the eyepiece. To prevent or reduce the intensity of these ghost images, embodiments of the present disclosure block most or all of the reflected light and prevent most or all of the reflected light from impinging on the SLM 9230.

The projector assembly 9500 with artifact prevention includes a circular polarizer 9510 incorporating a linear polarizer 9512 and a quarter waveplate 9514. The circular polarizer 9510 is positioned between the PBS 9220 and projector lens 9240. As illustrated in the inset in FIG. 95A, the circular polarizer 9510 receives s-polarized light from the PBS 9220 and generates circularly polarized light (e.g., left hand circularly polarized (LHCP) light) in the downstream path. One advantage of the circular polarizer 9510 is that it acts as a cleanup polarizer for the projector assembly 9500 which improves contrast.

As illustrated in FIG. 95A, the downstream light is LHCP polarized and reflection from the one or more surfaces 9242 of projector lens 9240 will introduce a phase shift such that the reflected light is circularly polarized with an opposing handedness (e.g., right hand circularly polarized (RHCP)). Referring to the inset, the RHCP light is converted to linearly polarized light by the quarter waveplate 9514. The linearly polarized light is polarized in a direction orthogonal to the transmission axis of the linear polarizer 9512 as it passes through the quarter waveplate 9514 and is, therefore, blocked by the linear polarizer 9512. Thus, the light reflected from projector lens 9240 is blocked and prevented from impinging on the SLM 9230. Therefore, embodiments of the present disclosure prevent or reduce the intensity of these unwanted artifacts or ghost images through the use of the circular polarizer 9510. In some embodiments, a portion 9504 of the reflected light can be reflected from the quarter waveplate 9514. This portion 9504 of the light reflected from the quarter waveplate 9514 will propagate away from the quarter waveplate toward the set of imaging optics 9240.

FIG. 95B is a flowchart illustrating a method 9550 of reducing optical artifacts according to one embodiment. The method 9550 includes injecting a light beam generated by an illumination source into a polarizing beam splitter (PBS) (9552) and reflecting a spatially defined portion of the light beam from a display panel (9554). The light beam can be one of a set of light beams. As an example, the set of light beams can include a set of spatially displaced light sources, for example, LEDs.

The method 9550 also includes reflecting, at an interface in the PBS, the spatially defined portion of the light beam towards projector lens (9556) and passing at least a portion of the spatially defined portion of the light beam through a circular polarizer disposed between the PBS and projector lens (9558). The spatially defined portion of the light beam can be characterized by a linear polarization. The method 9550 further includes reflecting, by one or more elements of the projector lens, a return portion of the spatially defined portion of the light beam (9560) and attenuating, at the circular polarizer, the return portion of the spatially defined portion of the light beam (9562). The return portion of the spatially defined portion of the light beam can be characterized by a circular polarization.

It should be appreciated that the specific steps illustrated in FIG. 95B provide a particular method of reducing optical artifacts according to one embodiment. Other sequences of steps may also be performed according to alternative embodiments. For example, alternative embodiments of the present disclosure may perform the steps outlined above in a different order. Moreover, the individual steps illustrated in FIG. 95B may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 96 illustrates reduction in intensity of the artifact using the projector assembly shown in FIG. 95A. The artifact 9420 illustrated in FIG. 94 is reduced in intensity, for example, eliminated, demonstrating the effectiveness of the reflection reduction system.

FIG. 97A is a schematic diagram illustrating artifact formation resulting from reflections from an in-coupling grating element or substrate surfaces of an eyepiece in a projection display system, according to one embodiment. FIG. 97B is an unfolded schematic diagram illustrating artifact formation resulting from reflections from an in-coupling grating or substrate surfaces of an eyepiece in the projection display system shown in FIG. 97A. The projector assembly illustrated in FIGS. 97A and 97B shares some common elements with the projector assembly illustrated in FIGS. 93A and 93B and the description provided in FIGS. 93A and 93B is applicable to the projector assembly in FIGS. 97A and 97B as appropriate. In some embodiments, the projector assembly illustrated in FIG. 97A may include a circular polarizer (e.g., the circular polarizer 9510 of FIG. 95A) between the PBS 9220 and projector lens 9240.

For purposes of clarity, reference numbers used in FIG. 93A are also used in FIG. 97A. Referring to FIG. 97A, in a manner similar to the operation of the projector assembly 9200 in FIG. 92A, s-polarization light 9702 from the SLM 9230, also referred to as a display panel, is reflected at interface 9222 inside the PBS 9220. It should be noted that the tilting of the rays after reflection from interface 9222 are merely provided for purposes of clarity. Most of the light emitted from the PBS 9220 passes projector lens 9240 and is relayed by projector lens 9240 to provide an image of the sub-pupil at the incoupling grating 9250 of the eyepiece.

A portion of the light incident on the incoupling grating 9250 is reflected by the incoupling grating 9250. As illustrated in FIG. 97A, although the light incident on the incoupling grating 9250 can be in a single polarization (e.g., s-polarization), the light reflected from the incoupling grating 9250 can have a mixture of polarizations (A*s+B*p) 9704, where A and B are coefficients between zero and one. For diffractive optical incoupling gratings with steps that are in a plane of the eyepiece, the reflections are of mostly flipped circular polarizations. However, if the incoupling gratings are slanted out of the plane of the eyepiece, then other polarization states will be reflected. The reflected light 9704 passes through projector lens 9240 and emerges with a mixture of polarizations (C*s+D*p) 9706 as it propagates back toward the PBS 9220, where C and D are coefficients between zero and one. Generally, A>C and B>D as a result of the characteristics of the incoupling grating 9250.

Light in the upstream path that is properly aligned with the polarization of interface (C*s) 9708 reflects from interface 9222, SLM 9230, interface 9222, passes through projector lens 9240, and is imaged by projector lens 9240 to provide an image at second incoupling grating 9252 of the eyepiece (E*s) 9712. Since the source of light at both incoupling gratings 9250 and 9252 is the same, the light at incoupling grating 9252 appears to be originating in the SLM 9230, thereby producing an artifact or ghost image.

Referring to FIG. 97B, the symmetry around the optical axis 9205 is demonstrated by the imaging at incoupling grating 9250 after the first pass through the PBS 9220 and projector lens 9240 and the imaging at incoupling grating 9252 after the reflected light 9704 is reflected from SLM 9230 a second time.

FIG. 98 is a schematic diagram illustrating reflections from an in-coupling grating element, according to one embodiment. The eyepiece can include a cover glass 9810 and an incoupling grating 9820. Incoming light is illustrated as LHCP input light 9801. Although input light with circular polarization is illustrated, embodiments of the present disclosure are not limited to circularly polarized light and the input light can be elliptically polarized with predetermined major and minor axes. The reflections from the eyepiece can include a reflection 9803 from a front surface 9812 of the cover glass 9810 as well as a reflection 9805 from a back surface 9814 of the cover glass 9810. Additionally, reflection 9807 from the incoupling grating 9820 is illustrated. In this example, reflections 9803 and 9805 are RHCP and reflection 9807 is LHCP. The sum of these reflections results in a mixed polarization state propagating upstream toward the PBS 9220. Accordingly, in FIG. 97A, the reflection from incoupling grating 9250 is illustrated as A*s+B*p, but it will be evident to one of ordinary skill in the art that the polarization state of the reflected light is not limited to combinations of linear polarization, but can include elliptical polarizations as well. In particular, when diffractive elements of the incoupling grating 9250 include blazed grating features, the polarization state of the reflected light is characterized by complex elliptical polarizations. One of ordinary skill in the art would recognize many variations, modifications, and alternatives.

FIG. 99A is a schematic diagram illustrating a projector assembly with artifact prevention, also referred to as ghost image prevention, according to one embodiment. The projector assembly illustrated in FIG. 99A shares some common elements with the projector assembly illustrated in FIG. 92A and the description provided in FIG. 92A is applicable to the projector assembly in FIG. 99A as appropriate.

As described above, light from the projector assembly creates an image at the image plane, for example, the incoupling grating of the eyepiece, where the eyepiece is positioned. Some of the light from the projector assembly can be reflected from the elements of the eyepiece including the incoupling grating and return upstream towards the projector assembly. If the reflected light is not blocked, it could travel to and reflect off the display panel, resulting in artifacts or ghost images that are produced in the eyepiece. To prevent or reduce the intensity of these ghost images, embodiments of the present disclosure block most or all of the reflected light and prevent most or all of the reflected light from impinging on the display panel.

The projector assembly with artifact prevention 9900 includes an illumination source 9910, which can be a collimated set of light beams. The illumination source 9910 can emit polarized, unpolarized, or partially polarized light. In the illustrated embodiment, the illumination source 9910 emits light polarized with a p-polarization. A first optical element 9915 (e.g., a pre-polarizer) is aligned to pass light with p-polarization to a polarizing beam splitter (PBS) 9920. Initially, light passes through the interface 9922 of the PBS 9920 and impinges on spatial light modulator (SLM) 9930. After reflection from the SLM 9930 and changing of the polarization to the s-polarization, the reflected light is reflected from interface 9922 and exits the PBS 9920. The emitted light passes through projector lens 9940 and is imaged onto an incoupling grating 9950 of the eyepiece (not shown).

A portion of the incident light will reflect off of the incoupling grating 9950 and propagate back toward the projector assembly as illustrated by reflected ray 9902. The projector assembly with artifact prevention includes an artifact prevention element 9960 that attenuates and preferably prevents reflections from the incoupling grating 9950 returning to the projector assembly. As illustrated in FIG. 99A, reflections from the incoupling grating 9950 pass through the artifact prevention element 9960 in the downstream path, but are attenuated or blocked in the upstream path. Additional description related to the artifact prevention element 9960 is described in relation to FIGS. 101 and 102.

FIG. 99B is a flowchart illustrating a method 9951 of reducing artifacts in an optical system, according to one embodiment. The method 9951 includes injecting a light beam generated by an illumination source into a polarizing beam splitter (PBS) (9952) and reflecting a spatially defined portion of the light beam from a display panel (9954). The method (9951) also includes reflecting, at an interface in the PBS, the spatially defined portion of the light beam towards a projector lens (9956) and passing at least a portion of the spatially defined portion of the light beam through projector lens (9958).

The method (9951) further includes forming an image, by the projector lens, at an incoupling grating of an eyepiece (9960) and reflecting, by the incoupling grating of the eyepiece, a return portion of the spatially defined portion of the light beam (9962). In some embodiments, one or more layers of the eyepiece can reflect a return portion of the spatially defined portion of the light beam at varying intensities. The light reflected from the one or more layers of the eyepiece is generally a lower intensity than the return portion of the spatially defined portion of the light beam reflected by the incoupling grating of the eyepiece. and attenuating, at an artifact prevention element, the return portion of the spatially defined portion of the light beam (9964). Forming the image can include passing at least a portion of the spatially defined portion of the light beam downstream through the artifact prevention element. In one embodiment, the artifact prevention element is disposed between the projector lens and the incoupling grating.

The artifact prevention element can include a first quarter waveplate, a linear polarizer disposed adjacent the first quarter waveplate, a second quarter waveplate disposed adjacent the linear polarizer, and a color select component disposed adjacent the second quarter waveplate. As an example, the first quarter waveplate can include an achromatic quarter waveplate operable to convert the spatially defined portion of the light beam to linearly polarized light. Moreover, the linear polarizer can pass the linearly polarized light downstream to the second quarter waveplate.

In an embodiment, the second quarter waveplate is operable to convert the linearly polarized light to elliptically polarized light. The color select component can be operable to convert the elliptically polarized light to wavelength dependent elliptically polarized light. For example, the return portion of the spatially defined portion of the light beam can impinge on the color select component. In this case, the color select component is operable to convert the return portion of the spatially defined portion of the light beam to an elliptically polarized return portion. The second quarter waveplate can be operable to convert the elliptically polarized return portion to a linearly polarized return portion. In this case, the linear polarizer attenuates the linear polarized return portion that is perpendicular to a defined polarization.

In some embodiments, the artifact prevention element may not include the first quarter waveplate, but may include the linear polarizer, the second quarter waveplate disposed adjacent the linear polarizer, and the color select component disposed adjacent the second quarter waveplate.

It should be appreciated that the specific steps illustrated in FIG. 99B provide a particular method of reducing artifacts in an optical system, according to one embodiment. Other sequences of steps may also be performed according to alternative embodiments. For example, alternative embodiments of the present disclosure may perform the steps outlined above in a different order. Moreover, the individual steps illustrated in FIG. 99B may include multiple sub-steps that may be performed in various sequences as appropriate to the individual step. Furthermore, additional steps may be added or removed depending on the particular applications. One of ordinary skill in the art would recognize many variations, modifications, and alternatives.

In some embodiments, the eyepiece includes an incoupling grating for each sub-pupil, which are each associated with the spatially dispersed light sources illustrated in FIGS. 90A-90C. In some implementations, the incoupling grating can be metalized, which can result in reflections back toward the projection display assembly. Additionally, reflections from surfaces within the multi-layer eyepiece can contribute to back reflections.

The integration of the separated sub-pupil illumination system with the PBS-based projector assembly enables a compact design that is smaller and lighter than conventional designs. Thus, the PBS-based projector assembly provided by embodiments of the present disclosure utilizes a compact design that is suitable for integration into a wearable device.

In embodiments in which emissive display panels are utilized, for example, an OLED display panel, dielectric filters can be utilized on the waveguides to select the color appropriate for a given waveguide. As an example, emission from the OLED display would be imaged on the waveguides, with light for each waveguide passing through the filter into the waveguide whereas wavelengths associated with other waveguides would be reflected.

In some embodiments, foveated displays in which the image resolution varies across the image, are utilized as the display plane. Additional description related to foveated displays is provided in U.S. Patent Application Publication No. 2014/0218468, the disclosure of which is hereby incorporated by reference in its entirety for all purposes.

According to embodiments of the present disclosure, content can be rendered at a desired depth plane and also at a desired resolution. As an example, peripheral portions of the image can be displayed at lower (or higher) resolution and in the near depth plane while central portions of the image can be displayed at higher (or lower) resolution and in the farther depth plane, emphasizing the clarity of the higher resolution central (or peripheral) portion. Thus, embodiments provide improvements over foveated displays that have differing resolution in only a single plane since they can provide foveated images in three dimensions. Because embodiments described herein utilize multiple depth planes to represent a scene, a foveated display can provide a foveated image at each depth plane, resulting in three dimensional foveation that is not available using a foveated image in a single plane.

Embodiments of the present disclosure provide very fast switching speeds, for example, 720 Hz field rate update, which significantly reduces or eliminates color breakup effects. As an example, the display enables up to two simultaneous depth planes at a 120 Hz frame rate and three depth planes at an 80 Hz frame rate. In other embodiments, additional depth planes at these rates or higher or lower rates can be implemented. Additionally, embodiments of the present disclosure provide depth blending and support for 64 virtual depth planes. In other embodiments, more than or less than 64 virtual depth planes can be implemented. Both linear and nonlinear blending modes are supported as well as adjustments via a look up table. In addition to depth blending, scaler support is provided including scale adjustment for depth plane distortion/magnification changes due to optics.

In relation to horizontal/vertical shift support, embodiments described herein enable H/V shift support per layer and per frame, allowing for changes due to parallax effects in head movements and corneal positions. Additionally, embodiments provide lens distortion correction per color and per layer. First row frame updating allows changes of display data and parameters per frame on the first row as well as for the communication of time stamp information. Moreover, vertical synchronization visibility is provided, allowing for round trip measurements and photon to photon measurements.

FIG. 100 illustrates reflection of light at an incoupling grating of an eyepiece in absence of a reflection prevention element. For an eyepiece with waveguides including incoupling gratings, some of the light directed to the incoupling grating will be launched into the waveguide and some of the light will be reflected (e.g., specularly reflected). Depending on the design, fabrication, and manufacturing sensitivities of the grating in the incoupling grating, the reflected light may not perfectly reverse the handedness of the light. In some cases, it may not modify the handedness at all. Thus, if a number of elements are present in a stack of waveguides and diffractive elements, the light reflected back to the projector may include a set of mixed polarization states.

Referring to FIG. 100, circularly polarized light (e.g., RHCP) 10010 reflects from an incoupling grating 10005 of an eyepiece and is characterized by rotated elliptical return states. If the incoupling grating 10005 is attached to a waveguide, there may be a mix of states (from the incoupling grating 10005 and the waveguide) and there may be a state within the mix of states that dominates. In this example considering only reflections from the incoupling grating 10005, reflected light 10020 of a first wavelength may have a left handed elliptical polarization state that has a major axis that is tilted with a negative slope. Reflected light 10030 of a second wavelength may have a left handed elliptical polarization state that has a major axis that is tilted with a positive slope. Accordingly, the eigenvalues of the incoupling grating 10005 define the transformation of the input light into different predetermined elliptical polarization states that are a function of wavelength.

Thus, embodiments of the present disclosure address the impact that the eigenvalues of grating structure of the incoupling grating 10005, for example, blazed gratings, have on the polarization state of reflected light. In contrast with a planar reflective surface, which merely flips the handedness of input light, blazed gratings convert input light at different wavelengths into predetermined elliptical polarization states as illustrated in FIG. 100. As discussed in relation to FIG. 98, the reflections from the eyepiece, because of the various optical elements making up the eyepiece, as well as the characteristics of the ICG, including the utilization of blazed gratings, the polarization of the reflected light is not easily characterized. Rather, the polarization state of the reflected light can be characterized by complex elliptical polarizations.

FIG. 101A illustrates blocking of reflections using an artifact prevention element according to one embodiment. Light impinges on an artifact prevention element 10100. In one embodiment, there may be a circular polarizer (e.g., the circular polarizer 9510) between a PBS (e.g., the PBS 9220) and a projector lens (e.g., projector lens 9240). In this embodiment, the light that impinges on the artifact prevention element 10100 is circularly polarized, as depicted in FIG. 101A. As circularly polarized light 10010 impinges on the artifact prevention element 10100, an achromatic quarter waveplate 10112 converts the circularly polarized light 10010 to linearly polarized light 10011. The achromatic quarter waveplate 10112 converts all colors into linearly polarized light 10111 to achieve high transmission efficiency through a linear polarizer 10114. In another embodiment, there may be no circular polarizer (e.g., the circular polarizer 9510) between the PBS (e.g., the PBS 9220) and the projector lens (e.g., projector lens 9240). In this embodiment, the light that impinges on the artifact prevention element 10100 is linearly polarized and the artifact prevention element 10100 does not include an achromatic quarter waveplate 10112. The linearly polarized light 10111 passes through the linear polarizer 10114 and is converted to elliptically polarized light 10118 by a second quarter waveplate 10116. The second quarter waveplate 10116, which is not necessarily achromatic, outputs the elliptically polarized light 10118 with a predetermined elliptical polarization. A color select component 10122 converts the various wavelength specific components of elliptically polarized light 10118 to different elliptical polarization states as the color select component 10122 rotates the polarization as a function of the wavelength. In other words, the color select component 10122 retards the phase by varying amounts as a function of wavelength. For example, the color select component 10122 rotates a polarization state of a first color band by 90 degrees while a complementary second color band retains its input polarization state. An exemplary color select component is a color selective rotator.

As illustrated in FIG. 101A, light at a first wavelength 10130 is converted from elliptically polarized light 10118 to right handed elliptically polarized light with a negative slope major axis. Light at a second wavelength 10140 is converted from elliptically polarized light 10118 to right handed elliptically polarized light with a slightly positive slope major axis. After reflection from incoupling grating 10005, light at the first wavelength 10130 is left handed elliptically polarized with a positive slope major axis (10132) and light at the second wavelength 10140 is left landed elliptically polarized with a slightly negative major axis (10142).

Given the eigenvalues of the incoupling grating 10005, the conversion from the polarization state of 10130 to 10132 is determined. Accordingly, the properties of the color select component 10122 are determined to provide the desired polarization state 10130 given the elliptically polarized light 10118. The color select component 10122 provides a predetermined conversion from elliptically polarized light 10118 to light at the first/second wavelength 10130/10140 such that, given the eigenvalues of the incoupling grating 10005 and the transformation resulting from reflection from the incoupling grating 10005, the reflected polarization states (for each color) will be converted to elliptically polarized light 10120 that matches elliptically polarized light 10118, but with the opposite handedness.

After passing through the color select component 10122, light at both wavelengths are converted to left hand circularly polarized light elliptically polarized light 10120 that is matched (other than handedness) with elliptically polarized light 10118. The second quarter waveplate 10116 converts elliptically polarized light 10120 to linearly polarized light 10113 that is rotated orthogonally with respect to linearly polarized light 10111 and is therefore blocked by linear polarizer 10114.

Although specific handedness and rotation angles of the major axes of the ellipses has been discussed in relation to FIG. 101A for purposes of explanation, embodiments of the present disclosure are not limited to these particular implementations and other handedness and elliptical characteristics are included within the scope of the present disclosure. Additionally, although only two colors are illustrated, embodiments are applicable to three or more colors as appropriate to the particular application. One of ordinary skill in the art would recognize many variations, modifications, and alternatives.

In other words, after reflection from the eyepiece, specifically, the incoupling grating 10005, the light passes through the color select component 10122 and is converted back to linearly polarized light by the second quarter waveplate 10116. Because the handedness is rotated on reflection, the linearly polarized light is rotated on the upstream pass and is blocked by the linear polarizer 10114, thereby preventing ghost images on the display panel.

FIG. 101B is a flowchart illustrating a method 10150 of reducing artifacts in an optical system according to one embodiment. The method 10150 includes injecting a light beam generated by an illumination source into a polarizing beam splitter (PBS) (10152) and reflecting a spatially defined portion of the light beam from a display panel (10154). The method 10150 also includes reflecting, at an interface in the PBS, the spatially defined portion of the light beam towards a projector lens (10156) and passing at least a portion of the spatially defined portion of the light beam through the projector lens (10158).

The method 10150 further includes forming an image, by the projector lens, of at an incoupling grating of an eyepiece (10160) and reflecting, by the incoupling grating of the eyepiece, a return portion of the spatially defined portion of the light beam (10162). The method 10150 also includes passing, by a first optical element, the return portion of the spatially defined portion of the light beam to a second optical element (10164). The first optical element is operable to convert the return portion to a first polarization (e.g., a circular polarization). The first optical element can include a color select component. The method 10150 further includes passing, by the second optical element, the return portion of the spatially defined portion of the light beam to a third optical element (10166). The second optical element is operable to convert the return portion to a second polarization (e.g., a linear polarization). Additionally, the method 10150 includes attenuating, at the third optical element, the return portion of the spatially defined portion of the light beam associated with the second polarization (10168).

It should be appreciated that the specific steps illustrated in FIG. 101B provide a particular method of reducing artifacts in an optical system, according to one embodiment. Other sequences of steps may also be performed according to alternative embodiments. For example, alternative embodiments of the present disclosure may perform the steps outlined above in a different order. Moreover, the individual steps illustrated in FIG. 101B may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 102 illustrates blocking of reflections using an artifact prevention element 10200, according to another embodiment. In this implementation, the positions of the second quarter waveplate 10116 and the color select component 10122 are switched in a manner analogous to a linear system in which the order of operations can be interchanged. The color select component 10122 converts linearly polarized light 10111 to different linear polarizations 10210 and 10220 as a function of wavelength. The second quarter waveplate 10116 then converts these different linear polarizations into desired polarization states 10130/10140 as discussed in relation to FIG. 101A. The second quarter waveplate 10116 converts reflected elliptically polarized light at different wavelengths into linearly polarized light 10212/10222 that is rotated orthogonally to linearly polarized light 10210/10220. As illustrated, a similar result is achieved as discussed in relation to FIG. 101A, with reflected light blocked by the linear polarizer 10114.

FIG. 103 is a schematic diagram of a projector assembly with multiple artifact prevention elements, according to one embodiment. A circular polarizer 10320, which in this embodiment includes a linear polarizer 10321 and an achromatic waveplate 10323, is positioned between a PBS 10310 and a projector lens 10330 to block or reduce reflections from the projector lens 10330. The circular polarizer 10320 illustrated in FIG. 103 may also block or reduce reflections from the incoupling grating 10352. In an alternative embodiment, the circular polarizer 10320 is positioned between the projector lens 10330 and the eyepiece 10350 to block or reduce reflections from the incoupling grating 10352. The alternative embodiment may be used if the projector lens 10330 has a sufficient anti-reflective coating.

Additionally, a second artifact prevention element 10360 is positioned adjacent an eyepiece 10350, specifically, an incoupling grating 10352 of the eyepiece 10350. The second artifact prevention element 10360 blocks or reduces reflections from the incoupling grating 10352. The second artifact prevention element 10360 includes an achromatic quarter waveplate 10361, a linear polarizer 10363, a second quarter waveplate 10365, and a color select component 10367 as discussed in relation to FIG. 101A that is matched to the color associated with the particular incoupling grating 10352 and associated waveguide (not shown).

FIG. 104A is a schematic diagram illustrating a projector assembly with artifact prevention using color filters, according to one embodiment. The projector assembly illustrated in FIG. 104A shares some common elements with the projector assembly illustrated in FIG. 99A and the description provided in FIG. 99A is applicable to the projector assembly in FIG. 104A as appropriate.

The projector assembly with artifact prevention 10400 includes an illumination source 9910, which can be a collimated set of light beams. The illumination source 9910 can emit polarized, unpolarized, or partially polarized light. In the illustrated embodiment, the illumination source 9910 emits light polarized with a p-polarization. A first optical element 9915 (e.g., a pre-polarizer) is aligned to pass light with p-polarization to a polarizing beam splitter (PBS) 9920. Initially, light passes through the interface 9922 of the PBS 9920 and impinges on spatial light modulator (SLM) 9930. After reflection from the SLM 9930 and changing of the polarization to the s-polarization, the reflected light is reflected from interface 9922 and exits the PBS 9920. The emitted light passes through projector lens 9940 and is imaged onto incoupling grating 9950 of the eyepiece (not shown).

A set of retarder stack film (RSF) filters 10410, 10412 are disposed adjacent the incoupling grating 9950 and incoupling grating 9960, respectively. RSF filters 10410 and 10412 include multiple layers of polymer film placed between polarizers, providing spectral properties including varying transmission as a function of wavelength. Additional discussion of RSF filters is provided in relation to FIG. 104C.

As illustrated in FIG. 104D, the RSF filters can be a split filter with a first region passing a first set of wavelengths and a second region passing a second set of wavelengths. In the downstream path, light directed toward incoupling grating 9950 passes through the RSF filters 10410 and impinges on the incoupling grating 9950.

A portion of the incident light will reflect off of the incoupling grating 9950 and propagate back toward the projector assembly. As illustrated in FIG. 104A, although the light incident on the incoupling grating 9950 can be in a single polarization (e.g., s-polarization), the light reflected from the incoupling grating 9950 can have a mixture of polarizations (A*s+B*p) 10402, where A and B are coefficients between zero and one. The reflected light passes through projector lens 9940 and emerges with a mixture of polarizations (C*s+D*p) 10404 as it propagates back toward the PBS 9920, where C and D are coefficients between zero and one. Generally, A>C and B>D as a result of the characteristics of projector lens 9940.

Light in the upstream path that is properly aligned with the polarization of interface (C*s) 10406 reflects from interface 9922, SLM 9930, interface 9922, passes through projector lens 9940. In the absence of RSF filters 10410, 10412, the light (E*s) 10408 passing through projector lens 9940 would be imaged at a second incoupling grating 9960 of the eyepiece. However, the presence of the RSF filters 10412 attenuates or eliminates the image at the second incoupling grating 10452, thereby reducing or preventing formation if the artifact or ghost image.

FIG. 104B is an unfolded schematic diagram illustrating the projector assembly shown in FIG. 104A. Light from the illumination source 9910 is collimated by the first optical element 9915, propagates through the PBS 9920, reflects off the SLM 9930, makes another pass through the PBS 9920, reflects off interface 9922 (not shown), and passes through projector lens 9940. The light in the downstream path passes through RSF filter 10410, and is imaged at the incoupling grating 9950.

Reflected light passes through the RSF filter 10410, passes through projector lens 9940, passes through to into the PBS 9920, reflects off the interface 9922 (not shown), and reflects off the SLM 9930. The light passes through to into the PBS 9920, reflects off the interface 9922, propagates in the downstream path through projector lens 9940 and is blocked or attenuated by the RSF filters 10412.

FIG. 104C is a transmission plot for cyan and magenta color filters, according to one embodiment. Transmission values for the cyan filter 10410 are high, for example near 100% or 100% for blue and green wavelengths and decreases, for example, to near zero or zero for red wavelengths. In contrast, the transmission values for the magenta filter 10412 are high, for example near 100% or 100% for blue wavelengths, decrease, for example, to near zero or zero for green wavelengths, and are high, for example near 100% or 100% for red wavelengths.

FIG. 104D is a schematic diagram illustrating spatial arrangement of color filters and sub-pupils, according to one embodiment. As illustrated in FIG. 104D, light intended for a green incoupling grating 10470 will appear as an artifact at a red incoupling grating 10472, which is disposed opposite the green incoupling grating 10470 with respect to the optical axis. Similarly, light intended for a green incoupling grating 10474 will appear as an artifact at a red incoupling grating 10476, which is disposed opposite the green incoupling grating 10474 with respect to the optical axis. Light intended for the green incoupling grating 10470 will pass through the cyan filter 10410 during the initial pass from the projector lens to the eyepiece since the cyan filter 10410 has high transmission for green wavelengths. However, the artifact will be blocked or attenuated by the magenta filter 10412, which has low transmission for green wavelengths. Accordingly, light intended for green incoupling grating 10470 will be passed, but the associated artifact that would impinge on red incoupling grating 10472 will be blocked or attenuated. Similar arguments apply for the pair including green incoupling grating 10474 and red incoupling grating 10476.

Considering the light intended for red incoupling grating 10472, the magenta filter 10412 will pass the intended light while the artifact will be blocked by cyan filter 10410. Embodiments of the present disclosure utilizing RSF filters reduce reflections since they utilize an absorptive process and enable the customization of cutoff wavelengths for improved color balance and increased throughput. Moreover, some embodiments preserve the polarization of the light delivered to the incoupling grating, which is preferably linearly polarized in order to maximize coupling of light into the incoupling grating. In some embodiments, the six sub-pupils in FIG. 104D (red incoupling grating 10476 and 10472, green incoupling 10470 and 10474, and blue incoupling grating 10480 and 10482) can be located on or near the same plane, for example, incoupling grating plane 10484. The incoupling grating plane can be located on a plane at the eyepiece. The RSF filters, cyan filter 10410 and magenta filter 10412, can be located on a plane between the projector lens and the incoupling grating plane 10484.

FIG. 104E is a flowchart illustrating a method 10450 of reducing artifacts in an optical system, according to one embodiment. The method 10450 includes injecting a light beam generated by an illumination source into a polarizing beam splitter (PBS) (10452) and reflecting a spatially defined portion of the light beam from a display panel (10454). The method 10450 also includes reflecting, at an interface in the PBS, the spatially defined portion of the light beam towards a projector lens (10456) and passing at least a portion of the spatially defined portion of the light beam through the projector lens (10458).

The method 10450 further includes passing at least a portion of the spatially defined portion of the light beam through a first region of an RSF filter (10460) and forming an image, by the projector lens, at an incoupling grating of an eyepiece (10462) and reflecting, by the incoupling grating of the eyepiece, a return portion of the spatially defined portion of the light beam (10464). The method 10450 also includes attenuating at least a portion of the return portion at a second region of the RSF filter (10468).

It should be appreciated that the specific steps illustrated in FIG. 104E provide a particular method of reducing artifacts in an optical system, according to one embodiment. Other sequences of steps may also be performed according to alternative embodiments. For example, alternative embodiments of the present disclosure may perform the steps outlined above in a different order. Moreover, the individual steps illustrated in FIG. 104E may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 105 is a schematic diagram illustrating a color filter system 10500, according to one embodiment. As illustrated in FIG. 105, the color filter system 10500 includes a cover glass 10510, which can include an anti-reflection coating, a linear polarizer 10512, a dual color RSF filter 10410/10412, and a dual polarizer 10516. The linear polarizer 10512 is aligned to pass a first polarization, for example, s-polarized light as received from the PBS 9920 and lens 9940. The dual color filter 10514 is described in additional detail with respect to FIGS. 104C and 104D. The dual polarizer 10516 includes a first region 10517 and second region 10518. First region 10517 is disposed adjacent cyan filter 10410 and passes light in the first polarization (e.g., s-polarized light). The second region 10518 is disposed adjacent magenta filter 10412 and passes light in a second polarization orthogonal to the first polarization (e.g., p-polarized light). As illustrated in FIG. 105, light passing through the cyan filter 10410 will also pass through the first region 10517 in order to reach the green incoupling gratings 10470, 10474, and blue incoupling grating 10480. Light passing through the magenta filter 10412 will also pass through the second region 10518 in order to reach the red incoupling gratings 10472, 10476 and blue incoupling grating 10482.

In some embodiments, for example, as illustrated in FIGS. 89 and 90, a multi-pupil system in which the sub-pupils are spatially separated both laterally (e.g., in x, y directions) as well as longitudinally (e.g., in the z-direction) is utilized. In other embodiments, as illustrated in FIG. 109, a single pupil system is utilized. FIG. 109 is a schematic diagram illustrating a single pupil system including a projector assembly and eyepiece, according to one embodiment. An artifact prevention element 10100 is illustrated as disposed between projector lens 10930 and eyepiece 10910.

As illustrated in FIG. 109, the pupils are overlapped laterally (e.g., in the x, y directions) and are only spatially separated longitudinally (e.g., in the z-direction). The projector lens 10930 directs light toward the eyepiece 10910, which includes, in this example, three waveguide layers 10920, 10922, and 10924 for red, green, and blue wavelengths, respectively. It will be appreciated that other orders are included within the scope of the present disclosure, including green, blue, red. One of ordinary skill in the art would recognize many variations, modifications, and alternatives. Incoupling gratings for each waveguide layer overlap in the directions parallel to the plane of the waveguide, resulting in a single pupil system. As will be evident to one of skill in the art, the focusing of the light as it moves through the waveguides is not to scale.

Thus, embodiments of the present disclosure discussed herein are suitable for use with both multi-pupil and single pupil systems. In embodiments in which the pupils are overlapped laterally, the artifact prevention systems described herein will reduce or eliminate artifacts for these single pupil systems as light propagates through the optical system toward the eyepiece. As a result, embodiments of the present disclosure are applicable to both single pupil and multi-pupil systems.

Although embodiments of the present disclosure have been described in relation to projection display systems utilizing a display panel, embodiments of the present disclosure are not limited to these particular projection display systems and are applicable to fiber scanning systems that utilize a fiber scanner as a component of the projector. One of ordinary skill in the art would recognize many variations, modifications, and alternatives.

In some embodiments, collection efficiency with which light emitted by the light sources (e.g., LED sources) is collected and utilized by the projector assembly can be impacted by the design of light sources. In particular, for some LED light sources, it is beneficial to place collimating optics as close to the emission plane of an LED light source as possible.

FIG. 106 is a schematic diagram illustrating a wire bonded LED, according to one embodiment. A wire bonded LED package 10600 includes a sapphire substrate 10610, which can be integrated with a metal reflector 10620. A GaN LED 10630 is provided with a transparent electrode 10640 over a portion of an emission surface and wire bonds 10650 are attached to bonding pads 10660 over another portion. Heat dissipation 10670 through the sapphire substrate 10610 and light emission 10690 through the transparent electrode 10640 are illustrated. A portion of the light emitted by the LED impinges on and is blocked 10680 by the wire bond 10650 and/or the bonding pad 10660 to which the wire bond is bonded, creating a non-uniform illumination pattern as the wire bond obscures the illumination surface. In addition to non-uniform illumination, a wire bonded structure can present reliability issues associated with the potential motion/vibration of the wire bond in response to movement of the projector assembly. Additionally, environment degradation is presented as an issue. Although encapsulation of the wire bond could deter motion/vibration, it can also adversely impact the intensity of the light emitted.

FIG. 107 is a schematic diagram illustrating a flip-chip bonded LED 10700, according to one embodiment. In this implementation, a GaN LED 10710 is disposed on a reflective structure 10720, which can be a silver reflector, and sealed with a sapphire cap 10730. Heat dissipation 10740 through the substrate 10750 and light emission through the sapphire cap 10730 are illustrated. In contrast with wire bonded structures, the flip chip geometry enables optics, including collimating or beam shaping optics such as a Compound Parabolic Concentrator (CPC) to be placed more closely to the emission surface, thereby increasing light collection efficiency and system brightness. Flip-chip LEDs mounted as illustrated in FIG. 107 are suitable for use as the displaced light sources illustrated in FIG. 88.

FIG. 108 is a schematic diagram illustrating an LED integrated with a parabolic beam expander according to an embodiment described herein. As shown in FIG. 108, a flip-chip bonded LED 10810 is positioned at the entrance aperture 10822 of a CPC 10820 utilized in a beam expander configuration. Light from the LED is characterized by a diverging beam profile, which is collected and expanded by the CPC 10820. Accordingly, the use of the CPC 10820 in conjunction with the flip-chip LED design illustrated in FIG. 107 improves the light emission efficiency of the LED as a result of the removal of the wire bond and the ability to position the CPC at a position closer to the emission surface of the LED package.

FIGS. 110A-110B show perspective views of an optical device 11000. FIG. 110A shows optical device 11000 in a fully assembled state. Optical device 11000 defines two opening within which two eyepieces 11001 can be held in precise registration with respect to one another and other components of optical device 11000. To accomplish this, a rigid internal frame is utilized to maintain the precise registration. The internal frame can then be coupled to a more flexible front band 11004 that facilitates securing optical device 11000 to a user's head.

FIG. 110B shows an exploded view of select components of optical device 11000. One of skill in the art will appreciate additional components and/or alternate locations of any particular component are of course possible, but not necessary to depict for purposes of understanding the invention. Optical device 11000 is depicted having arms 11002 that are configured to extend past the ears of the user and wrap at least partially around the head of the user. It should be appreciated that in some embodiments, an optical device similar to optical device 11000 could have more conventional arms or temples 11002. As depicted, arms 11002 cooperate with front band 11004 to secure optical device 11000 to the head of the user. Front band 11004 can be formed of a material capable of deforming so that front band 11004 is able to at least partially conform to the face of the user without deforming optics frame 11008. A heat spreader 11006 can be used to create a robust thermal interface between front band 11004 and optics frame 11008. Heat spreader 11006 can establish a robust thermally conductive pathway for transferring heat generated by electronic components mounted to optics frame 11008 to front band 11004. In this way, front band 11004, which can be formed from an aluminum alloy, can act as a heat sink for receiving heat generated by at least some of the electrical components of optical device 11000.

FIG. 110B also depicts projectors 11010 and their position relative to optics frame 11008, though other configurations of projectors 11010 are possible. For example, projector 11010 could be positioned between eyepieces 11001. Optics frame 11008 can be made from a material much stronger and with a higher elastic modulus than the material used to form the more flexible front band 11004, such that in some embodiments external factors may deform front band 11004 without deforming optics frame 11008. In such embodiments, front band 11004 can be characterized as absorbing these external factors such as temperature effects or load effects to preserve the material status of optics frame 11008 and the stability of the components it houses. For example, front band 11004 can be formed from a machined aluminum alloy, while optics frame 11008 can be formed from magnesium or titanium alloys. In some embodiments, front band 11004 can be coupled to both arms 11002 and attached to a central region of optics frame 11008. For this reason, any symmetric forces applied to front band 11004 or arms 11002 can result in little or no deformation of optics frame 11008. This configuration essentially allows optics frame 11008 to float within and be protected by front band 11004 and arms 11002.

The exploded view of FIG. 110B also shows projectors 11010, which are secured to optics frame 11008 and configured to project an image through each of the eye openings occupied by eyepieces 11001. A sensor cover 11012 can be coupled with optics frame 11008 and configured to cover sensors distributed around or adjacent to viewing optics 11012. Sensor cover 11012 can be constructed from a different type of material than front band 11004. In some embodiments, sensor cover 11012 can be formed from a polymer or another material with a low thermal coefficient of expansion unlikely to undergo substantial deformation from any heat received from optics frame 11008. In some embodiments, sensor cover 11012 can be physically separated by a gap from front band 11004 to avoid overheating sensor cover 11012. While the remaining figures will each illustrate multi-frame embodiments, it should be noted that embodiments with a unitary frame are also possible. Instead of having a deformable front band, rigid optics frame 11008 can be flexibly coupled to a pair of arms. The arms can be hinged and/or include springs and/or rails for moving the arms farther back on the head of a user without bending the rigid optics frame. In this way, distortion of the unitary frame can be avoided without utilizing a separate front band.

FIG. 110C shows a perspective view of optics frame 11008 with multiple electronic components attached thereto. The electronic components include a central printed circuit board (PCB) 11014, which is affixed to a bridge region of optics frame 11008. In some embodiments, central PCB 11014 can include one or more processors configured to execute instructions for operating optical device 11000. For example, the processor(s) can be configured to provide instructions to projectors 11010. Many other electronic devices can also be coupled to optics frame 11008. Sensors in particular can benefit from being coupled to optics frame 11008 on account of the rigidity of optics frame 11008 being able to maintain the position of the sensors in precise alignment with other sensors or eyepieces 11001 during operation of optical device 11000. The sensors can include but are not limited to a depth sensor 11016, front-facing world cameras 11018, lateral-facing world cameras 11020 and a photo camera 11022. In some embodiments, a world camera is an outward-looking video camera configured to help characterize the area around a user of optical device 11000 so that augmented reality imagery projected through eyepieces 11001 can be more realistically displayed and in some cases interact with the real world around it. Consequently, any misalignment of the sensors characterizing the outside world can result in the augmented reality imagery projected by projectors 11010 being noticeably shifted out of place with respect to corresponding real-world objects. Furthermore, any changes in pitch, yaw or roll of eyepieces 11001 with respect to each other during use can seriously degrade binocular calibration, resulting in serious imaging problems.

In some embodiments, various temperature sensors and strain sensors can be distributed across optics frame 11008, front band 11004 and/or arms 11002. The temperature and strain sensors can be configured to carryout multiple functions. For example, the temperature sensors can be configured to trigger a warning when optical device 11000 exceeds predetermined temperature comfort levels. Additionally, both the strain sensors and temperature sensors can be configured to determine when one or more of the sensors is shifted out of alignment. For example, a processor aboard PCB 11014 can include a table indicating how much thermal expansion or contraction to expect for a given temperature change. In some embodiments, when temperature or strain readings do indicate an out of alignment condition, projectors 11010 can be directed to adjust the signal output or in some cases temporarily recalibrate optical device 11000 to accommodate the shift.

One common scenario in which a large change in temperature generally occurs is during startup of the wearable device after it has been out of use long enough to cool to room temperature. One way to account for the large temperature change is to configure the projector to shift its content to accommodate the output of the projector to account for the substantially cooler temperatures present in the frame during startup and before the electronics have the chance to raise a temperature of the device to a steady state temperature associated with normal operation. In some embodiments, the temperature change at startup can be large enough to cause deformation of the rigid frame resulting in an alignment problem between the projectors and the rigid frame. Because the regions of the rigid frame to which the projectors are affixed can include input coupling gratings associated with diffractive optics that reorient the light emitted by the projectors toward the eyes of the user, the resulting misalignment between the projectors and input coupling gratings can cause substantial distortion of the imagery being presented. Consequently, the content output of the projector can be shifted to account for the deformation. As the temperature approaches steady state, a temperature sensor sampling frequency can be reduced. In some embodiments, the temperature sensor sampling frequency could be increased when the wearable device is under heavy use or any time temperatures can be expected to increase above the normal steady state temperature of the wearable device.

Other electronic components are also depicted in FIG. 110C. For example, a number of circuit boards and flexible circuits are depicted extending from each side of optics frame 11008 and are arranged to fit within an interior volume defined by a respective one of arms 11002.

During use of optical device 11000, heat can be dissipated from PCB 11014 by heat spreader 11006, depicted in FIG. 110D. Heat spreader 11006 is capable of conducting the heat emitted by the various electronic devices coupled to optics frame 11008 to front band 11004. Heat spreader 11006 can be formed from sheets of material having particularly high thermal conductivity. In some embodiments, pyrolytic graphite sheets (PGS) can be used, which can be particularly effective at spreading heat given its excellent in-plane heat transfer characteristics. Other materials formed from high thermal conductivity materials are also possible. FIG. 110D also depicts sensor cover 11012, which includes various openings through which forward looking sensors can monitor objects in the user's line of site. For example, openings 11024 and 11026 can be configured to allow depth sensor 11016 and front-facing world camera 11018 to characterize the field of view in front of sensor cover 11012. When sensor cover 11012 is coupled directly to optics frame 11008, any thermally induced expansion or contraction of front band 11004, which is being used to receive a large portion of the heat generated by components mounted to optics frame 11008, can have minimal impact upon sensor cover 11012.

FIG. 110E shows a perspective view of optics frame 11008. Of particular interest, projectors 11010 are depicted in full view as well as eyepieces 11001. Eyepieces 11001 and projectors 11010 form at least a portion of a display assembly of optical device 11000. Eyepieces 11001 are configured to receive light from projectors 11010 and redirect the imagery emitted by projectors 11010 into the eyes of a user of optical device 11000.

FIGS. 111A-111D show how heat is spread out along optical device 11000. FIG. 111A shows a perspective view of a rear portion of projector 11010 and surrounding circuitry. In particular, one end of heat spreader 11102 is shown affixed to a rear-facing surface of projector 11010. Positioned in this way, heat spreader 11102 is configured to receive heat from a light source of projector 11010. Heat spreader 11102 can take the form of a pyrolytic graphite sheet that is routed beneath projector 11010 and then along an interior surface of a band or temple of optical device 11000 (see the description of FIG. 111C below). When heat spreader 11102 is formed of electrically conductive material, projector 11010 can be electrically insulated from heat spreader 11102 by an electrically insulating puck 11104. In some embodiments, electrically insulating puck 11104 can be formed from aluminum nitride or other electrically insulating materials with good thermal conductivity.

FIG. 111B shows another perspective view of a rear portion of projector 11010 and surrounding circuitry. In particular, a first end of a heat spreader 11106 is depicted and positioned to receive heat generated by a driver board positioned atop projector 11010 and also from the light source of projector 11010. The second end of heat spreader 11106 is then routed along an opposite side of an arm 11002 (not depicted) from heat spreader 11102. In this way, both interior and exterior sides of arm 11002 can be used in distributing heat generated by projector 11010. In this way arms 11002 can also function as heat sinks for receiving and distributing heat generated by optical device 11000.

FIG. 111C shows a perspective view of one side of optical device 11000. In particular, this view shows how heat spreader 11102 extends the length of arm. In this way, substantially the whole arm 11002 can act as a heat sink for absorbing heat generated by the components of optical device 11000, such as projector 11010.

FIG. 111D shows a front perspective view of optical device 11000. Conduction layer 11108 is shown overlaid upon a surface of PCB 11014 and is configured to transfer heat from various heat generating components distributed across PCB 11014 to heat spreader 11006, which as described above distributes heat across front band 11004. In some embodiments, front band 11004 and arms 11002 can be at least partially thermally isolated by rubber gaskets so that heat dissipation within the arms is limited primarily to heat received from projectors 11010 and front band 11004 is responsible for dissipating the rest of the heat generated by other electronic components of optical device 11000. It should be noted that as the rubber gaskets heat up, heat can be transferred more easily between arms 11002 and band 11004. In some embodiments, a heat-transferring pathway can be established between front band 11004 and arms 11002 by various heat transferring components. For example, a heat pipe or additional heat spreaders similar to heat spreader 11102 can be utilized to redistribute heat from portions of optical device 11000 subject to substantial amounts of heat loading. In some embodiments, the transfer of heat directly to arms 11002 can be preferable to shedding heat to front band 11004, particularly when arms 11002 include electrical components that are less susceptible to heat damage than those attached to optics frame 11008. The various heat transfer mechanisms discussed can be configured to dissipate about 7 W of total power output.

FIG. 111E-111G show perspective and side cross-sectional views of a heat dissipation system that utilizes forced convection as opposed to the passive convection illustrated in previous embodiments. FIG. 111E shows heat dissipation system 11150 configured to draw heat away from various heat generating components 11168 (see FIG. 111G) mounted on PCB 11014. Heat generating components 11162 can include, for example, an electronic component such as a logic chip and may be involved in computer vision or other high-demand, high-powered processes. To prevent overheating of heat generating components 11168, a first heat spreader 11152 can be thermally coupled to one or more of heat generating components 11168. In some embodiments, a thermal interface 11170 (see FIG. 111G), such as metal shield or thermal adhesive, may be disposed between heat generating components 11162 and first heat spreader 11152 to facilitate more efficient heat transfer. Other types of thermal interfaces or conduction layers known in the art may also be used and various thermal interfaces may be used in combination.

Heat from heat generating components 11162 moves across thermal interface 11164 into first heat spreader 11152 by conduction due to the presence of a temperature gradient over portions of heat dissipation system 11150. A heat pipe 11154 may be used to facilitate conduction of heat from first heat spreader 11152 toward second heat spreaders 11156 positioned at opposing ends of heat pipe 11154. Routing of heat from first heat spreader 11152 into heat pipe 11154 may occur by conduction when an exposed metal, or otherwise conductive material, portion of heat pipe 11154 is thermally coupled to first heat spreader 11152 by a thermal adhesive. Heat pipe 11154 can include an internal wicking structure that circulates a working fluid from the thermal interface between heat pipe 11154 and first heat spreader 11152 to the thermal interface between the ends of heat pipe 11154 where heat pipe 11154 interfaces with second heat spreaders 11156. Second heat spreaders 11156 may be similarly thermally coupled to heat pipe 11154 at the opposing ends of heat pipe 11154. Second heat spreaders 11156 may be thermally coupled to a heatsink or a forced convection device, such as fans 11158. In some embodiments, heat spreaders 11156 can include an array of cooling fins to increase the effective surface area across which fans 11158 force cooling air.

FIG. 111F shows a perspective view of heat dissipation system 11150 incorporated into a wearable device 11160. An interior-facing wall of headset arms 11102 have been removed to show simplified interior view within headset arms 11102. In some embodiments, as shown in FIG. 111F, cooling air 11162 can be pulled into headset arms 11102 through vents 11164 defined by headset arms 11102. Once cooling air 11162 convectively dissipates heat from second heat spreaders 11156, cooling air 11162 can travel to the end of headset arms 11102 when the ends of the headset arms include additional exit vents. In this way, a robust flow of air can be established through headset arms 11102 giving the heated cooling air a robust route by which to exit headset arms 11102. In other embodiments, vents 11160 may instead provide an exhaust route for heated air to exit headset arms 11102.

In some embodiments, heat pipe 11154 may be made of a flexible material, such as a polymer material. The flexible heat pipe material may be configured to absorb mechanical strain or vibration in the system so that minimal, or zero, loading is transferred to heat generating component 11162 or other components coupled to PCB 11014 or front band 11004. Heat pipe 11154 as shown has a flattened cross section; however, any other cross-sectional shape may be used to facilitate heat transfer and strain mitigation, such as circular, round, oval, or elongated. In some embodiments, the cross-sectional shape or size may be variable over portions of the heat pipe to achieve desired heat transfer characteristics.

Anchor points 11166, which can take the form of fastens, secure heat pipe 11154 to front band 11004 may be configured to accommodate flexing of heat pipe 11154. For example, it may be desired to minimize the number of anchor points 11166 to avoid over-constraining heat pipe 11154. Allowing heat pipe 11154 to flex in response to strain may reduce loads transferred to electrical components. In addition to the number of anchor points, the locations of the anchor points may be considered. For example, it may be advantageous to place an anchor point along heat pipe 11154 at a location where minimal flexure is likely to occur in response to anticipated frame loading conditions. It may also be advantageous to route heat pipe 11154 along the stiffest portions of the frame to further reduce moment loading to sensitive components on board the frame. Furthermore, service loops 11167, which take the form of U-shaped bends in heat pipe 11154 can be arranged to minimize any transmission of stress resulting from headset arms bending and flexing relative to front band 11004. It should be noted that while a dual fan embodiment distributing heat to both headset arms 11102 is depicted, it should be appreciated that in some embodiments, heat pipe 11156 could only extend to one of headset arms 11102.

FIG. 111G shows a side view of heat distribution system 11150 and in particular shows how heat pipe 11152 is in thermal contact with heat generating component 11168 and PCB 11014 by way of thermal interface 11170 and heat spreader 11152. In this way, heat pipe 11154 is able to efficiently offload heat from heat generating component(s) 11168, allowing higher performance of wearable device 11160.

FIG. 112A shows a cross-sectional view depicting the transfer of heat from PCB 11014 through conduction layer 11108 to heat spreader 11006. Conduction layer 11108 can be formed from a semi sealing material disposed within a polyethylene terephthalate (PET) pouch. The semi sealing material is a thermoplastic resin with very low contact thermal resistance that is capable of deforming to accommodate complex geometries. Conduction layer 11108 fills any gaps between heat spreader 11006 and PCB 11014 that would otherwise result due to the varied height of different electrical components mounted to PCB 11014. In this way, heat conduction layer 11108 creates a robust heat transfer pathway for efficiently removing heat from each of the chips mounted to PCB 11014 and PCB 11014 itself. FIG. 112A also shows how the surface of conduction layer 11108 defines regions for accommodating the various shapes of electronic components arranged along PCB 11014. FIG. 112B shows material properties of various thickness of one particular type of conduction layer 11108.

Figure 113A:
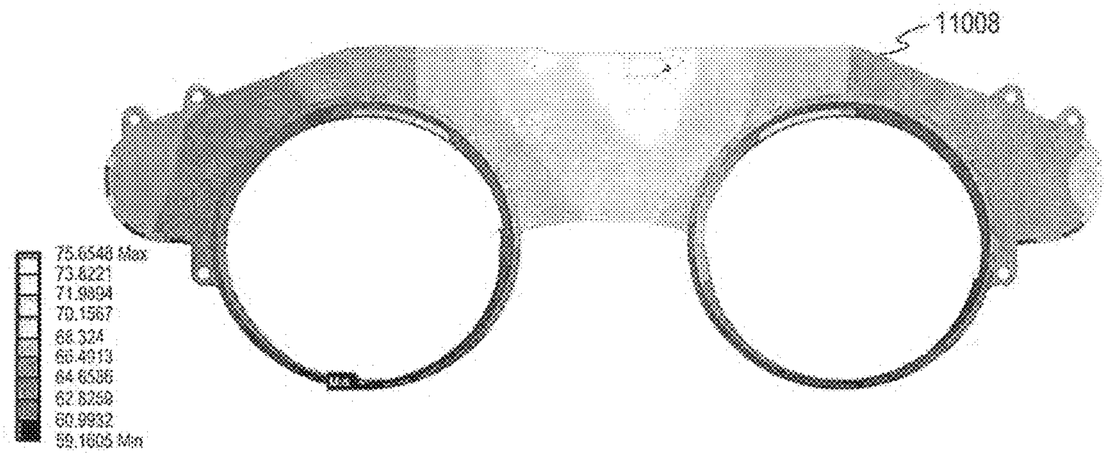
Figure 113B:
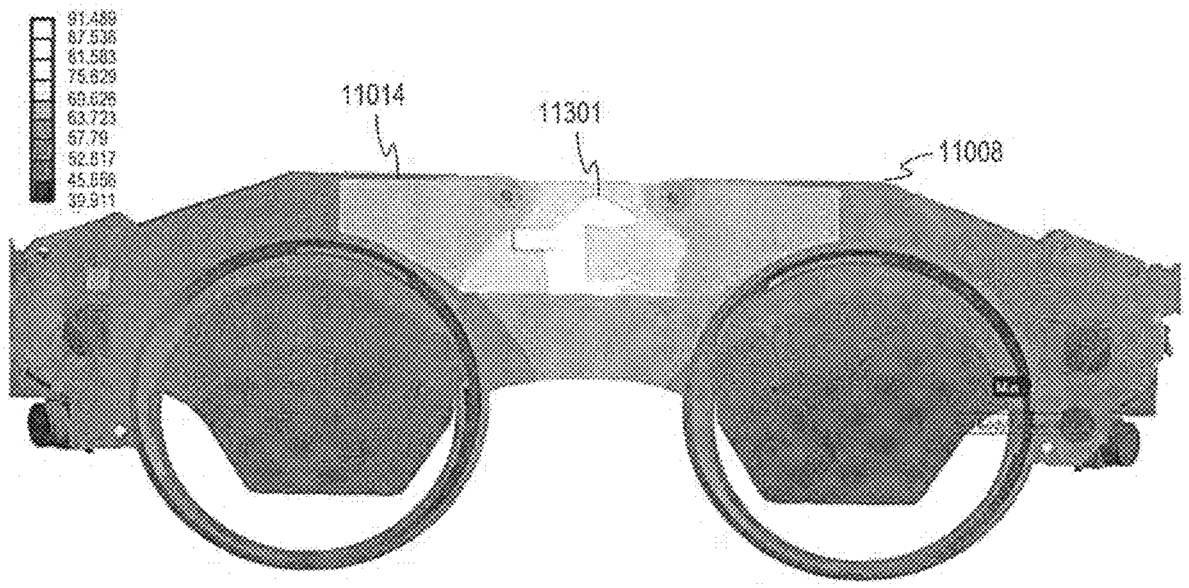

FIGS. 113A-113D show various heat maps overlaid on parts of optical device 11000. The heat maps identify regions of higher heat loading during operation of optical device 11000. The heat maps are coded so that lighter colors correspond to higher temperatures. A legend is shown on the side of each heat map identifying ranges of degrees C. for each indicated region. The heat loading was analyzed in a room having an ambient temperature of 30 degrees C. FIGS. 113A-113B show heat maps of optics frame 11008. FIG. 113A depicts optics frame 11008 and shows that heat loading is strongest in the center of optics frame 11008. This can be caused primarily by the heat generated by PCB 11014. In FIG. 113B, optics frame 11008 and PCB 11014 are characterized using a heat map to identify heat distribution within optics frame 11008 and PCB 11014. The hottest portion of PCB 11014 generally corresponds to a C-shaped region 11301 that can include one or more processors. It should be appreciated that while a specific distribution of heat is depicted herein, the distribution of heat across optical device 11000 can change in accordance with different types of use, durations of use and other environmental factors.

The distribution of heat within optics frame 11008 as depicted in FIGS. 113A-113B can be controlled in many ways. In some embodiments, the thickness of optics frame 11008 can be varied. For example, portions of optics frame 11008 commonly subjected to above average amounts of heat loading can be thickened to increase the ability of that portion of optics frame 11008 to absorb and dissipate heat. In some embodiments, thickening portions of optics frame 11008 can also be beneficial as it can reduce the size of any air gaps between optics frame 11008 and front band 11004. These types of adjustments can also be performed on areas of optics frame 11008 surrounding heat sensitive components so that the heat sensitive components can operate for longer periods of time without having to go into a reduced-functionality overheating protection mode. In some embodiments, optics frame 11008 can take the form of a heat distribution system that incorporates different materials to help in spreading heat across the frame. For example, plating the exterior surface of optics frame 11008 with a copper alloy or another highly thermally conductive material could also help distribute heat more evenly on account of copper alloys having a substantially greater thermal conductivity than most magnesium or titanium alloys. In some embodiments, pyrolytic graphite sheets could be adhered to both sides of optics frame 11008 in order to more evenly distribute heat across optics frame 11008. Other solutions could involve incorporating thermally conductive composites, such as AlSiC, into optics frame 11008. One benefit of AlSiC is that its alloys can be adjust so that its thermal expansion properties can match the thermal of other materials.

Figure 113C:
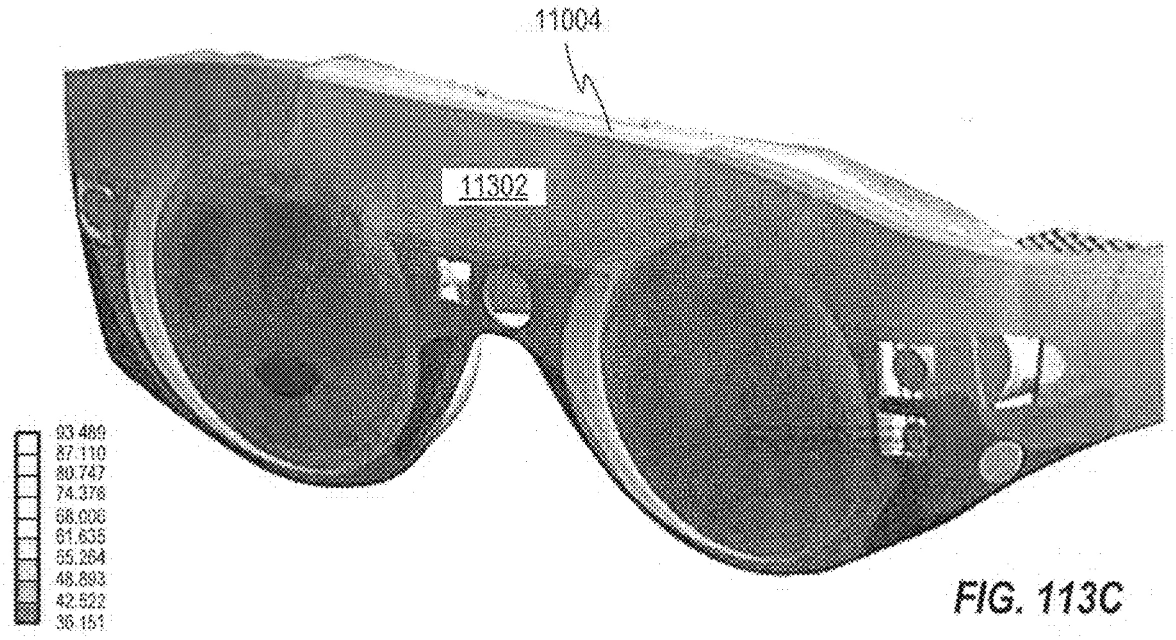
Figure 113D:
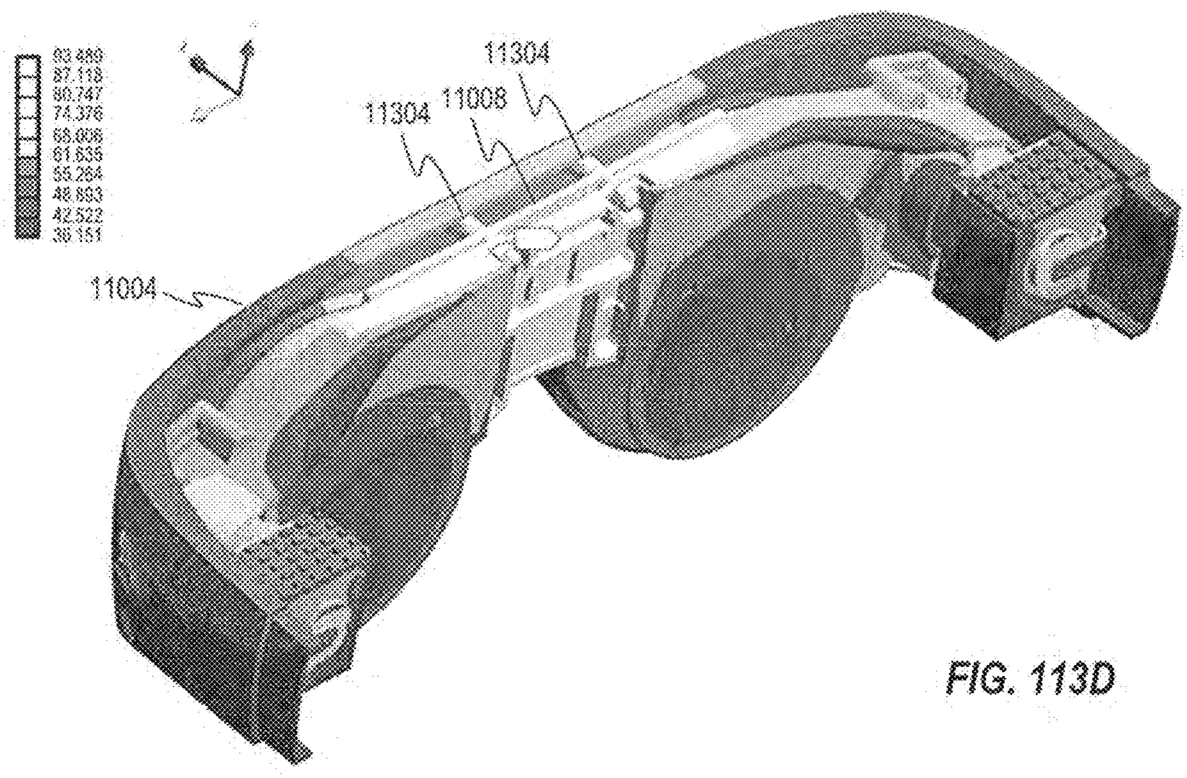

FIGS. 113C-113D show heat maps characterizing the distribution of heat across front and rear surfaces of front band 11004. FIG. 113C shows how bridge region 11302 of front band 11004 only reaches a temperature of about 65 degrees C., which is substantially lower than the 90+ degree temperatures associated with portions of optics frame 11004. FIG. 113D illustrates how much cooler front band 11004 can remain than optics frame 11008. This large reduction in temperature can be critical for user comfort and long-duration use of optical device 11000 since a user of optical device 11000 is most likely to be in direct contact with portions of front band 11004 and arms 11002. This particular illustration also shows how front band 11004 can be coupled to optics frame 11008 by structural members 11304, which are depicted as cylindrical protrusions. Structural members 11304 can take the form of any suitable mechanical connector. For example, the protrusions can take the form of boss structures for receiving screws. The central location of structural members 11304 prevents any substantial bending moments from being transferred to optics frame 11008, thereby allowing front band 11004 to bend and flex near an interconnect with arms 11002 without substantially affecting optics frame 11008.

FIG. 114A shows a perspective view of an optical device 14000. Optical device 14000 has an arm 14002 configured to rotate in the direction of arrow 14003 in order to accommodate a user with a larger head, while an arm 14004 can be fixedly coupled to a front band 14006. FIGS. 140B-140C show a top perspective view and a top view of optical device 14000. FIG. 140B shows an overlay illustrating which portions of optical device 14000 deform the most. By limiting deformation to arm 14002, a position of arm 14004 with respect to front band 14006 can remain substantially unchanged when optical device 14000 is in use. In some embodiments, this type of configuration could allow for integration of various optical sensors into arm 14004 without having to worry about substantial shifts in the orientation of that sensor due to arm flex. FIG. 140C shows a top view of optical device 14000 and a range of motion of arm 14002. FIG. 140D is provided for comparison with FIG. 140B and illustrates how much more relative movement is generated when both arms 14002 and 14004 are allowed to bend and/or flex.

Grating Structures

Some embodiments may use nanograted eyepiece layers (e.g., ICG, OPE, and/or EPE) to pass images to a viewer's eye. FIG. 115 is a simplified diagram describing optimizations for an eyepiece of a viewing optics assembly according to some embodiments of the invention. The illustration shows a multi-level, stepped EPE 11500 that increases diffraction efficiency as compared to a binary, "top hat" structure. In some embodiments, the stepped structure includes a blazed grating that resembles a saw tooth structure. In some embodiments, the structure incorporates features associated with both binary gratings and blazed gratings. A binary grating diffracts light in both directions equally. A blazed grating may break the symmetry of the eyepiece, so the light travels in the desired direction, increasing efficiency and overall brightness. The multi-level, stepped structure illustrated in FIG. 115 decreases light traveling out toward the world as opposed to the viewer's eye, and suppresses light coupling into the eyepiece from the real world due to its selectivity.

Diffraction efficiency, luminance and uniformity of the EPE grating structure may also be increased by adjusting etch depth over space. Thus, good uniformity across the image may be achieved. In addition, increased efficiency of the eyepiece may be achieved by prioritizing light that is actually going to reach the pupil. Increased efficiency may also be achieved by better matching the photoresist placed on top of the glass substrate in the eyepiece structure. In general, the refractive index of the resist may be increased to match the high n of the substrate, resulting in better efficiency due to a lack of reflections from the interface of the resist.

Although described with respect to an EPE, it is contemplated that the optimized grating structures described herein may be similarly implemented on the OPE and/or the ICG. For example, increased efficiency may also be achieved by reducing rebounce decoupling in the ICG by minimizing the chance that light has to bounce back.

Properties of Eyepiece Layers

Substrate properties for an eyepiece of a viewing optics assembly may vary according to some embodiments of the invention. In some embodiments, a very flat glass substrate with very low roughness and low total thickness variation (TTV) may be utilized. Low roughness may minimize scatter and thus maintain image contrast. Low TTV may allow for predictive performance with OPE dithering (described further herein). Low TTV may also reduce virtual image distortion that would otherwise need to be corrected in software with computation and resolution loss expense.

In some embodiments, the thickness of the eyepiece layers (including the substrate) may be optimized as well. For example, in one embodiment, each eyepiece layer may be between 300 to 340 um in thickness. Adequate out-coupled ray samples may provide the desired density for a human eye. Further, the thickness of the eyepiece layers may reduce the total number of bounces for the eyepiece. Adequate total internal reflection (TIR) bounce spacing (and adequate out-coupled ray spacing) may create uniform light distribution within the viewer's pupil. In addition, the thickness of the eyepiece layers may affect the rigidity of the eyepiece.

FIG. 116A is a graph illustrating the total thickness variation (TTV) effect on field distortion for a dome apex in the EPE according to some embodiments. FIG. 116B is a graph illustrating the TTV effect on field distortion for a flat substrate according to some embodiments.

FIG. 116C are graphs illustrating measured TTV according to some embodiments.

Manufacturing Process for Blazed Grating

In some embodiments, a manufacturing process may be used to implement gratings on an input coupling grating (ICG). Although described with respect to an ICG, it is contemplated that similar methods may be used to implement similar gratings on an OPE and/or EPE. In some embodiments, a combined blazed and binary grating is used for the ICG. For example, 3-1-1 cut silicon wafers may be used with a wet etch process to produce the blaze. In other examples, ion beam milling may be used, and/or piecewise blazed profiles with binary stair-step profiles.

FIG. 117A is a simplified diagram illustrating a manufacturing process for a blazed grating structure according to some embodiments of the invention. The blazed grating structure described herein may be used, for example, on an ICG, an OPE, and/or an EPE. As shown in FIG. 117A, a silicon wafer or other suitable material may be sliced at an angle, then deposited with an etch mask (e.g., $SiO_2$). The wafer may then be etched, e.g., with KOH. Because the wafer is sliced at an angle, the anisotropic etching that occurs results in a blazed grating in the silicon wafer (e.g., a triangular opening in the silicon wafer having an opening of 70.5 degrees in one example). FIG. 117B shows photographs illustrating a blazed grating, e.g., for an ICG according to some embodiments of the invention, such as produced by the process of FIG. 117A. As illustrated in FIG. 117B, the angles associated with the gratings can be determined, in part, by the crystallography of the substrate being etched, for example, a blazed grating with an angle of 70.5 degrees with one surface tilted at 30 degrees with respect to the substrate surface. In some embodiments, <211> and/or <311> crystal planes are utilized, for example, in silicon substrates, thereby enabling an increase in the number of available substrates.

FIG. 117C is a simplified diagram comparing a manufacturing process of a triangular grating structure to a blazed grating structure according to some embodiments of the invention. In both processes, the substrate and etch mask begin as illustrated at 11701C. If a wafer is not sliced prior to etching, the wafer will be etched in a triangular fashion, as illustrated at 11702C. If a wafer is sliced prior to etching, the wafer will be etched with a blazed grating, as illustrated at 11703C. Accordingly, the slicing of the substrate at a predetermined angle results in the <111> planes of the silicon substrate being angled at angles other than 45 degrees with respect to the substrate surface, resulting in a blazed grating structure.

FIG. 117D is a simplified diagram illustrating a flat-top ICG structure 11710D as compared to a pointed-top ICG structure 11720D according to some embodiments of the invention. The blazed ICG provides, on average, an input coupling efficiency in the first order of about 50%, whereas a binary ICG gives about 20%. In addition, a flat-top ICG structure 4410 gives higher first order diffraction efficiency versus a true blaze with a sharp top as illustrated by pointed-top ICG structure 11720D. Although blazed gratings are discussed in relation to the ICG in some embodiments, embodiments of the present invention are also applicable to other diffraction structures, including the EPE and OPE. One of ordinary skill in the art would recognize many variations, modifications, and alternatives.

FIG. 118 is a simplified process flow diagram illustrating a manufacturing process of a blazed grating structure according to some embodiments of the invention. FIG. 118 shows the steps involved in fabricating controlled and optimal geometry to achieve a high efficiency waveguide device template in a silicon substrate. In one embodiment, the silicon substrate may be off-axis cut silicon. This template may be used to fabricate an ICG, an OPE, and/or an EPE, for example.

The fabrication method of FIG. 118 enables the patterning of different components (i.e., fields) of a waveguide device with a predetermined (e.g., the most optimum) nano- or micro-structure for each individual field, enabling high efficiency of the device on any large or small wafer scale format. The fabrication method uses wet and dry plasma etch steps in combination to pattern transfer various nano- and micro-patterns such as square, rectangular, or blazed gratings into desired substrate or material layers. The inclusion and use of sacrificial dummy fields (with same critical dimension and larger pitch or same pitch and smaller critical dimension) improves accuracy of critical etch timing in wet and dry processes. This aspect of controlling the top flat critical dimension is a way to control blazed grating depth to avoid light trapping, and is done in order to achieve a predetermined (e.g., the maximum) amount of efficiency for the waveguide pattern. The etched substrate can then be used as a template for pattern transfer using imprint lithography in a device production process.

Light waveguide devices can utilize different nano- and micro-patterns for various functions. The ability to vary pattern within and among various fields is this provided by some embodiments of the present invention as a feature of the device fabrication process. The fabrication step also utilizes conventional process equipment to achieve this on a large wafer scale in sufficient quantities for production. Standard materials, patterning, process tools and equipment do not typically allow the fabrication of such devices on their own. The fabrication can, however, be achieved using certain materials in combination with certain processes, sacrificial patterns, and processing sequences.

According to fabrication methods described herein, using lithography processes (e.g., photolithography, imprint lithography, etc.), a primary pattern is fabricated over silicon dioxide on silicon with or without an adhesion layer and less than one degree of pattern alignment to the desired silicon crystal lattice axis at step 11801. At step 11802, a plasma process is used to remove residual layer thickness (RLT) of the imprint (if imprint lithography is used initially) and/or subsequently a dry etch is used to pattern transfer into the silicon dioxide layer. At step 11803, a polymer (thick) layer is coated over the input coupler (IC) field and the substrate is dry etched at 11804 to pattern transfer in through the other fields into silicon. Polymers such as poly(vinyl alcohol), PMMA, PAAc, etc., may be used. This polymer layer prevents the etch transfer through the IC field.

At step 11805, the etch pattern is stripped and cleaned and the other fields (non-IC) are covered with titanium metal and a second polymer layer with use of a mask at steps 11806A and 11806B. The titanium layer is deposited using PVD-type processes while shadow masking other fields. Based on IC proximity to other patterned fields and field size, titanium metal layer deposition can be avoided. The second polymer layer may be PVA, PMMA, PAAc, etc.

At step 11807, with the IC field silicon exposed, a wet etching step (e.g., KOH) creates the desired blazed geometry along the {111} silicon crystal lattice plane. Wet etch rates may vary for varying pattern density (like pitch variation), silicon doping, etc. Etch rates may be controlled, for example, by using different concentrations of KOH.

Sixth, to get the desired (e.g., optimum) IC efficiency, the IC grating etched into silicon dioxide can be trimmed in the critical dimension (CD) width, to facilitate a wider and deeper blazed pattern at step 11808. FIG. 119A illustrates the characteristics of this blaze geometry once wet etched. FIG. 119C shows the control of CD of the IC in silicon dioxide in creating a high efficiency IC. FIG. 119B illustrates exemplary SEMs of four different CDs. This aspect of controlling the top flat CD as a way to control blazed depth to avoid light trapping is done in order to achieve a predetermined (e.g., maximum) amount of efficiency for the waveguide pattern. The wet etch to create the desired CD in the IC field can be done using an appropriately diluted BOE solution. Dilution ratios can be chosen so as to control the etch of silicon dioxide. For example, a wet etch process window of 35 seconds can be increased to 2 minutes by switching from 6:1 to 20:1 BOE solution. When the desired CD in the IC field is achieved, the fifth step described above creates the appropriate high efficiency blaze profile for the waveguide device. For wafer wet etch process control, dummy fields with smaller CD, same IC pitch or same CD, larger IC pitch can be present outside the device pattern area for wet etch timing purposes. For example, if the diffraction pattern visibility disappears from the dummy field during wet etch, this can signal the completion of wet etch to open the appropriate CD in the silicon dioxide for subsequent silicon wet etch.

Masking and patterning steps may be alternated and repeated to achieve variation in the pattern transfer profile from field to field over any wafer format. Eighth, the remaining polymer and/or metal layer are stripped and the substrate is cleaned and made ready for use as a template where this pattern is replicated in high throughput over large areas 11808.

Imprint-Based Manufacturing and Lift Off

According to some embodiments, imprint-based manufacturing may be implemented. This type of manufacturing may result in low residual layer thickness and higher eyepiece efficiency. Jet and flash imprinting may be used and may replicate rapidly. Resist formulas may be implemented that enable jetting with high uniformity. Imprint-based manufacturing may be implemented on a variety of substrates, including polymer and glass substrates.

FIG. 120 is a simplified diagram illustrating imprint-based manufacturing according to some embodiments of the invention. At step 12005, precise fluid resist drops are placed on a substrate. At step 12010, a mask is placed on the substrate in contact with the fluid resist drops. At step 12015, the fluid resist is polymerized using an ultraviolet light source. At step 12020, the mask is separated from the substrate, leaving the polymerized resist on the substrate due to strong substrate adhesion. The resulting surface is illustrated as surface 12025, with 50 nm lines and 50 nm spaces between lines.

FIG. 121A is a simplified process flow diagram illustrating a manufacturing process of a patterned grating structure for a waveguide according to some embodiments of the invention. The patterned grating structure described herein may be used, for example, on an OPE and/or an EPE. In some embodiments, the patterned grating structure is constructed of high index inorganic material using imprinting and lift-off. High index inorganic materials may be difficult to etch via plasma etch processes currently used in the industry. Thus, some embodiments of the present invention implement a process to avoid etching the otherwise hard to etch materials, such as Cu and Ag. A lift-off process is used in which the high index inorganic material is only deposited (PVD) and patterned using a pre-patterned lift-off (solvent-soluble) layer over the desired substrate, such as high index glass or plastic.

FIG. 121A illustrates the lift-off process, which enables patterning of inorganic high index materials such as $TiO_2$, ZnO, $HfO_2$, $ZrO_2$, etc. (i.e., metal oxides or inorganic materials with $n>1.6$). Such materials can be very difficult to etch using conventional ion plasma etch tools. At step 12101A, a soluble layer is coated on a substrate. The soluble layer may be a water soluble polymer layer in one embodiment. A water soluble layer may be more compliant in a production line for large scale fabrication and with the use of polymer substrates where solvents other than water can react with the polymer substrate.

At step 12102A, a pattern is imprinted in the soluble layer. One shot, large area patterning may be used on the deposited polymer layer using J-FIL in one embodiment. This avoids the use of an adhesive layer and overcomes limitations of optical lithography on smaller areas and the need to use reactive solvents to develop the optical lithography resists.

At step 12103A, etching is completed through and into the soluble layer. The imprinted cured polymer over the bottom sacrificial polymer layer etches at a different rate with a single etch chemistry. This produces an undercut necessary for the lift-off process. This also avoids the use of a secondary hard mask, to create an etch profile.

At step 12104A, high index material is deposited onto the soluble layer and substrate. The high index material may be deposited using a vapor deposition technique (e.g., PVD) that allows for disconnects to exist, forming a discontinuous high index layer. The deposition parameters along with the etch profile can be controlled to get either a trapezoidal or triangular profile in some embodiments, as is illustrated in FIG. 121C. FIG. 121C is simplified diagram illustrating varying profiles of material deposited based on deposition parameters and etch profile according to some embodiments of the invention. A triangular profile may, for example, reduce haze of transmitted light through the pattern and substrate.

Turning back to FIG. 121A, at step 12105A, the soluble layer and high index material on the soluble layer is lifted off, leaving the patterned high index material on the substrate. This process allows for materials which otherwise cannot be patterned easily like high index metal oxides, inorganics, metal oxide-polymer hybrids, metals, etc., to be patterned at the 100 nm scale, for example, with high accuracy over glass or polymer substrates. FIG. 121D illustrates 100 nm to 200 nm Ag lines patterned on a polycarbonate film over a >50 mm by 50 mm pattern area.

In other words, patterning is made possible by etching a soluble sacrificial layer and then using deposition techniques to deposit the high index materials. Photographs 12106A, 12110A, 12115A of FIG. 121A are SEM images showing patterned 190 nm wide and 280 nm tall Ag lines formed by the process described above. FIG. 121B is a graph illustrating the refractive index of a ZrOx film deposited using a PVD type process according to some embodiments of the invention. The end patterned high index material can be used as an element of a functional waveguide when incorporated on a substrate.

Multi-Level Gratings

According to some embodiments, a multi-level binary grating can be used on a grating structure for a waveguide. The multi-level binary grating structure described herein may be used, for example, on an ICG, an OPE, and/or an EPE. Fabrication of multi-level (i.e., 3-D) micro- or nano-structures may use several lithography steps and be challenging as it may rely on sub-100 nm patterns and very high overlay accuracy. Some embodiments of the invention provide methods of fabricating high-resolution multi-level micro- or nano-structures and diffractive gratings with multiple binary steps, such as those shown in FIG. 122. These embodiments of the invention simplify the overall fabrication process of multi-level structures and can be used to fabricate directly optical components or create nano-imprint molds.

For optical devices, triangular gratings may be desired due to their ability to manipulate light. At the nano-level, a triangular pattern is difficult to achieve; thus, a series of stepped gratings may be created to mimic a triangular pattern. The height of each step and the number of steps may be fixed based on current fabrication techniques. However, according to some embodiments of the invention, the number of steps may be increased and the height may be varied amongst the steps to create desired grating patterns more closely resembling and mimicking desired triangular patterns.

Fabrication of multi-level binary gratings may be typically achieved by multiple lithography steps with high alignment accuracy. Generally, the maximum number of levels (m) that can be generated with n number of lithography steps is given by $m=2^n$. The process is limited by the alignment precision of the lithography tool and the etching process. Both are challenging when the dimension of the features is sub-100 nm and usually lead to low quality of multi-level binary gratings for optical applications.

Some embodiments of the present invention provide processes of fabricating multi-level gratings with high quality, both in terms of sidewall and etch depth. According to some embodiments, a stack of "stop layers" is used to create multi-level gratings. In some embodiments, the first stop layer is optional. The other two stop layers allow for precise definition of the depth of each step in the gratings, increasing the quality of corners, and simplifying the etching process to one step and allowing for a high vertical profile. In other words, some embodiments allow for precise control over the profile and depth of each sub-grating, and utilize only one etching process.

FIG. 123 illustrates an iterative process where in each cycle, a layer of the substrate and the mask are deposited sequentially. Every cycle generates a level. In FIG. 123, two cycle processes are shown (cycle 1: steps 12303, 12304, 12305; cycle 2: steps 12306, 12307, 12308). In some embodiments, the deposition of the final etch stop layer is made in step 12302. After the creation of a 3D etching mask, a single etching process may result in a 3D process (step 12309). In some embodiments, the final etch stop layer may be selectively etched away (step 12310). The starting substrate shown in step 12301 may be, for example, silicon, quartz, or any other material.

A cycle (e.g., cycles 1 and 2) includes (I) depositing an added substrate layer (steps 12303 and 12306), (II) depositing a stop etch layer (steps 12304 and 12307), and (III) performing lift-off (steps 12305 and 12308). At steps 12303 and 12306, an added substrate layer may be deposited. This layer may be deposited by various methods (e.g., sputtering, evaporation, ALD, etc.), and may comprise films of materials that have good etching selectivity with a stop layer. In some embodiments, silicon, silicon dioxide, silicon nitride, and the like may be used. The thickness of the transfer layers may correspond to the height of the sub-gratings.

At steps 12304 and 12307, lithography may be completed and a mask (i.e., a stop etch layer) may be deposited. Lithography may be performed with UV, E-beam lithography, NIL, or other techniques. The stop etch layer may be deposited by various methods (e.g., sputtering, evaporation, ALD, etc.). The stop etch layer may comprise metal(s) (e.g., Au, Al, Ag, Ni, Cr, etc.) or metal oxide(s) (e.g., $SiO_2$, $TiO_2$, etc.), or other materials, such as silicon, silicon nitride, and the like. In some embodiments, the thickness of the stop etch layer is between 2 nm and 40 nm.

At steps 12305 and 12308, lift-off is performed. Depending on the resist used in the lithography process, a specific solvent may dissolve the resist, leaving only the stop etch layer. In some embodiments, this step may be replaced by deposition and etching.

In some embodiments, "shadow" deposition of an etching mask is used to create multi-level gratings as illustrated in FIG. 124. These embodiments allow processes having a reduced number of lithography steps. For example, as shown in FIG. 124, only one lithography step is utilized to create a three level structure. The starting structure is a binary grating, which can be fabricated by any known process, such as lithography and etching, at step 12401. A metal or dielectric mask layer may be deposited over the grating at an angle at step 12402, and the directionality of the deposition and the shadowing of the grating of the metal film will partially cover the bottom of the trench. In some embodiments, sputtering, evaporation or any other directional depositional technique may be used to deposit the mask layer. In some embodiments, ALD is not used to deposit the mask layer. A clean area, w, is given by the equation, $w=h/\tan(\theta)$, where h is the height of the trench and theta is the deposition angle. The same equation allows finding the deposition angle for any desired width. Due to the dependence on the height of the trench, the control and reproducibility of this approach decreases with the aspect ratio. The structure may then be etched using the mask layer as a mask, and the mask layer can be removed to form the multi-level binary grating structure shown at step 12403. The process may be iterated to generate multiple layers.

FIG. 125 illustrates how different deposition angles result in different widths of the second step. For example, in process A, a 55 degree deposition angle is used in step 12501A, resulting in 70% clean area in step 12502A, and a narrow second step in step 12503A. In process B, a 65 degree deposition angle is used in step 12501B, resulting in 47% clean area in step 12502B, and a medium width second step in step 12503B. In process C, an 80 degree deposition angle is used in step 12501C, resulting in 18% clean area in step 12502C, and a wide second step in step 12503C.

Graded Grating Duty Cycle

In some embodiments, the gratings described herein may have a graded duty cycle to reflect light in a graded manner. This may result in uniform intensity across an image output from the eyepiece. As described further herein, the eyepiece may receive input light from an ICG. The light may be coupled to the OPE, expanded, and propagated to the EPE to be reflected to a viewer's eye. As the light propagates through the grating area of one or more of these diffractive elements, it will typically decrease in intensity as light is outcoupled by the gratings as a result of diffraction. Therefore, the image output by the diffractive elements, for example, the EPE, may be characterized by a gradient in brightness as a function of position.

According to some embodiments, the duty cycle of the grating may be adjusted as a function of position. This may result in reduced light diffraction in regions where the light in the eyepiece layer has greater intensity and increased light diffraction in regions where the light in the eyepiece layer has reduced intensity. Thus, an image having uniform brightness may result through the use of graded duty cycle grating structures.

FIG. 126A is a simplified plan view diagram illustrating a constant grating structure according to some embodiments of the invention. According to FIG. 126A, light 12610 may be input into an eyepiece layer 12620 along a longitudinal direction (i.e., the z-direction). The eyepiece layer 12620 may be, for example, an ICG, OPE, and/or EPE, as described further herein. The eyepiece layer 12620 may have a plurality of gratings 12630 arrayed along the longitudinal direction. The gratings 12630 may be constant in the sense that they are solid and evenly spaced with respect to each other along the longitudinal direction.

FIG. 126B is a graph illustrating light intensity output from the constant grating structure illustrated in FIG. 126A according to some embodiments of the invention. As shown in FIG. 126B, constant gratings 12630 may result in a continuous decrease in light intensity between the top surface 12602 of the eyepiece layer 12620 and the bottom surface 12604 of the eyepiece layer 12620 as the light propagates through the grating. This may result in decreased light available to be projected to a viewer from the portions of the grating structure associated with greater longitudinal positions (i.e., greater z values).

FIG. 127A is a simplified plan view diagram illustrating a grating structure with a graded duty cycle according to some embodiments of the invention. According to FIG. 127A, light 12710 may be input into an eyepiece layer 12720 and propagate along the longitudinal direction (i.e., the z-direction). The eyepiece layer 12720 may be, for example, an ICG, OPE, and/or EPE, as described further herein. The eyepiece layer 12720 may have a plurality of gratings 12730 arrayed along the longitudinal direction. The gratings 12730 may have a graded duty cycle in the sense that individual portions of each grating 12730 may be spaced apart in the lateral direction (i.e., the y-direction). The duty cycle may vary from a low duty cycle (i.e., low ratio of grating material to spacing between grating portions) to a high duty cycle (i.e., high ratio of grating material to spacing between grating portions). In some embodiments, the gratings 12730 may be manufactured using a scanning tool that allows for precision writing in the eyepiece layer 12720. As illustrated in FIG. 127B, the eyepiece layer 12720 can be characterized by an entry surface 12702 and a terminal surface 12704.

FIG. 127C illustrates a zoomed in view of the eyepiece layer 12720. As shown in FIGS. 127A and 127C, the spacing 12734 in the lateral direction between the portions 12732 of each grating 12730 may depend on the longitudinal position (e.g., the position of the grating 12730 with respect to the entry surface 12702 and the terminal surface 12704 of the eyepiece layer 12720). Thus, as compared to FIG. 126A, the gratings 12730 may not be solid in the lateral direction, and may have differing spacings 12734 between individual portions 12732. In the embodiment shown in FIG. 127A, the gratings 12730 may be arranged with increasing duty cycle along the path of light 12710 propagation (i.e., in the longitudinal direction). In other words, the ratio of the lateral size of the portions 12732 of the grating 12730 to the spacing 12734 between adjacent portions may increase as a function of longitudinal position from the entry surface 12702 to the terminal surface 12704.

The variation in duty cycle as a function of longitudinal position may be implemented such that the intensity emitted by the eyepiece layer 12720 is uniform or substantially uniform as a function of longitudinal position throughout the eyepiece layer 12720. In some embodiments, the duty cycle may vary from 0% to 100% from the entry surface 12702 to the terminal surface 12704 of the eyepiece layer 12720. In some embodiments, the duty cycle may vary from 50% to 90% from the entry surface 12702 to the terminal surface 12704 of the eyepiece layer 12720. In some embodiments in which the eyepiece layer 12720 is an EPE, the entry surface 12702 may be the surface positioned closest to the OPE, while the terminal surface 12704 may be the surface positioned furthest from the OPE.

In some embodiments, such as that shown in FIG. 127A, the gratings 12730 may be evenly spaced with respect to each other along the longitudinal direction. In other embodiments, however, the gratings 12730 may be variably spaced with respect to each other along the longitudinal direction. In some embodiments, the dithering techniques described herein may be combined with the graded duty cycle shown in FIG. 127A to increase uniformity of the light intensity output to a viewer.

FIG. 127B is a graph illustrating light intensity output from the grating structure with a graded duty cycle illustrated in FIG. 127A according to some embodiments. As shown in FIG. 127B, graded duty cycle gratings 12730 may result in constant light intensity output between the entry surface 12702 of the eyepiece layer 12720 and the terminal surface 12704 of the eyepiece layer 12720. This constant intensity output may result in a more uniform light profile that is then available to be projected to a viewer further down the light path.

FIG. 128 is a flow diagram 12800 of an exemplary method of manipulating light by an eyepiece layer having a grating structure with a graded duty cycle according to some embodiments of the present invention. The method includes receiving light from a light source at an input coupling grating having a first grating structure characterized by a first set of grating parameters (12810).

The method further comprises receiving light from the input coupling grating at an expansion grating having a second grating structure characterized by a second set of grating parameters (12820). The method further comprises receiving light from the expansion grating at an output coupling grating having a third grating structure characterized by a third set of grating parameters (12830). At least one of the first grating structure, the second grating structure, and the third grating structure has a graded duty cycle. The duty cycle of the grating structure may increase from the surface of the eyepiece layer that receives the light to the surface of the eyepiece layer that outputs the light. The first set of grating parameters, the second set of grating parameters, and/or the third set of grating parameters may specify the duty cycle and the grading of the duty cycle across the eyepiece layer. The light intensity through the eyepiece layer may be constant. The method further comprises outputting light to a viewer (12840).

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing a waveguide having a multi-level binary grating structure, the method comprising:

coating a first etch stop layer on a first substrate;

adding a second substrate on the first etch stop layer;

depositing a first resist layer on the second substrate, wherein the first resist layer includes at least one first opening;

depositing a second etch stop layer on the second substrate in the at least one first opening;

removing the first resist layer from the second substrate;

adding a third substrate on the second substrate and the second etch stop layer;

depositing a second resist layer on the third substrate, wherein the second resist layer includes at least one second opening;

depositing a third etch stop layer on the third substrate in the at least one second opening;

removing the second resist layer from the third substrate;

etching the second substrate and the third substrate, leaving the first substrate, the first etch stop layer, the second etch stop layer and the second substrate in the at least one first opening, and the third etch stop layer and the third substrate in the at least one second opening; and etching an exposed portion of the first etch stop layer, an exposed portion of the second etch stop layer, and the third etch stop layer, forming the multi-level binary grating structure.

2. The method of claim 1, wherein the first substrate comprises silicon or quartz.

3. The method of claim 1, wherein the second substrate and the third substrate comprise at least one of silicon, silicon dioxide, and silicon nitride.

4. The method of claim 1, wherein at least one of the first resist layer and the second resist layer is removed by lift off.

5. The method of claim 1, wherein at least one of the first resist layer and the second resist layer is removed by etching.

6. The method of claim 1, wherein at least one of the first resist layer and the second resist layer is removed by dissolving.

* * * * *